US011696458B2

(12) United States Patent
Hong et al.

(10) Patent No.: US 11,696,458 B2
(45) Date of Patent: Jul. 4, 2023

(54) ORGANIC LIGHT-EMITTING DEVICE AND METHOD OF MANUFACTURING THE SAME

(71) Applicant: Samsung Electronics Co., Ltd., Suwon-si (KR)

(72) Inventors: Seokhwan Hong, Seoul (KR); Seungyeon Kwak, Suwon-si (KR); Hyun Koo, Seongnam-si (KR); Sangdong Kim, Seongnam-si (KR); Sungjun Kim, Seongnam-si (KR); Jiwhan Kim, Seoul (KR); Sunghun Lee, Hwaseong-si (KR); Sukekazu Aratani, Hwaseong-si (KR); Sunyoung Lee, Seoul (KR); Shingo Ishihara, Suwon-si (KR); Aram Jeon, Suwon-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 443 days.

(21) Appl. No.: 16/197,710

(22) Filed: Nov. 21, 2018

(65) Prior Publication Data

US 2019/0165292 A1 May 30, 2019

(30) Foreign Application Priority Data

Nov. 24, 2017 (KR) ........................ 10-2017-0158568

(51) Int. Cl.

| | |
|---|---|
| ***H01L 51/00*** | (2006.01) |
| ***H10K 50/11*** | (2023.01) |
| ***C09K 11/06*** | (2006.01) |
| ***C07F 15/00*** | (2006.01) |
| ***H10K 50/15*** | (2023.01) |
| ***H10K 50/16*** | (2023.01) |
| ***H10K 71/00*** | (2023.01) |

(Continued)

(52) U.S. Cl.

CPC .......... *H10K 50/11* (2023.02); *C07F 15/0086* (2013.01); *C09K 11/06* (2013.01);

(Continued)

(58) Field of Classification Search

CPC ............. C07F 15/0086; H01L 51/0087; H01L 2251/5384; C09K 2211/185

See application file for complete search history.

(56) References Cited

U.S. PATENT DOCUMENTS 7,928,652 B2 4/2011 Kitamura et al.
2003/0170380 A1 9/2003 Nakano et al.

(Continued)

FOREIGN PATENT DOCUMENTS

JP 4181795 B2 9/2008
KR 2012-0058894 A 6/2012

(Continued)

OTHER PUBLICATIONS

Wang et al, Strongly phosphorescent platinum(II) complexes supported by tetradentate benzazole-containing ligands, J. Mater. Chem. C, Jul. 17, 2015, 3 8212-8 (Year: 2015).*

(Continued)

*Primary Examiner* — Sean M De Guire
(74) *Attorney, Agent, or Firm* — Cantor Colburn LLP

(57) ABSTRACT

An organic light-emitting device including a first electrode, a second electrode, an emission layer disposed between the first electrode and the second electrode, a hole transport region disposed between the first electrode and the emission layer, and an electron transport region disposed between the emission layer and the second electrode, wherein the emission layer includes a host and a dopant, wherein the dopant is an iridium-free organometallic compound, and wherein a dopant concentration profile of the emission layer satisfies predetermined parameters disclosed in the specification.

13 Claims, 9 Drawing Sheets

(51) Int. Cl.

| | |
|---|---|
| ***H10K 85/30*** | (2023.01) |
| *H10K 101/40* | (2023.01) |
| *H10K 101/10* | (2023.01) |
| *H10K 101/30* | (2023.01) |
| *H10K 101/00* | (2023.01) |

(52) U.S. Cl.

CPC ............. *H10K 50/15* (2023.02); *H10K 50/16* (2023.02); *H10K 71/00* (2023.02); *H10K 85/346* (2023.02); *C09K 2211/1044* (2013.01); *C09K 2211/185* (2013.01); *H10K 2101/10* (2023.02); *H10K 2101/30* (2023.02); *H10K 2101/40* (2023.02); *H10K 2101/90* (2023.02)

(56) References Cited

U.S. PATENT DOCUMENTS

| | | | | |
|---|---|---|---|---|
| 2006/0182992 A1* | 8/2006 | Nii | C07D 213/22 | 428/690 |
| 2007/0024185 A1* | 2/2007 | Kitamura | H01L 51/5012 | 313/504 |
| 2014/0091265 A1* | 4/2014 | Stoessel | H05B 33/14 | 252/519.21 |
| 2015/0171359 A1* | 6/2015 | Forrest | H01L 51/5004 | 257/40 |
| 2015/0263305 A1* | 9/2015 | Premutico | H01L 51/5016 | 257/40 |
| 2015/0340621 A1* | 11/2015 | Parham | H01L 51/0073 | 252/500 |

FOREIGN PATENT DOCUMENTS

| | | |
|---|---|---|
| KR | 2014-0052614 A | 5/2014 |
| KR | 2017-0033187 A | 3/2017 |

OTHER PUBLICATIONS

English Translation of Office Action dated Jan. 20, 2022 issued in KR Patent Application No. 10-2017-0158568, 10 pp.

Office Action dated Jan. 20, 2022 issued in KR Patent Application No. 10-2017-0158568, 8 pp.

* cited by examiner

ORGANIC LIGHT-EMITTING DEVICE AND METHOD OF MANUFACTURING THE SAME

CROSS-REFERENCE TO RELATED APPLICATION

This application claims priority to Korean Patent Application No. 10-2017-0158568, filed on Nov. 24, 2017, in the Korean Intellectual Property Office, and all the benefits accruing therefrom under 35 U.S.C. § 119, the content of which is incorporated herein in its entirety by reference.

BACKGROUND

1. Field

The present disclosure relates to an organic light-emitting device.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

One or more embodiments provide an organic light-emitting device, which satisfies predetermined parameters, includes an iridium-free organometallic compound, and has high luminescent efficiency and a long lifespan, and a method of manufacturing the organic light-emitting device.

Additional aspects will be set forth in part in the description which follows and, in part, will be apparent from the description, or may be learned by practice of the presented embodiments.

An aspect provides an organic light-emitting device including:

a first electrode;

a second electrode;

an emission layer disposed between the first electrode and the second electrode;

a hole transport region disposed between the first electrode and the emission layer; and an electron transport region disposed between the emission layer and the second electrode, wherein the emission layer includes a host and a dopant, the dopant is an iridium (Ir)-free organometallic compound, a dopant concentration profile of the emission layer satisfies $N_1 \leq D_{con}(x) \leq N_2$ in a direction from the hole transport region toward the electron transport region, x in $D_{con}(x)$ is a real number and a variable satisfying $0 \leq x \leq L_{EML}$, $L_{EML}$ is a thickness of the emission layer, $D_{con}(x)$ is a dopant concentration (percent by weight) at a position spaced apart by x from an interface between the hole transport region and the emission layer, toward the emission layer, $N_1$ (percent by weight) is a minimum value of a dopant concentration of the emission layer and is greater than or equal to about 0 percent by weight and less than about 100 percent by weight, $N_2$ (percent by weight) is a maximum value of the dopant concentration of the emission layer and is greater than about 0 percent by weight and less than or equal to about 100 percent by weight, $N_1$ and $N_2$ are different from each other, and $D_{con}(0)$ and $D_{con}(L_{EML})$ are each $N_2$.

Another aspect provides a method of manufacturing an organic light-emitting device, including:

preparing a substrate in which a first electrode and a hole transport region are formed;

preparing a deposition source moving unit that includes a first deposition source configured to emit a dopant and a second deposition source configured to emit a host, wherein the first deposition source and the second deposition source are spaced apart from each other by a predetermined distance, such that a region in which the dopant is emitted overlaps a region in which the host is emitted;

arranging the deposition source moving unit at a first end under the surface of the hole transport region, such that the hole transport region faces the deposition source moving unit, and such that the first deposition source is more adjacent to the center of the hole transport region than the second deposition source;

forming an emission layer on the surface of the hole transport region by performing a reciprocating process of moving the deposition source moving unit in a direction from the first end under the surface of the hole transport region toward a second end and immediately moving the deposition source moving unit in a direction from the second end to the first end one or more times; and forming an electron transport region and a second electrode on the emission layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
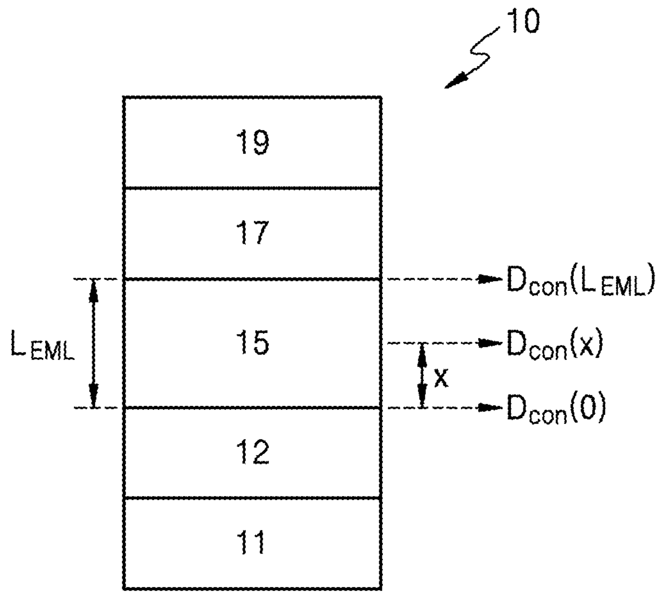
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term, "about" means within ±5% of the stated value.

Description of FIG. 1

An organic light-emitting device 10 of FIG. 1 includes a first electrode 11, a second electrode 19 facing the first electrode 11, an emission layer 15 between the first electrode 11 and the second electrode 19, a hole transport region between the first electrode 11 and the emission layer 15, and an electron transport region 17 between the emission layer 15 and the second electrode 19.

In FIG. 1, a substrate may be additionally disposed under the first electrode 11 or above the second electrode 19. The substrate may be a glass substrate or a plastic substrate, each having excellent mechanical strength, thermal stability, transparency, surface smoothness, ease of handling, and water resistance.

First Electrode 11

The first electrode 11 may be formed by depositing or sputtering a material for forming the first electrode 110 on the substrate. When the first electrode 11 is an anode, the material for forming a first electrode may be selected from materials with a high work function to facilitate hole injection.

The first electrode 11 may be a reflective electrode, a semi-transmissive electrode, or a transmissive electrode. When the first electrode 11 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. When the first electrode 110 is a semi-transmissive electrode or a reflective electrode, as a material for forming the first electrode 110, magnesium (Mg), silver (Ag), aluminum (Al), aluminum-lithium (Al—Li), calcium (Ca), magnesium-indium (Mg—In), magnesium-silver (Mg—Ag), or any combination thereof may be used. However, the material for forming the first electrode 110 is not limited thereto.

The first electrode 11 may have a single-layered structure, or a multi-layered structure including two or more layers.

Dopant Concentration Profile in Emission Layer 15

The emission layer 15 may include a host and a dopant.

The dopant is an iridium (Ir)-free organometallic compound. That is, the dopant is an organometallic compound that does not include iridium.

A dopant concentration profile in the emission layer 15 may satisfy $N_1 \leq D_{con}(x) \leq N_2$ in a direction from the hole transport region 12 toward the electron transport region 17. x in $D_{con}(x)$ is a real number and a variable satisfying $0 \leq x \leq L_{EML}$, $L_{EML}$ is a thickness of the emission layer 15, $D_{con}(x)$ is a dopant concentration (percent by weight, wt %) at a position spaced apart from an interface between the hole transport region 12 and the emission layer 15 by x toward the emission layer 15, $N_1$ (wt %) is a minimum value of the dopant concentration in the emission layer 15 and is greater than or equal to about 0 wt % and less than about 100 wt %, and $N_2$ (wt %) is a maximum value of the dopant concentration in the emission layer 15 and is greater than about 0 wt % and less than or equal to about 100 wt %.

$N_1$ and $N_2$ are different from each other, and $N_1 < N_2$.

The unit of x may be an arbitrary unit. For example, the unit of x may be nm.

$D_{con}(0)$ and $D_{con}(L_{EML})$ may each be $N_2$.

$D_{con}(x)$ represents an amount of the dopant in the unit of wt % based on 100 wt % of the host and the dopant at the position spaced apart from the interface between the hole transport region 12 and the emission layer 15 by x toward the emission layer 15.

Since $D_{con}(0)$ and $D_{con}(L_{EML})$ in the emission layer 15 are each $N_2$, the hole injection from the interface between the hole transport region 12 and the emission layer 15 to the emission layer 15 and the electron injection from the interface between the emission layer 15 and the electron transport region 17 to the emission layer 15 are accelerated, and thus, the organic light-emitting device 10 may have a long lifespan.

In an embodiment, $N_1$ may be in a range of about 0.5 wt % to about 20 wt %, about 1 wt % to about 10 wt %, about 2 wt % to about 9 wt %, or about 3 wt % to about 8 wt %.

In an embodiment, $N_2$ may be in a range of about 10 wt % to about 40 wt %, about 12 wt % to about 30 wt %, or about 15 wt % to about 25 wt %.

When $N_1$ and $N_2$ are within these ranges, the organic light-emitting device 10 having high luminescent efficiency without exciton quenching may be achieved.

In one or more embodiments, $x_1$ and $x_2$ may each be a real number satisfying $0 < x_1 < x_2 < L_{EML}$, $D_{con}(x)$ may be $N_2$ when x satisfies $0 \leq x \leq x_1$, and $D_{con}(x)$ may be $N_2$ when x satisfies $x_2 \leq x \leq L_{EML}$. $x_1$ and $L_{EML}-x_2$ may be identical to each other. For example, $x_1$ and $L_{EML}-x_2$ may each be in a range of about 0.1% to about 20% of $L_{EML}$, about 0.5% to about 15% of $L_{EML}$, about 1% to about 10% of $L_{EML}$, or about 1% to about 5% of $L_{EML}$, but embodiments of the present disclosure are not limited thereto. in an embodiment, $x_1$ and $L_{EML}-x_2$ may each be about 2.5% of $L_{EML}$, but embodiments of the present disclosure are not limited thereto.

The dopant concentration profile in the emission layer may be discontinuous (see, for example, FIGS. 3 and 4) or continuous (see, for example, FIGS. 5, 7, 8, and 9).

Dopant in Emission Layer 15

The dopant in the emission layer 15 may be a phosphorescent compound. Therefore, the organic light-emitting device 10 differs from an organic light-emitting device that emits fluorescence according to a fluorescent mechanism.

In one or more embodiments, the dopant may be an organometallic compound including platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), rhodium (Rh), palladium (Pd), silver (Ag), or gold (Au). For example, the dopant may be an organometallic compound including platinum (Pt) or palladium (Pd), but embodiments of the present disclosure are not limited thereto.

In one or more embodiments, the dopant in the emission layer 15 may be an organometallic compound having a square-planar coordination structure.

In one or more embodiments, the dopant in the emission layer 15 may satisfy $T1(\text{dopant}) \leq E_{gap}(\text{dopant}) \leq T1(\text{dopant}) + 0.5$ electron volts (eV), for example, $T1(\text{dopant}) \leq E_{gap}(\text{dopant}) \leq T1(\text{dopant}) + 0.36$ eV, but embodiments of the present disclosure are not limited thereto.

When $E_{gap}(\text{dopant})$ is within this range, the dopant in the emission layer 15, for example, the organometallic compound having the square-planar coordination structure, may have a high radiative decay rate although spin-orbital coupling (SOC) at a single energy level close to a triplet energy level is weak.

In one or more embodiments, the dopant in the emission layer 15 may satisfy $-2.8\text{ eV} \leq \text{LUMO (dopant)} \leq -2.3\text{ eV}$, $-2.8\text{ eV} \leq \text{LUMO (dopant)} \leq -2.4\text{ eV}$, $-2.7\text{ eV} \leq \text{LUMO (dopant)} \leq -2.5\text{ eV}$, or $-2.7\text{ eV} \leq \text{LUMO (dopant)} \leq -2.61\text{ eV}$.

In one or more embodiments, the dopant in the emission layer 15 may satisfy $-6.0\text{ eV} \leq \text{HOMO (dopant)} \leq -4.5\text{ eV}$, $-5.7\text{ eV} \leq \text{HOMO (dopant)} \leq -5.1\text{ eV}$, $-5.6\text{ eV} \leq \text{HOMO (dopant)} \leq -5.2\text{ eV}$, or $-5.6\text{ eV} \leq \text{HOMO (dopant)} \leq -5.25\text{ eV}$.

T1(dopant) is a triplet energy level (eV) of the dopant in the emission layer 15, $E_{gap}(\text{dopant})$ is a difference between HOMO (dopant) and LUMO (dopant) included in the emission layer 15, HOMO (dopant) is a highest occupied molecular orbital (HOMO) energy level of the dopant included in the emission layer 15, LUMO (dopant) is a lowest unoccupied molecular orbital (LUMO) energy level of the dopant included in the emission layer 15, HOMO (dopant) and LUMO (dopant) are a negative value measured by a differential pulse voltammeter using ferrocene as a reference material, and T1(dopant) is calculated from a peak wavelength of a phosphorescence spectrum of the dopant which is measured by using a phosphorescence measurement device.

In one or more embodiments, the dopant may include a metal M and an organic ligand, and the metal M and the organic ligand may form one, two, or three cyclometalated rings. The metal M may be platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), rhodium (Rh), palladium (Pd), silver (Ag), or gold (Au).

In one or more embodiments, the dopant may include a metal M and a tetradentate organic ligand capable of forming three or four (for example, three) cyclometalated rings. The metal M is the same as described above. The tetradentate organic ligand may include, for example, a benzimidazole group and a pyridine group, but embodiments of the present disclosure are not limited thereto.

In one or more embodiments, the dopant may include a metal M and at least one ligand selected from ligands represented by Formulae 1-1 to 1-4:

Formula 1-1

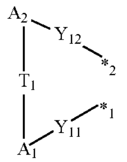

Formula 1-2

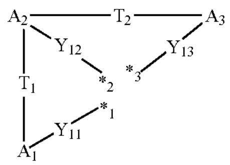

Formula 1-3

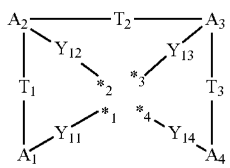

Formula 1-4

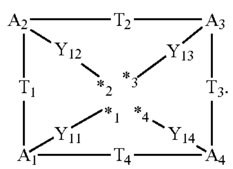

In Formulae 1-1 to 1-4, $A_1$ to $A_4$ may each independently be selected from a substituted or unsubstituted $C_5$-$C_{30}$ carbocyclic group, a substituted or unsubstituted $C_1$-$C_{30}$ heterocyclic group, and a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be selected from a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—$S(=O)_2$—*', *—$C(R_{93})$=*', *=$C(R_{93})$—*', *—$C(R_{93})$=$C(R_{94})$—*', *—C(=S)—*', and *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, and $*_1$, $*_2$, $*_3$, and $*_4$ each indicate a binding site to the metal M of the dopant, and wherein $Q_1$ to $Q_9$ are the same as defined below.

For example, the dopant may include a ligand represented by Formula 1-3, and two selected from $A_1$ to $A_4$ in Formula 1-3 may each independently be a substituted or unsubstituted benzimidazole group and a substituted or unsubstituted pyridine group, but embodiments of the present disclosure are not limited thereto.

In one or more embodiments, the dopant may be an organometallic compound represented by Formula 1A:

Formula 1A

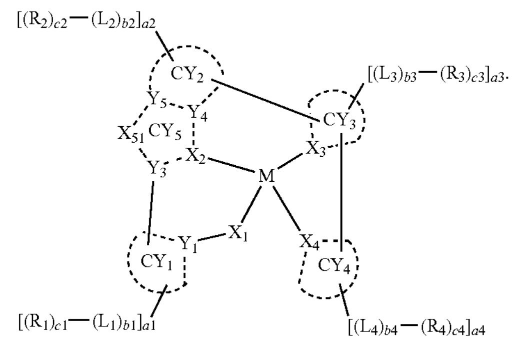

In Formula 1A,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be O or S, and a bond between $X_1$ and M may be a covalent bond, $X_2$ to $X_4$ may each independently be C or N, at least one of a bond between $X_2$ and M, a bond between $X_3$ and M, and a bond between $X_4$ and M may be a covalent bond, and the others may each independently a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ may each independently be a chemical bond, $CY_1$ to $CY_5$ may each independently be selected from a $C_5$-$C_{30}$ carbocyclic group and a $C_1$-$C_{30}$ heterocyclic group, wherein $CY_4$ may not be a benzimidazole group, a cyclometalated ring formed by $CY_5$, $CY_2$, $CY_3$, and M may be a 6-membered ring, $X_{51}$ may be selected from O, S, N-$[(L_7)_{b7}$-$(R_7)_{c7}]$, $C(R_7)(R_8)$, $Si(R_7)(R_8)$, $Ge(R_7)(R_8)$, C(=O), N, $C(R_7)$, $Si(R_7)$, and $Ge(R_7)$, $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be selected from a substituted or unsubstituted $C_5$-$C_{30}$ carbocyclic group and a substituted or unsubstituted $C_1$-$C_{30}$ heterocyclic group, b1 to b4 and b7 may each independently be an integer of 0 to 5, $R_1$ to $R_4$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, c1 to c4 may each independently be an integer of 1 to 5, a1 to a4 may each independently be 0, 1, 2, 3, 4, or 5, at least two selected from a plurality of neighboring groups $R_1$ may be optionally linked via a substituted or unsubstituted $C_5$-$C_{30}$ carbocyclic group or a substituted or unsubstituted $C_1$-$C_{30}$ heterocyclic group, at least two selected from a plurality of neighboring groups $R_2$ may be optionally linked via a substituted or unsubstituted $C_5$-$C_{30}$ carbocyclic group or a substituted or unsubstituted $C_1$-$C_{30}$ heterocyclic group, at least two selected from a plurality of neighboring groups $R_3$ may be optionally linked via a substituted or unsubstituted $C_5$-$C_{30}$ carbocyclic group or a substituted or unsubstituted $C_1$-$C_{30}$ heterocyclic group, at least two selected from a plurality of neighboring groups $R_4$ may be optionally linked via a substituted or unsubstituted $C_5$-$C_{30}$ carbocyclic group or a substituted or unsubstituted $C_1$-$C_{30}$ heterocyclic group, and at least two selected from neighboring $R_1$ to $R_4$ may be optionally linked to form a substituted or unsubstituted $C_5$-$C_{30}$ carbocyclic group or a substituted or unsubstituted $C_1$-$C_{30}$ heterocyclic group.

In Formulae 1-1 to 1-4 and 1A, the $C_5$-$C_{30}$ carbocyclic group, the $C_1$-$C_{30}$ heterocyclic group, and $CY_1$ to $CY_4$ may each independently be selected from:

a) a first ring;

b) a condensed ring in which two or more first rings are condensed; and c) a condensed ring in which at least second rings is condensed with at least one first ring, wherein the first ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group, and the second ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isooxazole group, a thiazole group, an isothiazole group, an oxadiazole group and thiadiazole group.

In Formulae 1-1 to 1-4, the non-cyclic group may be *—C(=O)—*', *—O—C(=O)—*', *—S—C(=O)—*', *—O—C(=S)—*', or *—S—C(=S)—*', but embodiments of the present disclosure are not limited thereto.

In Formulae 1-1 to 1-4 and 1A, a substituent of the substituted $C_5$-$C_{30}$ carbocyclic group, a substituent of the substituted $C_1$-$C_{30}$ heterocyclic group, $R_{91}$ to $R_{94}$, $R_1$ to $R_4$, $R_7$, and $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and $-Si(Q_{33})(Q_{34})(Q_{35})$; and $-N(Q_1)(Q_2)$, $-Si(Q_3)(Q_4)(Q_5)$, $-B(Q_6)(Q_7)$, and $-P(=O)(Q_8)(Q_9)$, and $Q_1$ to $Q_9$ and $Q_{33}$ to $Q_{35}$ may each independently be selected from:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, and $-CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In one or more embodiments, the dopant may be an organometallic compound represented by Formula 1A, wherein, in Formula 1A, $X_2$ and $X_3$ may each independently be C or N, $X_4$ may be N, when i) M may be Pt, ii) $X_1$ may be O, iii) $X_2$ and $X_4$ may each independently be N, $X_3$ may be C, a bond between $X_2$ and M and a bond between $X_4$ and M may each independently be a coordinate bond, and a bond between $X_3$ and M may be a covalent bond, iv) $Y_1$ to $Y_5$ may each independently be C, v) a bond between $Y_5$ and $X_{51}$ and a bond between $Y_3$ and $X_{51}$ may each independently be a single bond, vi) $CY_1$, $CY_2$, and $CY_3$ may each independently be a benzene group, and $CY_4$ may be a pyridine group, vii) $X_{51}$ may be O, S, or N-$[(L_7)_{b7}$-$(R_7)_{c7}]$, and viii) b7 may be 0, c7 may be 1 and $R_7$ is a substituted or unsubstituted $C_1$-$C_{60}$ alkyl group, a1 to a4 may each independently be 1, 2, 3, 4, or 5 and at least one of $R_1$ to $R_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the dopant may be represented by Formula 1A-1:

Formula 1A-1

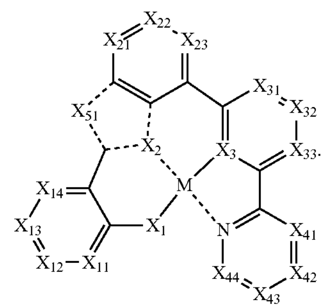

In Formula 1A-1,

M, $X_1$ to $X_3$, and $X_{51}$ are the same as described above, $X_{11}$ may be N or C-$[(L_{11})_{b11}$-$(R_{11})_{c11}]$, $X_{12}$ may be N or C-$[(L_{12})_{b12}$-$(R_{12})_{c12}]$, $X_{13}$ may be N or C-$[(L_{13})_{b13}$-$(R_{13})_{c13}]$, and $X_{14}$ may be N or C-$[(L_{14})_{b14}$-$(R_{14})_{c14}]$, $L_{11}$ to $L_{14}$, b11 to b14, $R_{11}$ to $R_{14}$, and c11 to c14 may each independently be the same described above in connection with $L_1$, b1, $R_1$, and c1, $X_{21}$ may be N or C-$[(L_{21})_{b21}$-$(R_{21})_{c21}]$, $X_{22}$ may be N or C-$[(L_{22})_{b22}$-$(R_{22})_{c22}]$, and $X_{23}$ may be N or C-$[(L_{23})_{b23}$-$(R_{23})_{c23}]$, $L_{21}$ to $L_{23}$, b21 to b23, $R_{21}$ to $R_{23}$, and c21 to c23 may each independently be the same described above in connection with $L_2$, b2, $R_2$, and c2, $X_{31}$ may be N or C-$[(L_{31})_{b31}$-$(R_{31})_{c31}]$, $X_{32}$ may be N or C-$[(L_{32})_{b32}$-$(R_{32})_{c32}]$, and $X_{33}$ may be N or C-$[(L_{33})_{b33}$-$(R_{33})_{c33}]$, $L_{31}$ to $L_{33}$, b31 to b33, $R_{31}$ to $R_{33}$, and c31 to c33 may each independently be the same as described above in connection with $L_3$, b3, $R_3$, and c3, $X_{41}$ may be N or C-$[(L_{41})_{b41}$-$(R_{41})_{c41}]$, $X_{42}$ may be N or C-$[(L_{42})_{b42}$-$(R_{42})_{c42}]$, $X_{43}$ may be N or C-$[(L_{43})_{b43}$-$(R_{43})_{c43}]$, and $X_{44}$ may be N or C-$[(L_{44})_{b44}$-$(R_{44})_{c44}]$, $L_{41}$ to $L_{44}$, b41 to b44, $R_{41}$ to $R_{44}$, and c41 to c44 may each independently be the same as described above in connection with $L_4$, b4, $R_4$, and c4, at least two selected from $R_{11}$ to $R_{14}$ may optionally be linked to form a substituted or unsubstituted $C_5$-$C_{30}$ carbocyclic group or a substituted or unsubstituted $C_1$-$C_{30}$ heterocyclic group, at least two selected from $R_{21}$ to $R_{23}$ may optionally be linked to form a substituted or unsubstituted $C_5$-$C_{30}$ carbocyclic group or a substituted or unsubstituted $C_1$-$C_{30}$ heterocyclic group, at least two selected from $R_{31}$ to $R_{33}$ may optionally be linked to form a substituted or unsubstituted $C_5$-$C_{30}$ carbocyclic group or a substituted or unsubstituted $C_1$-$C_{30}$ heterocyclic group, and at least two selected from $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group.
For example, the dopant may be at least one selected from Compounds 1-1 to 1-88, 2-1 to 2-47 and 3-1 to 3-582, but embodiments of the present disclosure are not limited thereto:
1-1
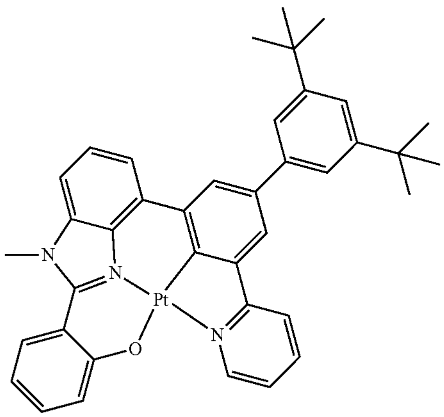
1-2
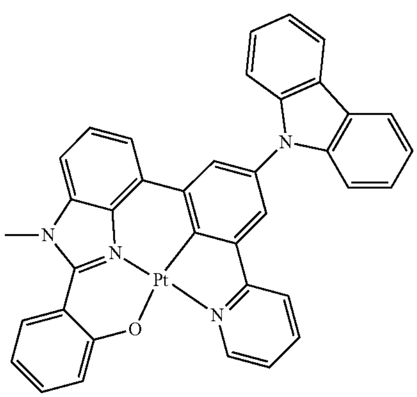
1-3
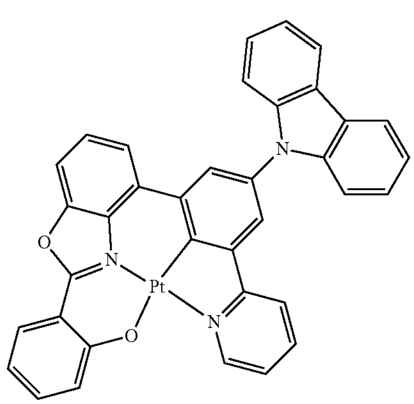
-continued
1-4
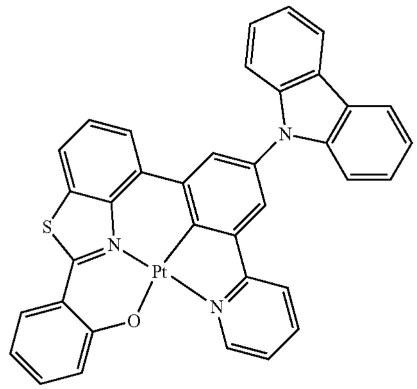
1-5
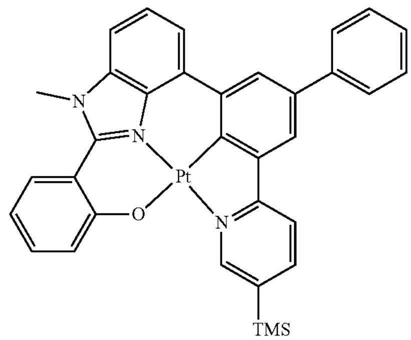
1-6
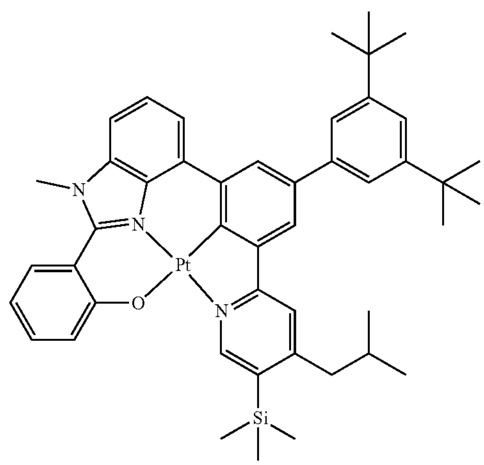
1-7
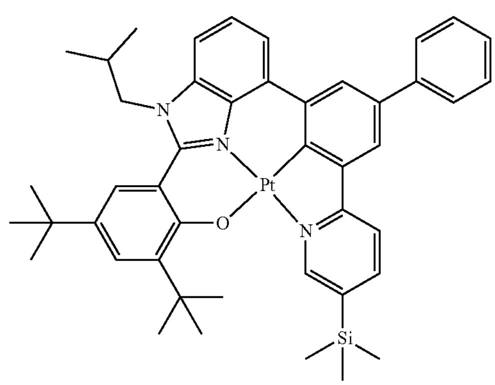

-continued
1-8
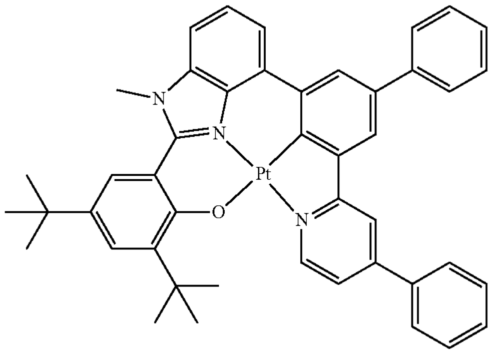
1-9
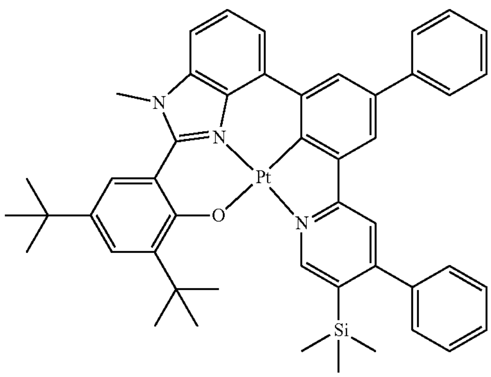
1-10
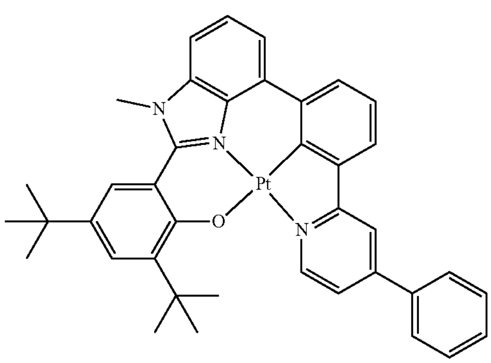
1-11
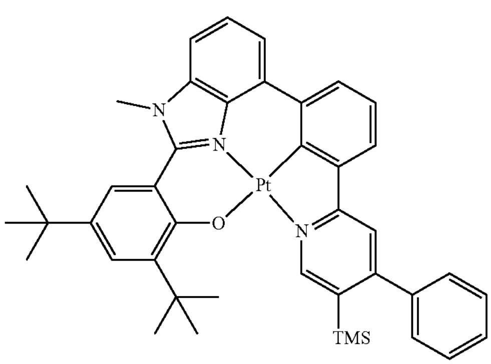
-continued
1-12
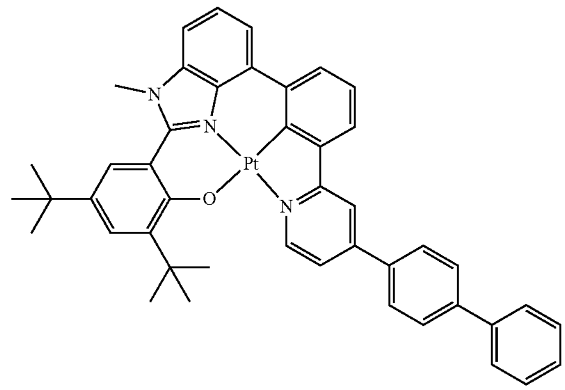
1-13
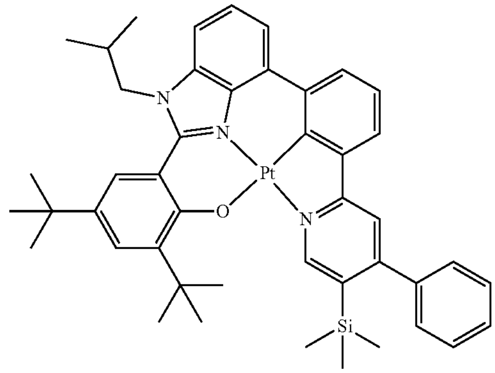
1-14
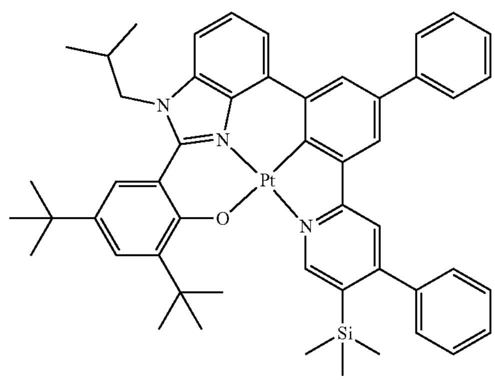
1-15
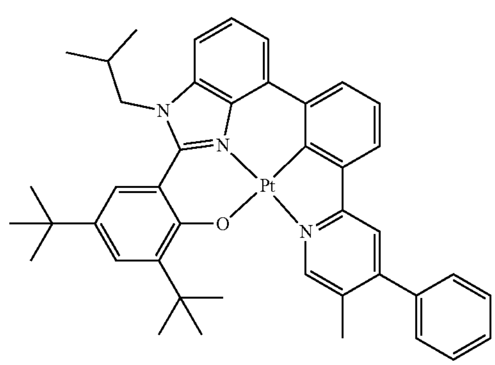

-continued
1-16
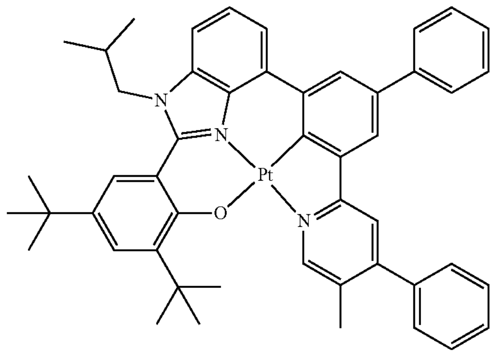
1-17
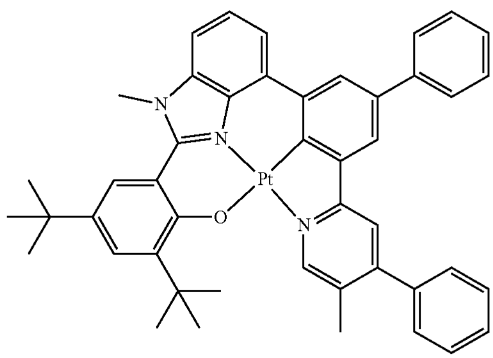
1-18
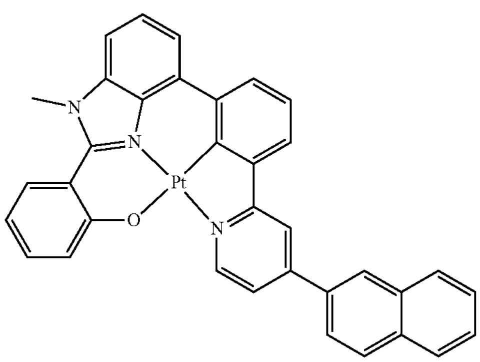
1-19
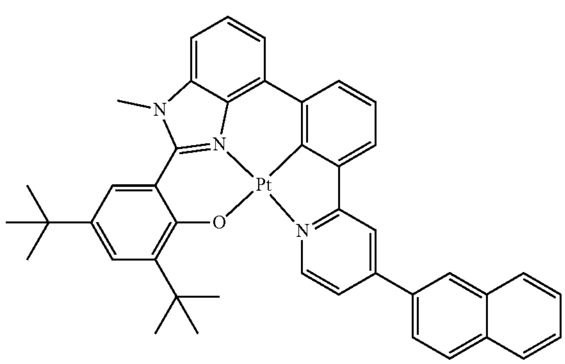
-continued
1-20
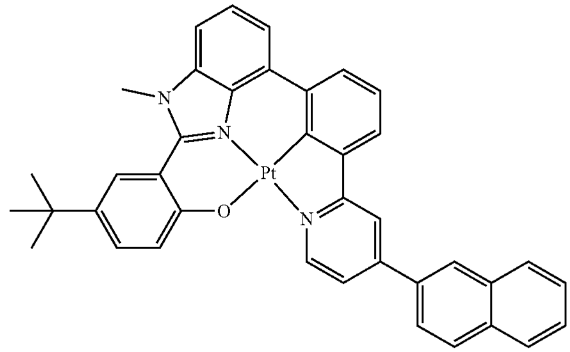
1-21
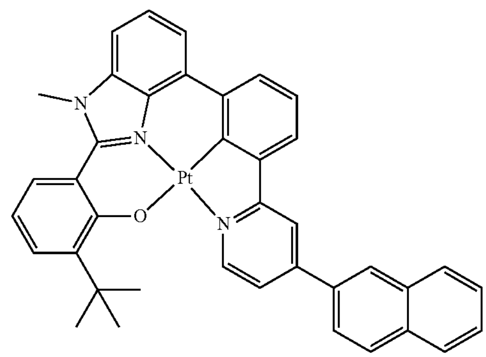
1-22
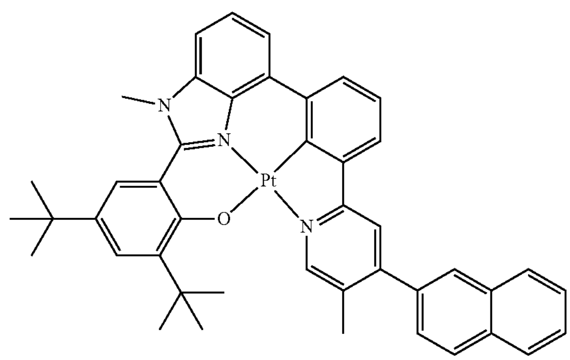
1-23
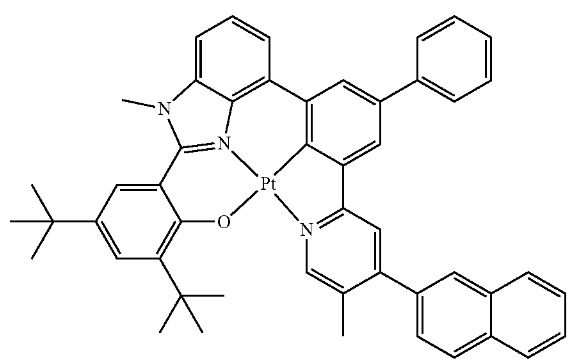

-continued
1-24
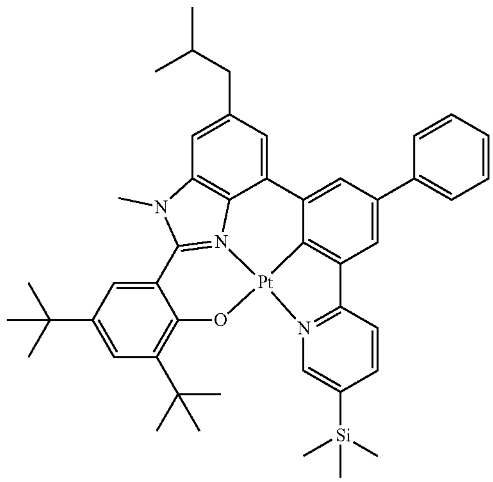
1-25
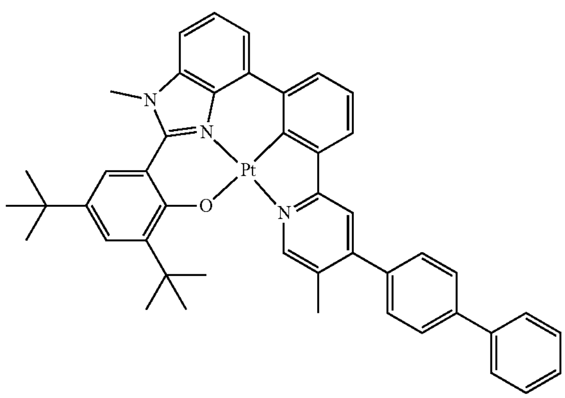
1-26
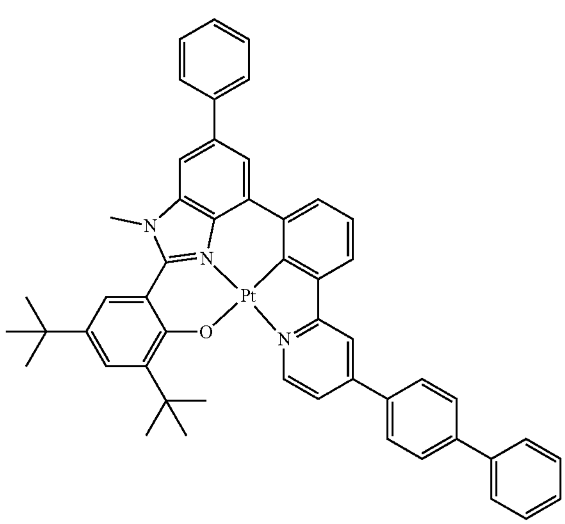
-continued
1-27
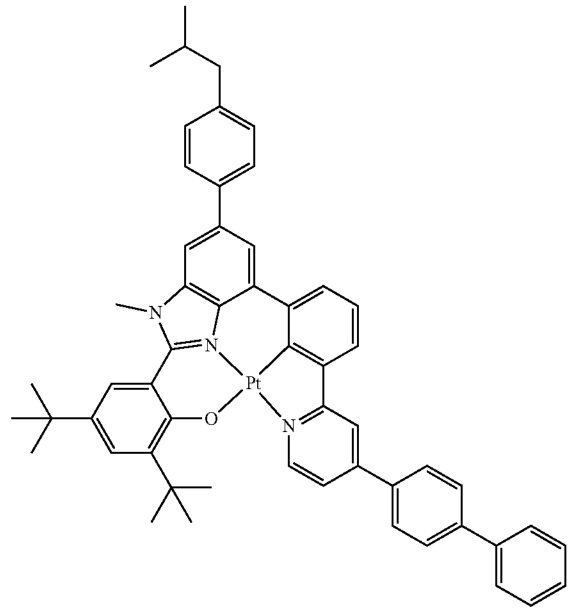
1-28
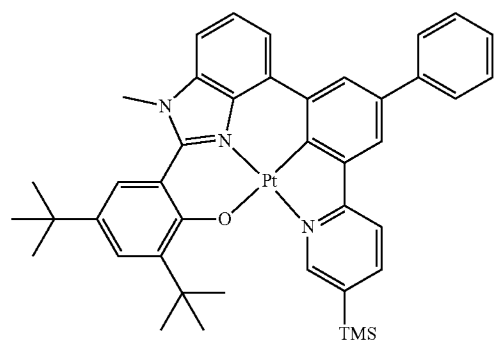
1-29
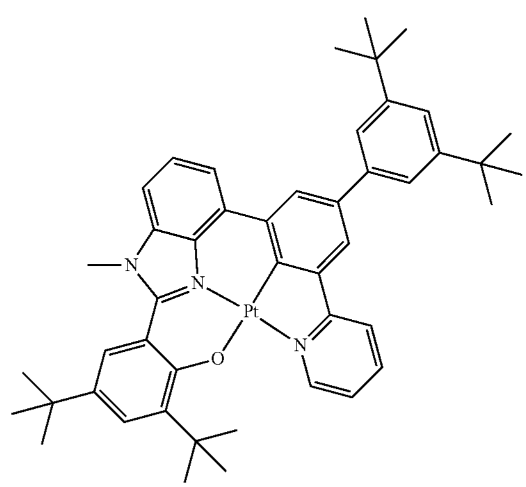

-continued
1-30
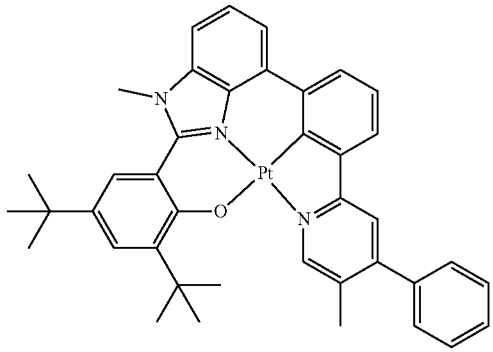
1-31
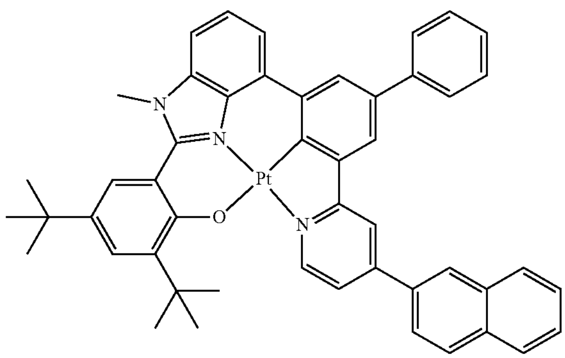
1-32
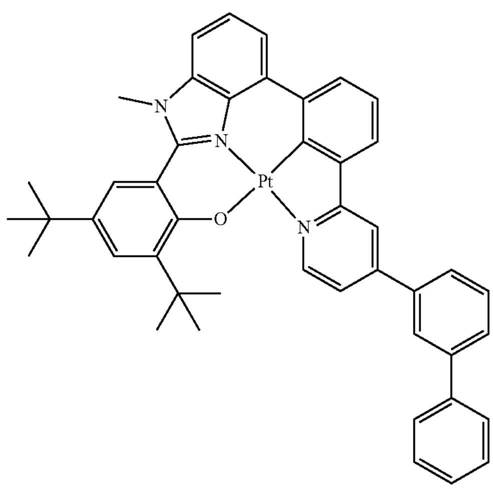
1-33
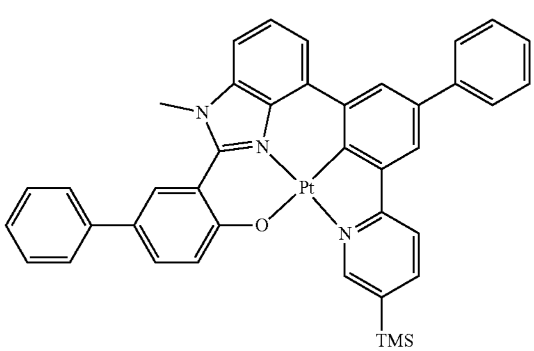
-continued
1-34
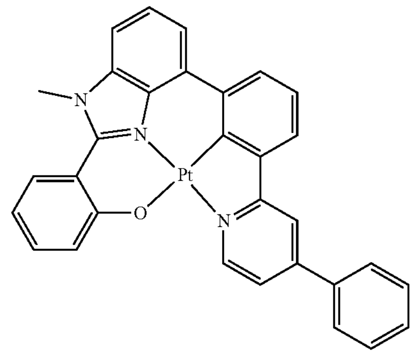
1-35
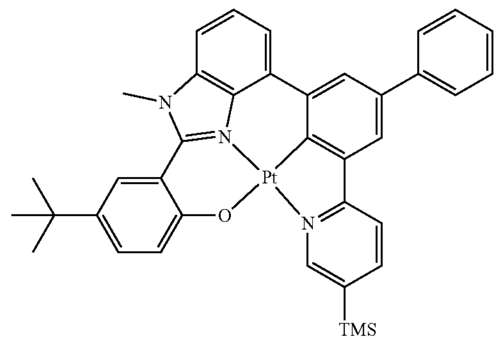
1-36
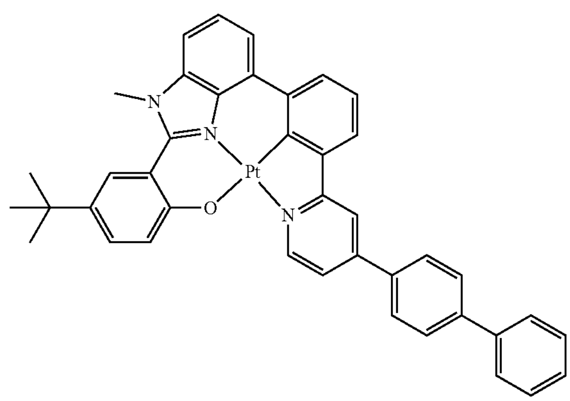
1-37
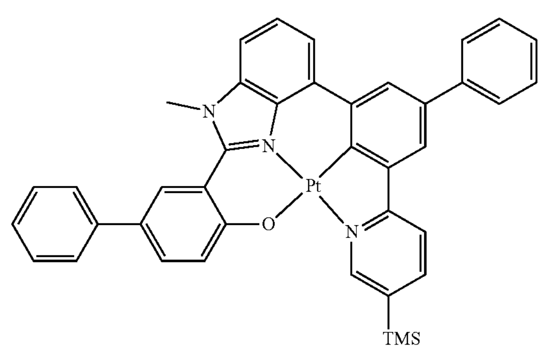

-continued
1-38
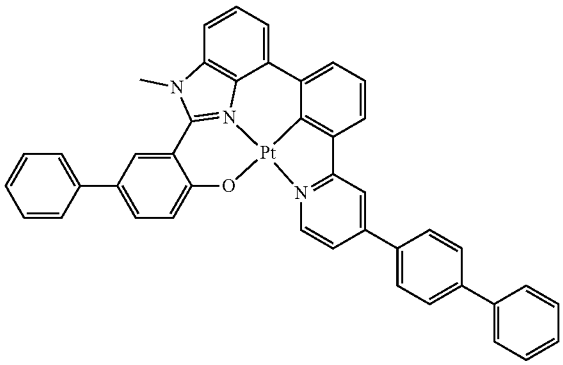
1-39
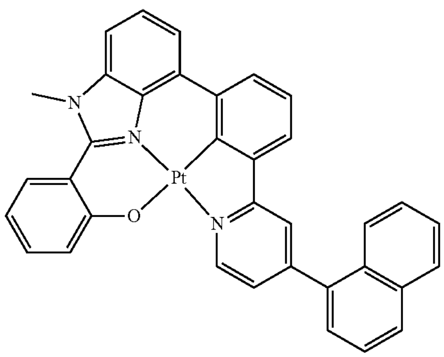
1-40
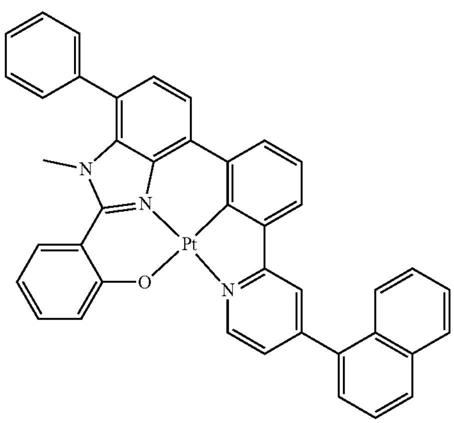
1-41
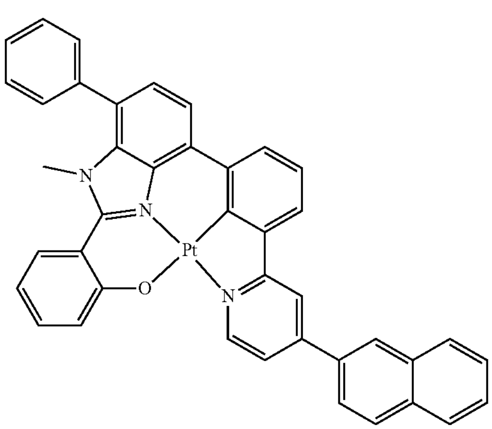
-continued
1-42
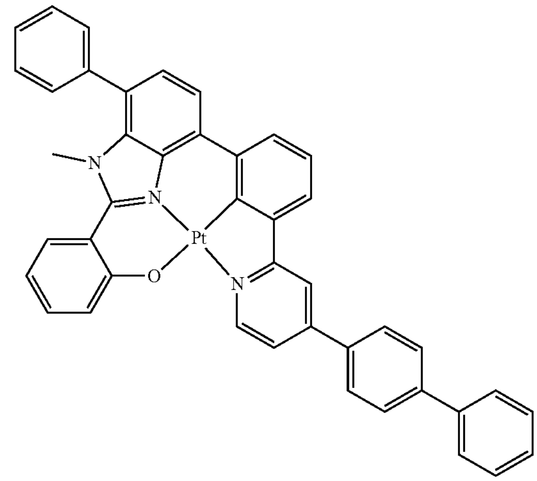
1-43
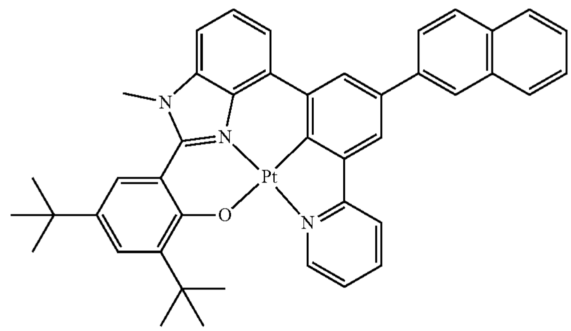
1-44
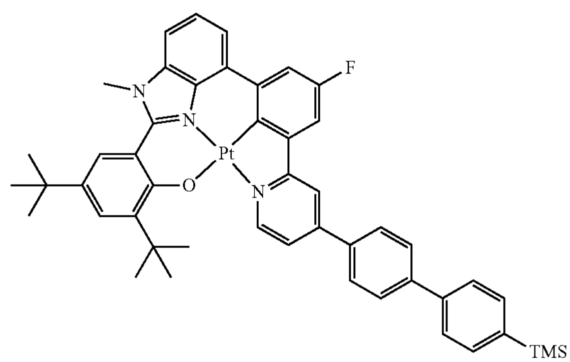
1-45
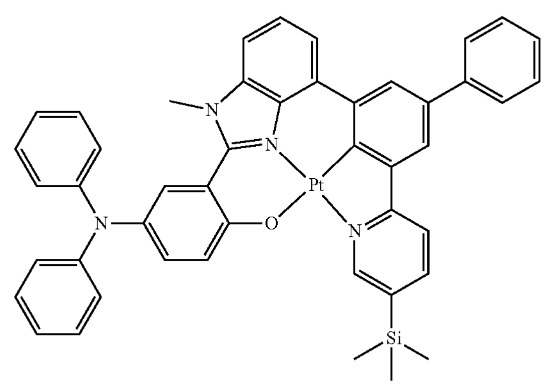

-continued
1-46
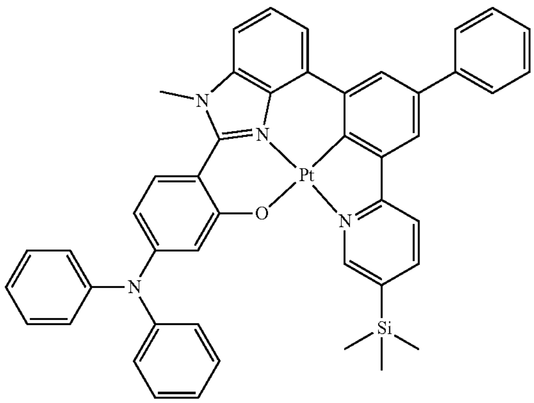
1-47
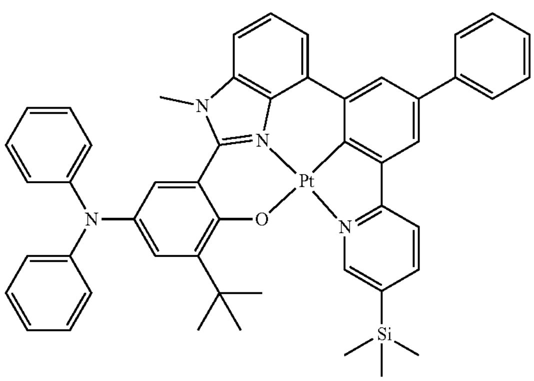
1-48
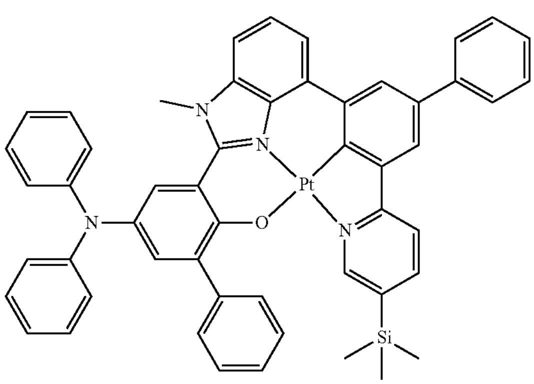
1-49
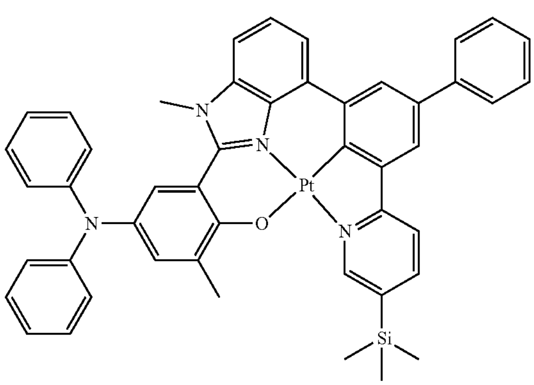
-continued
1-50
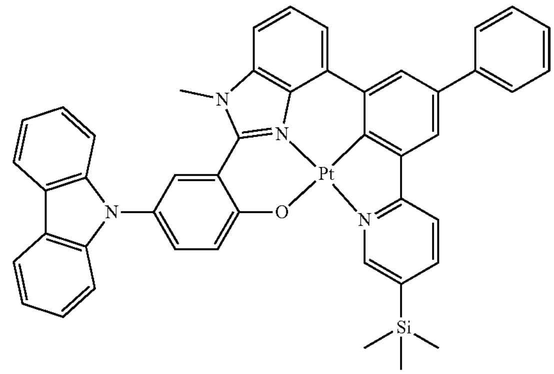
1-51
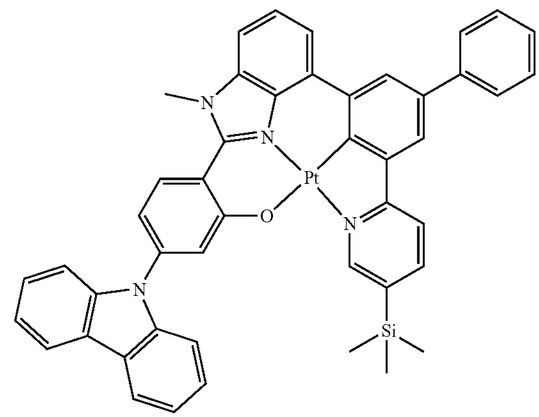
1-52
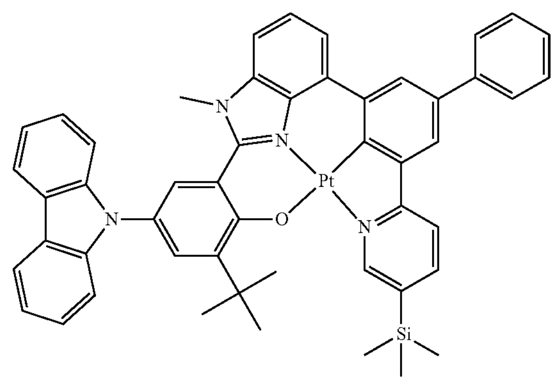
1-53
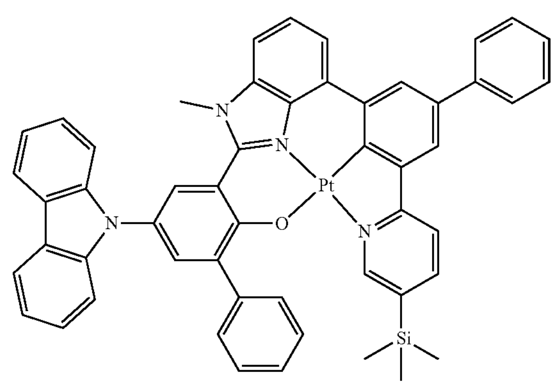

-continued
1-54
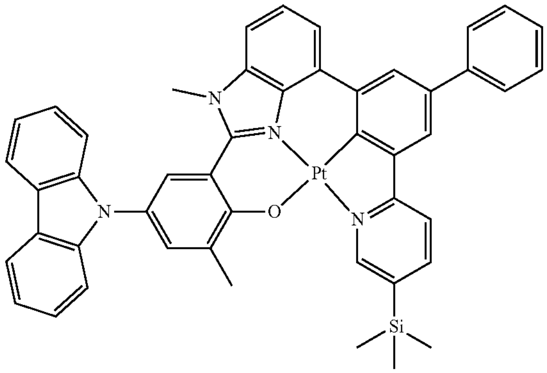
1-55
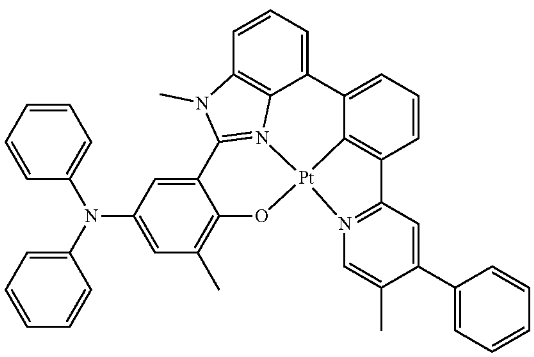
1-56
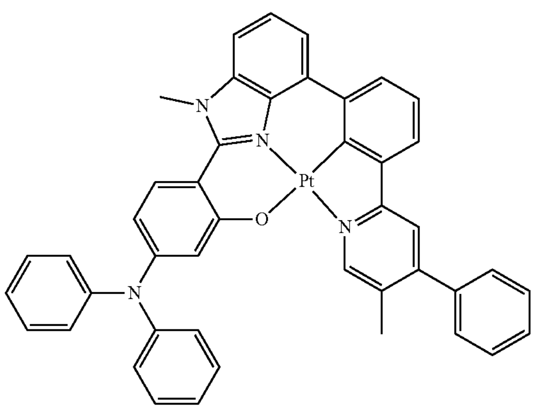
1-57
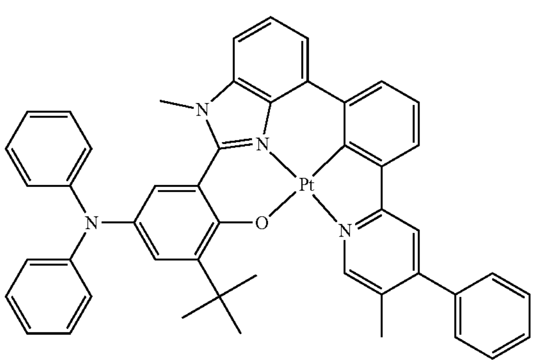
-continued
1-58
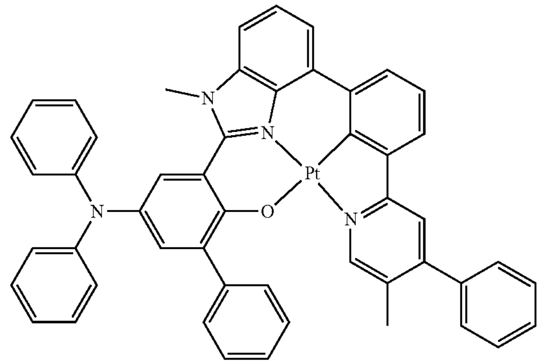
1-59
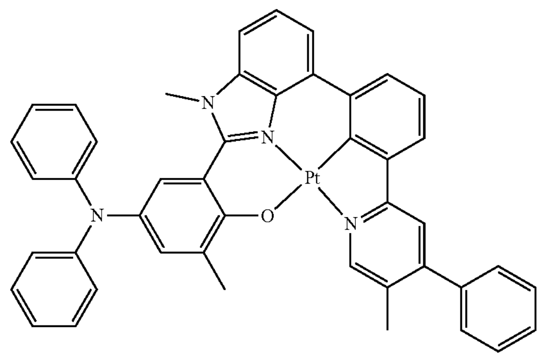
1-60
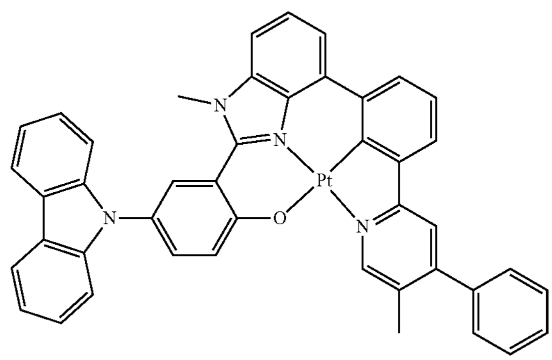
1-61
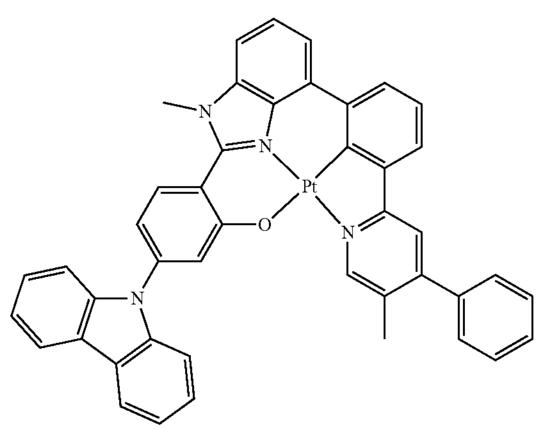

-continued
1-62
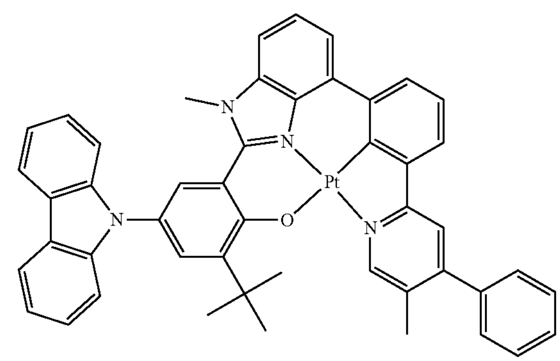
1-63
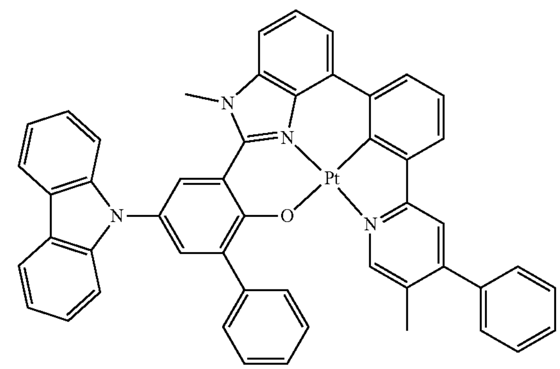
1-64
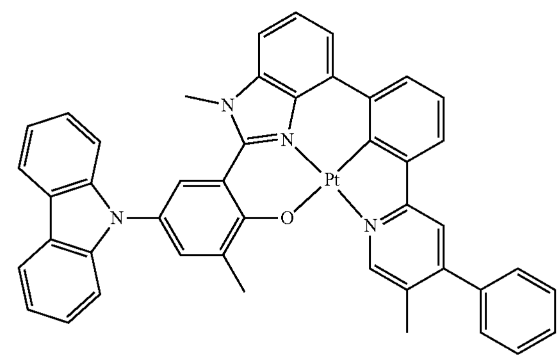
1-65
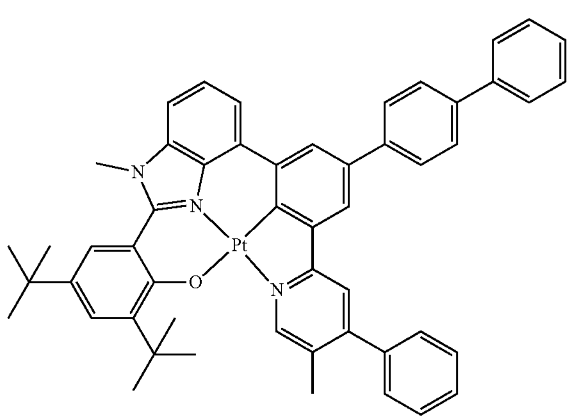
-continued
1-66
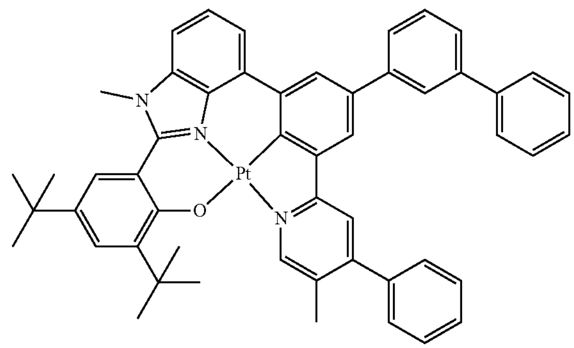
1-67
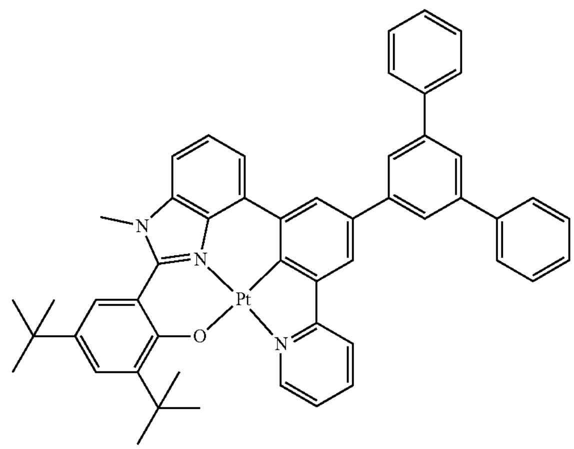
1-68
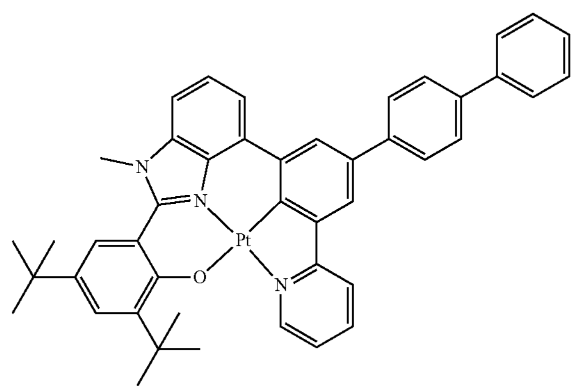
1-69
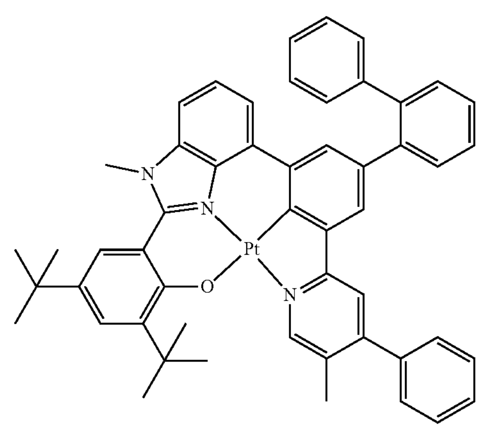

1-70
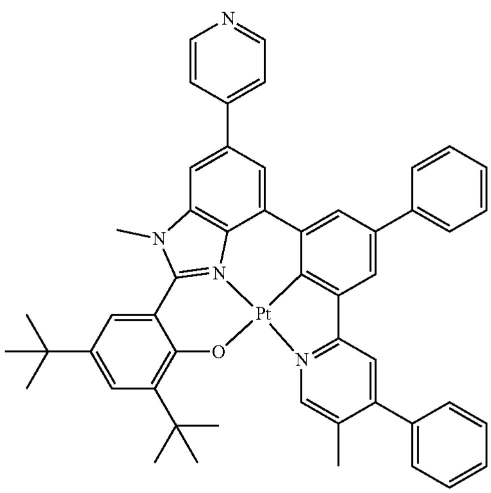
1-71
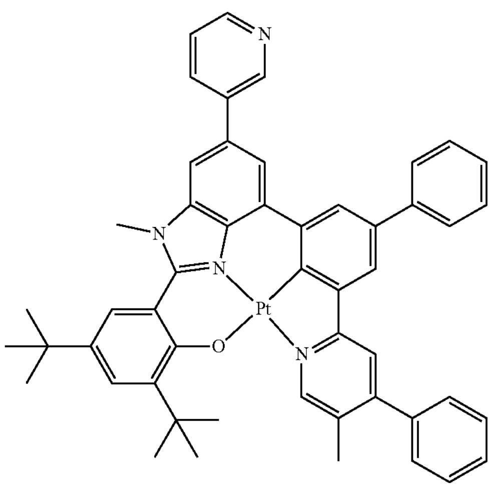
1-72
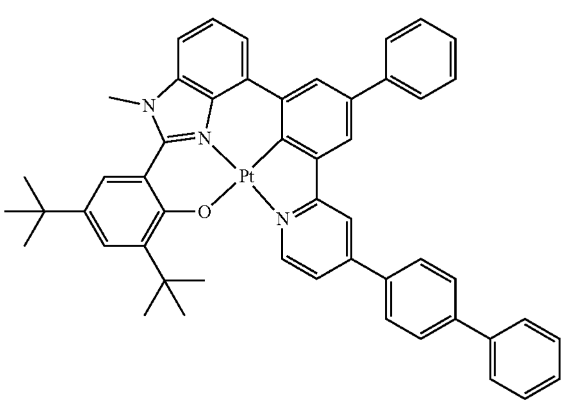
1-73
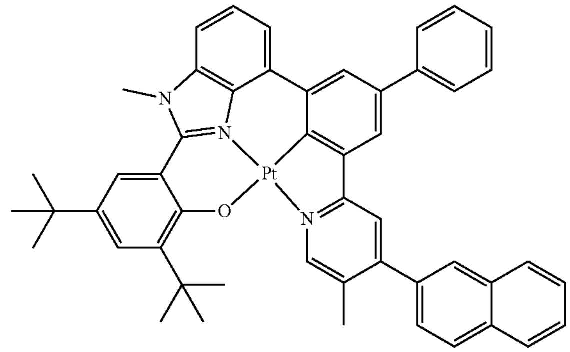
1-74
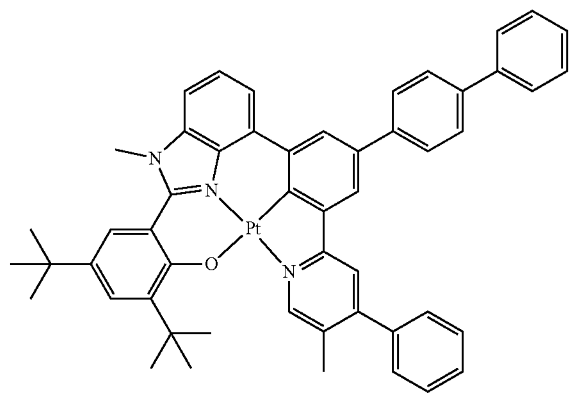
1-75
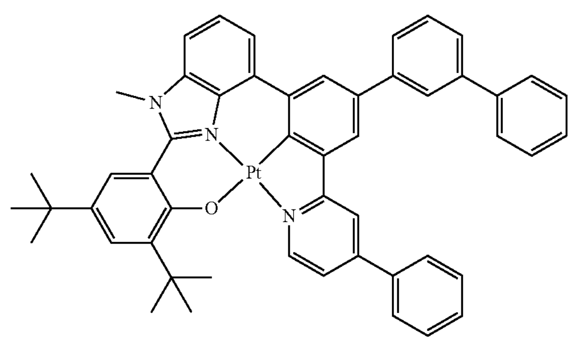
1-76
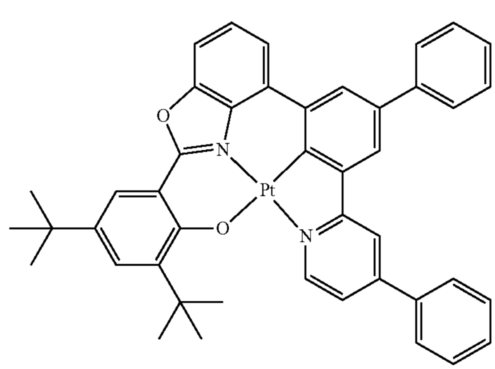

-continued
1-77
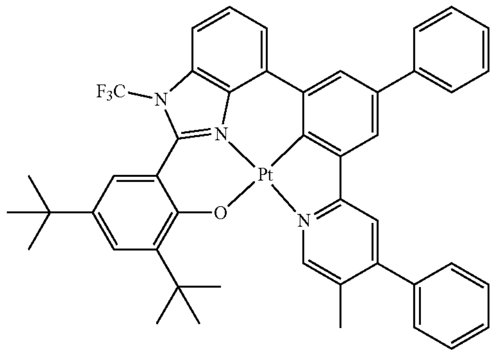
1-78
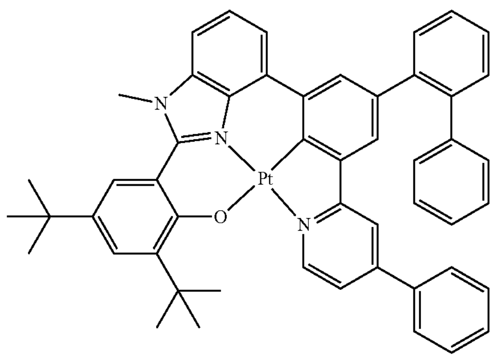
1-79
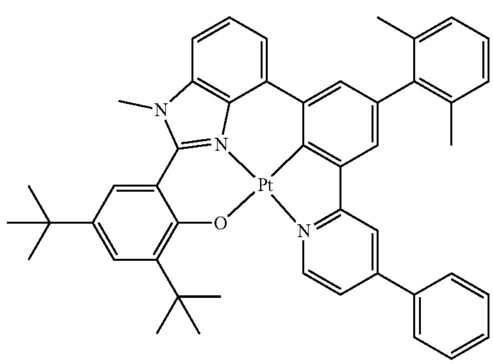
1-80
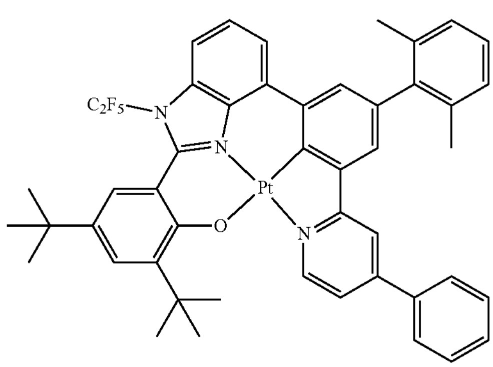
-continued
1-81
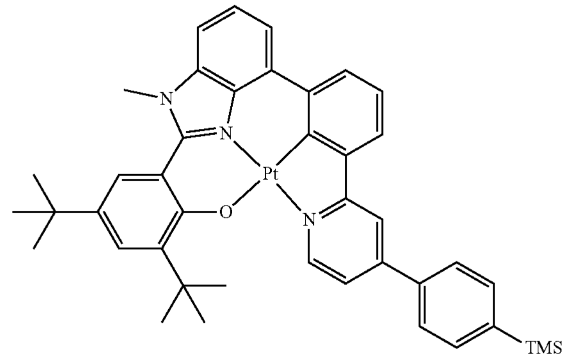
1-82
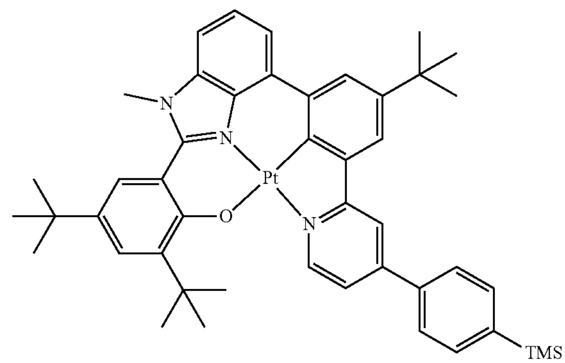
1-83
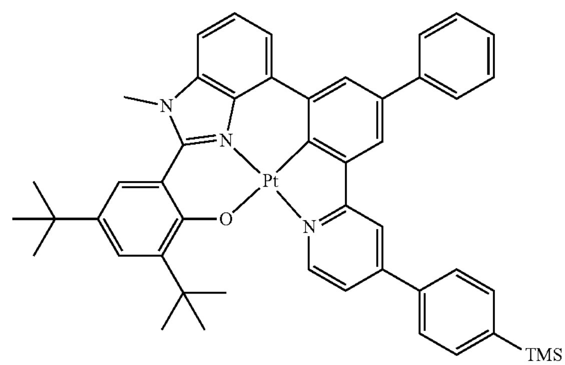
1-84
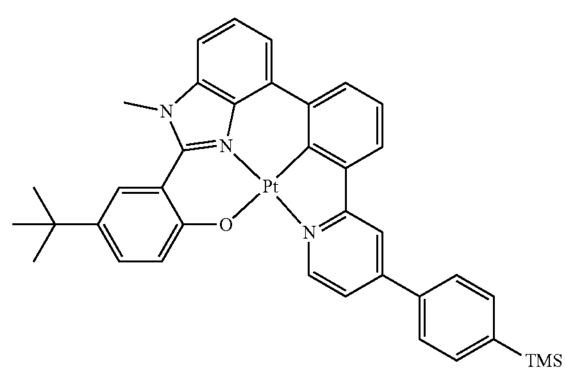

-continued
1-85
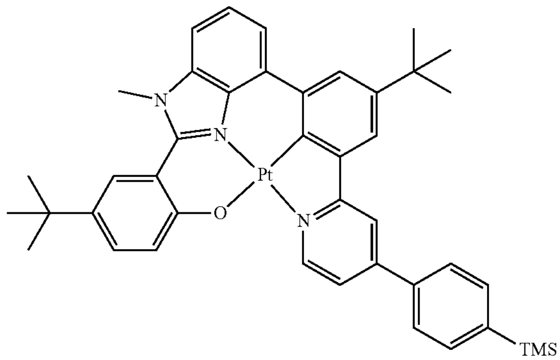
1-86
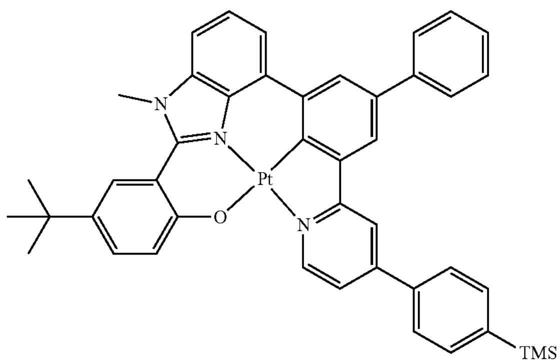
1-87
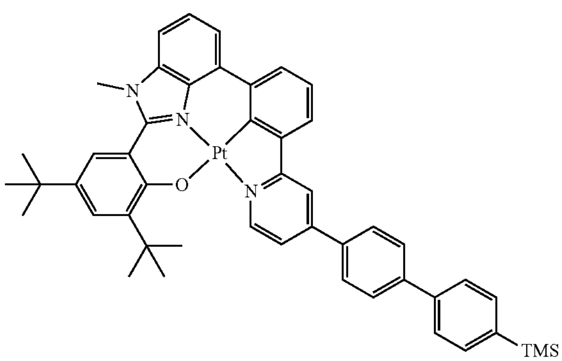
1-88
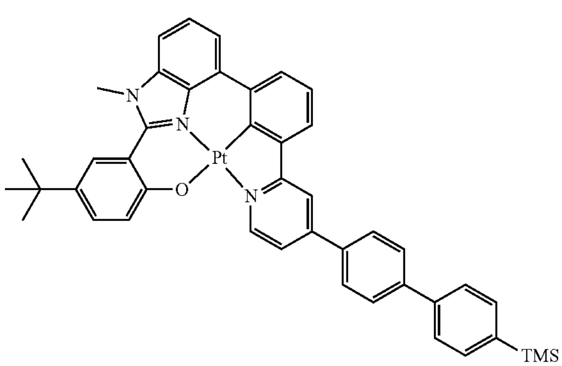
-continued
2-1
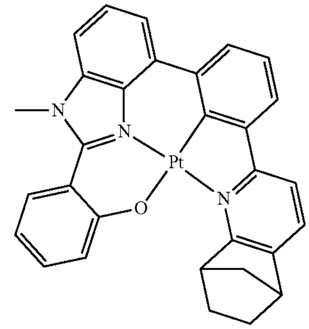
2-2
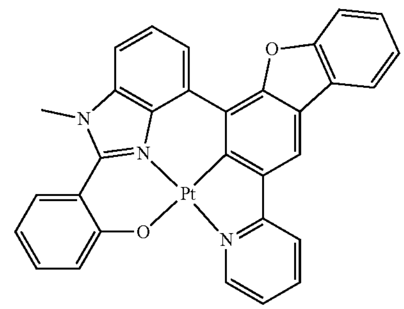
2-3
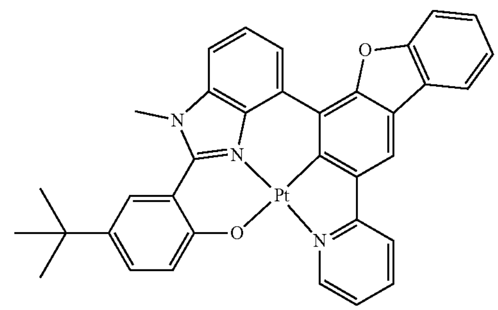
2-4
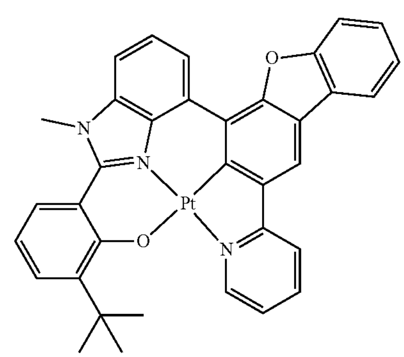

2-5
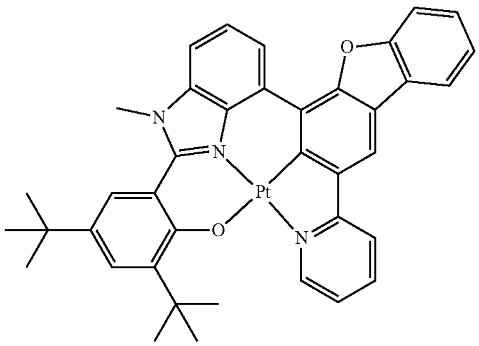
2-6
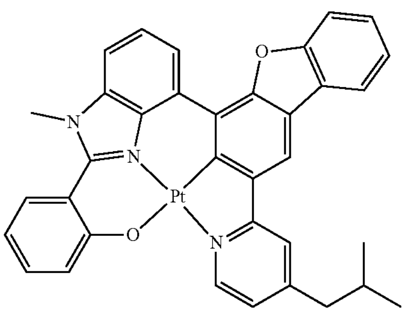
2-7
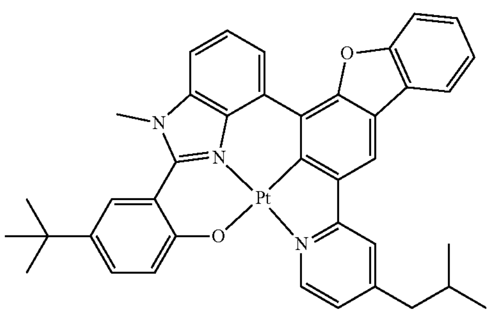
2-8
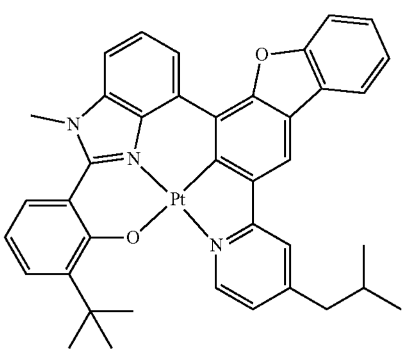
2-9
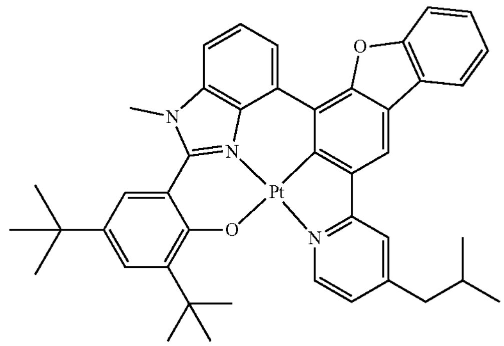
2-10
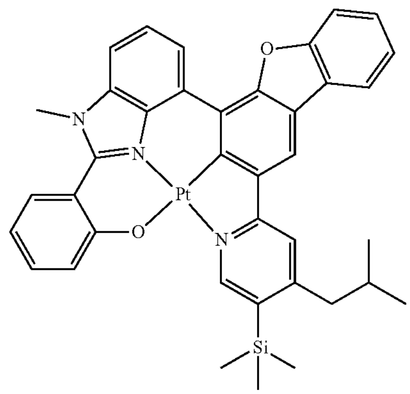
2-11
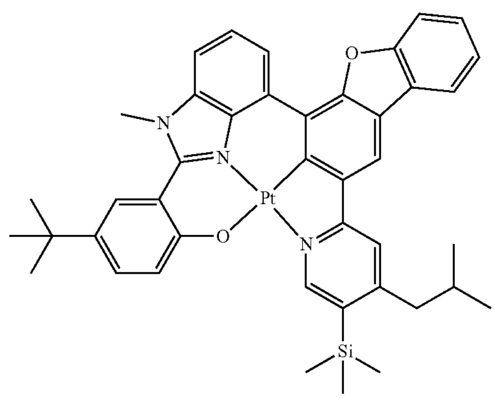
2-12
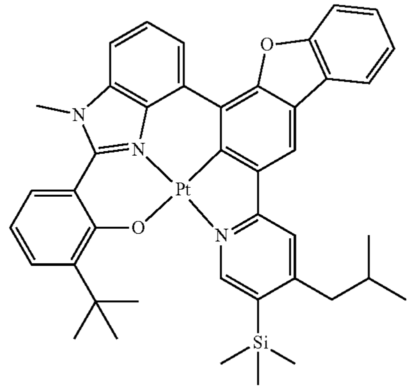

2-13
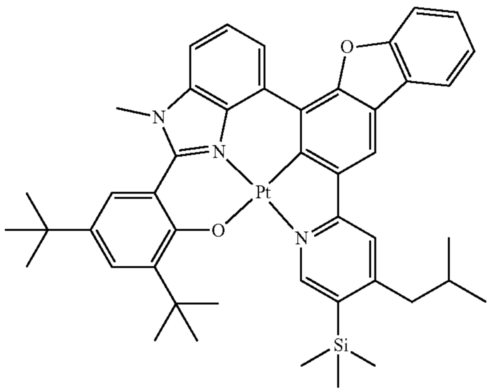
2-14
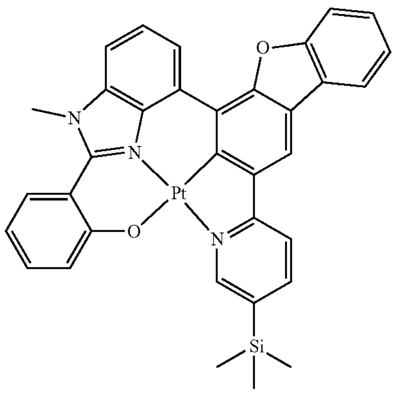
2-15
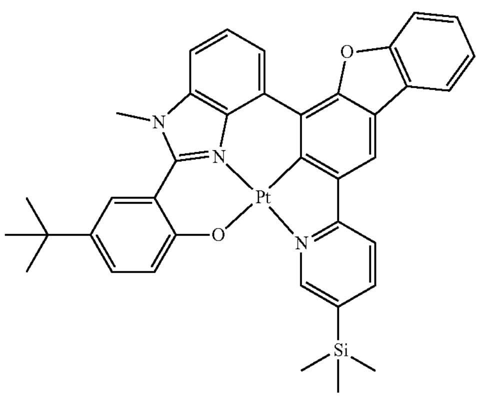
2-16
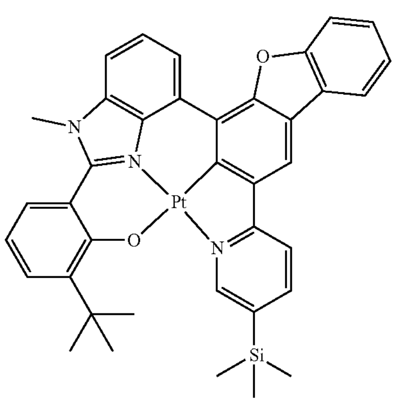
2-17
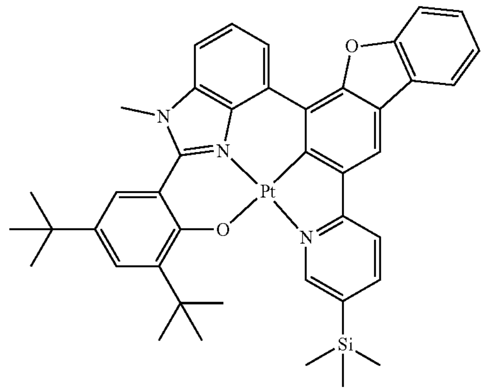
2-18
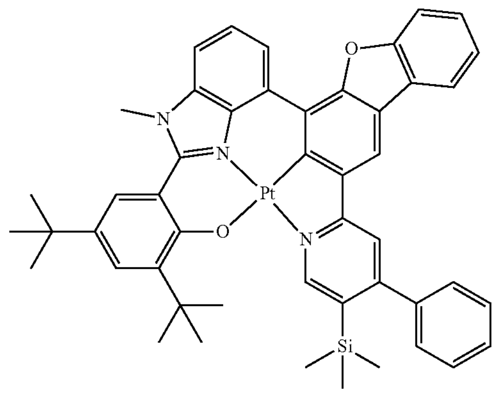
2-19
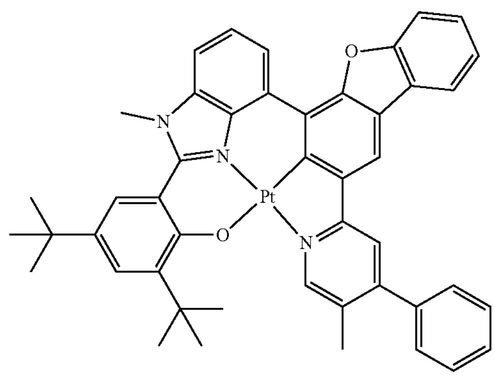
2-20
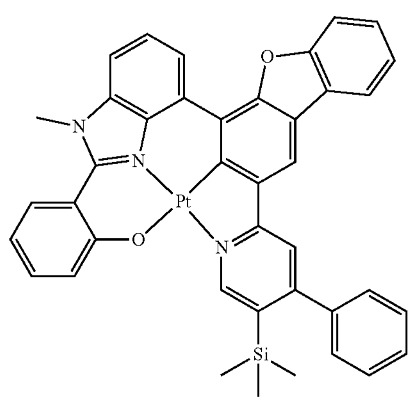

2-21
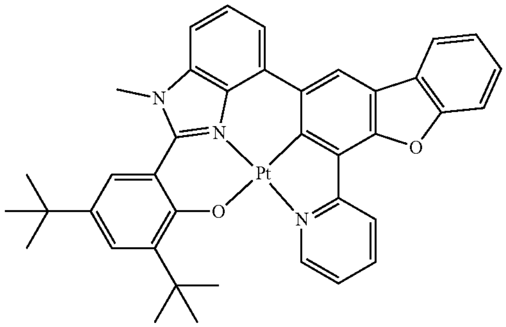
2-22
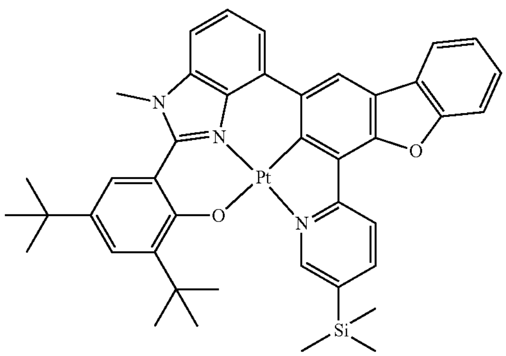
2-23
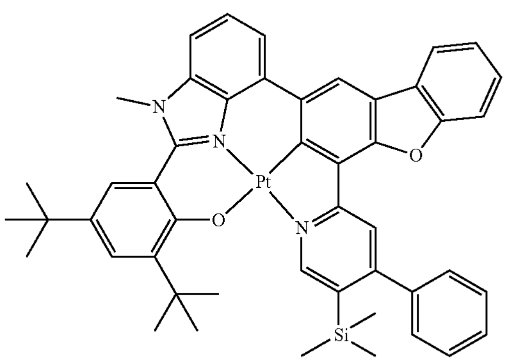
2-24
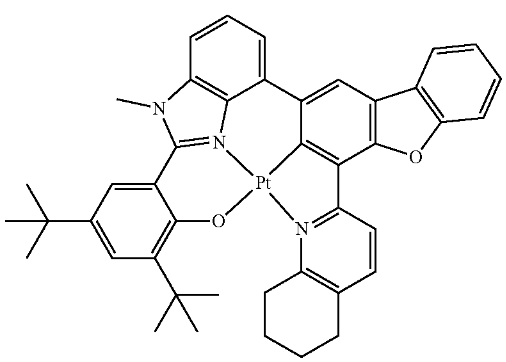
2-25
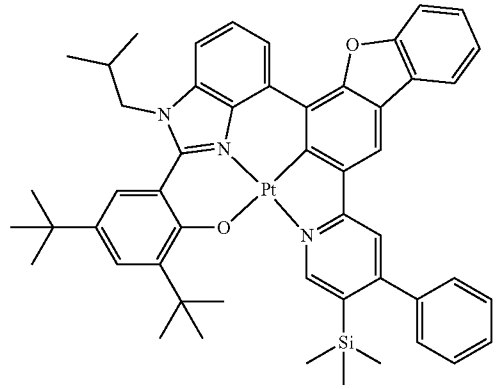
2-26
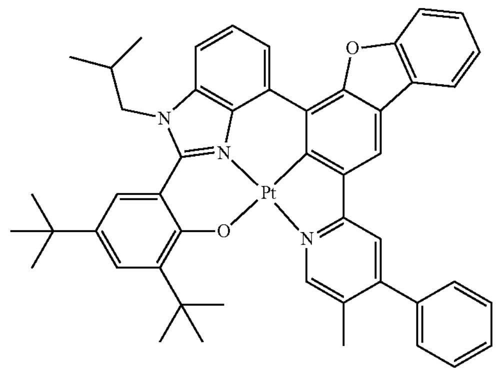
2-27
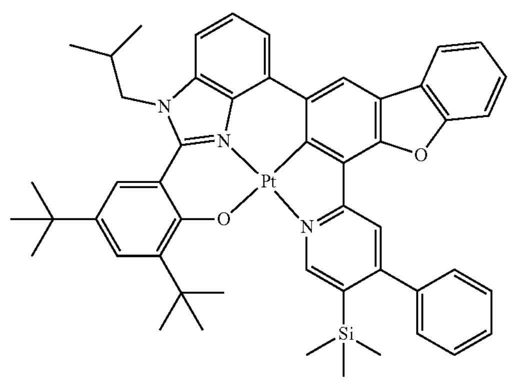
2-28
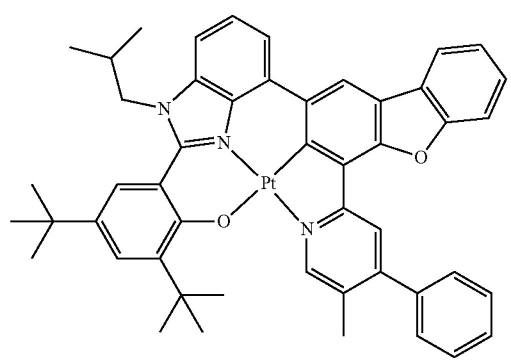

-continued
2-29
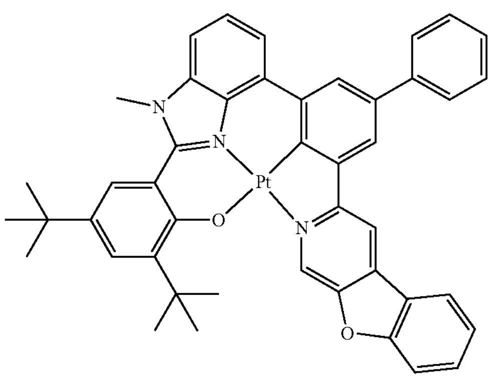
2-30
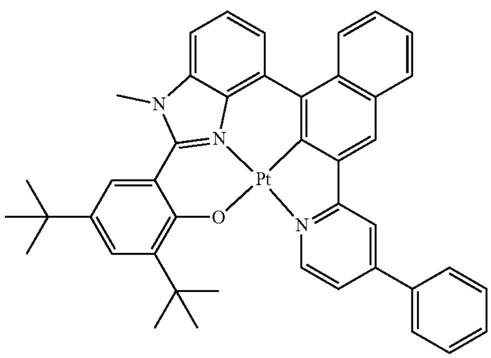
2-31
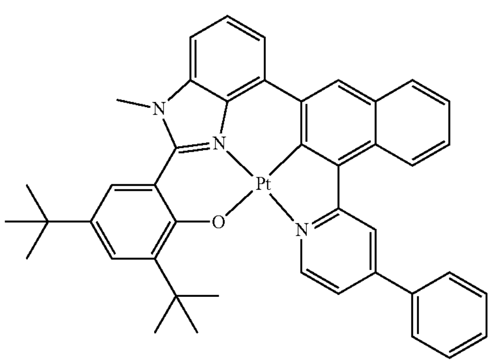
2-32
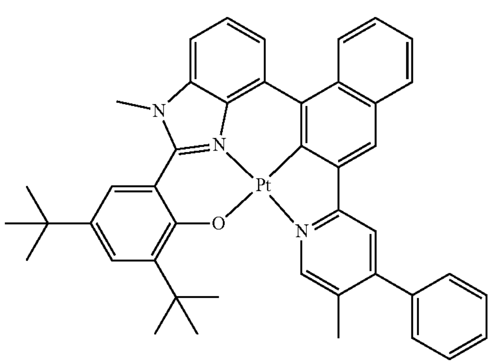
-continued
2-33
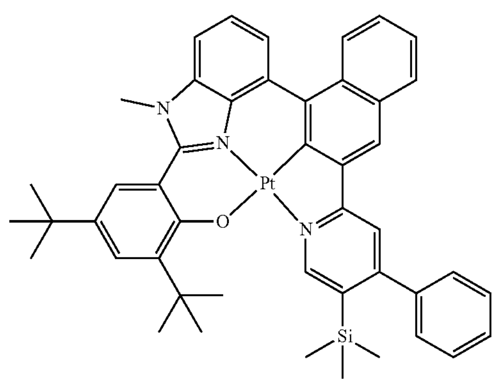
2-34
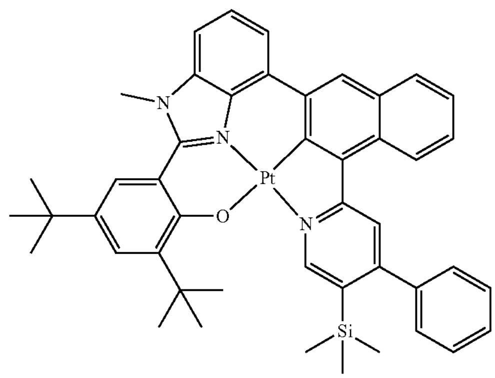
2-35
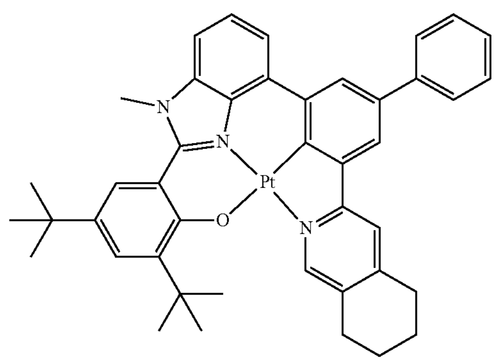
2-36
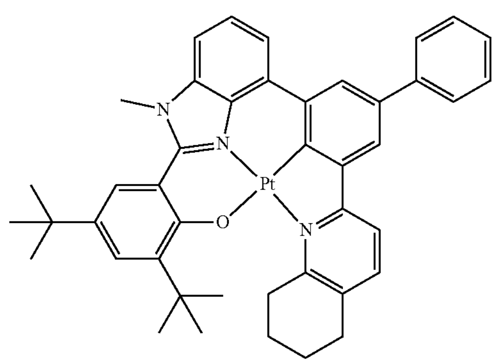

2-37
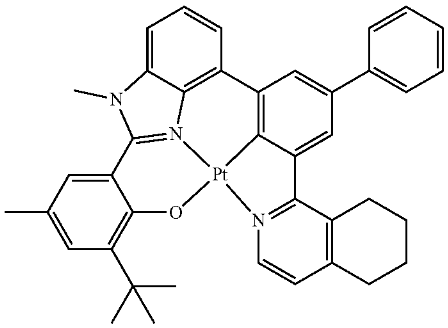
2-38
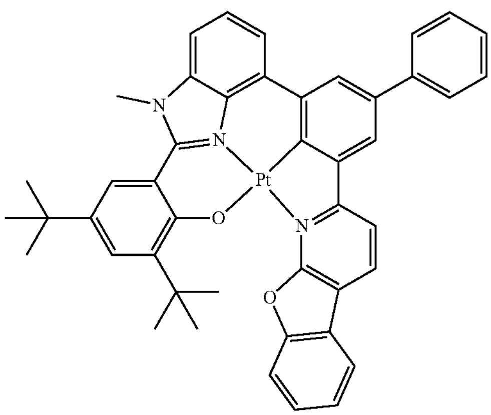
2-39
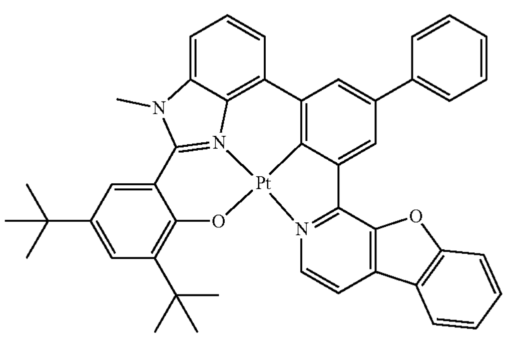
2-40
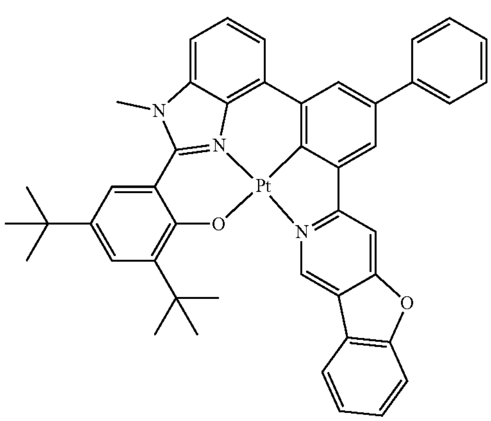
2-41
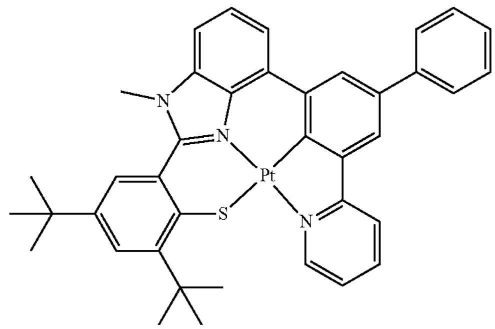
2-42
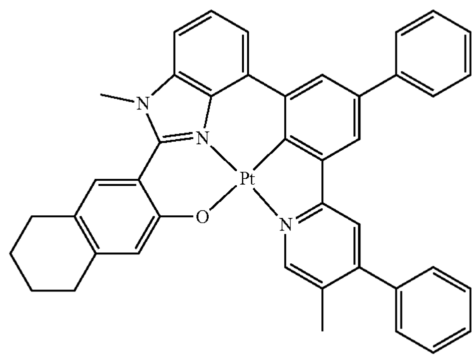
2-43
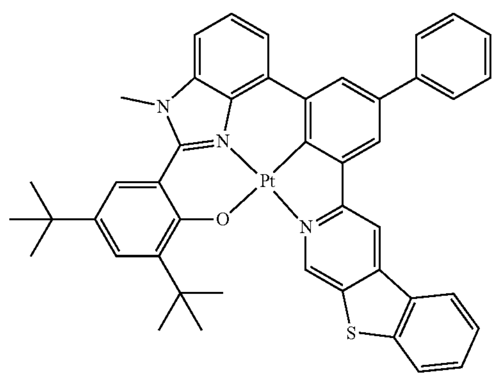
2-44
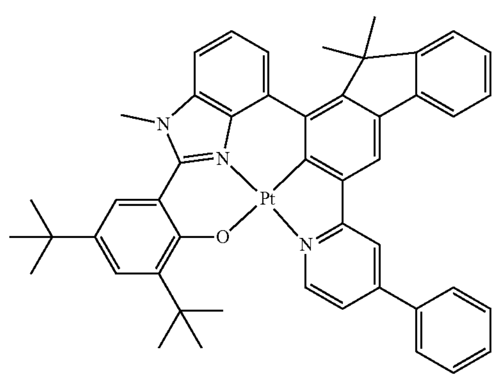

-continued
2-45
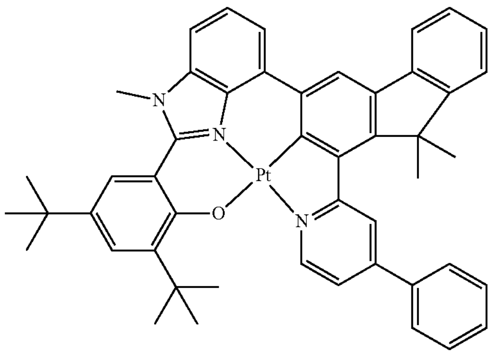
2-46
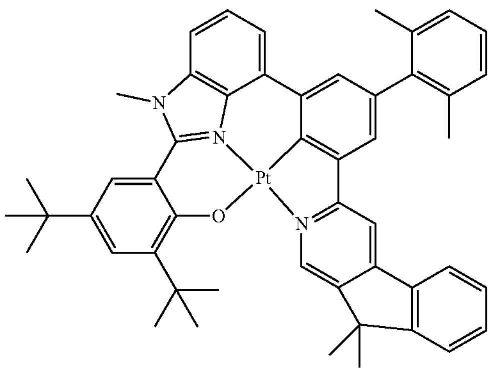
2-47
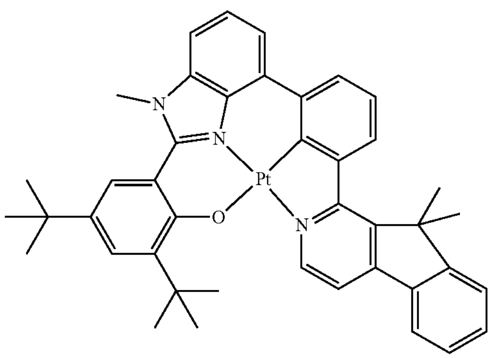
3-1
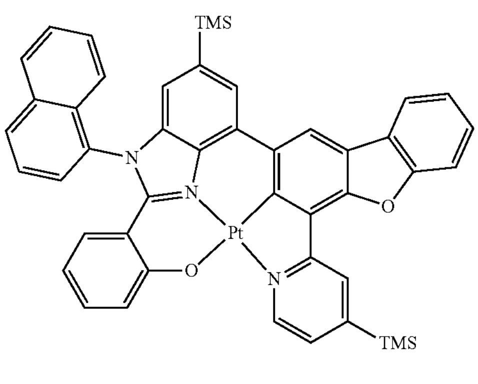
-continued
3-2
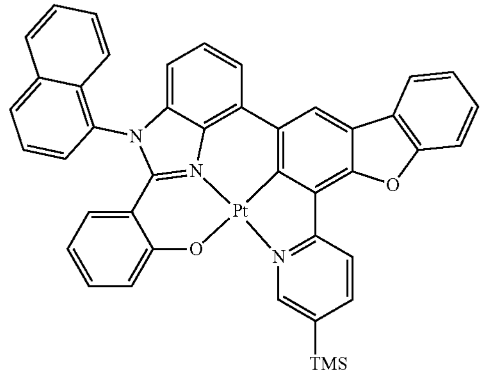
3-3
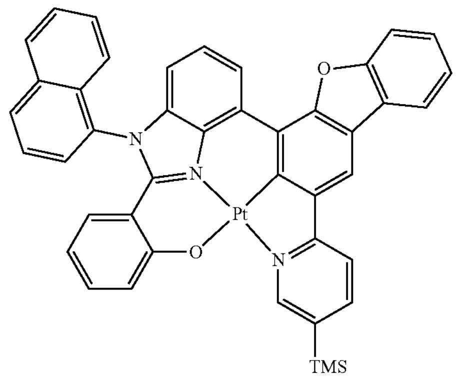
3-4
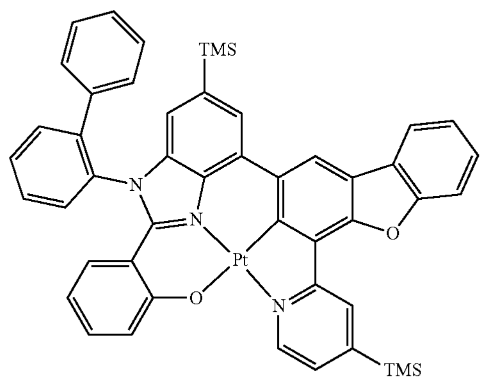
3-5
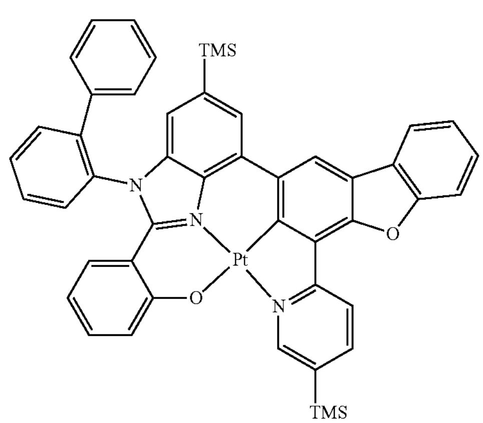

-continued
3-6
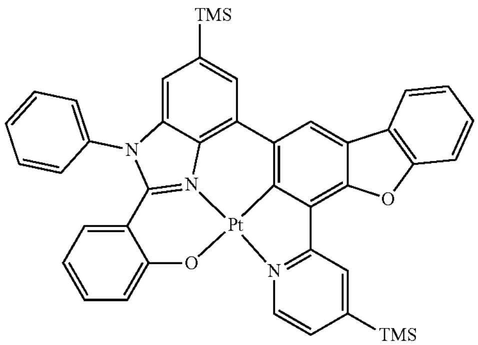
3-7
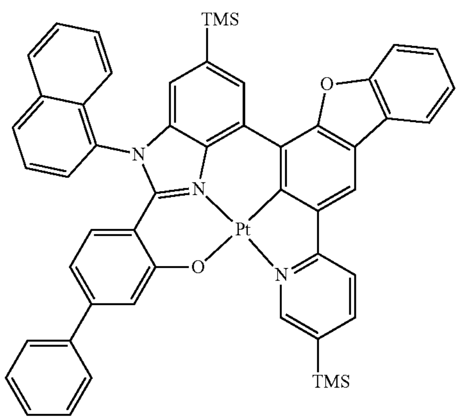
3-8
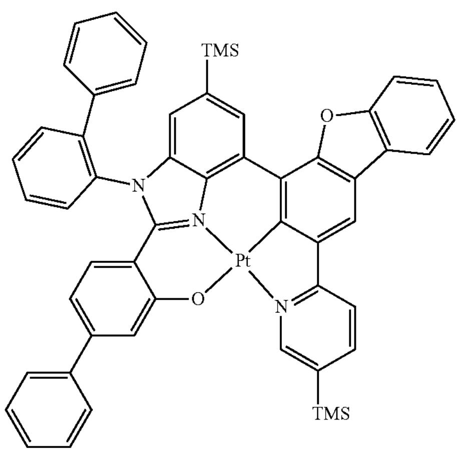
3-9
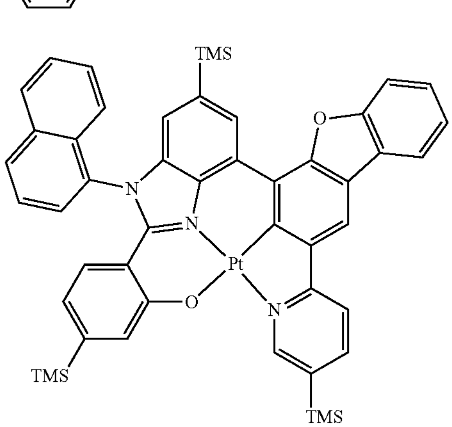
-continued
3-10
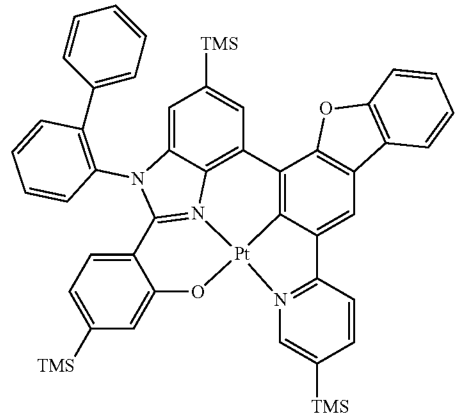
3-11
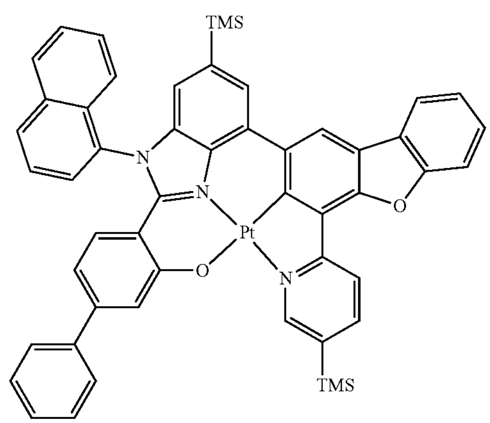
3-12
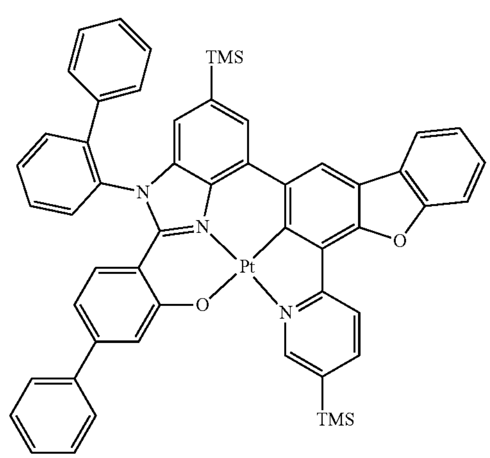

-continued
3-13
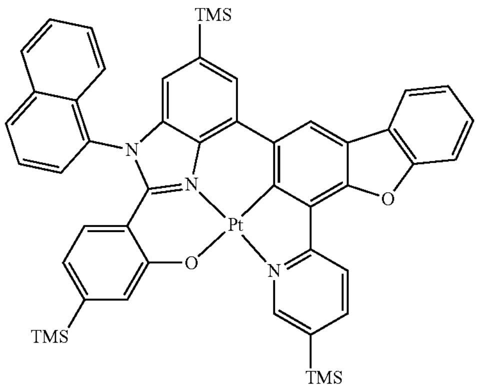
3-14
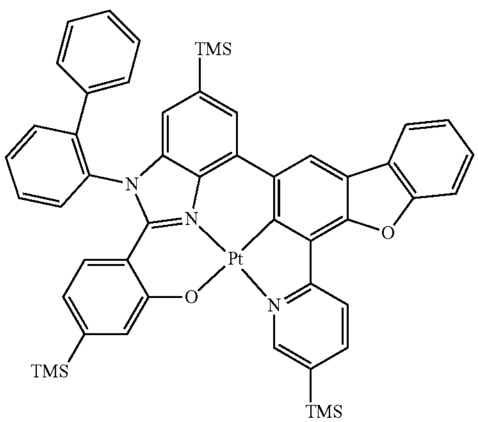
3-15
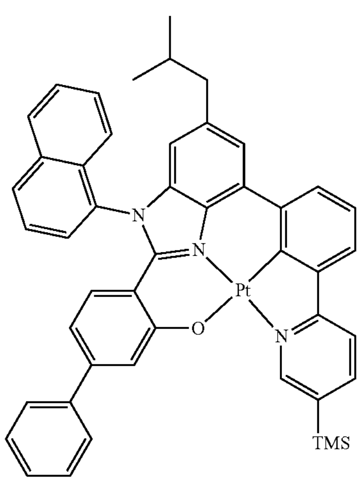
-continued
3-16
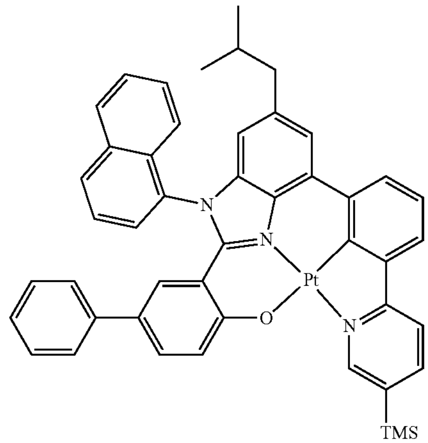
3-17
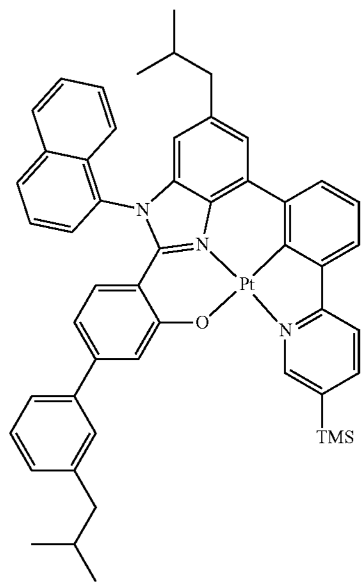
3-18
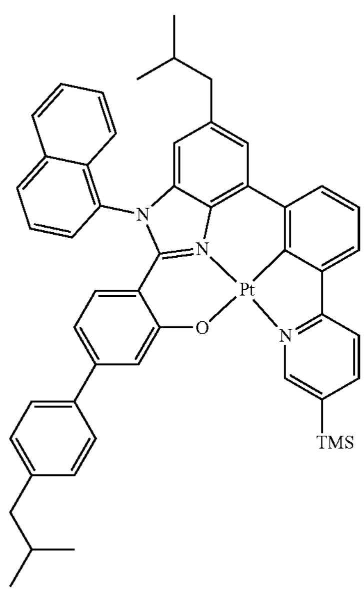

-continued
3-19
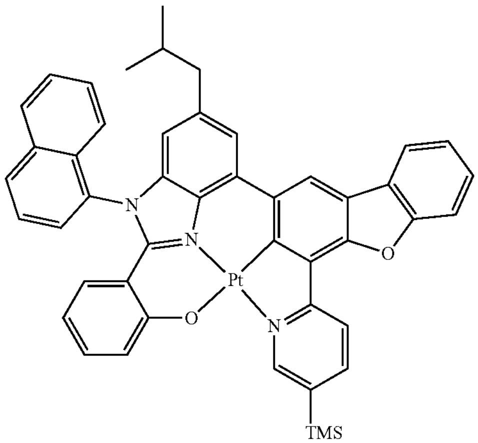
3-20
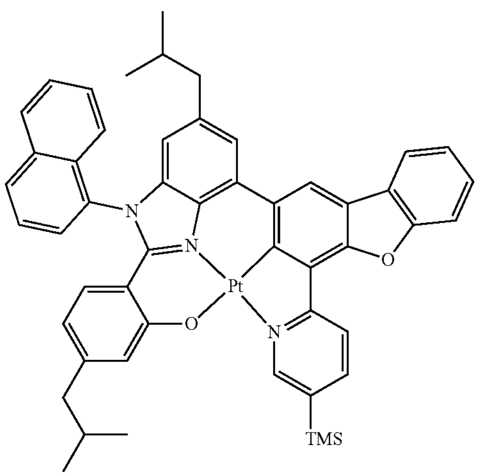
3-21
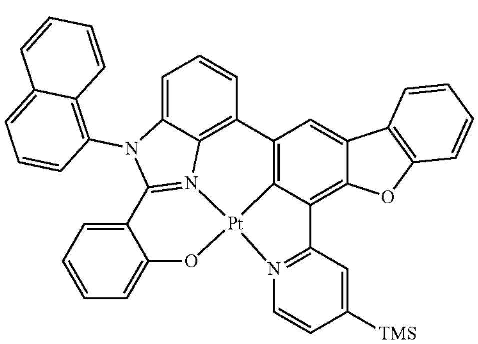
-continued
3-22
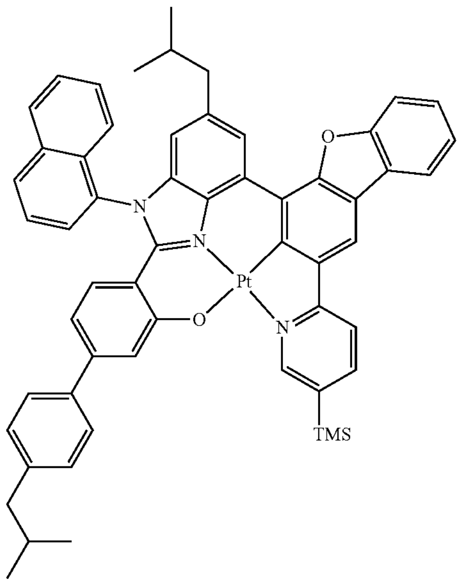
3-23
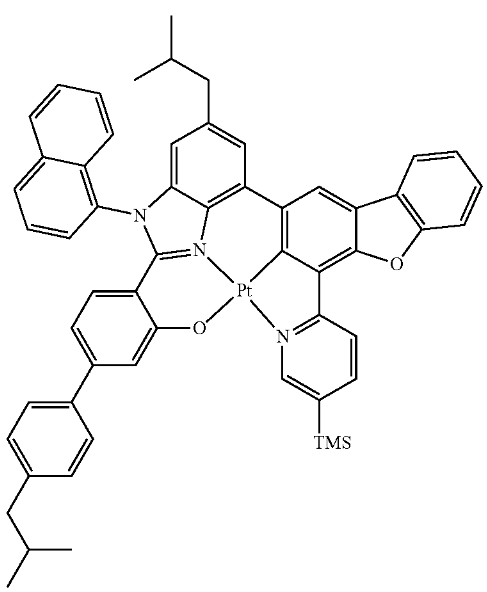

-continued
3-24
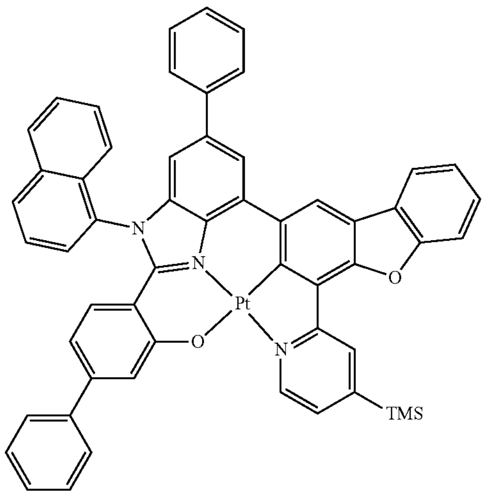
3-25
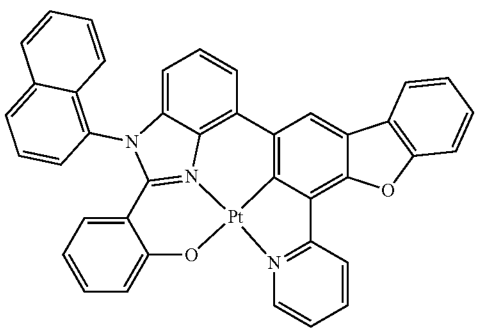
3-26
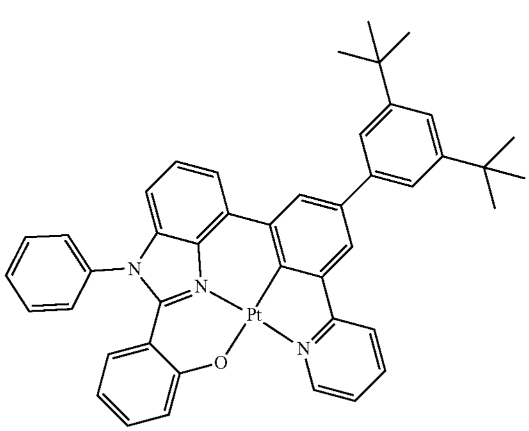
-continued
3-27
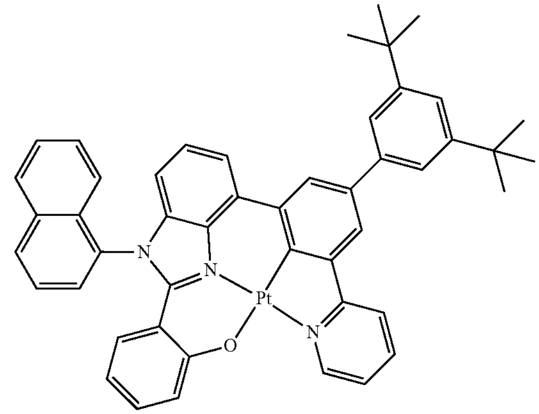
3-28
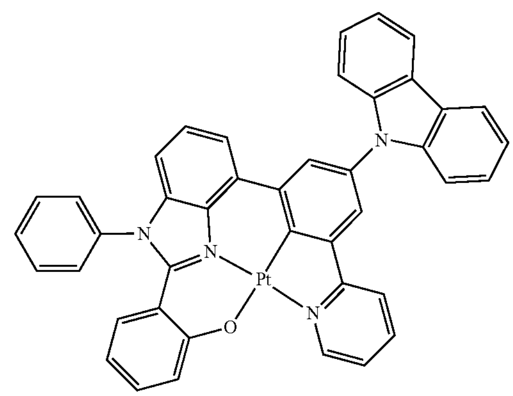
3-29
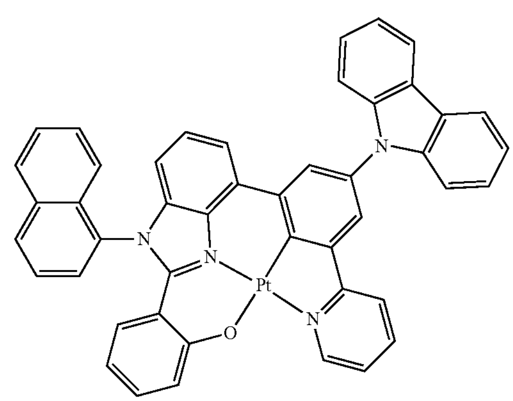

-continued
3-30
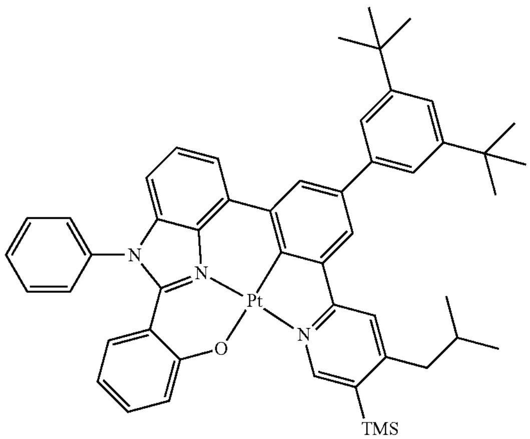
3-31
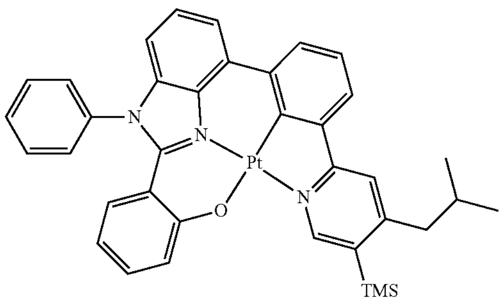
3-32
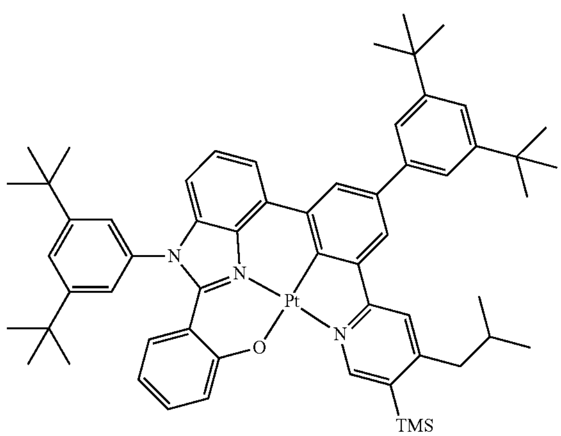
3-33
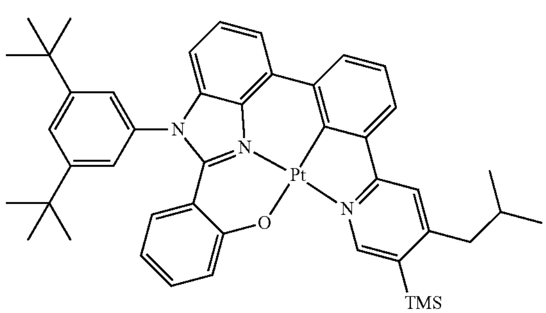
-continued
3-34
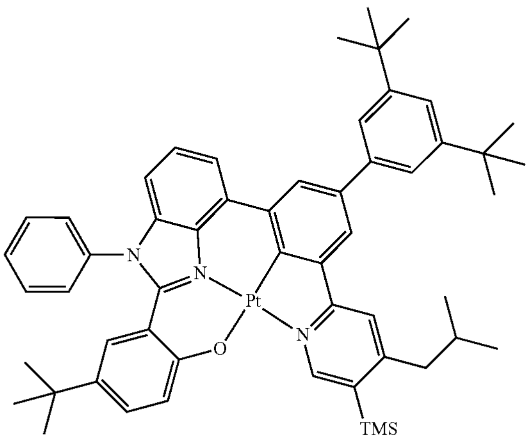
3-35
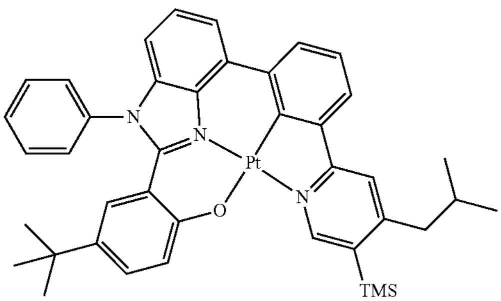
3-36
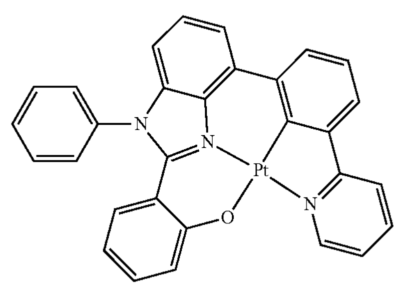
3-37
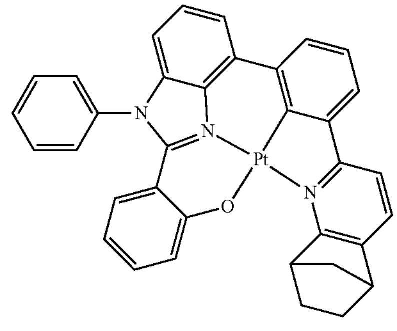

-continued
3-38
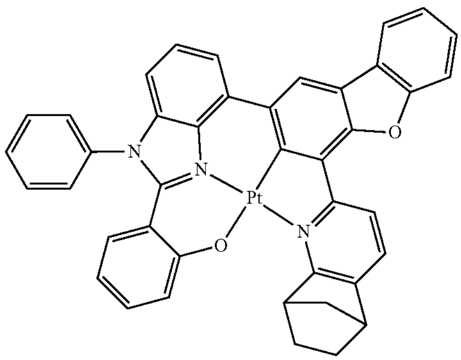
3-39
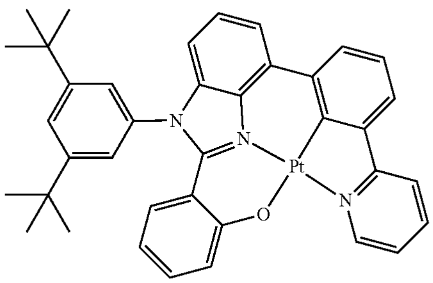
3-40
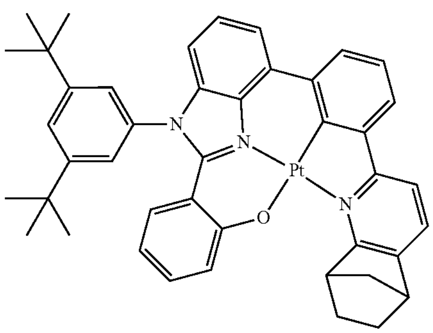
3-41
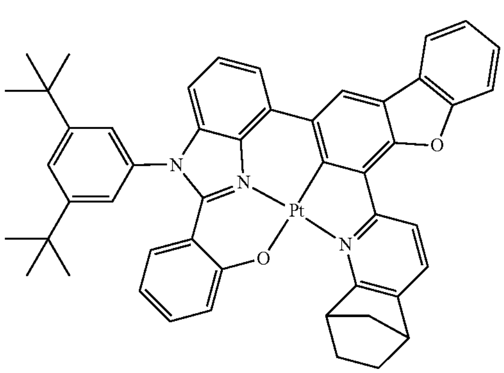
-continued
3-42
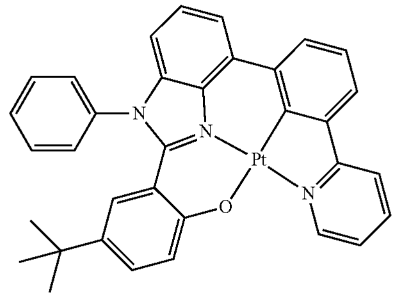
3-43
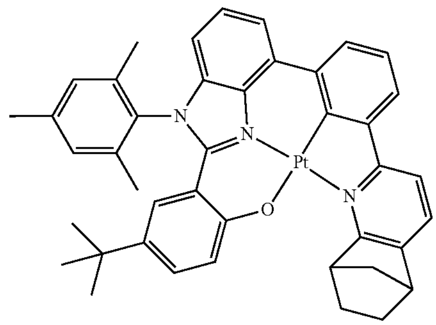
3-44
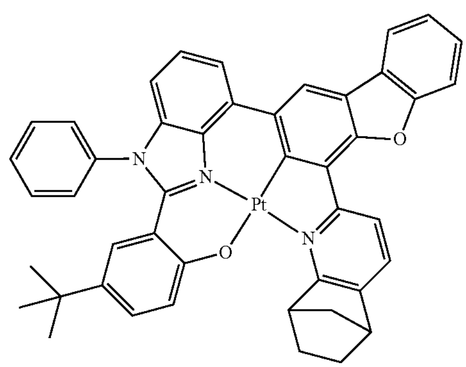
3-45
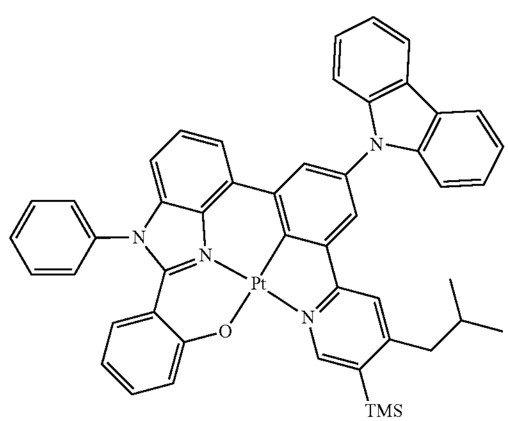

-continued
3-46
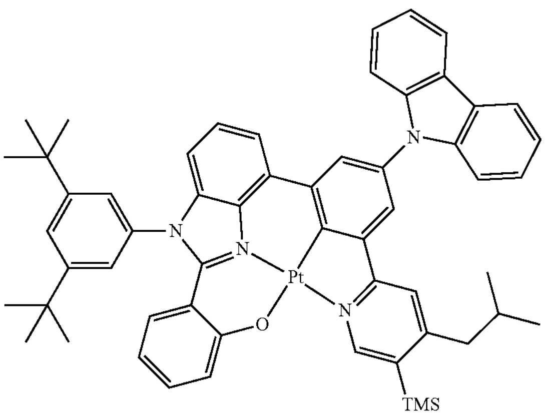
3-47
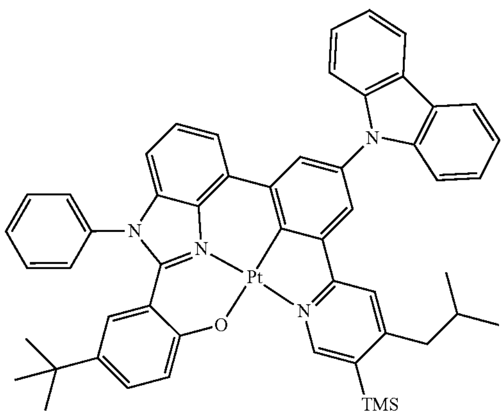
3-48
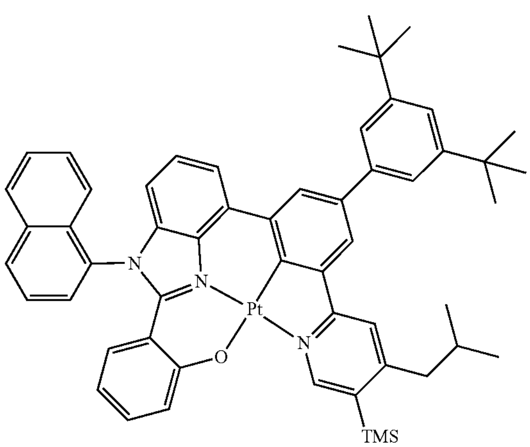
3-49
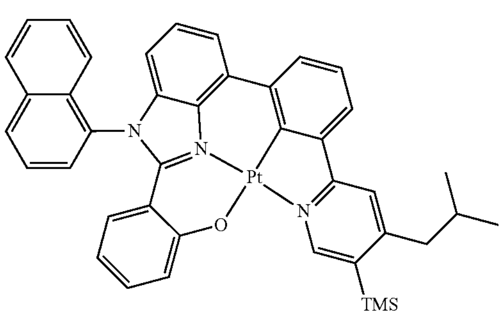
-continued
3-50
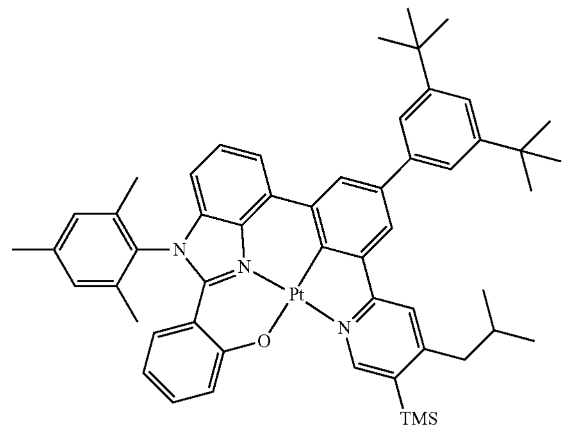
3-51
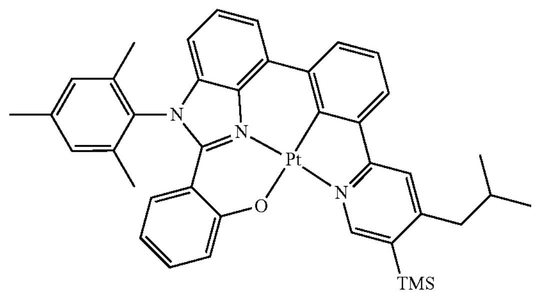
3-52
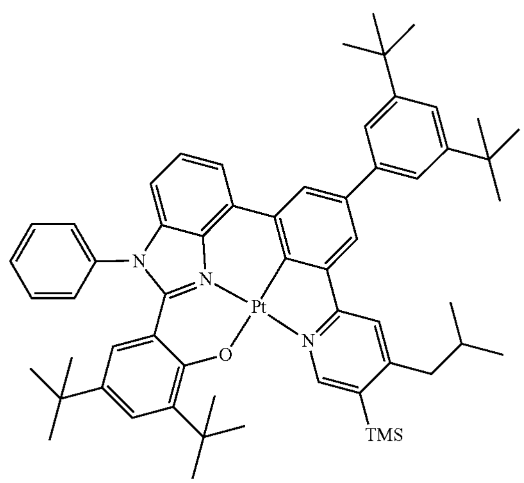
3-53
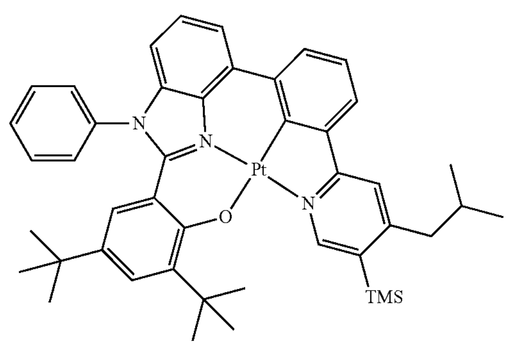

-continued
3-54
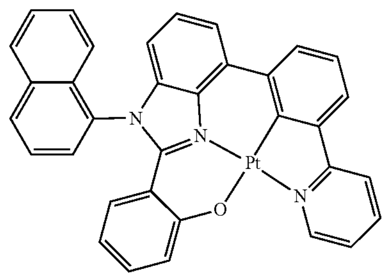
3-55
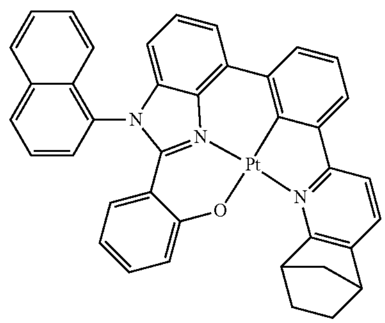
3-56
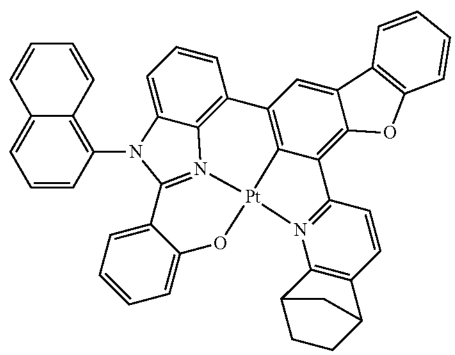
3-57
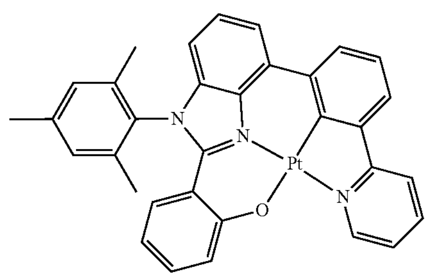
3-58
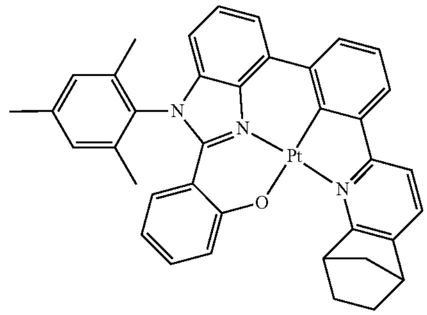
-continued
3-59
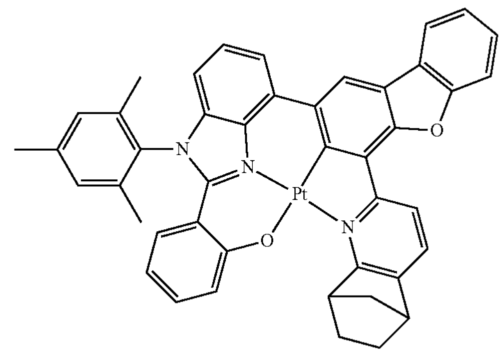
3-60
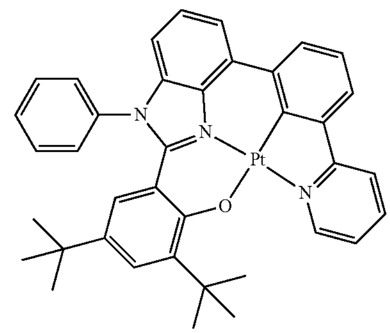
3-61
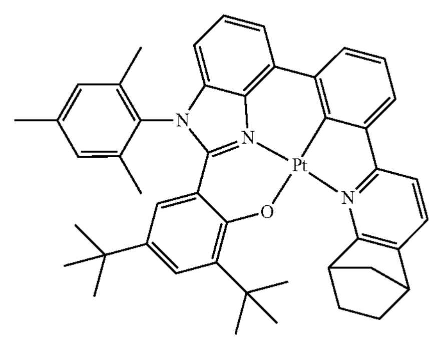
3-62
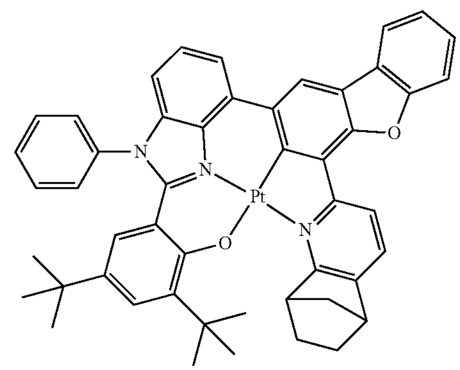

-continued
3-63
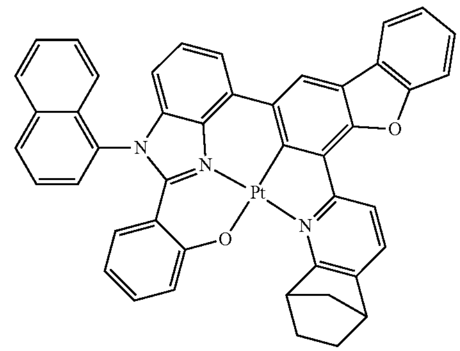
3-64
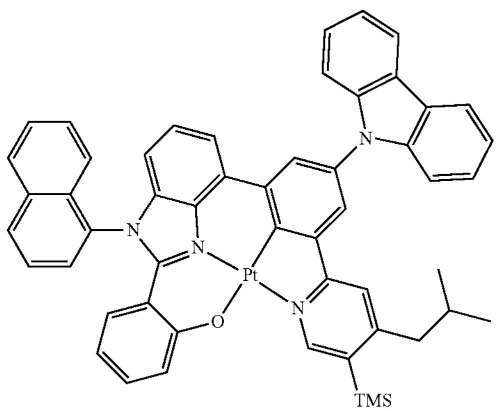
3-65
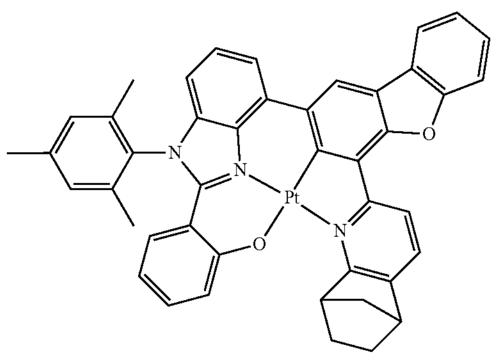
3-66
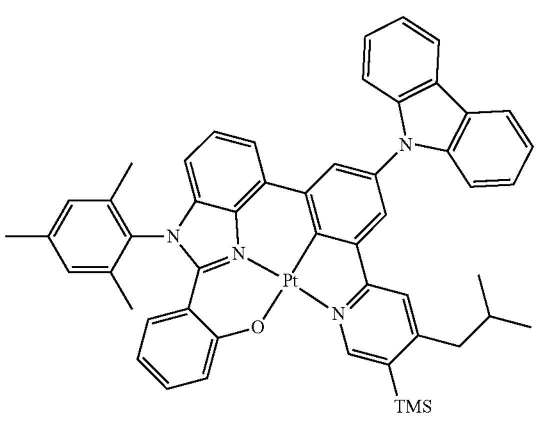
-continued
3-67
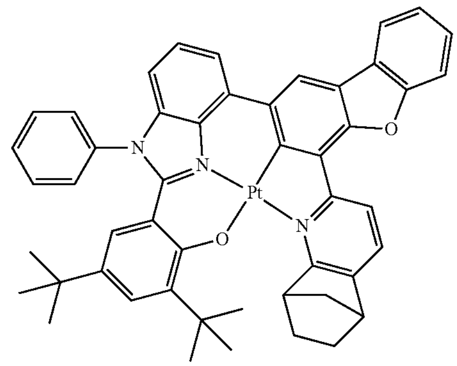
3-68
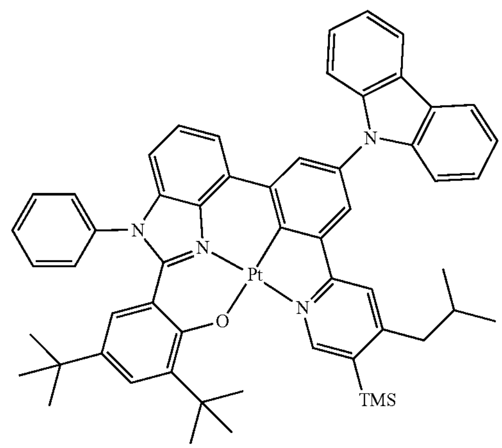
3-69
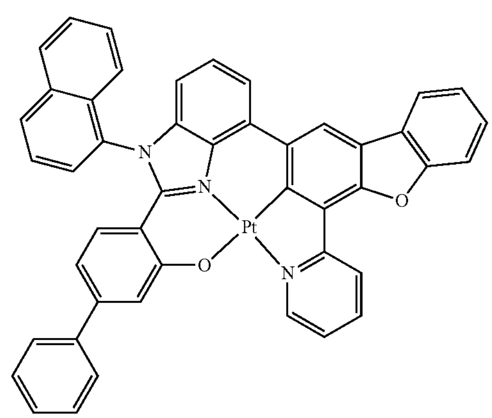

-continued
3-70
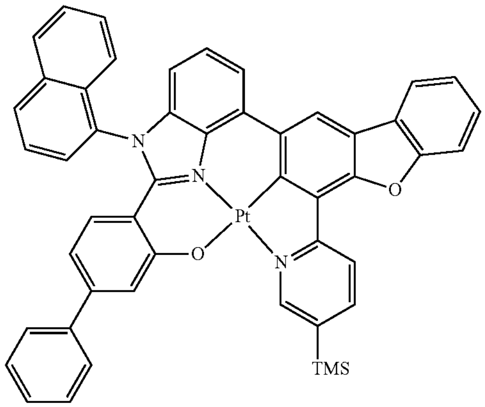
3-71
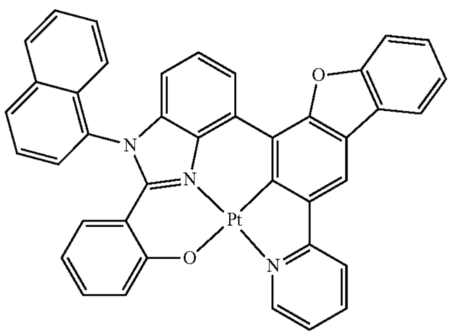
3-72
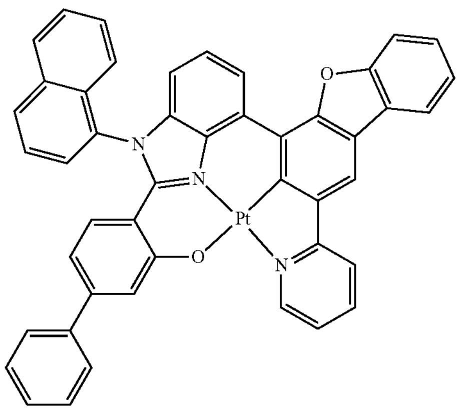
3-73
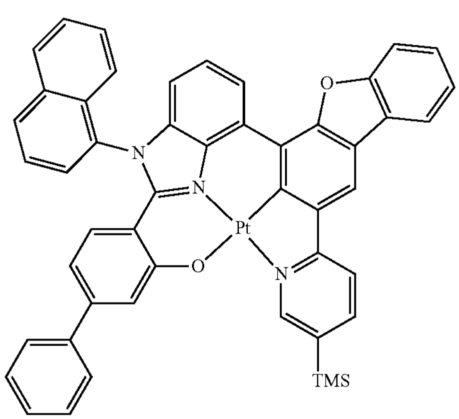
-continued
3-74
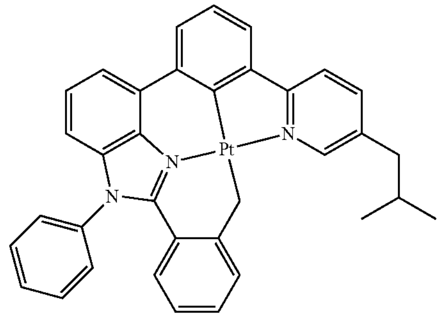
3-75
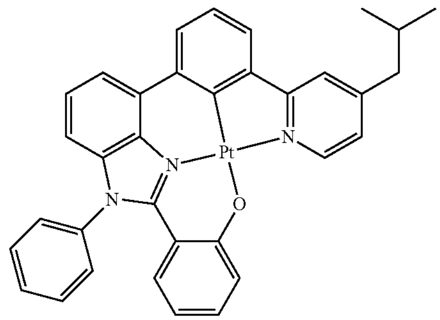
3-76
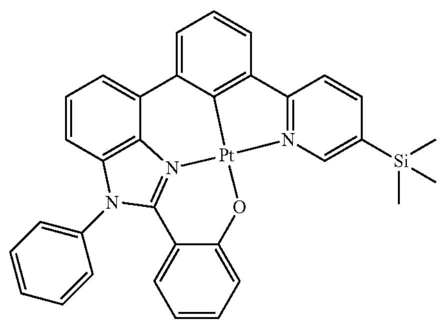
3-77
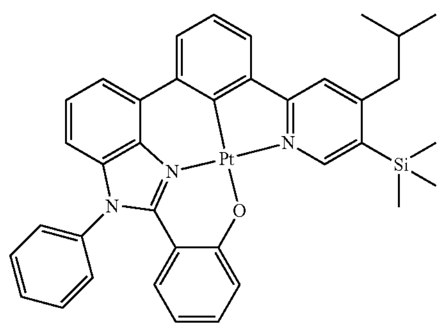
3-78
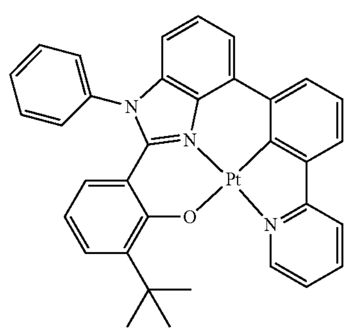

-continued
3-79
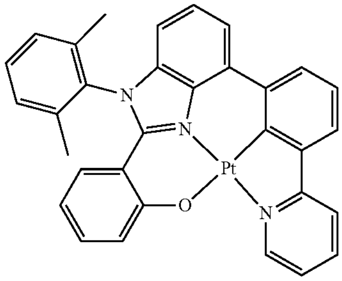
3-80
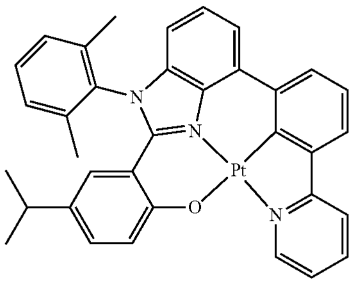
3-81
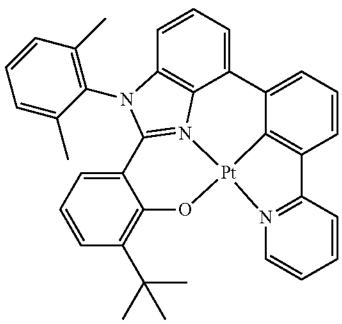
3-82
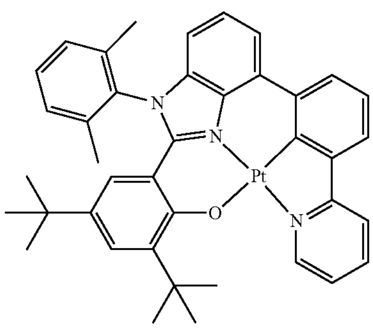
3-83
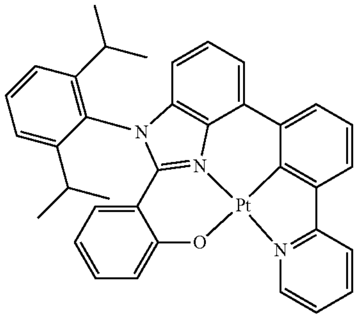
-continued
3-84
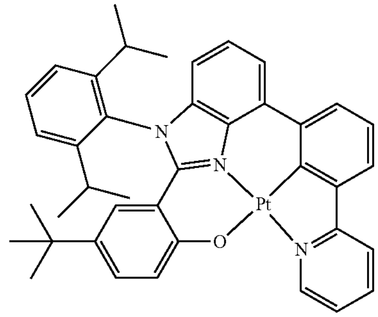
3-85
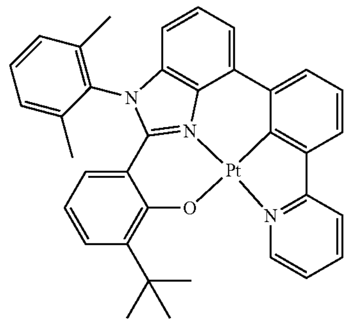
3-86
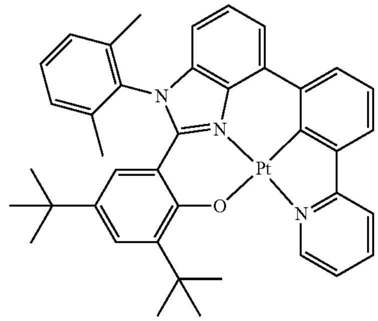
3-87
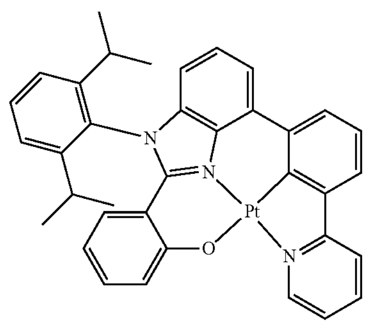
3-88
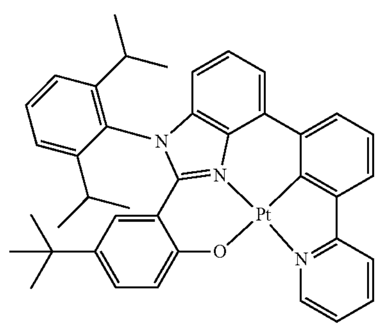

-continued
3-89
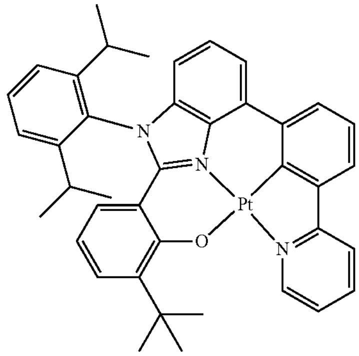
3-90
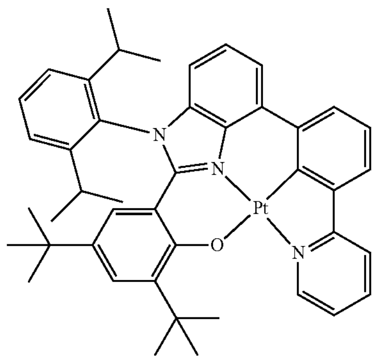
3-91
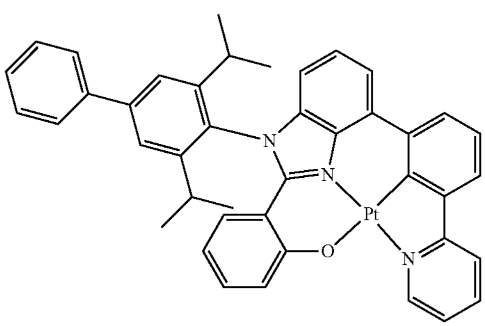
3-92
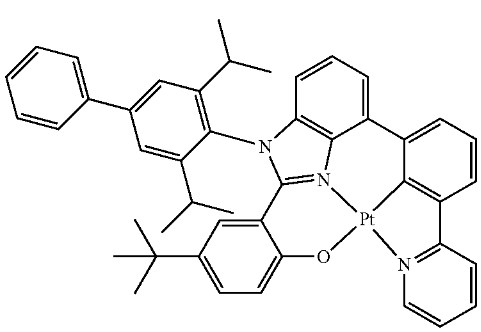
-continued
3-93
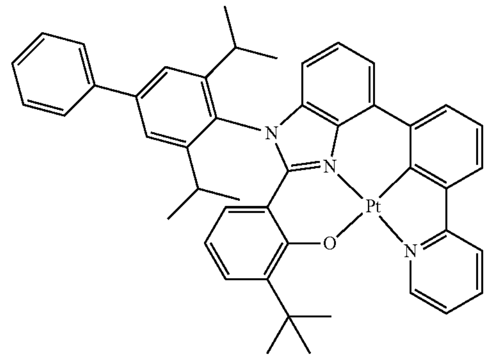
3-94
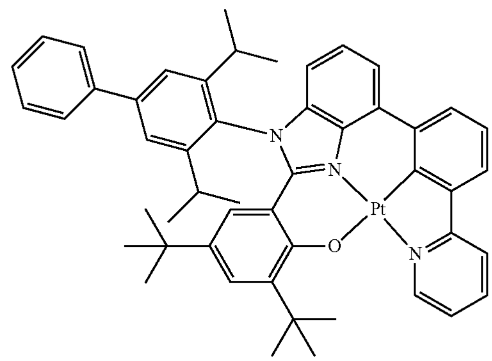
3-95
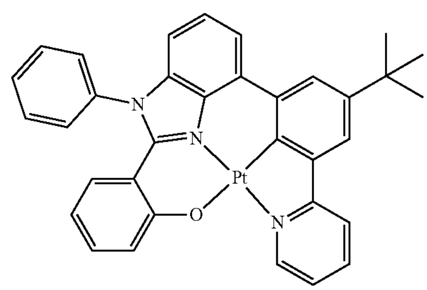
3-96
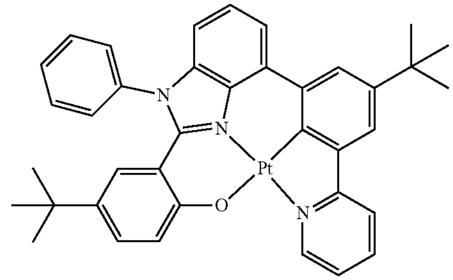
3-97
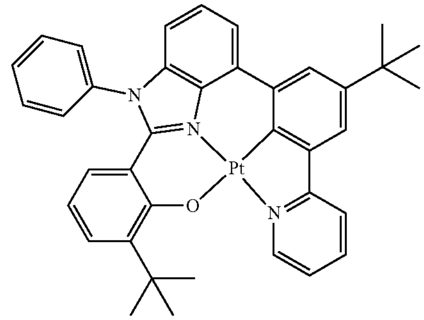

3-98
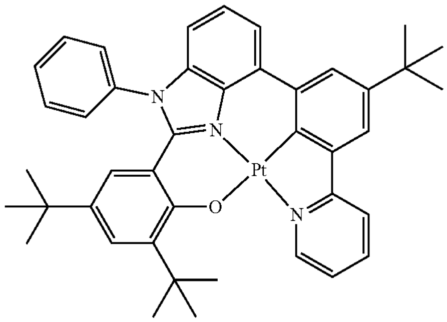
3-99
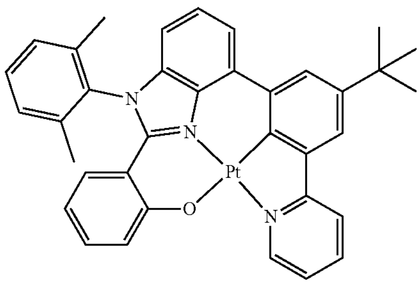
3-100
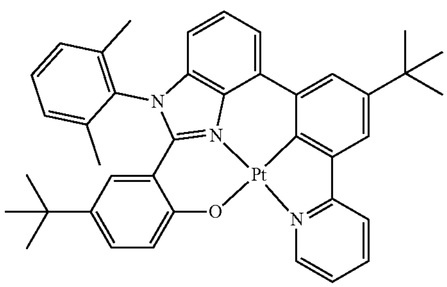
3-101
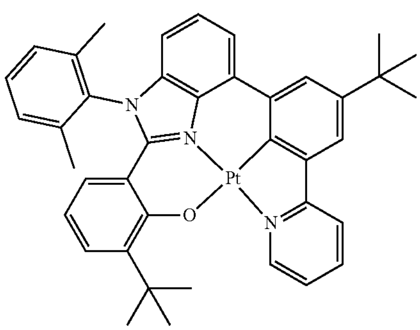
3-102
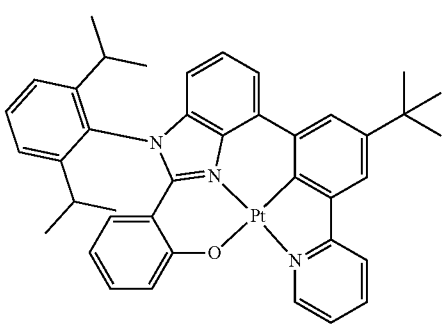
3-103
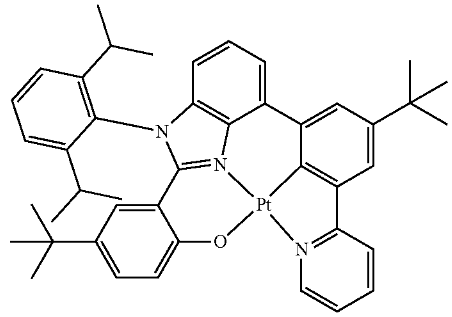
3-104
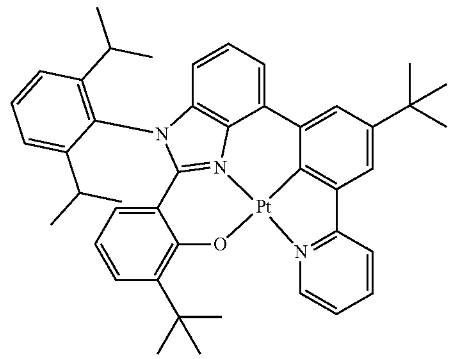
3-105
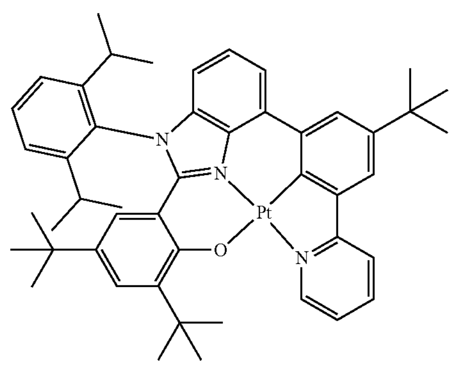
3-106
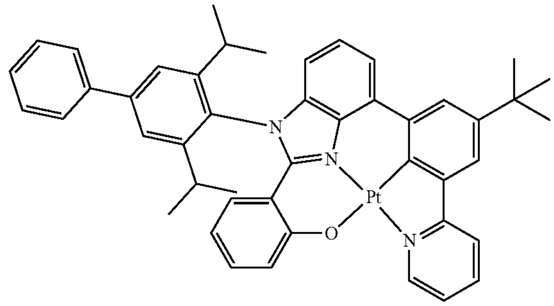

-continued
3-107
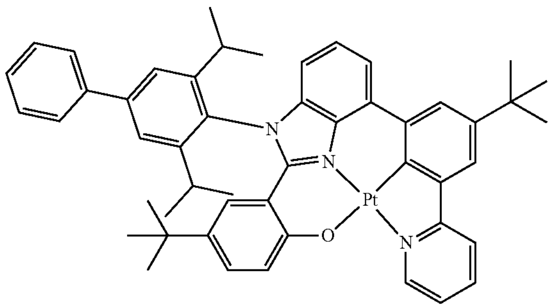
3-108
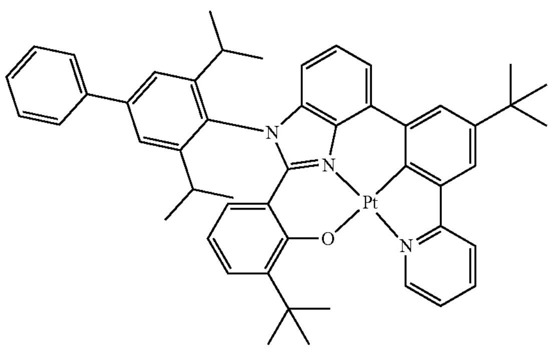
3-109
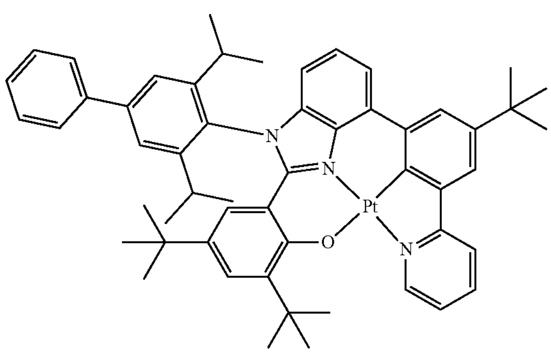
3-110
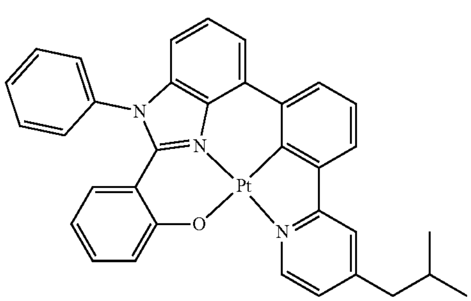
-continued
3-111
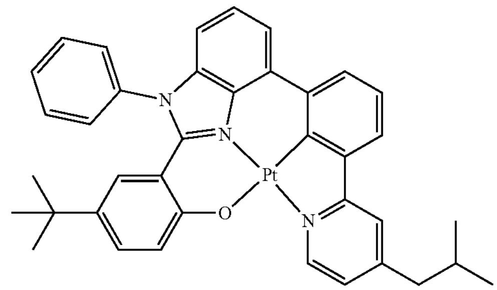
3-112
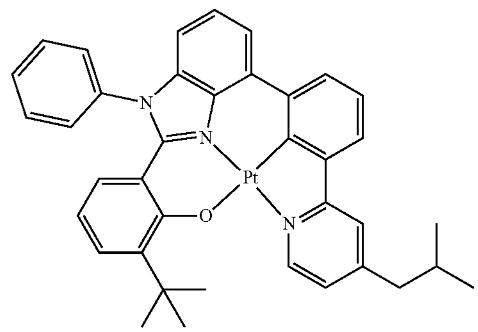
3-113
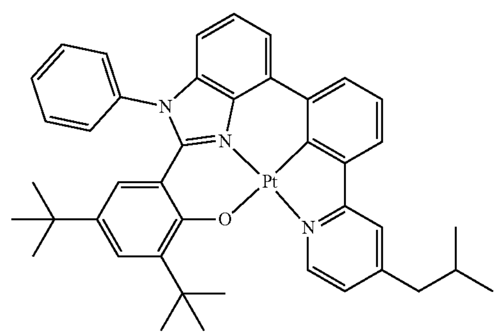
3-114
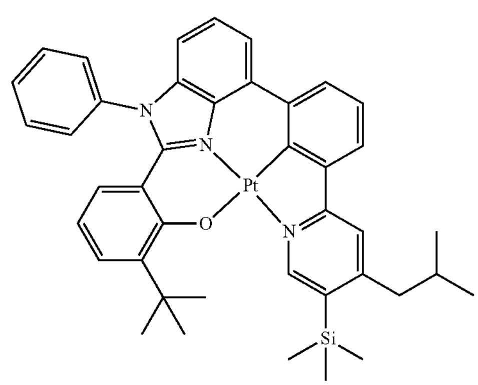

-continued
3-115
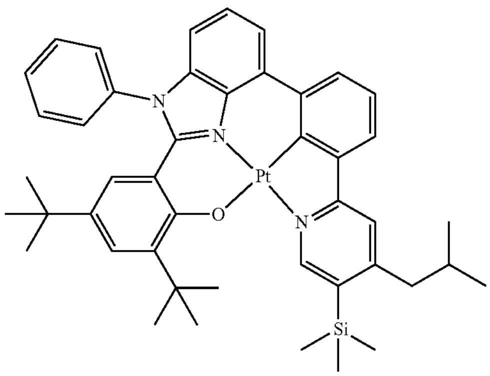
3-116
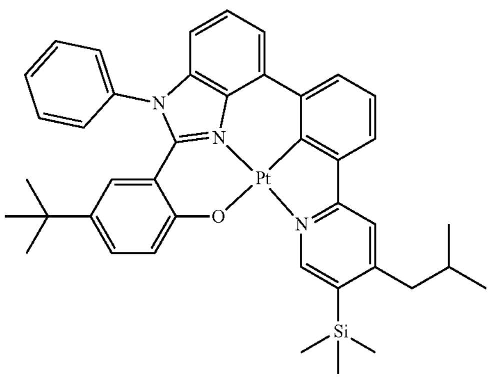
3-117
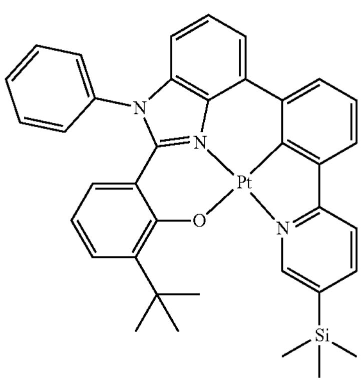
3-118
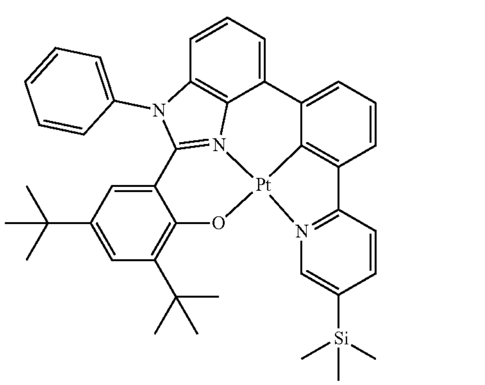
-continued
3-119
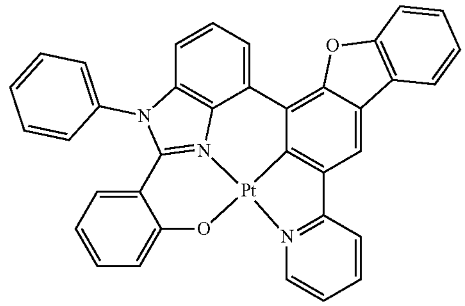
3-120
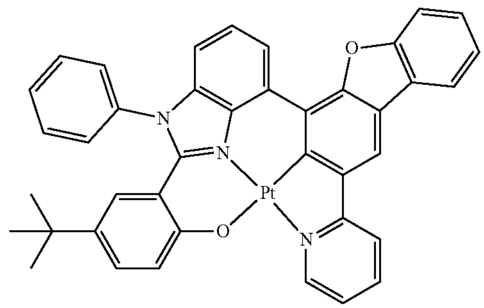
3-121
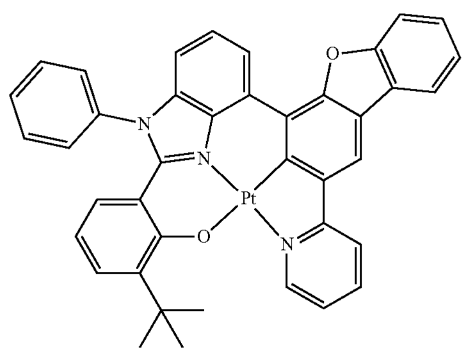
3-122
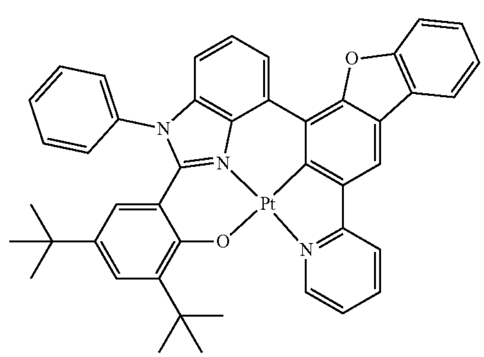

-continued
3-123
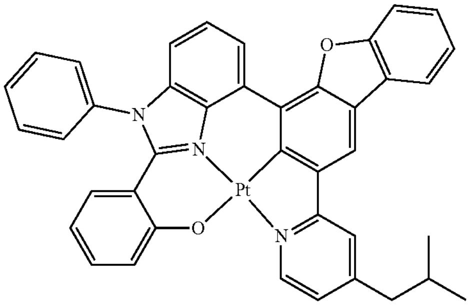
3-124
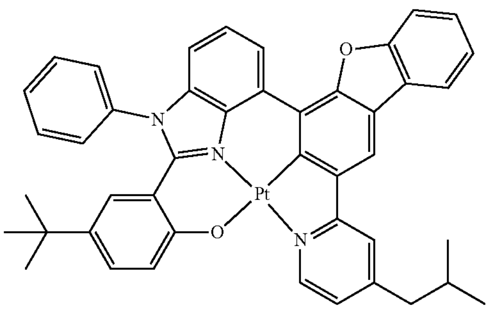
3-125
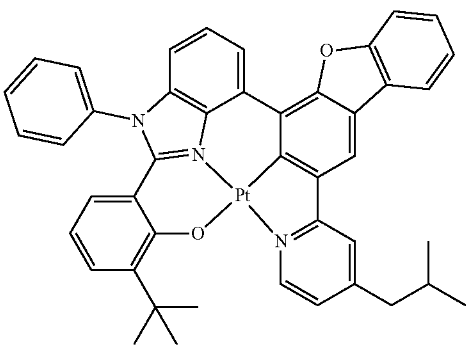
3-126
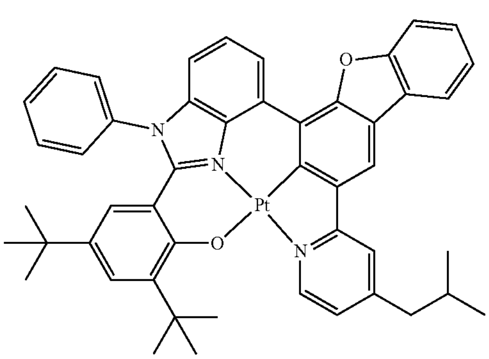
-continued
3-127
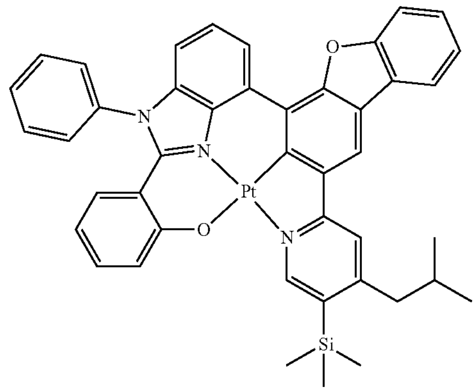
3-128
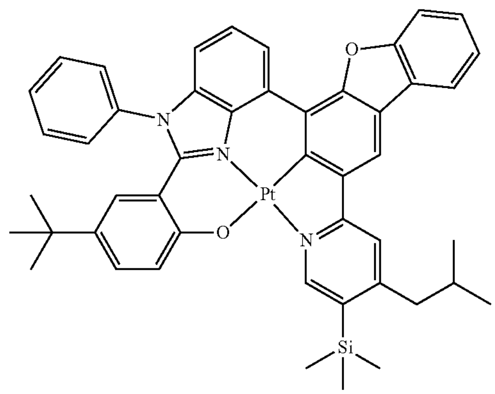
3-129
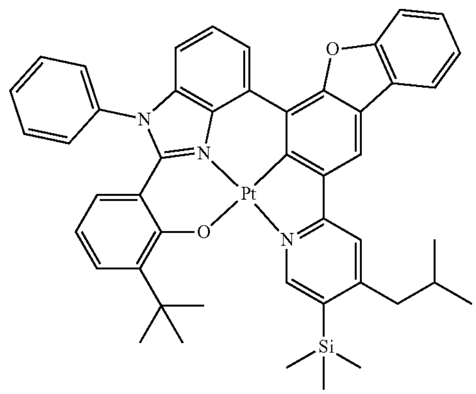
3-130
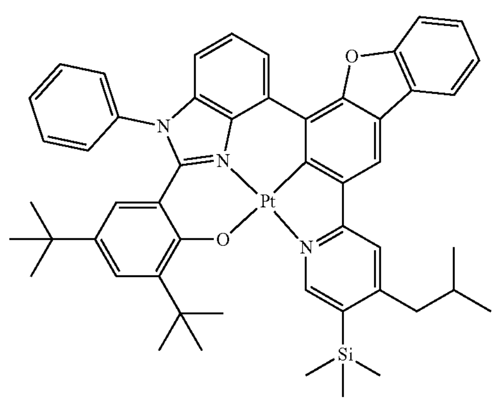

-continued
3-131
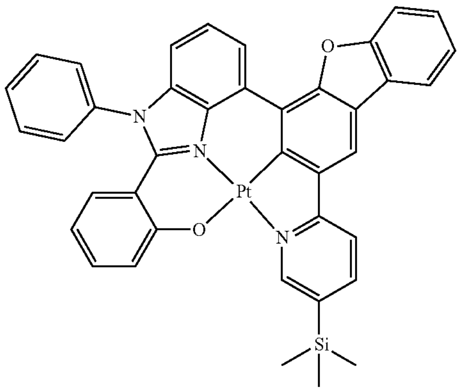
3-132
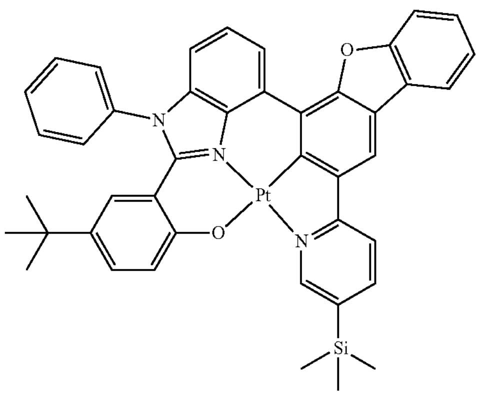
3-133
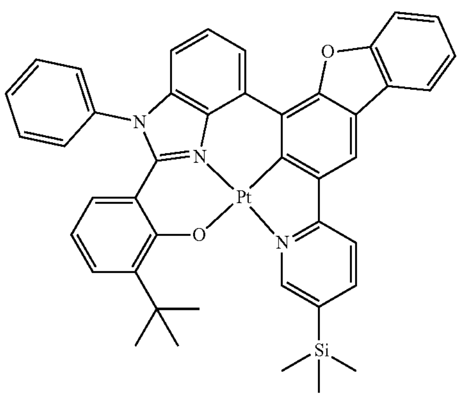
3-134
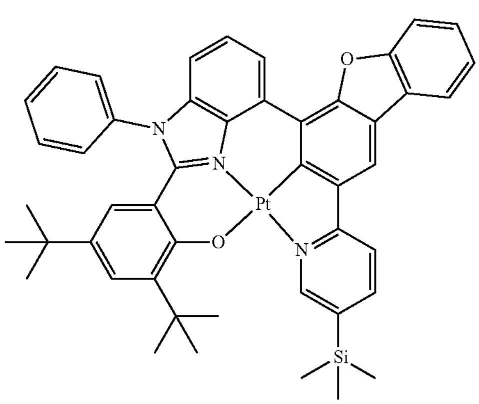
-continued
3-135
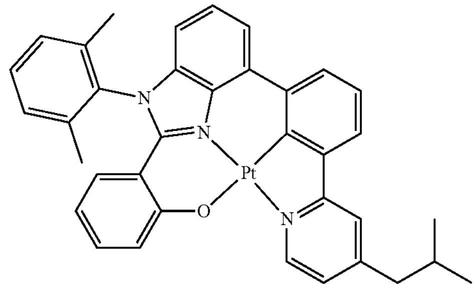
3-136
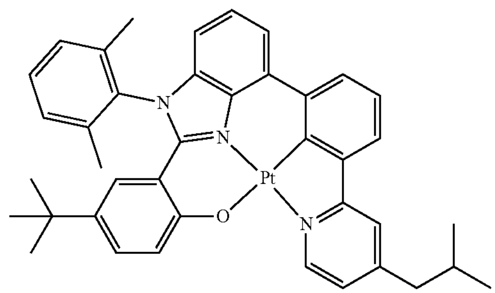
3-137
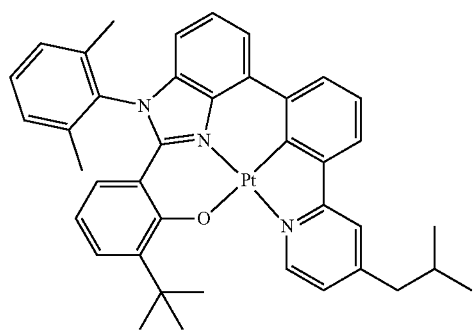
3-138
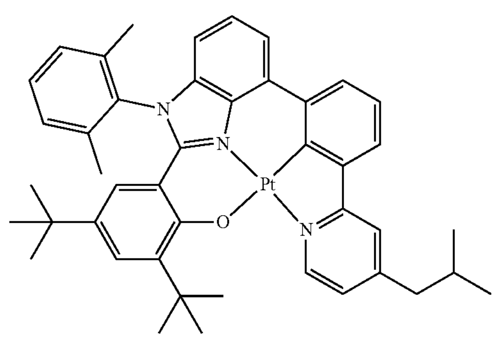

-continued
3-139
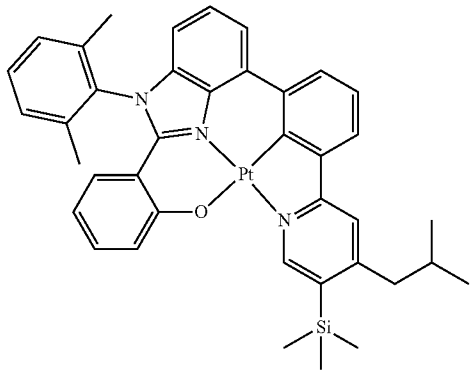
3-140
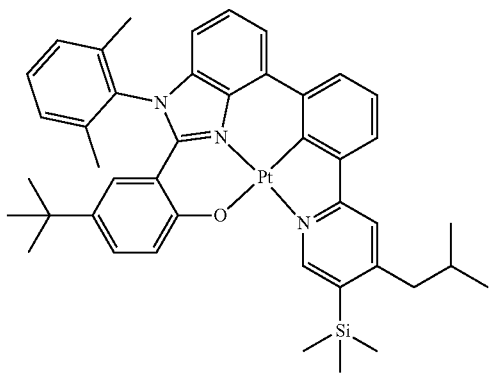
3-141
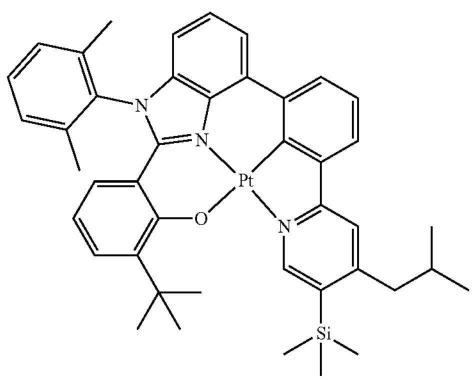
3-142
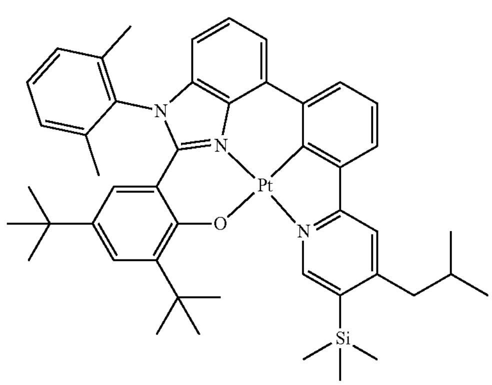
-continued
3-143
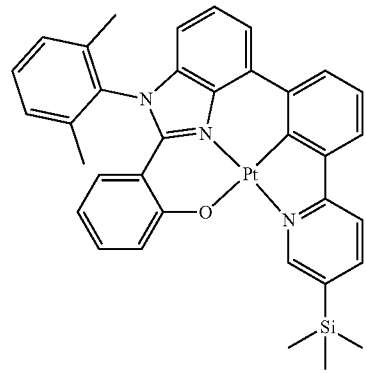
3-144
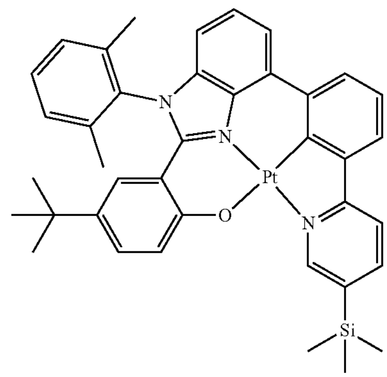
3-145
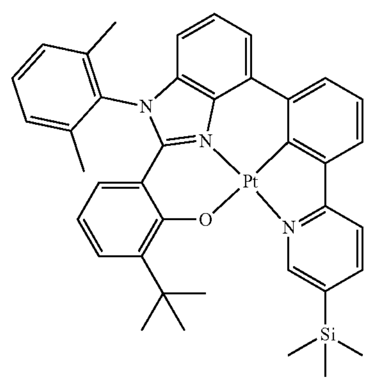
3-146
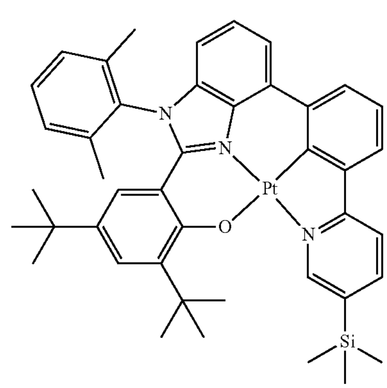

3-147
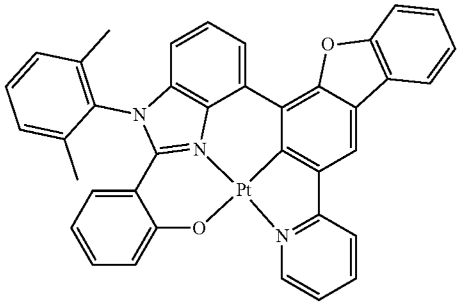
3-148
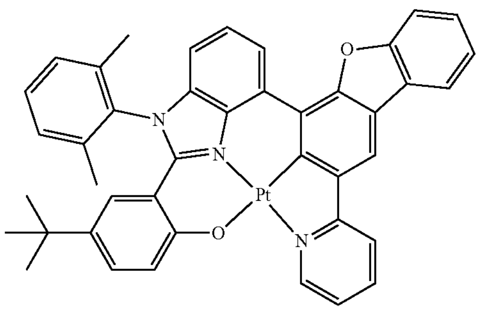
3-149
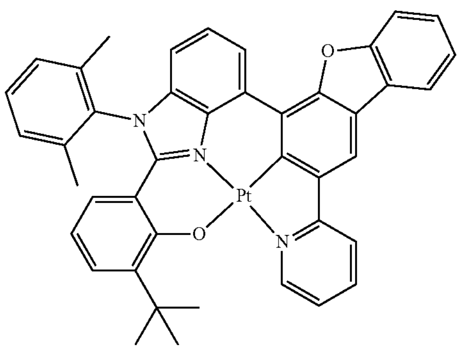
3-150
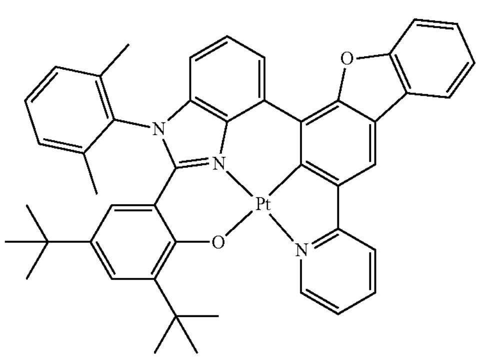
3-151
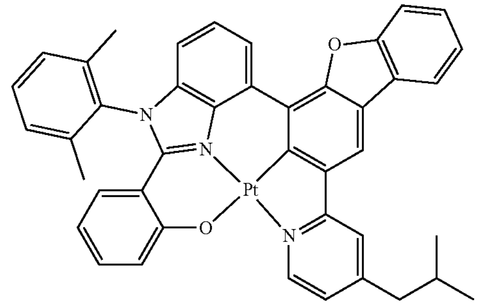
3-152
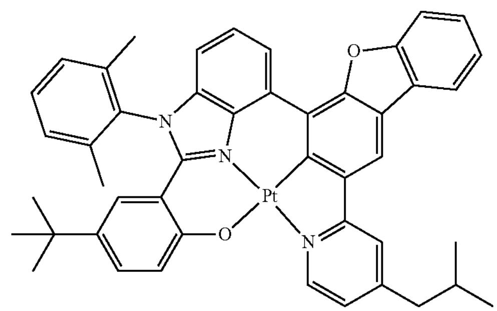
3-153
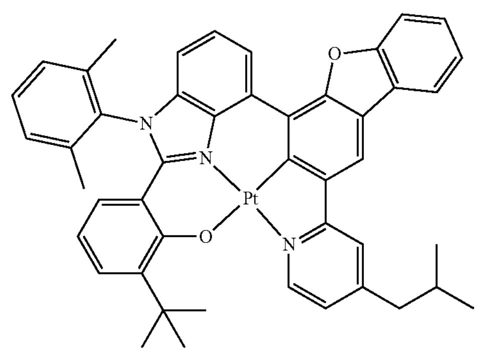
3-154
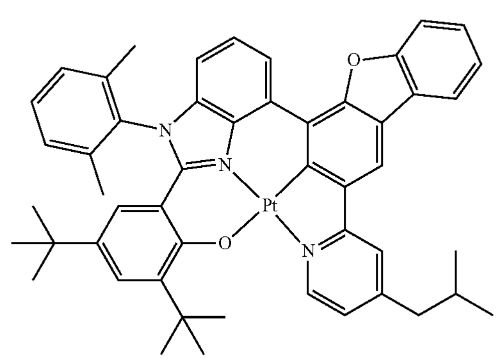

-continued
3-155
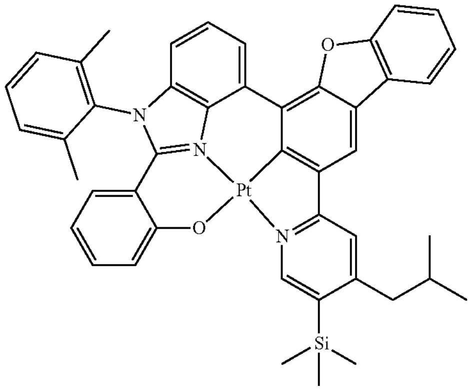
3-156
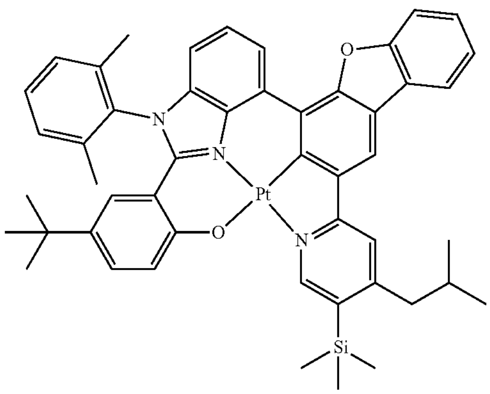
3-157
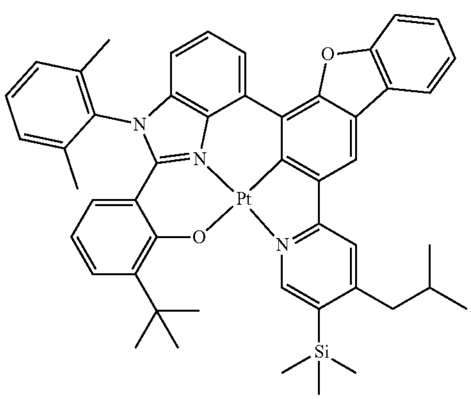
3-158
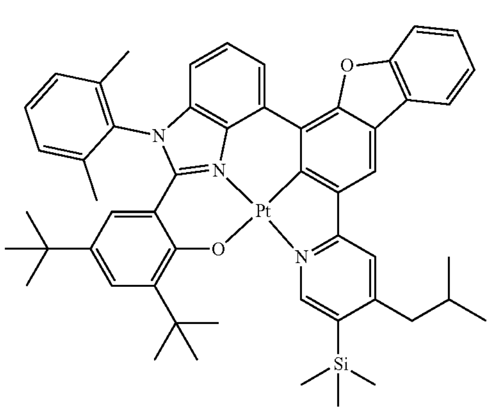
-continued
3-159
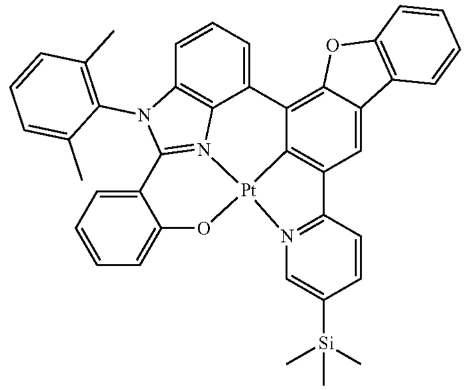
3-160
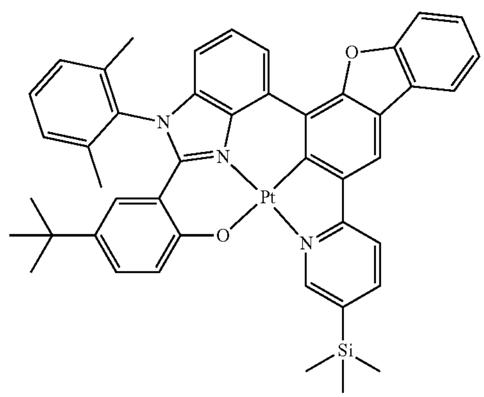
3-161
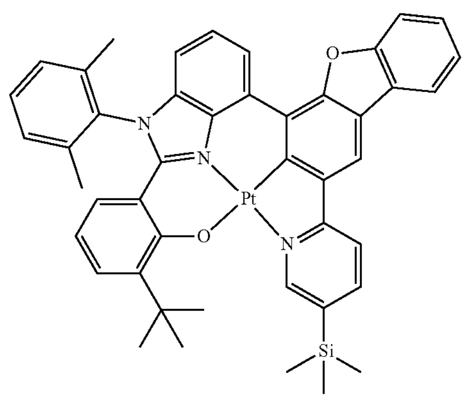
3-162
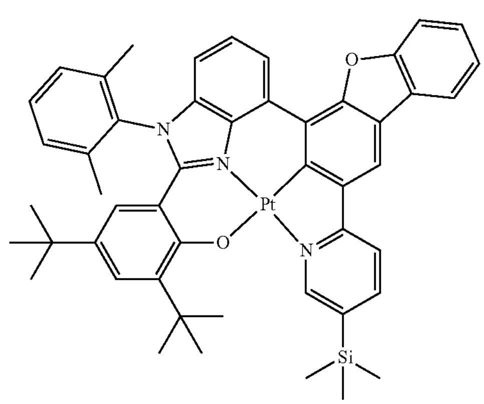

-continued
3-163
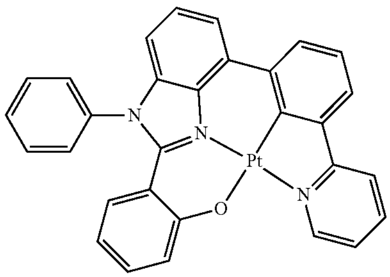
3-164
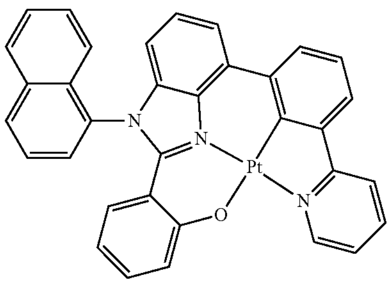
3-165
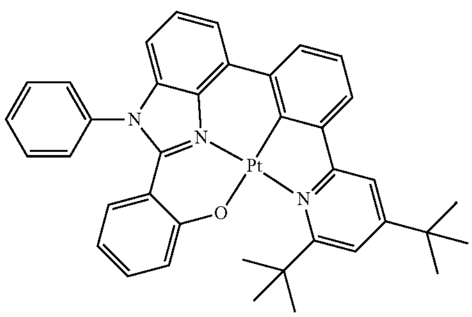
3-166
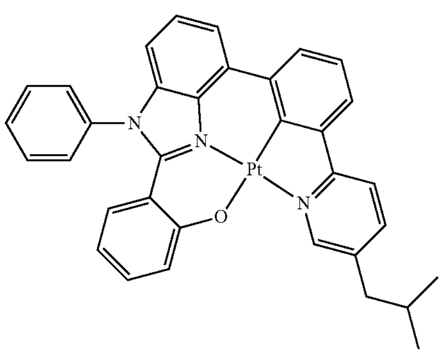
3-167
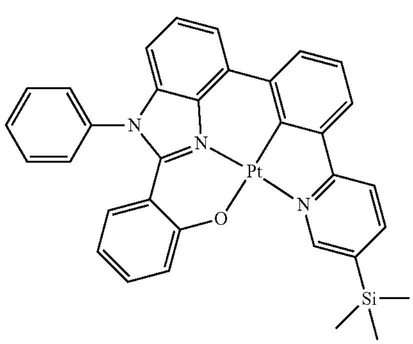
-continued
3-168
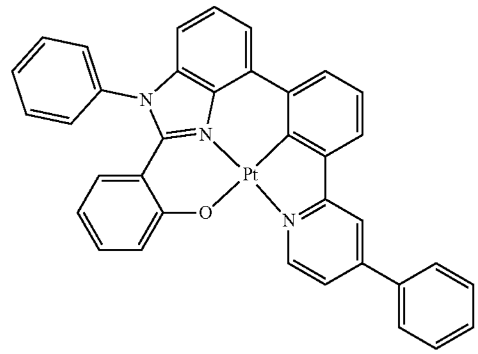
3-169
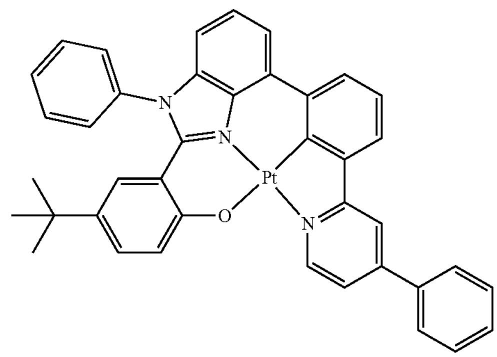
3-170
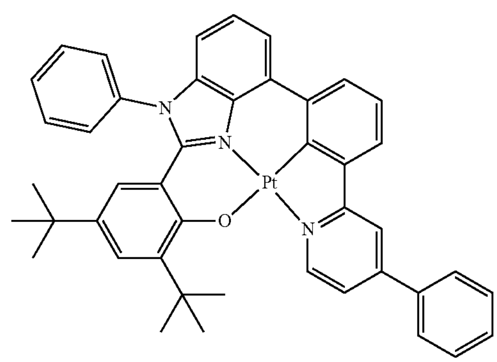
3-171
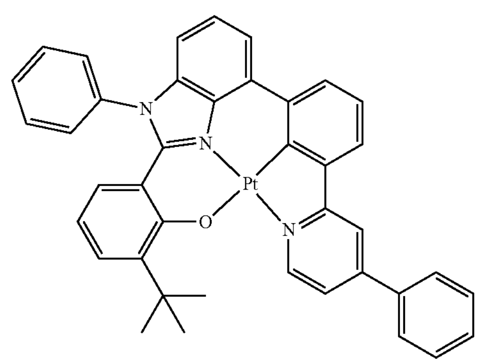

-continued
3-172
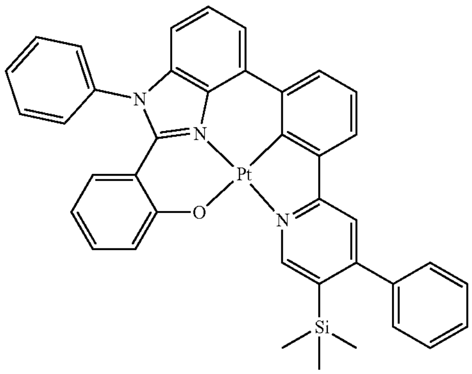
3-173
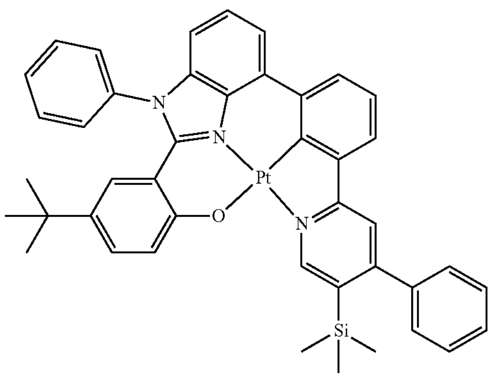
3-174
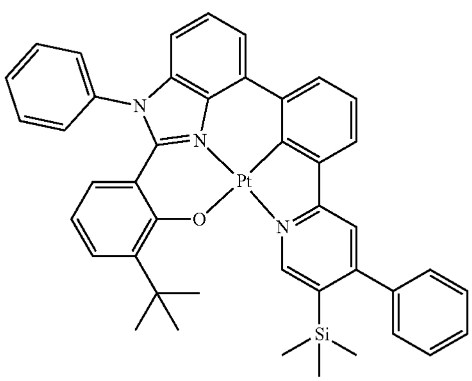
3-175
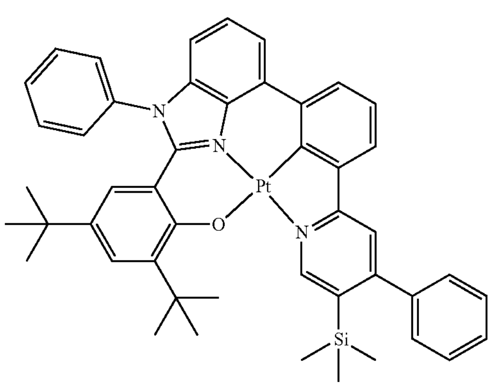
-continued
3-176
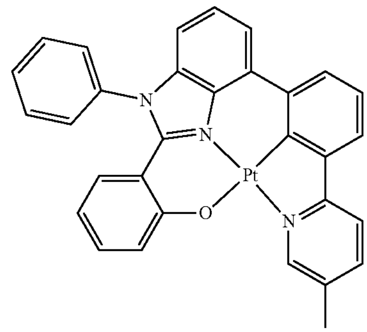
3-177
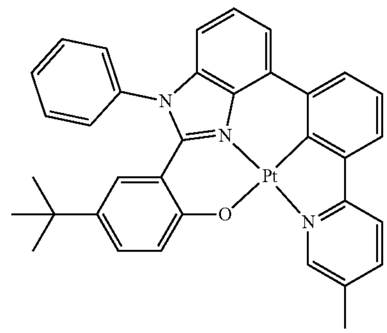
3-178
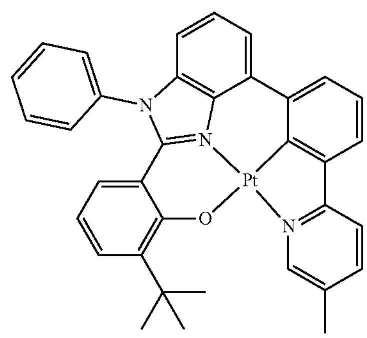
3-179
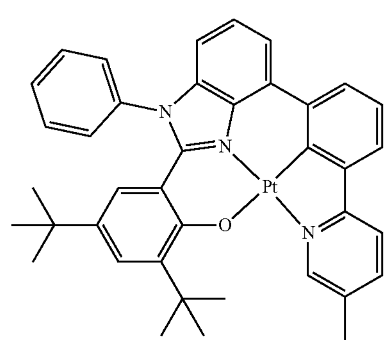

-continued
3-180
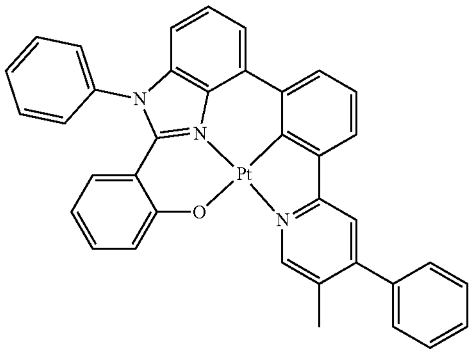
3-181
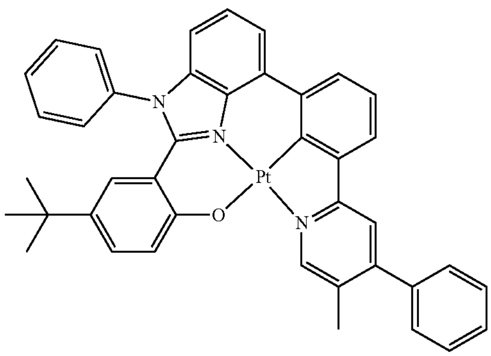
3-182
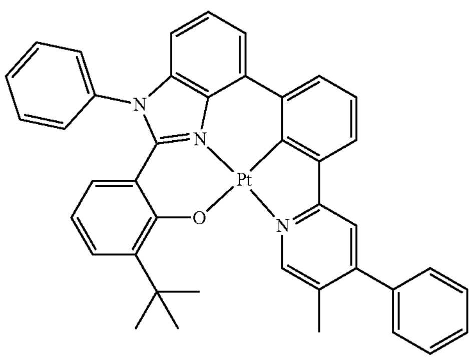
3-183
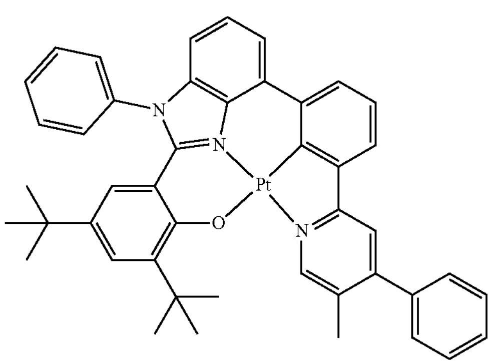
-continued
3-184
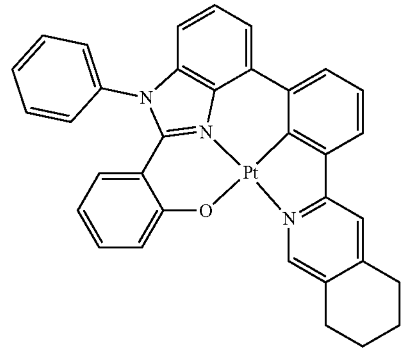
3-185
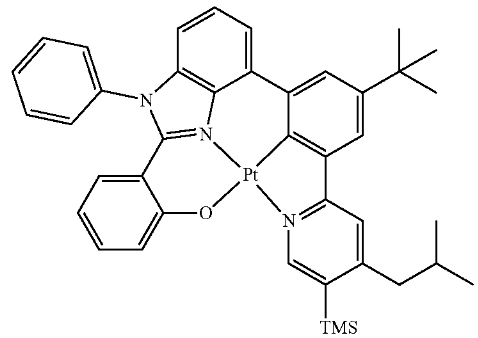
3-186
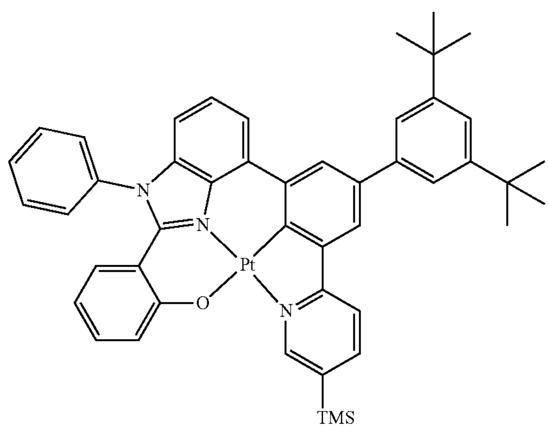
3-187
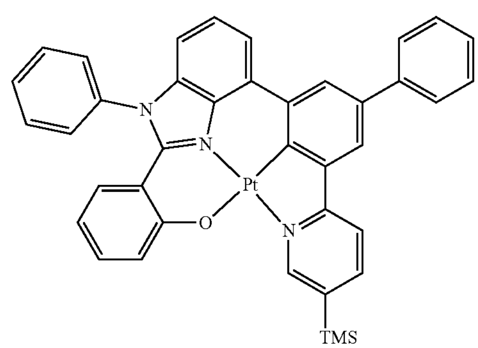

-continued
3-188
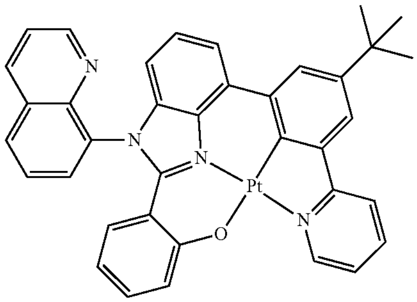
3-189
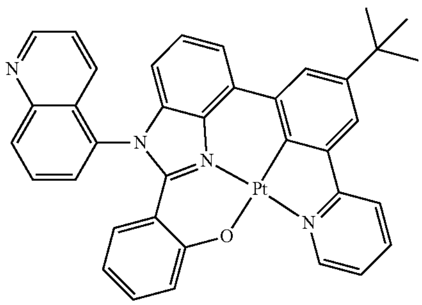
3-190
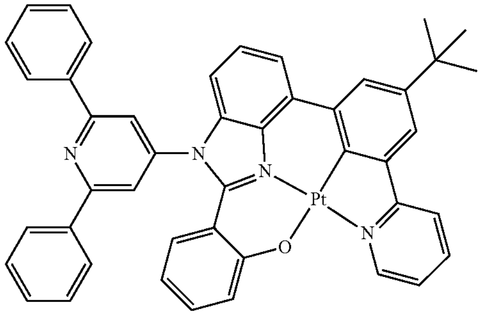
3-191
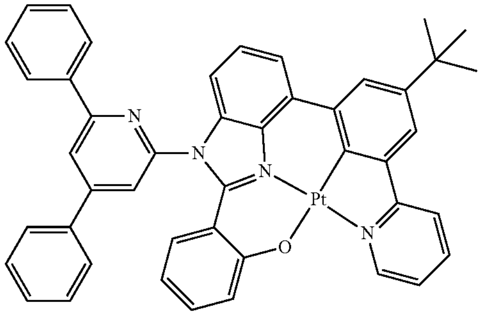
3-192
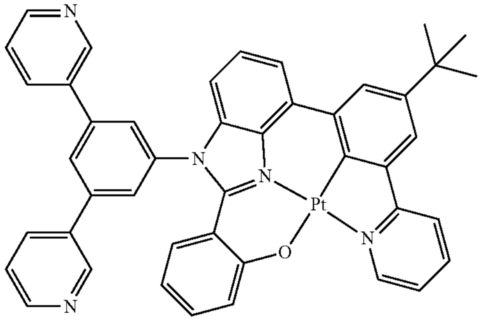
-continued
3-193
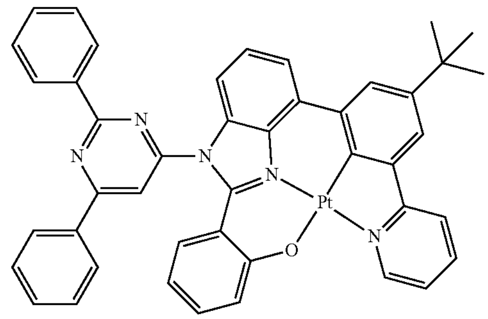
3-194
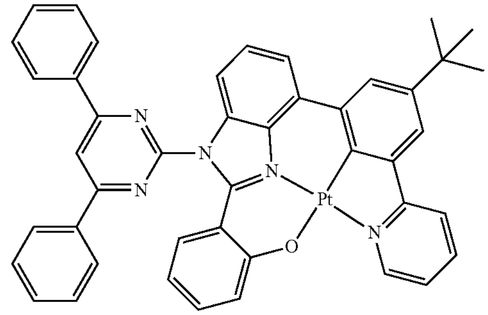
3-195
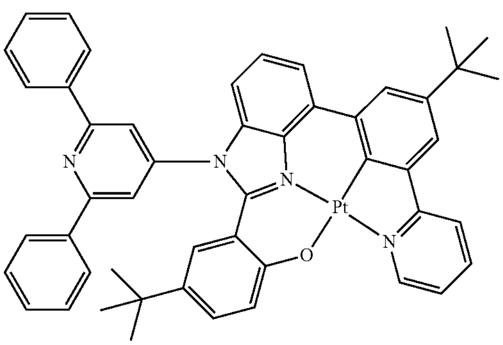
3-196
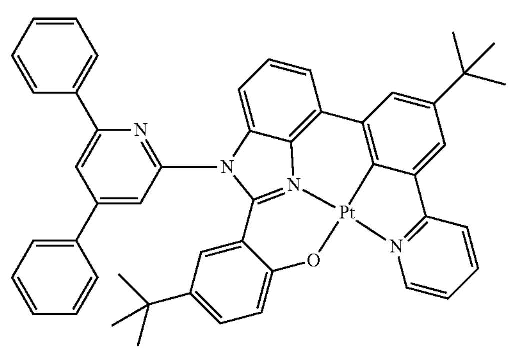

-continued
3-197
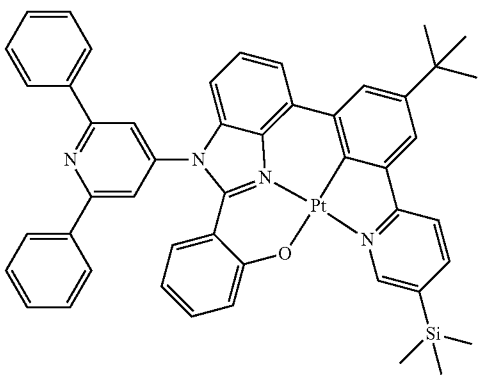
3-198
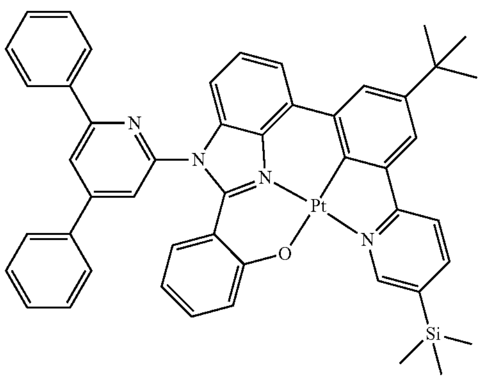
3-199
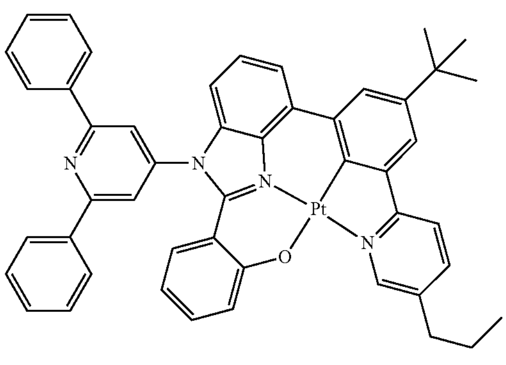
3-200
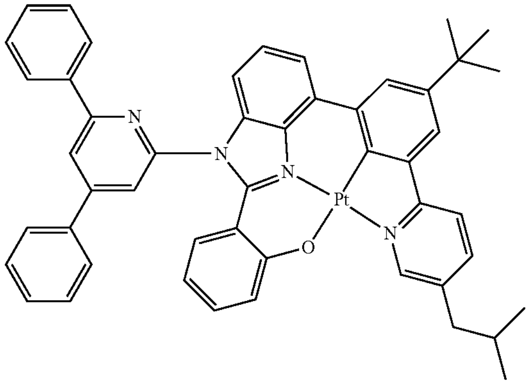
-continued
3-201
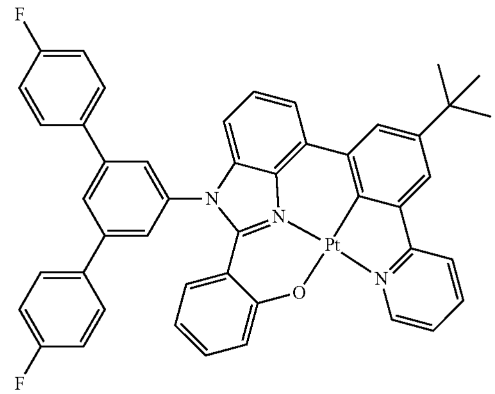
3-202
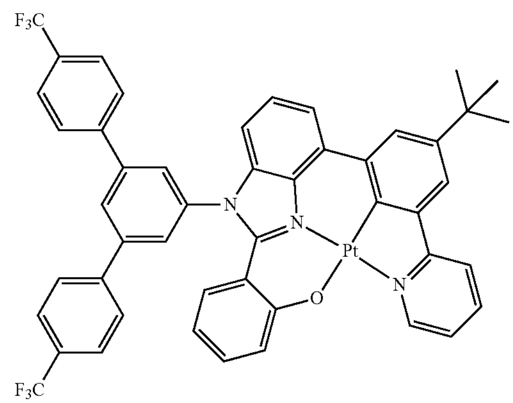
3-203
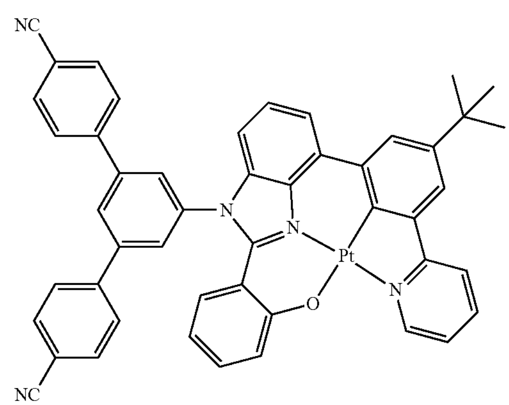
3-204
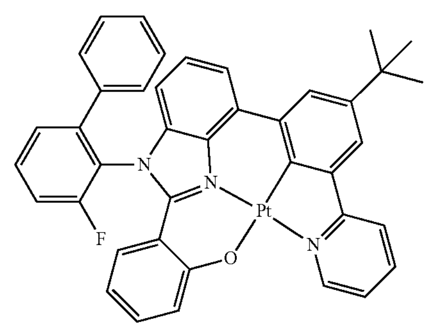

-continued
3-205
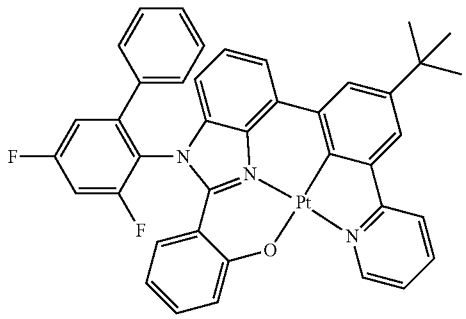
3-206
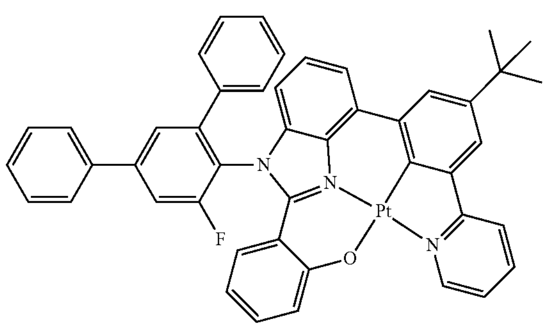
3-207
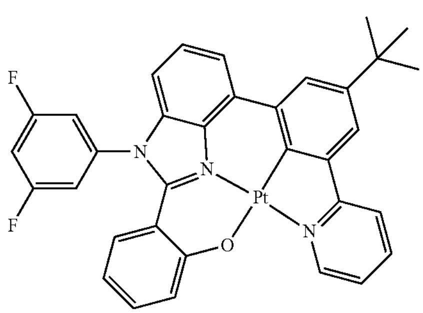
3-208
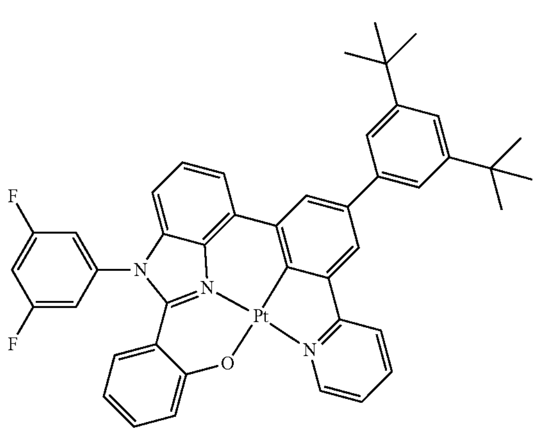
-continued
3-209
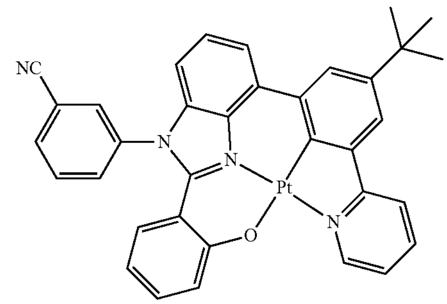
3-210
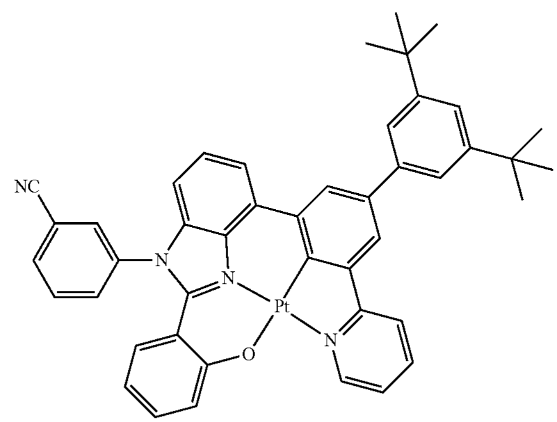
3-211
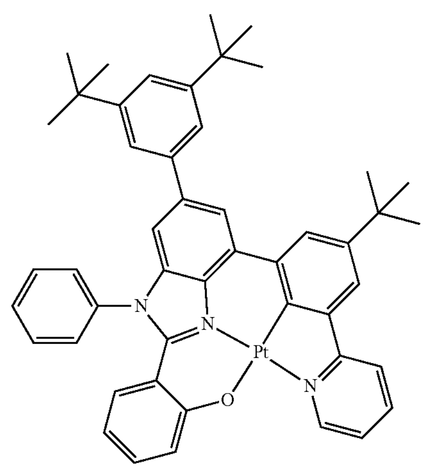
3-212
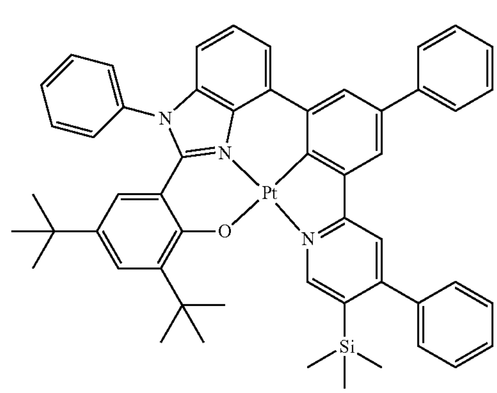

-continued
3-213
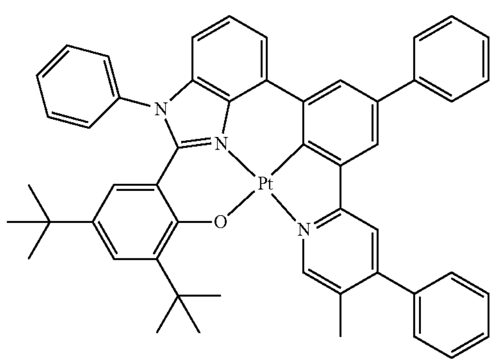
3-214
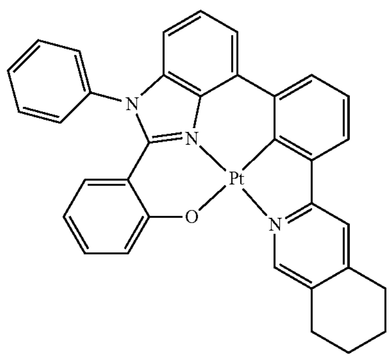
3-215
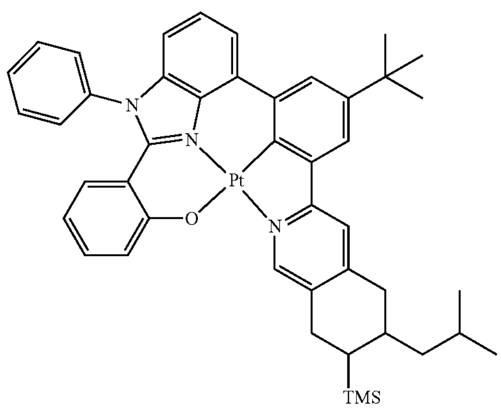
3-216
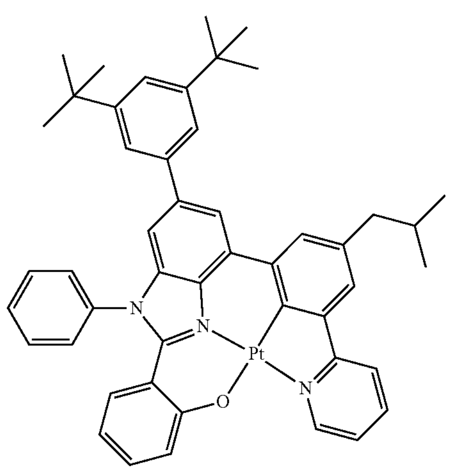
-continued
3-217
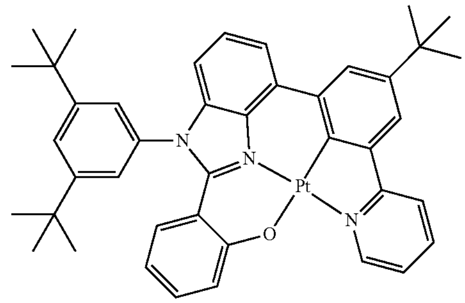
3-218
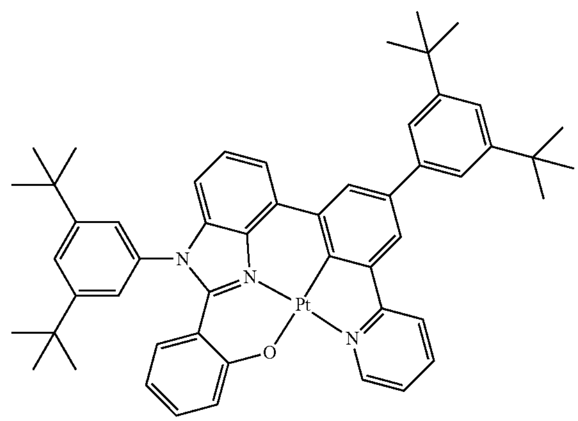
3-219
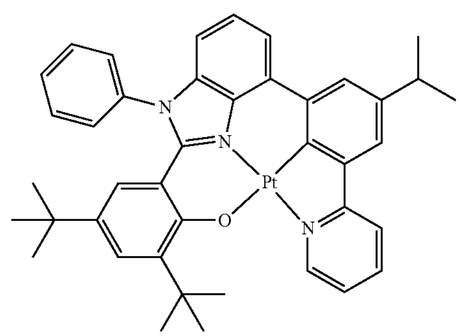
3-220
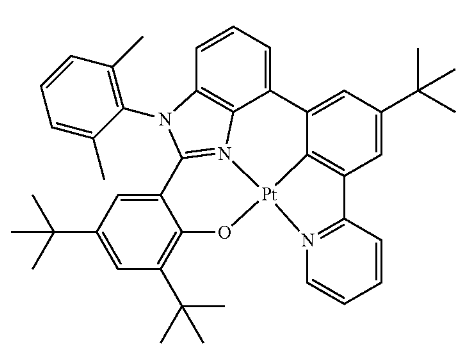

-continued
3-221
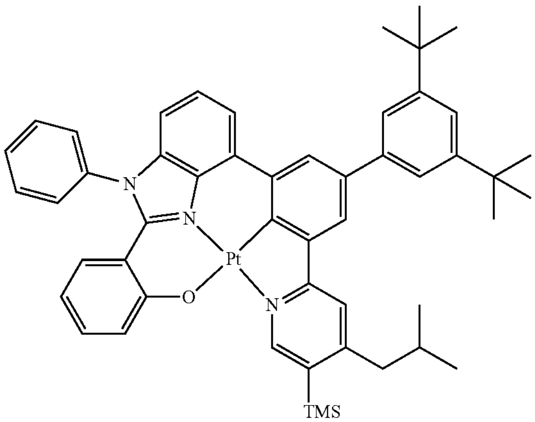
3-222
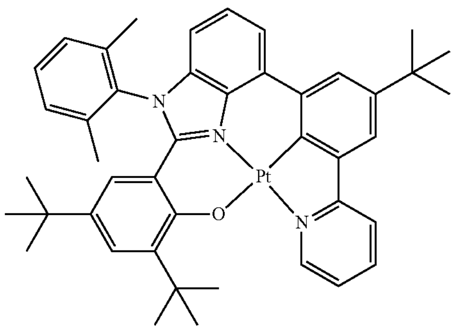
3-223
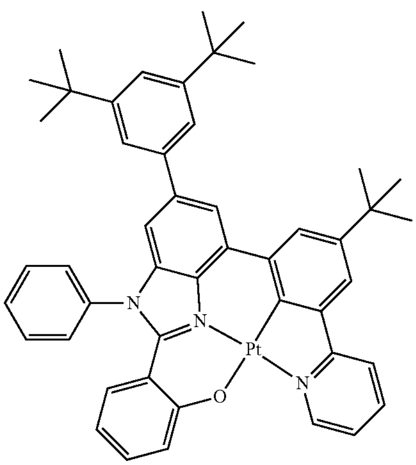
3-224
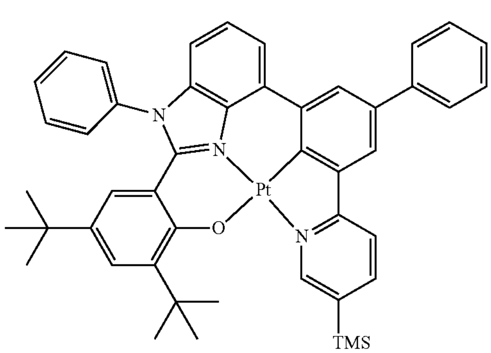
-continued
3-225
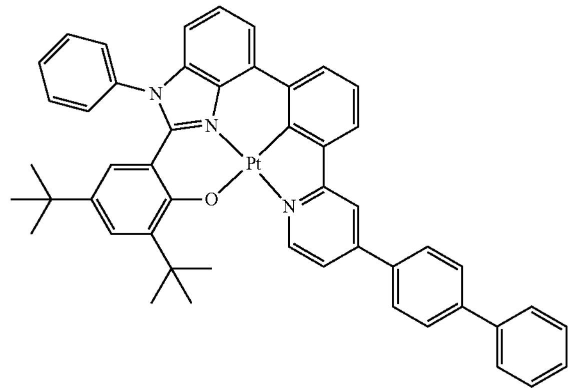
3-226
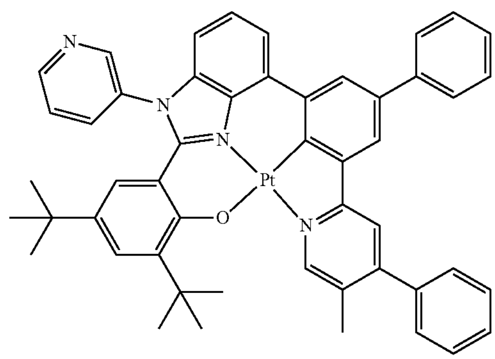
3-227
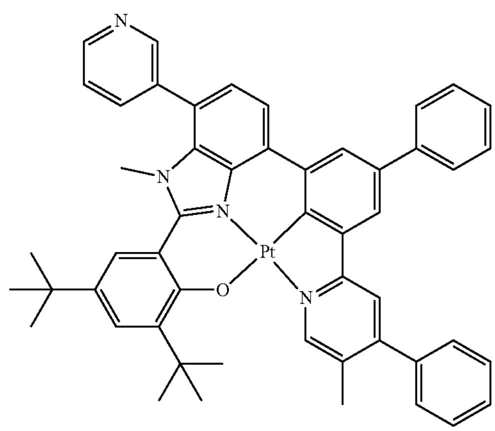
3-228
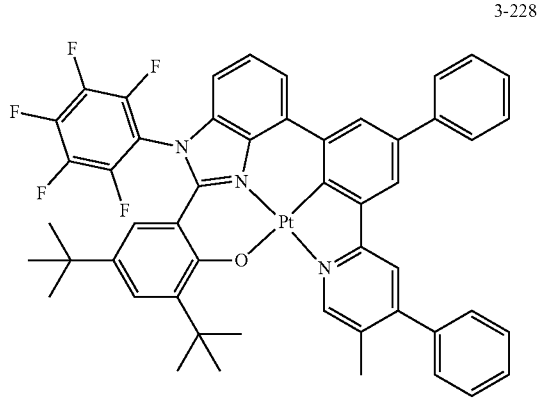

-continued
3-229
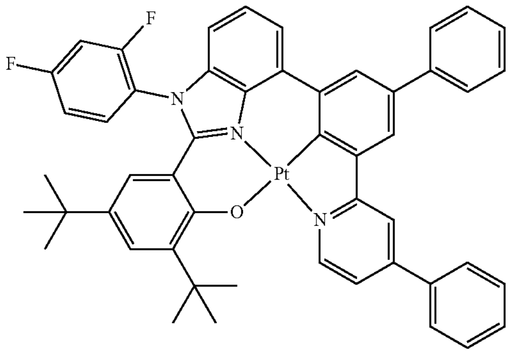
3-230
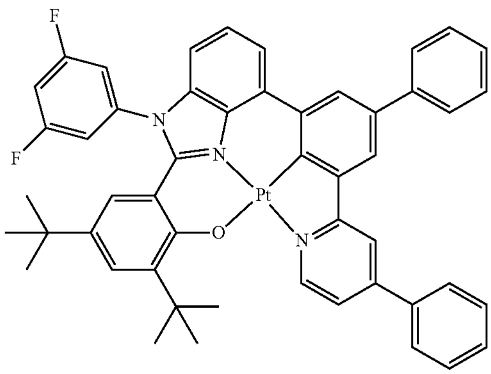
3-231
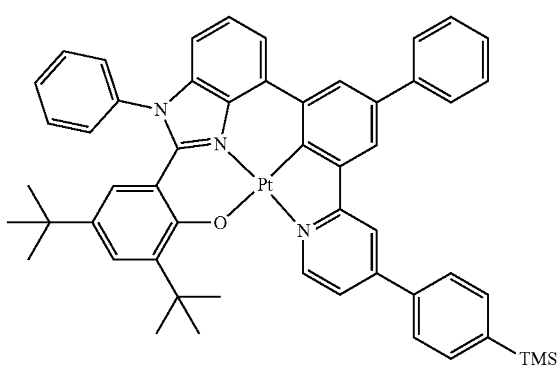
3-232
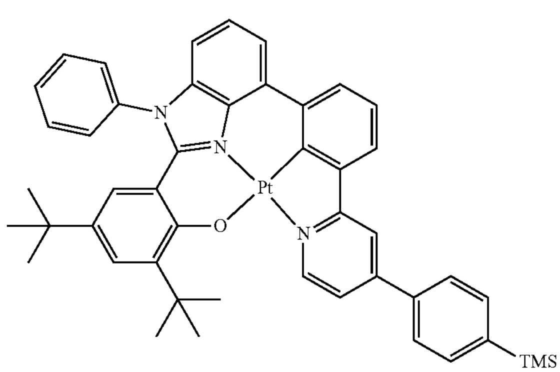
-continued
3-233
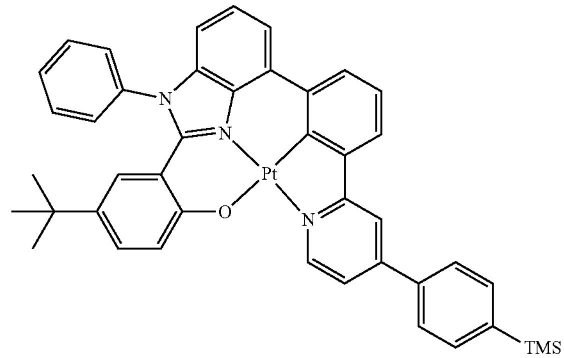
3-234
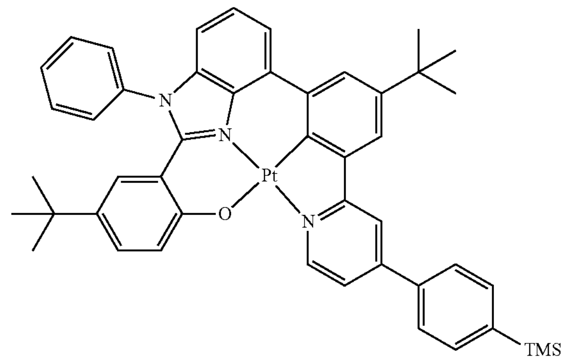
3-235
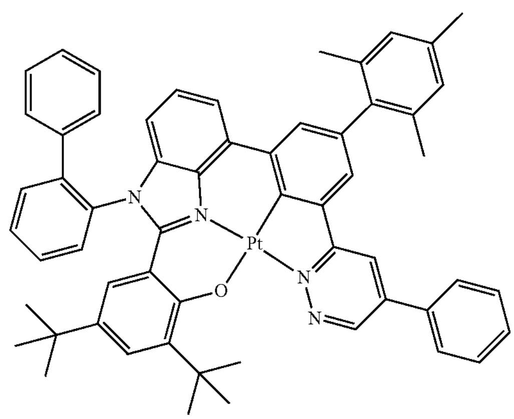
3-236
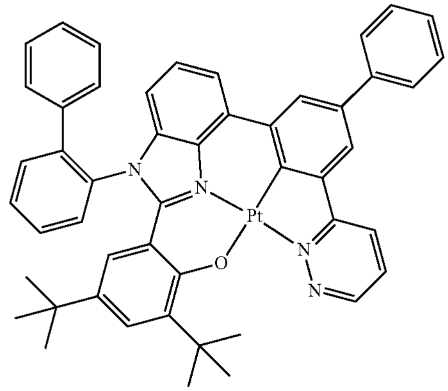

-continued
3-237
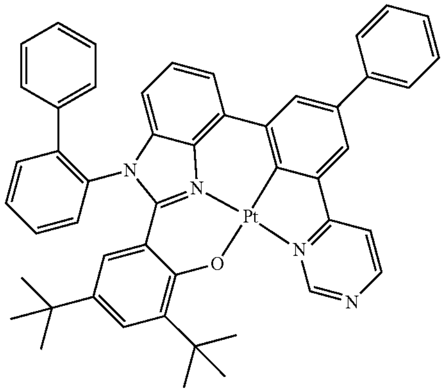
3-238
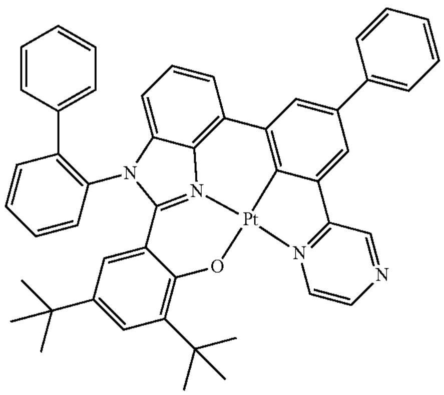
3-239
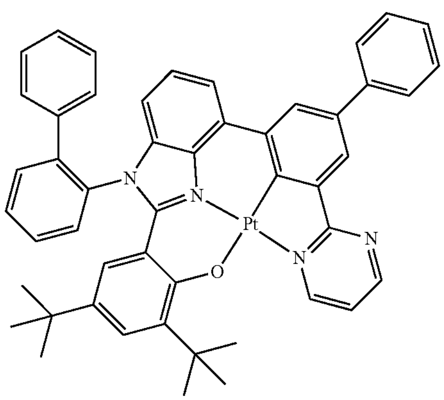
3-240
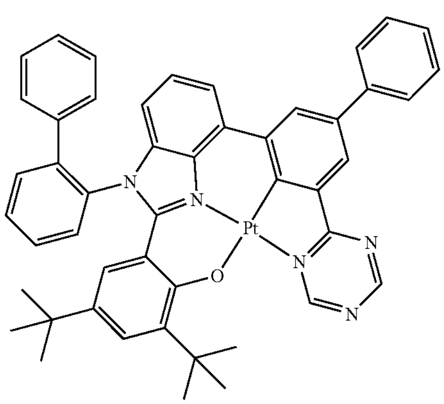
-continued
3-241
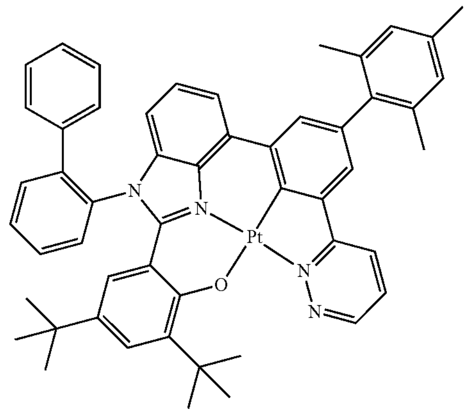
3-242
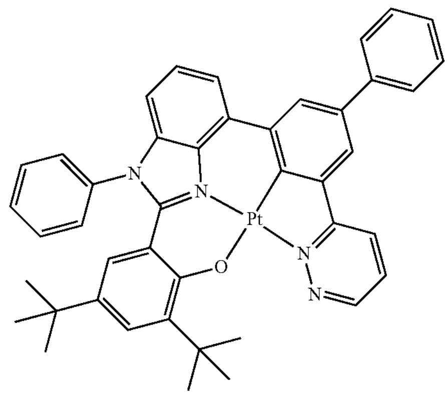
3-243
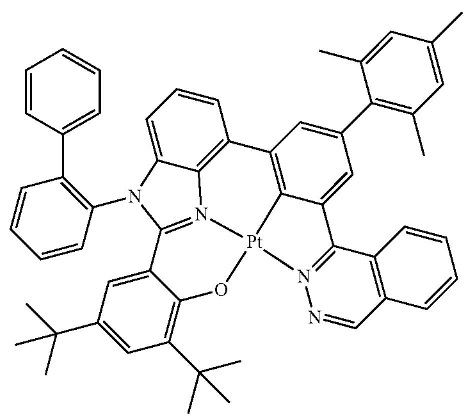
3-244
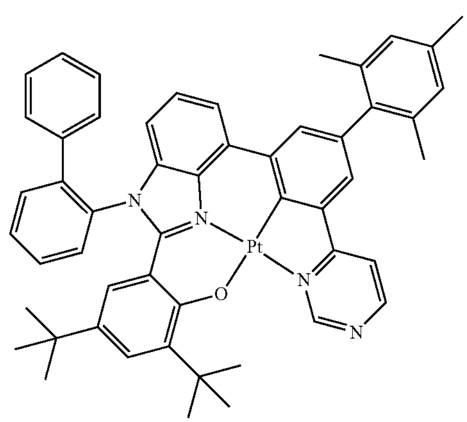

-continued
3-245
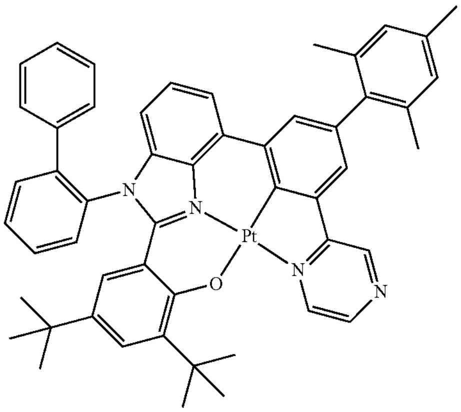
3-246
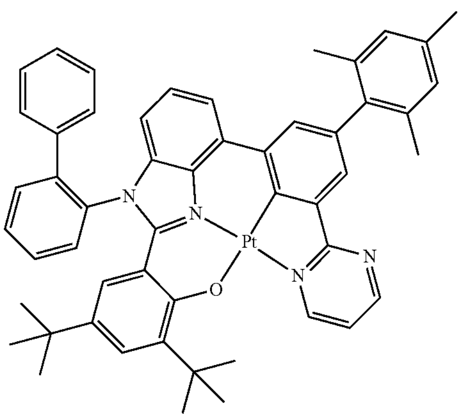
3-247
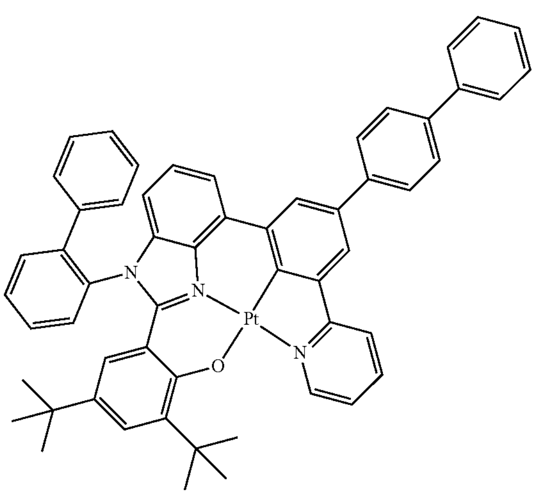
-continued
3-248
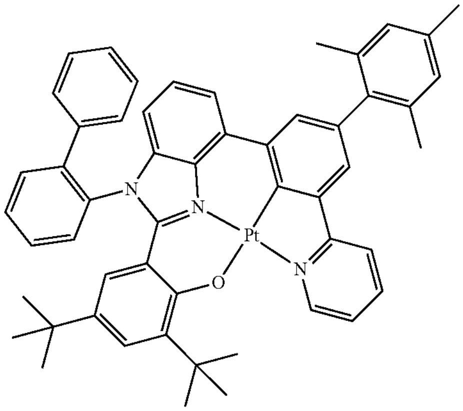
3-249
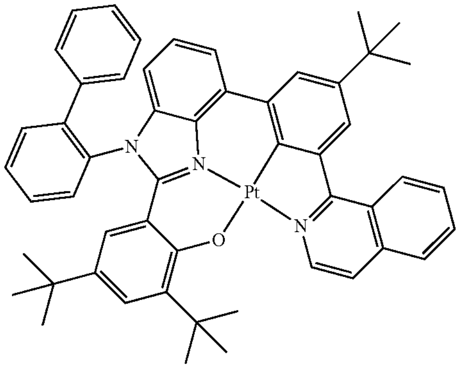
3-250
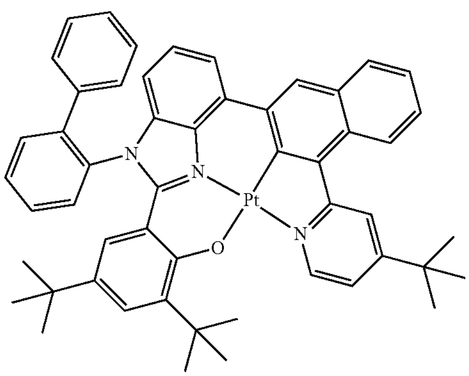
3-251
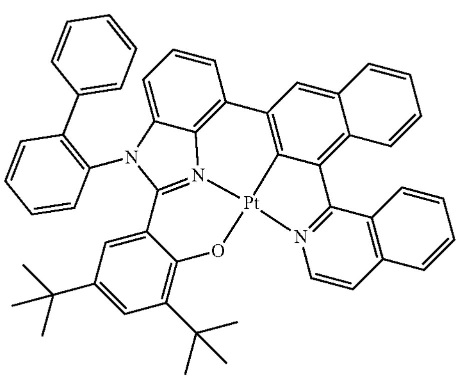

-continued
3-252
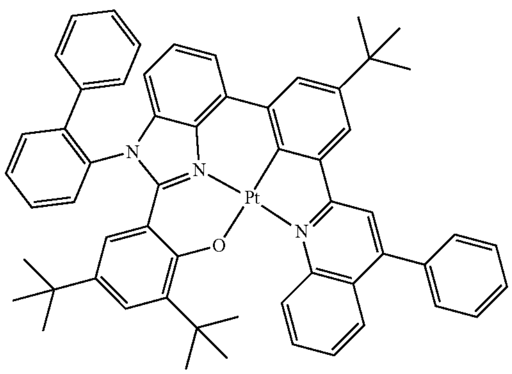
3-253
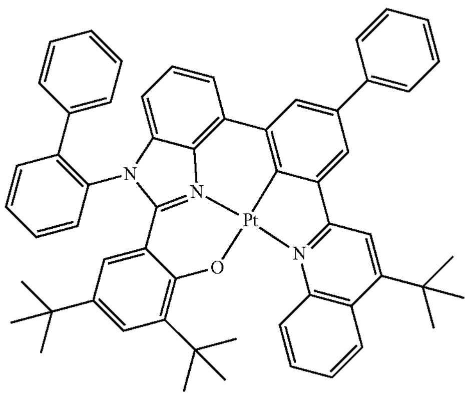
3-254
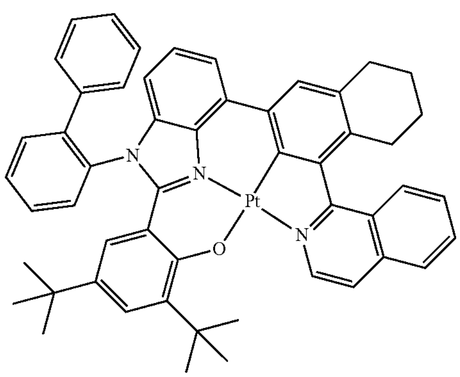
3-255
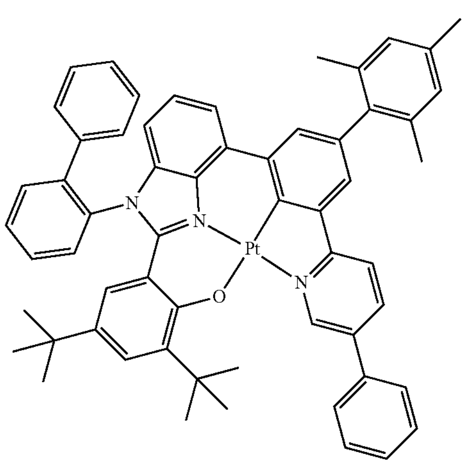
-continued
3-256
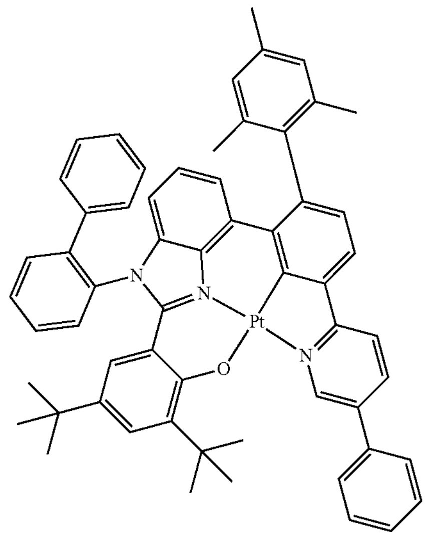
3-257
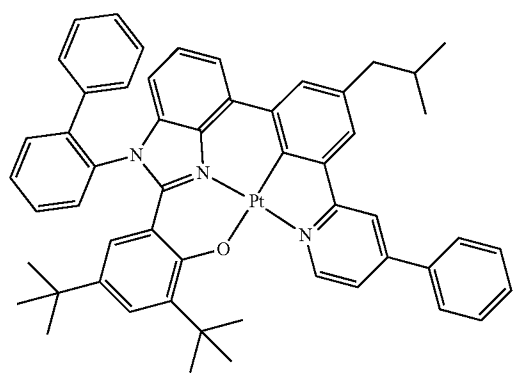
3-258
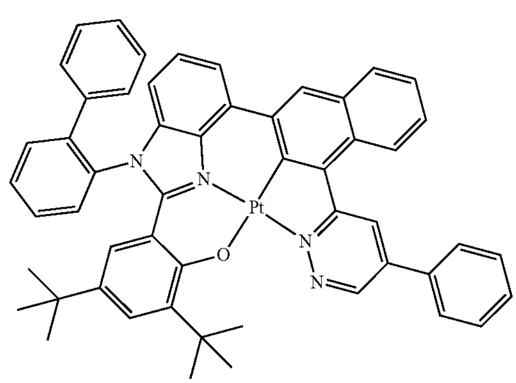

-continued
3-259
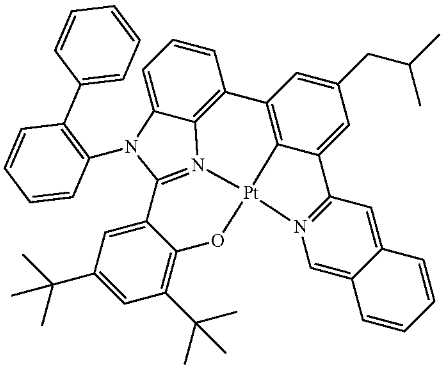
3-260
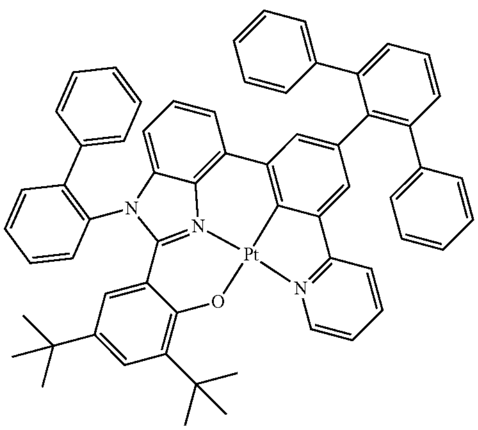
3-261
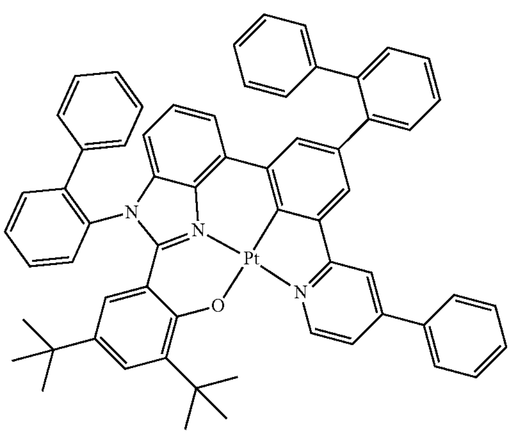
3-262
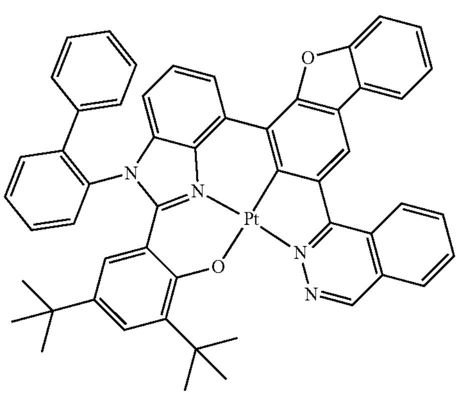
-continued
3-263
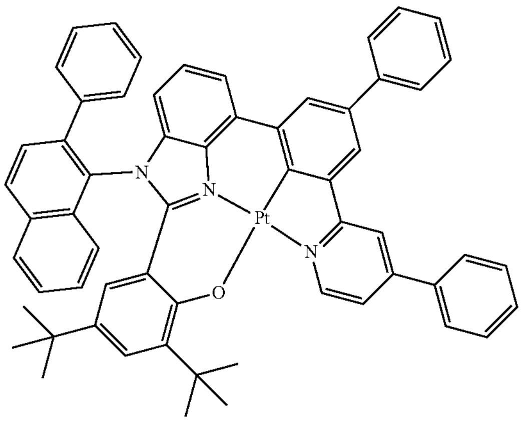
3-264
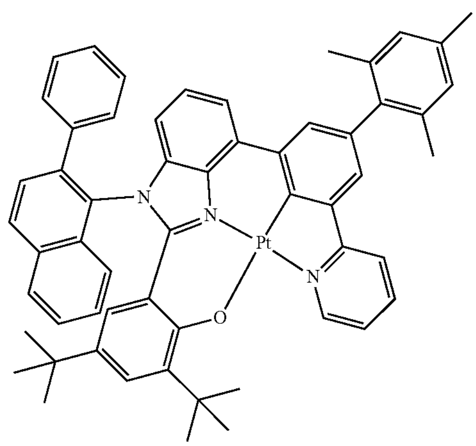
3-265
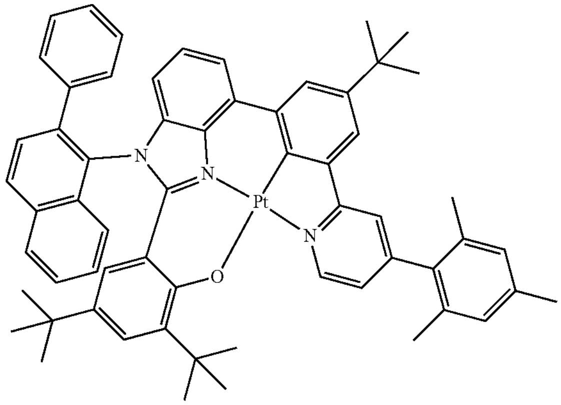

3-266
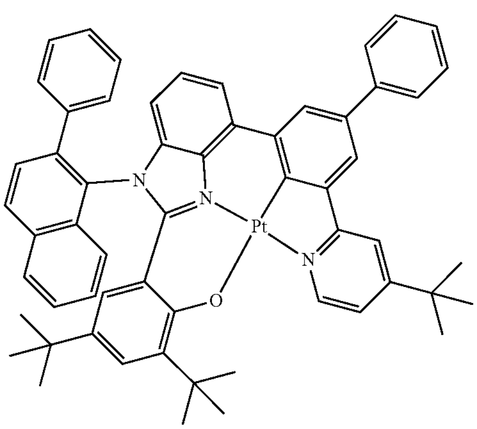
3-267
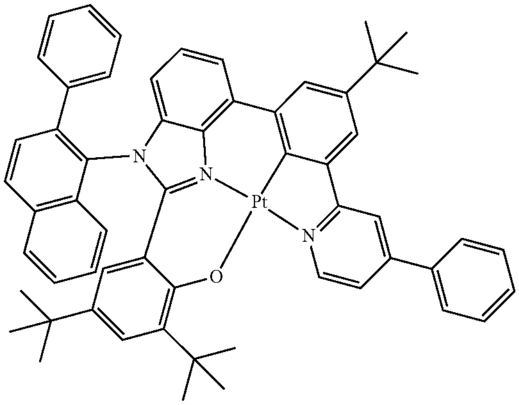
3-268
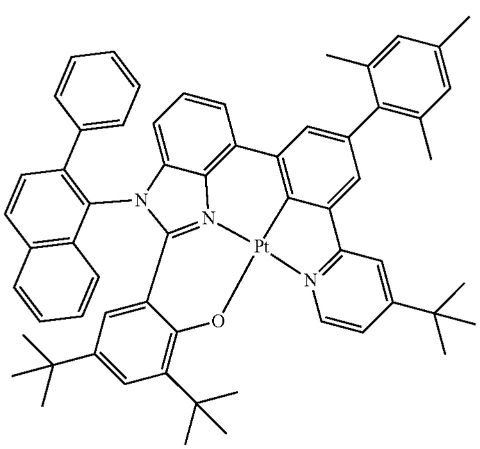
3-269
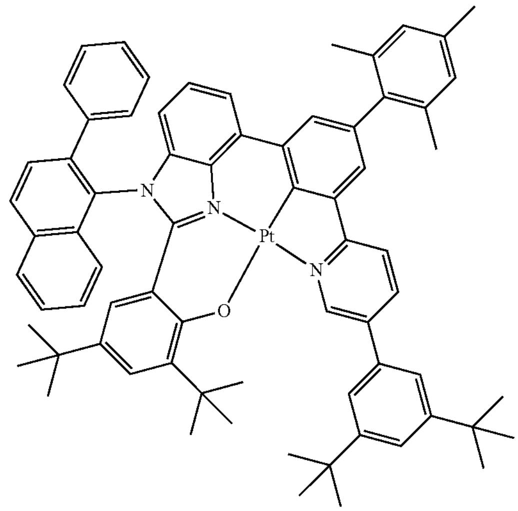
3-270
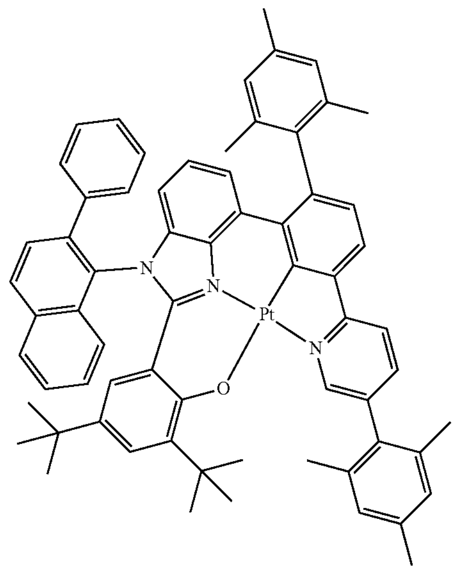
3-271
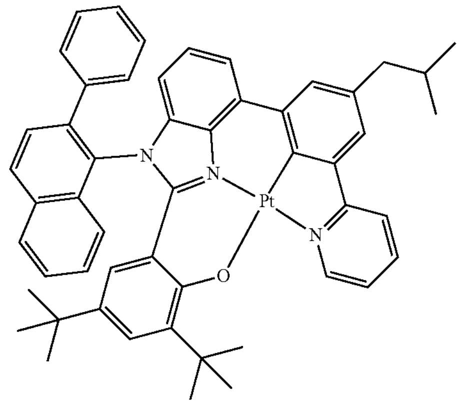

3-272
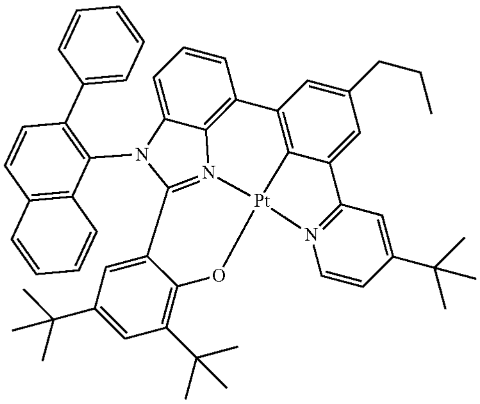
3-273
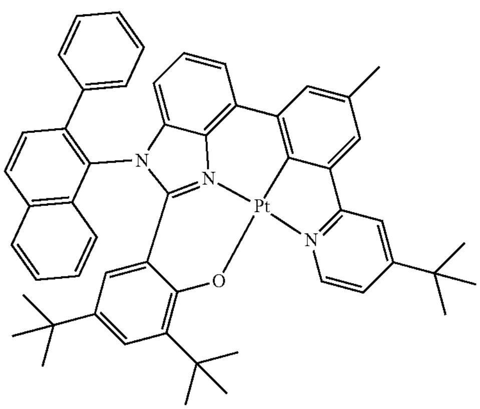
3-274
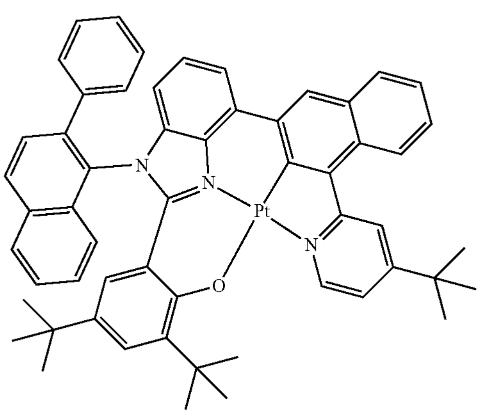
3-275
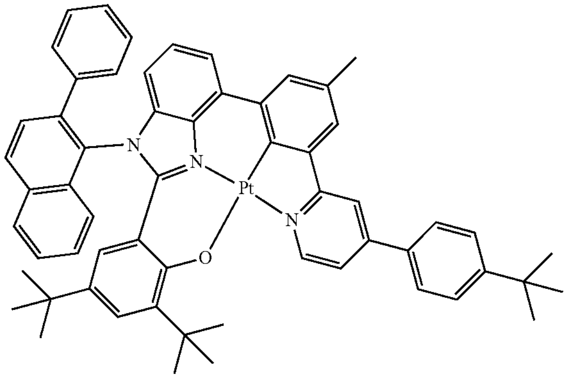
3-276
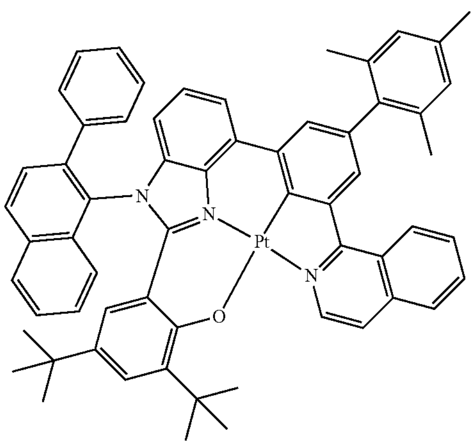
3-277
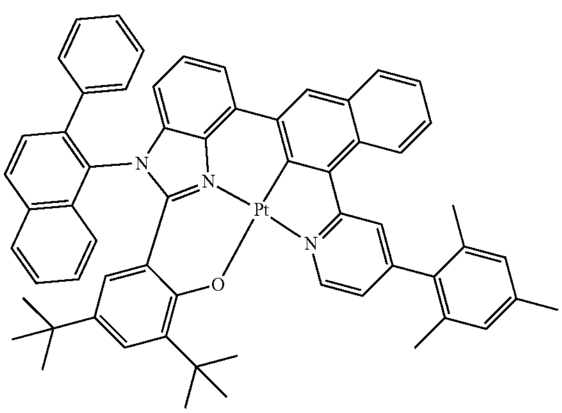

-continued
3-278
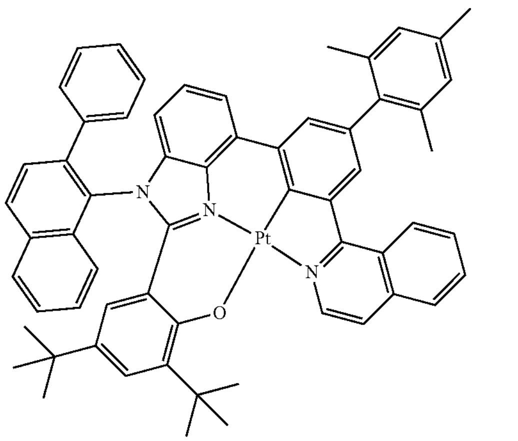
3-279
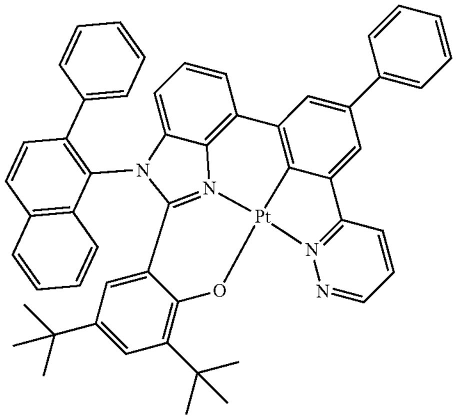
3-280
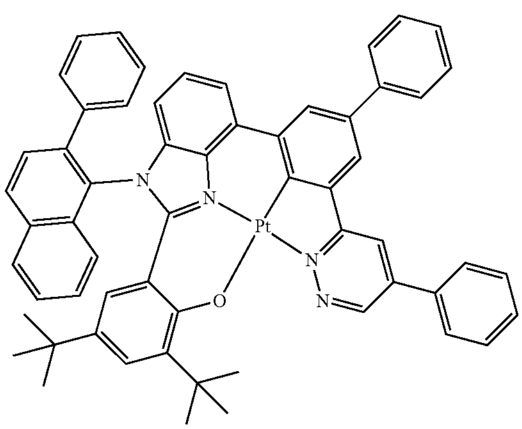
3-281
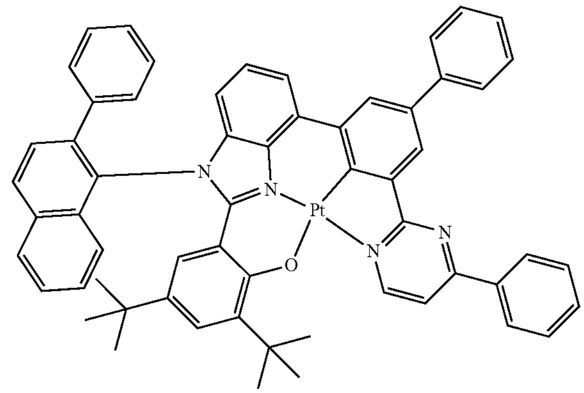
3-282
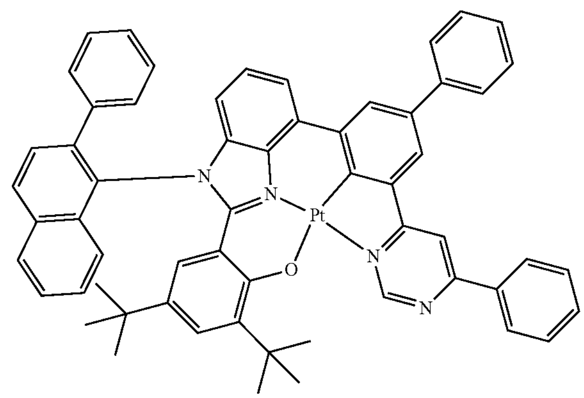
3-283
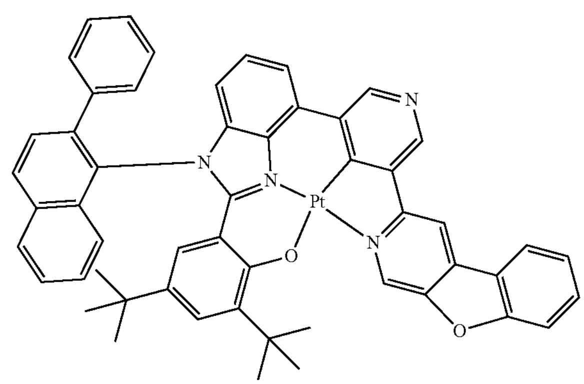
3-284
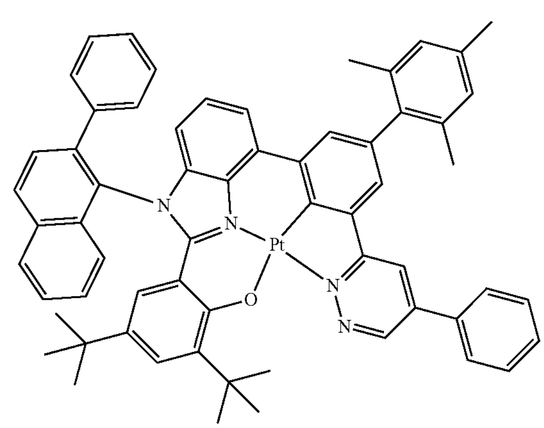

-continued
3-285
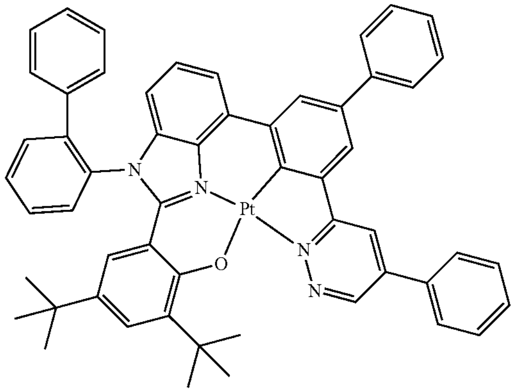
3-286
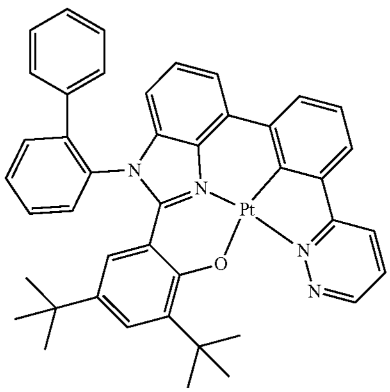
3-287
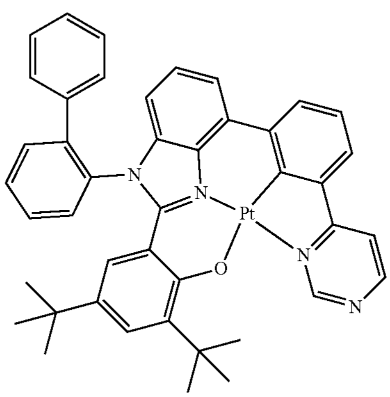
3-288
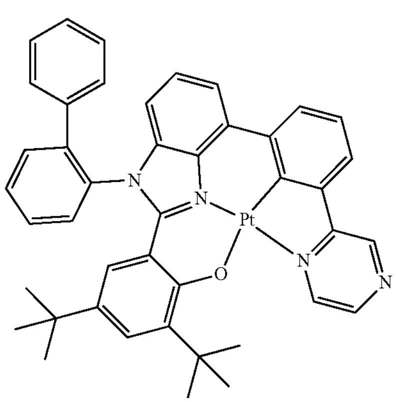
-continued
3-289
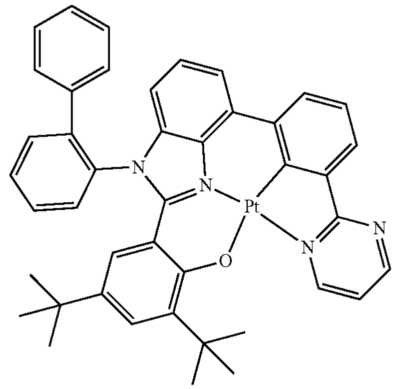
3-290
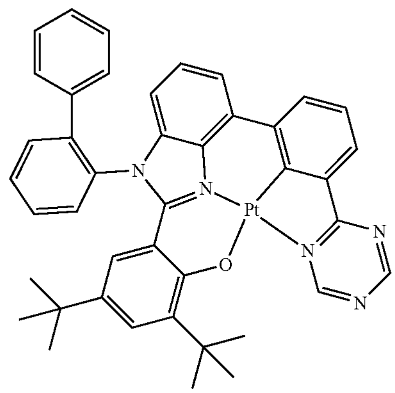
3-291
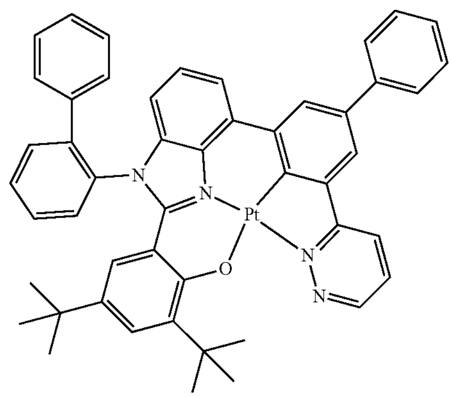
3-292
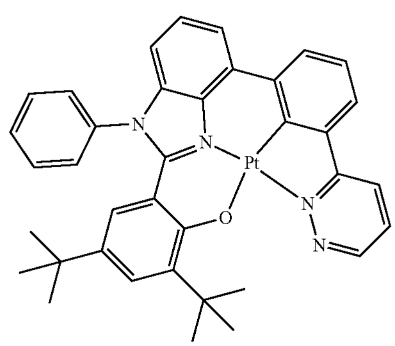

-continued
3-293
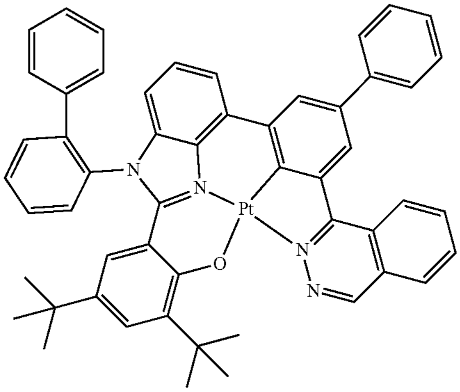
3-294
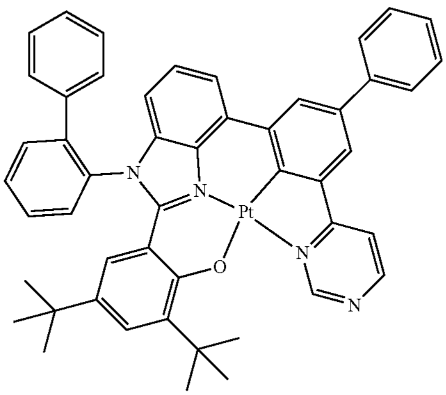
3-295
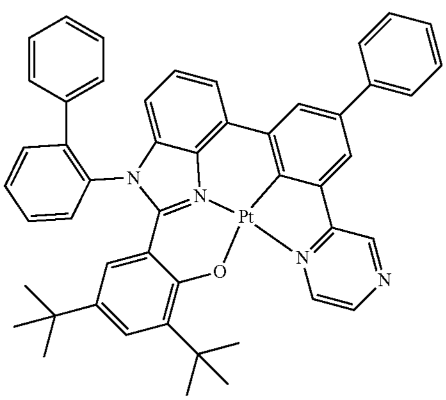
3-296
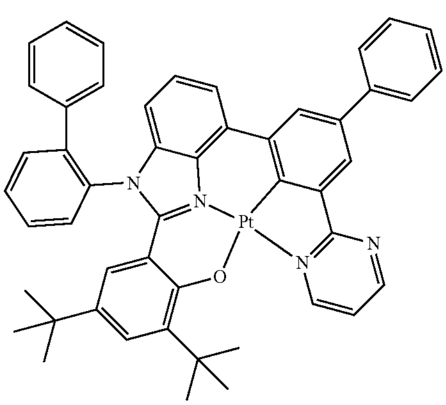
-continued
3-297
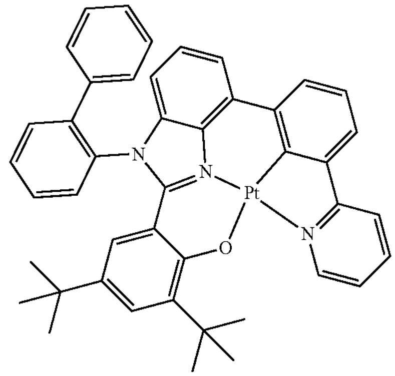
3-298
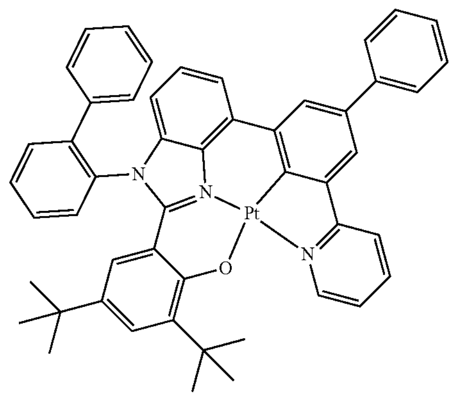
3-299
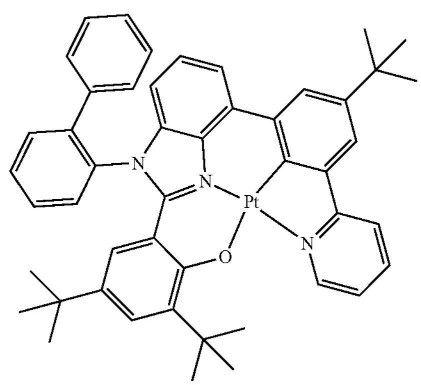
3-300
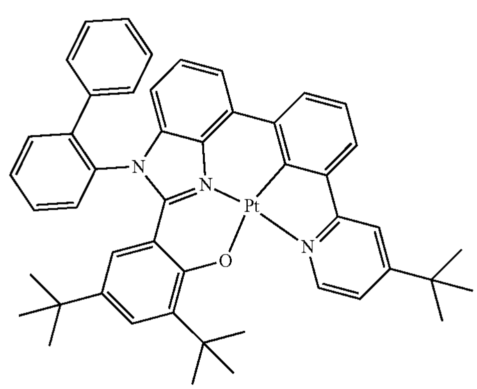

-continued
3-301
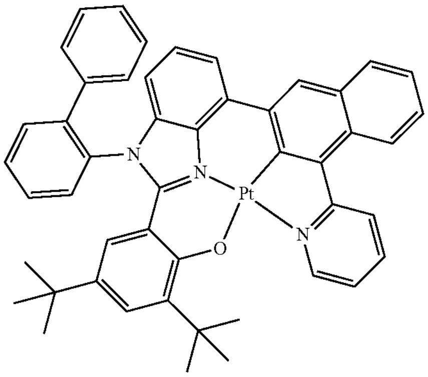
3-302
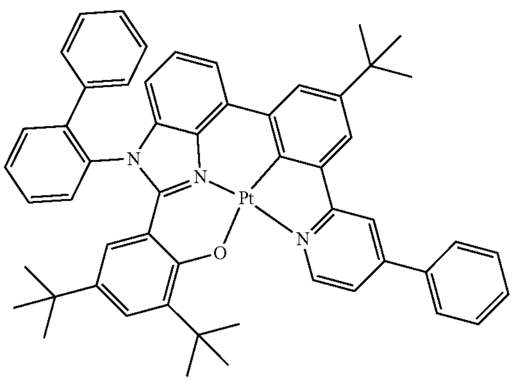
3-303
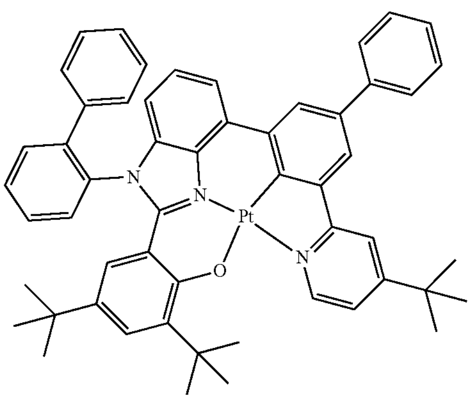
3-304
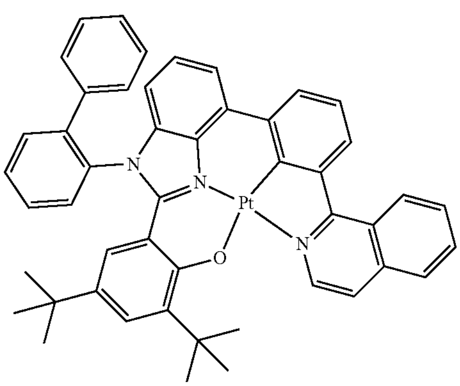
-continued
3-305
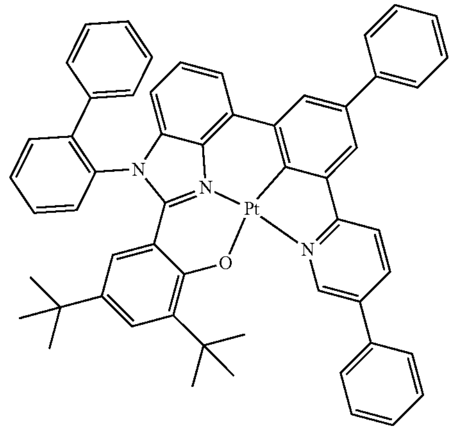
3-306
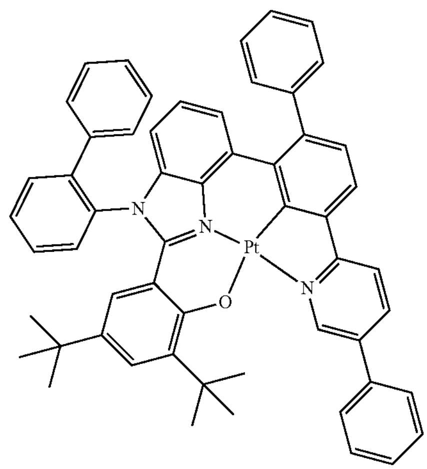
3-307
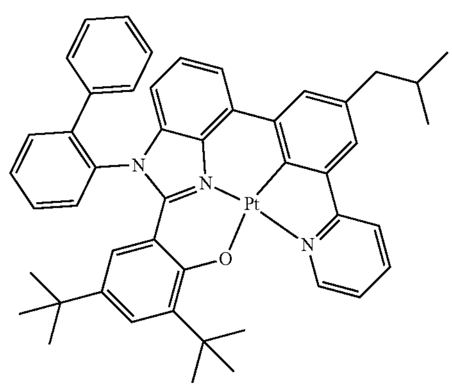

-continued
3-308
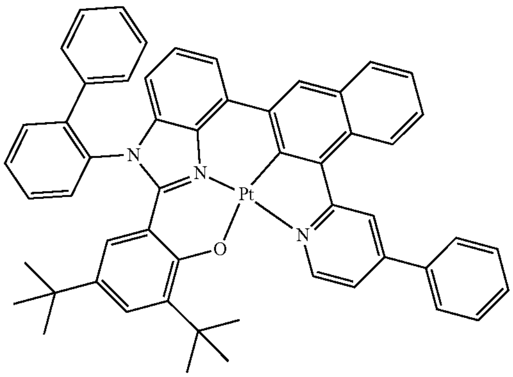
3-309
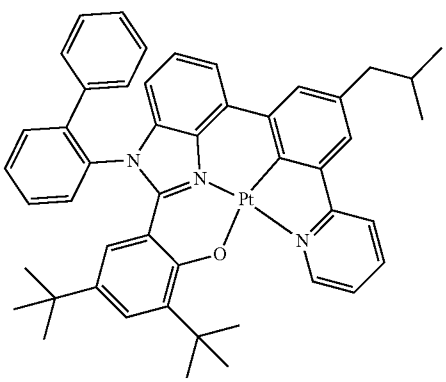
3-310
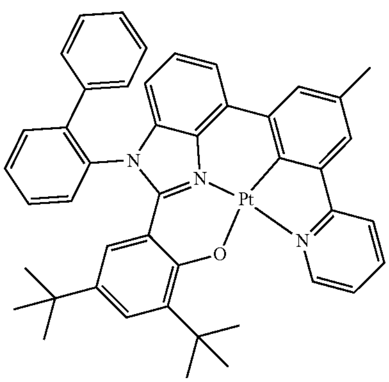
3-311
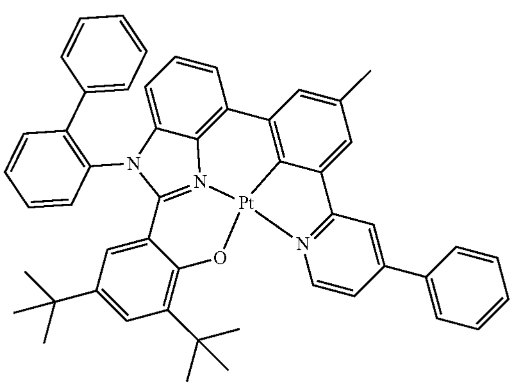
-continued
3-312
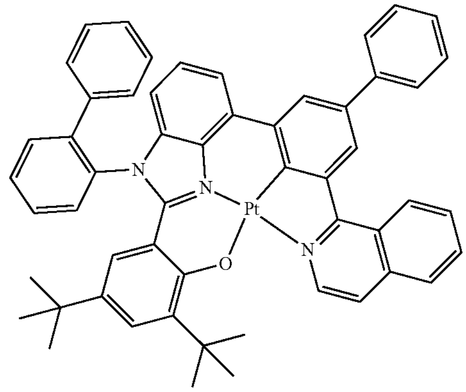
3-313
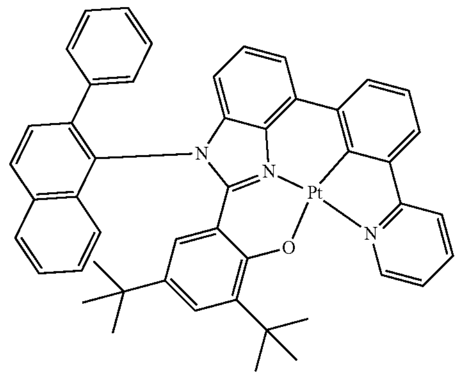
3-314
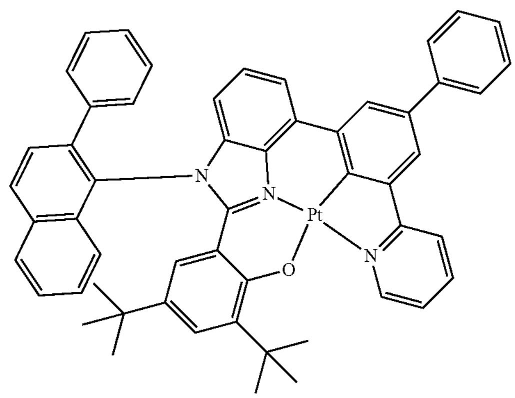
3-315
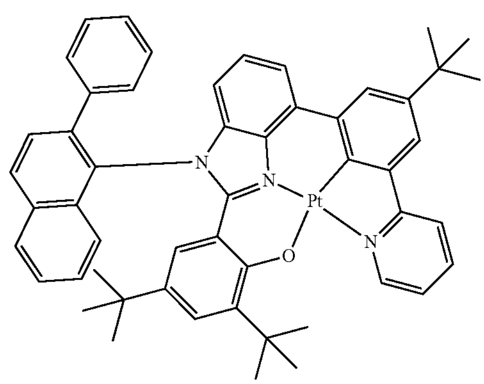

-continued
3-316
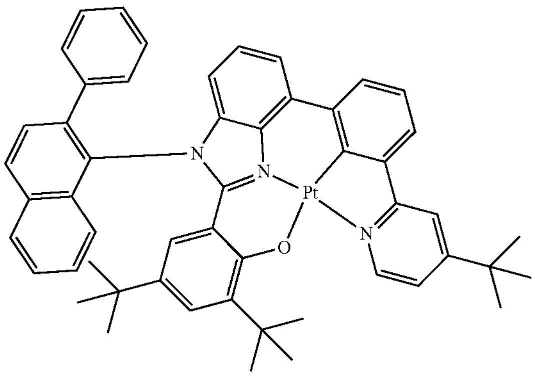
3-317
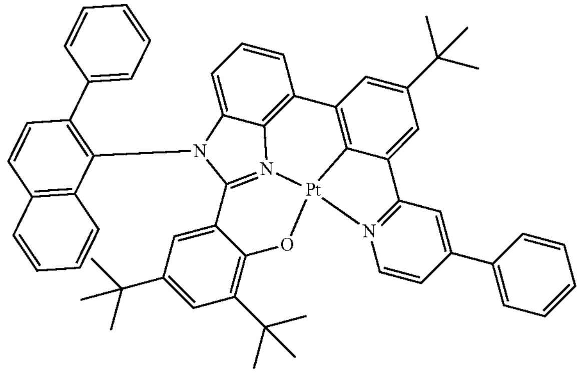
3-318
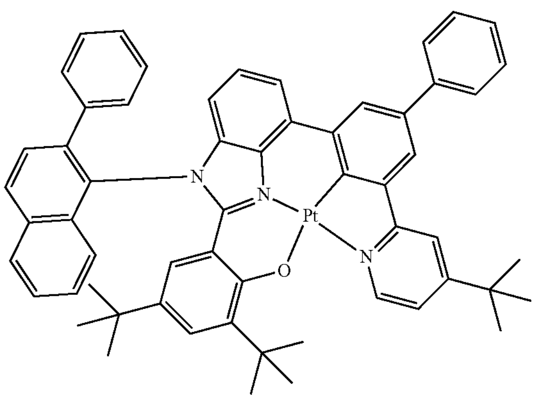
3-319
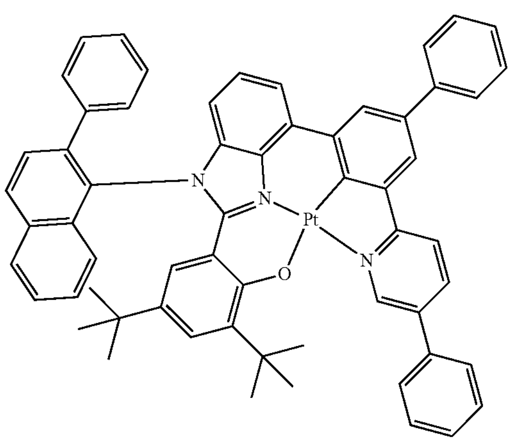
-continued
3-320
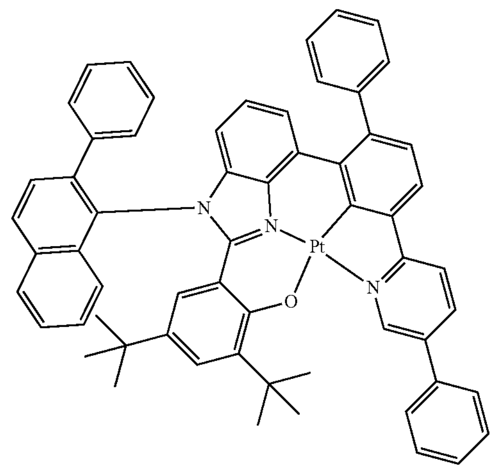
3-321
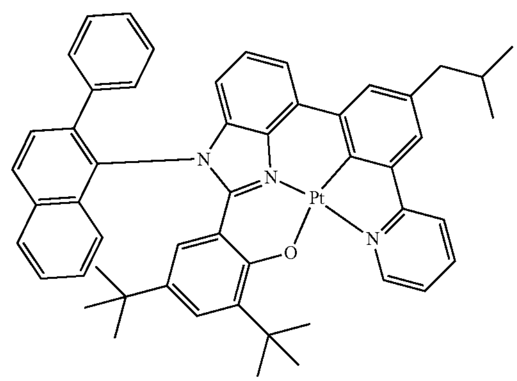
3-222
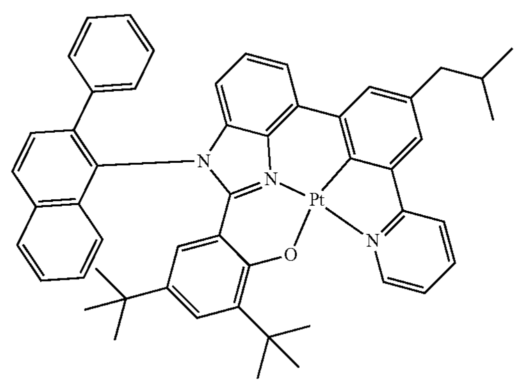
3-323
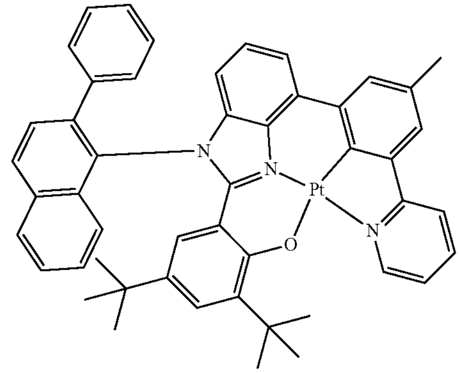

-continued
3-324
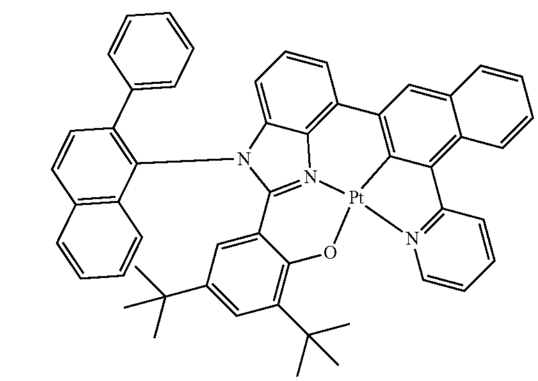
3-325
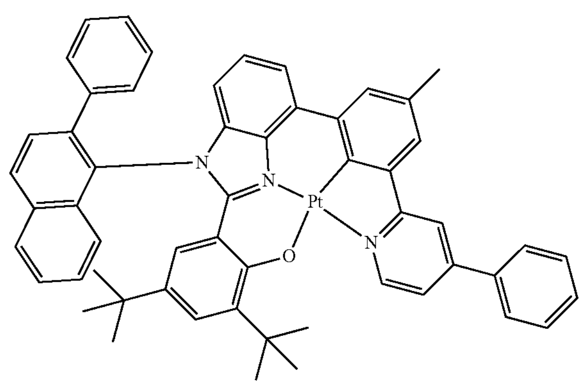
3-326
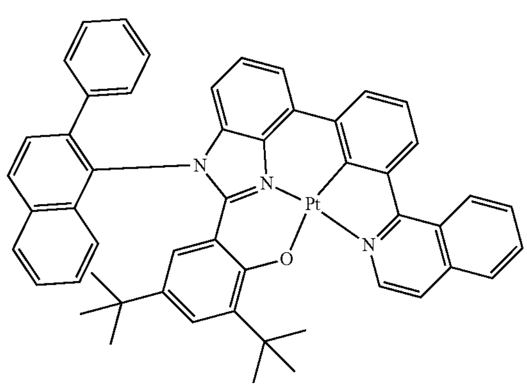
3-327
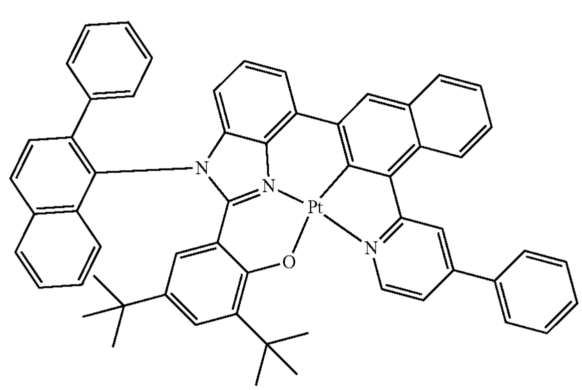
-continued
3-328
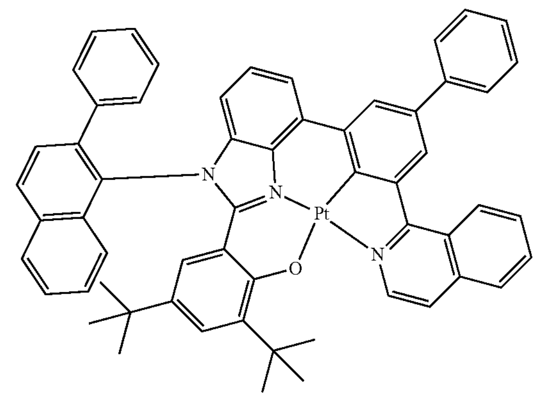
3-329
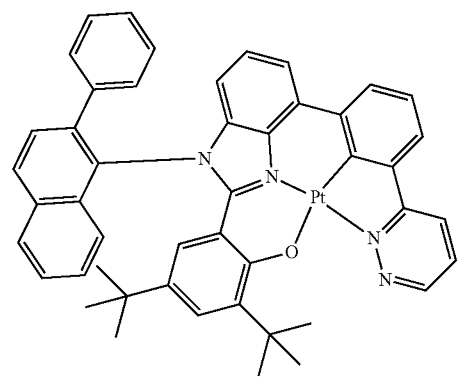
3-330
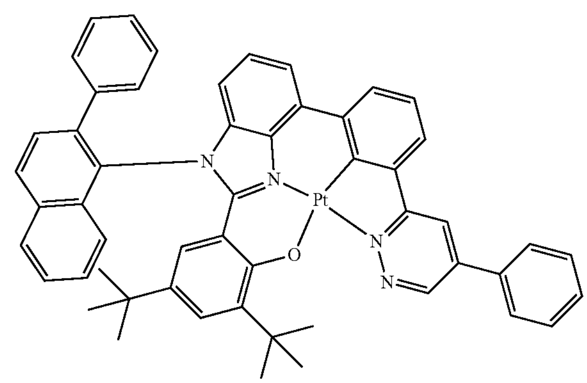
3-331
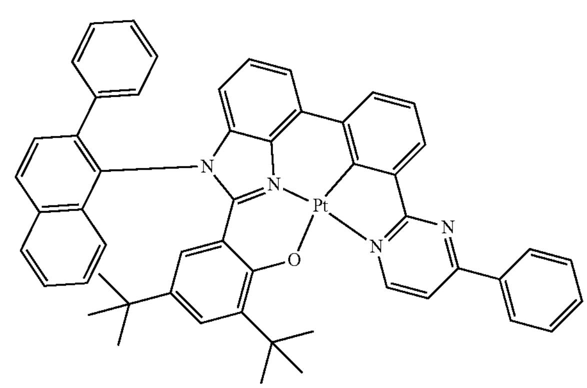

-continued
3-332
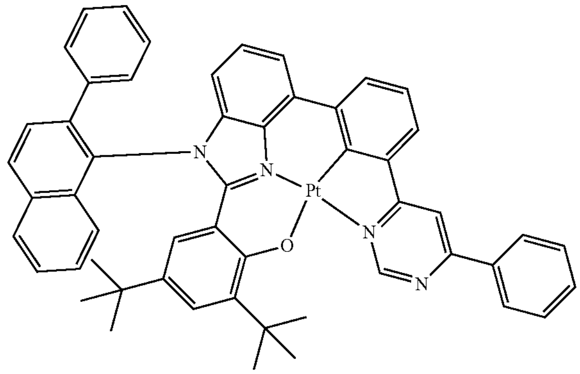
3-333
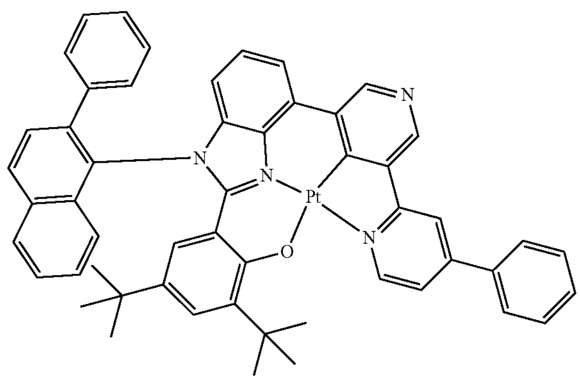
3-334
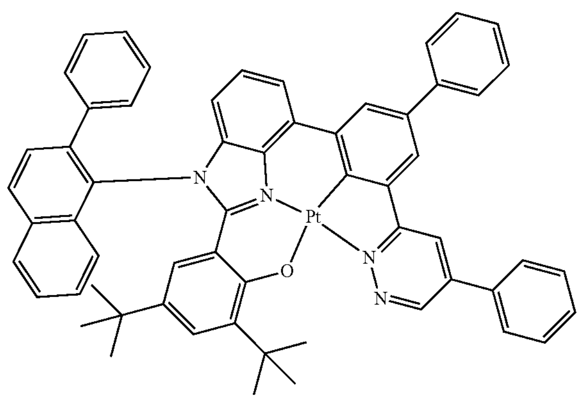
3-335
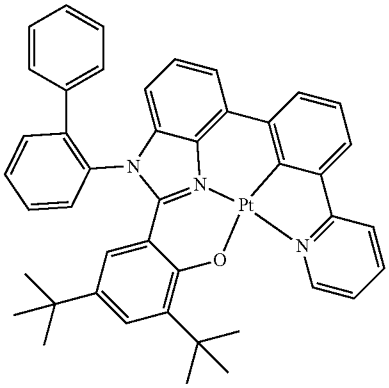
-continued
3-336
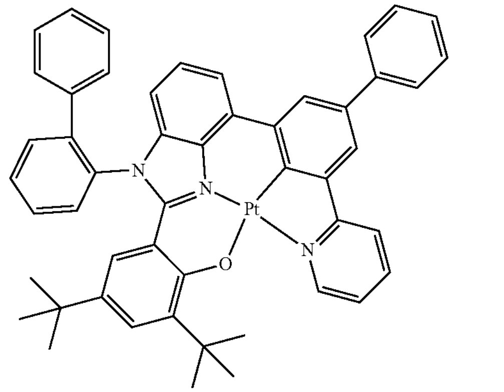
3-337
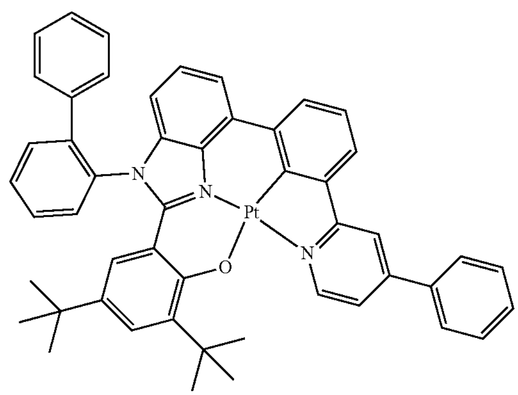
3-338
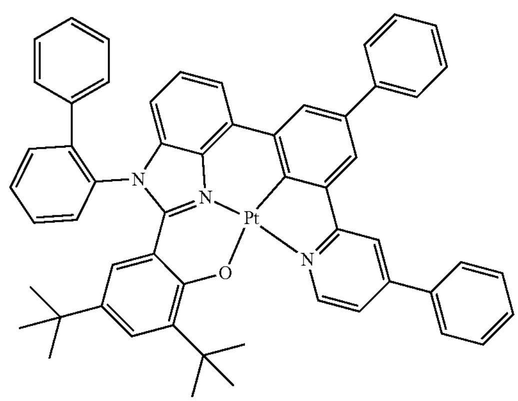

-continued
3-339
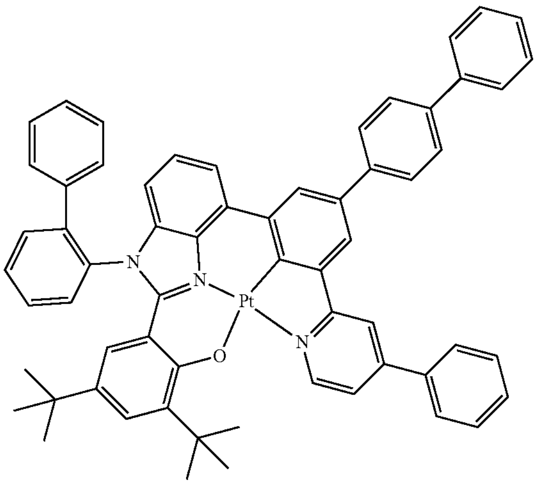
3-340
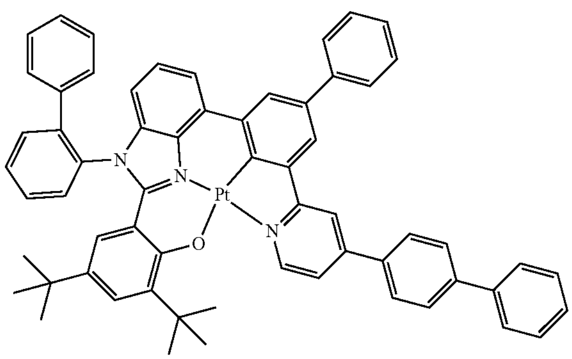
3-341
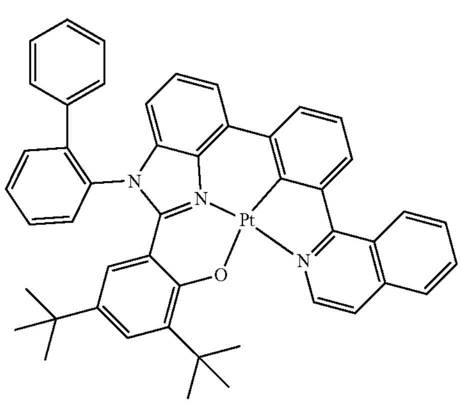
-continued
3-342
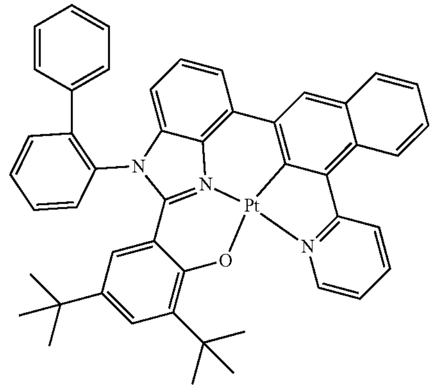
3-343
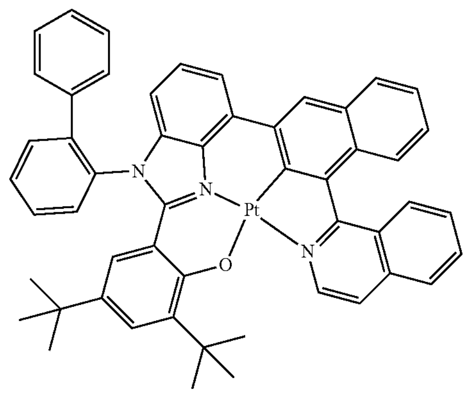
3-344
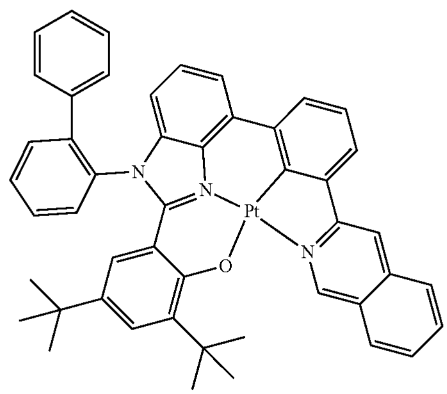
3-345
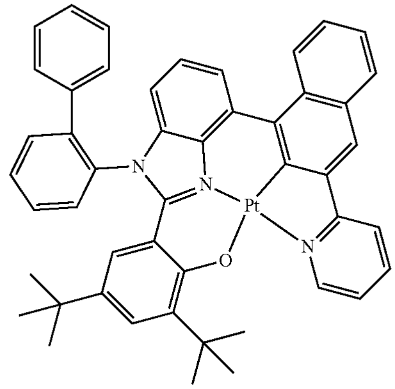

3-346
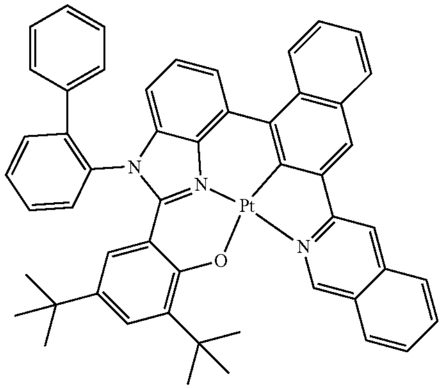
3-347
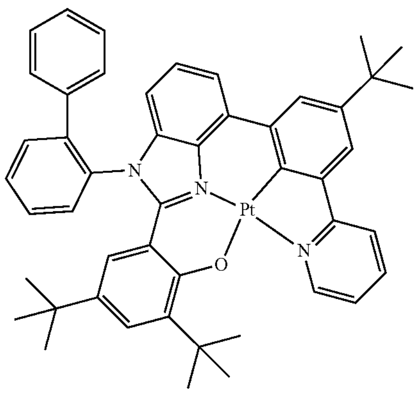
3-348
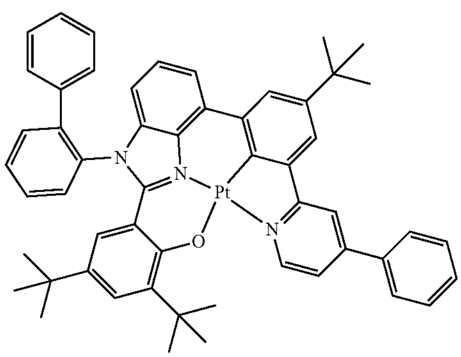
3-349
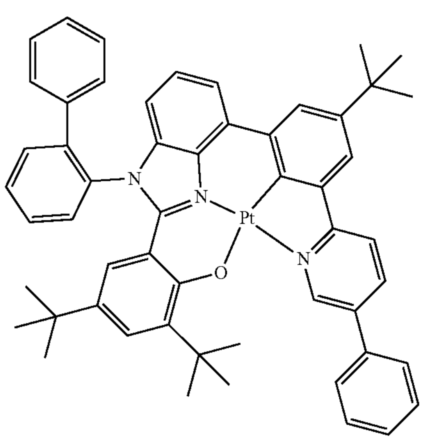
3-350
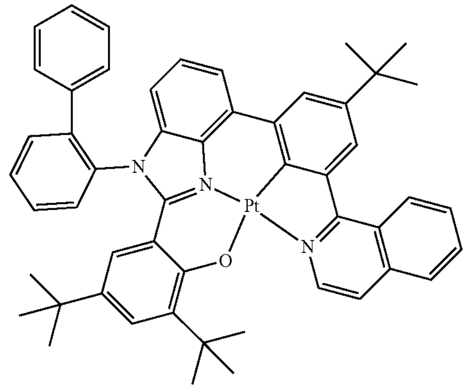
3-351
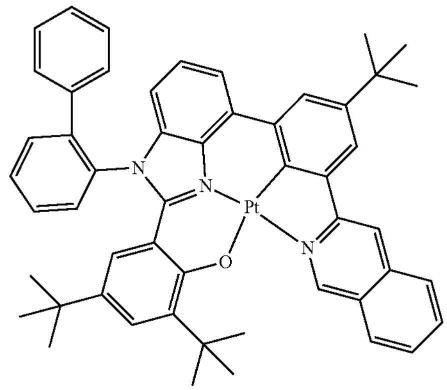
3-352
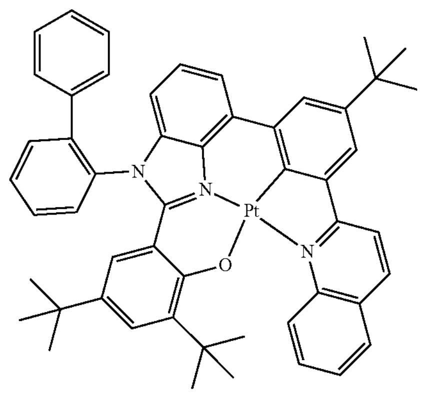
3-353
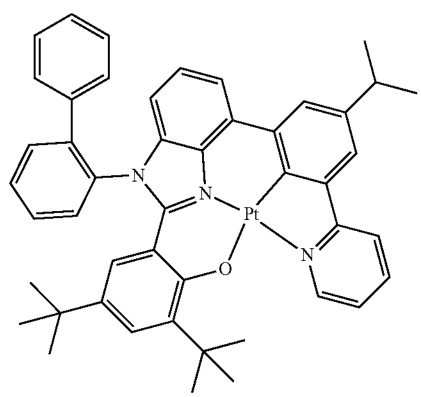

3-354
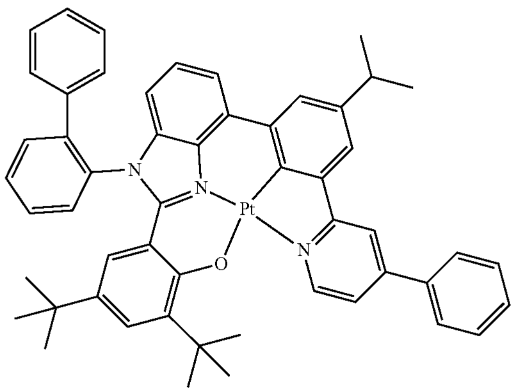
3-355
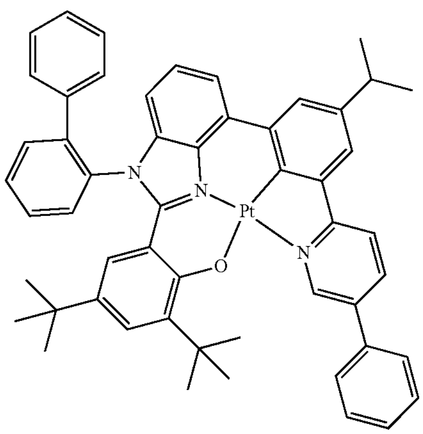
3-356
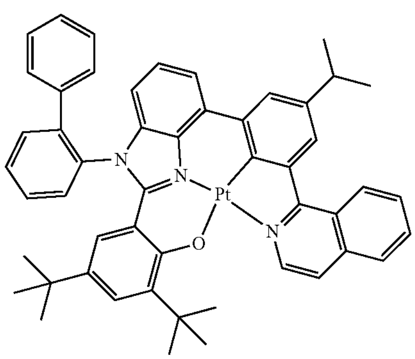
3-357
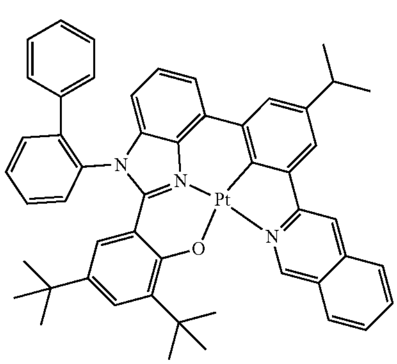
3-358
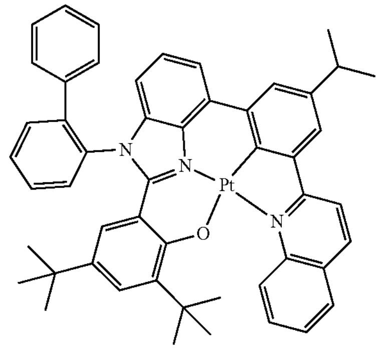
3-359
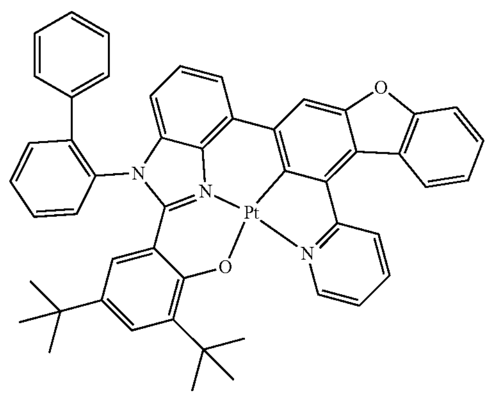
3-360
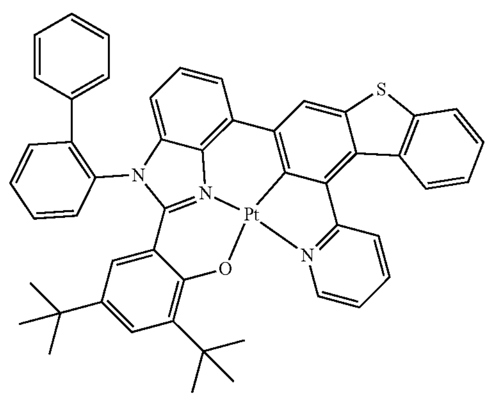
3-361
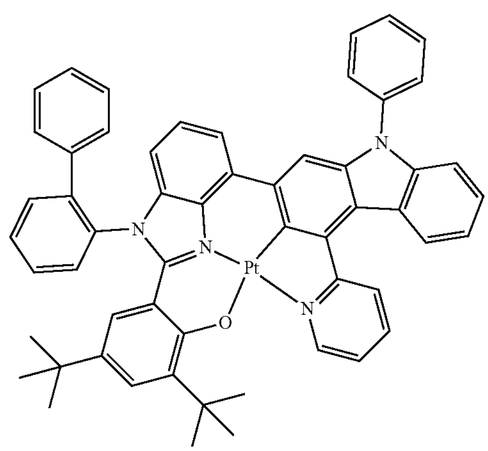

-continued
3-362
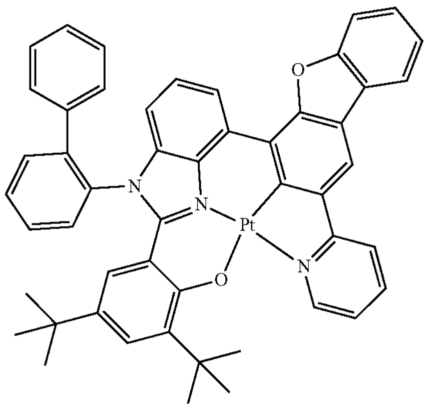
3-363
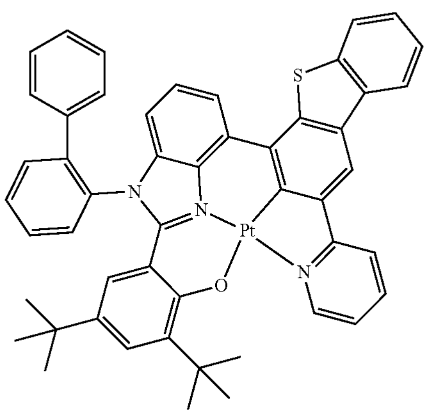
3-364
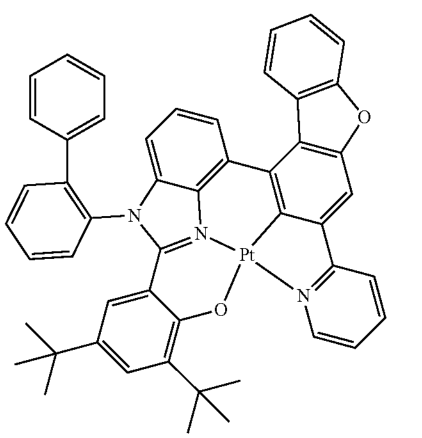
-continued
3-365
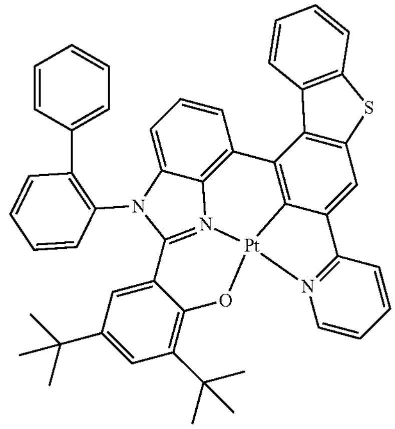
3-366
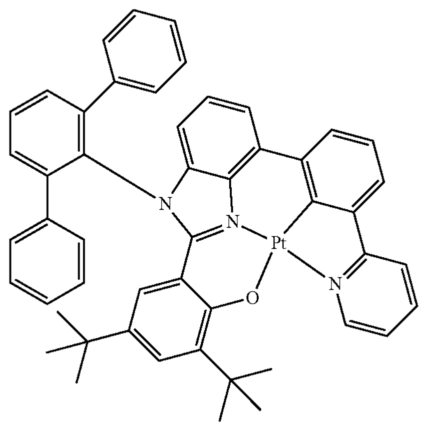
3-367
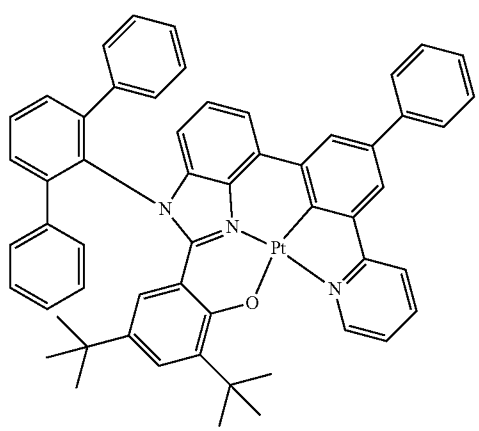

3-368
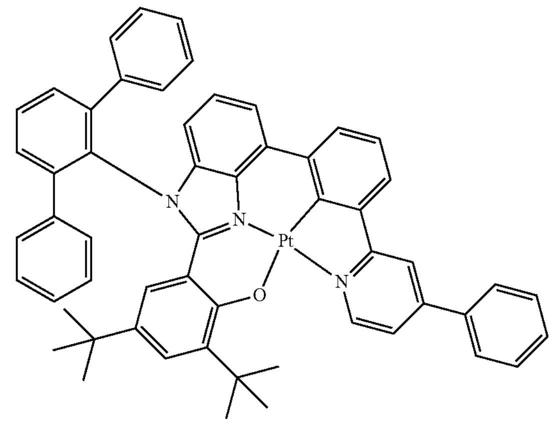
3-369
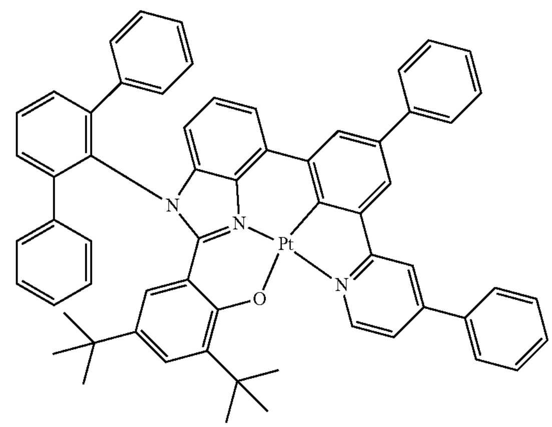
3-370
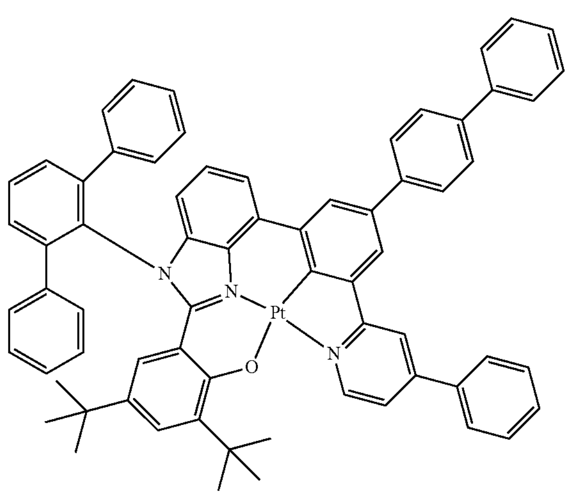
3-371
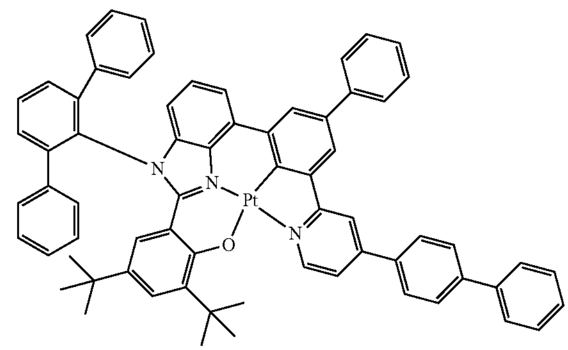
3-372
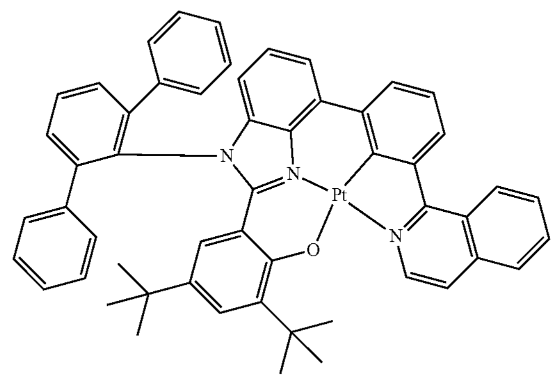
3-373
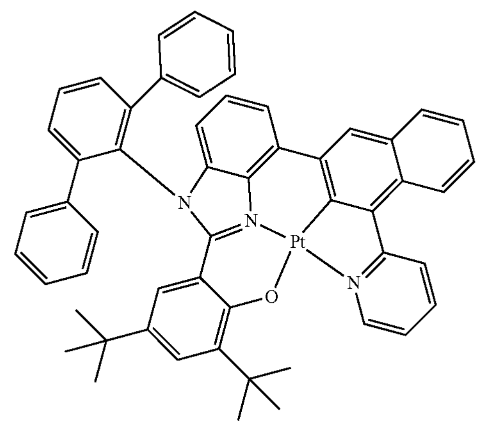
3-374
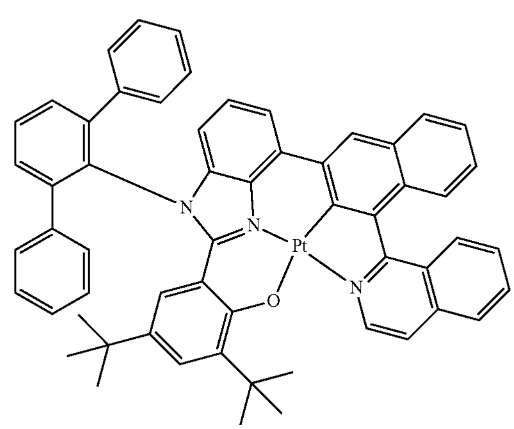

-continued
3-375
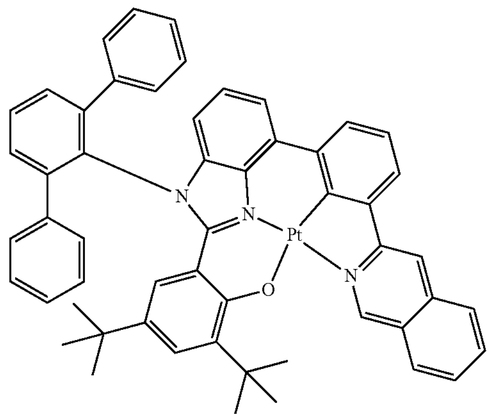
3-376
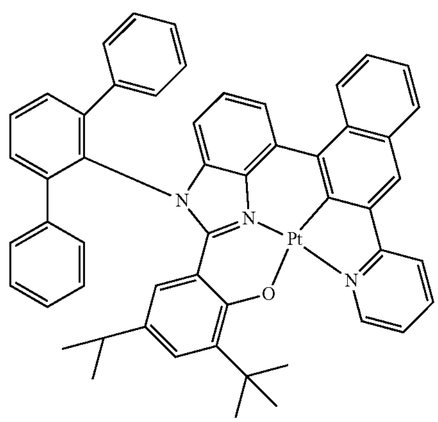
3-377
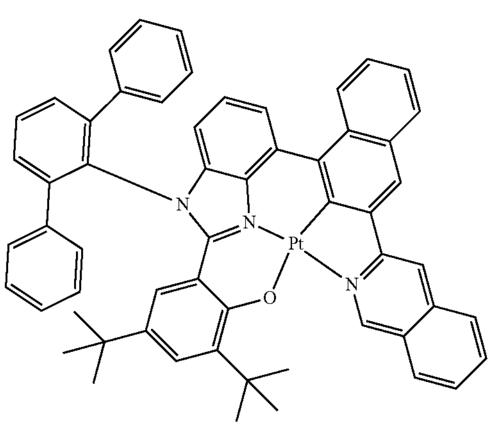
-continued
3-378
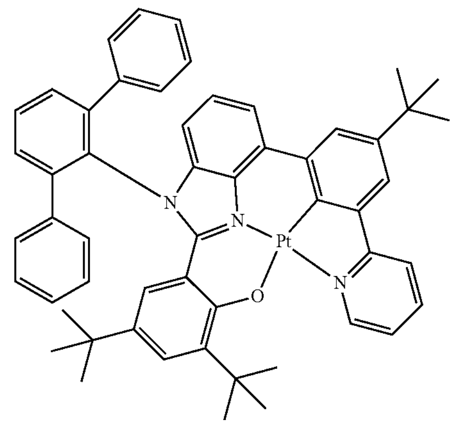
3-379
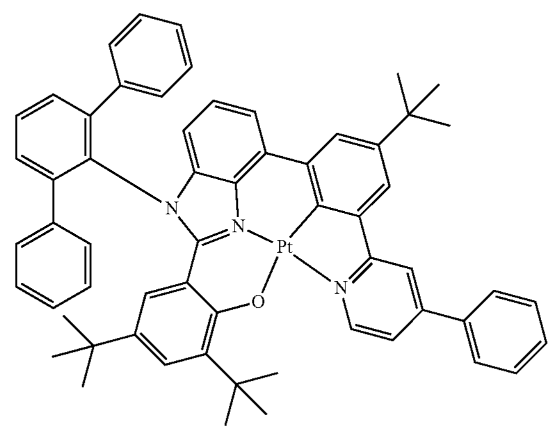
3-380
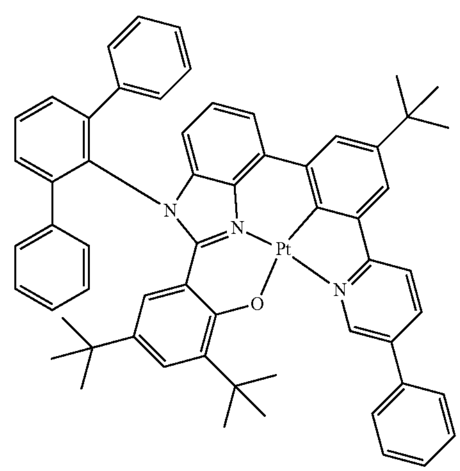

-continued
3-381
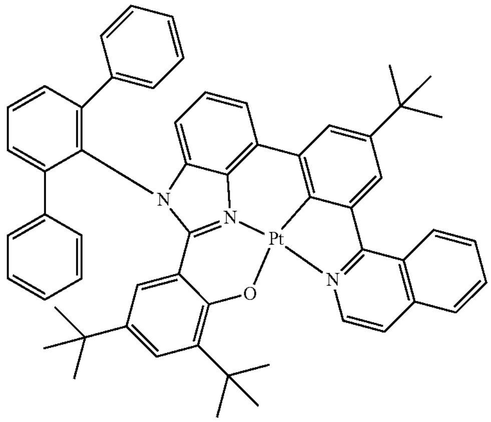
3-382
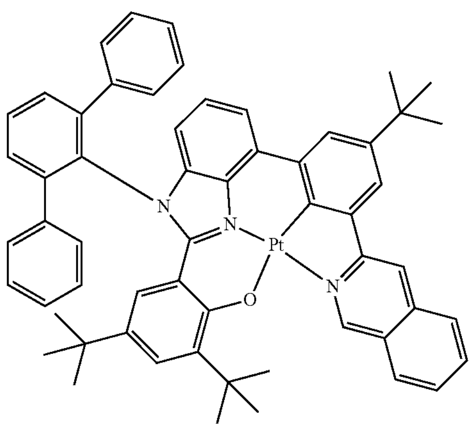
3-383
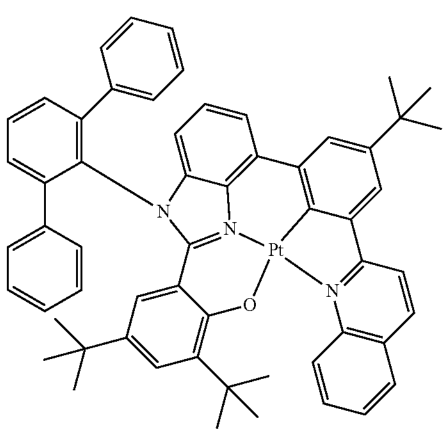
-continued
3-384
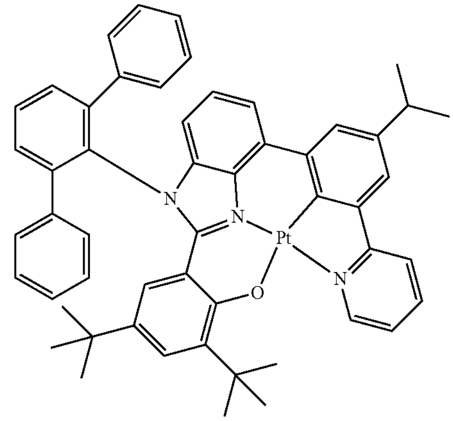
3-385
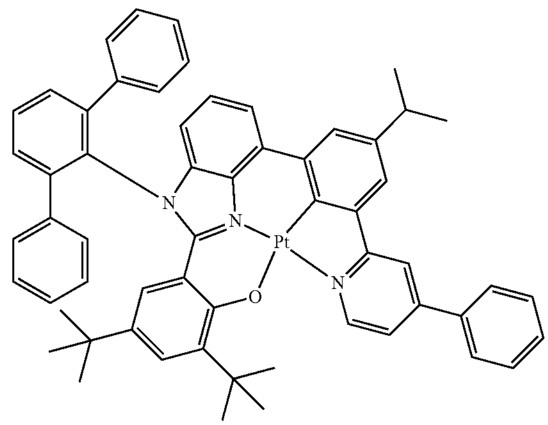
3-386
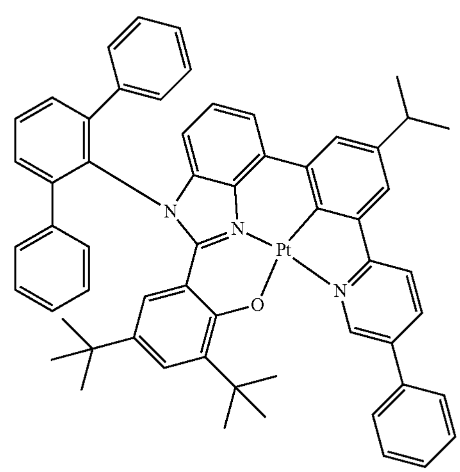

-continued
3-387
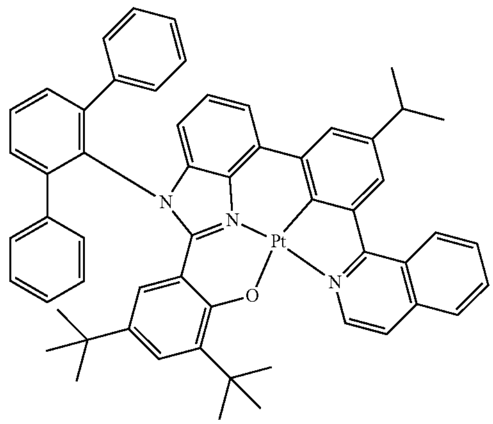
3-388
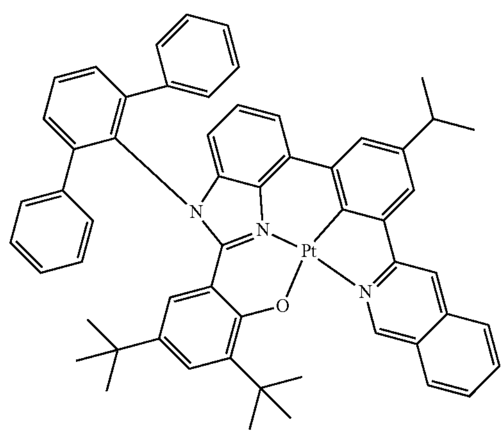
3-389
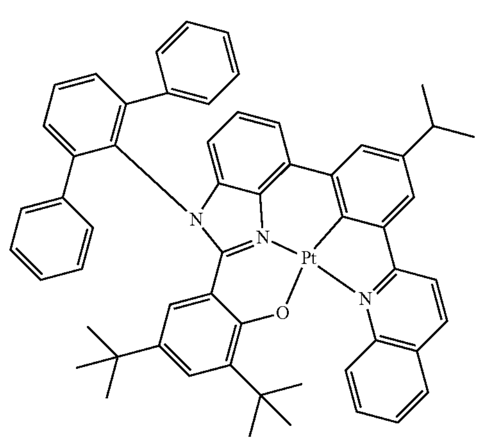
-continued
3-390
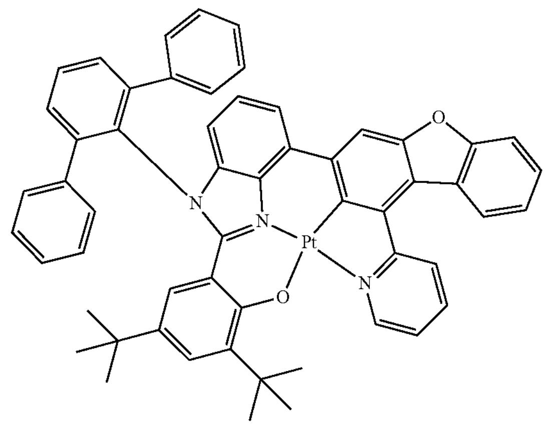
3-391
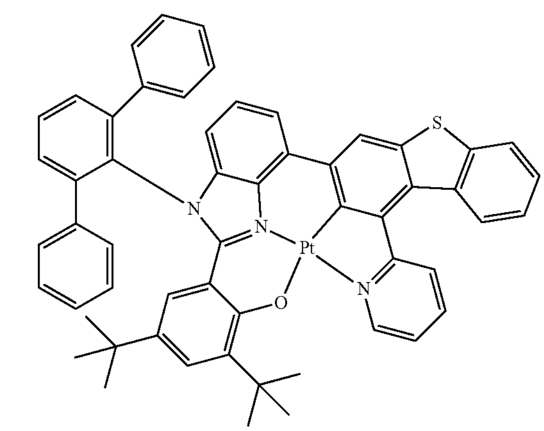
3-392
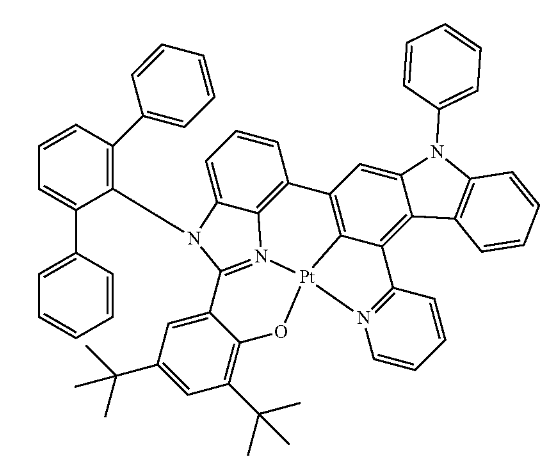

-continued
3-393
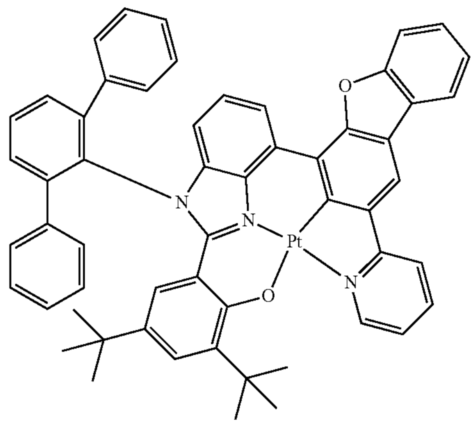
3-394
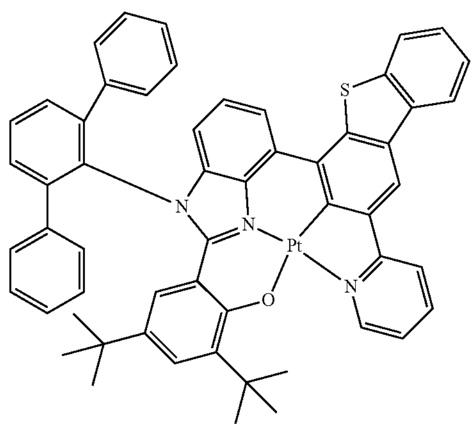
3-395
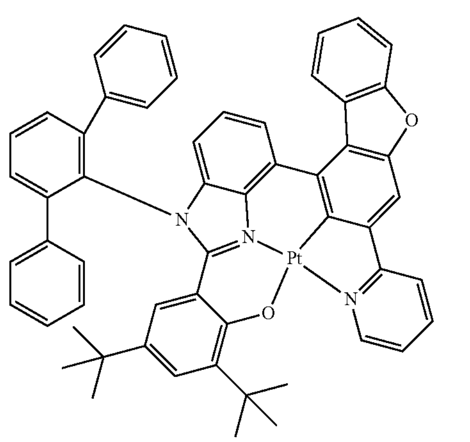
-continued
3-396
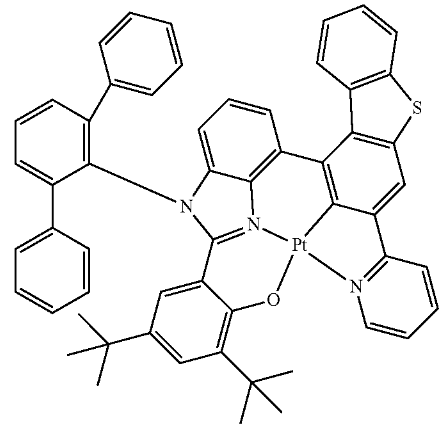
3-397
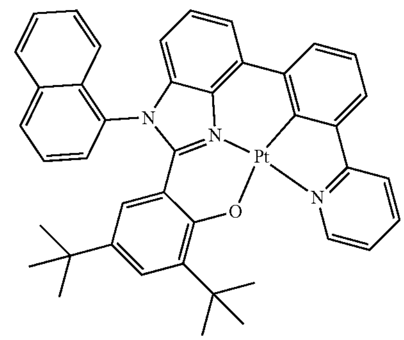
3-398
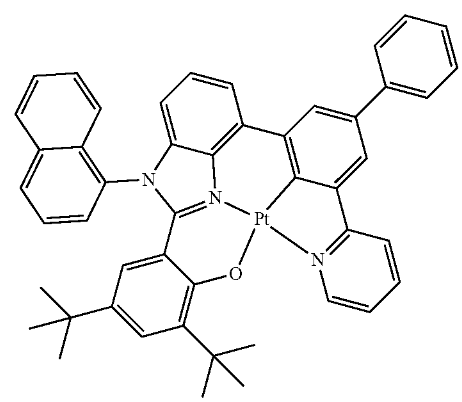
3-399
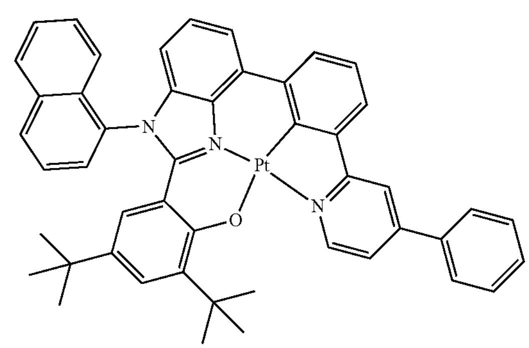

3-400
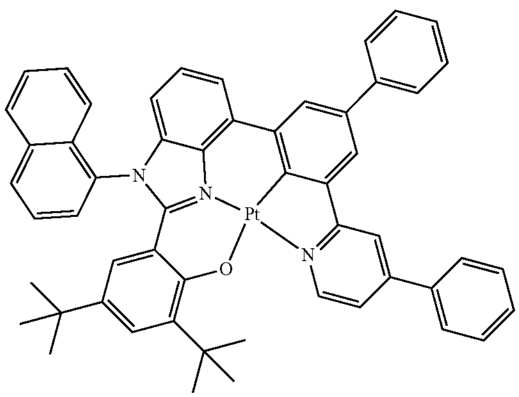
3-401
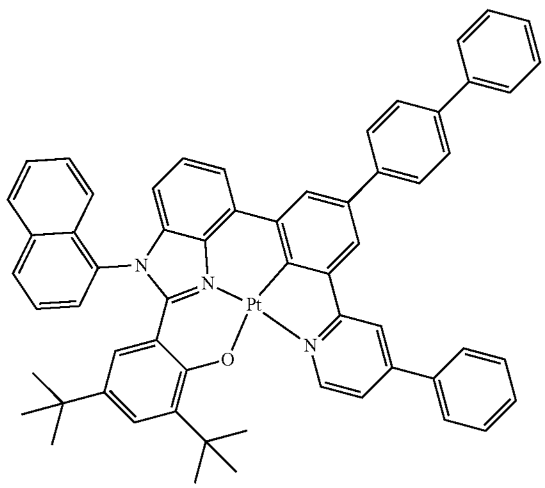
3-402
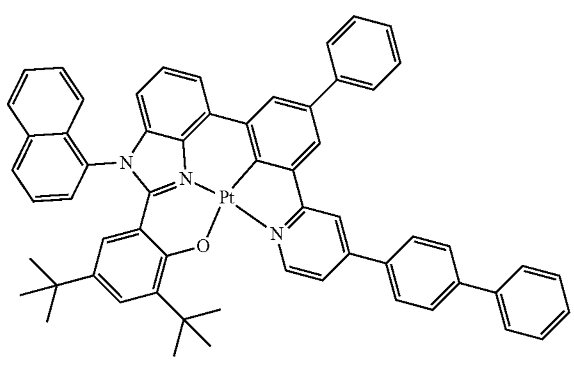
3-403
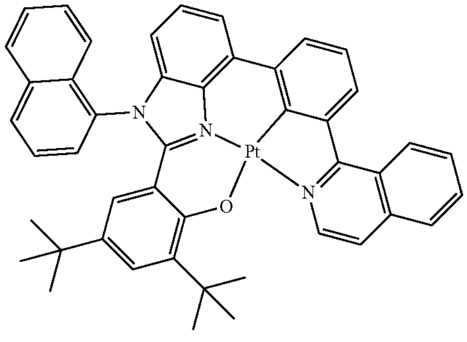
3-404
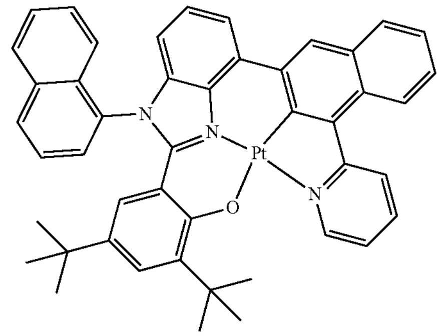
3-405
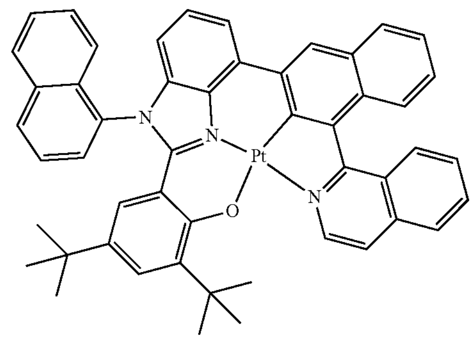
3-406
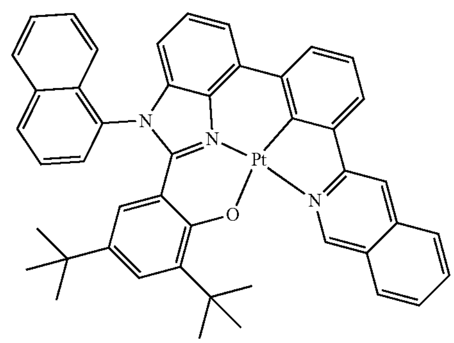
3-407
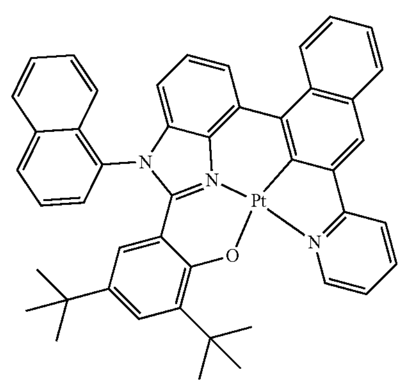

3-408
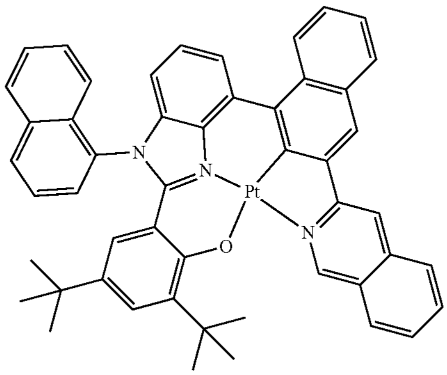
3-409
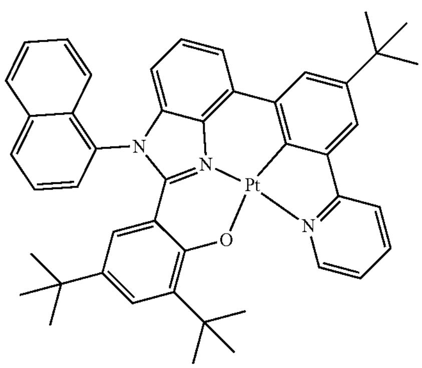
3-410
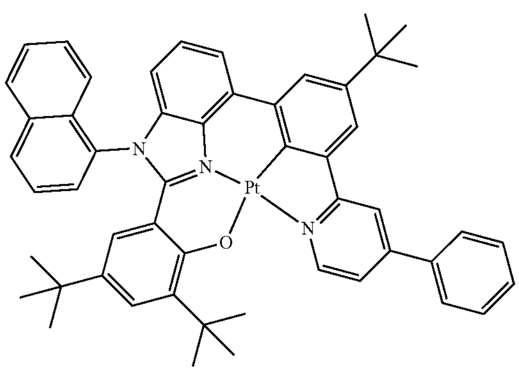
3-411
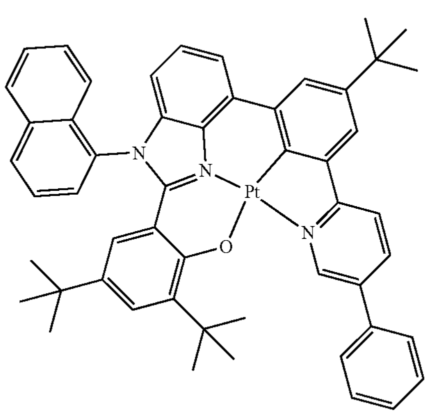
3-412
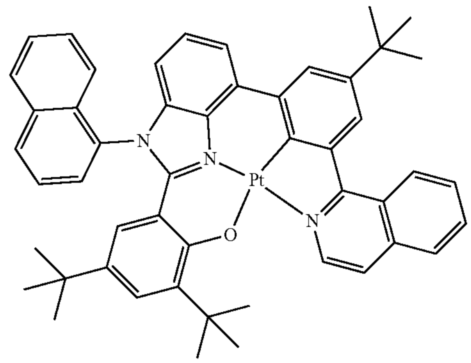
3-413
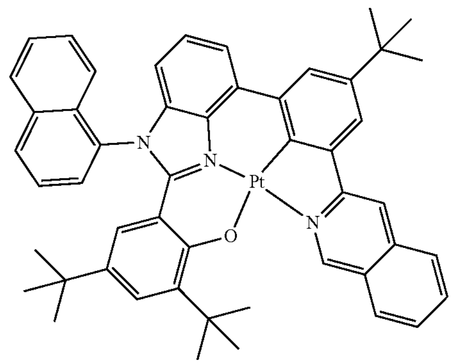
3-414
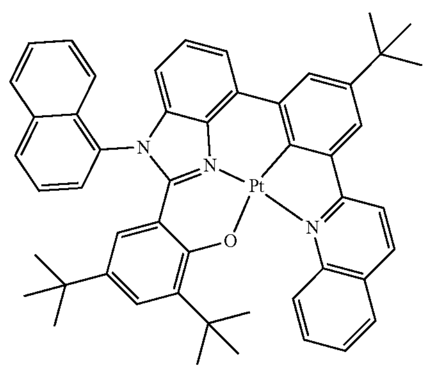
3-415
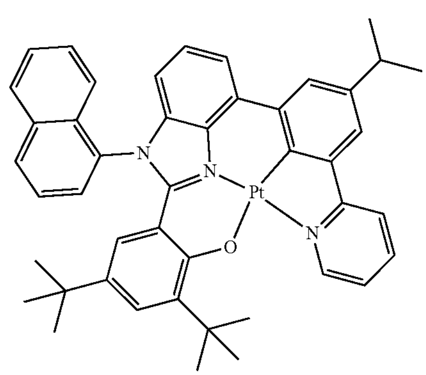

-continued
3-416
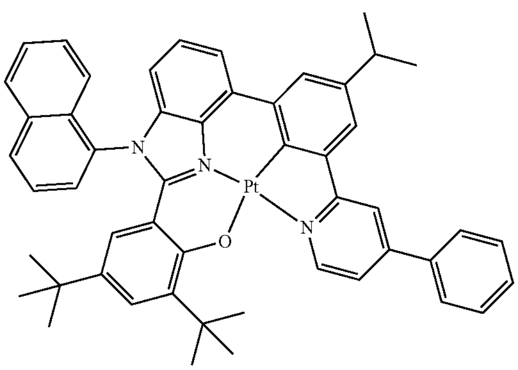
3-417
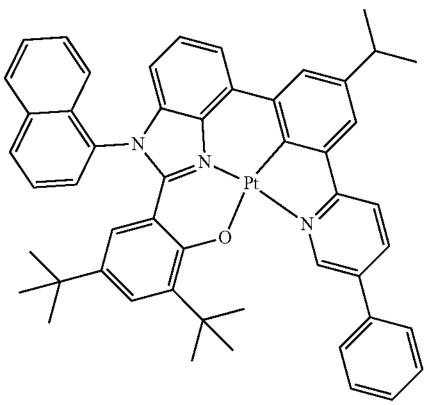
3-418
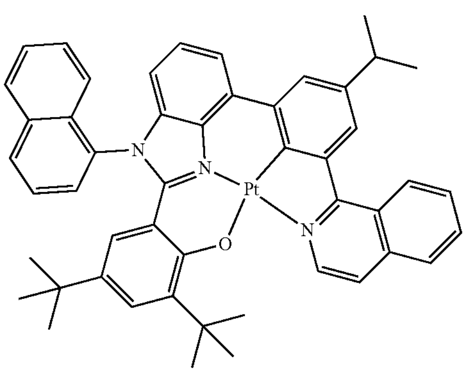
3-419
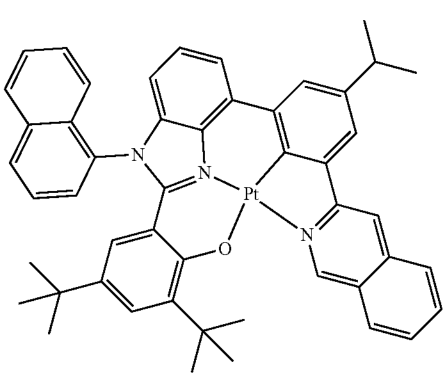
-continued
3-420
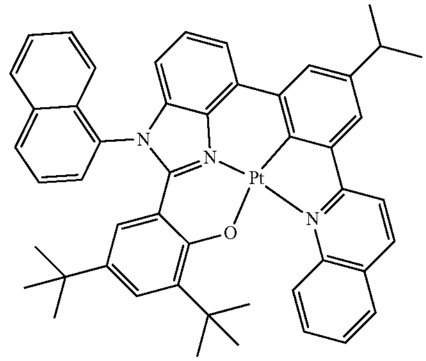
3-421
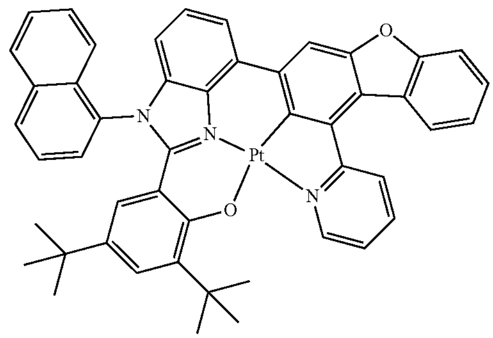
3-422
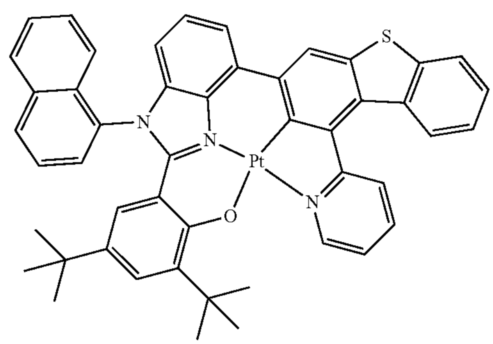
3-423
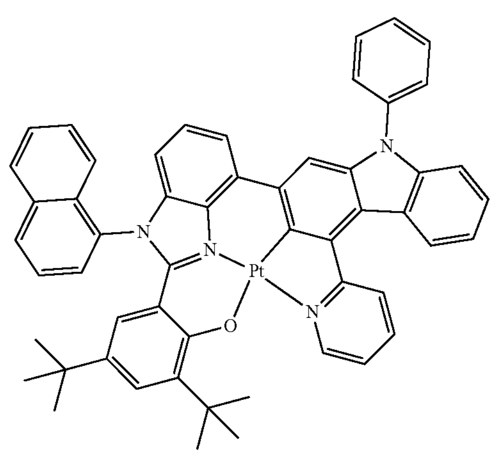

-continued
3-424
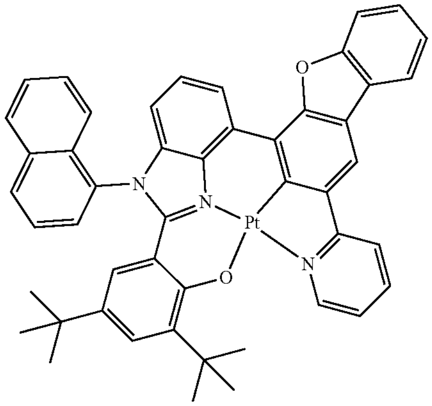
3-425
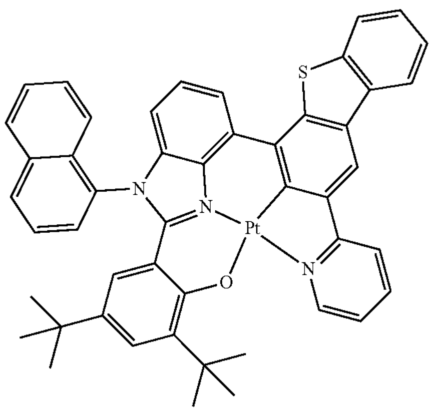
3-426
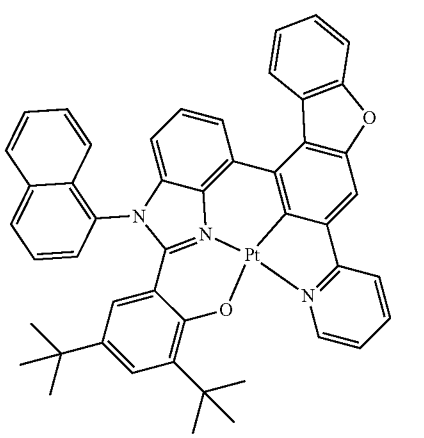
-continued
3-427
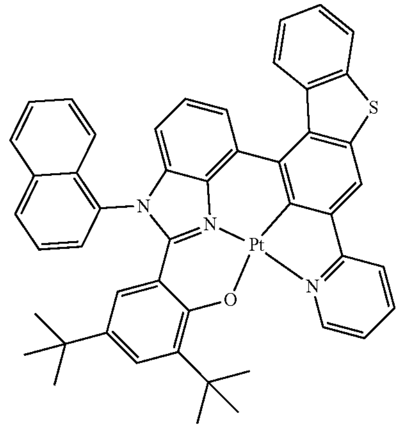
3-428
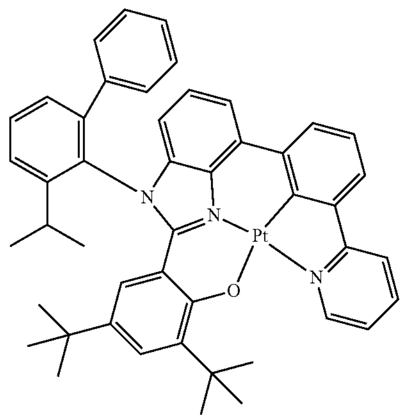
3-429
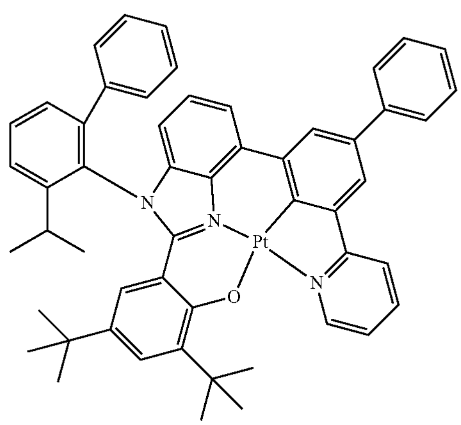

-continued
3-430
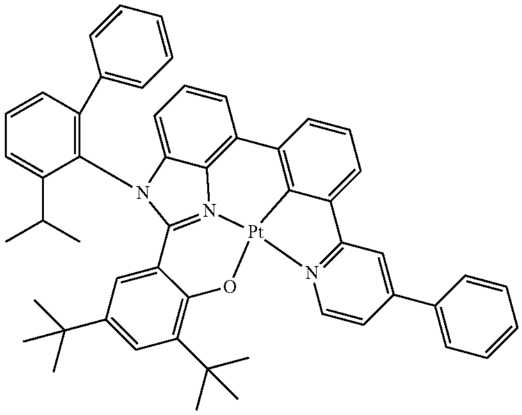
3-431
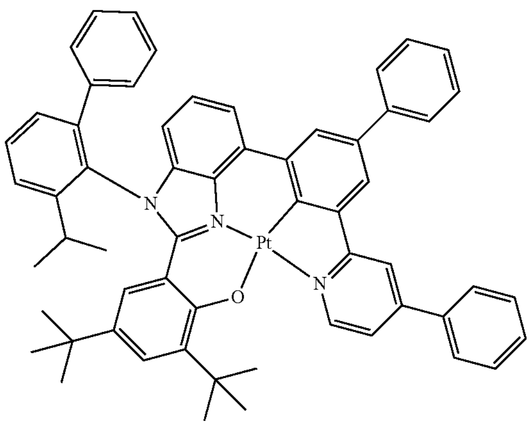
3-432
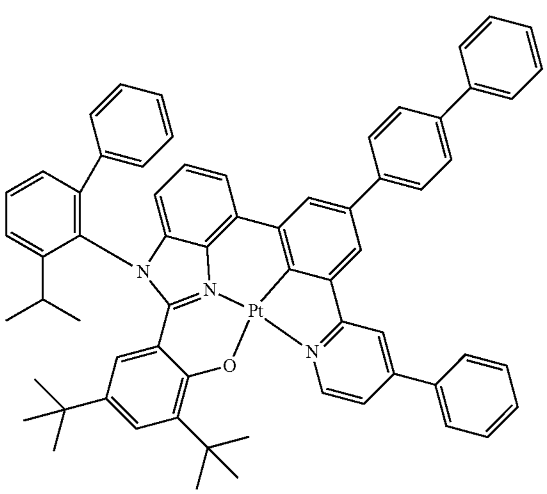
-continued
3-433
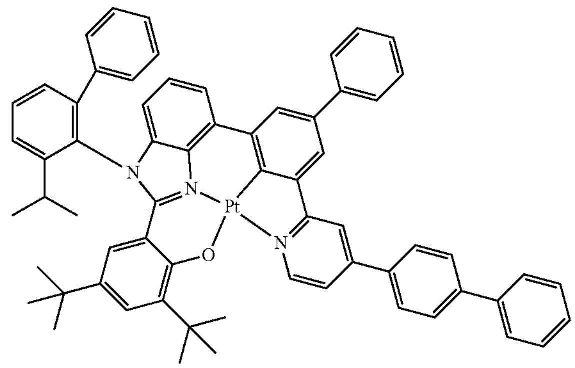
3-434
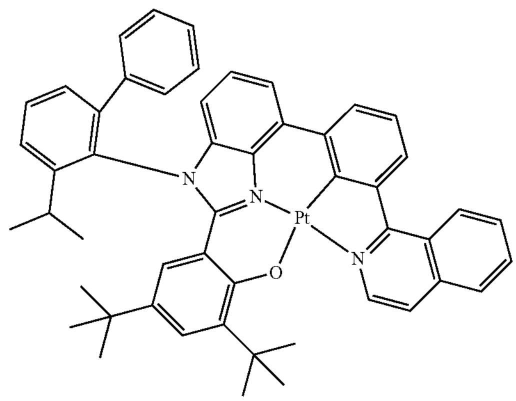
3-435
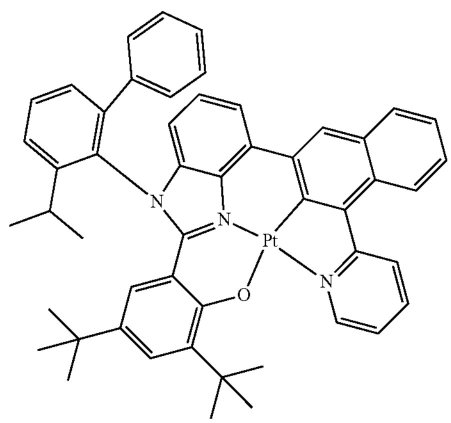
3-436
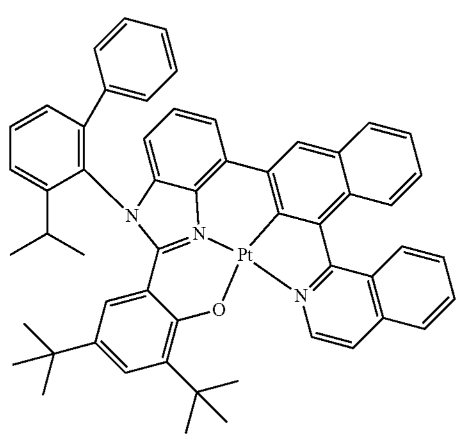

-continued
3-437
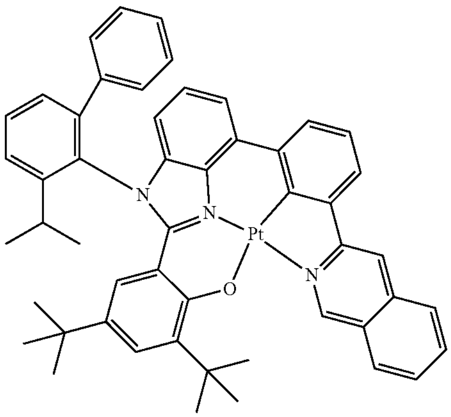
3-438
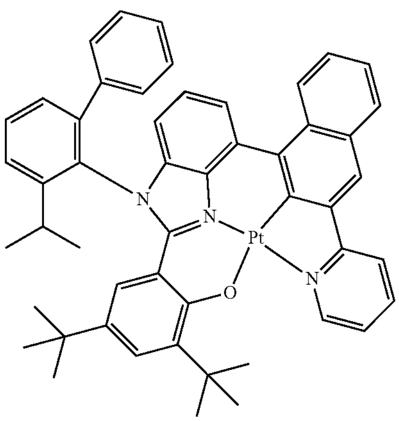
3-439
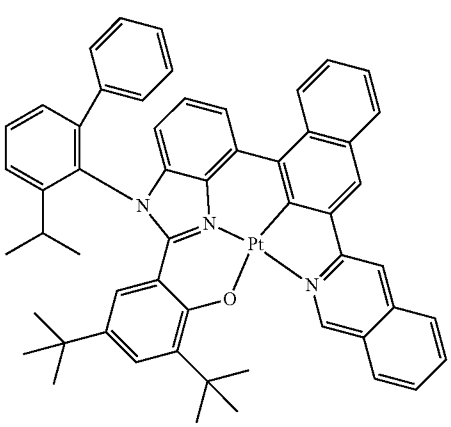
-continued
3-440
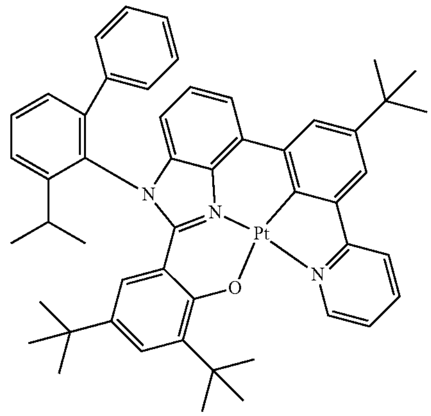
3-441
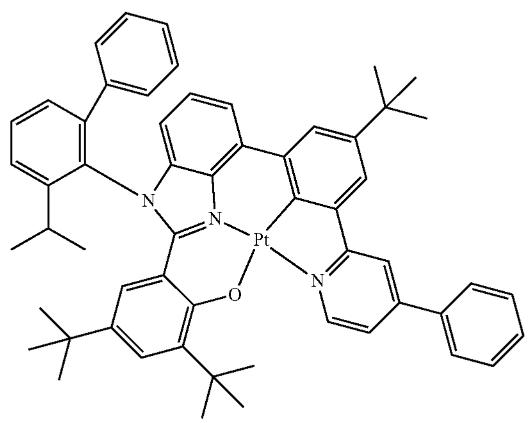
3-442
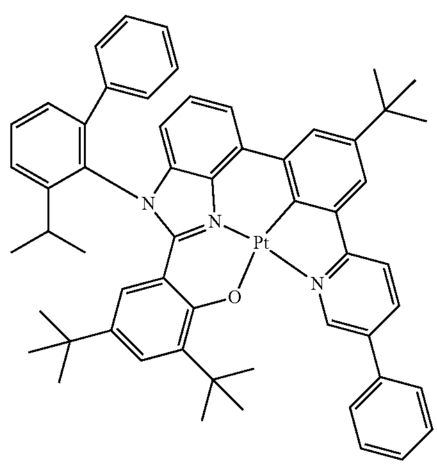

-continued
3-443
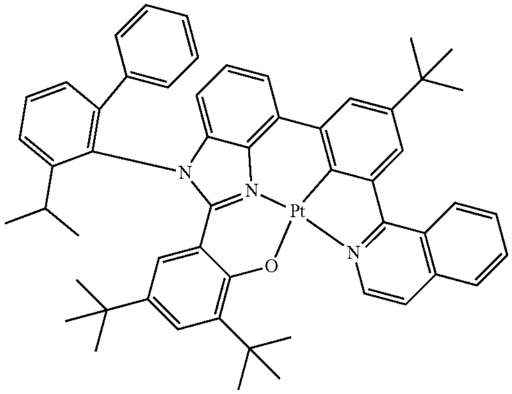
3-444
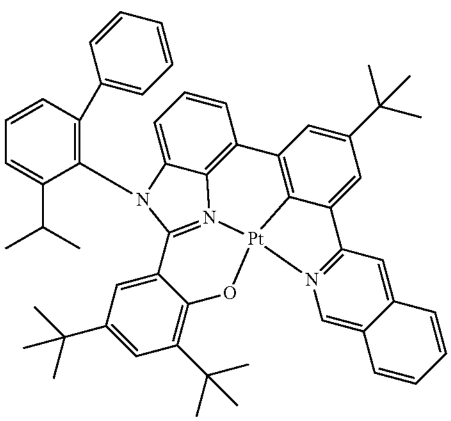
3-445
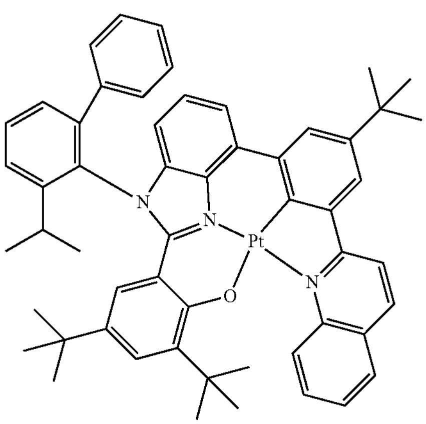
-continued
3-446
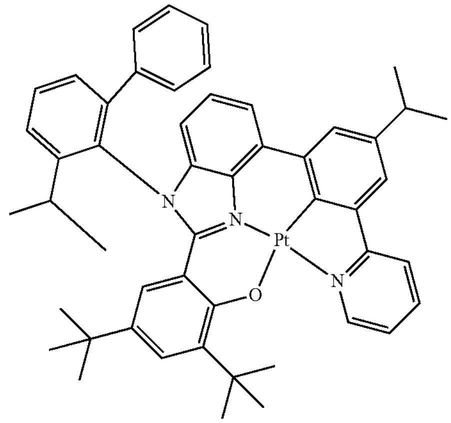
3-447
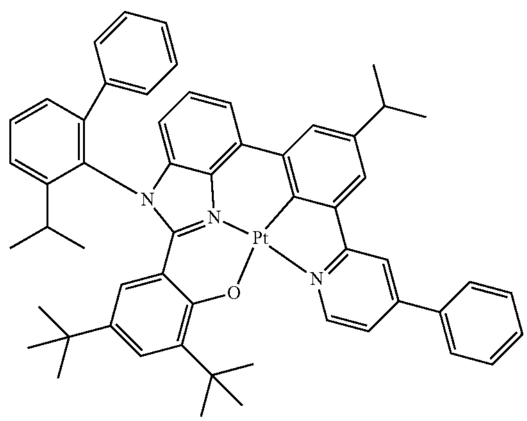
3-448
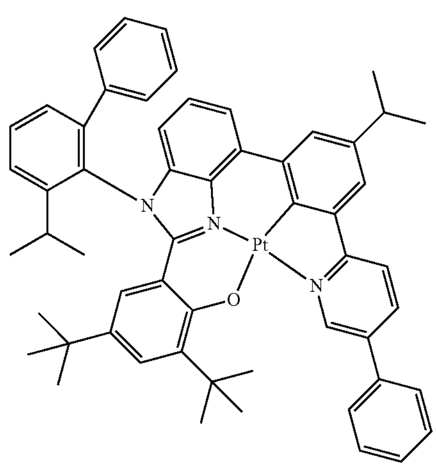

-continued
3-449
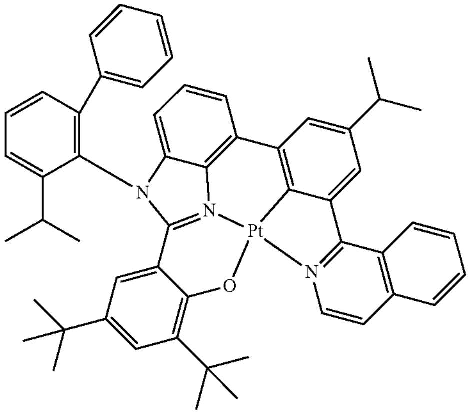
3-450
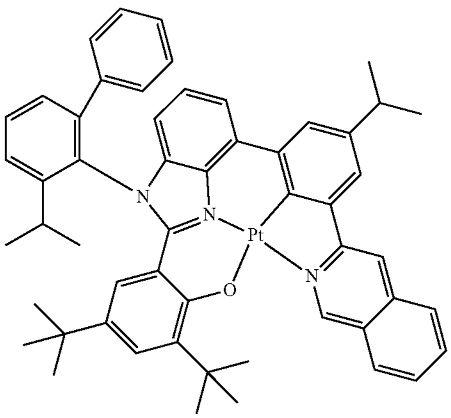
3-451
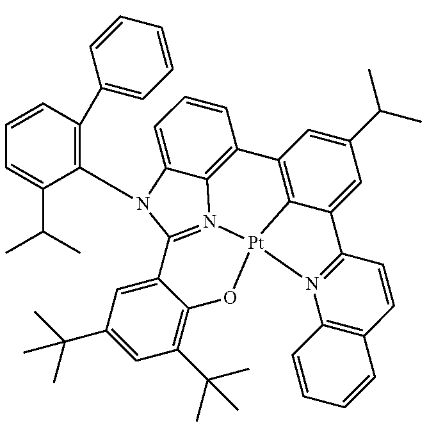
-continued
3-452
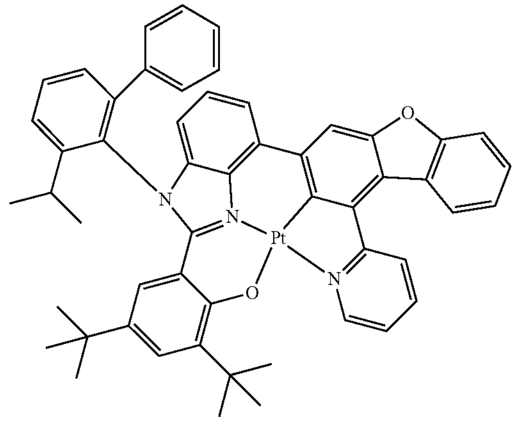
3-453
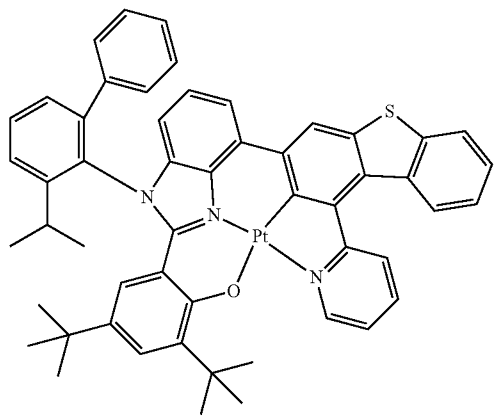
3-454
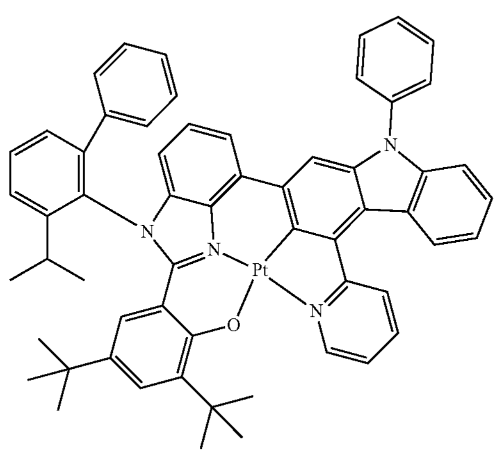

3-455
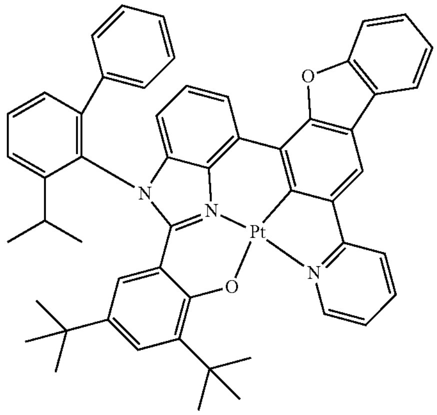
3-456
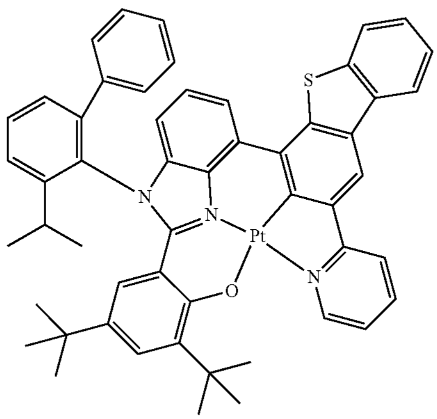
3-457
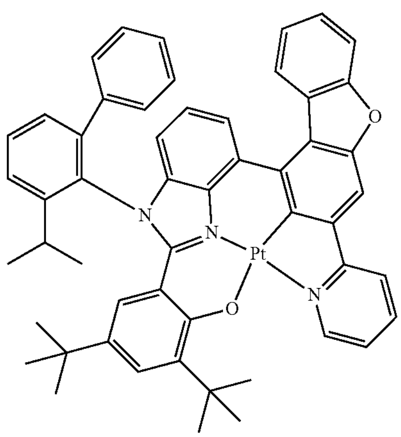
3-458
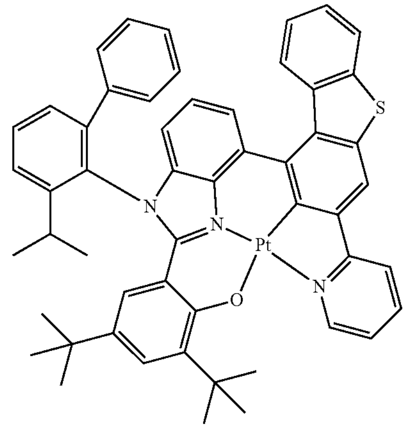
3-459
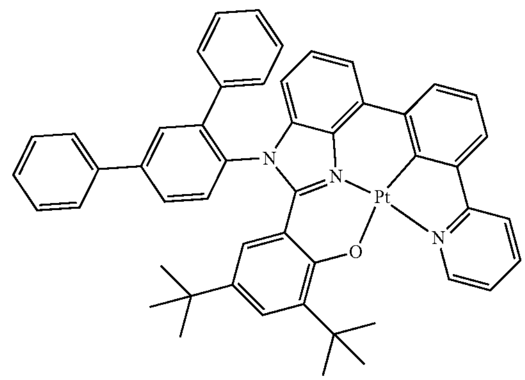
3-460
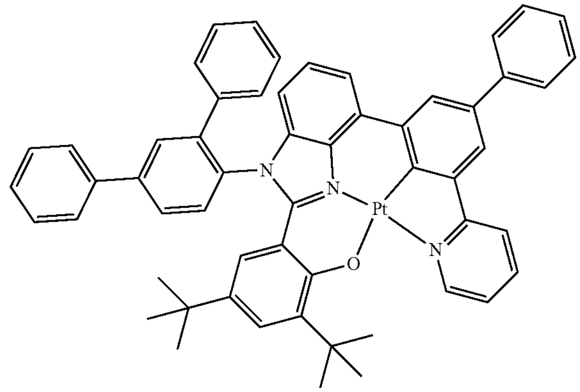
3-461
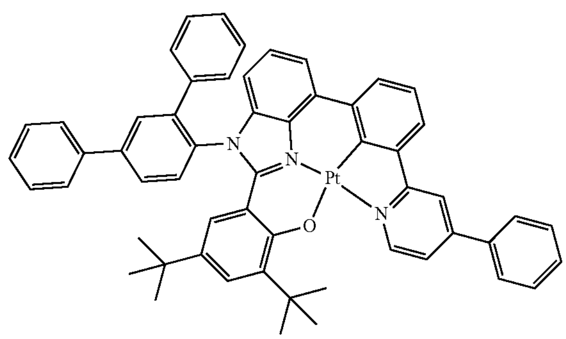

3-462
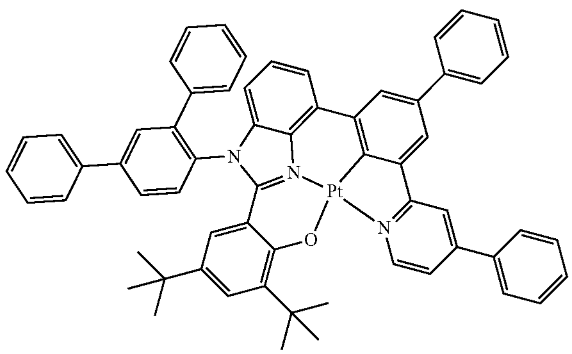
3-463
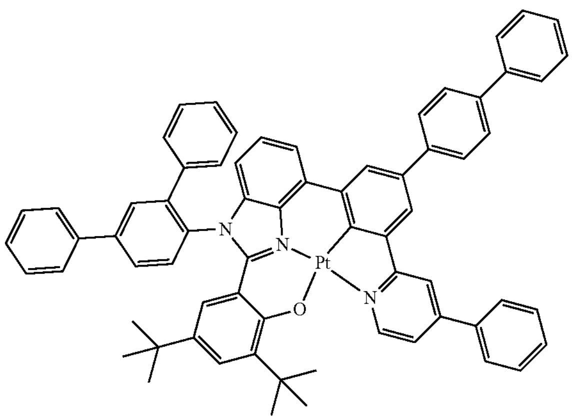
3-464
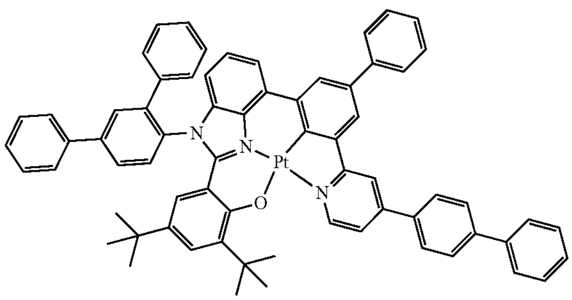
3-465
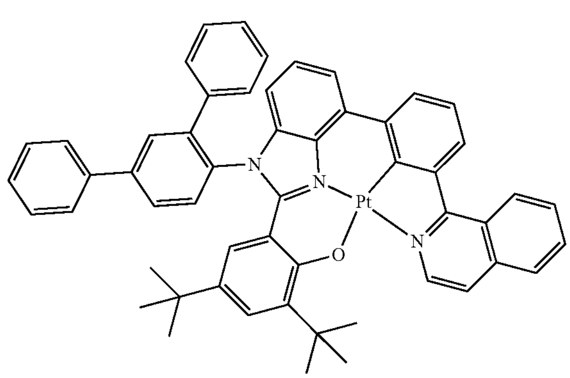
3-466
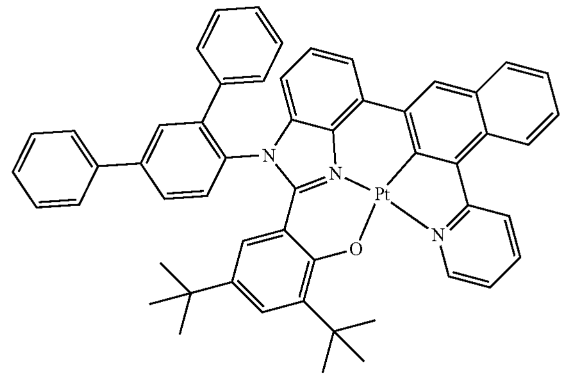
3-467
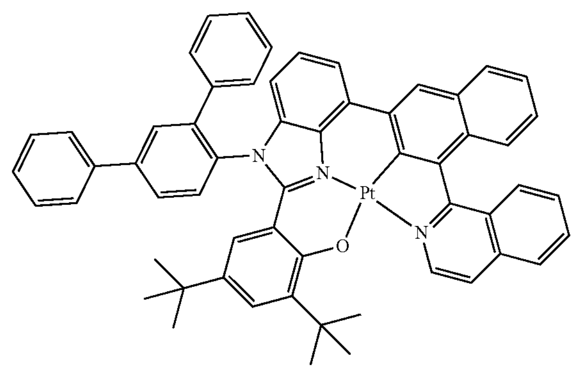
3-468
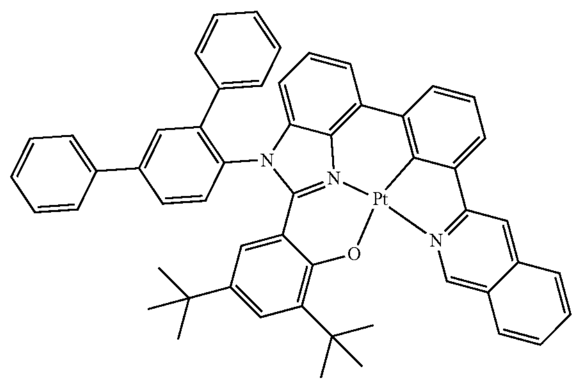
3-469
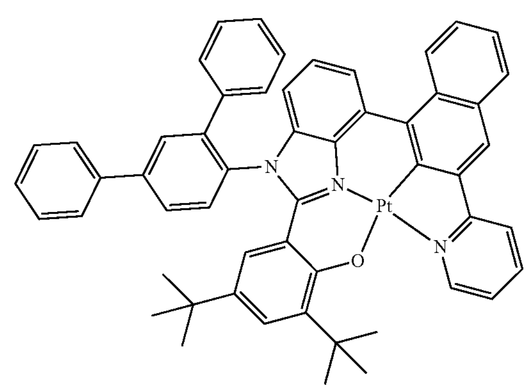

-continued
3-470
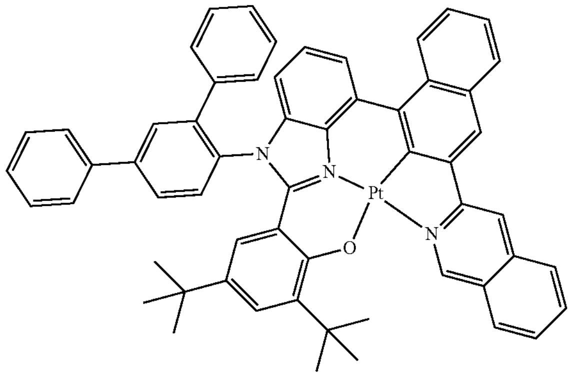
3-471
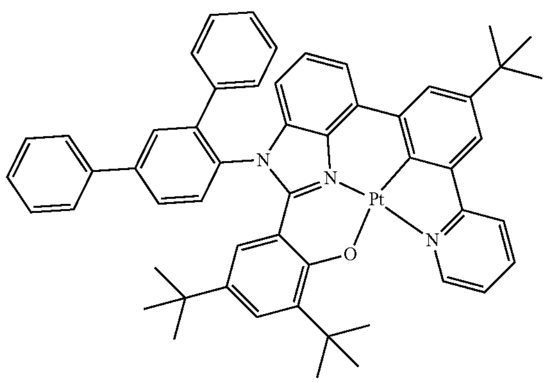
3-472
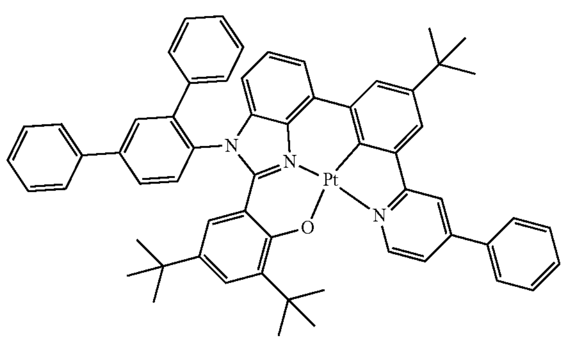
3-473
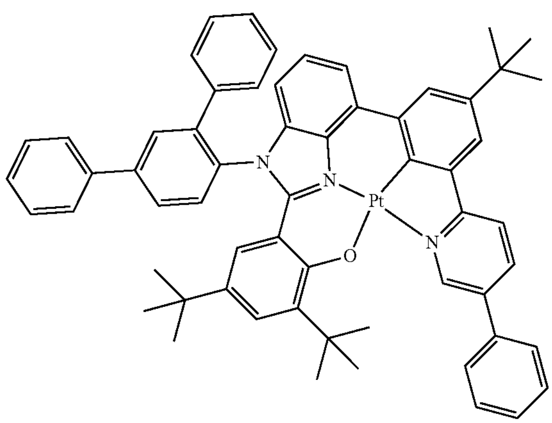
-continued
3-474
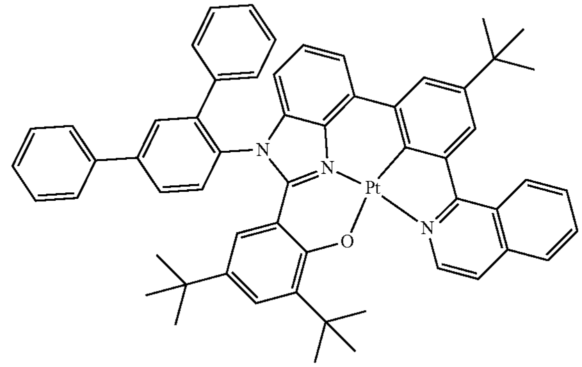
3-475
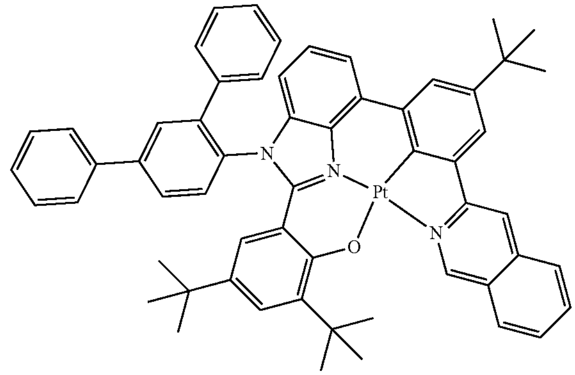
3-476
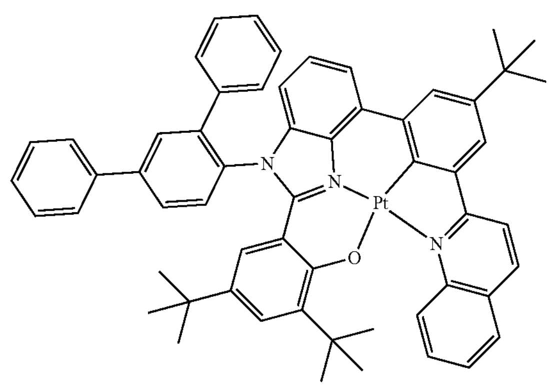
3-477
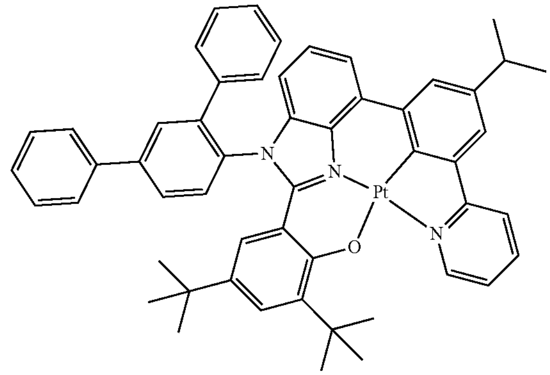

-continued
3-478
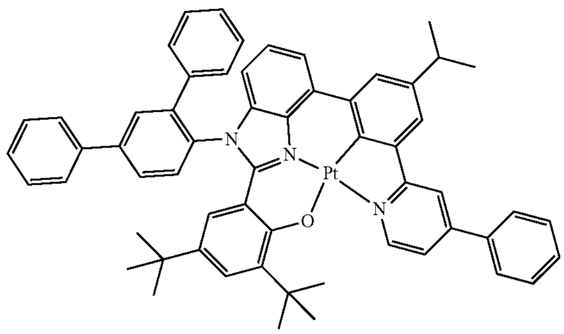
3-479
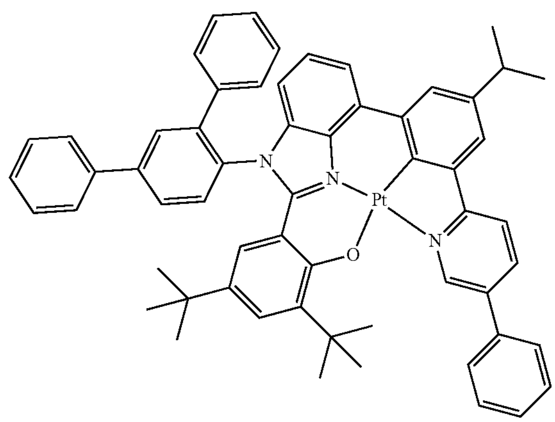
3-480
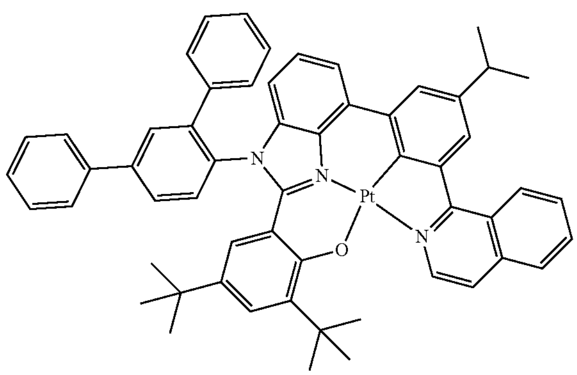
3-481
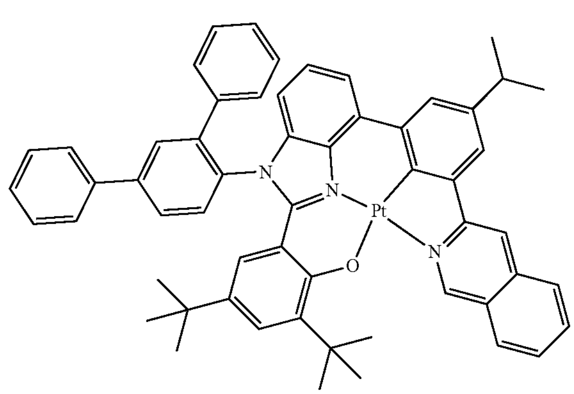
-continued
3-482
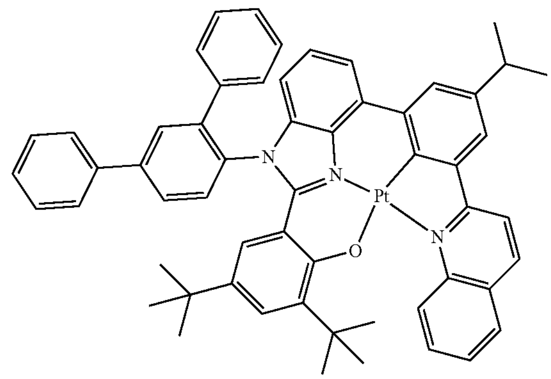
3-483
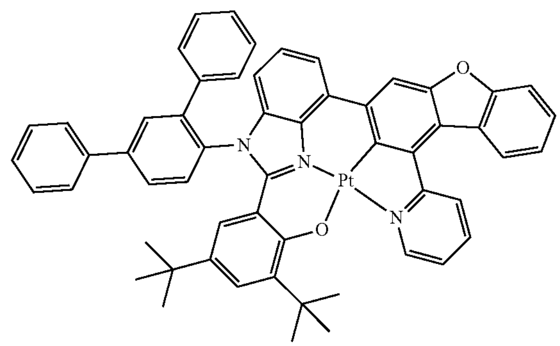
3-484
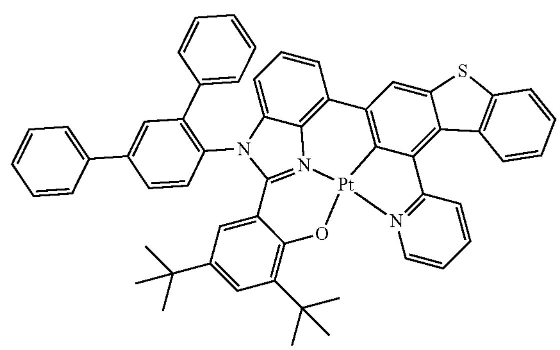
3-485
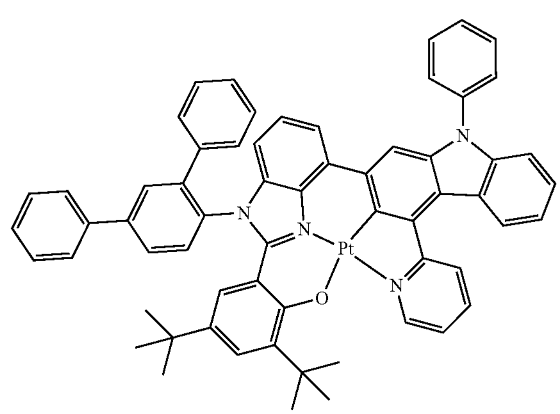

-continued
3-486
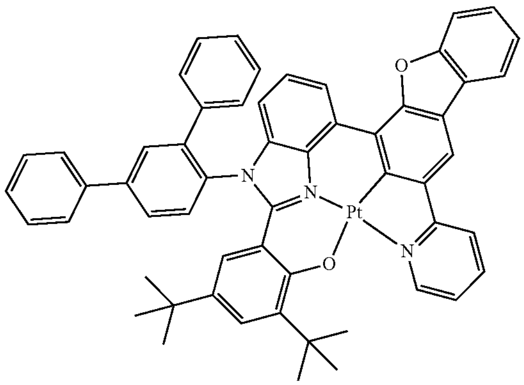
3-487
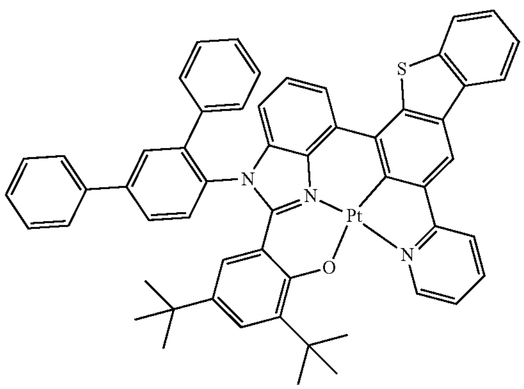
3-488
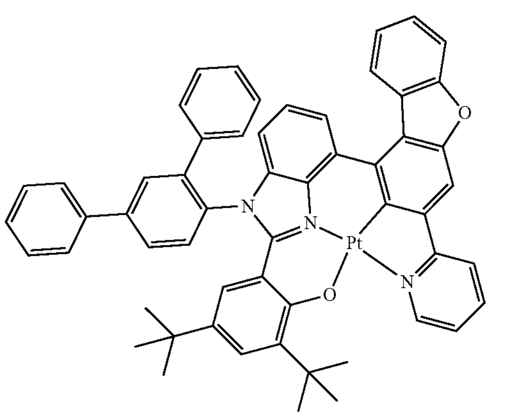
-continued
3-489
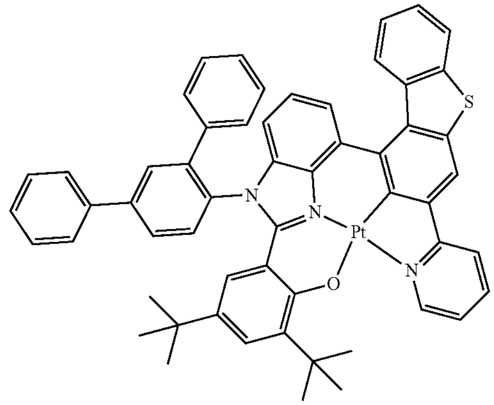
3-490
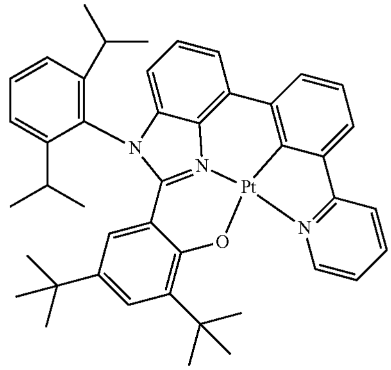
3-491
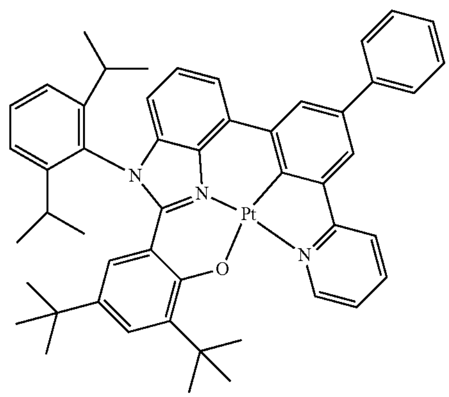
3-492
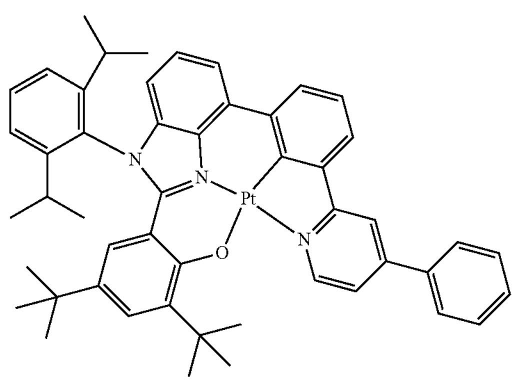

-continued
3-493
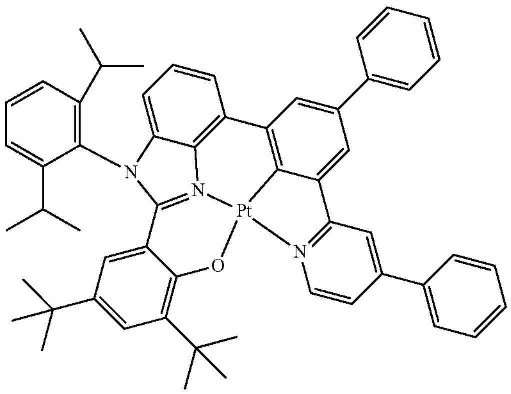
3-494
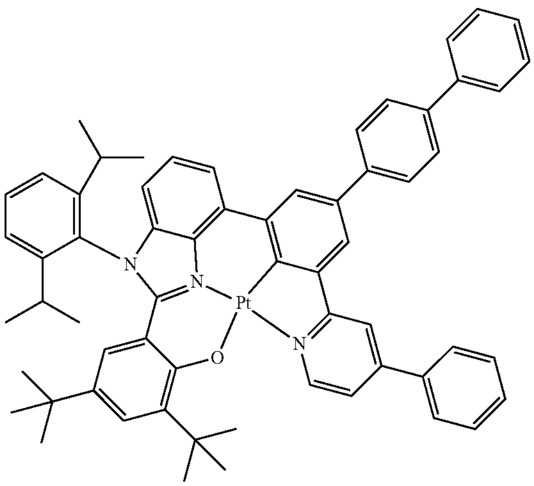
3-495
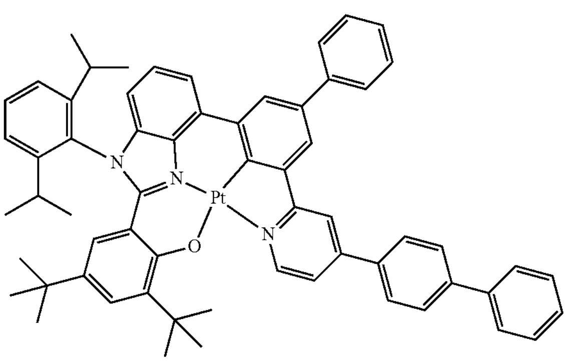
-continued
3-496
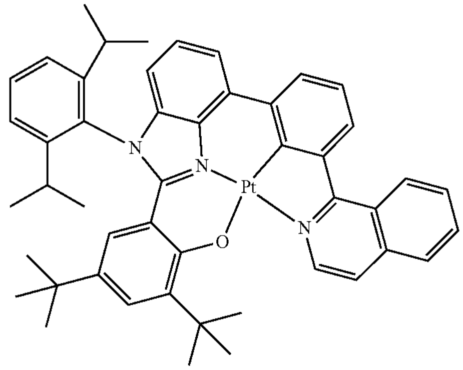
3-497
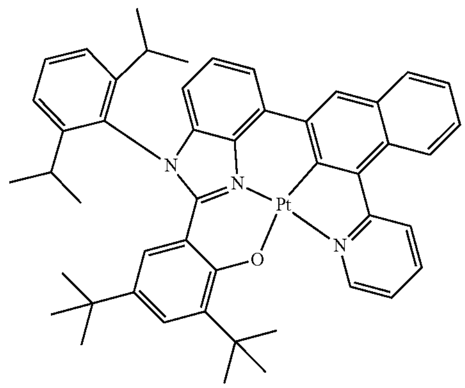
3-498
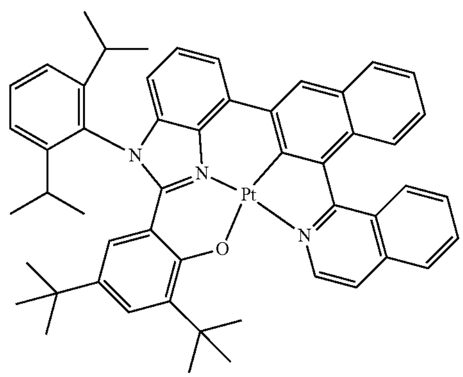
3-499
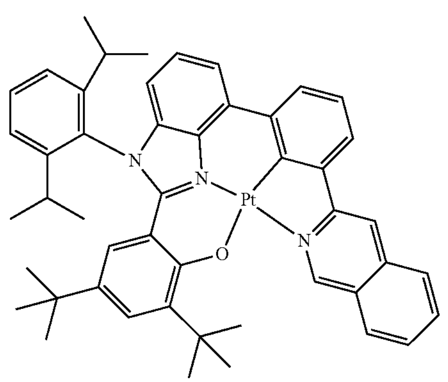

-continued
3-500
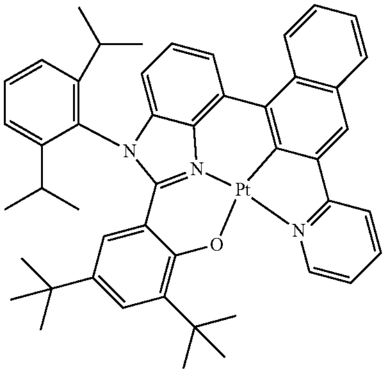
3-501
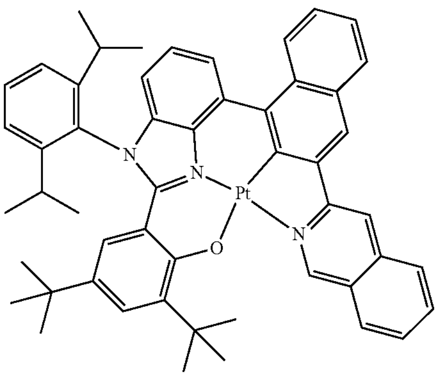
3-502
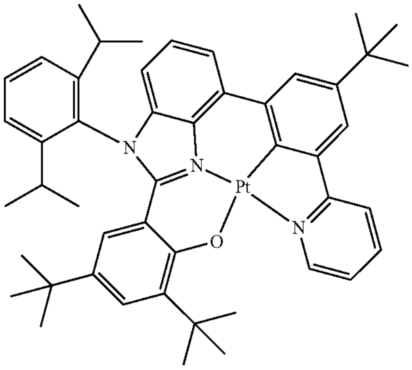
3-503
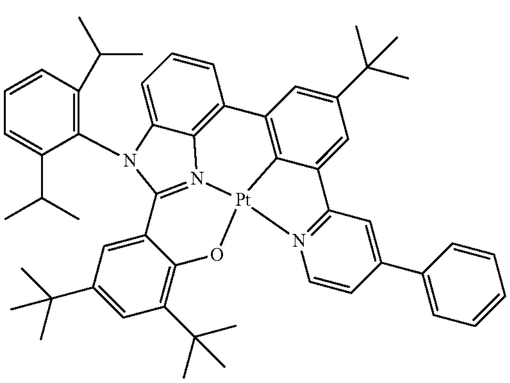
-continued
3-504
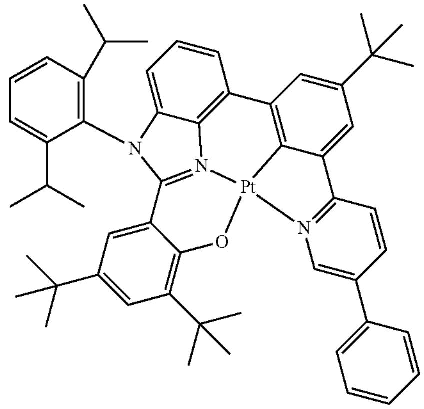
3-505
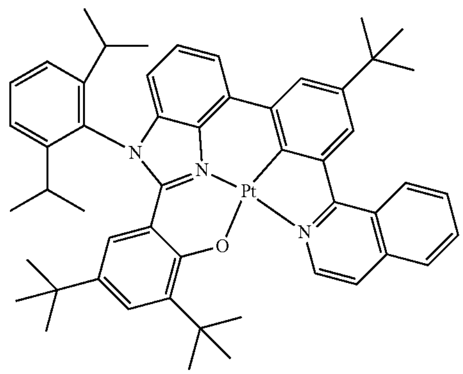
3-506
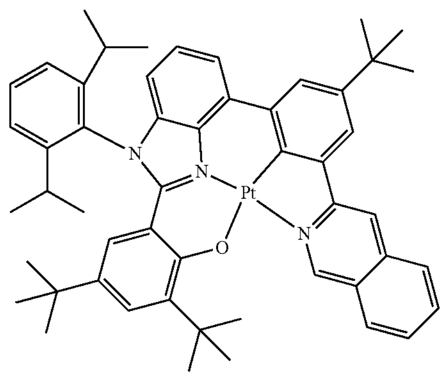
3-507
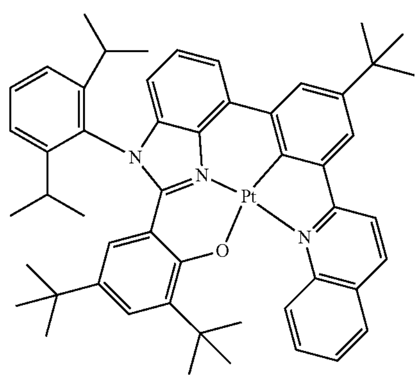

-continued
3-508
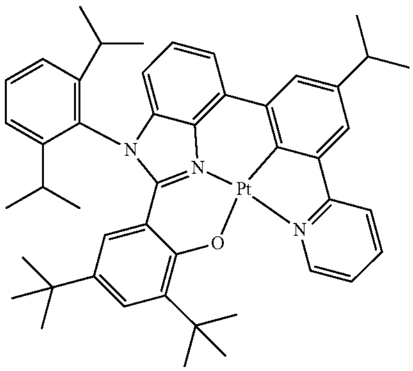
3-509
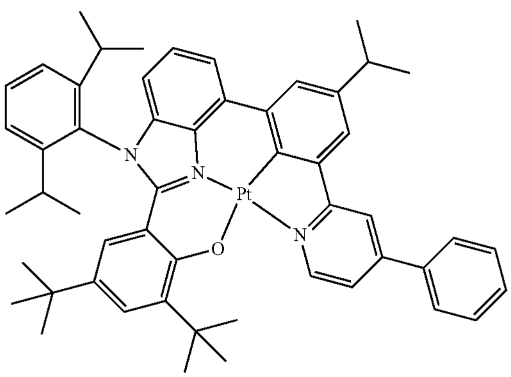
3-510
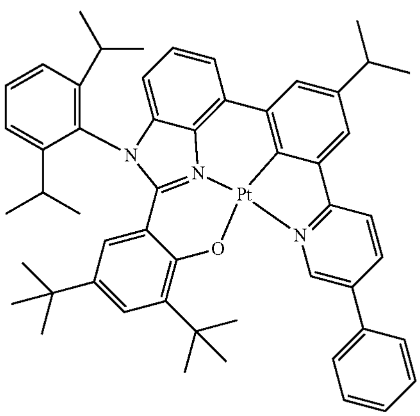
3-511
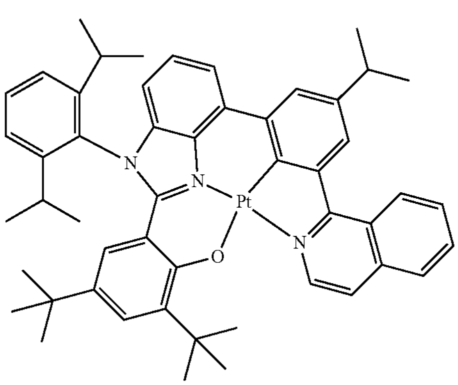
-continued
3-512
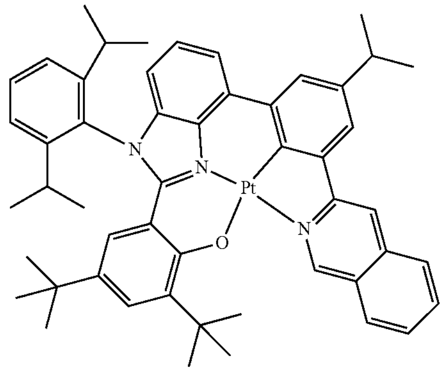
3-513
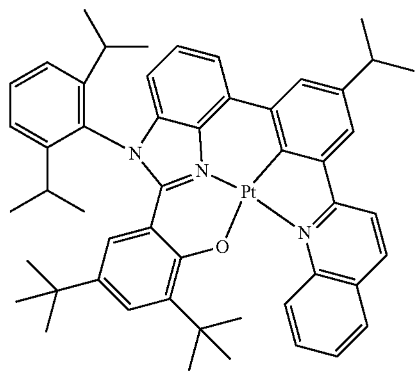
3-514
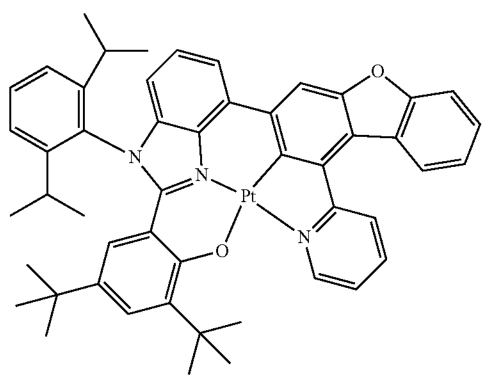
3-515
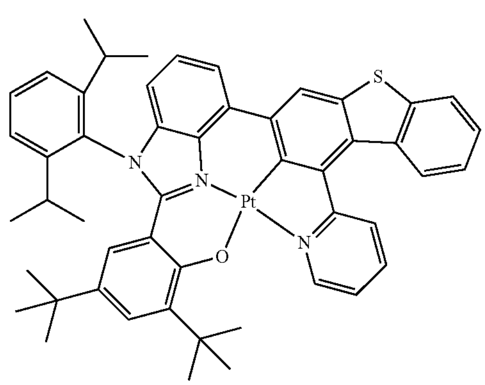

-continued
3-516
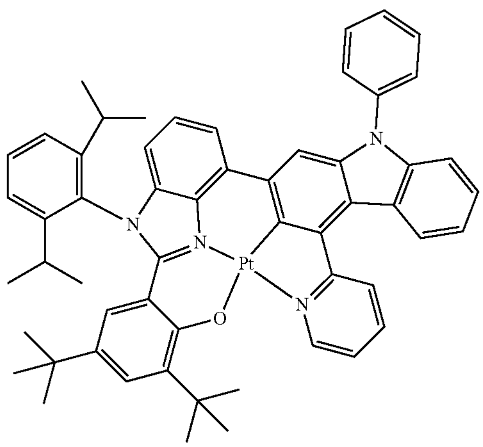
3-517
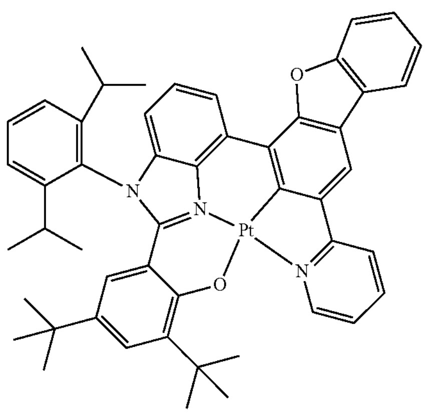
3-518
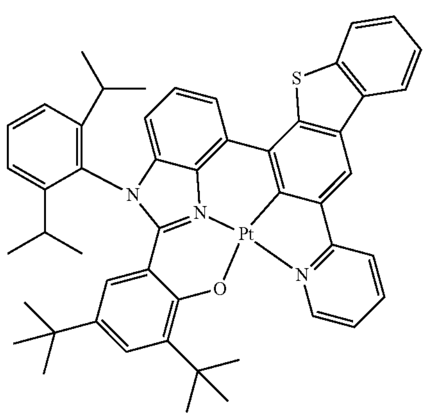
-continued
3-519
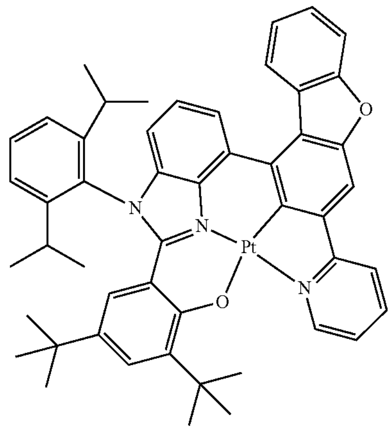
3-520
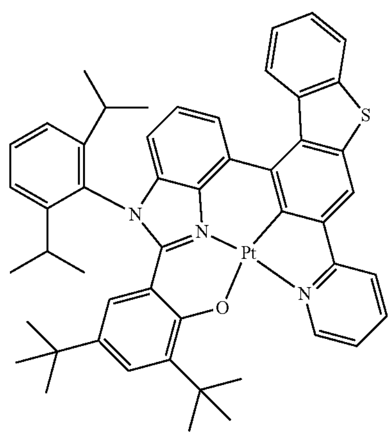
3-521
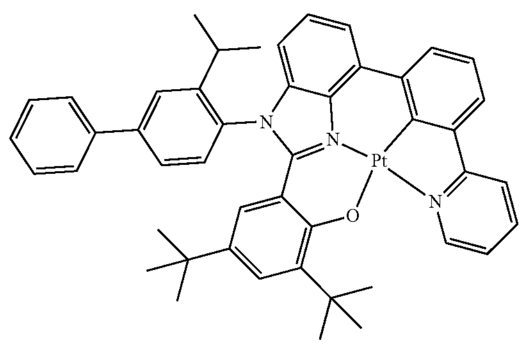
3-522
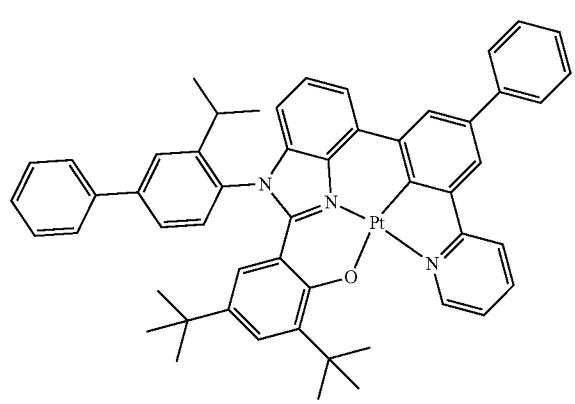

-continued
3-523
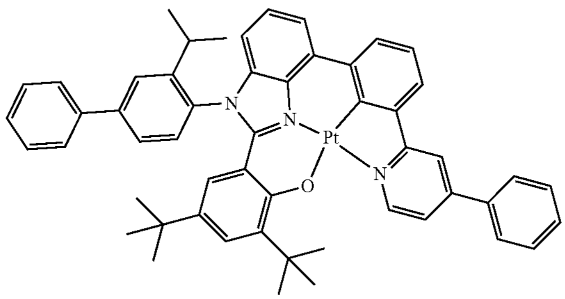
3-524
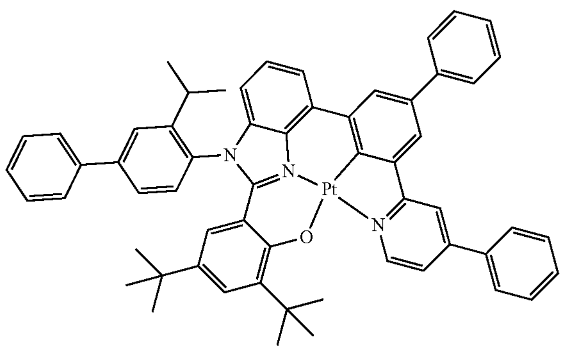
3-525
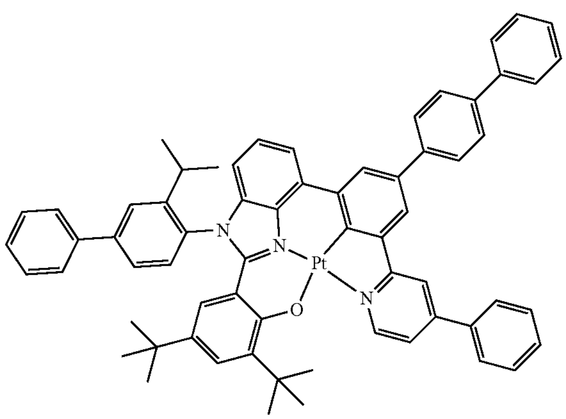
3-526
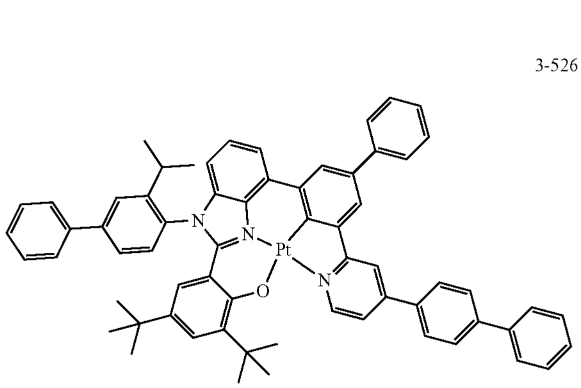
-continued
3-527
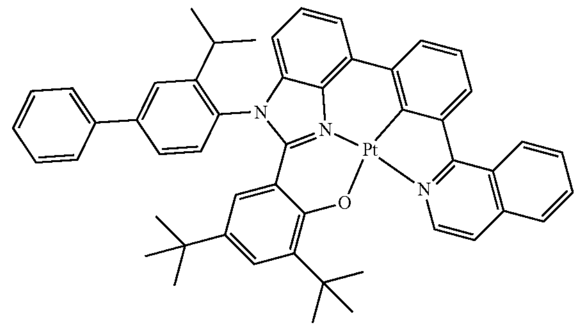
3-528
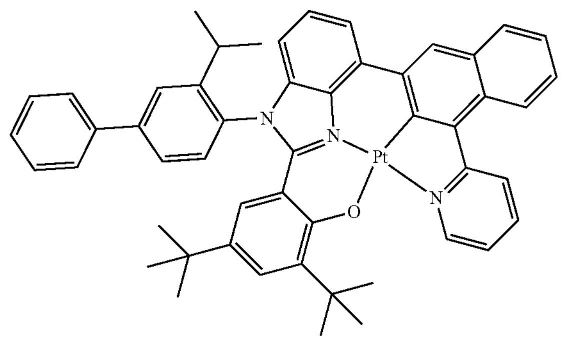
3-529
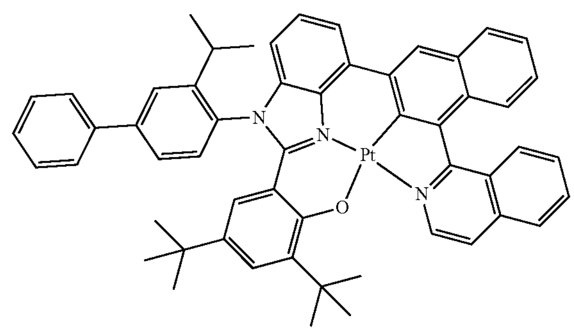
3-530
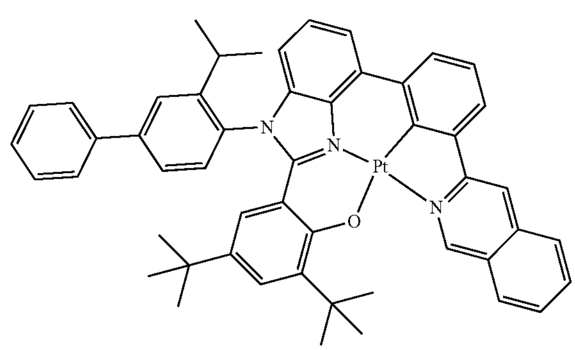

-continued
3-531
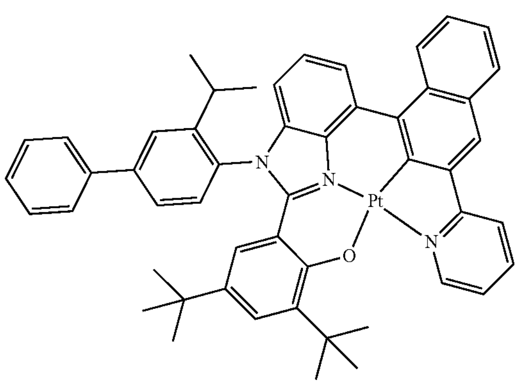
3-532
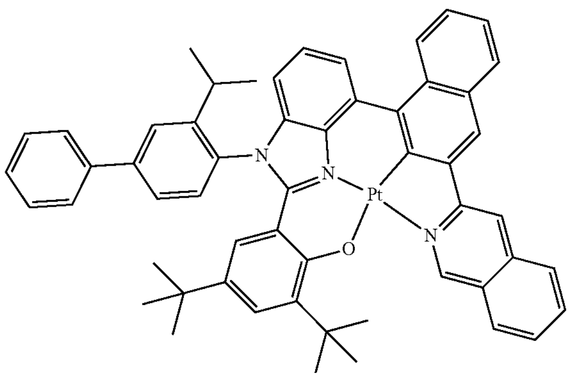
3-533
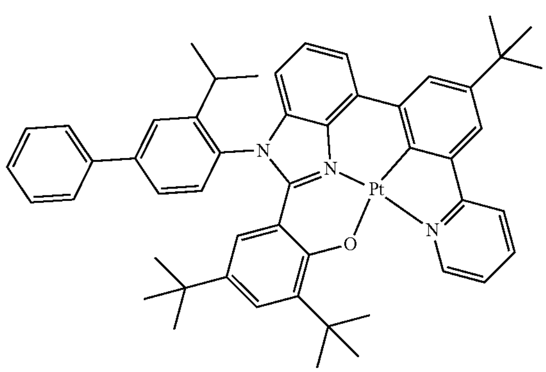
3-534
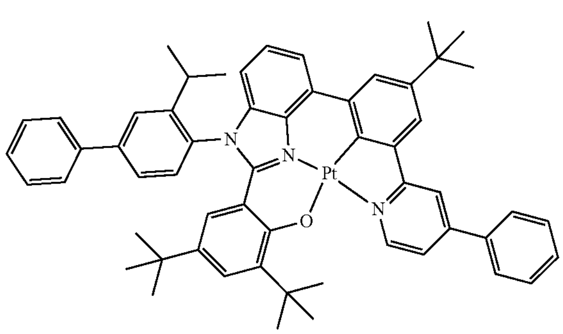
-continued
3-535
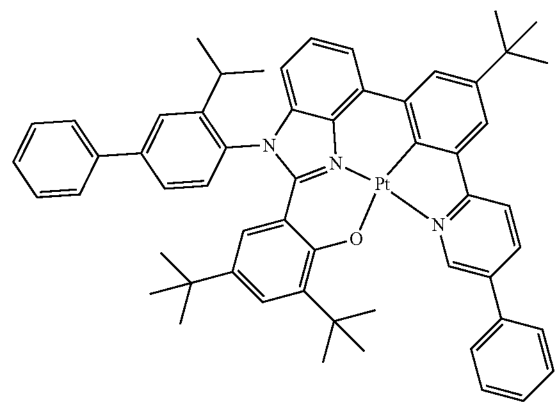
3-536
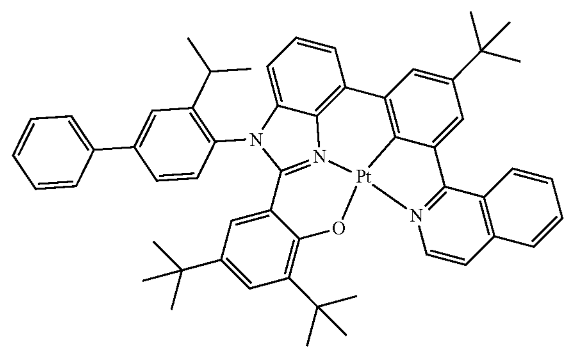
3-537
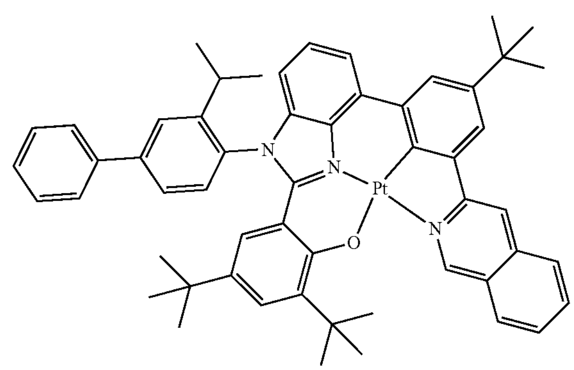
3-538
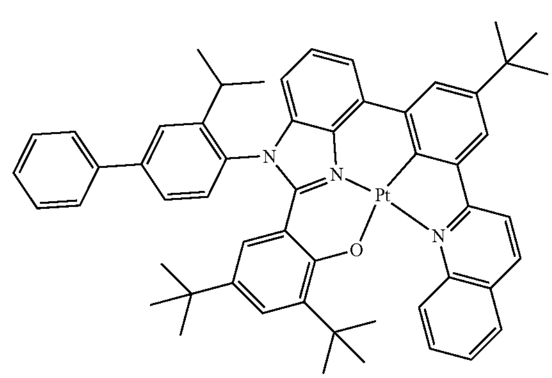

3-539
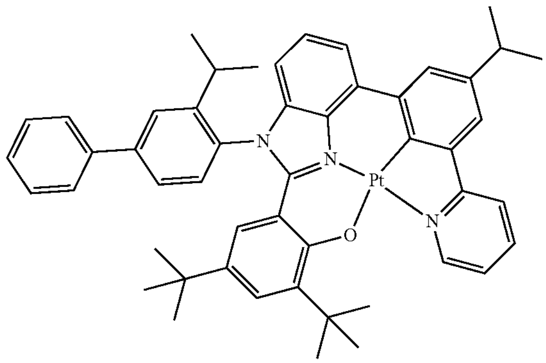
3-540
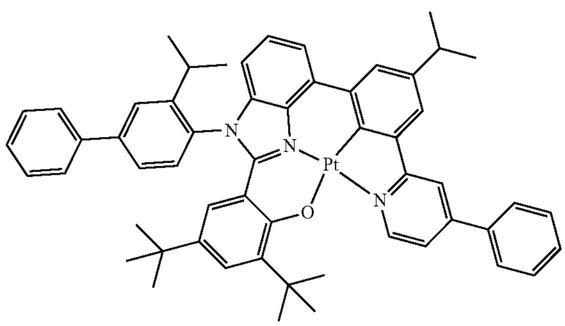
3-541
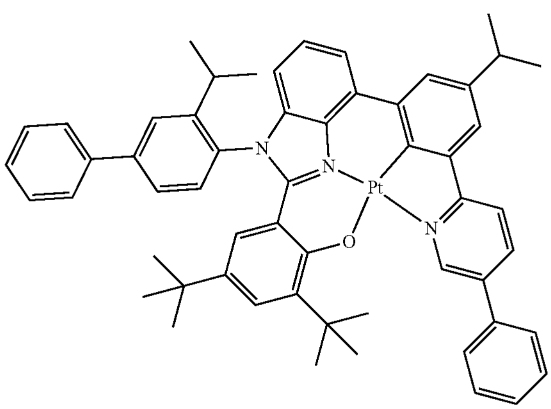
3-542
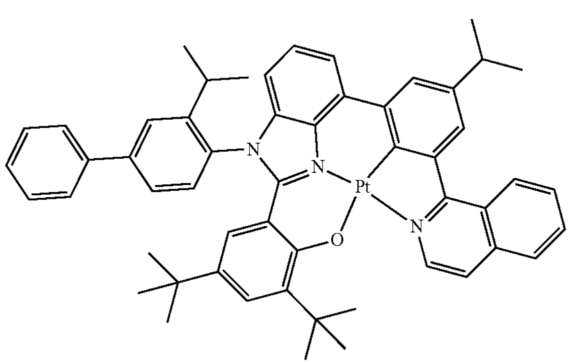
3-543
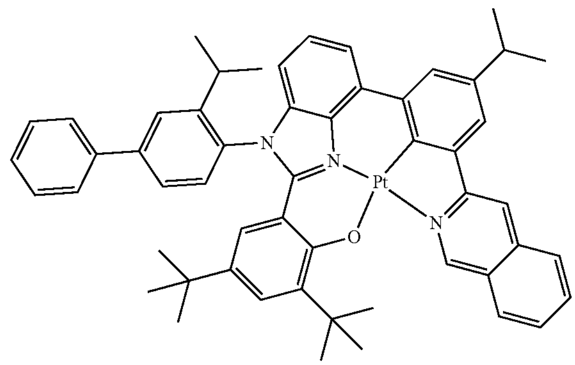
3-544
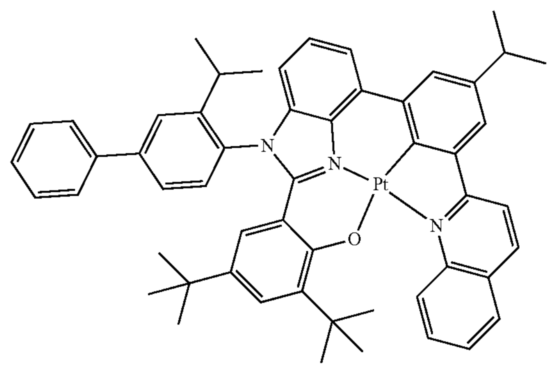
3-545
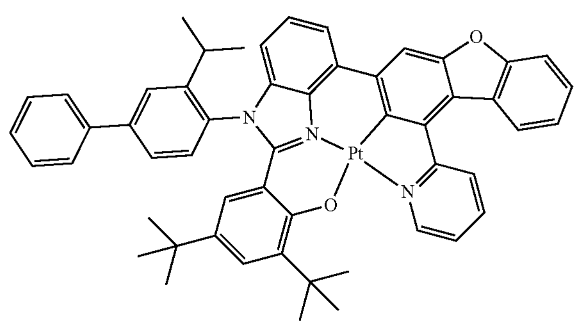
3-546
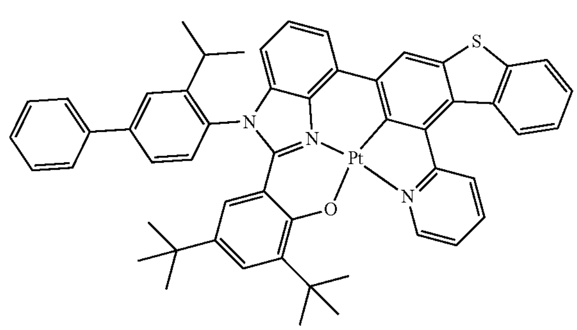

-continued
3-547
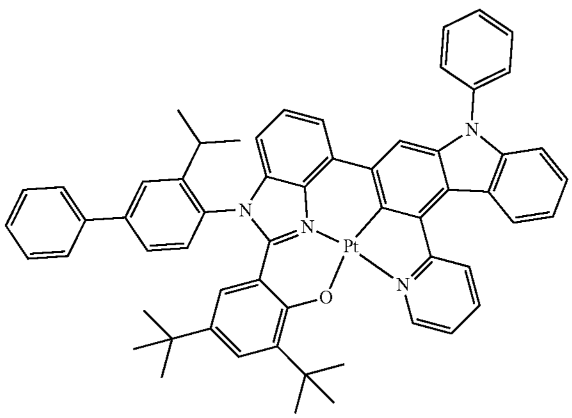
3-548
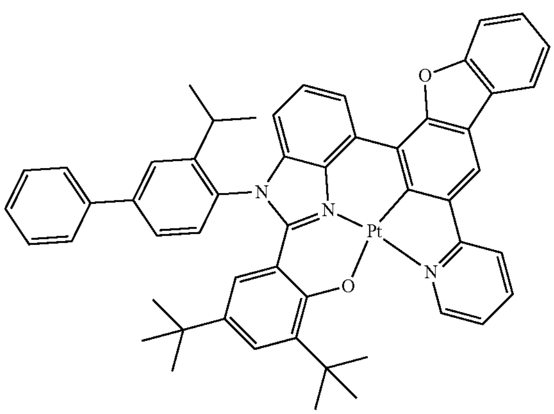
3-549
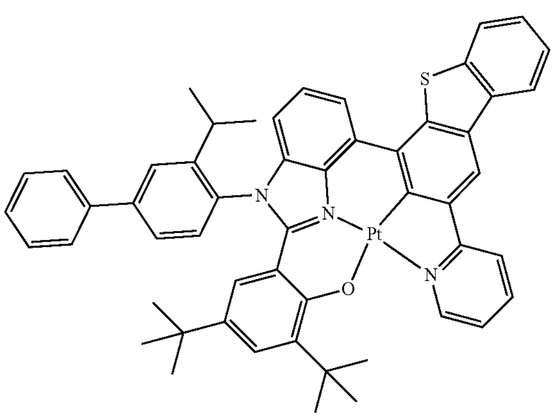
-continued
3-550
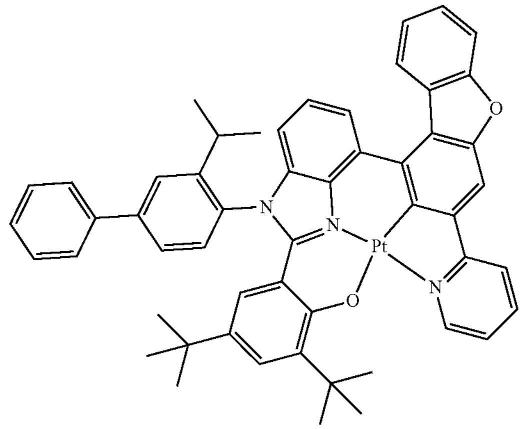
3-551
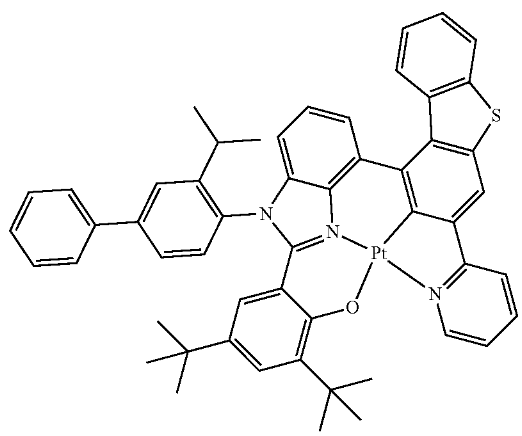
3-552
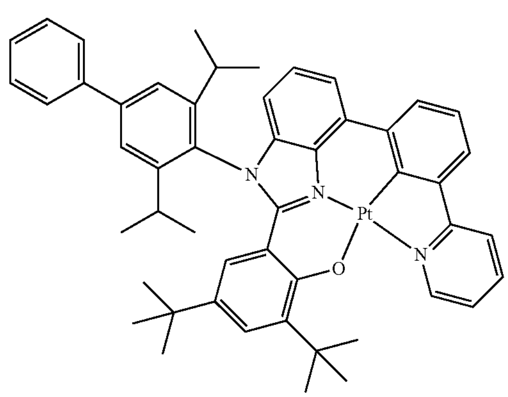

-continued
3-553
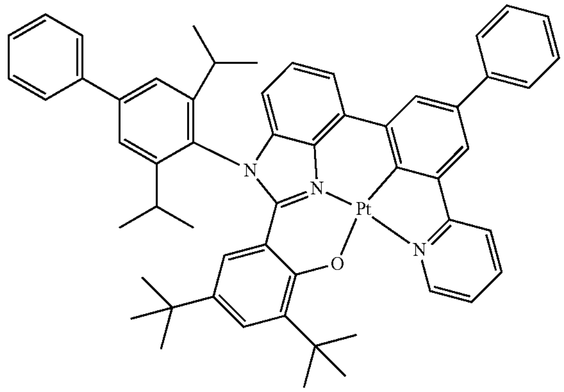
3-554
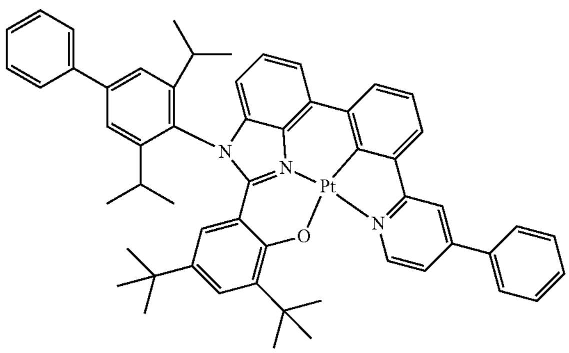
3-555
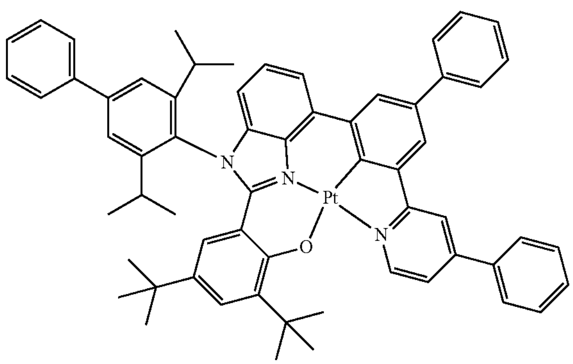
3-556
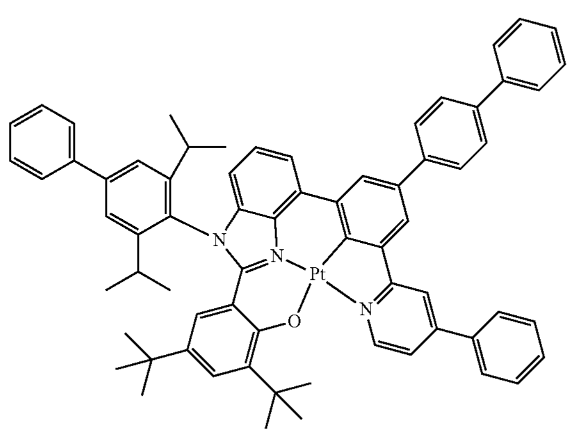
-continued
3-557
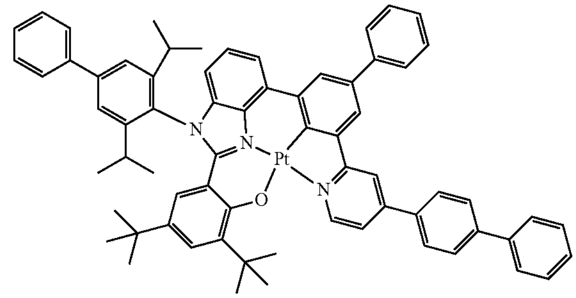
3-558
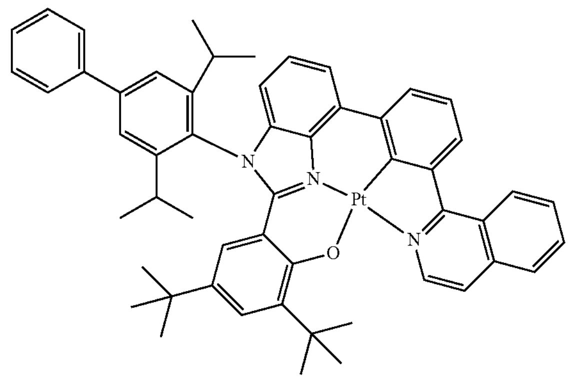
3-559
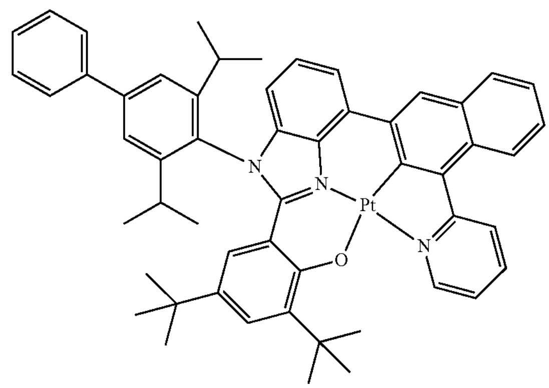
3-560
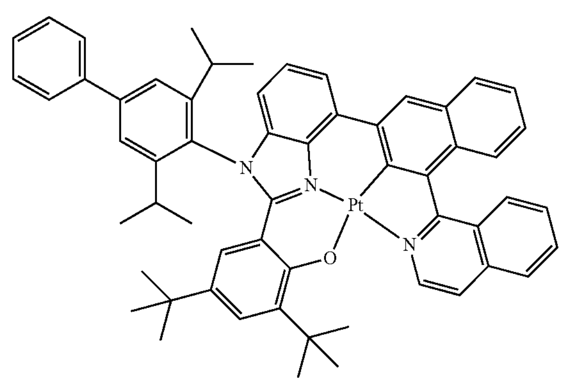

-continued
3-561
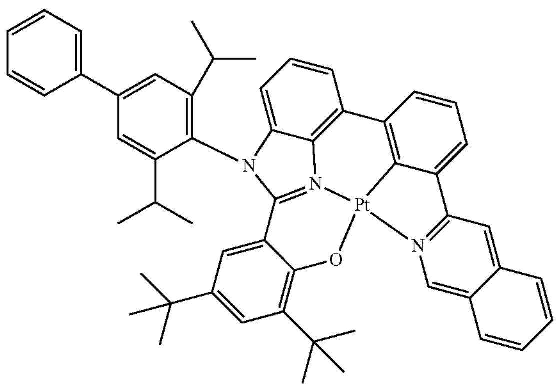
3-562
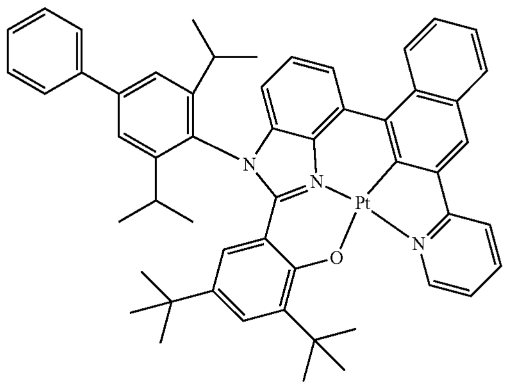
3-563
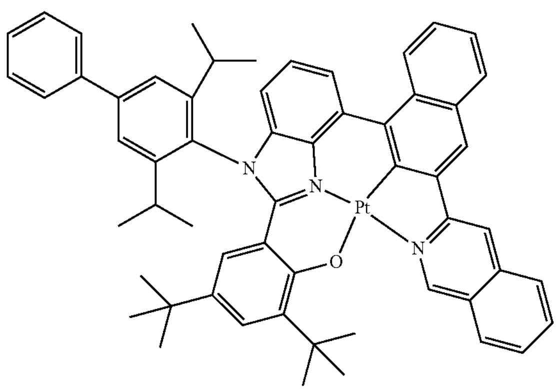
3-564
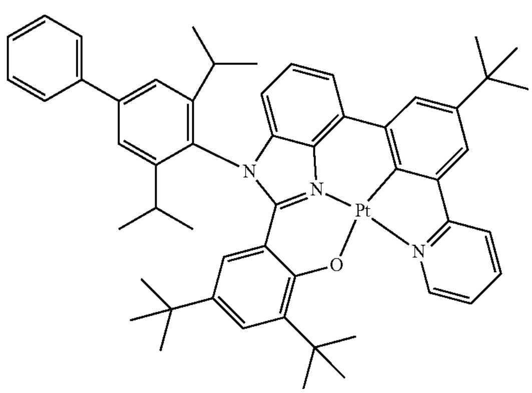
-continued
3-565
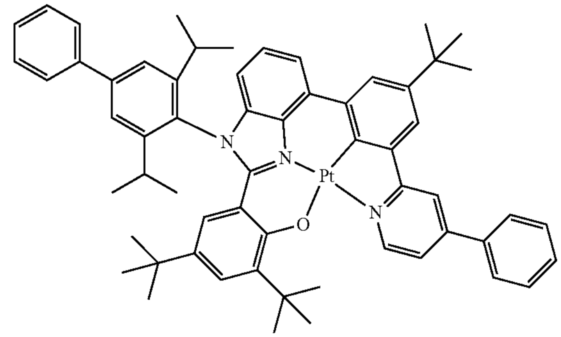
3-566
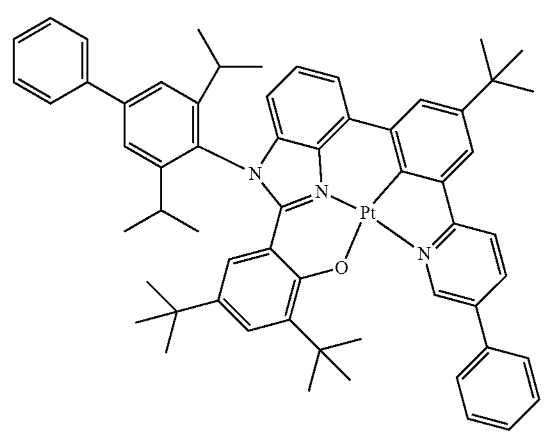
3-567
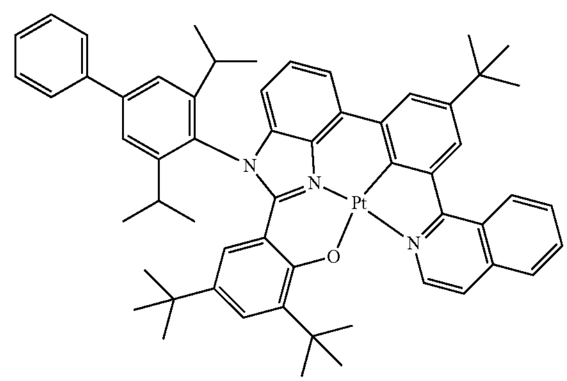
3-568
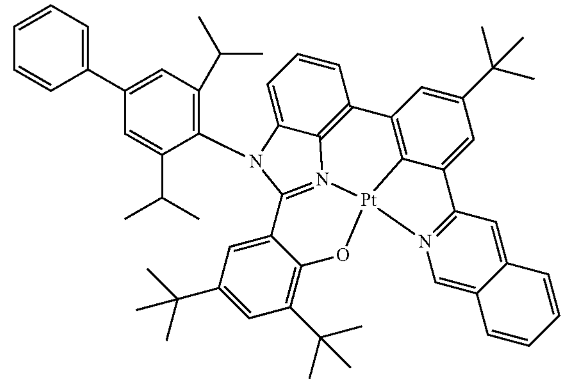

3-569
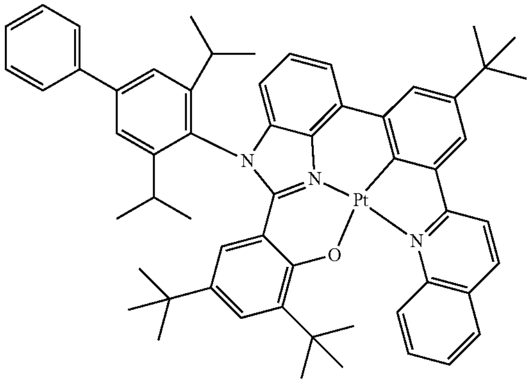
3-570
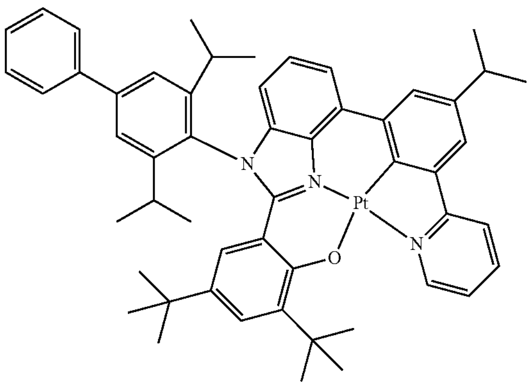
3-571
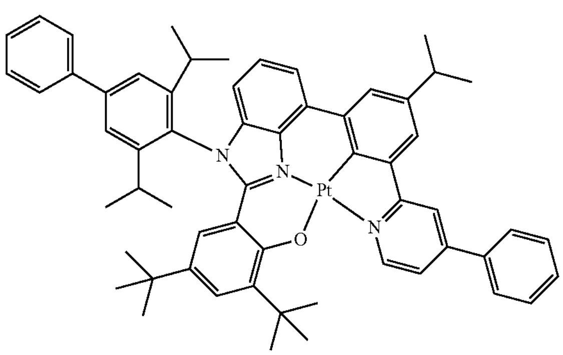
3-572
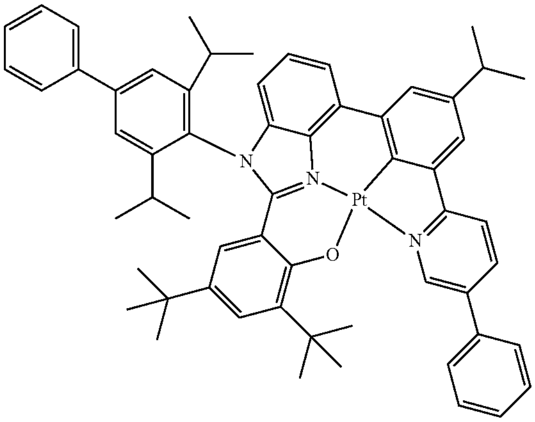
3-573
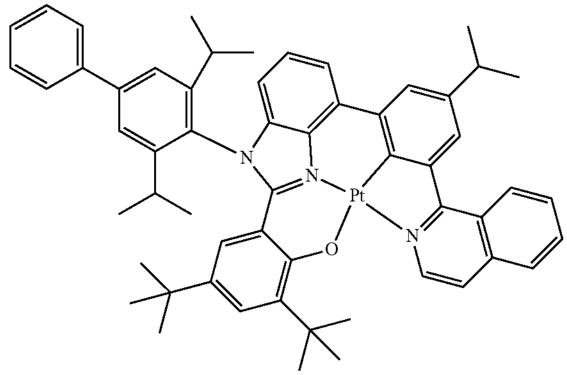
3-574
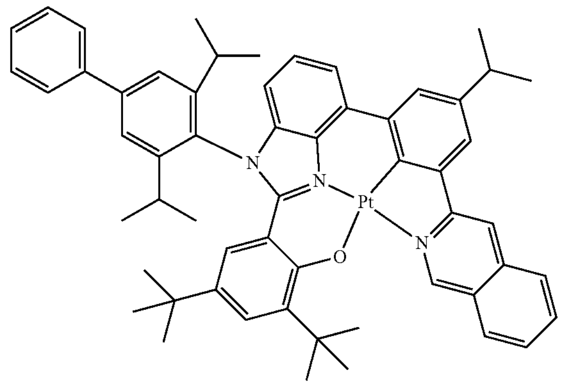
3-575
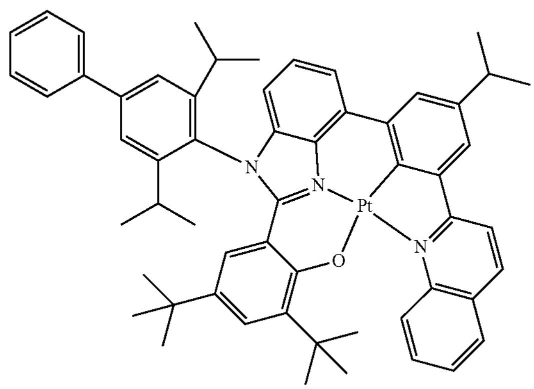
3-576
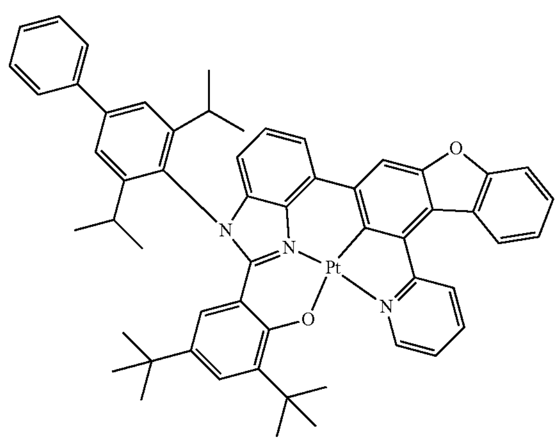

-continued 3-577

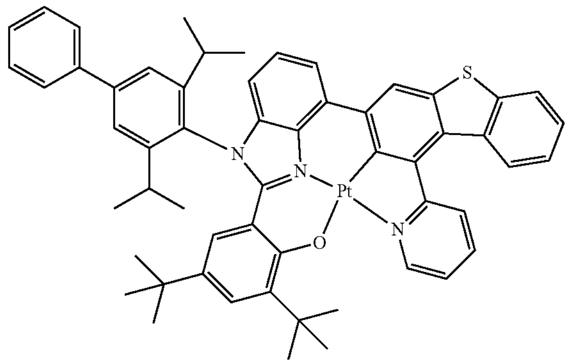

3-578

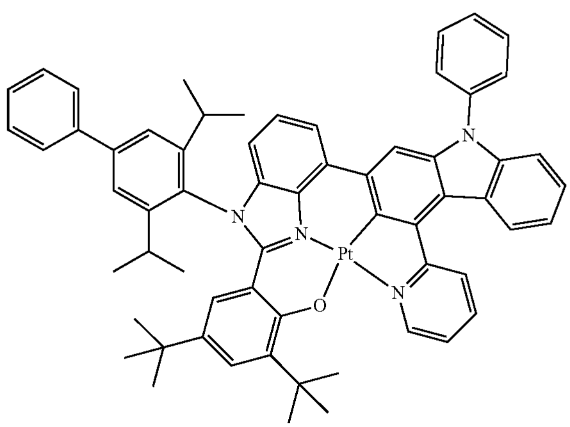

3-579

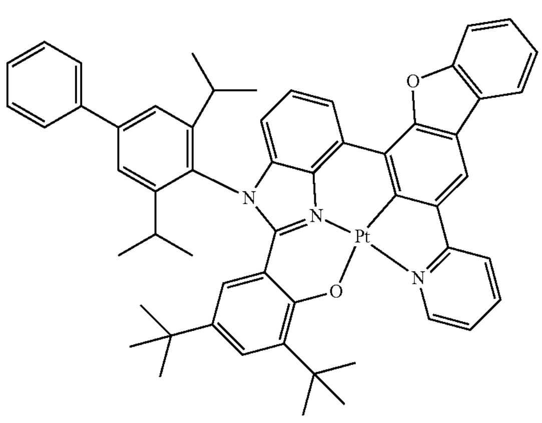

-continued 3-580

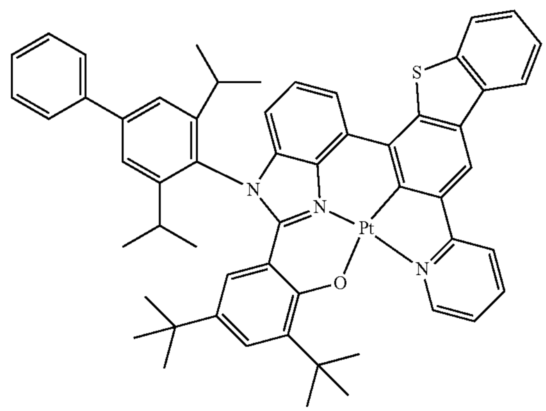

3-581

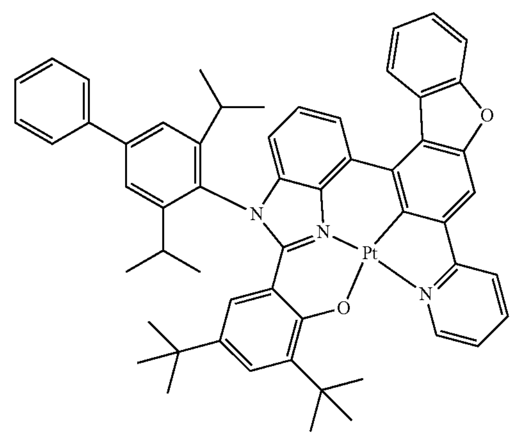

3-582

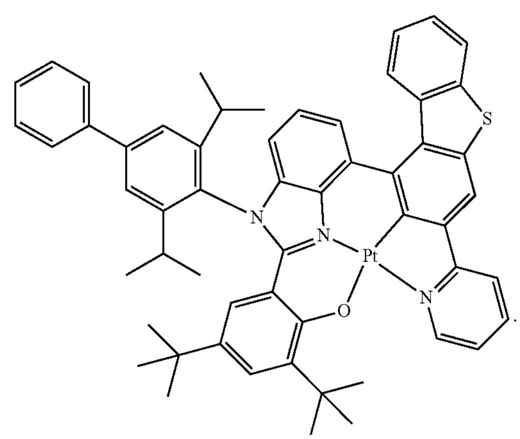

Host 15 in Emission Layer

The host in the emission layer 15 may include an electron transport host and a hole transport host.

The electron transport host may include at least one electron transport moiety, and the hole transport host may not include an electron transport moiety.

The electron transport moiety may be selected from a cyano group, a π electron-depleted nitrogen-containing cyclic group, and a group represented by one of the following formulae:

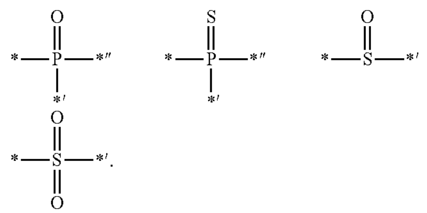

In the formulae, *, *', and *" each indicate a binding site to a neighboring atom.

In an embodiment, the electron transport host in the emission layer 15 may include at least one selected from a cyano group and a π electron-depleted nitrogen-containing cyclic group.

In one or more embodiments, the electron transport host in the emission layer 15 may include at least one cyano group.

In one or more embodiments, the electron transport host in the emission layer 15 may include at least one cyano group and at least one π electron-depleted nitrogen-containing cyclic group.

In one or more embodiments, the electron transport host in the emission layer 15 may have a minimum anion decomposition energy of about 2.5 eV or more. When the electron transport host has the minimum anion decomposition energy within the above-described range, decomposition of the electron transport host by charge and/or exciton may be substantially prevented. The minimum anion decomposition energy may be measured by Equation 1 below.

$$E_{minimum\ anion\ decomposition\ energy}=E_{[A\text{-}B]-}-[E_A^{-}+E_B^{\bullet}\ (\text{or}\ E_A^{\bullet}+E_B^{-})] \quad \text{Equation 1}$$

1. Quantum computation is performed on a ground state of a neutral molecule by using a density function theory (DFT) or an ab-initio method.

2. Quantum computation ($E_{[A\text{-}B]-}$) is performed on an anion state under an excess electron condition based on a neutral molecular structure.

3. Quantum computation ($[E_A^{-}+E_B^{\bullet}$ (or $E_A^{\bullet}+E_B^{-})]$) is performed on $[A\text{–}B]^-$ (process of decomposition into $A^x+B^y$) based on the most stable structure of the anion state (global minimum of $[A\text{–}B]^-$).

Figure 2:
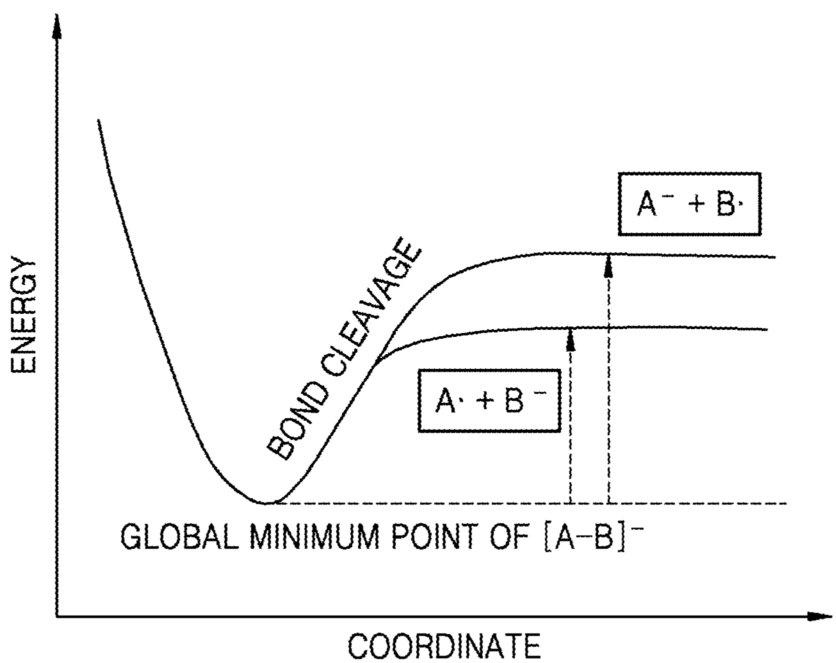
FIG. 2 is graphs for two decomposition modes i) $A^-+B^•$ or ii) $A^•+B^-$ for Equation 1.

The decomposition form has two cases, that is, i) $A^-+B^\bullet$ and ii) $A^\bullet+B^-$, as shown in FIG. 2, and a decomposition form having a smaller value from among the two cases is selected.

In one or more embodiments, the electron transport host may include at least one π electron-depleted nitrogen-free cyclic group and at least one electron transport moiety, and the hole transport host may include at least one π electron-depleted nitrogen-free cyclic group and may not include the electron transport moiety.

The term "π electron-depleted nitrogen-containing cyclic group" as used herein refers to a cyclic group including at least one *—N═*' moiety, and non-limiting examples thereof are an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinolic, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, or a condensed group in which at least one of the groups above is condensed with any cyclic group (for example, a condensed group in which a triazole group is condensed with a naphthalene group).

Non-limiting examples of the π electron-depleted nitrogen-free cyclic group are a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corozene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, and a triindolobenzene group, but embodiments of the present disclosure are not limited thereto.

In one or more embodiments, the electron transport host may be selected from a compound represented by Formula E-1, and the hole transport host may be selected from a compound represented by Formula H-1, but embodiments of the present disclosure are not limited thereto:

$$[Ar_{301}]_{xb11}\text{-}[(L_{301})_{xb1}\text{-}R_{301}]_{xb21}. \quad \text{Formula E-1}$$

In Formula E-1, $Ar_{301}$ may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may each independently be selected from a single bond, a group represented by one of the following formulae, a substituted or unsubstituted $C_5$-$C_{60}$ carbocyclic group, and a substituted or unsubstituted $C_1$-$C_{60}$ heterocyclic group, wherein in the following formulae, *, *', and *" each independently indicate a binding site to a neighboring atom:

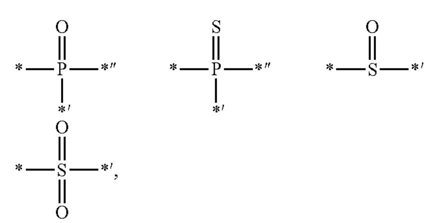

xb1 may be an integer from 1 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), and —P(=S)($Q_{301}$)($Q_{302}$), xb21 may be an integer from 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, and at least one of Condition 1 to Condition 3 may be satisfied:

Condition 1 at least one selected from of $Ar_{301}$, $L_{301}$, and $R_{301}$ in Formula E-1 may each independently include a π electron-depleted nitrogen-containing cyclic group Condition 2

$L_{301}$ in Formula E-1 may be a group represented by the following formulae:

Condition 3

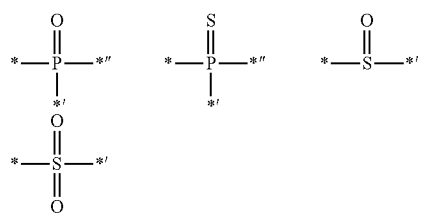

$R_{301}$ in Formula E-1 may be selected from a cyano group, —S(=O)$_2$($Q_{301}$), —S(=O)($Q_{301}$), —P(=O)($Q_{301}$)($Q_{302}$), and —P(=S)($Q_{301}$)($Q_{302}$), Formula H-1

$$Ar_{401}—(L_{401})_{xd1}—(Ar_{402})_{xd11}$$

Fomula 11

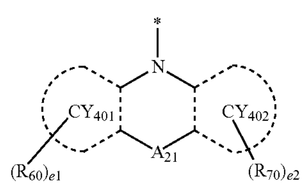

Formula 12

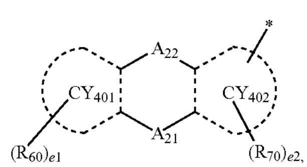

wherein, in Formulae H-1, 11, and 12, $L_{401}$ may be selected from:

a single bond; and a π electron-depleted nitrogen-free cyclic group (for example, a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corozene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, and a triindolobenzene group), unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$), xd1 may be an integer of 1 to 10, and when xd1 is two or more, two or more of groups $L_{401}$ may be identical to or different from each other, $Ar_{401}$ may be selected from groups represented by Formulae 11 and 12, $Ar_{402}$ may be selected from:

groups represented by Formulae 11 and 12 and π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group); and a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group), substituted with at least one sleeted from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, and a triphenylenyl group, $CY_{401}$ and $CY_{402}$ may each independently be selected from a π electron-depleted nitrogen-free cyclic group (for example, a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, a benzonaphthosilole group), $A_{21}$ may be selected from a single bond, O, S, N($R_{51}$), C($R_{51}$)($R_{52}$), and Si($R_{51}$)($R_{52}$), $A_{22}$ may be a single bond, O, S, N($R_{53}$), C($R_{53}$)($R_{54}$), and Si($R_{53}$)($R_{54}$), in Formula 12, at least one of $A_{21}$ and $A_{22}$ may not be a single bond, $R_{51}$ to $R_{54}$, $R_{60}$, and $R_{70}$ may each independently be selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group);

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group), substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, and a biphenyl group; and —$Si(Q_{404})(Q_{405})(Q_{406})$, e1 and e2 may each independently be an integer of 0 to 10, $Q_{401}$ to $Q_{406}$ may each independently be selected from hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, and a triphenylenyl group, and

* indicates a binding site to a neighboring atom.

In an embodiment, in Formula E-1, $Ar_{301}$ and $L_{401}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, at least one of groups $L_{301}$ in the number of xb1 may each independently be selected from an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, $R_{301}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano group-containing phenyl group, a cyano group-containing biphenyl group, a cyano group-containing terphenyl group, a cyano group-containing tetraphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group. However, embodiments of the present disclosure are not limited thereto.

In one or more embodiments, $Ar_{301}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and groups represented by Formulae 5-1 to 5-3 and 6-1 to 6-33, and $L_{301}$ may be selected from groups represented by Formulae 5-1 to 5-3 and 6-1 to 6-33:

Formula 5-1

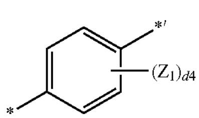

Formula 5-2

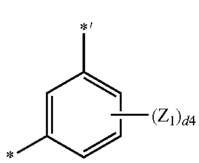

-continued

Formula 5-3

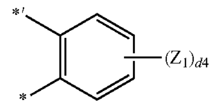

Formula 6-1

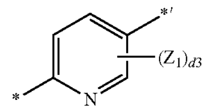

Formula 6-2

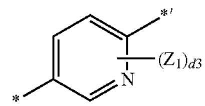

Formula 6-3

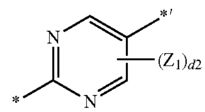

Formula 6-4

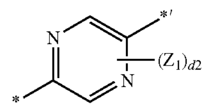

Formula 6-5

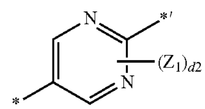

Formula 6-6

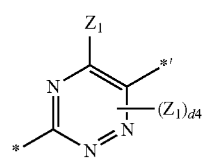

Formula 6-7

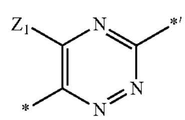

Formula 6-8

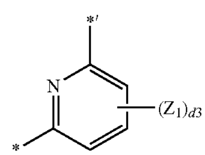

Formula 6-9

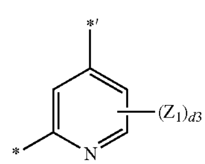

Formula 6-10

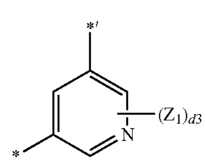

Formula 6-11

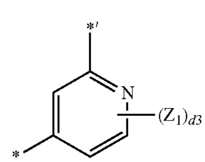

-continued

Formula 6-12

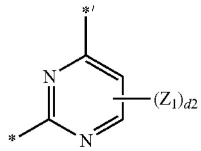

Formula 6-13

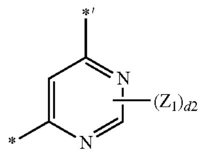

Formula 6-14

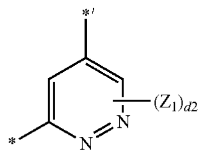

Formula 6-15

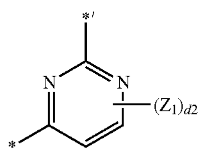

Formula 6-16

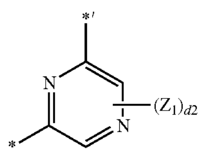

Formula 6-17

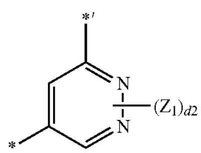

Formula 6-18

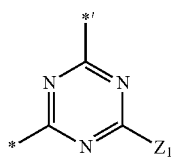

Formula 6-19

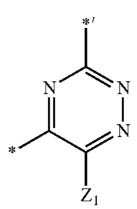

Formula 6-20

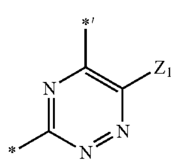

Formula 6-21

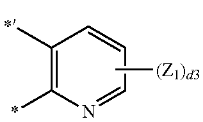

-continued

Formula 6-22

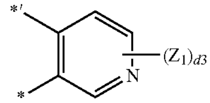

Formula 6-23

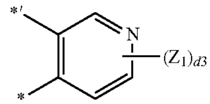

Formula 6-24

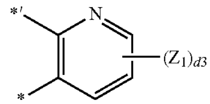

Formula 6-25

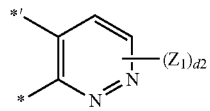

Formula 6-26

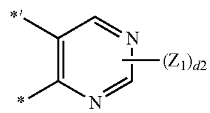

Formula 6-27

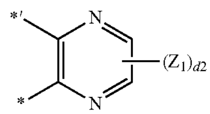

Formula 6-28

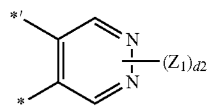

Formula 6-29

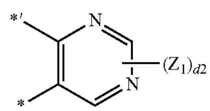

Formula 6-30

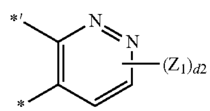

Formula 31

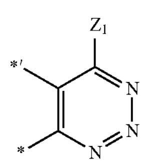

Formula 32

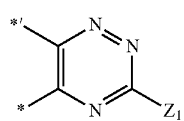

Formula 33

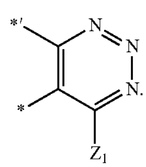

In Formulae 5-1 to 5-3 and 6-1 to 6-33, $Z_1$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), d4 may be 0, 1, 2, 3, or 4, d3 may be 0, 1, 2, 3, or 4, d2 may be 0, 1, 2, 3, or 4,

* and *' each independently indicate a binding site to a neighboring atom, and $Q_{31}$ to $Q_{33}$ are the same as described above.

In one or more embodiments, $L_{301}$ may be selected from groups represented by Formulae 5-2, 5-3, and 6-8 to 6-33.

In one or more embodiments, $R_{301}$ may be selected from a cyano group and groups represented by Formulae 7-1 to 7-18, and at least one of groups $Ar_{402}$ in the number of xd11 may be selected from groups represented by Formulae 7-1 to 7-18, but embodiments of the present disclosure are not limited thereto:

7-1

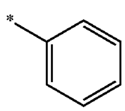

7-2

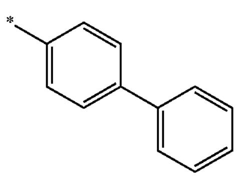

7-3

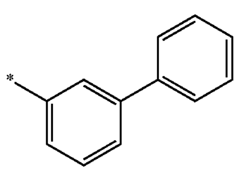

7-4

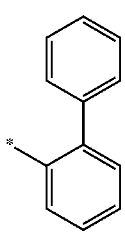

-continued 7-5

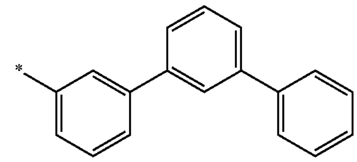

7-6

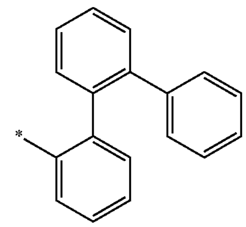

7-7

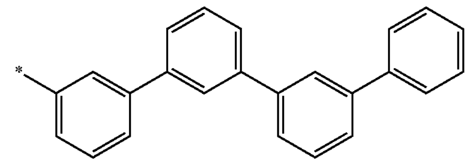

7-8

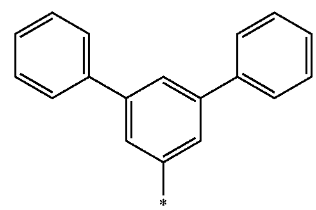

7-9

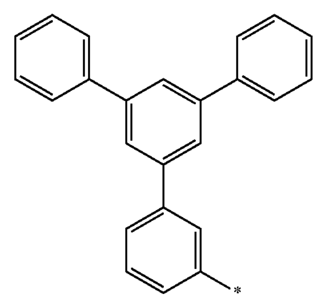

7-10

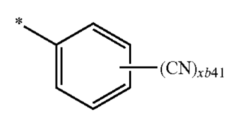

7-11

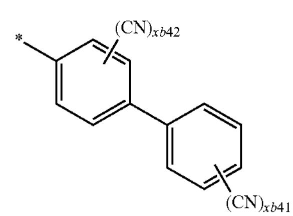

7-12

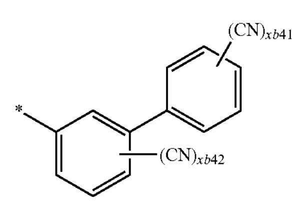

-continued 7-13

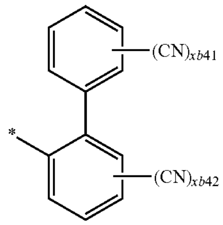

7-14

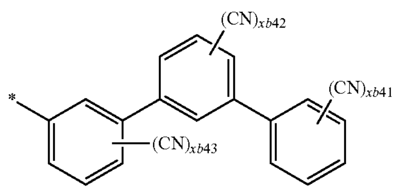

7-15

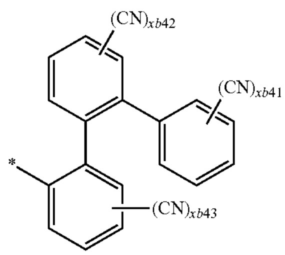

7-16

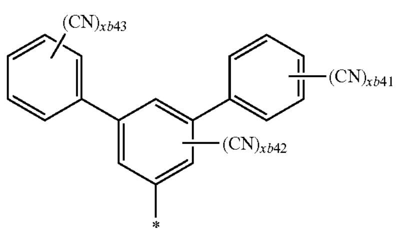

-continued 7-17

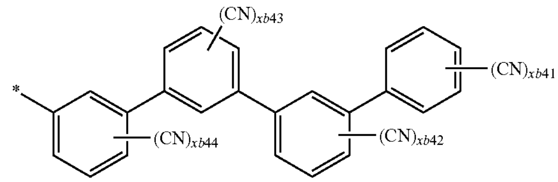

7-18

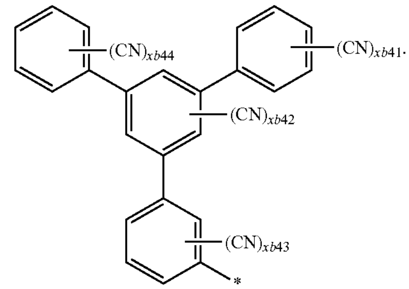

In Formulae 7-1 to 7-18, xb41 to xb44 may each independently 0, 1, or 2, wherein xb41 in Formula 7-10 may not be 0, the sum of xb41 and xb42 in Formulae 7-11 to 7-13 may not be 0, the sum of xb41, xb42, and xb43 in Formulae 7-14 to 7-16 may not be 0, the sum of xb41, xb42, xb43, and xb44 in Formulae 7-17 and 7-18 may not be 0, and * indicates a binding site to a neighboring atom.

In Formula E-1, two or more of groups $Ar_{301}$ may be identical to or different from each other, and two or more of groups $L_{301}$ may be identical to or different from each other. In Formula H-1, two or more of groups $L_{401}$ may be identical to or different from each other, and two or more of groups $Ar_{402}$ may be identical to or different from each other.

The electron transport host may be, for example, selected from Compounds H-E1 to H-E4 and the following compounds, but embodiments of the present disclosure are not limited thereto:

HE-1

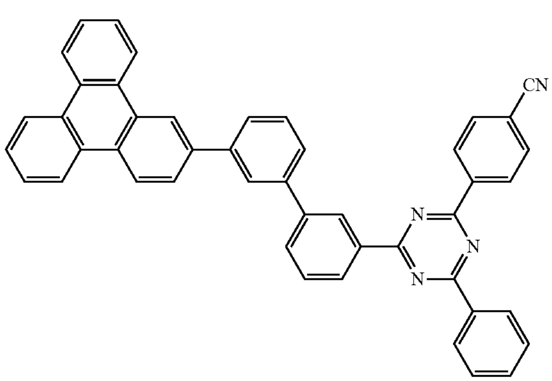

HE-2

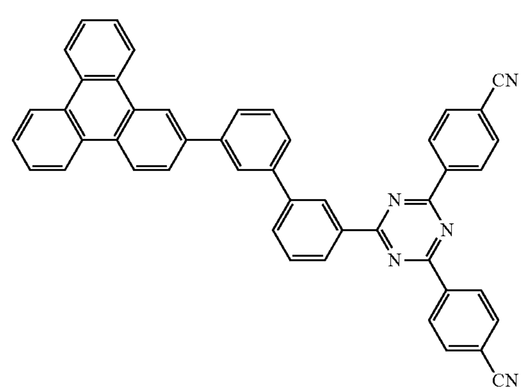

-continued
HE-3
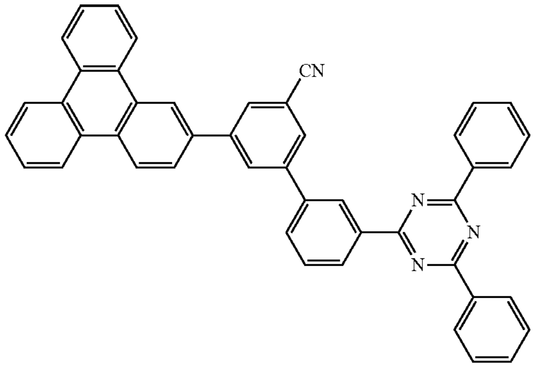
HE-4
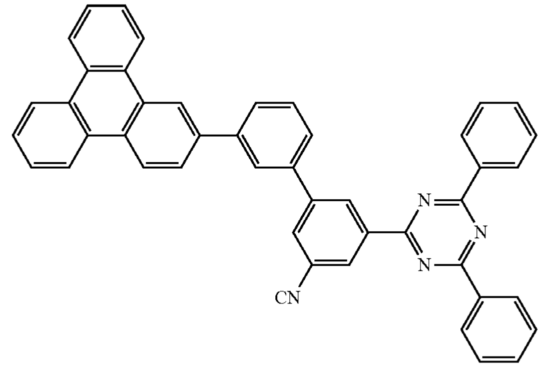
A-1
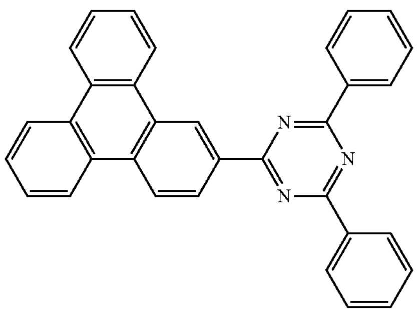
A-2
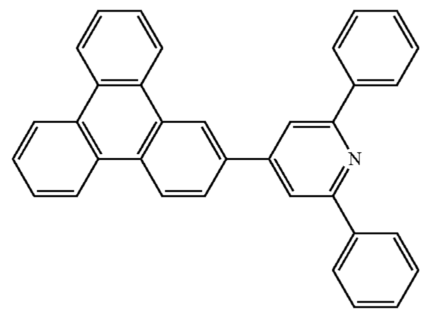
A-3
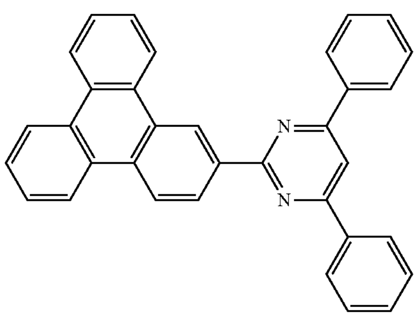
A-4
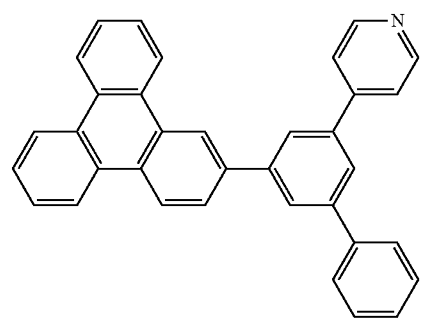
A-5
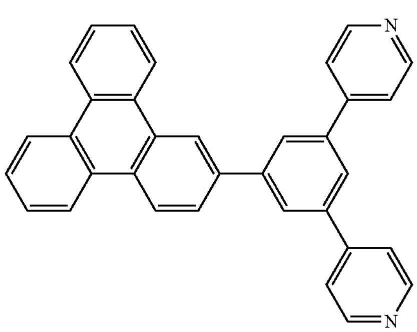
A-6
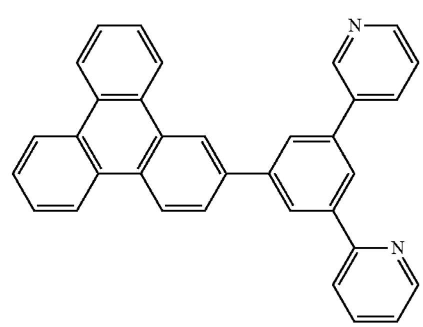

-continued
A-7
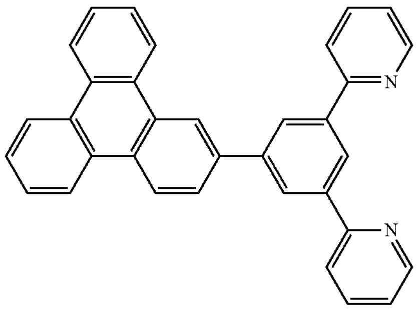
A-8
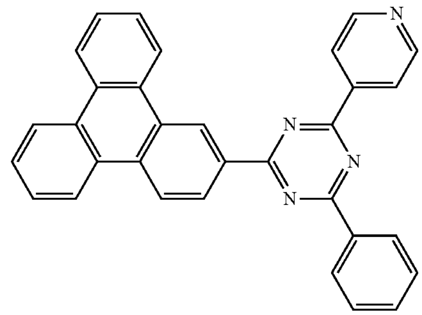
A-9
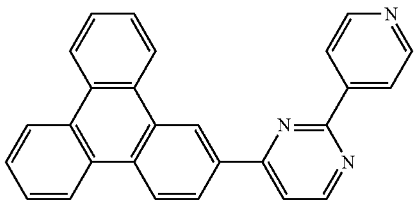
A-10
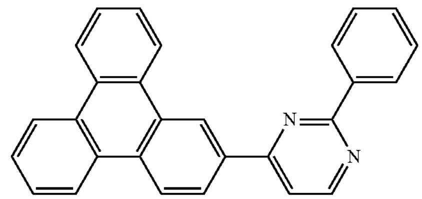
A-11
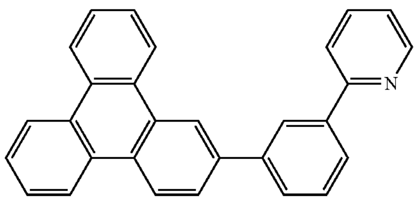
A-12
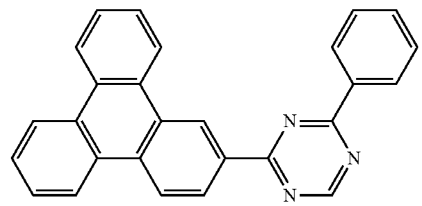
A-13
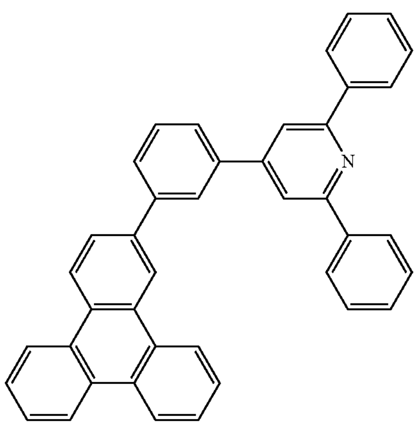
A-14
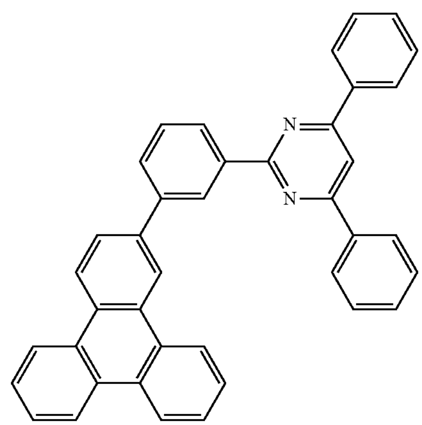
A-15
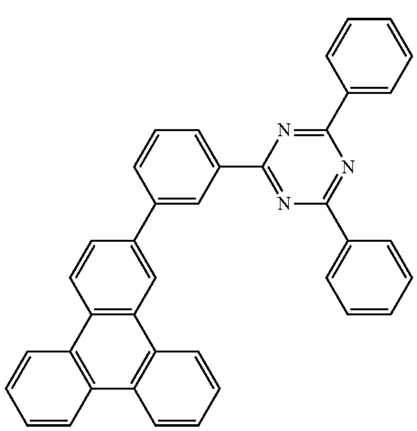
A-16
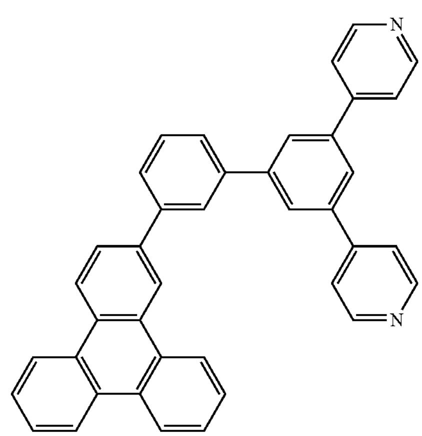

-continued
A-17
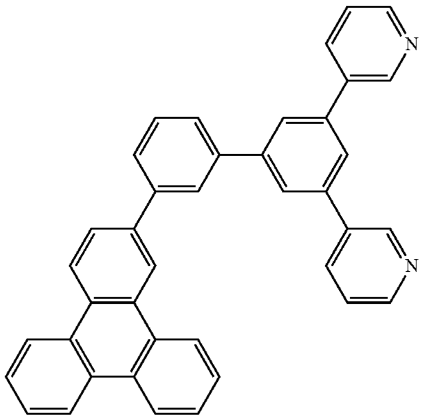
A-18
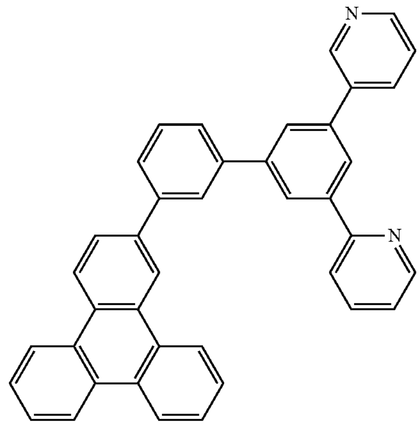
A-19
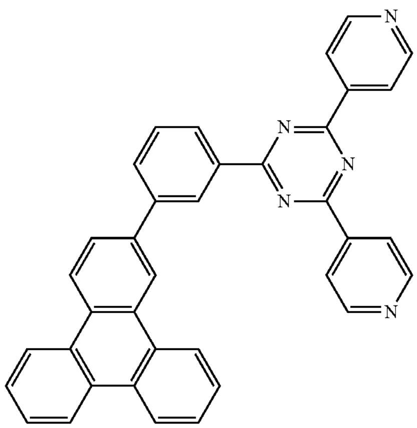
A-20
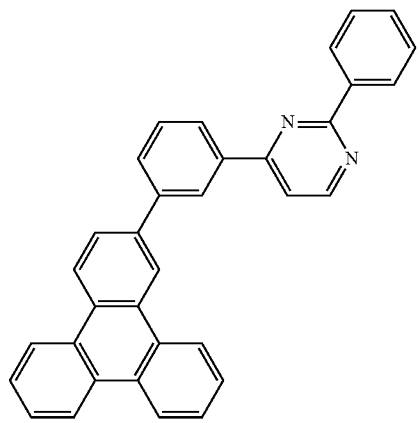
A-21
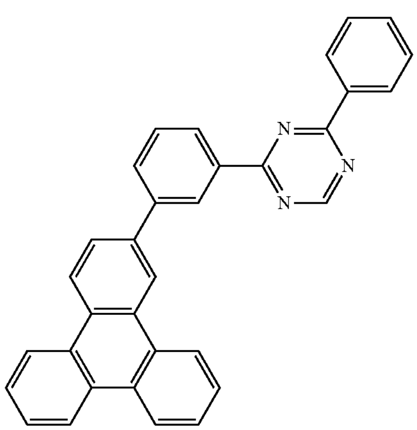
A-22
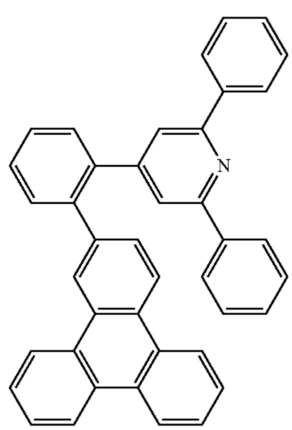

-continued
A-23
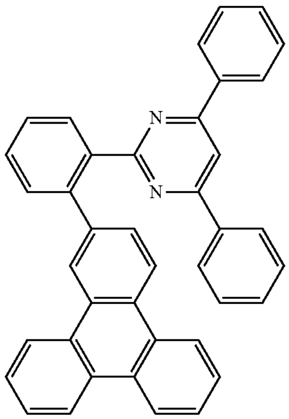
A-24
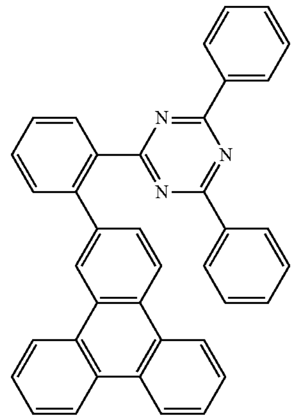
A-25
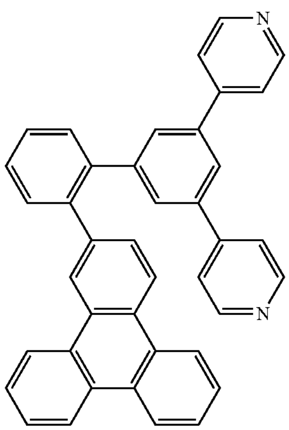
A-26
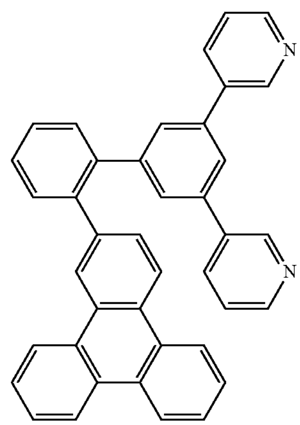
A-27
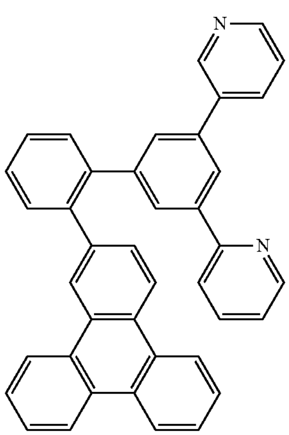
A-28
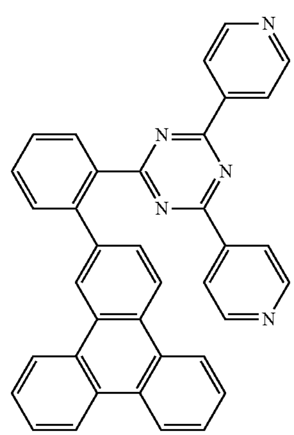

-continued
A-29
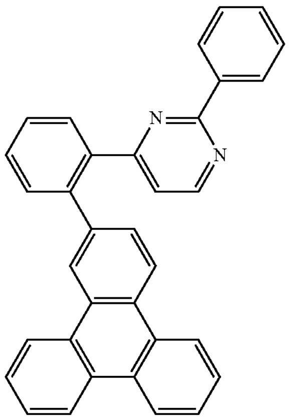
A-30
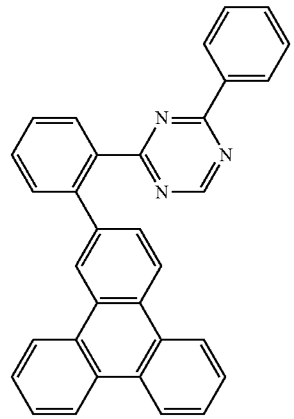
A-31
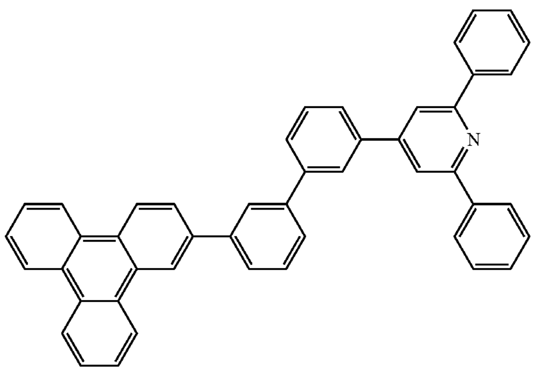
A-32
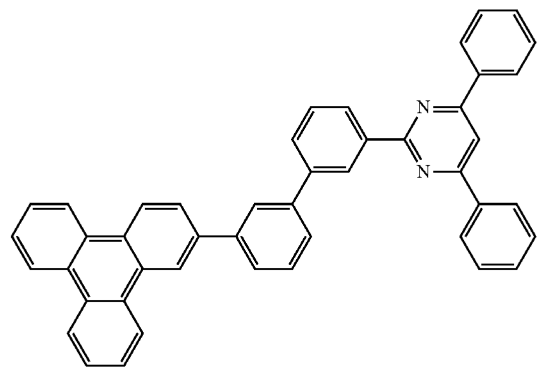
A-33
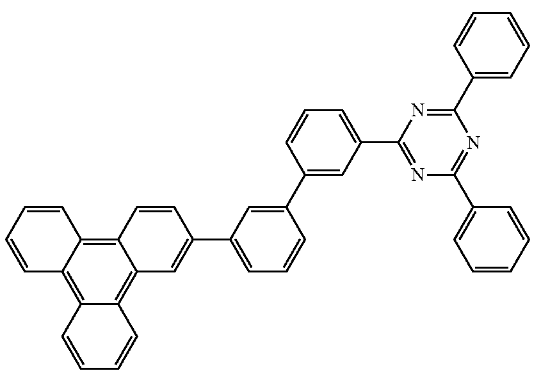
A-34
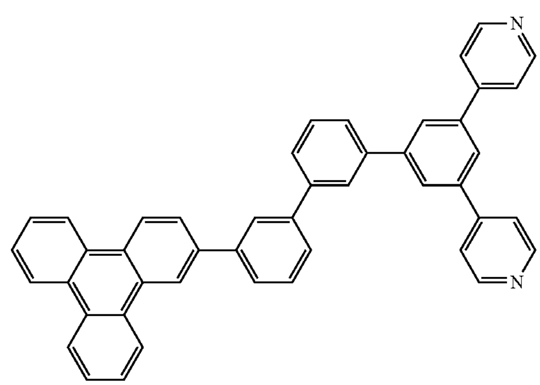
A-35
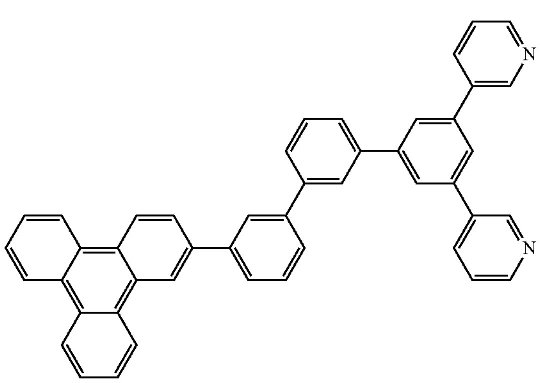
A-36
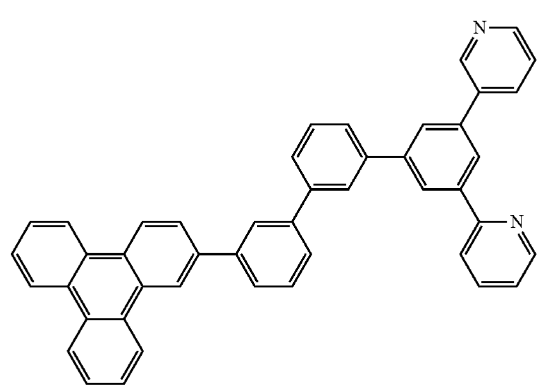

-continued
A-37
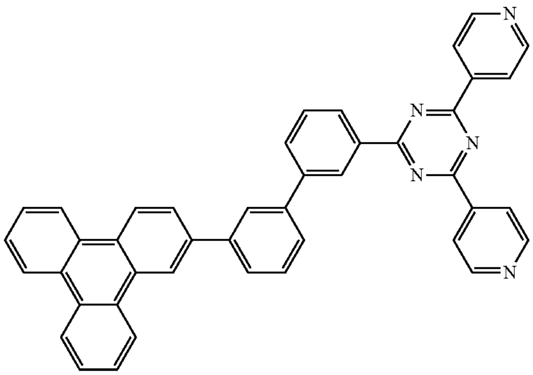
A-38
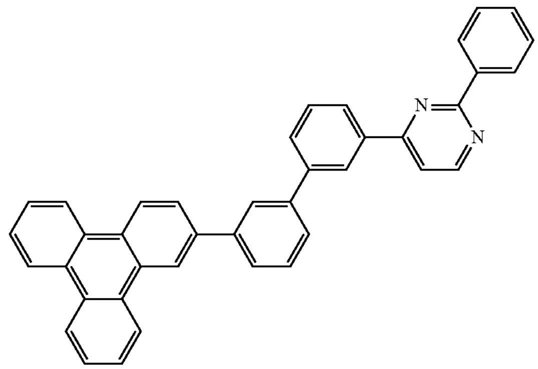
A-39
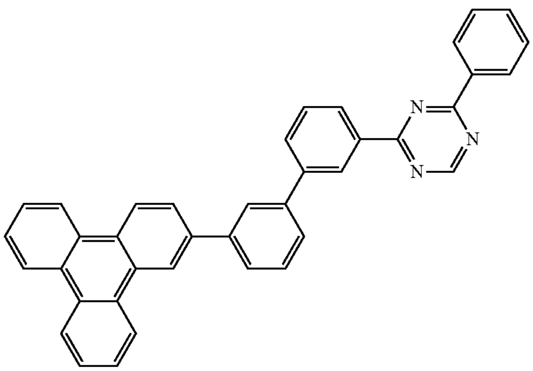
A-40
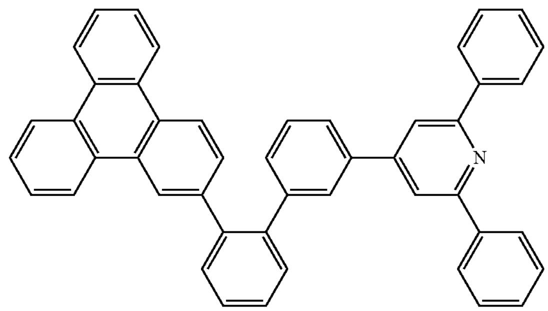
A-41
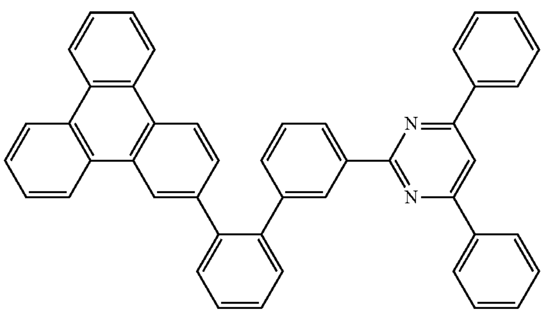
A-42
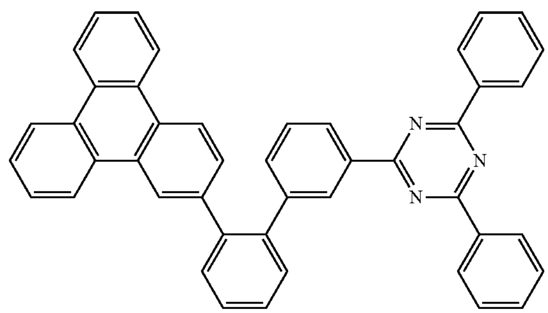
A-43
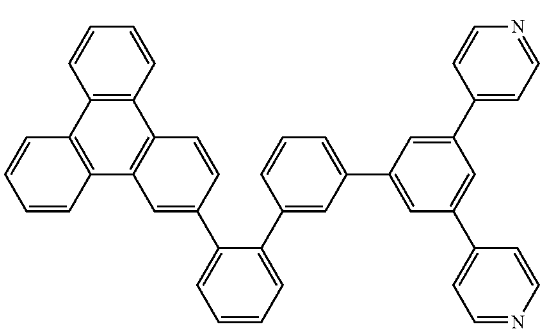
A-44
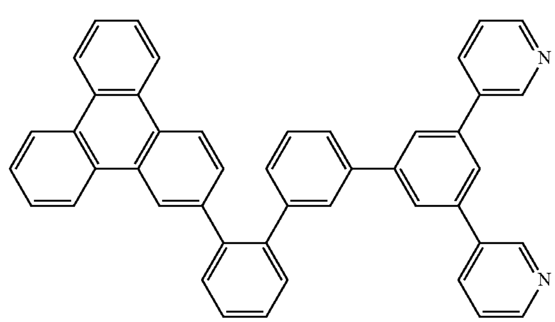

-continued
A-45
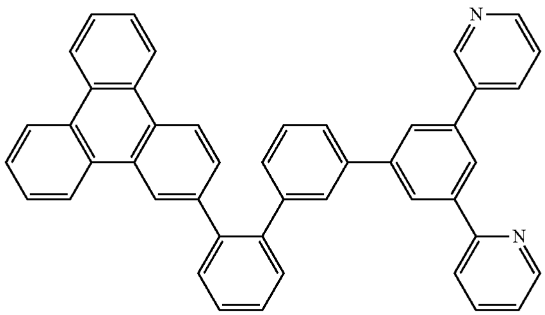
A-46
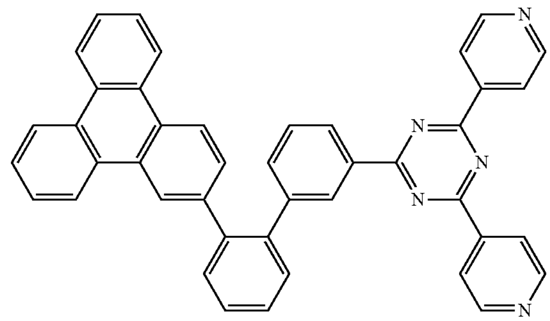
A-47
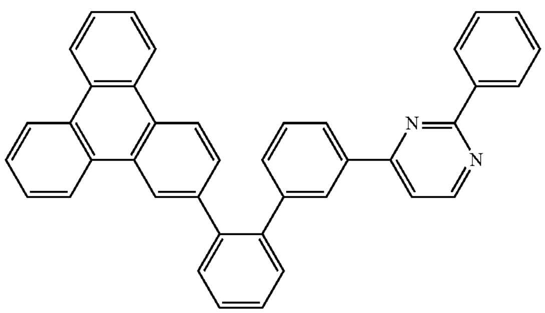
A-48
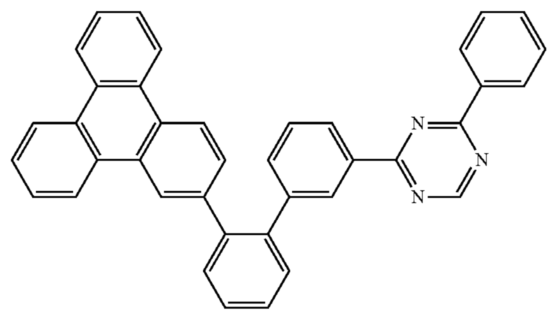
A-49
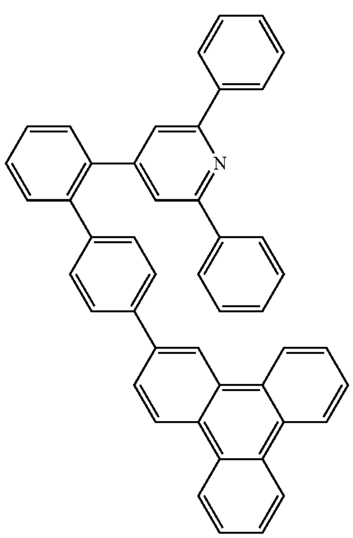
A-50
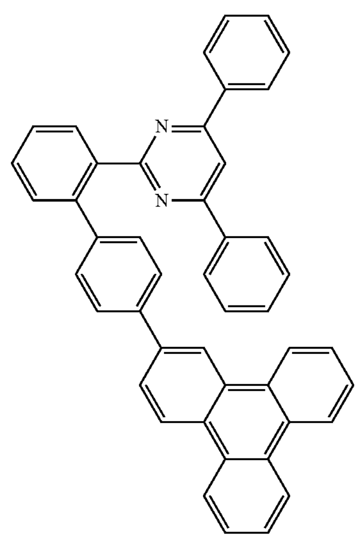

-continued
A-51
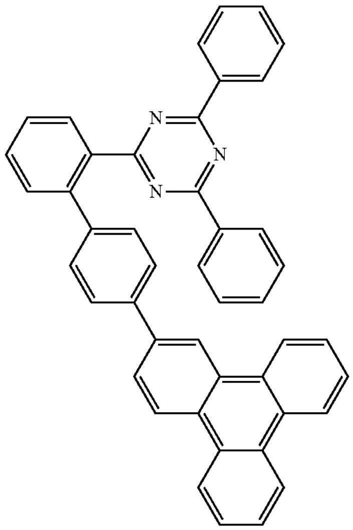
A-52
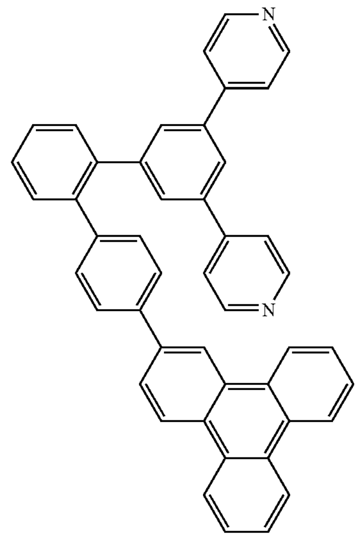
A-53
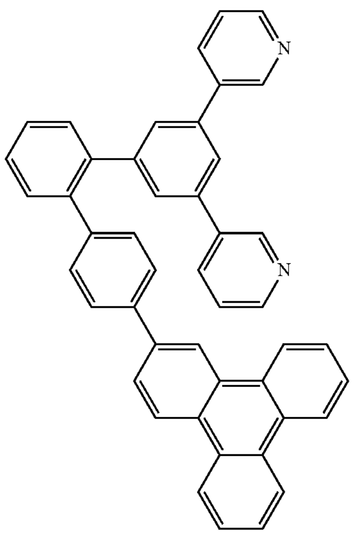
A-54
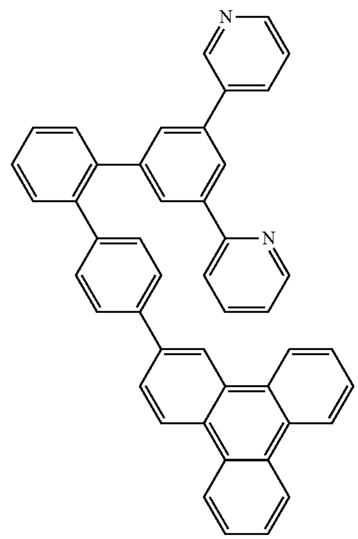
A-55
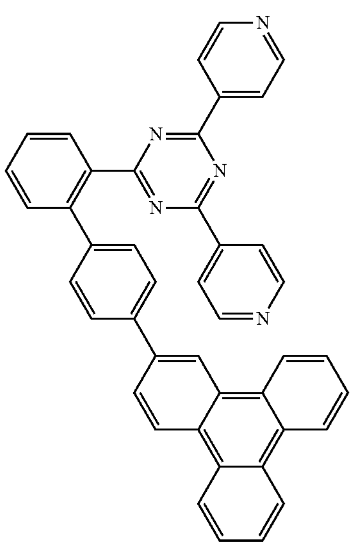
A-56
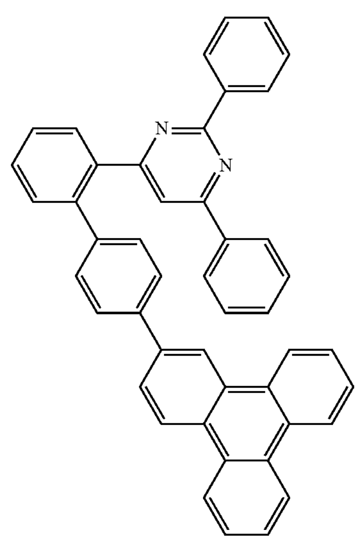

-continued
A-57
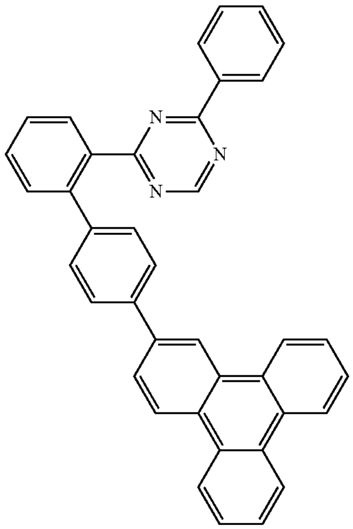
A-58
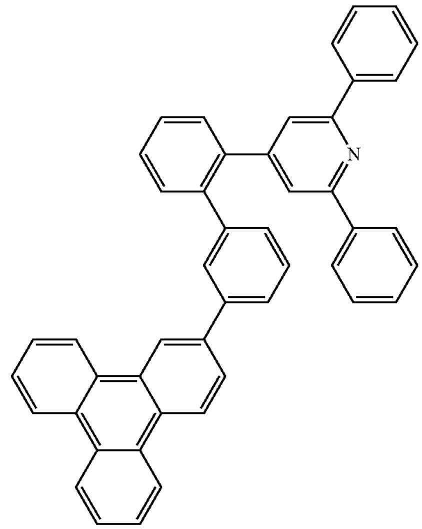
A-59
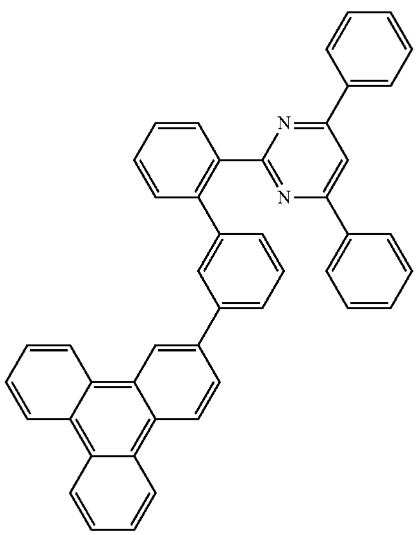
A-60
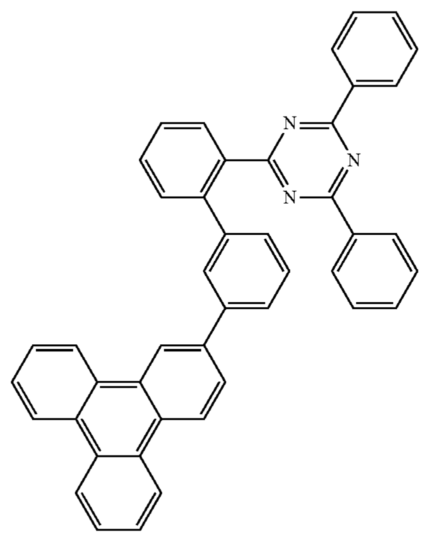
A-61
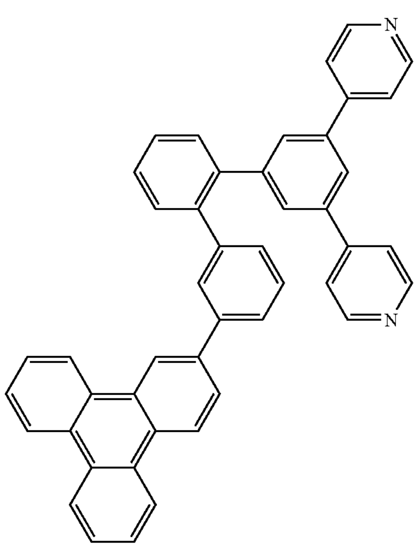
A-62
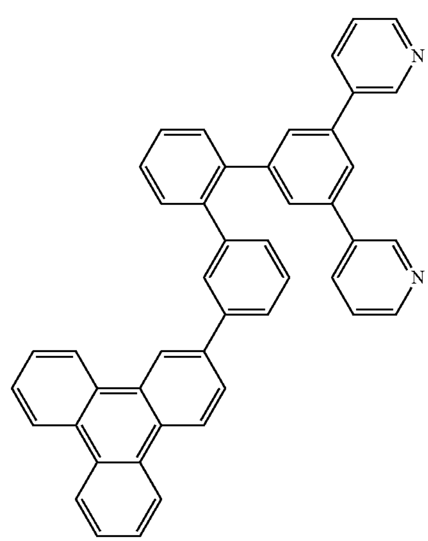

-continued
A-63
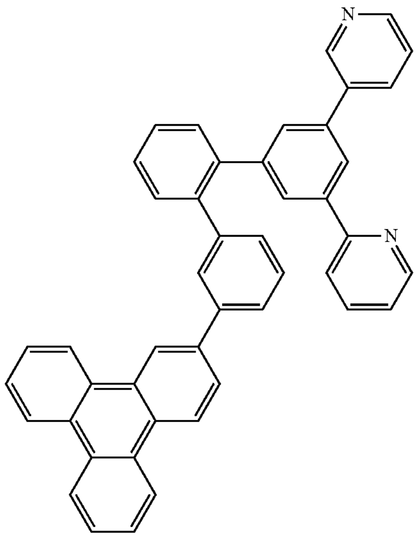
A-64
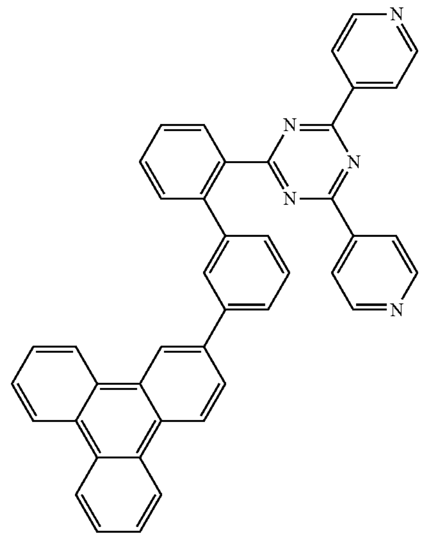
A-65
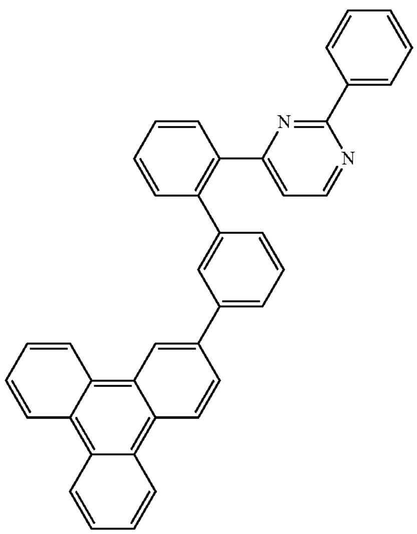
A-66
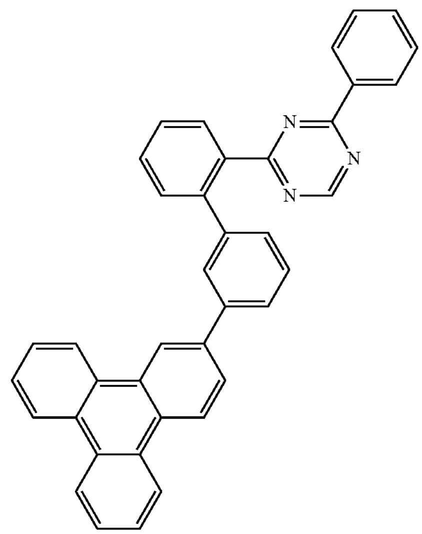
A-67
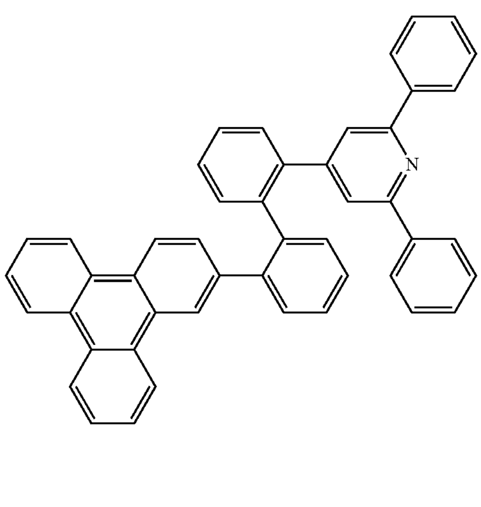
A-68
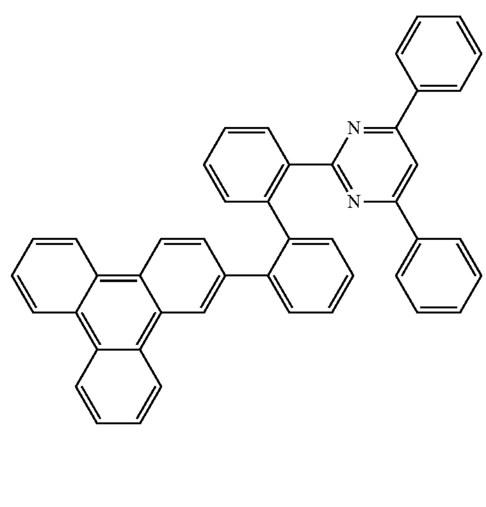

-continued
A-69
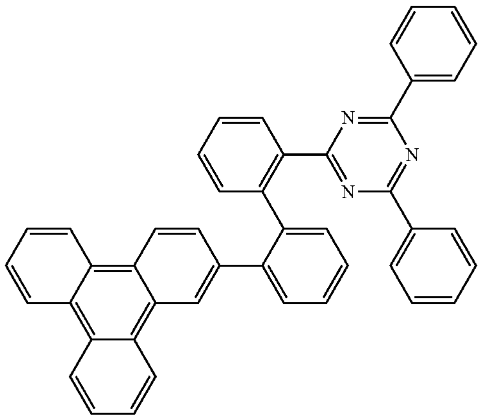
A-70
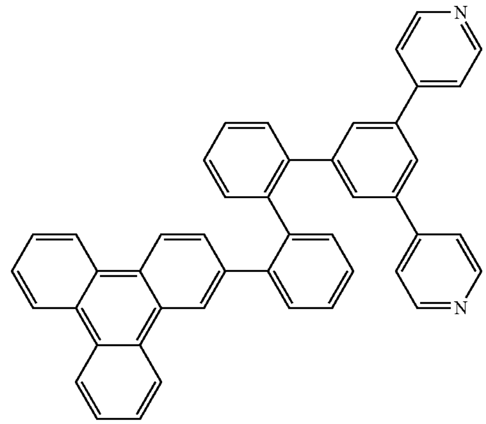
A-71
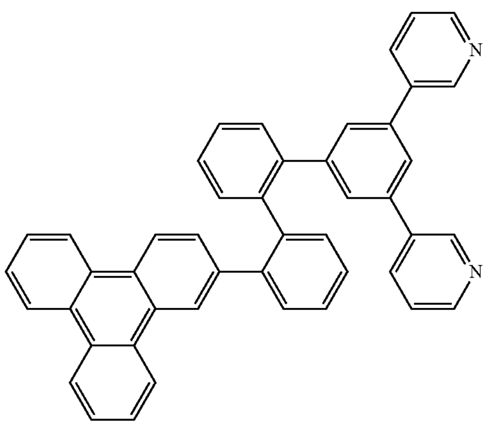
A-72
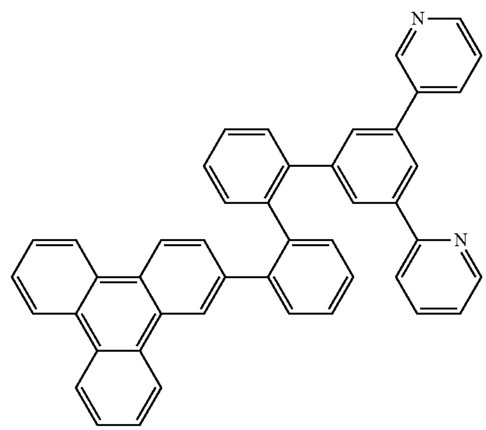
A-73
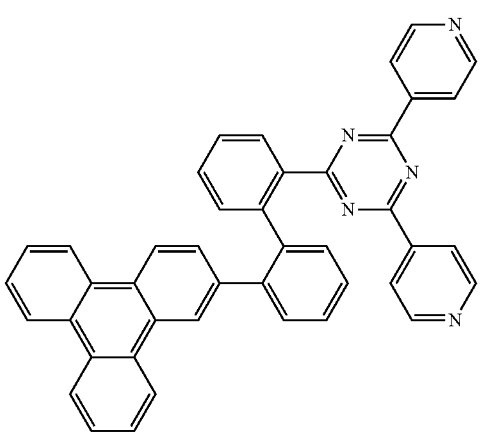
A-74
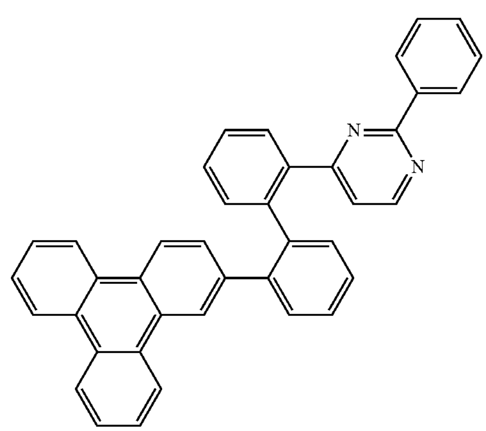

-continued
A-75
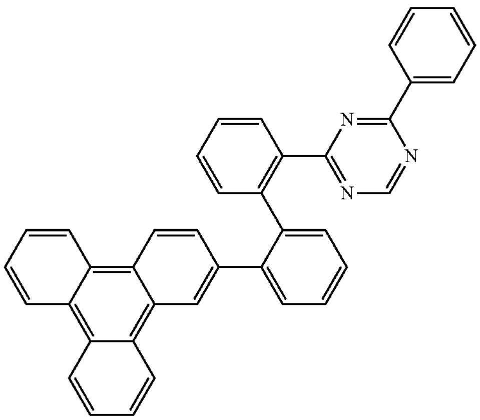
A-76
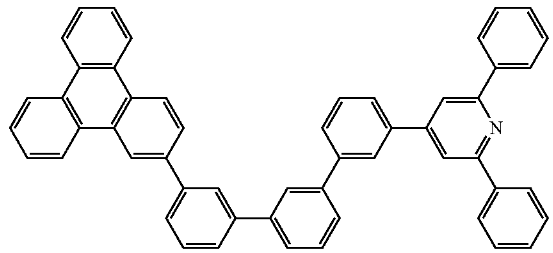
A-77
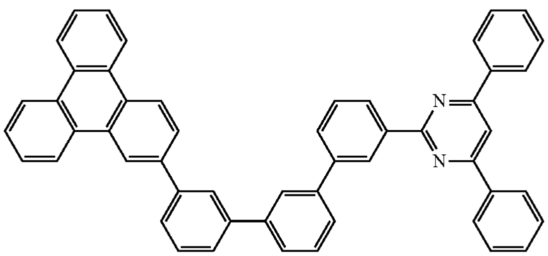
A-78
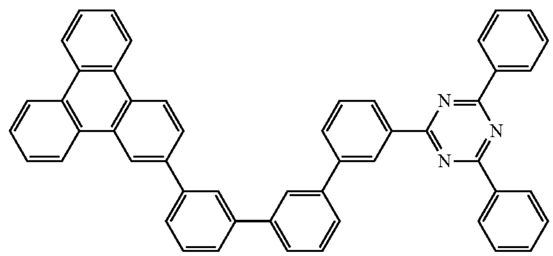
A-79
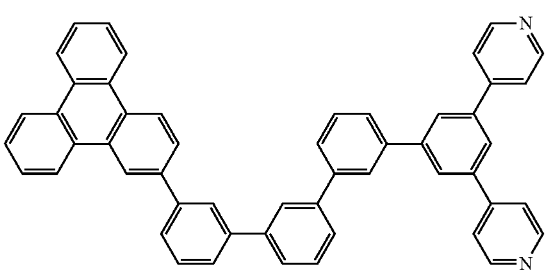
A-80
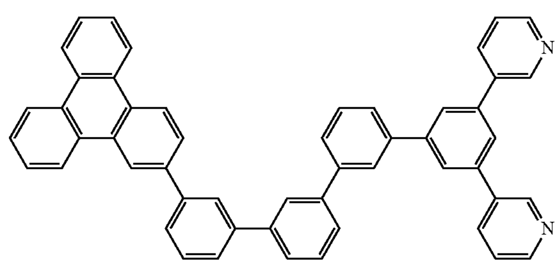
A-81
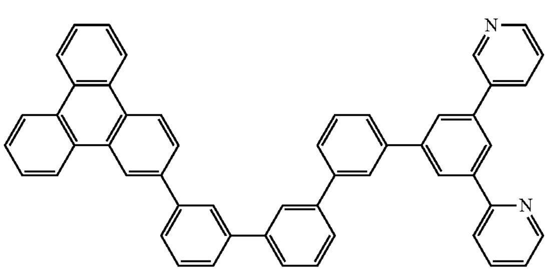
A-82
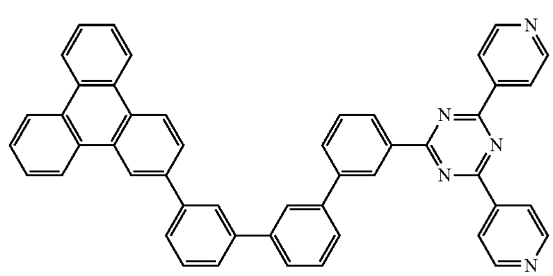
A-83
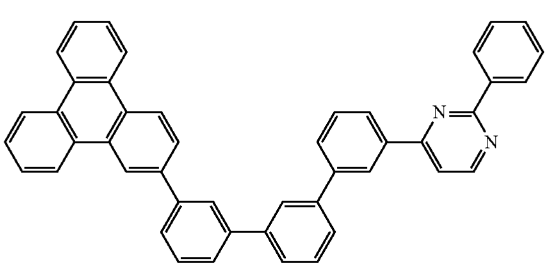
A-84
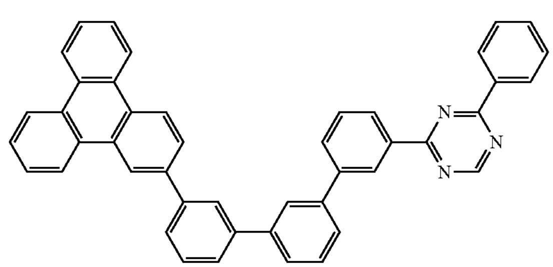

-continued
A-85
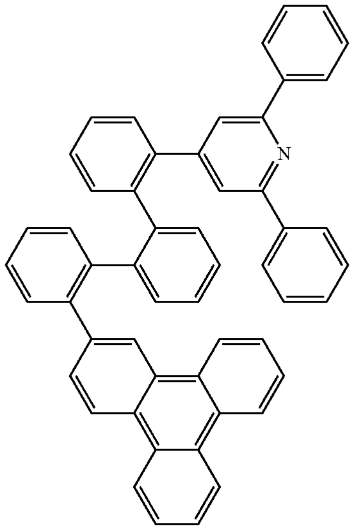
A-86
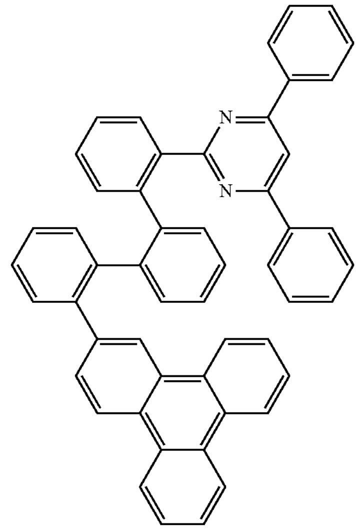
A-87
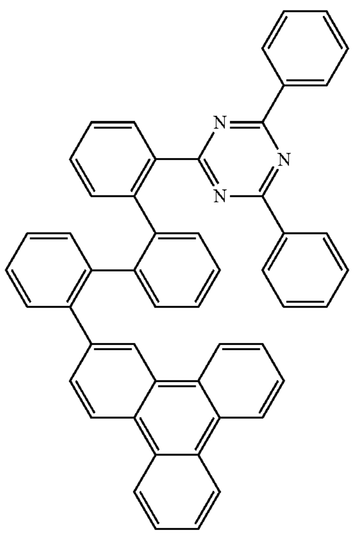
A-88
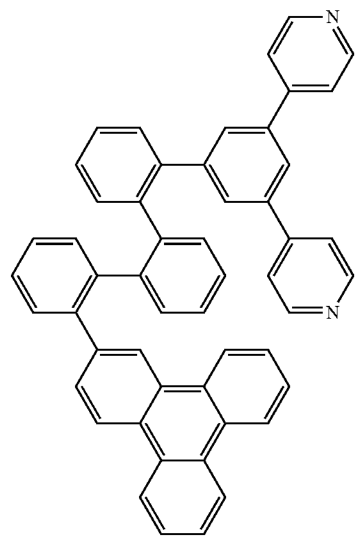
A-89
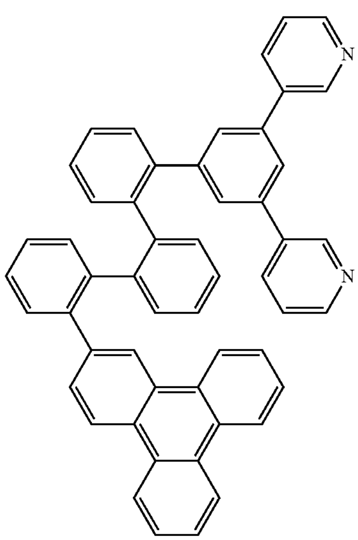
A-90
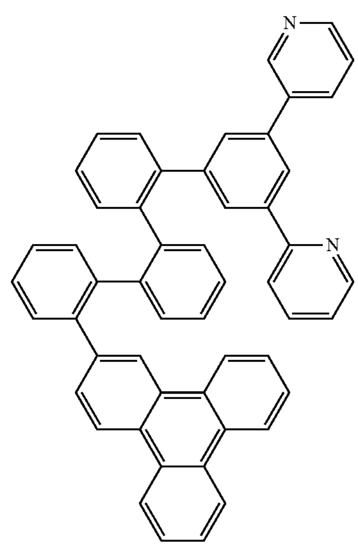

-continued
A-91
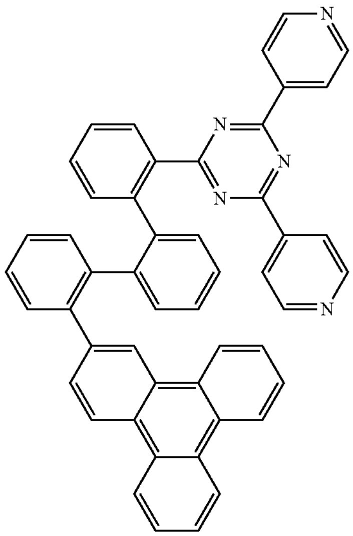
A-92
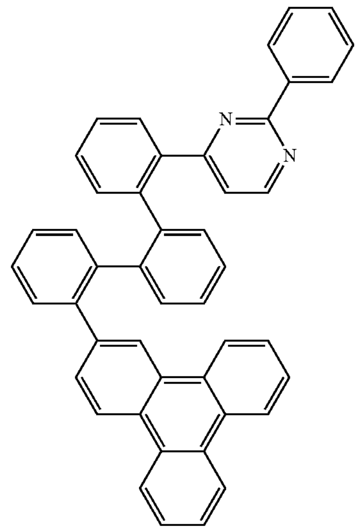
A-93
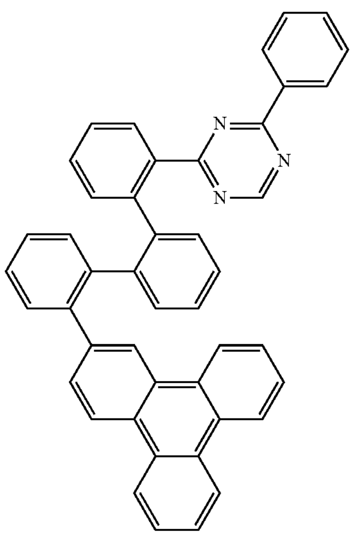
A94
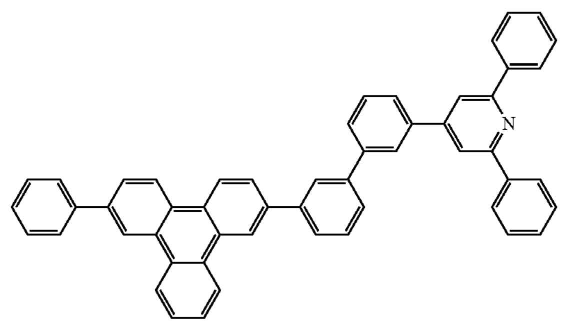
A-95
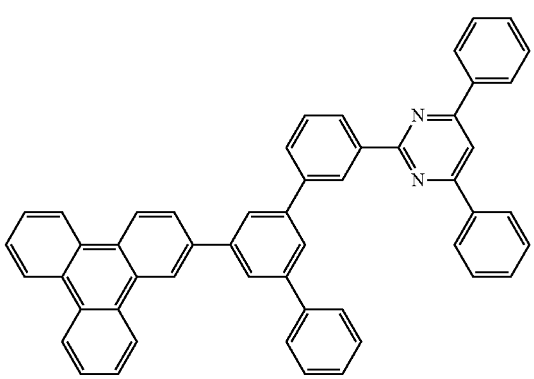
A-96
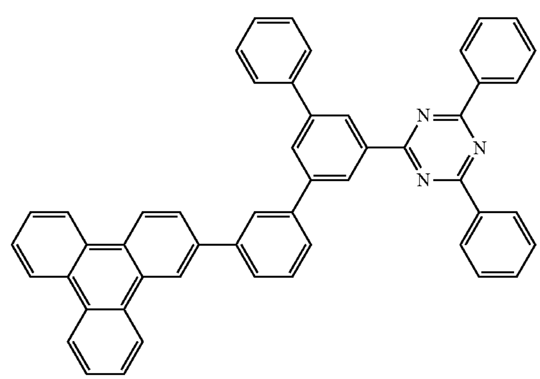

-continued
A-97
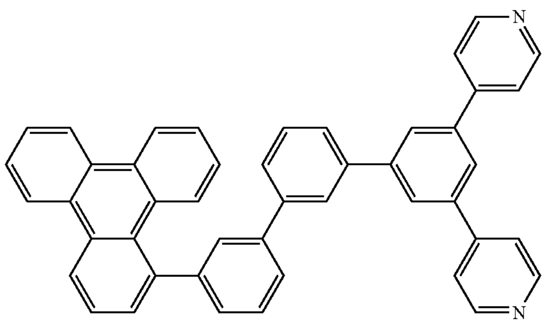
A-98
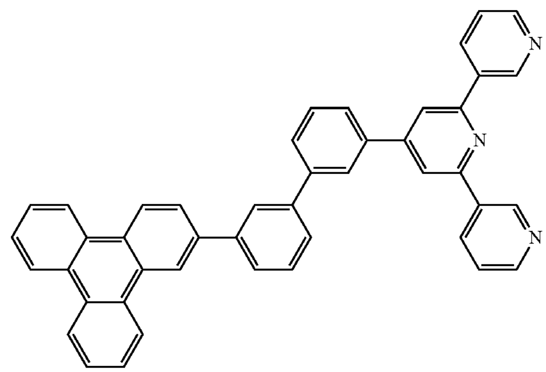
A-99
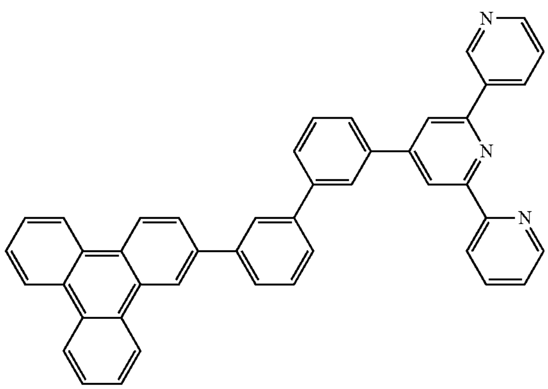
A-100
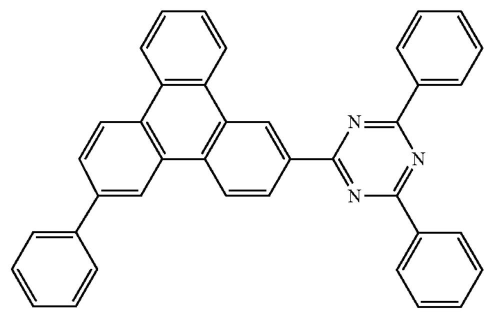
A-101
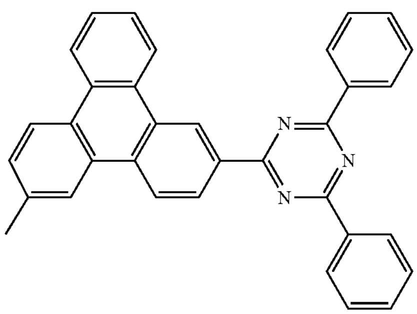
A-102
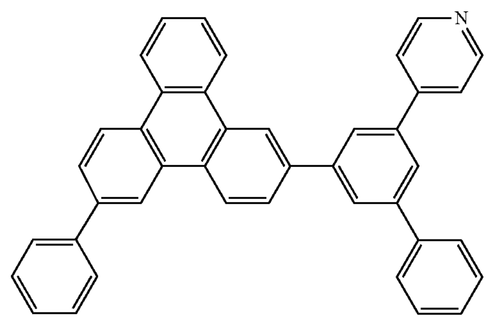
A-103
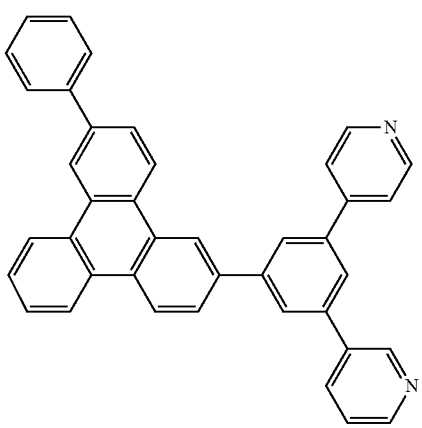
A-104
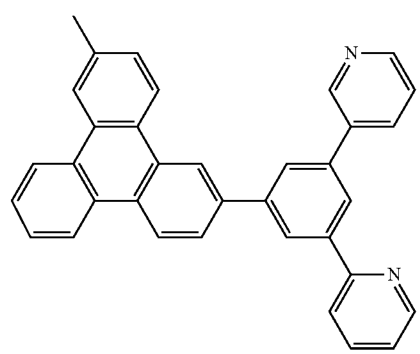

-continued
A-105
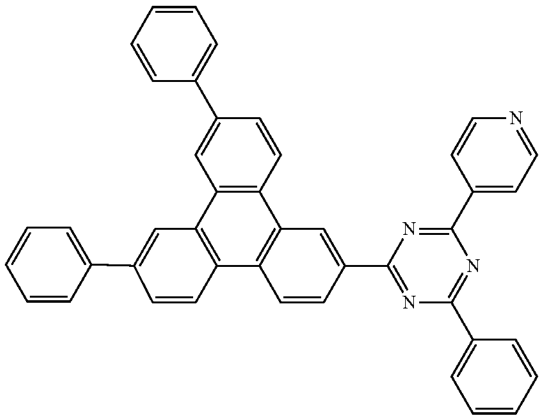
A-106
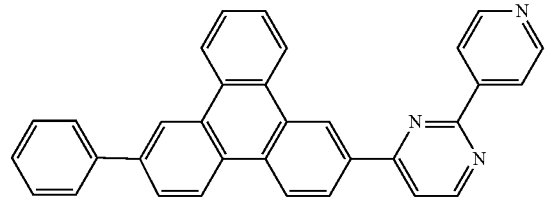
A-107
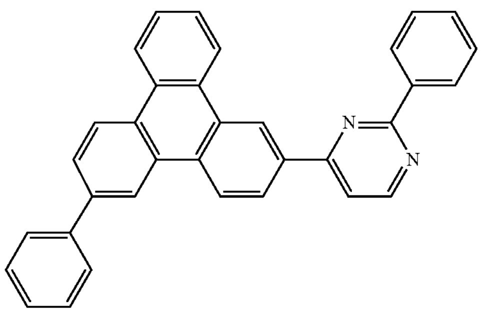
A-108
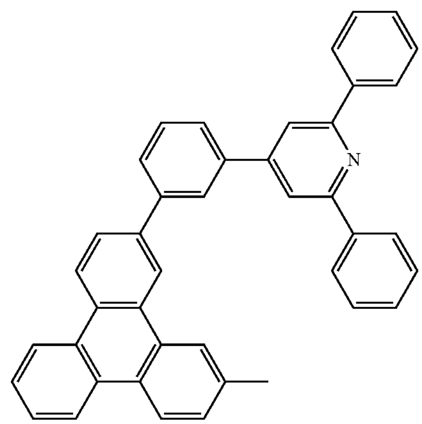
A-109
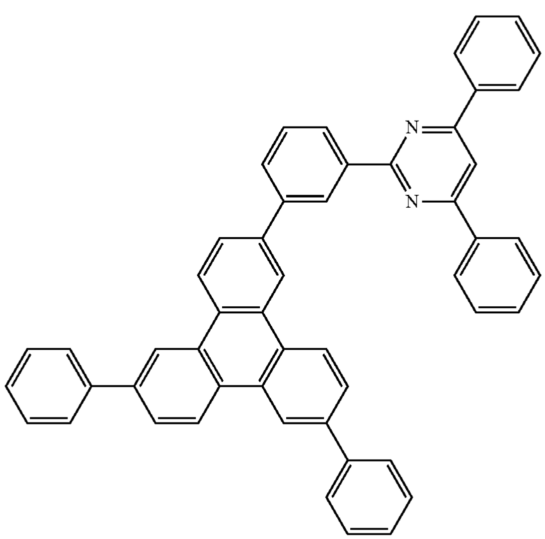
A-110
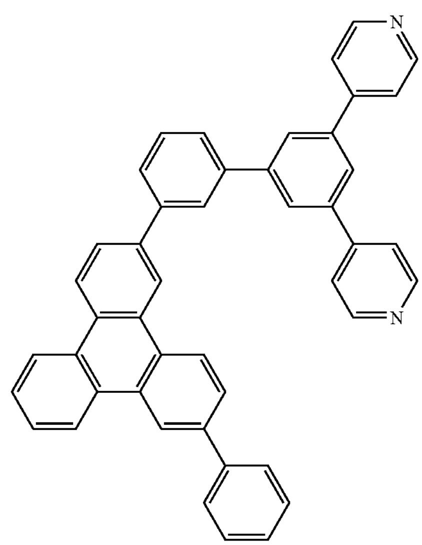

-continued
A-111
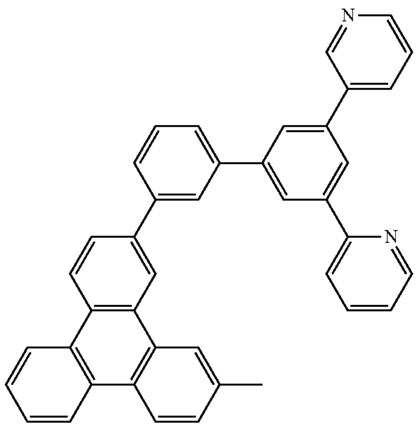
A-112
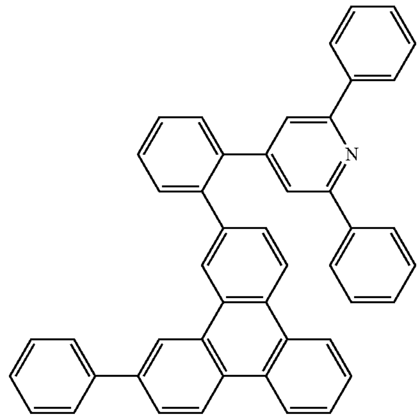
A-113
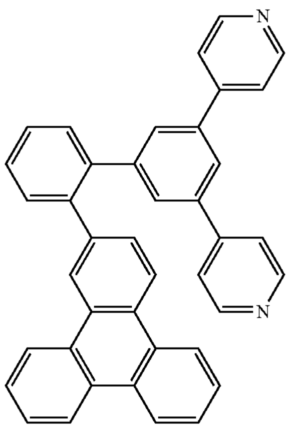
A-114
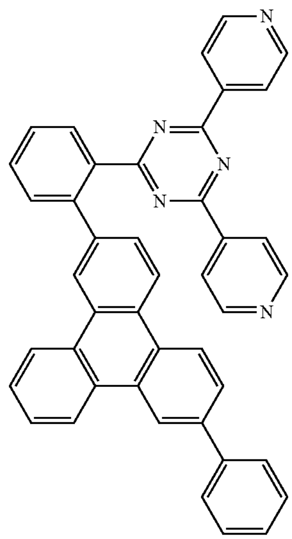
A-115
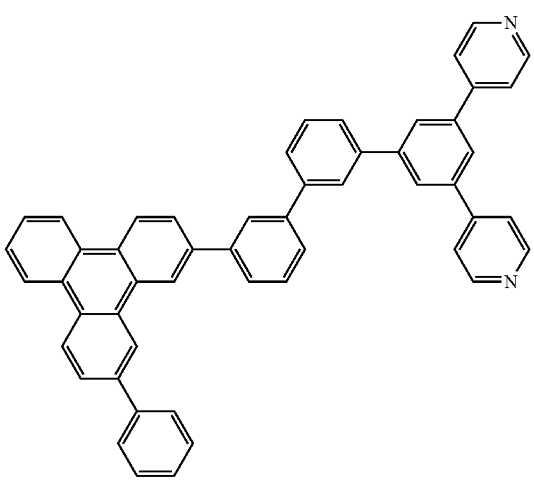
A-116
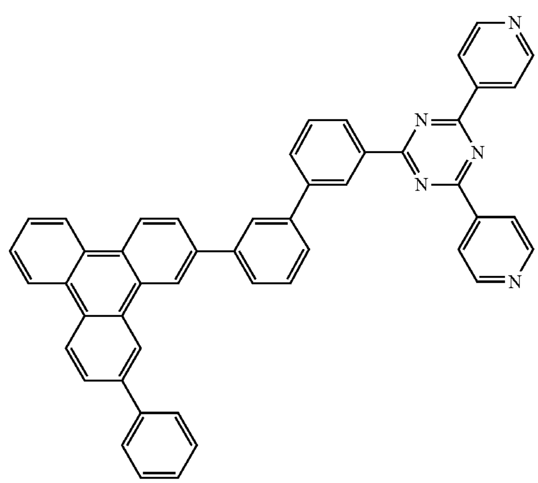

-continued
A-117
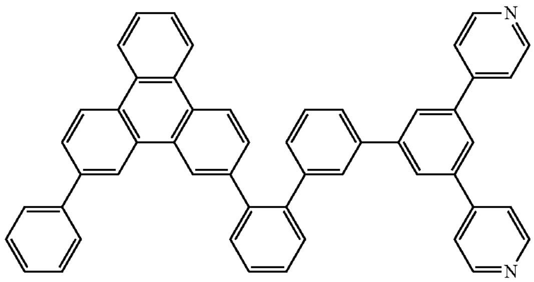
A-118
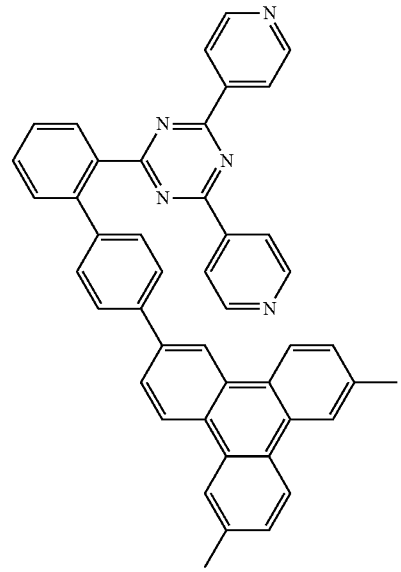
A-119
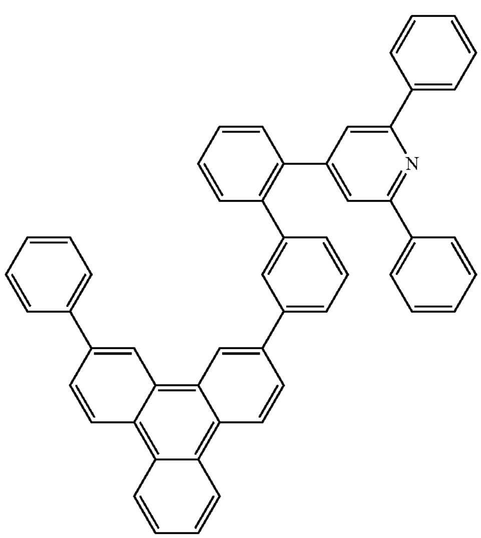
A-120
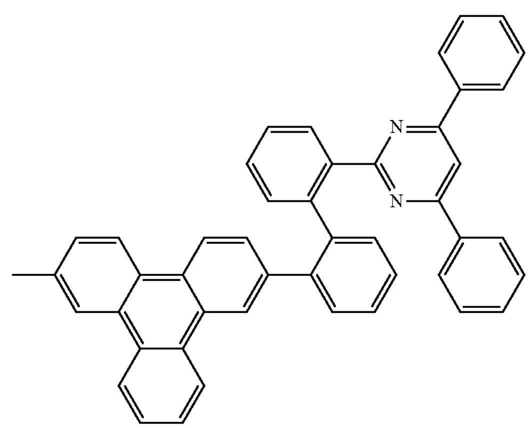

-continued
A-121
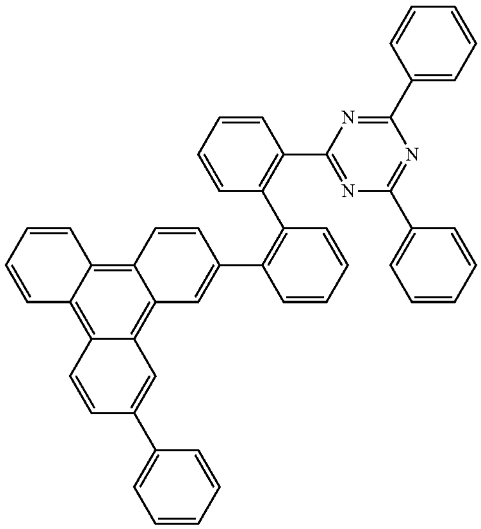
A-122
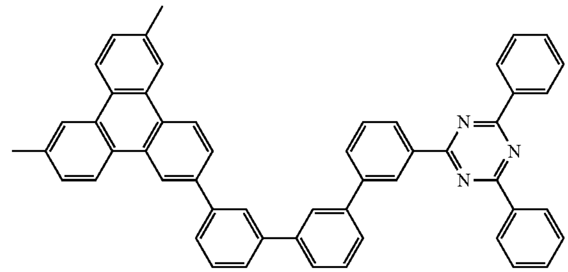
A-123
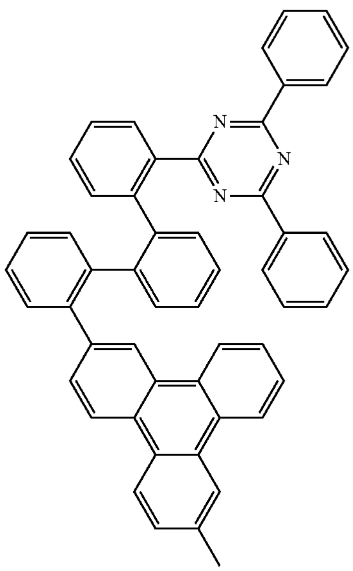
A-124
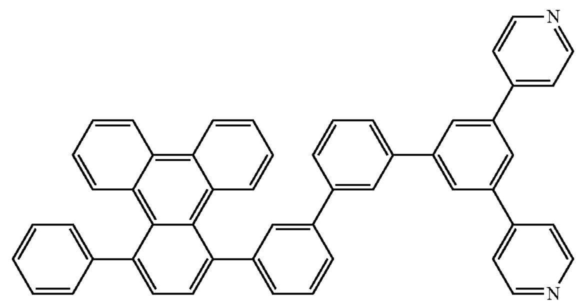
A-125
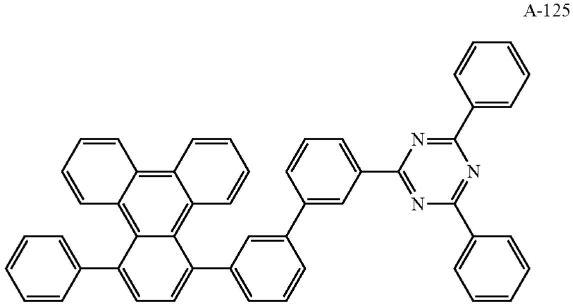
A(1)
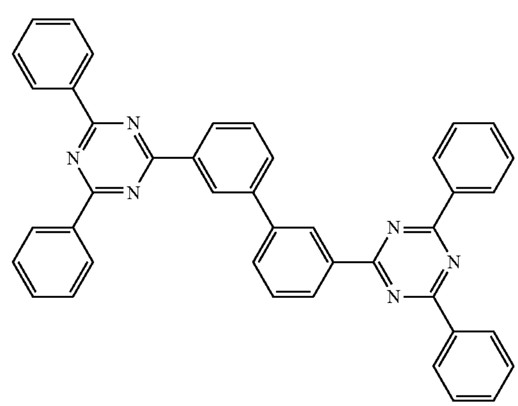

-continued
A(2)
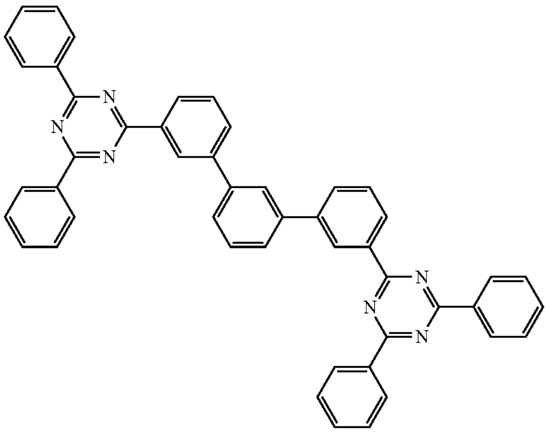
A(3)
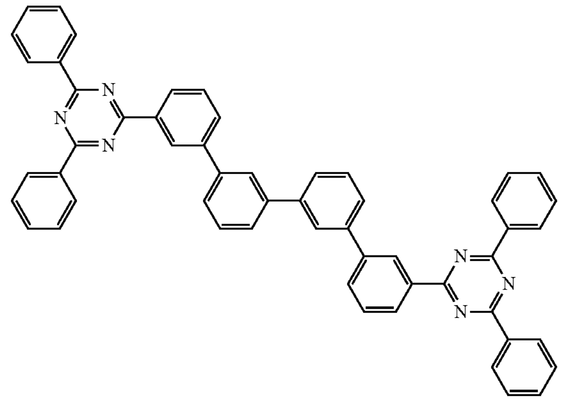
A(4)
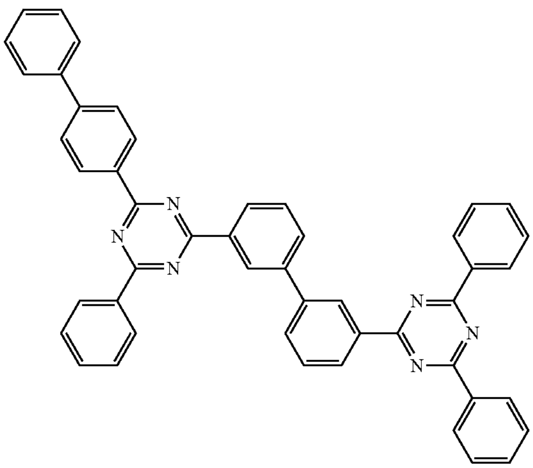
A(5)
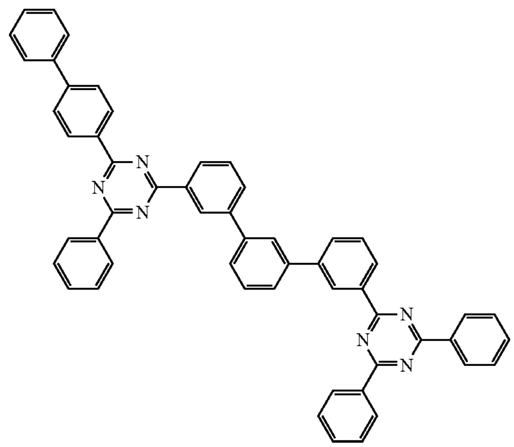
A(6)
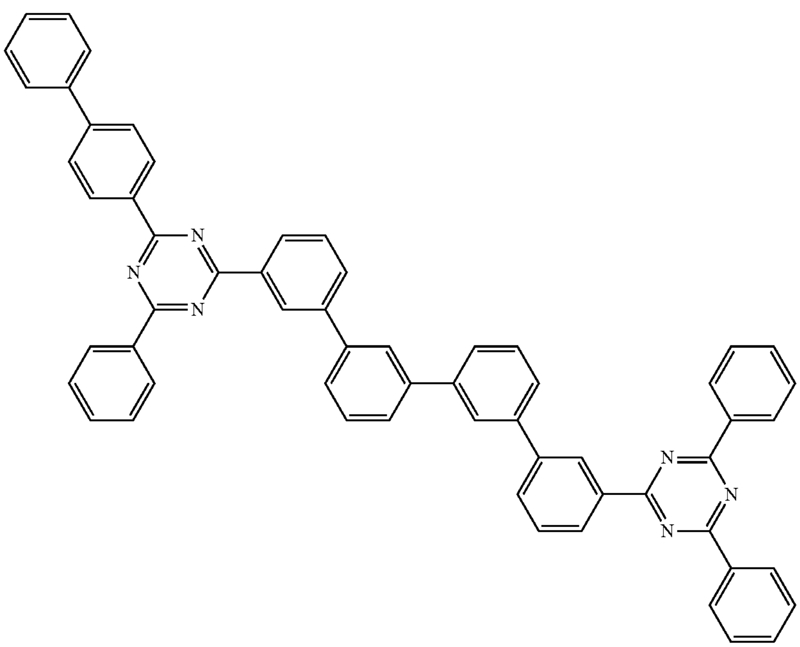

-continued
A(7)
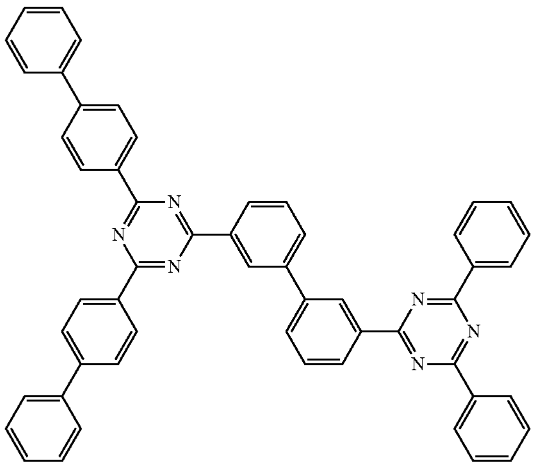
A(8)
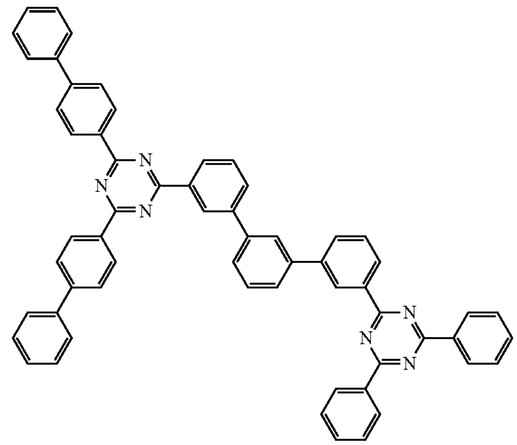
A(9)
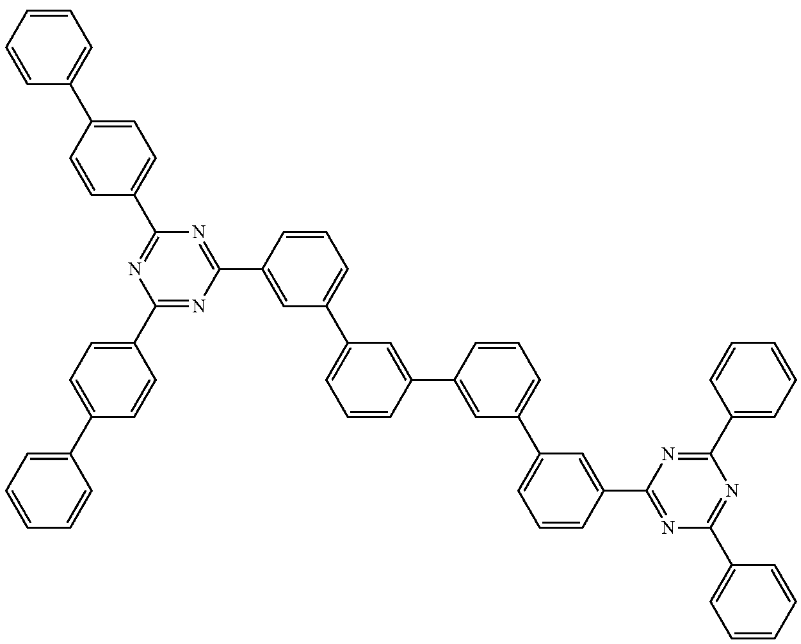
A(10)
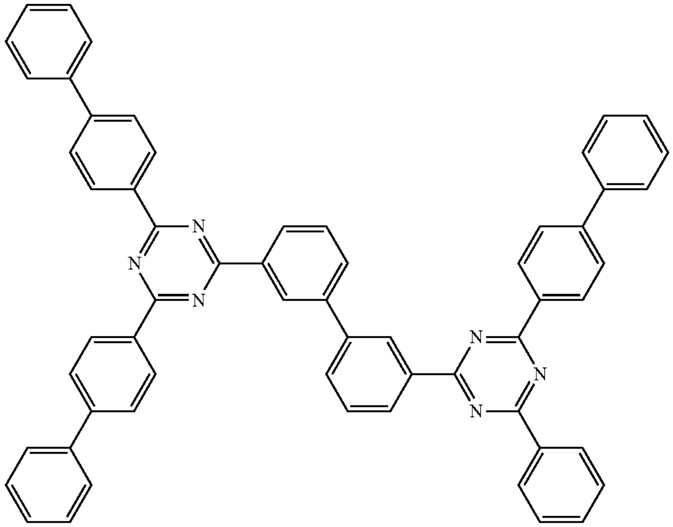

-continued
A(11)
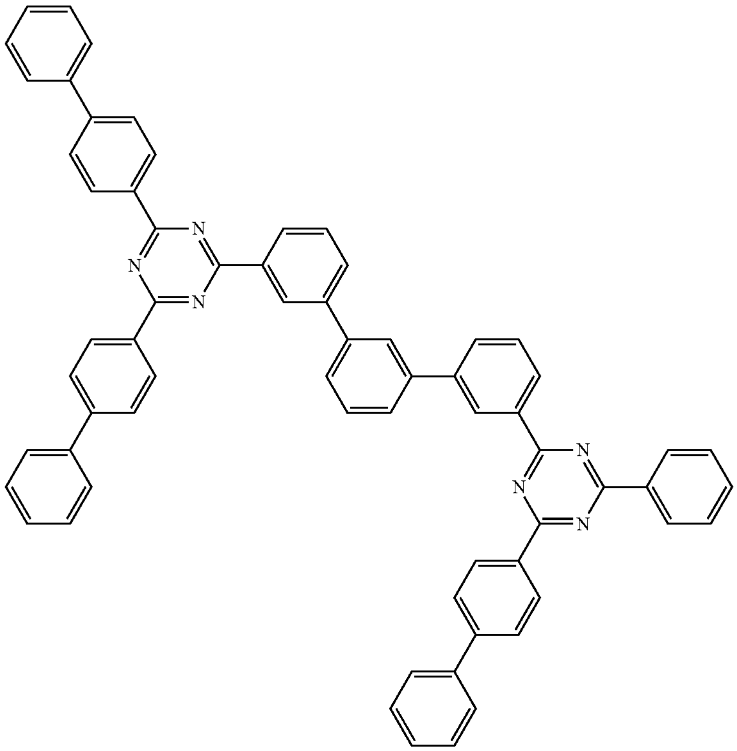
(A12)
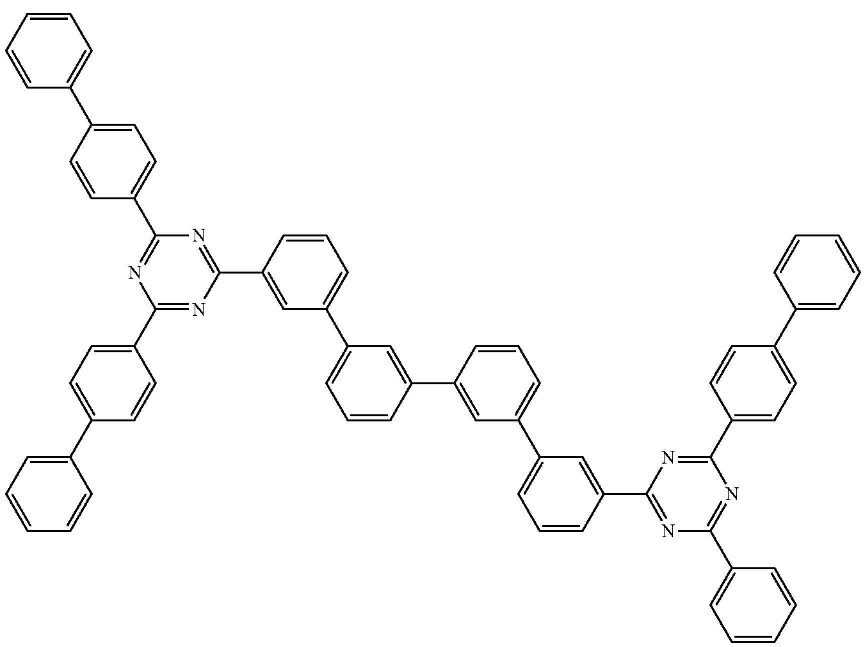

-continued
A(13)
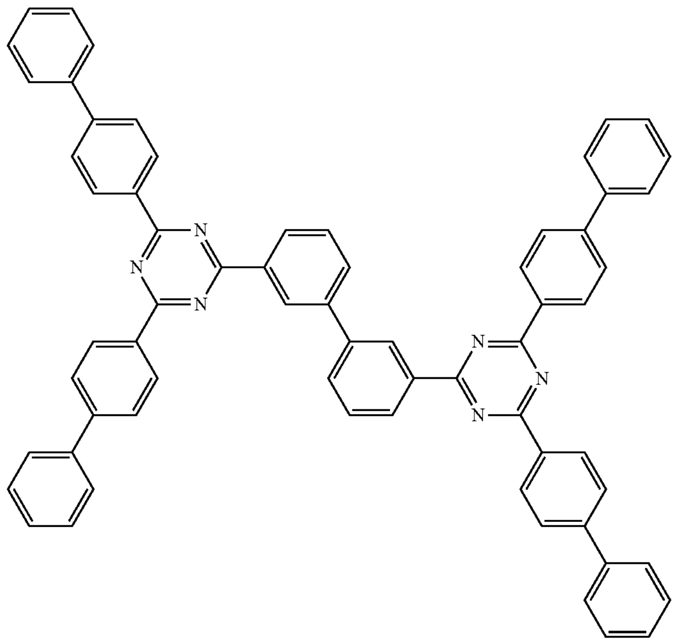
A(14)
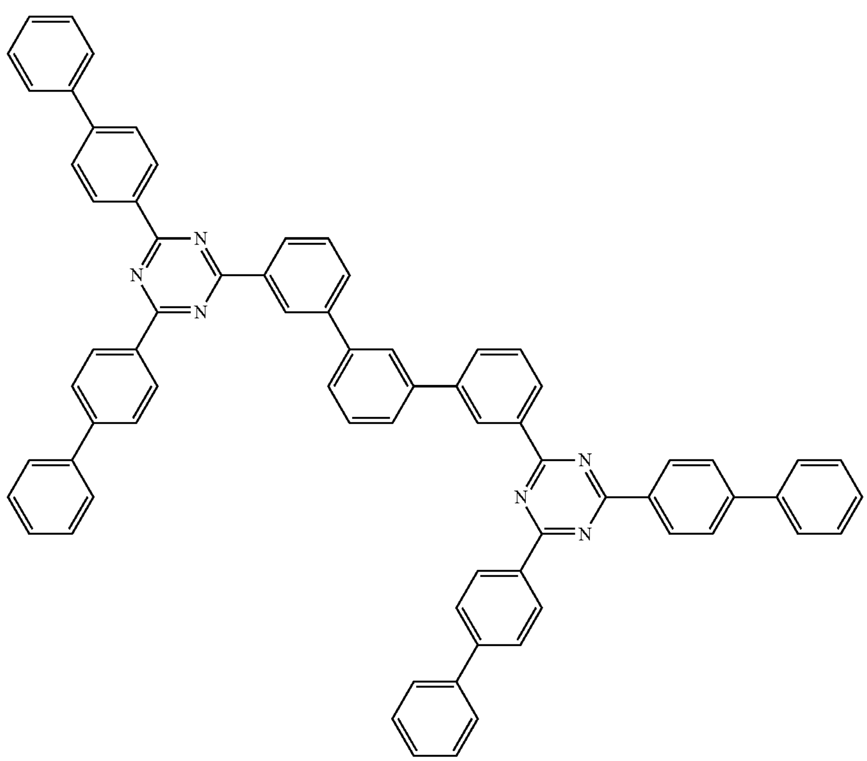

-continued
A(15)
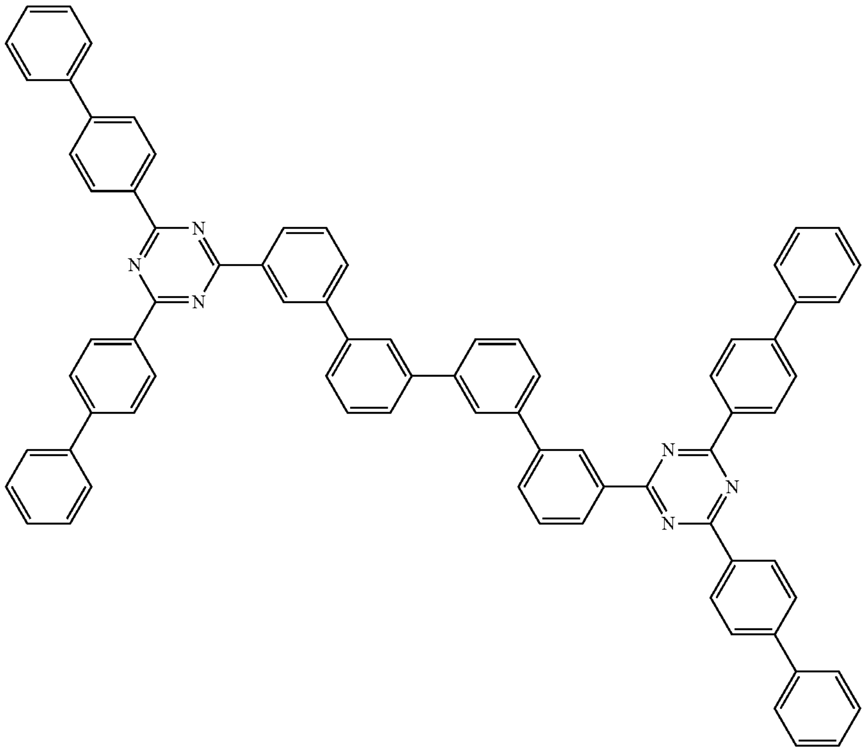
A(16)
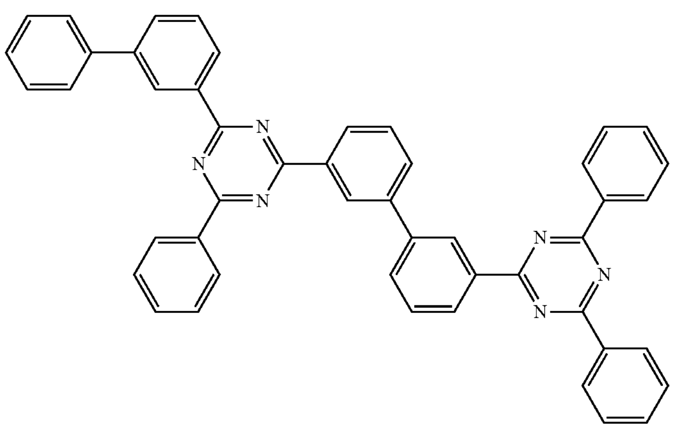

-continued
A(17)
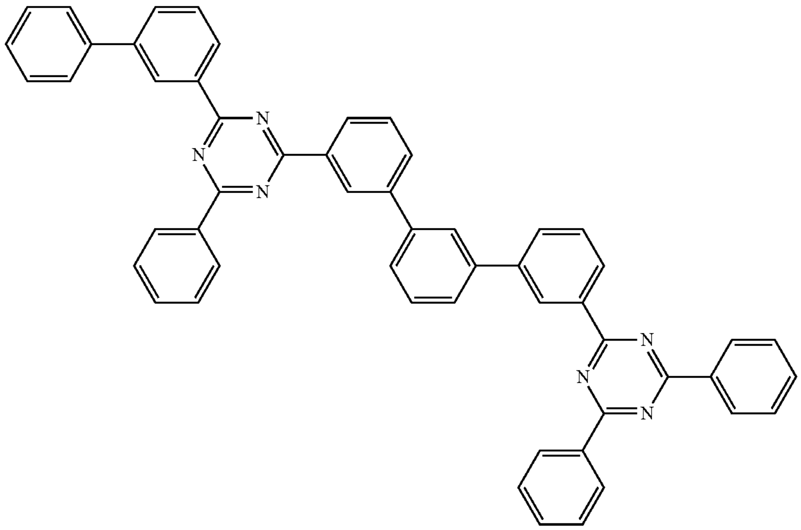
A(18)
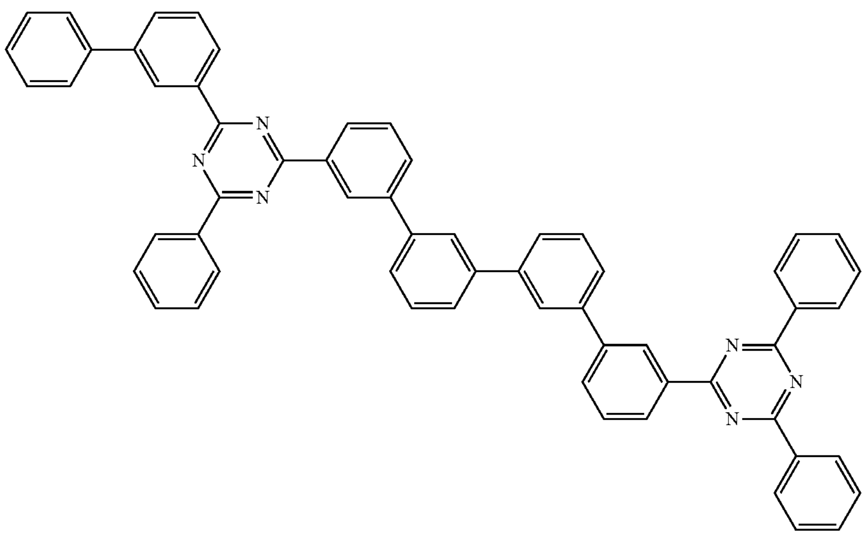
A(19)
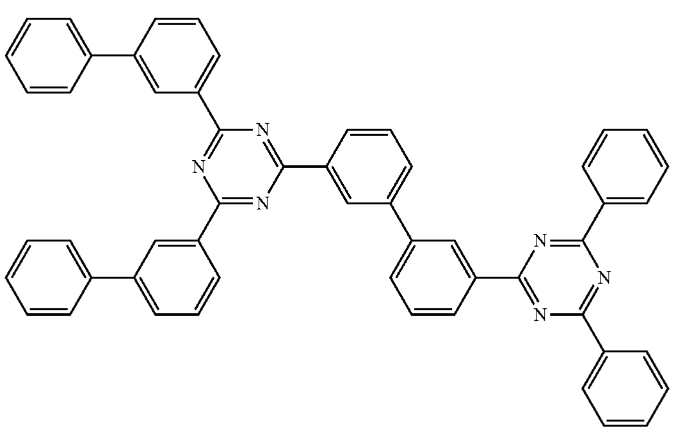

-continued
A(20)
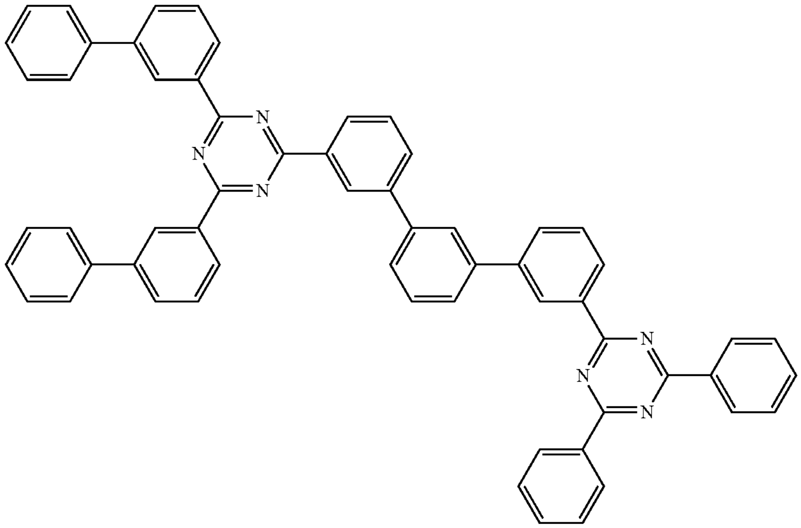
A(21)
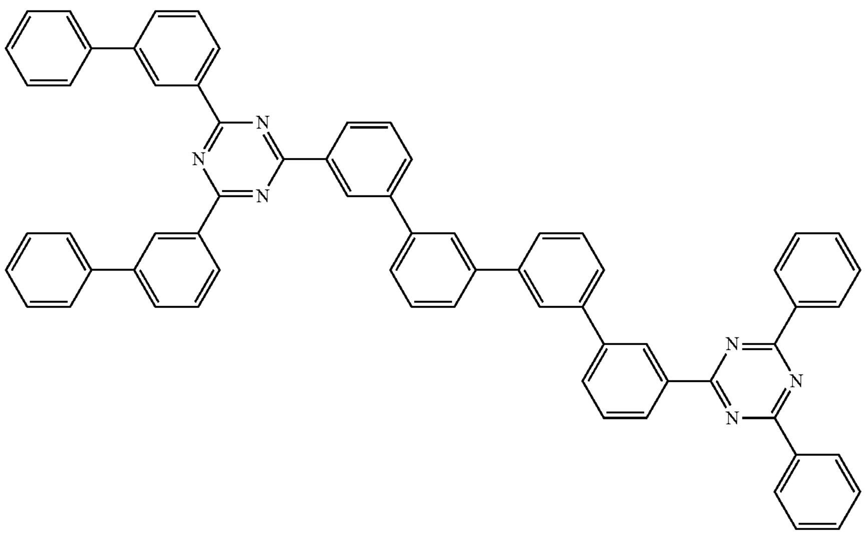
A(22)
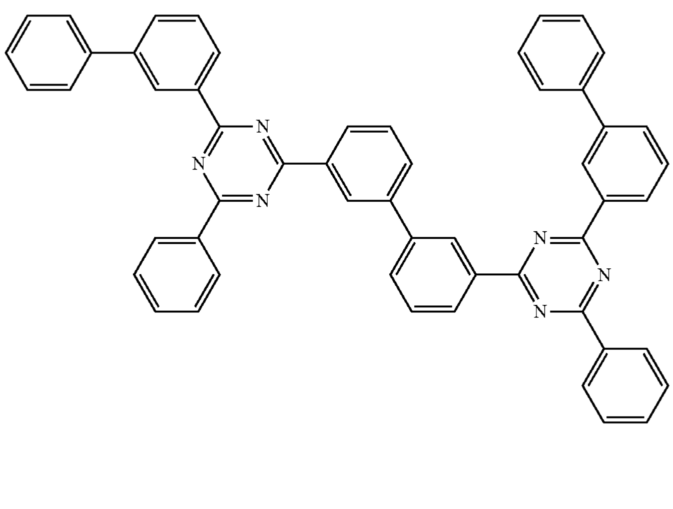

-continued
A(23)
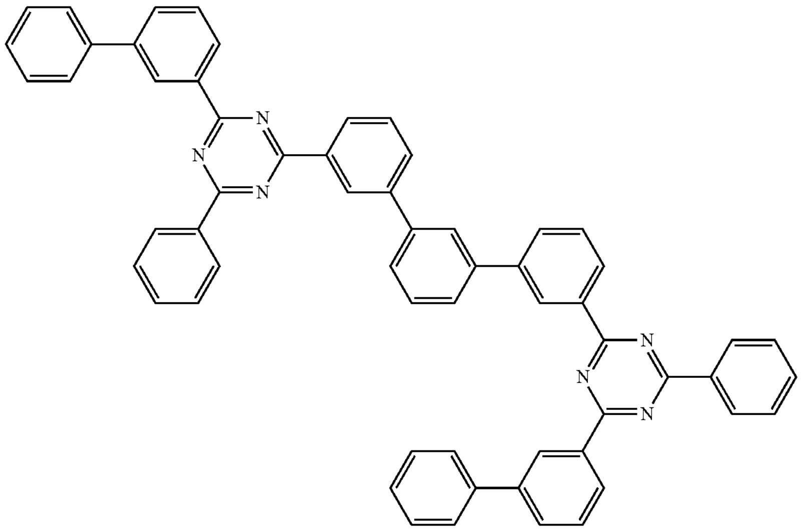
A(24)
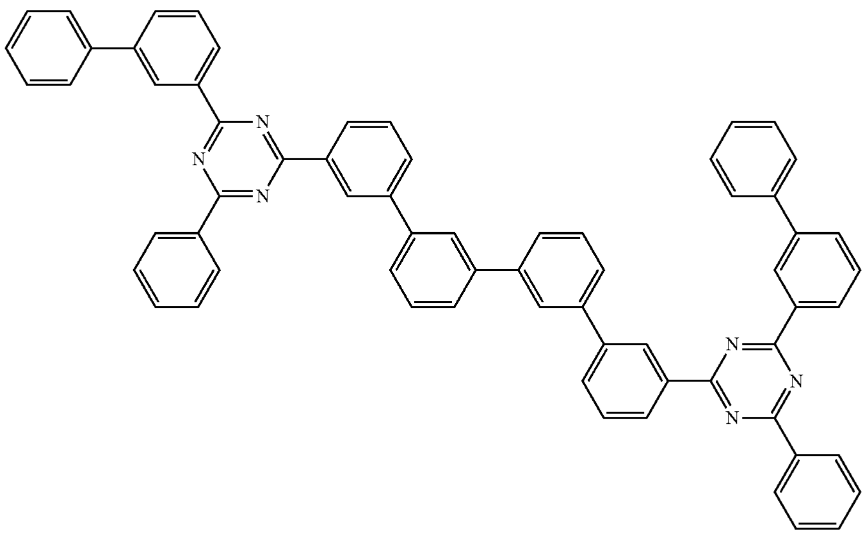
A(25)
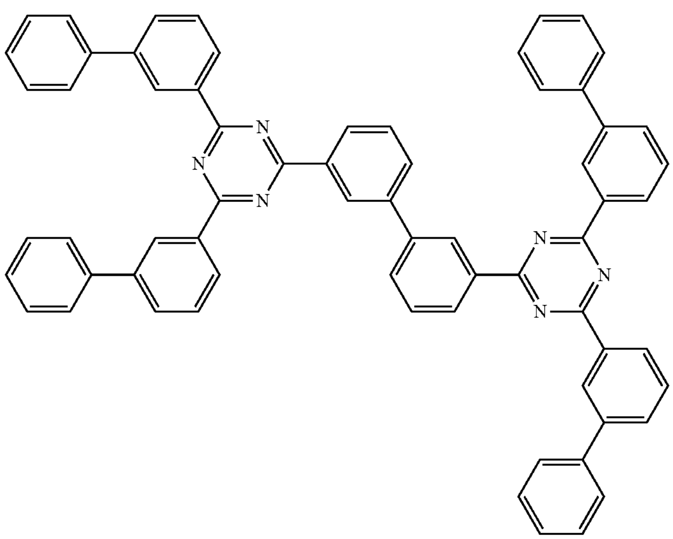

-continued
A(26)
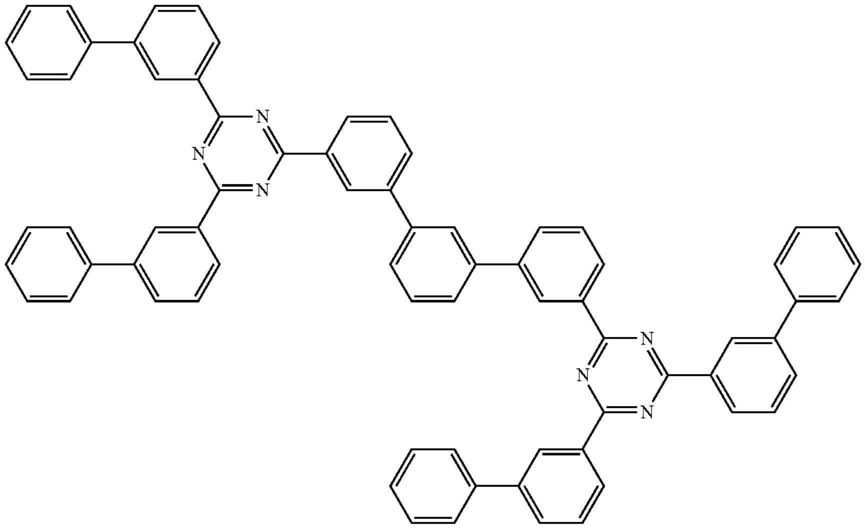
A(27)
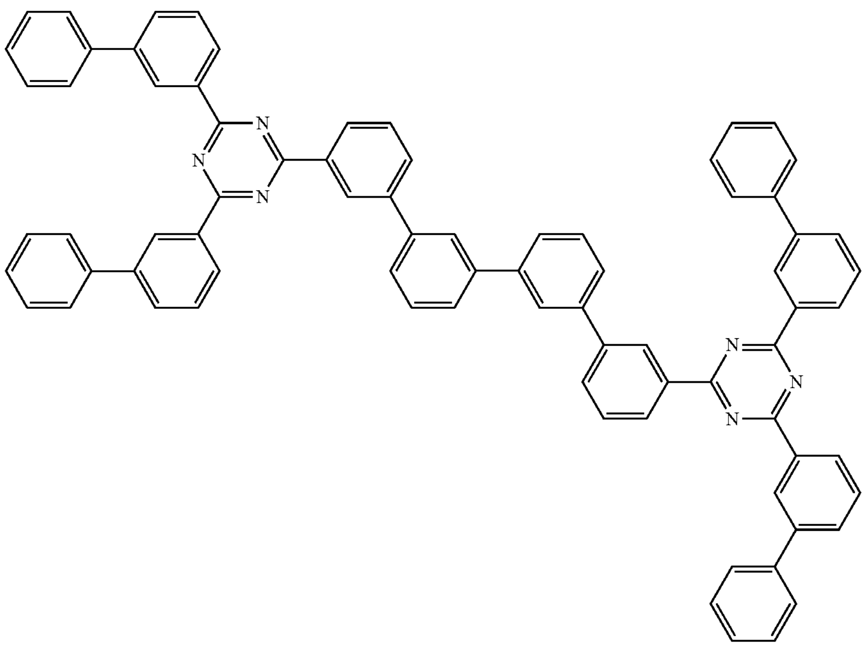
A(28)
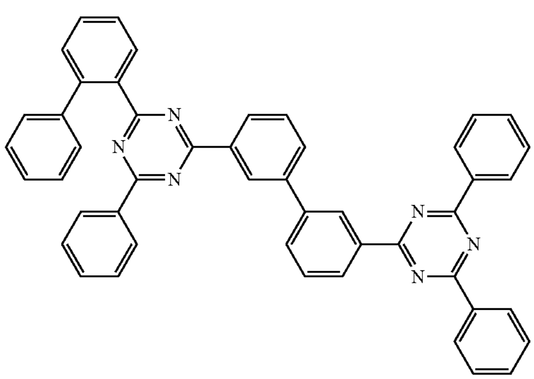
A(29)
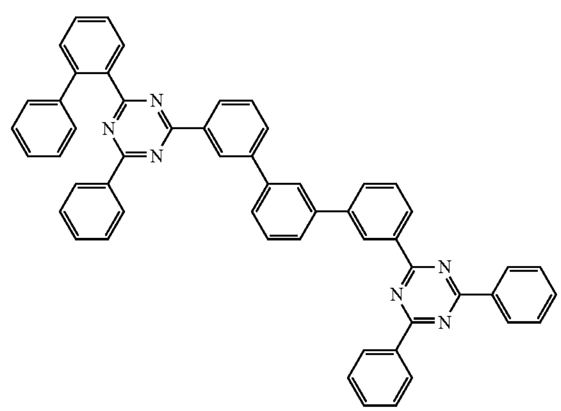

-continued
A(30)
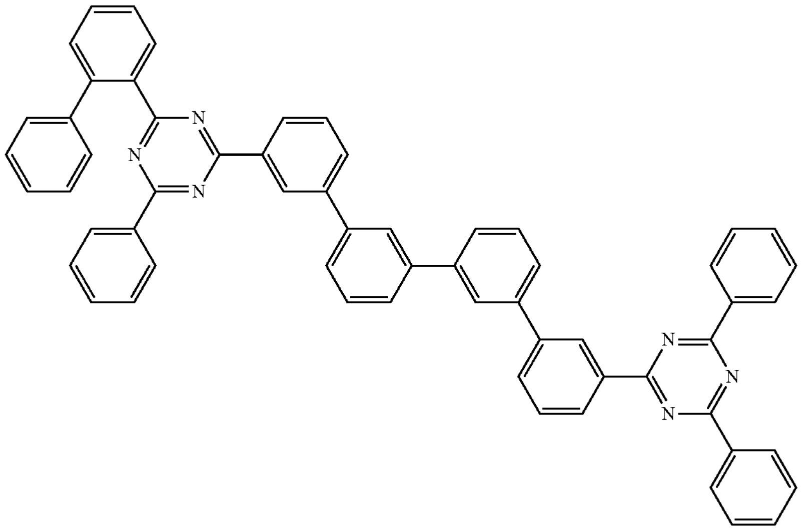
A(31)
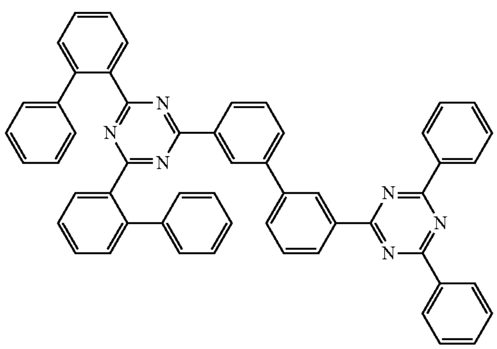
A(32)
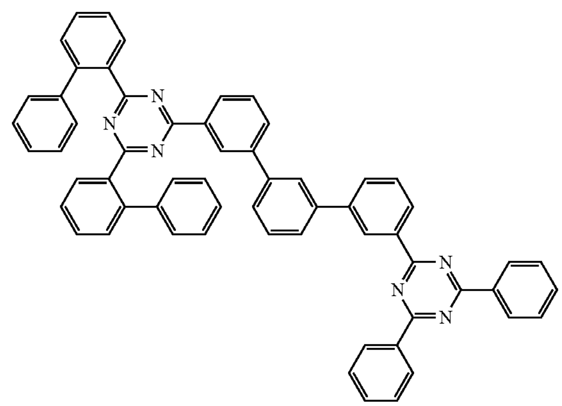
A(33)
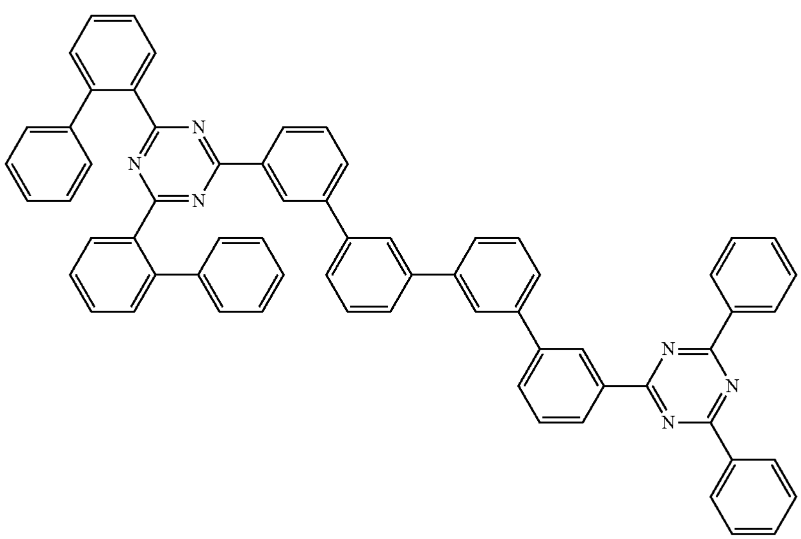

-continued
A(34)
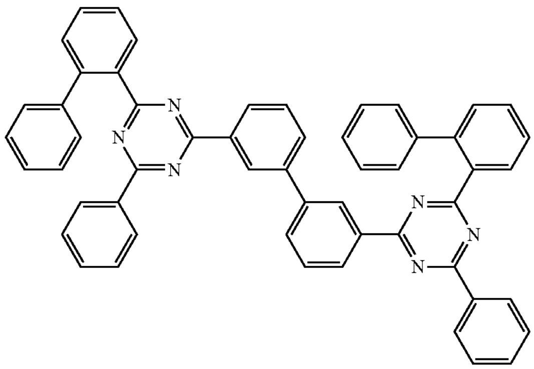
A(35)
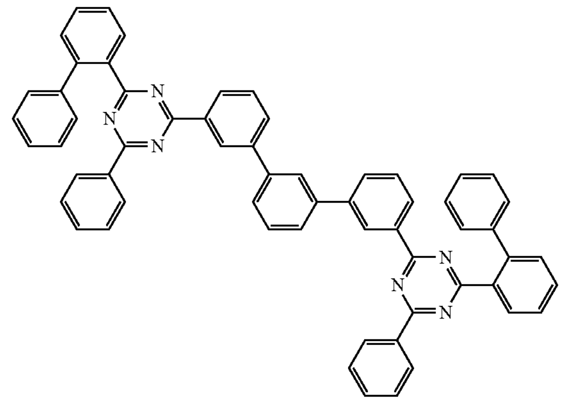
A(36)
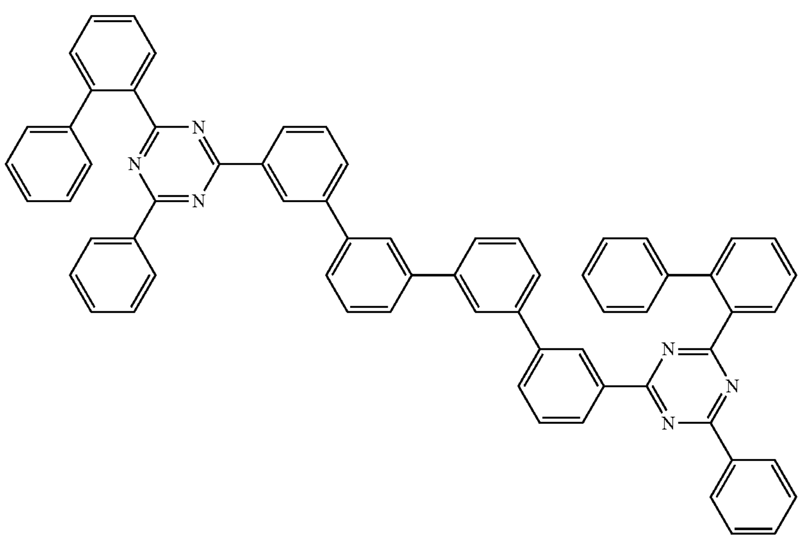
A(37)
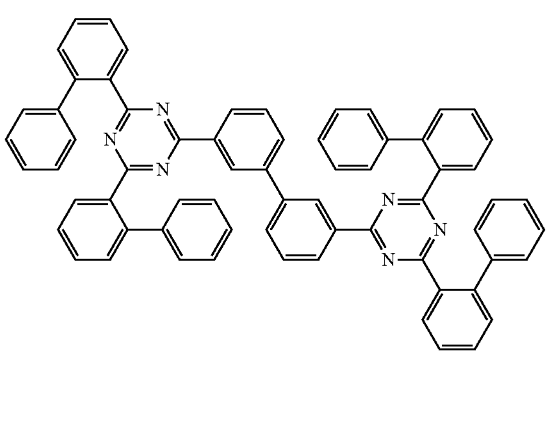
A(38)
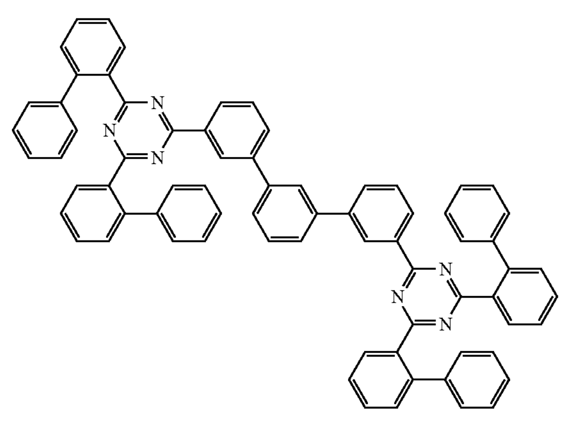

-continued
A(39)
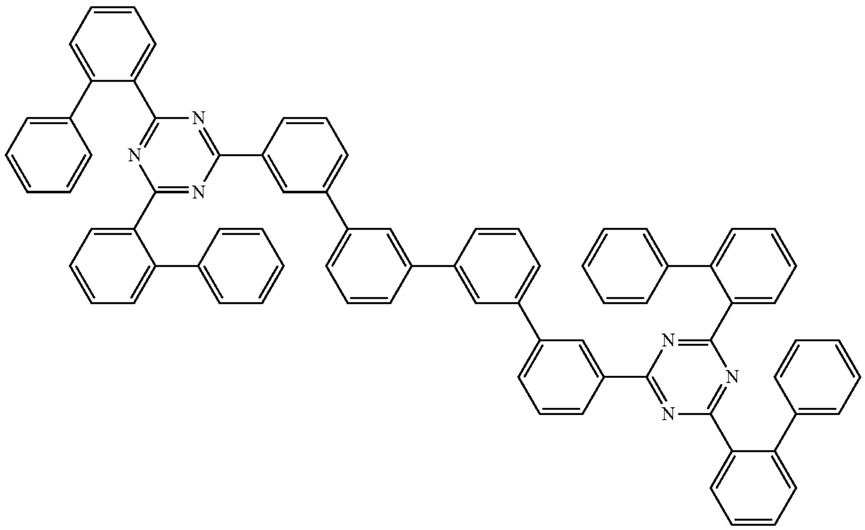
A(40)
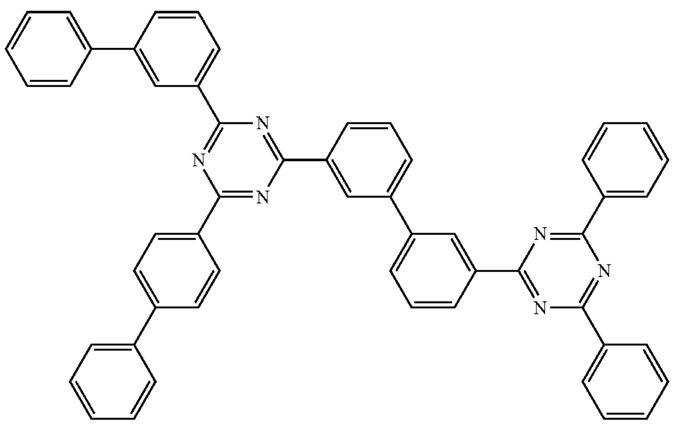
A(41)
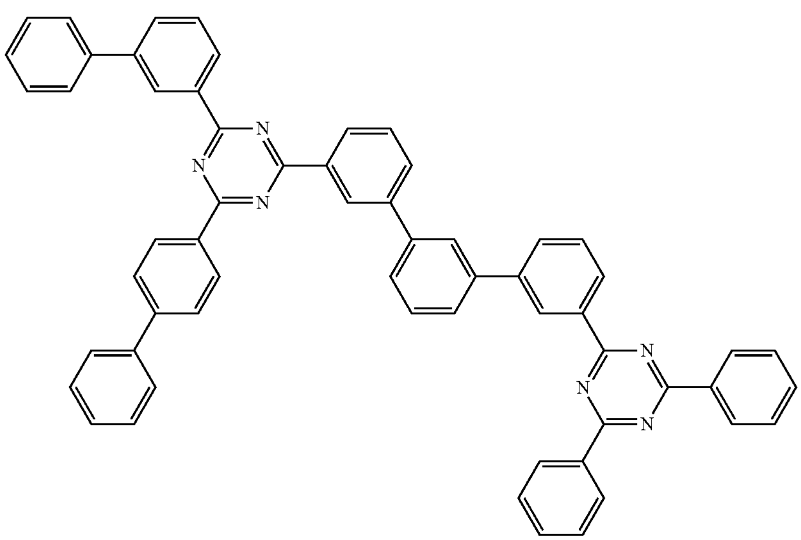

-continued
A(42)
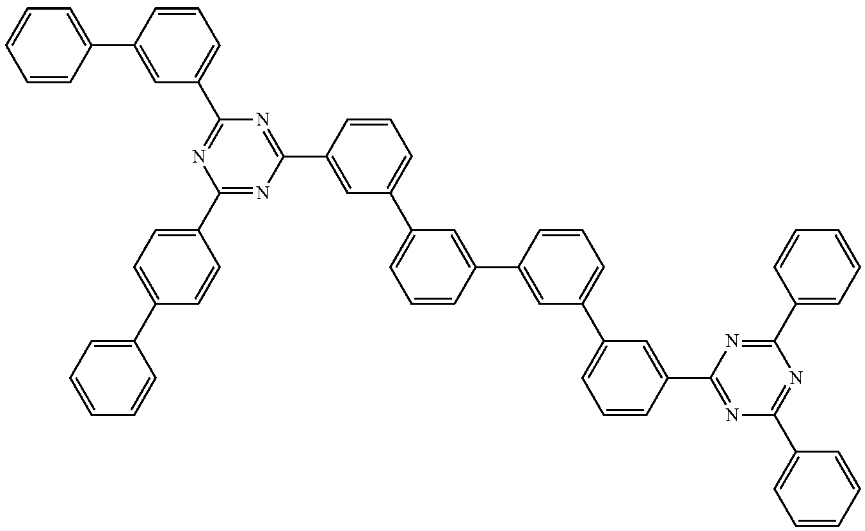
A(43)
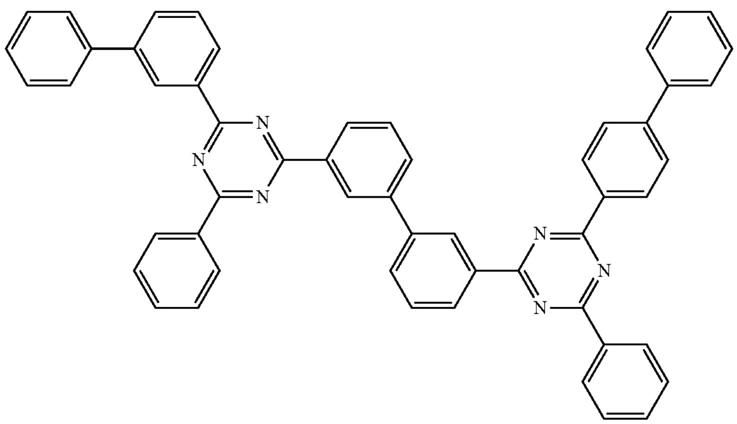
A(44)
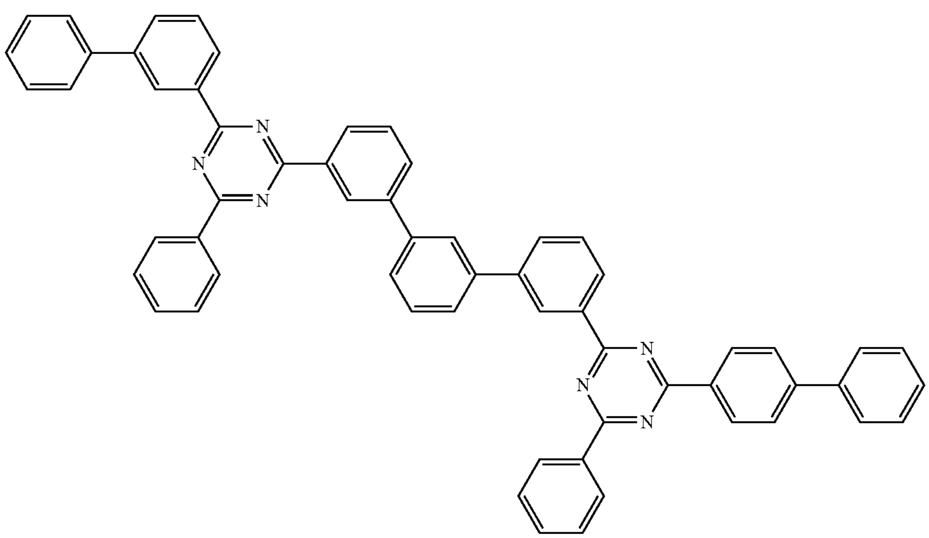

-continued
A(45)
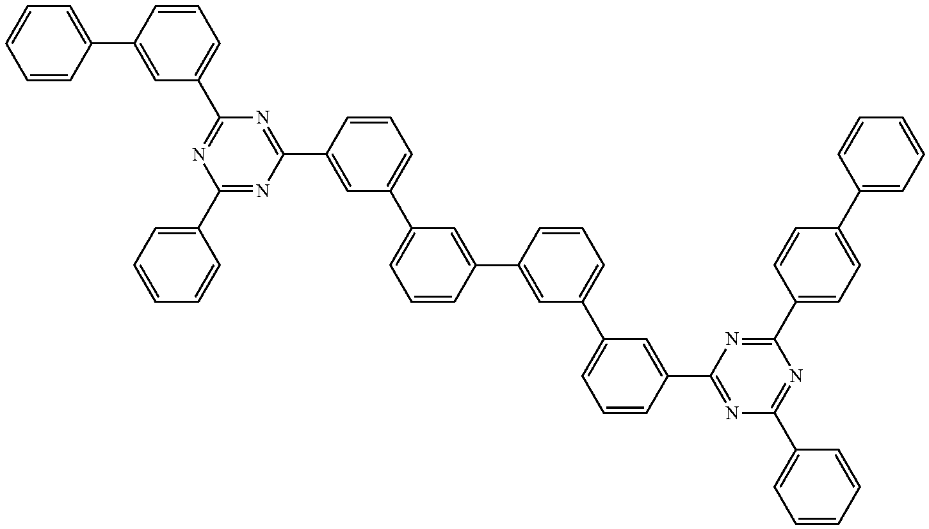
A(46)
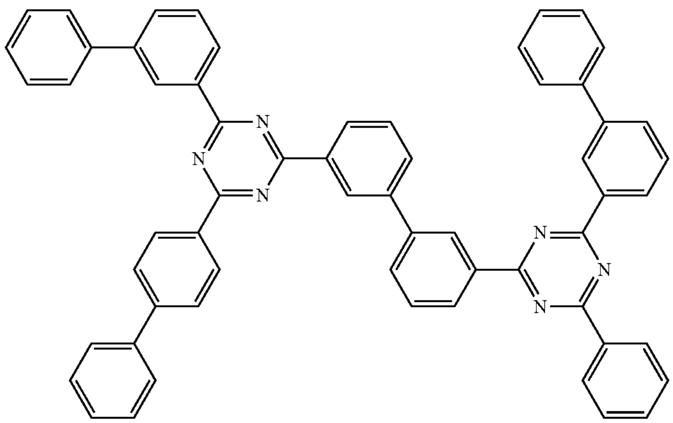
A(47)
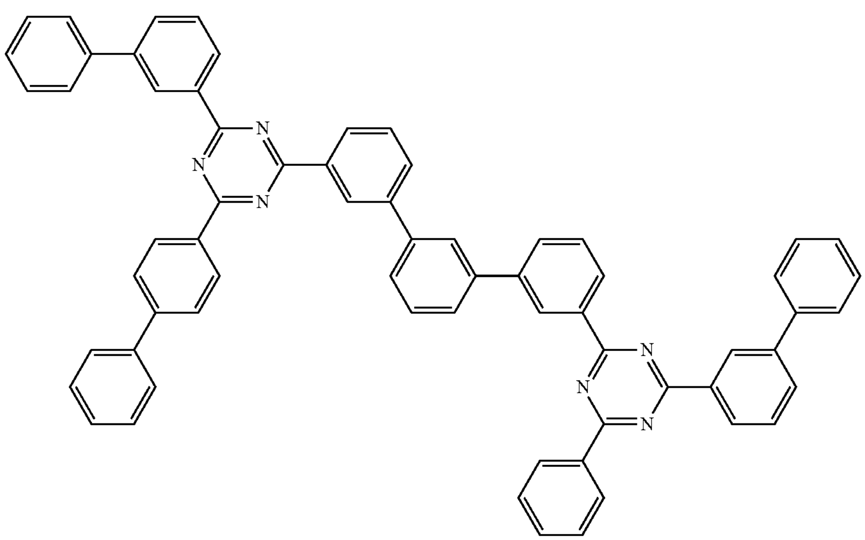

-continued
A(48)
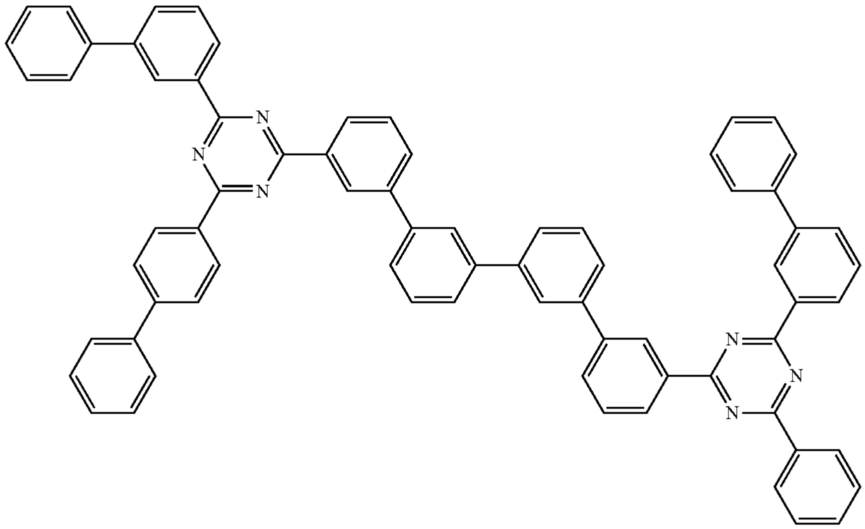
A(49)
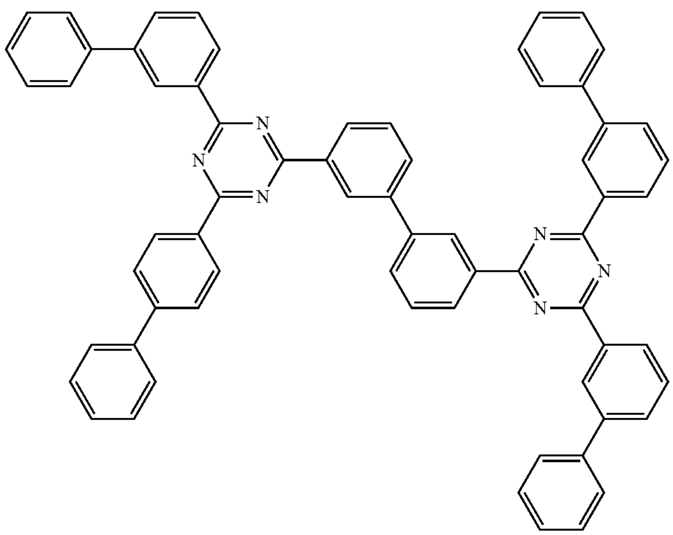
A(50)
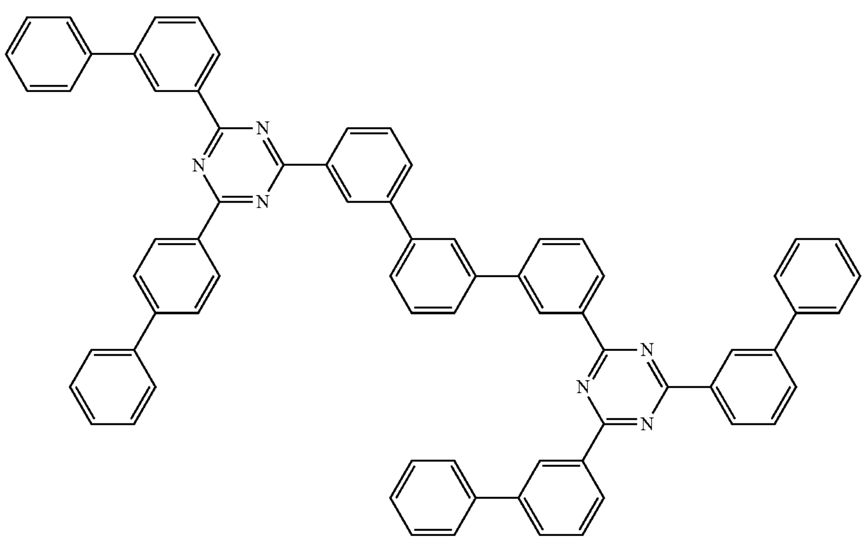

-continued
A(51)
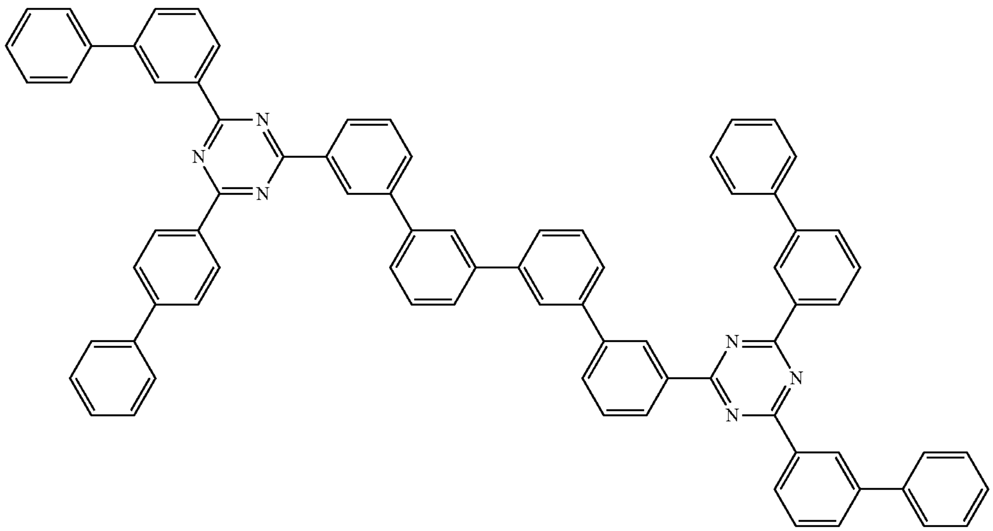
A(52)
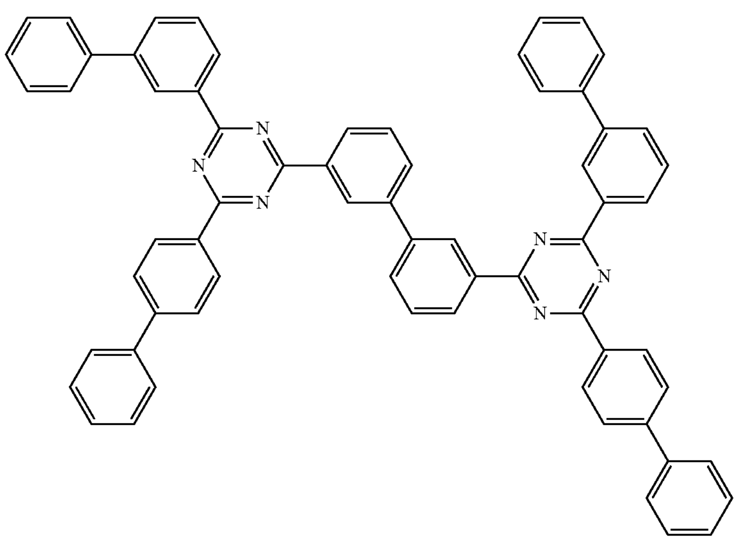

-continued
A(53)
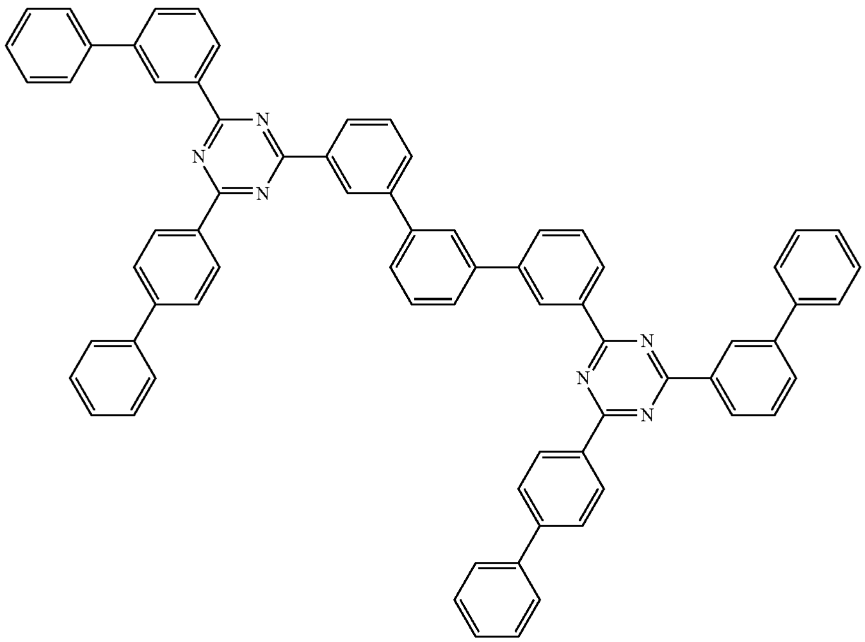
A(54)
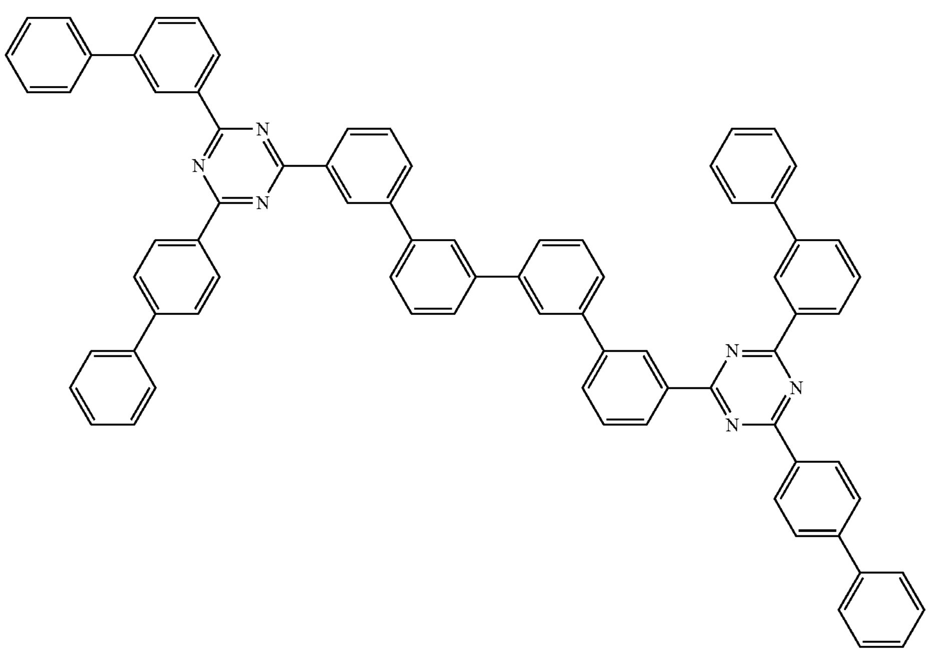

-continued
A(55)
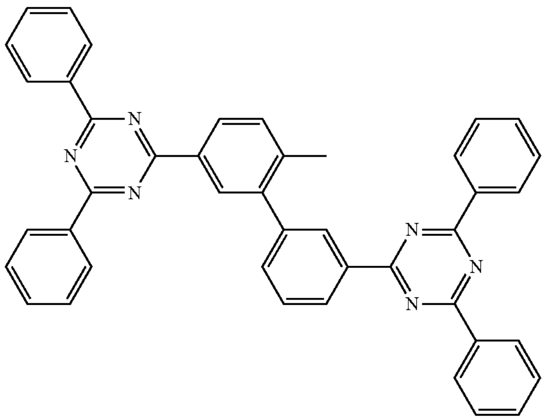
A(56)
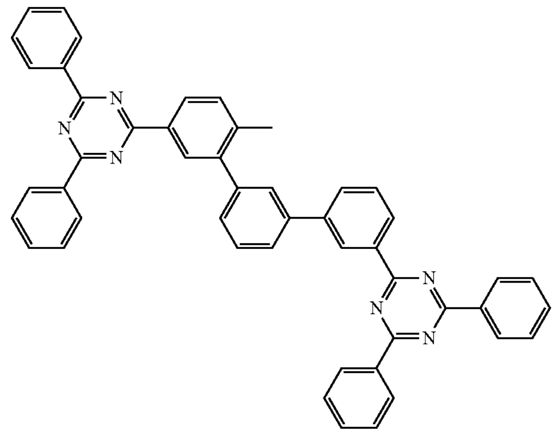
A(57)
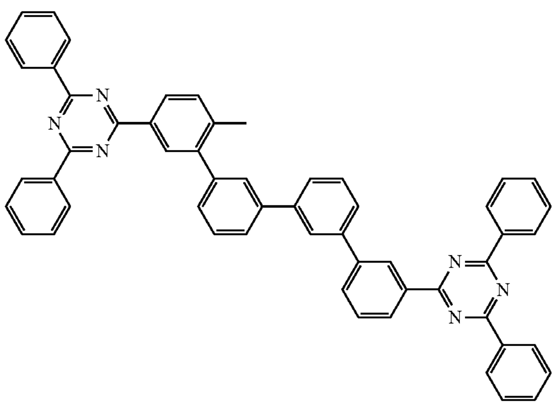
A(58)
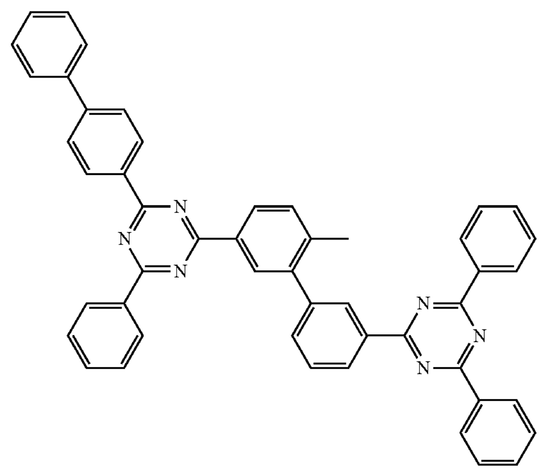
A(59)
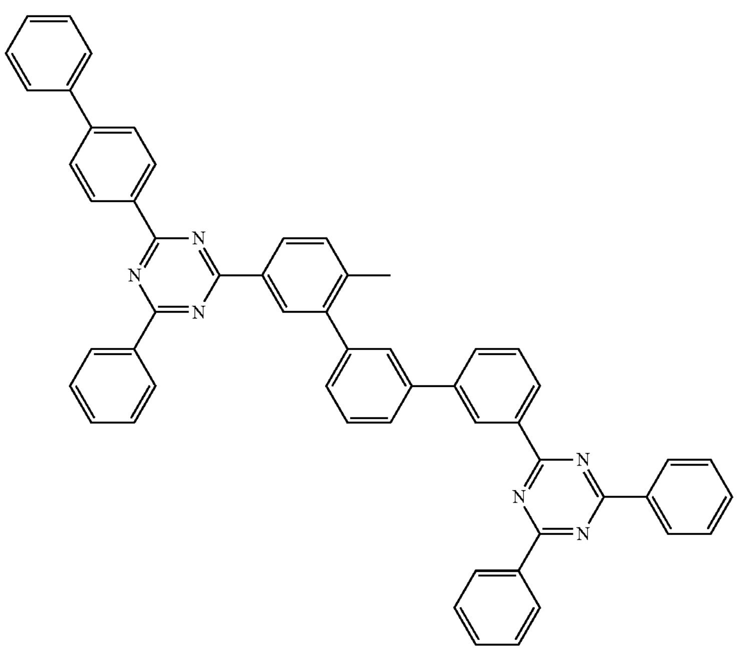

-continued
A(60)
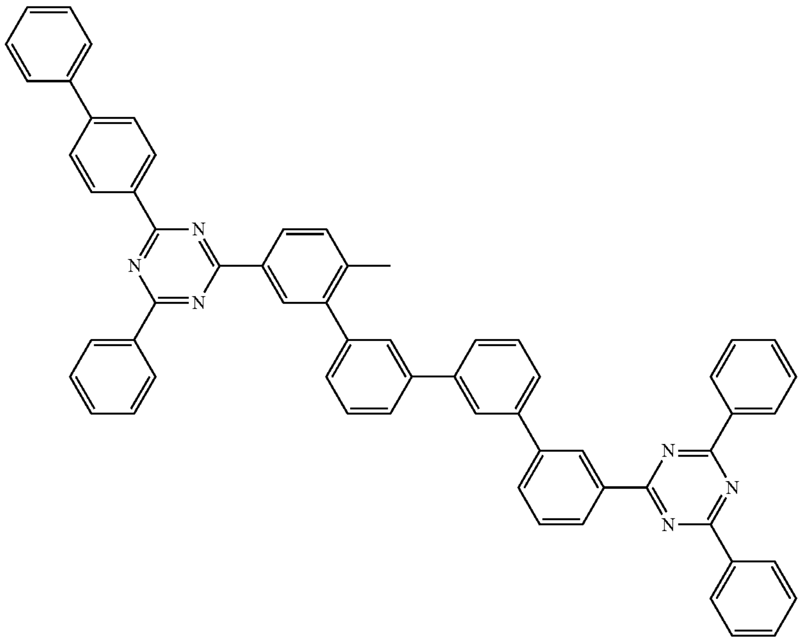
A(61)
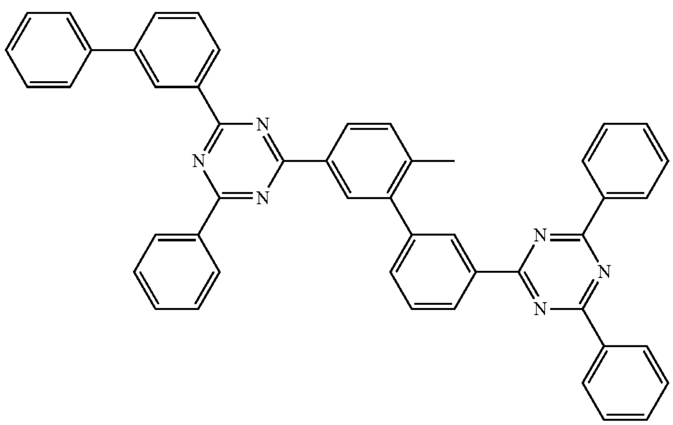
A(62)
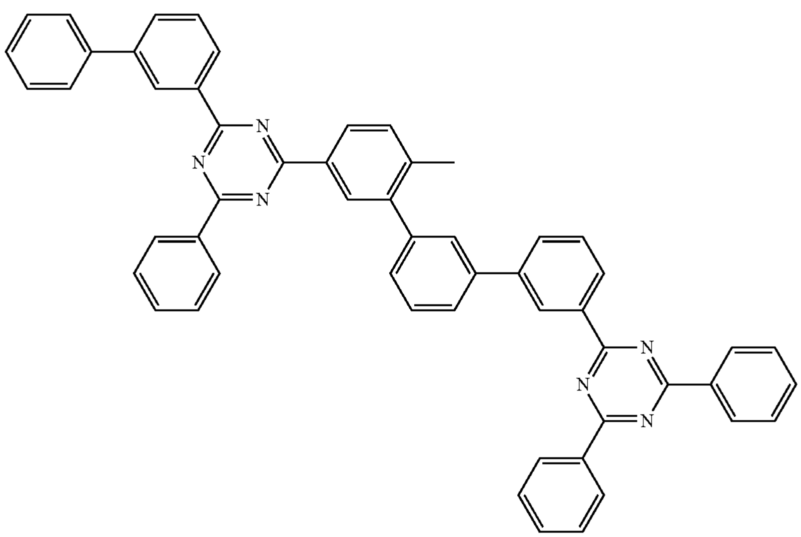

-continued
A(63)
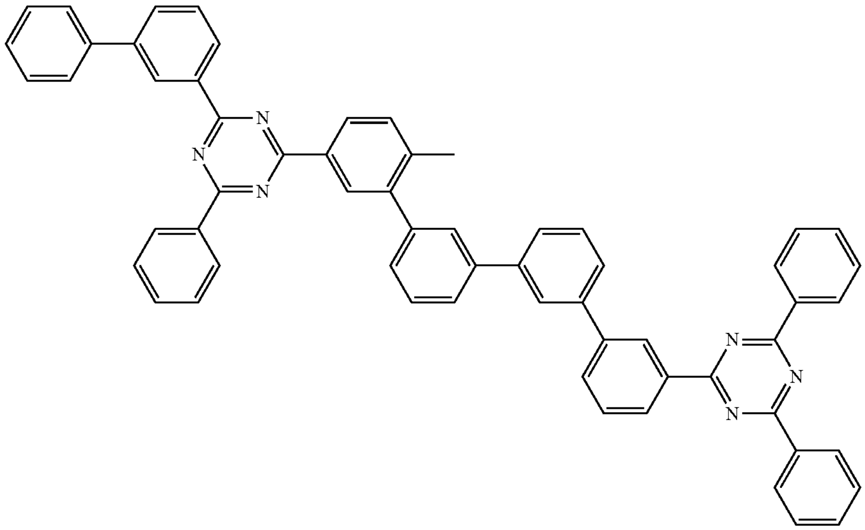
A(64)
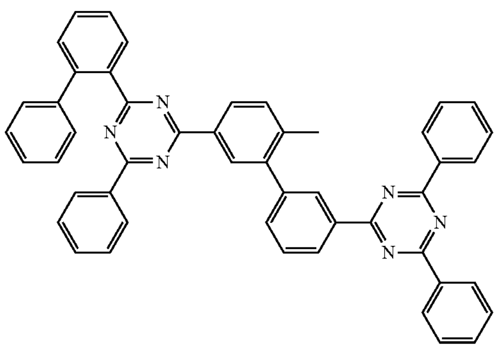
A(65)
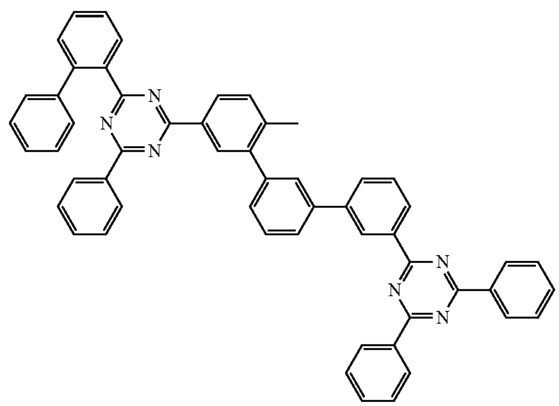
A(66)
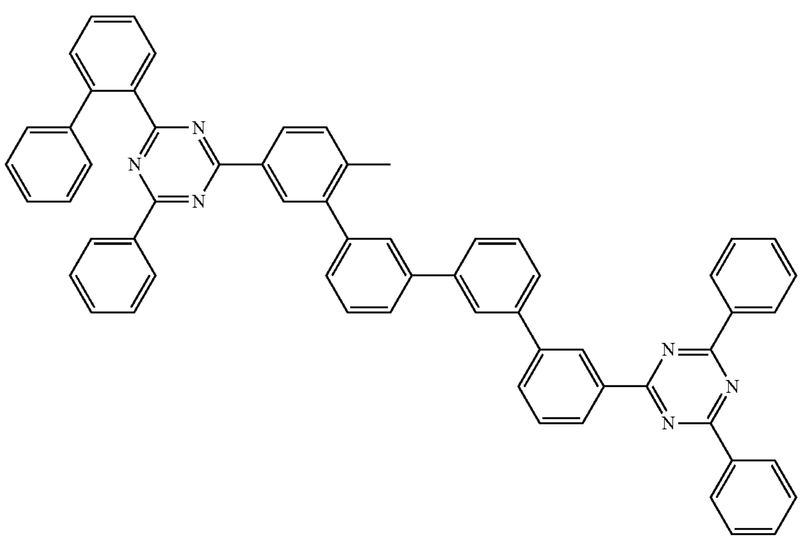

-continued
A(67)
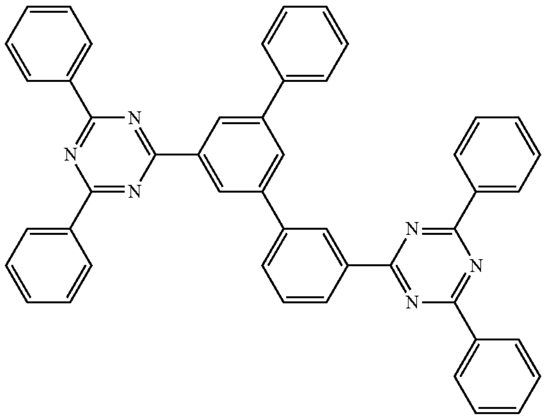
A(68)
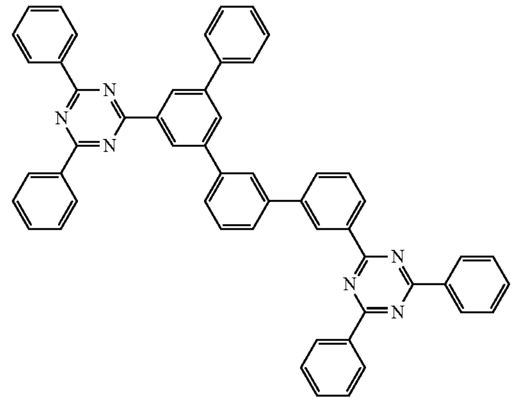
A(69)
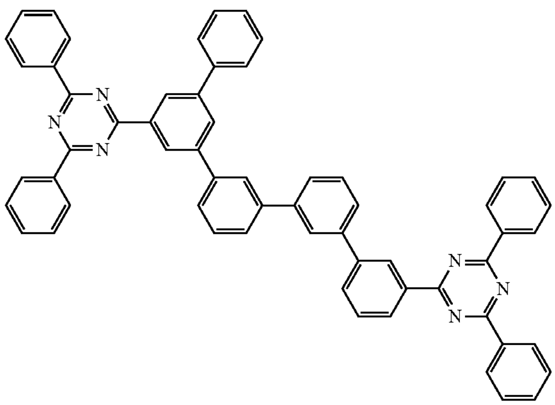
(A70)
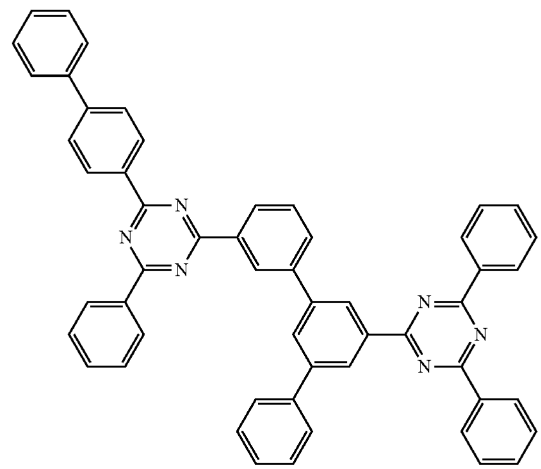
A(71)
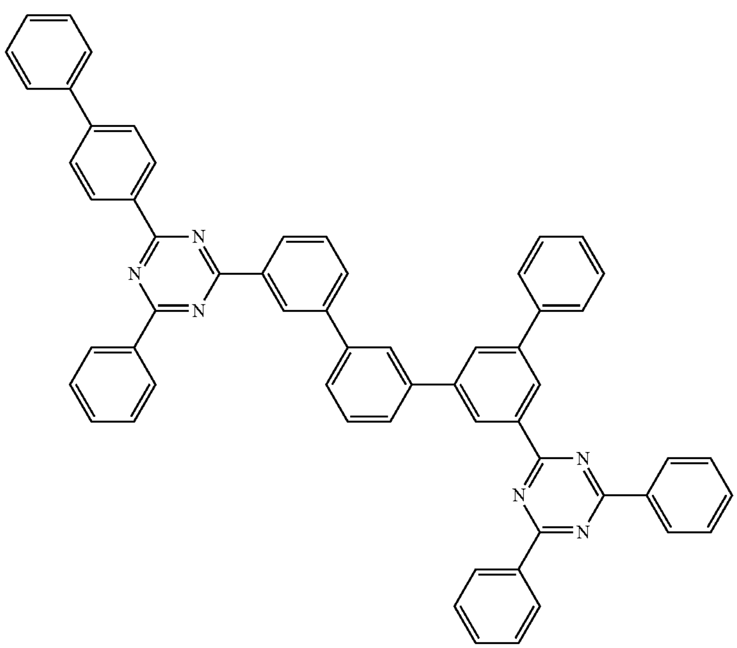

-continued
A(72)
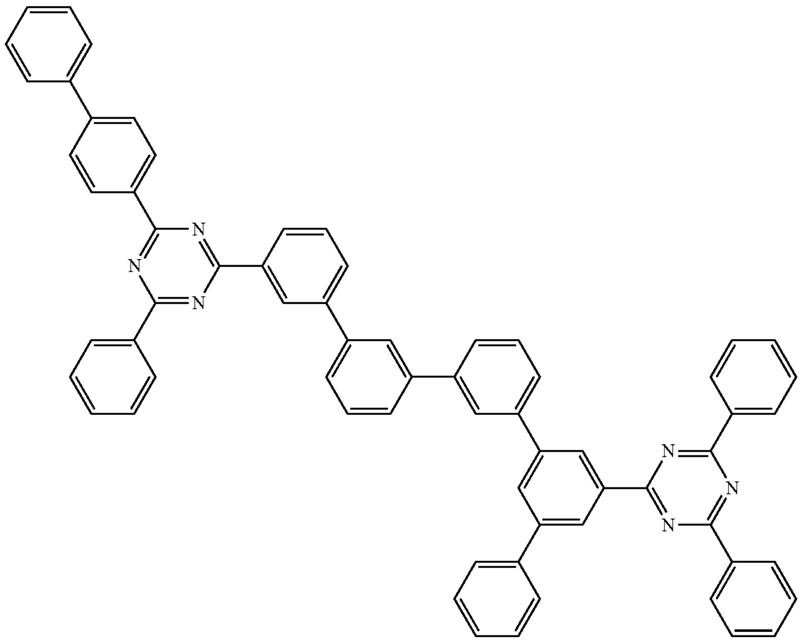
A(73)
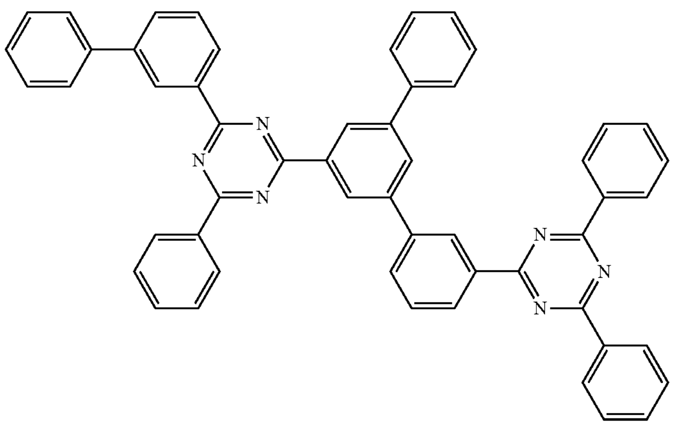
A(74)
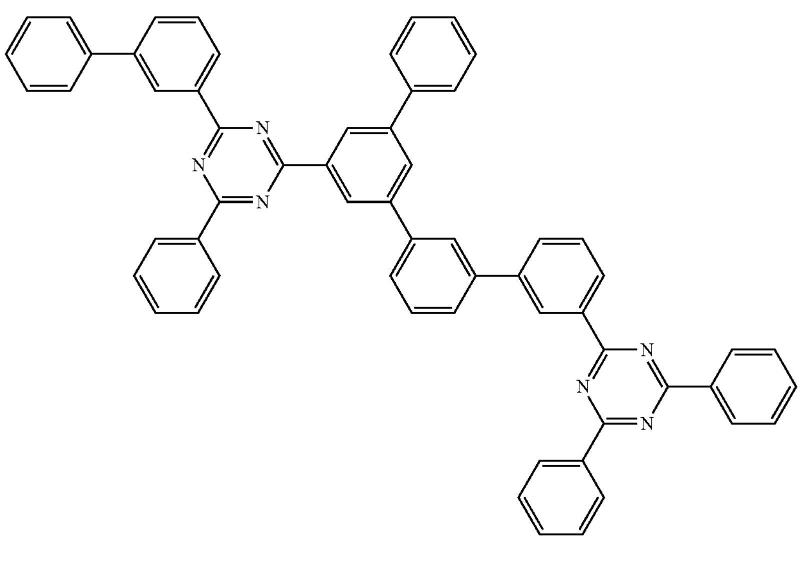

-continued
A(75)
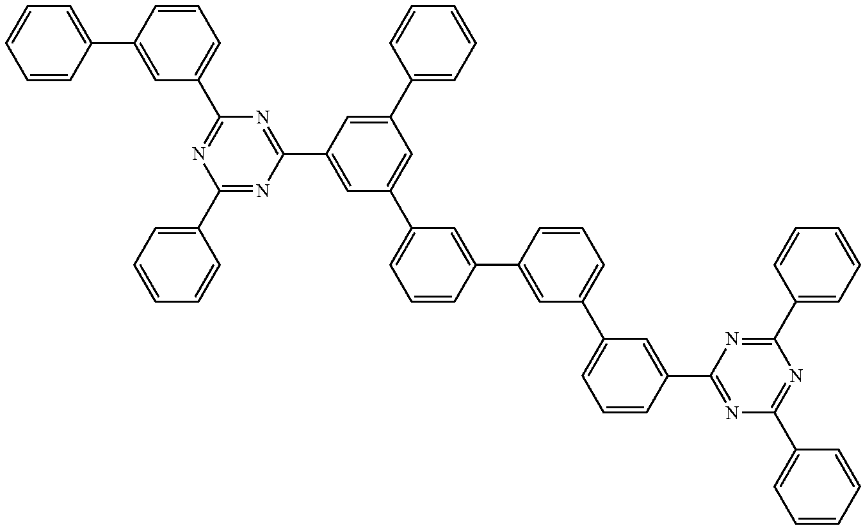
A(76)
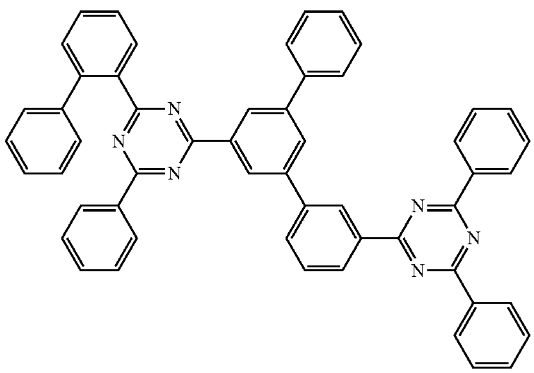
A(77)
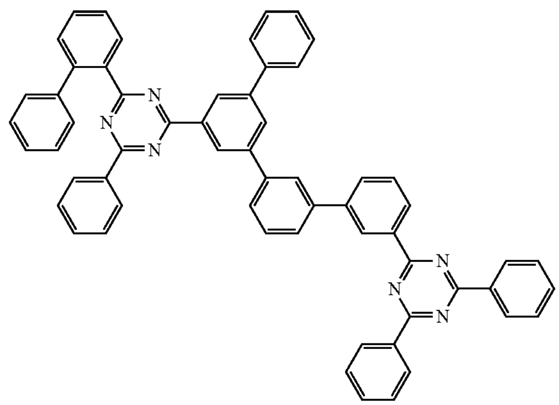
A(78)
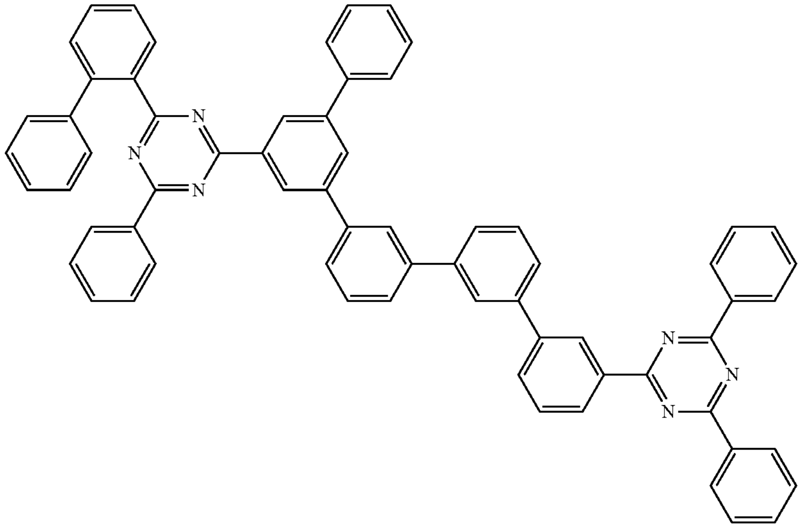

-continued
A(79)
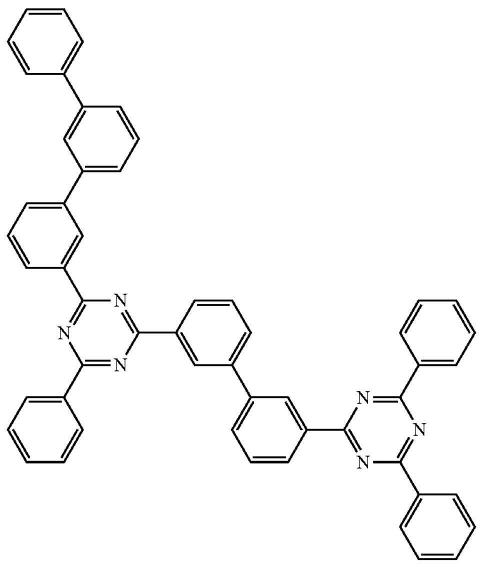
A(80)
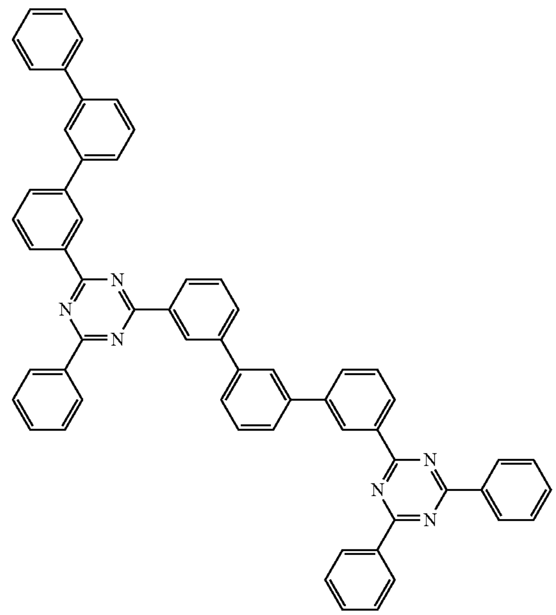
A(81)
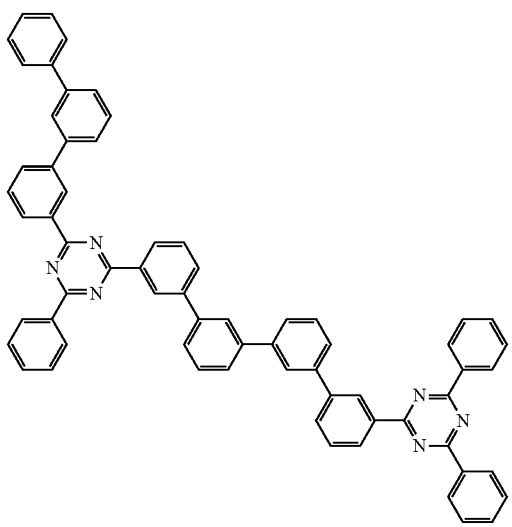
A(82)
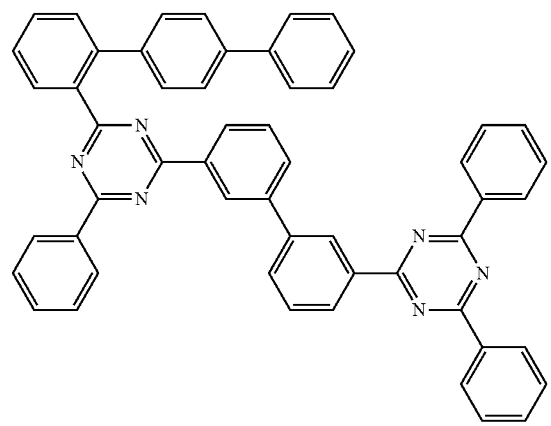
A(83)
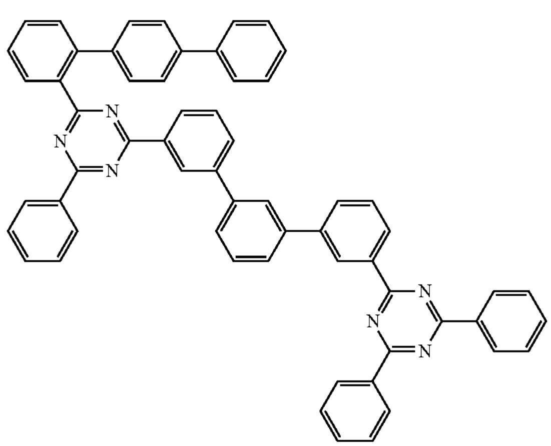
A(84)
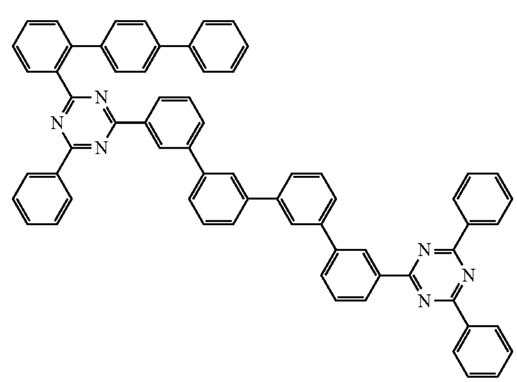

-continued
A(85)
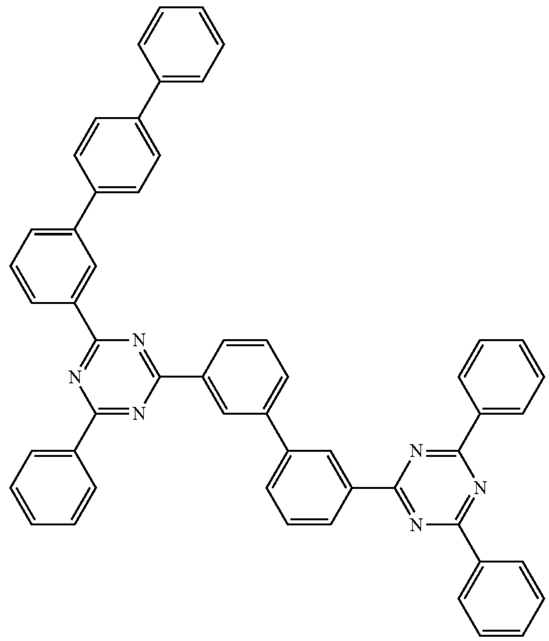
A(86)
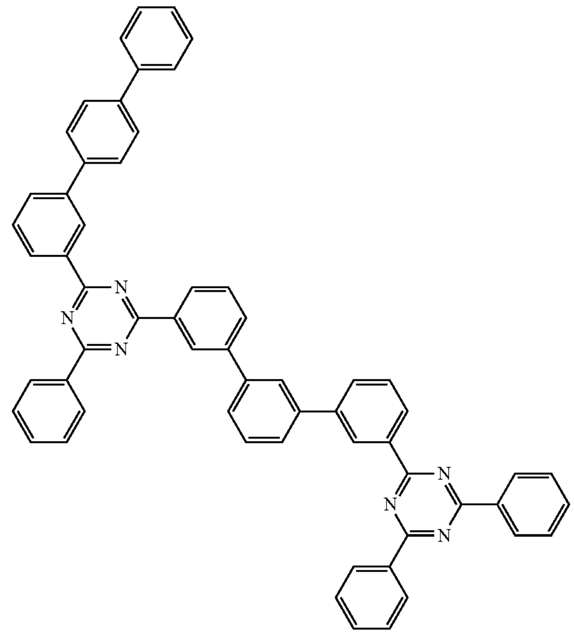
A(87)
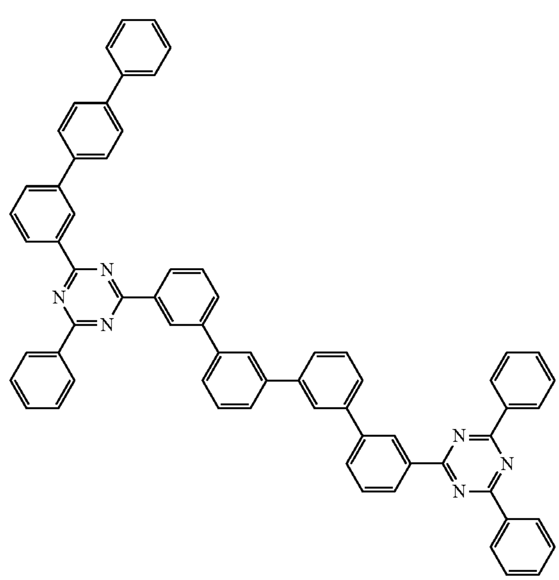
A(88)
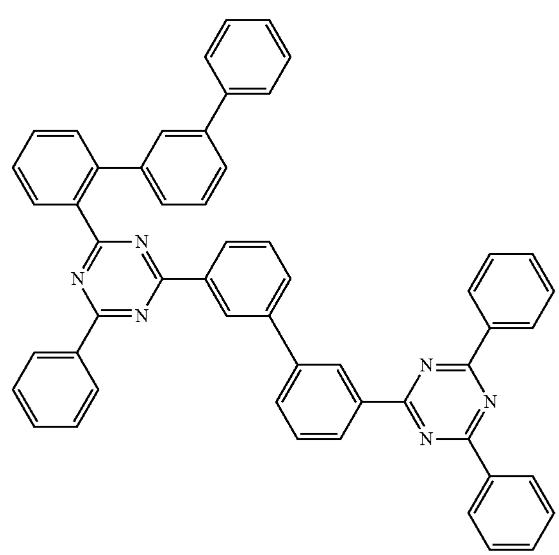

-continued
A(89)
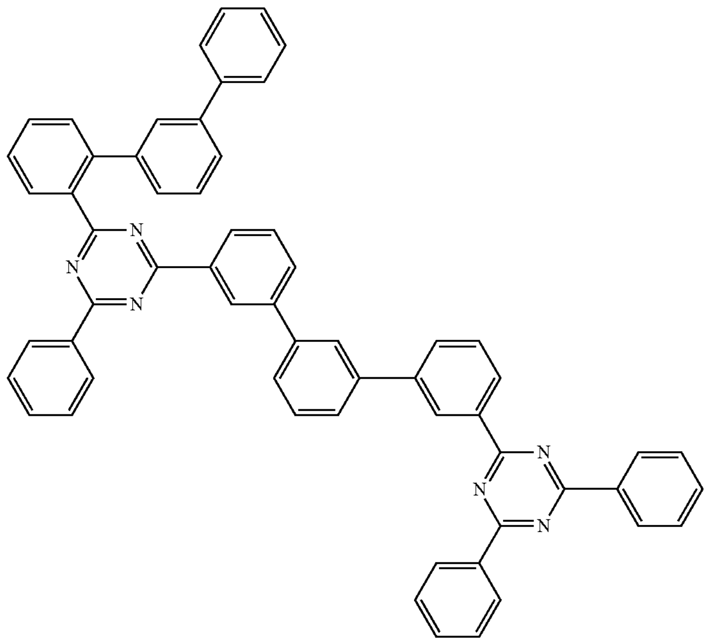
A(90)
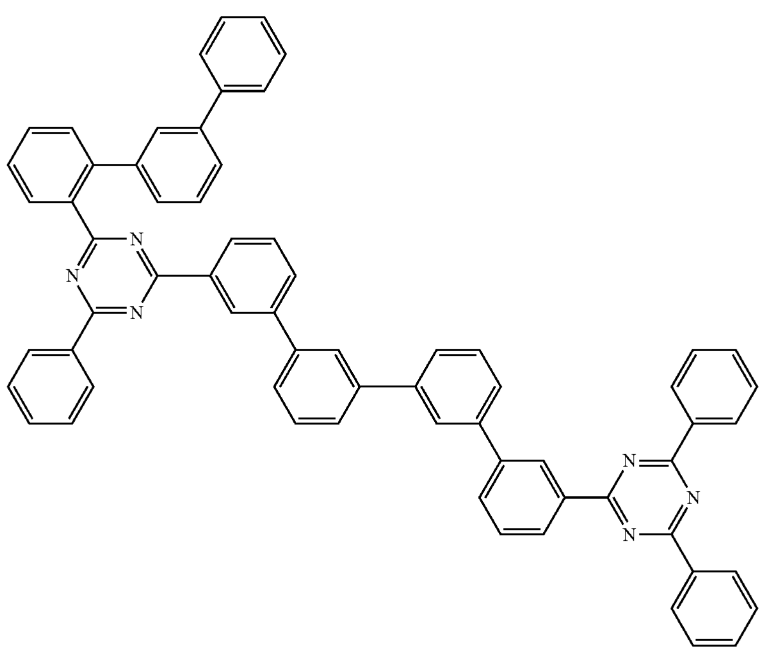

-continued
A(91)
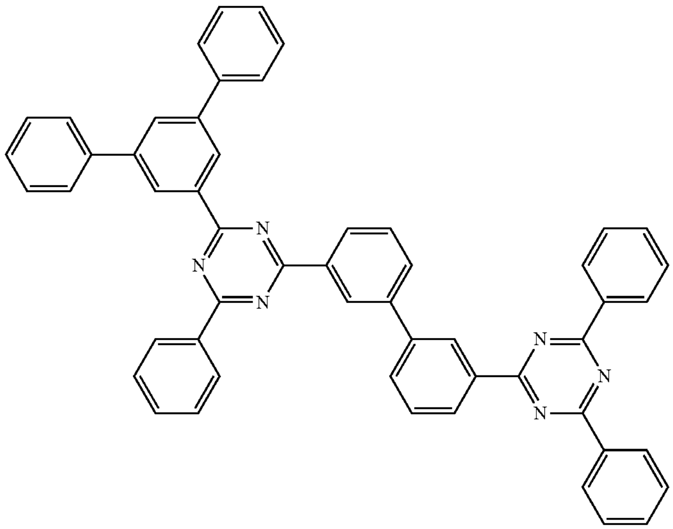
A(92)
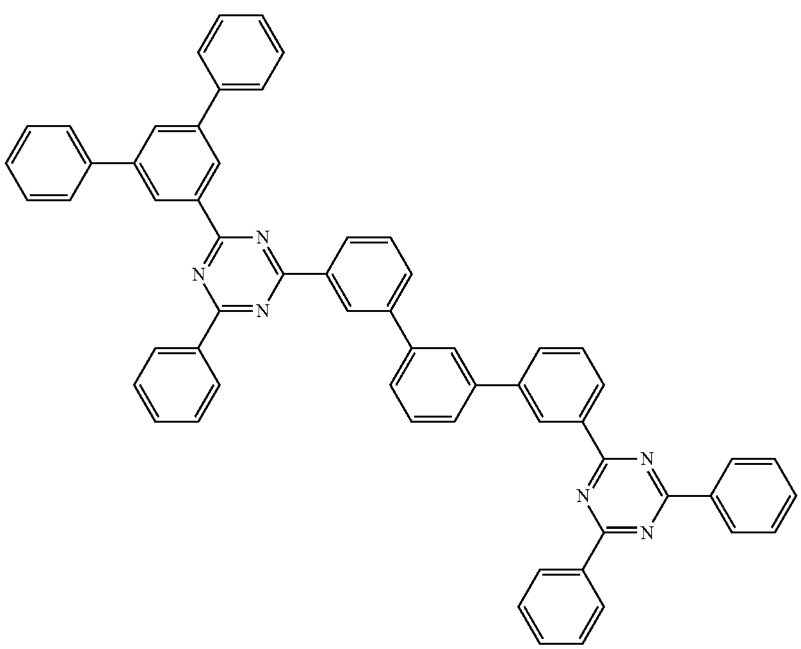

-continued
A(93)
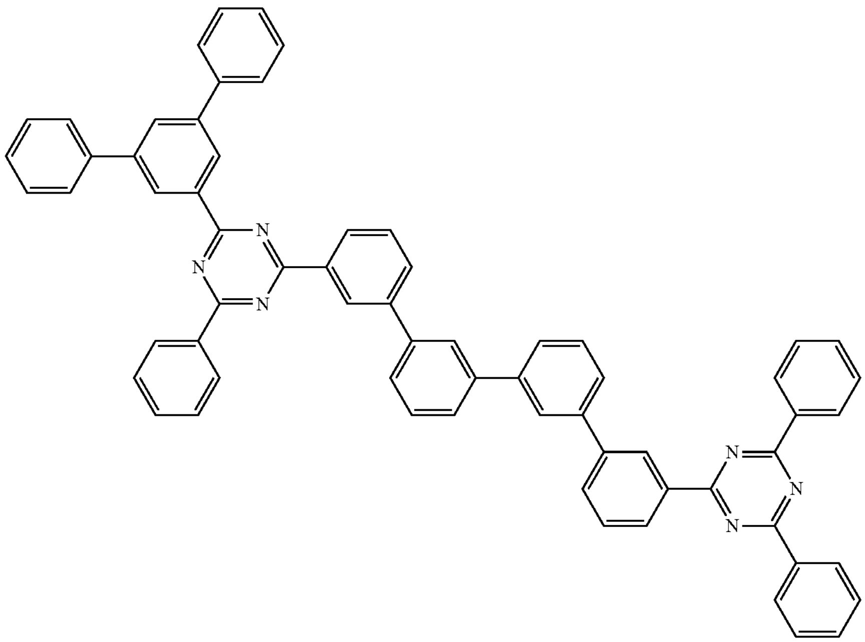
A(94)
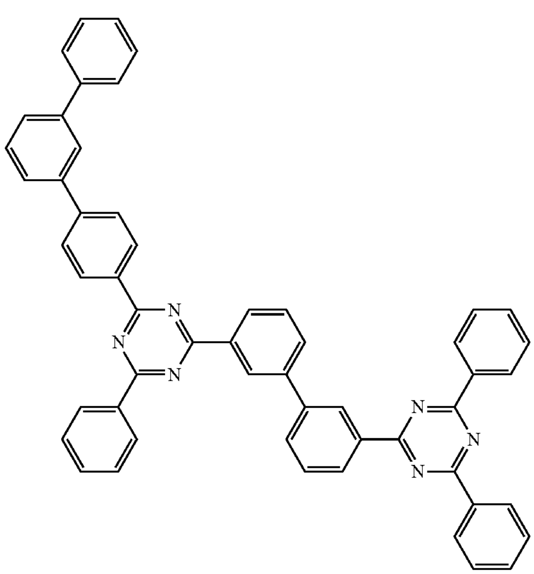
A(95)
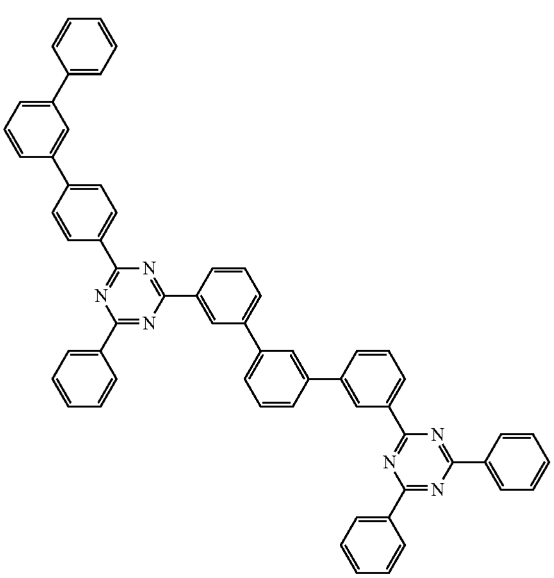

-continued
A(96)
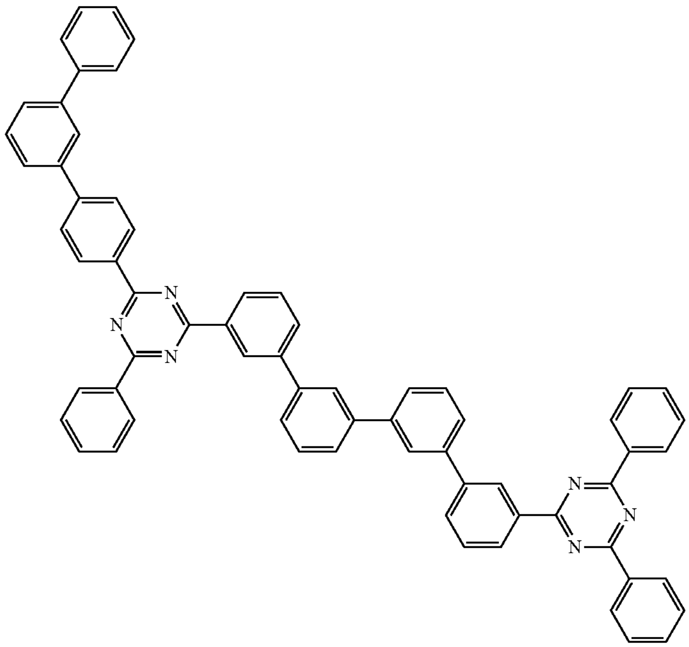
A(97)
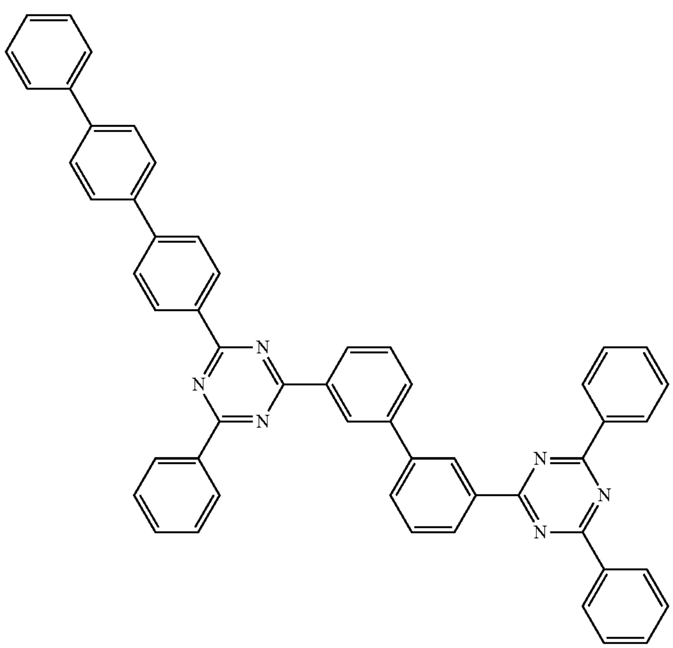

-continued
A(98)
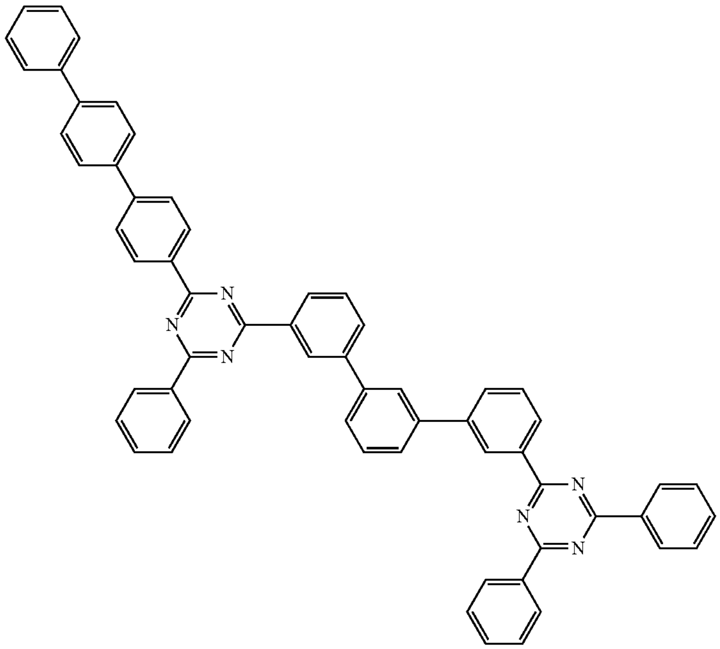
A(99)
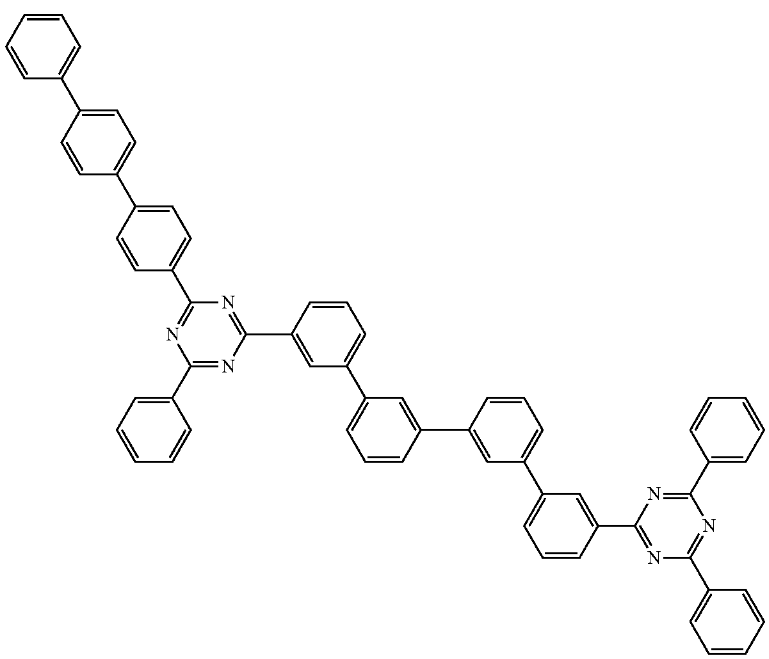

-continued
A(100)
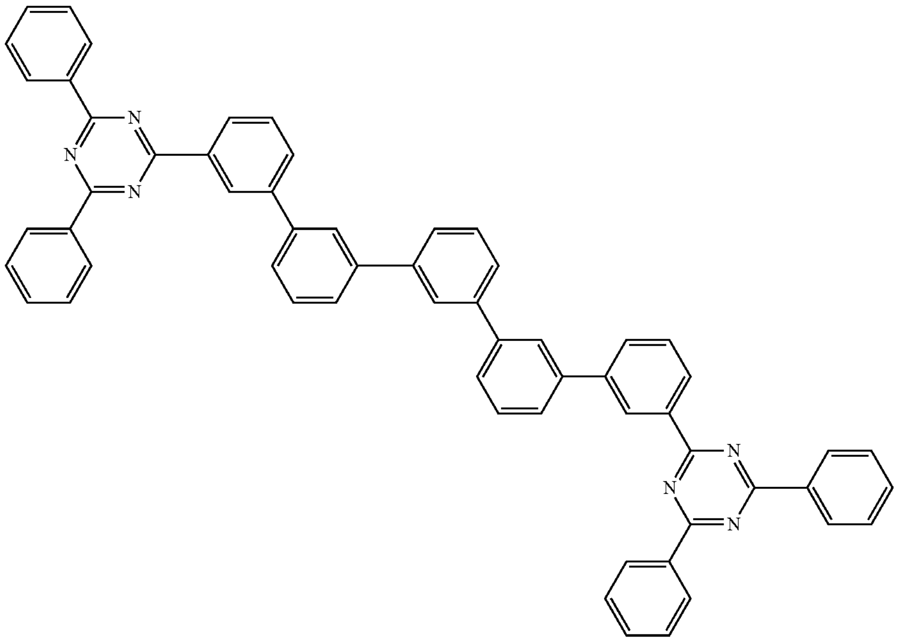
A(101)
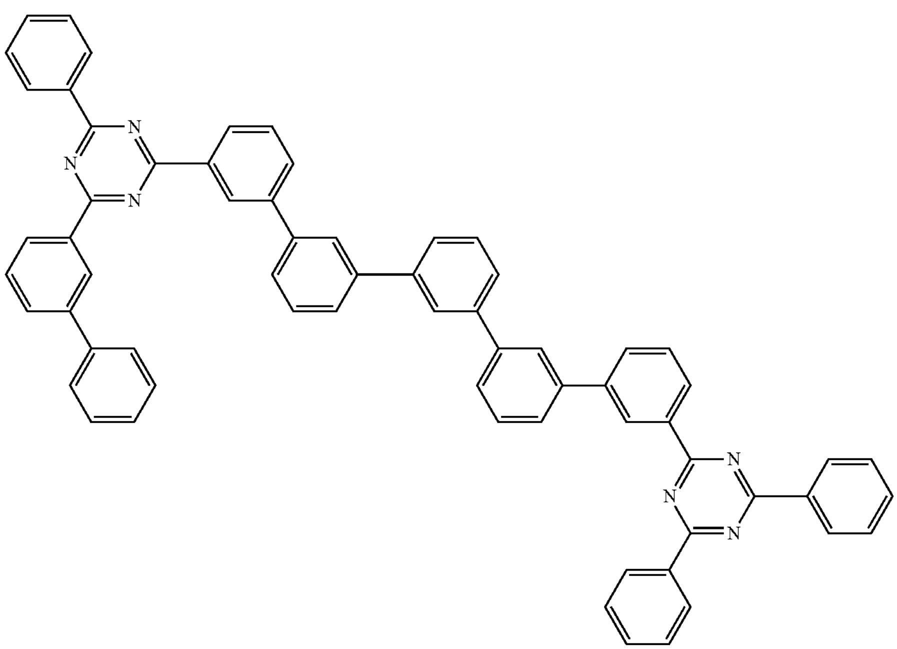

-continued
A(102)
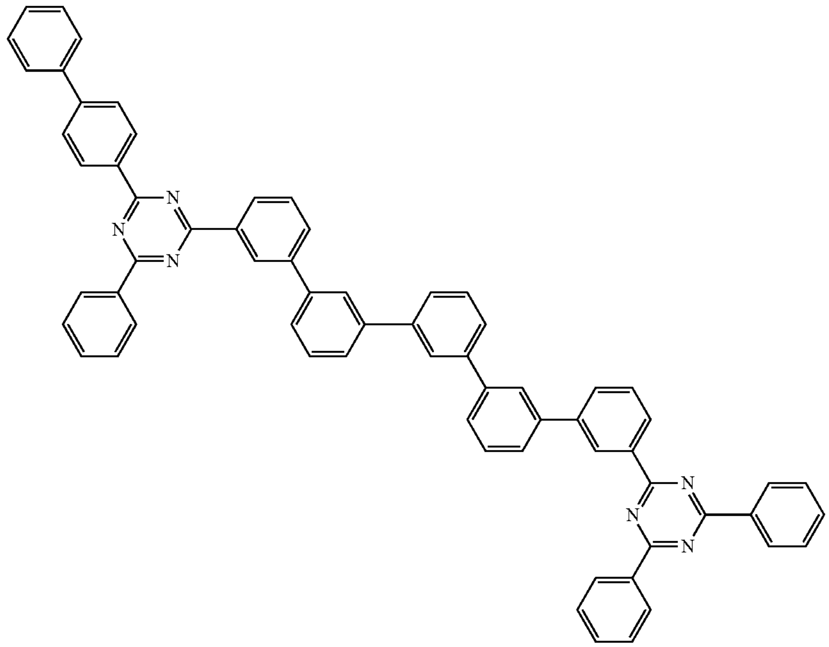
A(103)
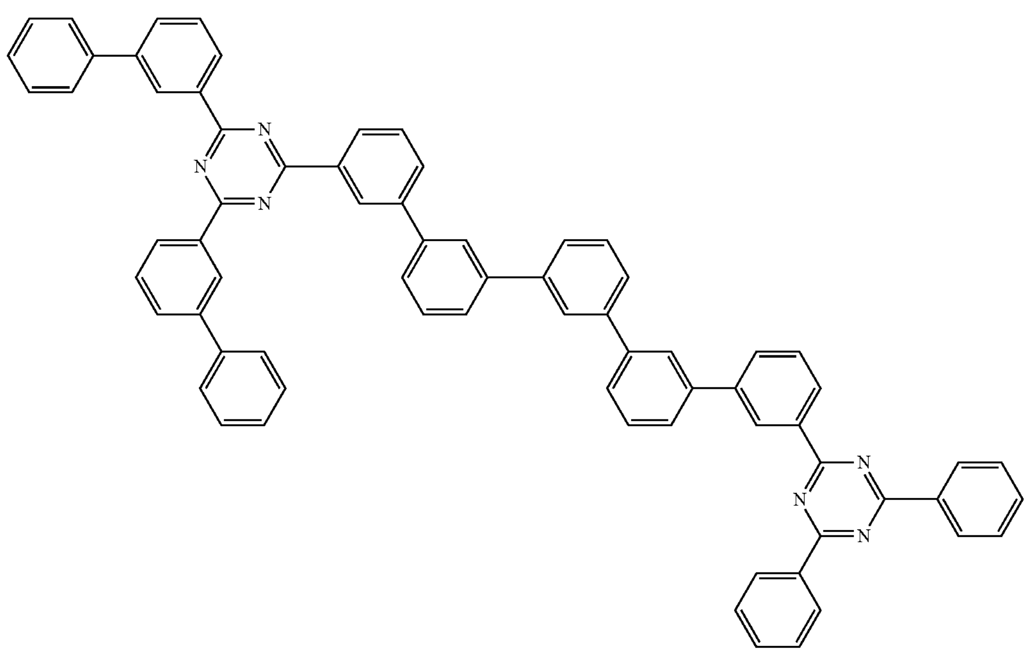

-continued
A(104)
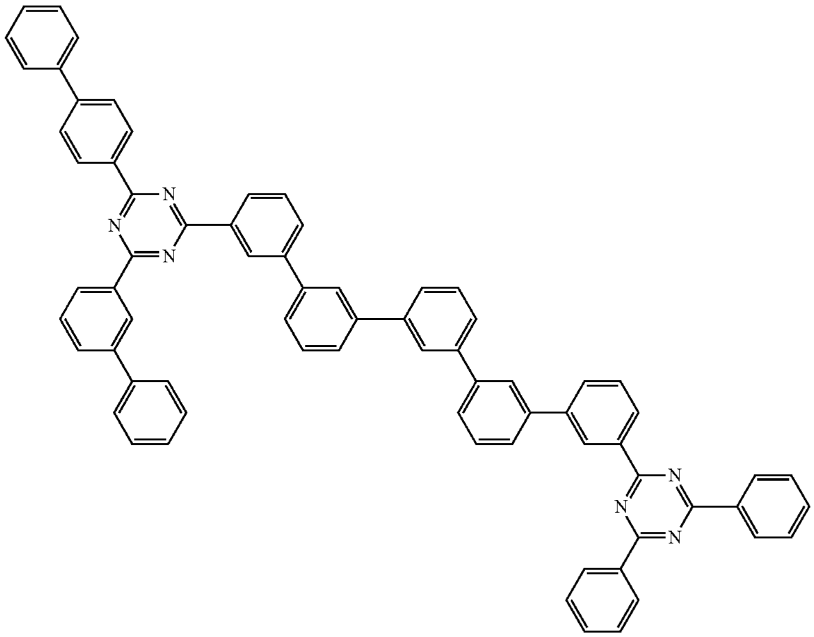
A(105)
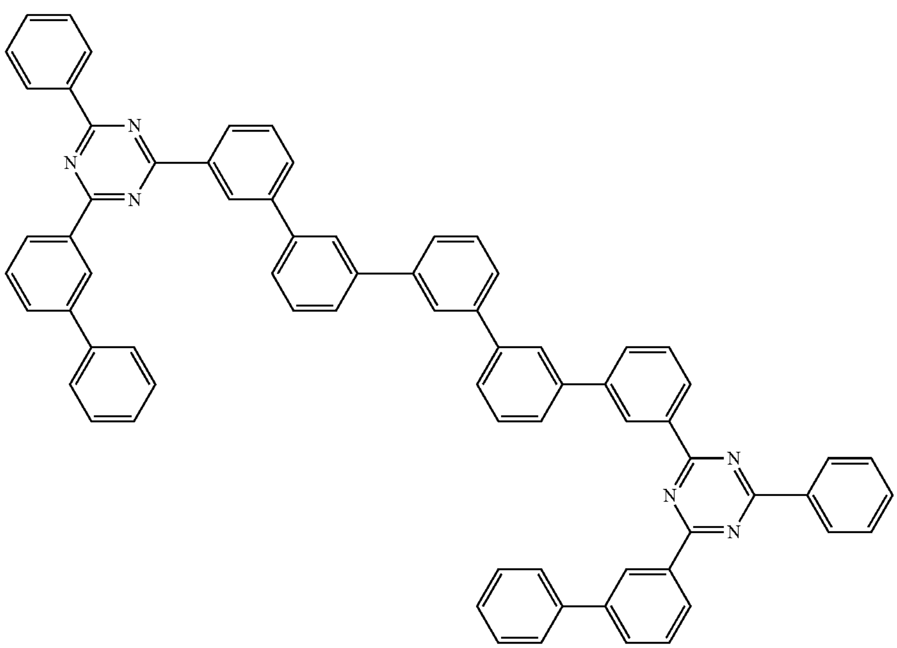

-continued
A(106)
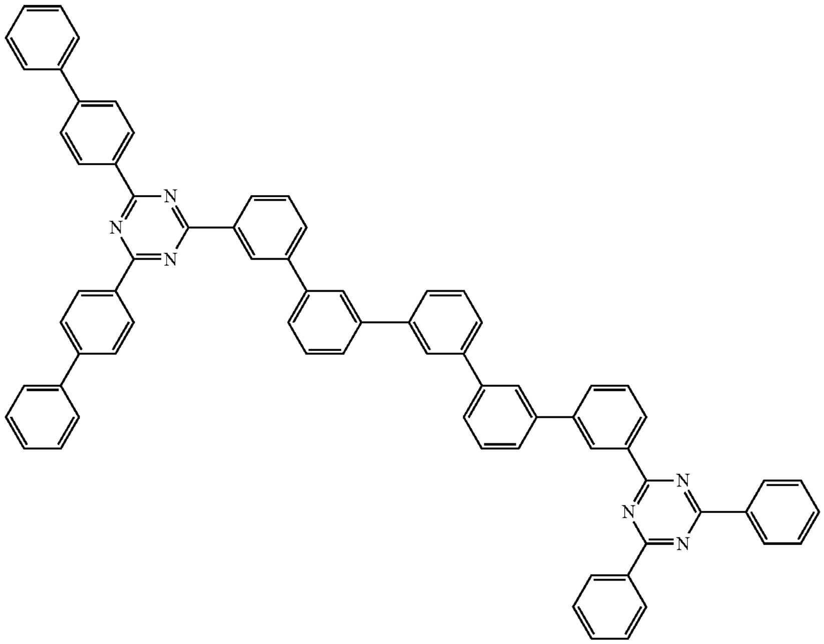
A(107)
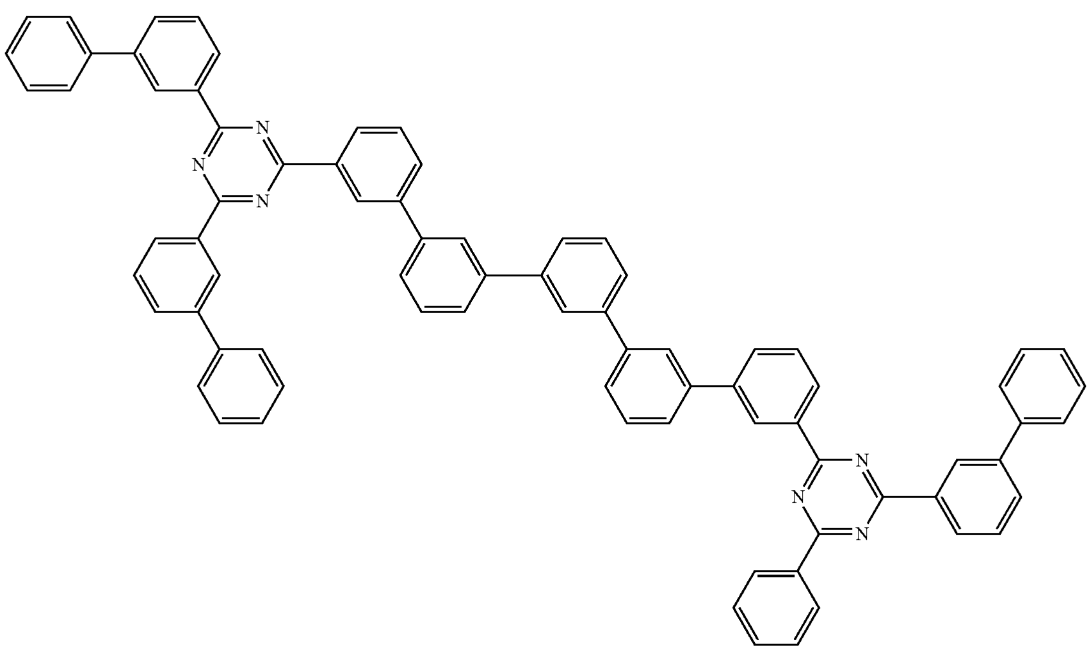

-continued
A(108)
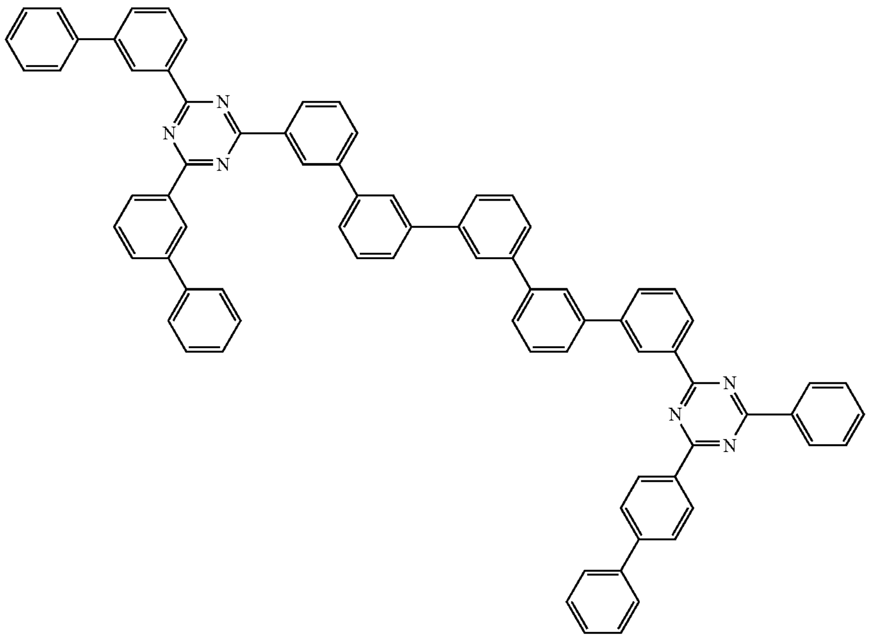
A(109)
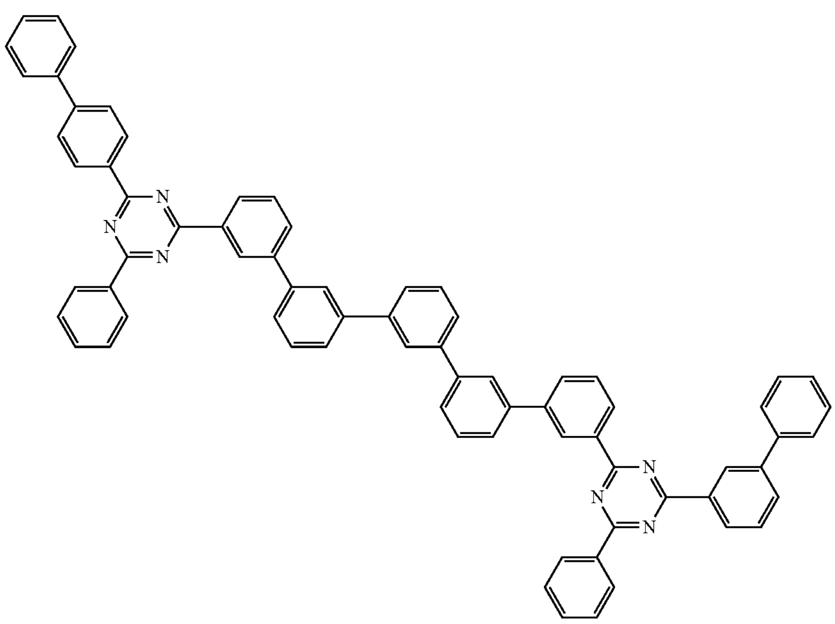

-continued
A(110)
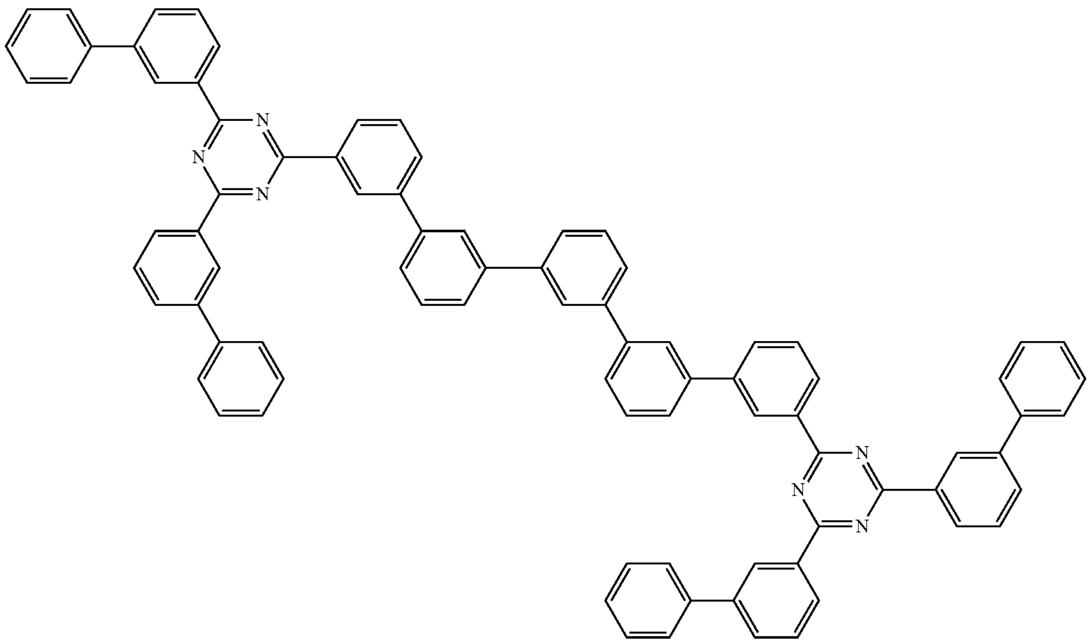
A(111)
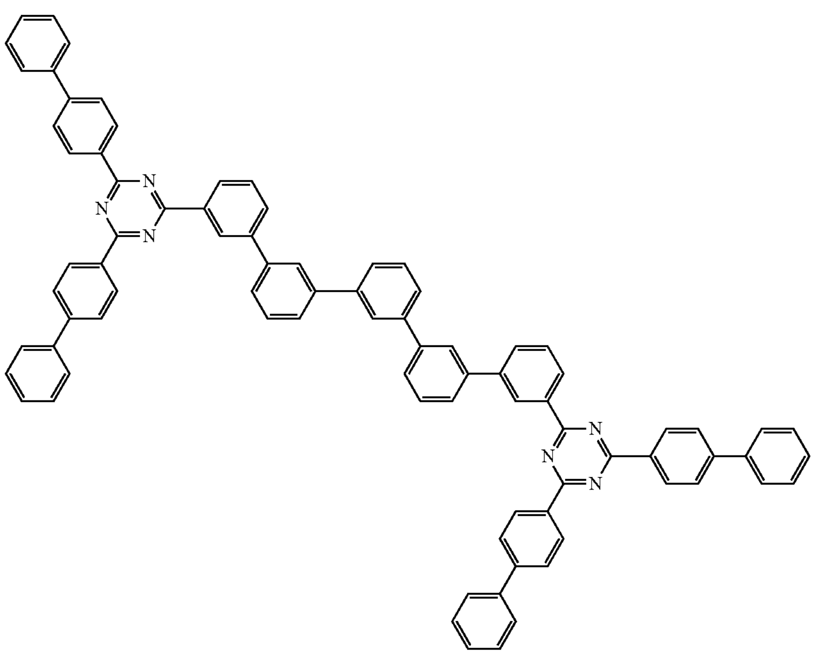

-continued
A(112)
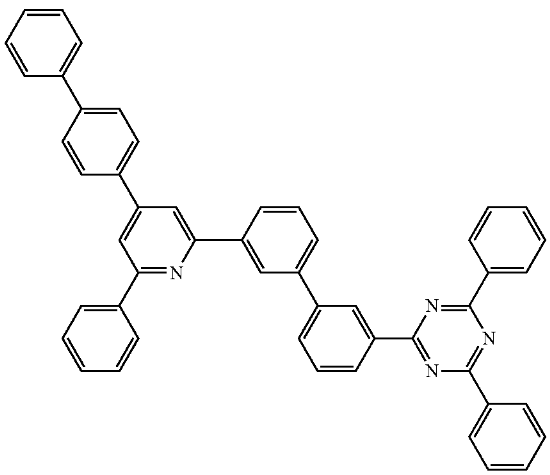
A(113)
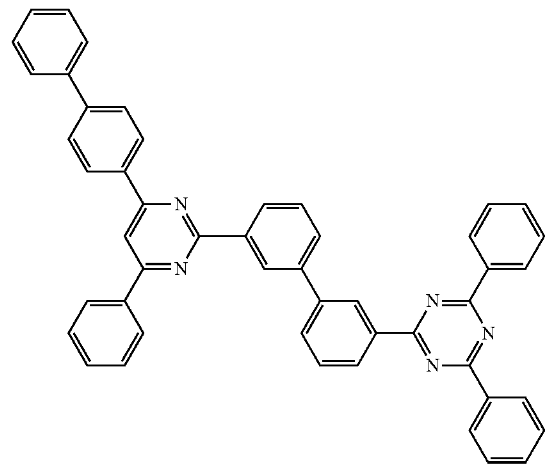
A(114)
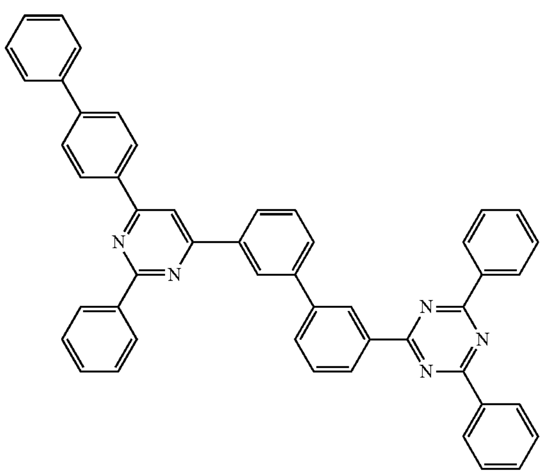
A(115)
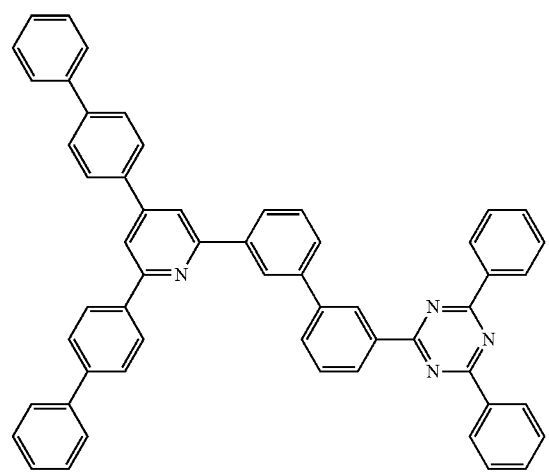
A(116)
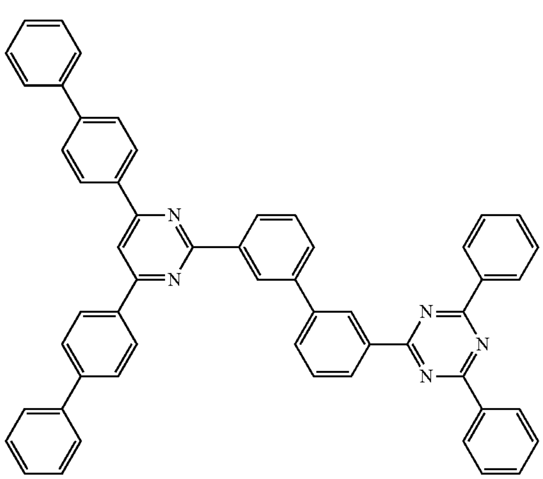
A(117)
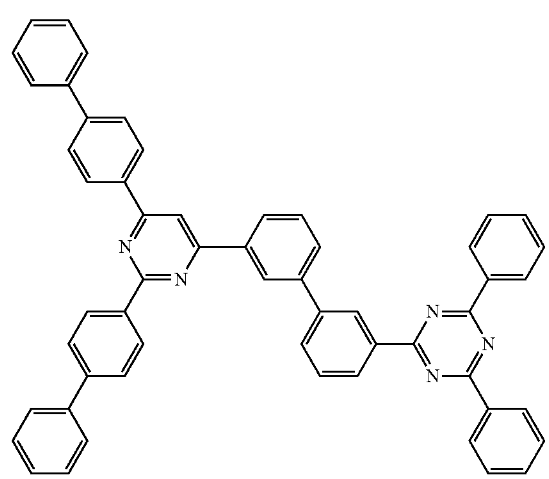

-continued
A(118)
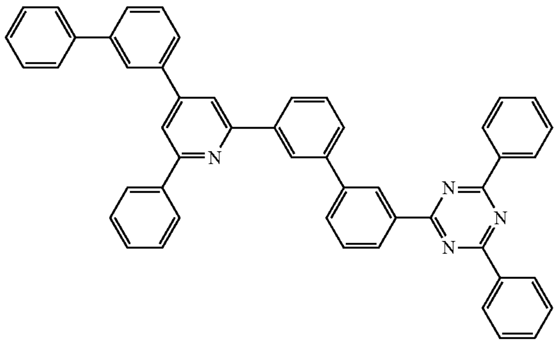
A(119)
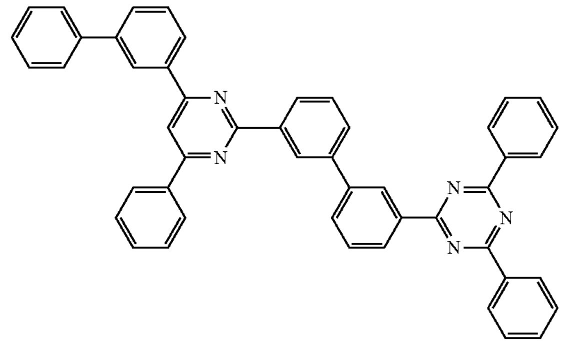
A(120)
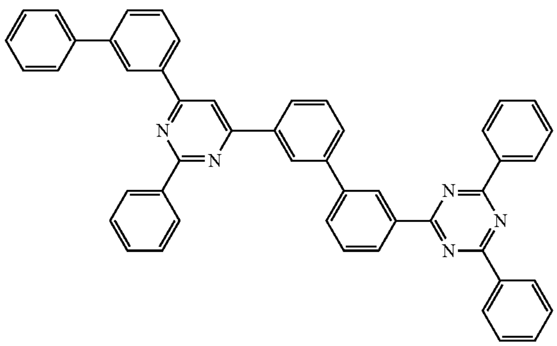
A(121)
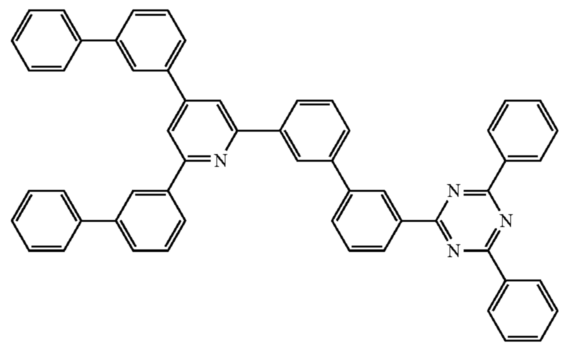
A(122)
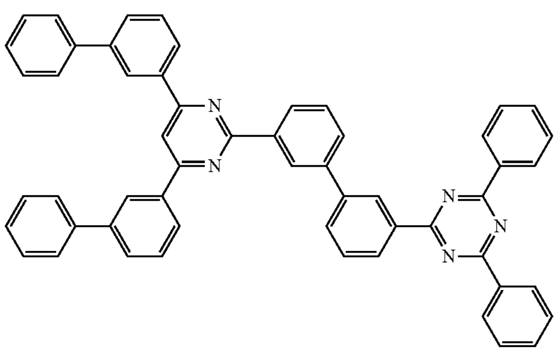
A(123)
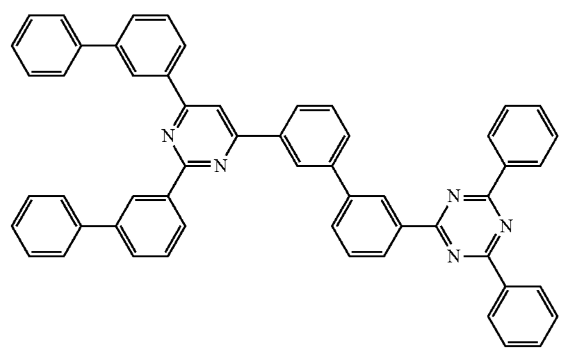
A(124)
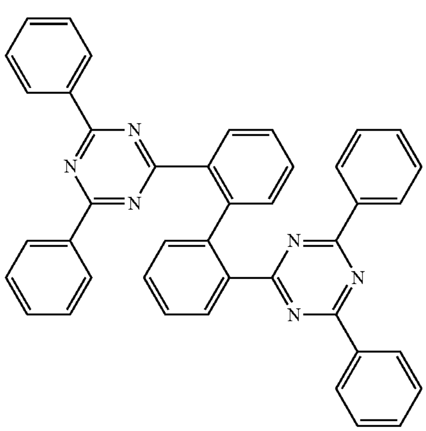
A(125)
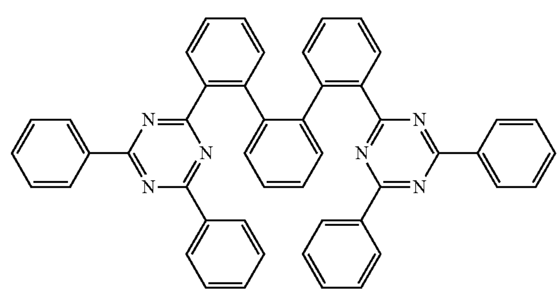

-continued
A(126)
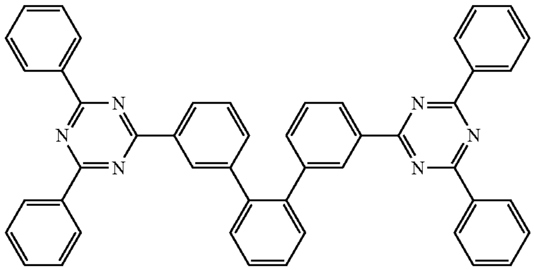
A(127)
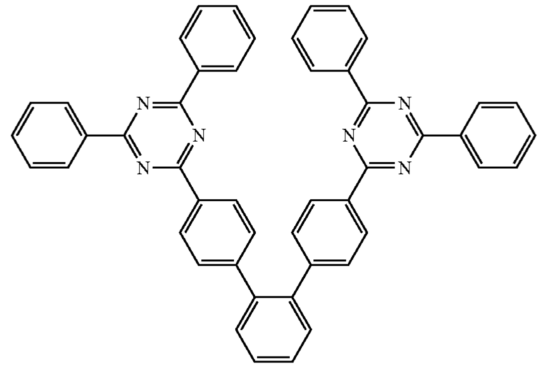
A(128)
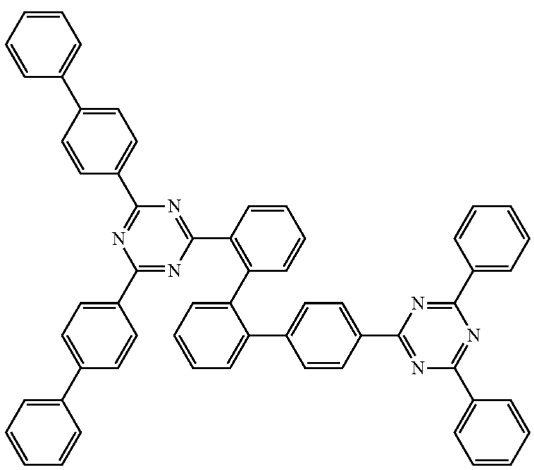
A(129)
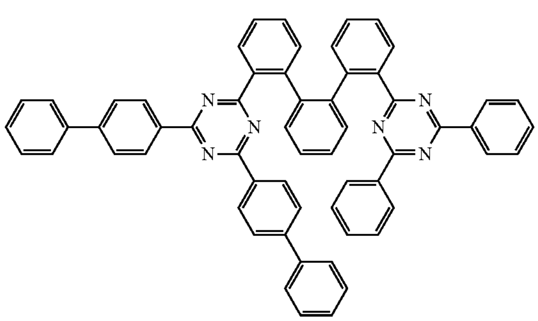
A(130)
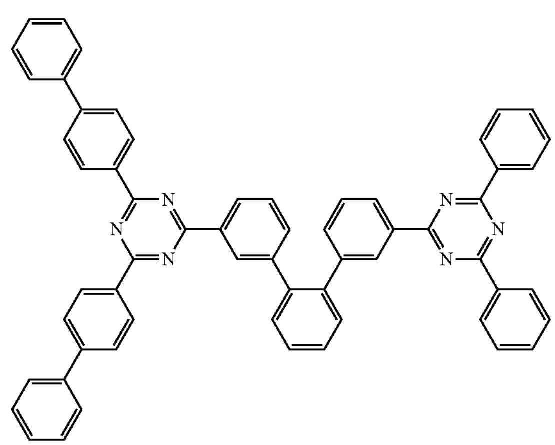

-continued
A(131)
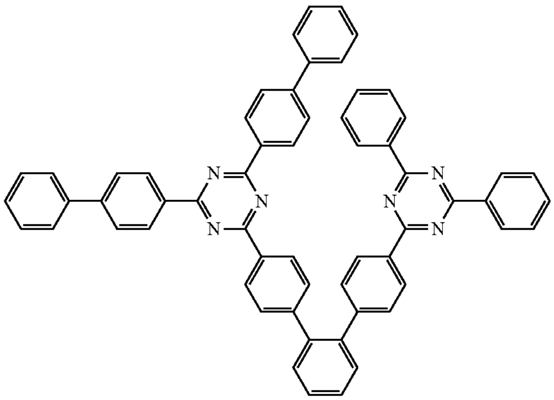
A(132)
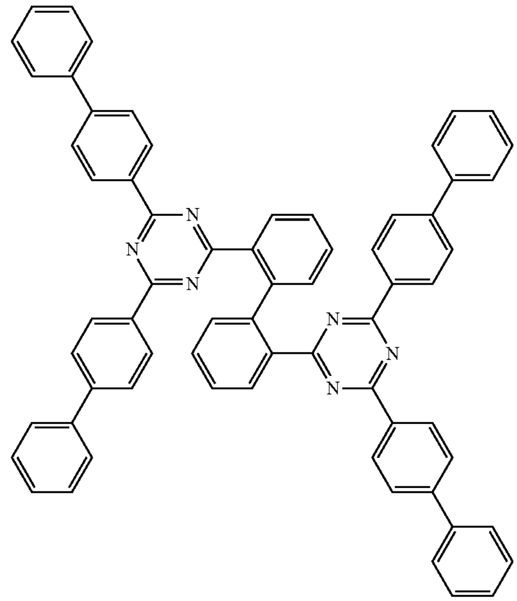
A(133)
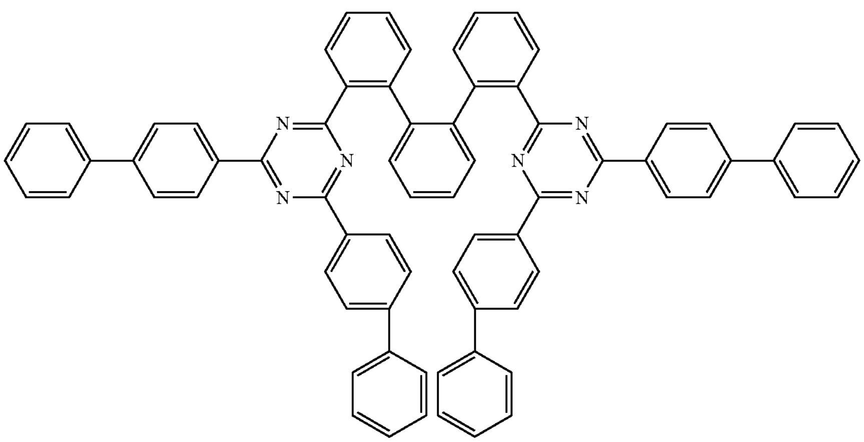
A(134)
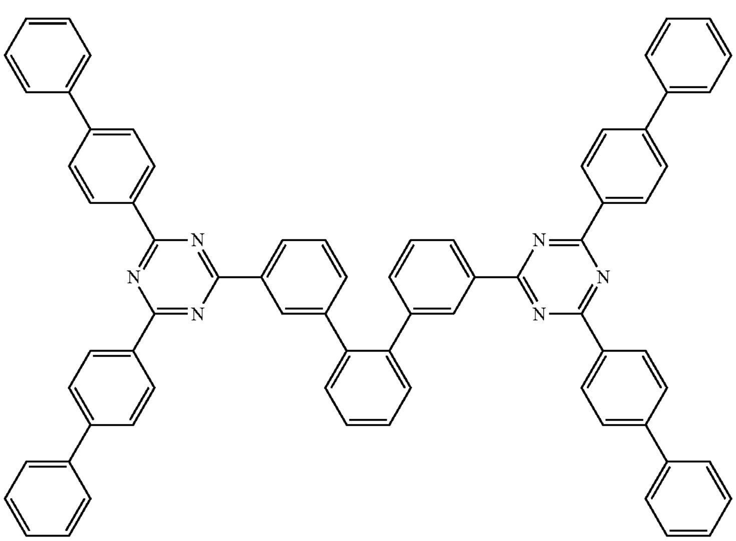

-continued
A(135)
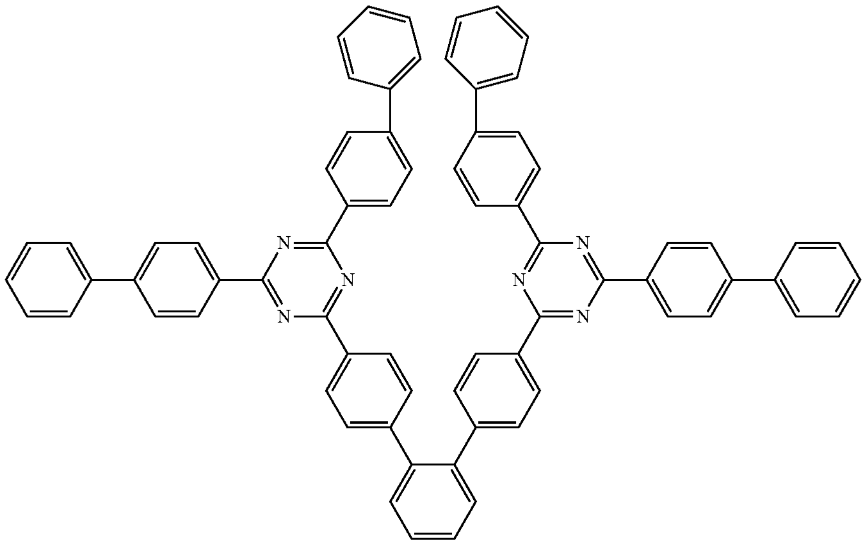
A(136)
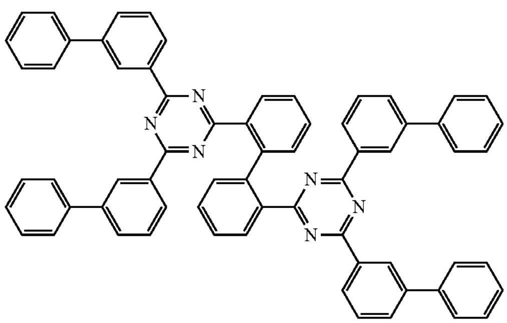
A(137)
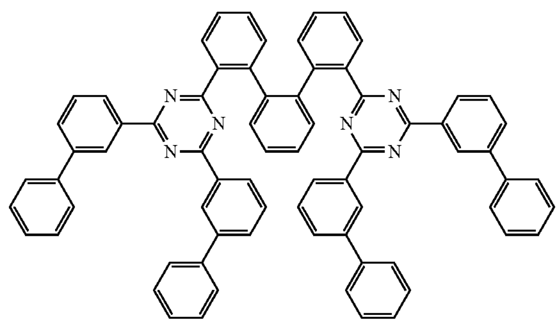
A(138)
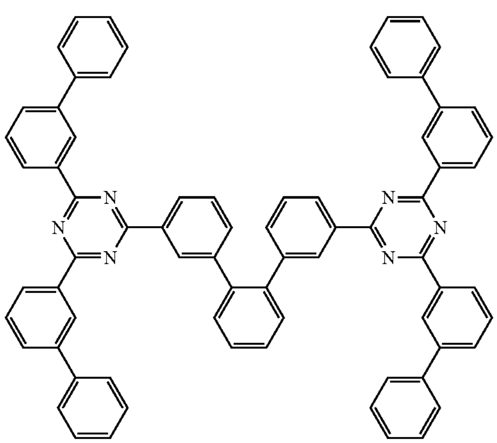
A(139)
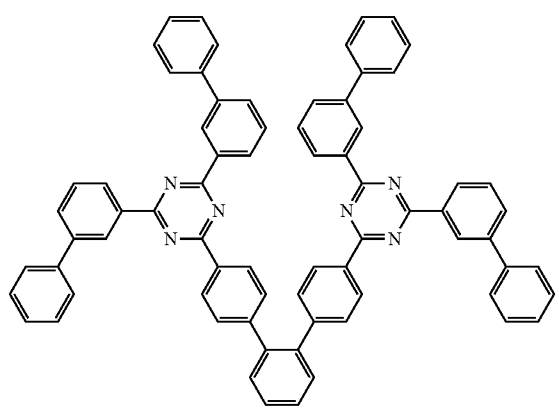

-continued
A(140)
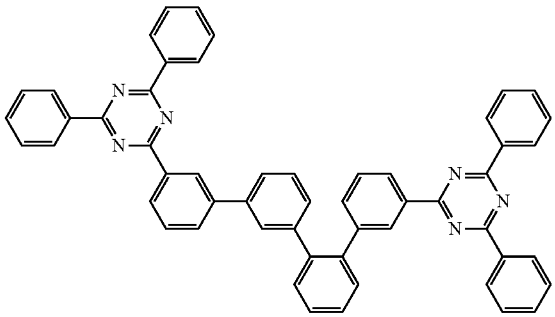
A(141)
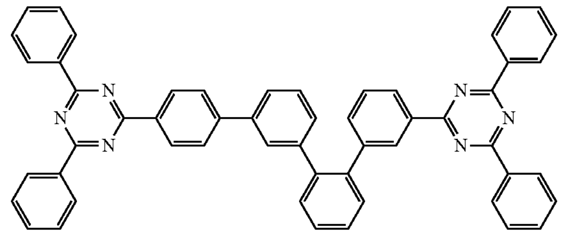
A(142)
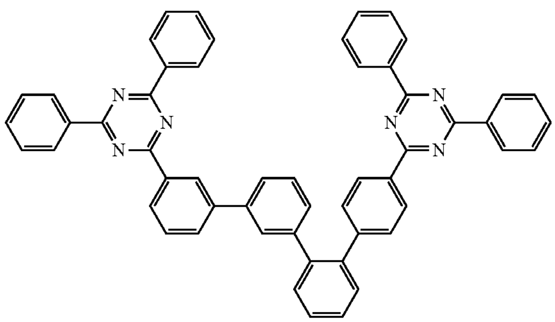
A(143)
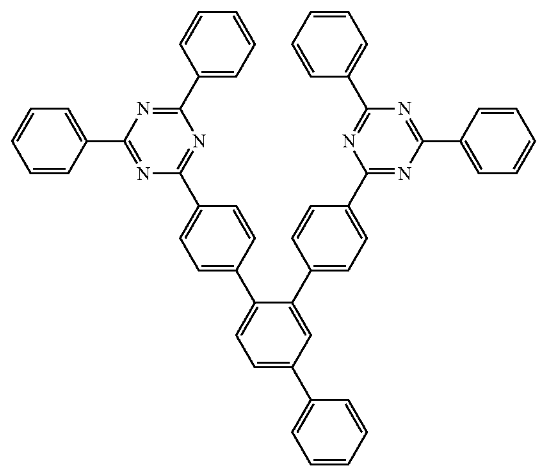
A(144)
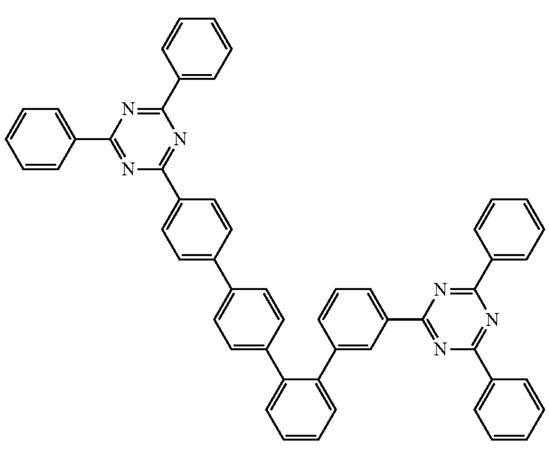
A(145)
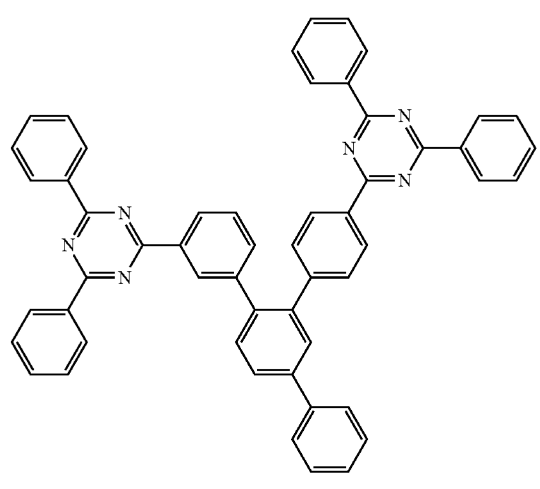

-continued
A(146)
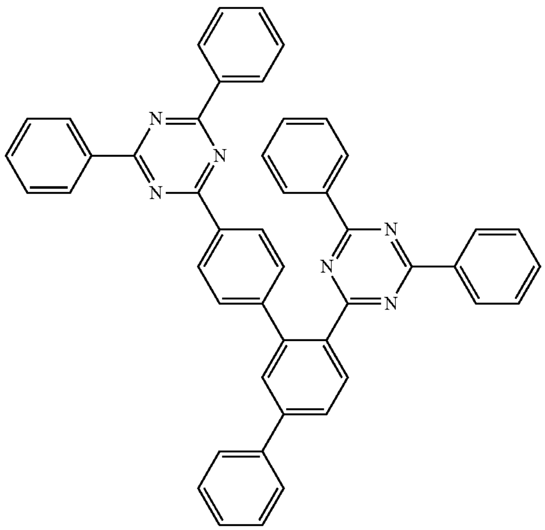
A(147)
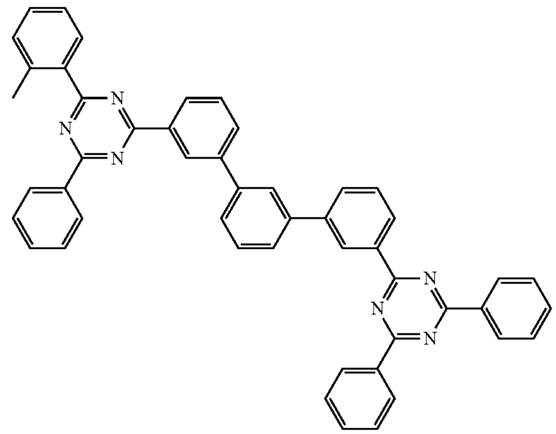
A(148)
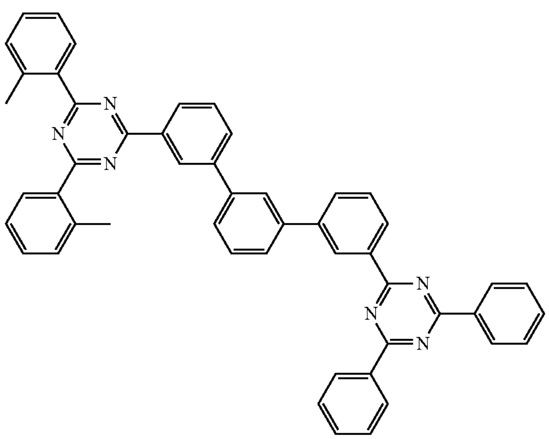
A(149)
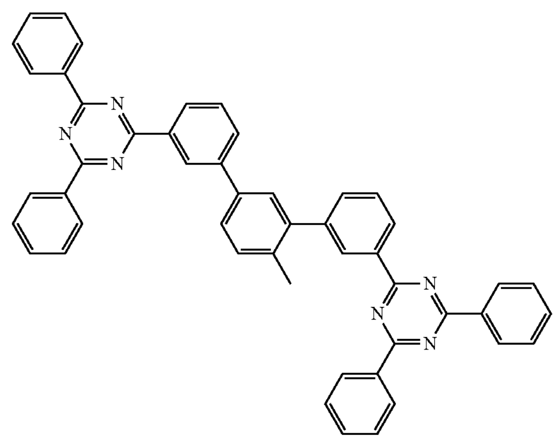
A(150)
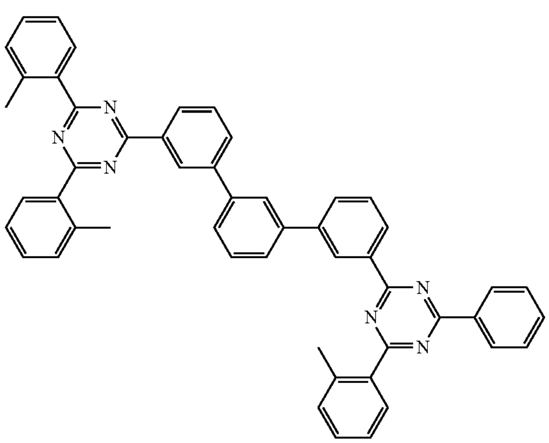
A(151)
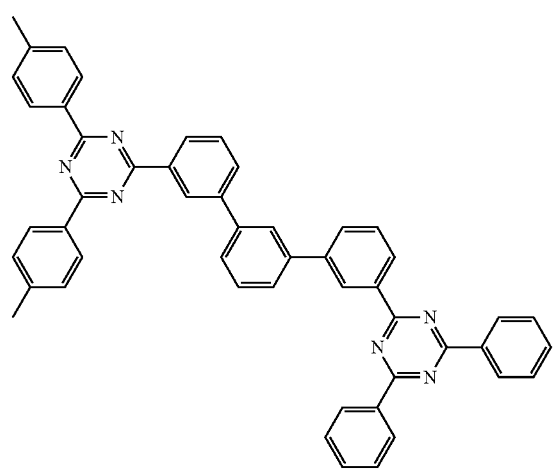

-continued
A(152)
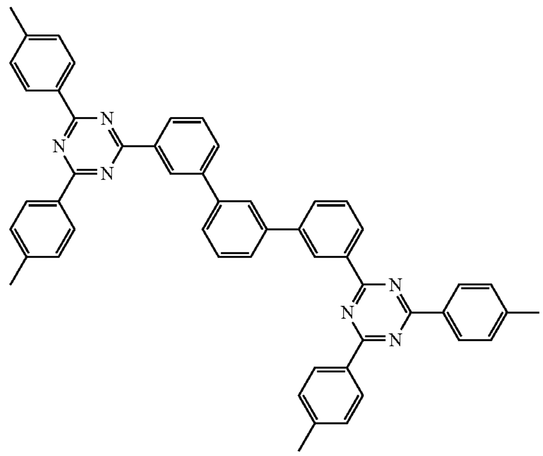
A(153)
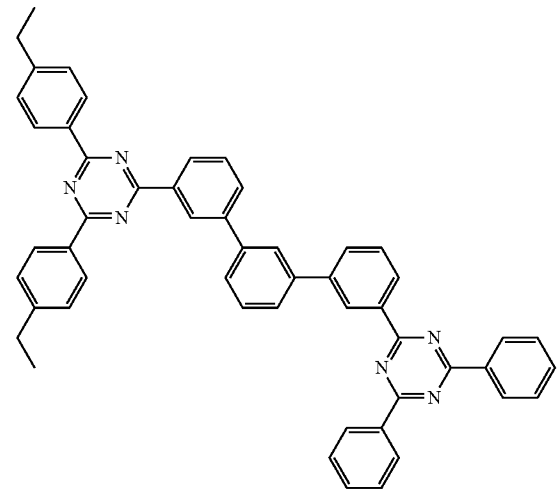
A(154)
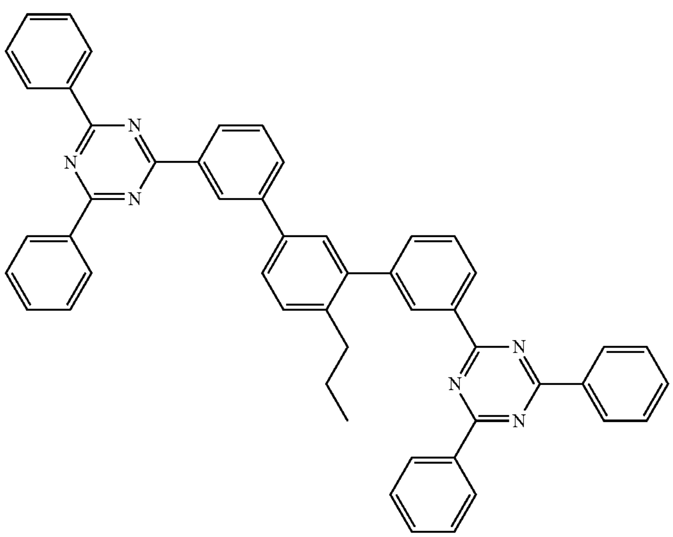

In an embodiment, the hole transport host may be selected from Compounds H-H1 to H-H103, but embodiments of the present disclosure are not limited thereto:
H-H1
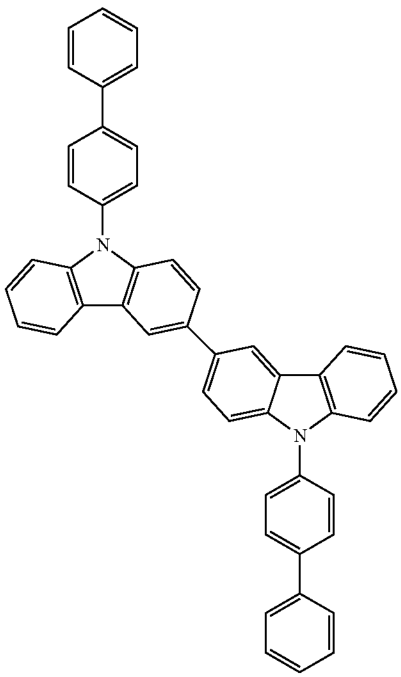
H-H2
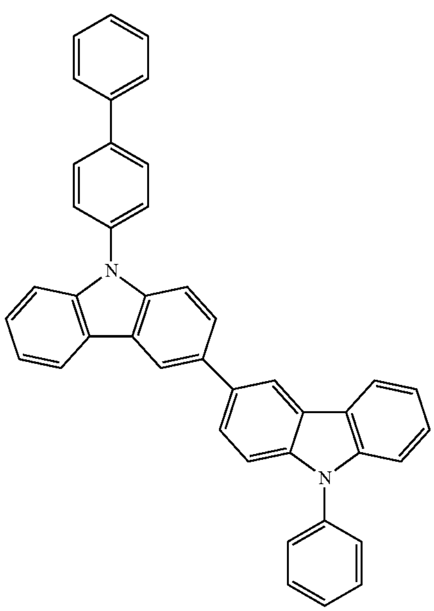
-continued
H-H3
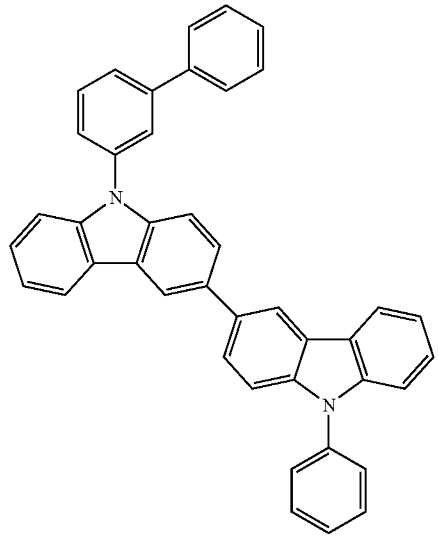
H-H4
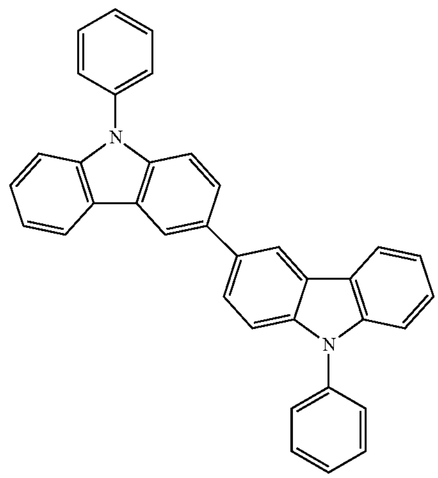
H-H5
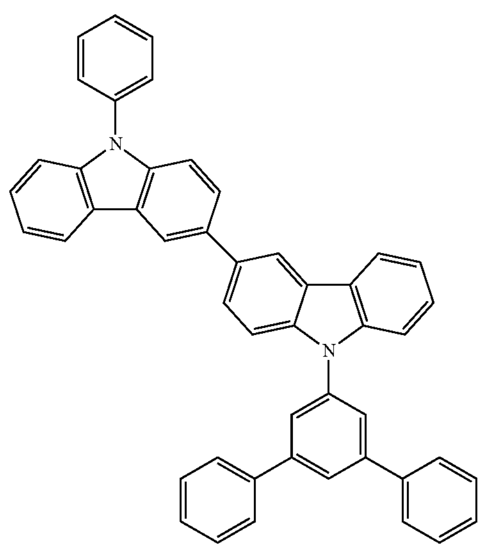

-continued
H-H6
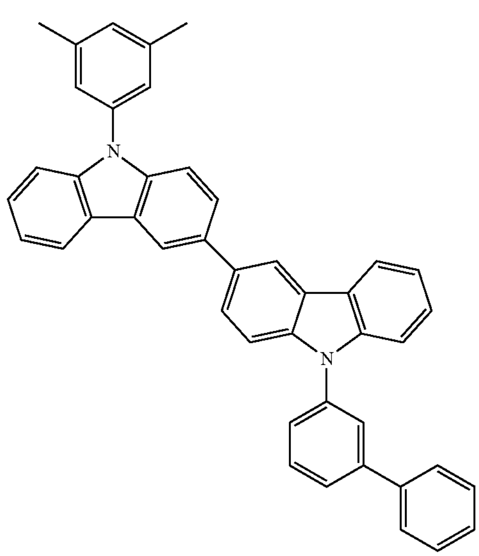
H-H7
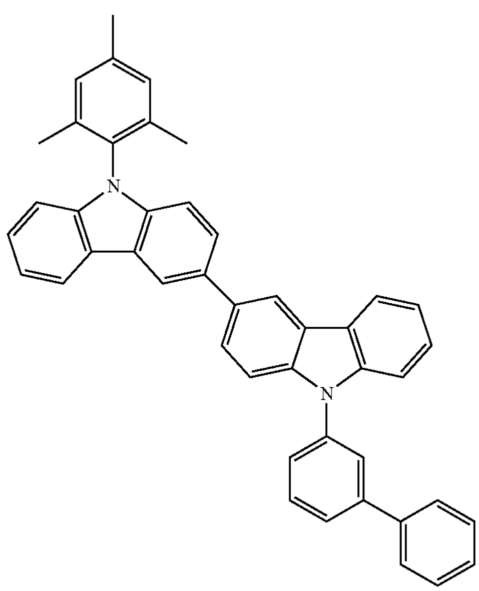
-continued
H-H8
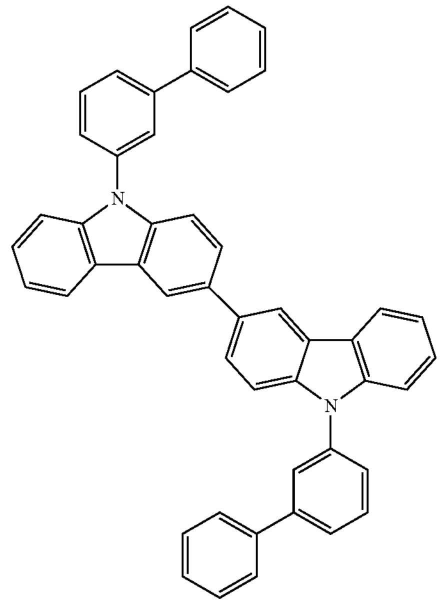
H-H9
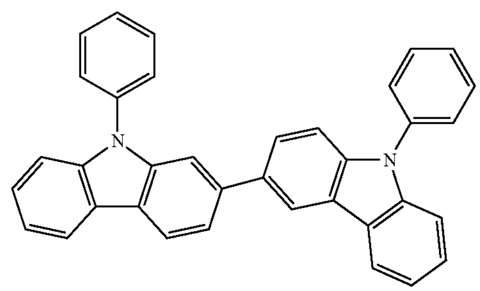
H-H10
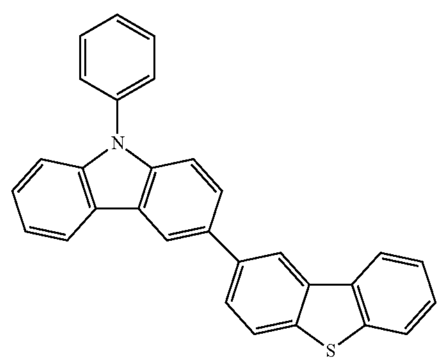
H-H11
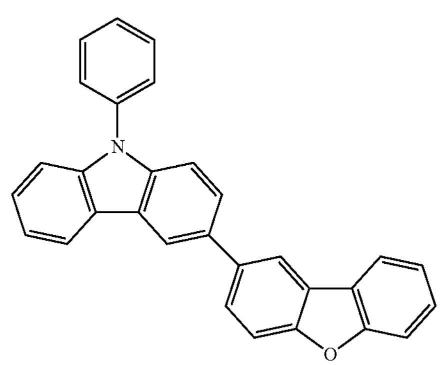

-continued
H-H12
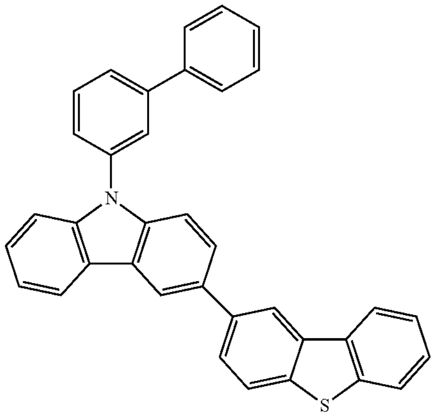
H-H13
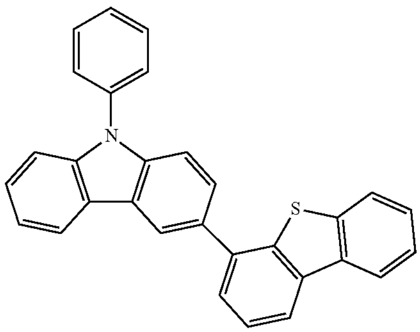
H-H14
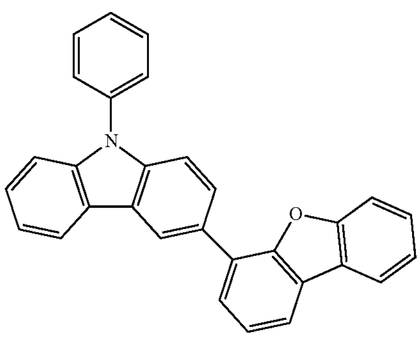
H-H15
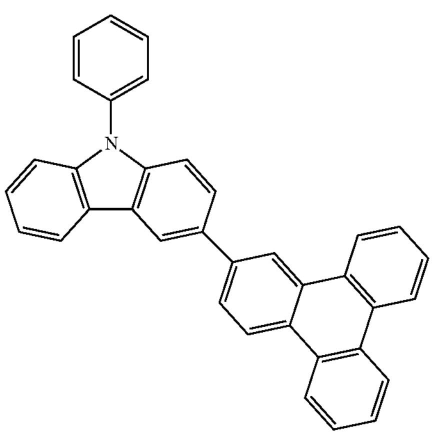
-continued
H-H16
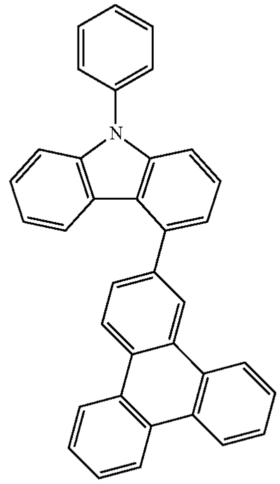
H-H17
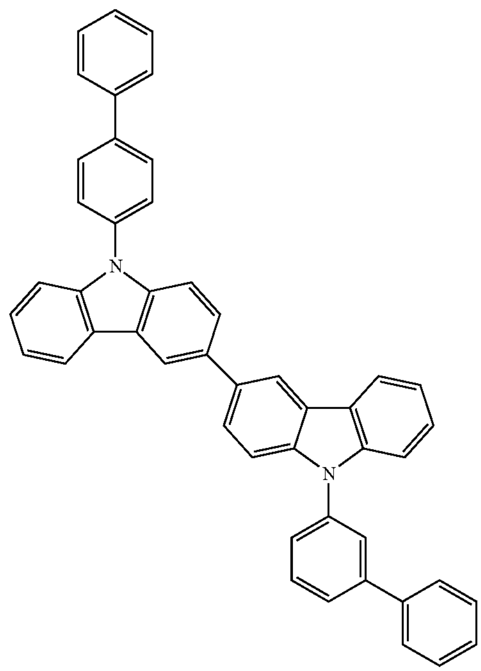
H-H18
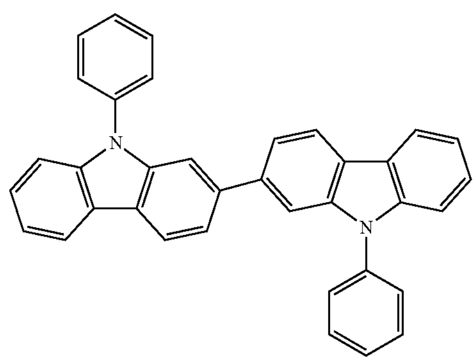

-continued
H-H19
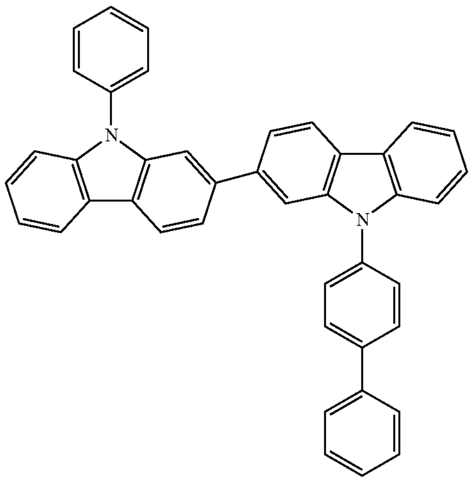
H-H20
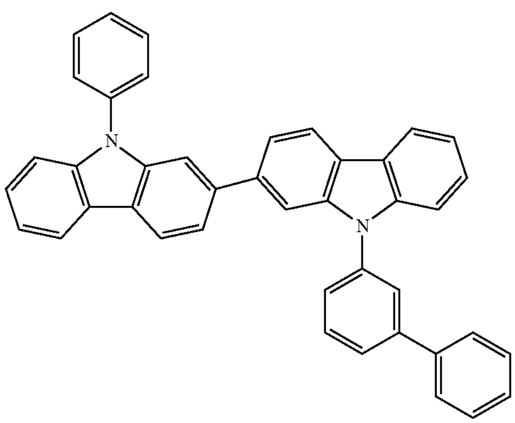
H-H21
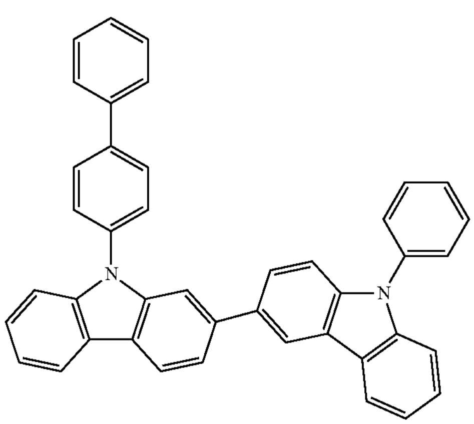
-continued
H-H22
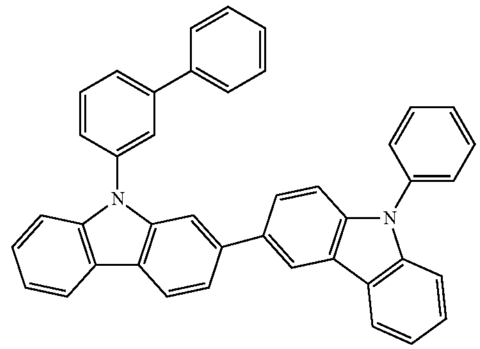
H-H23
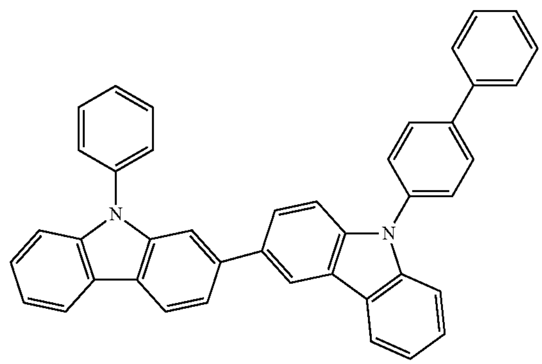
H-H24
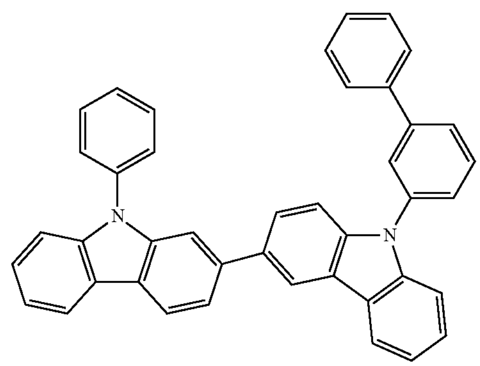
H-H25
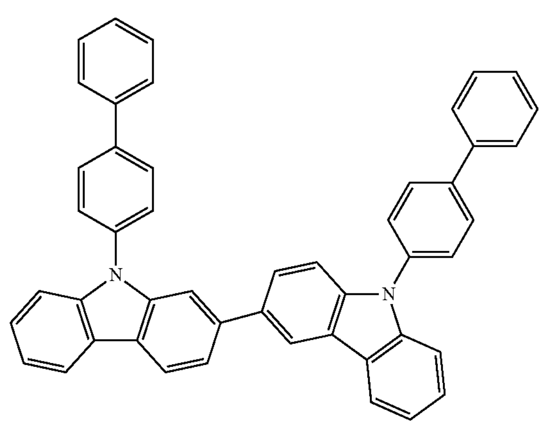

-continued
H-H26
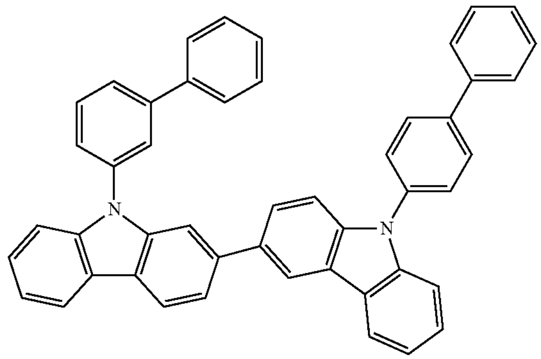
H-H27
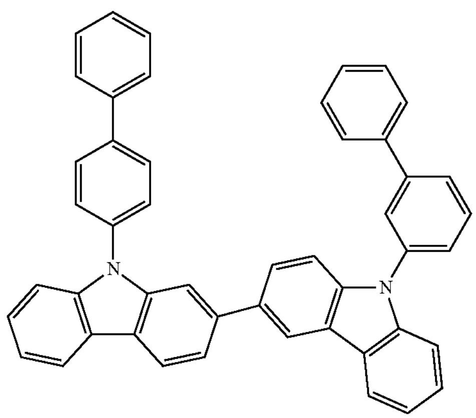
H-H28
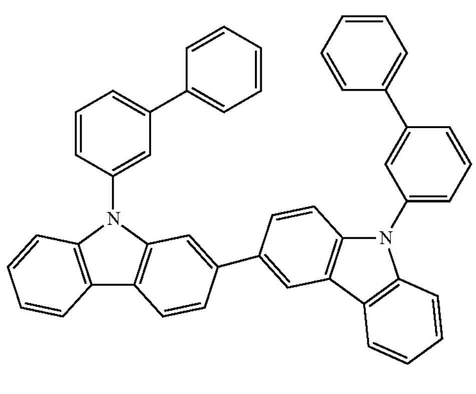
-continued
H-H29
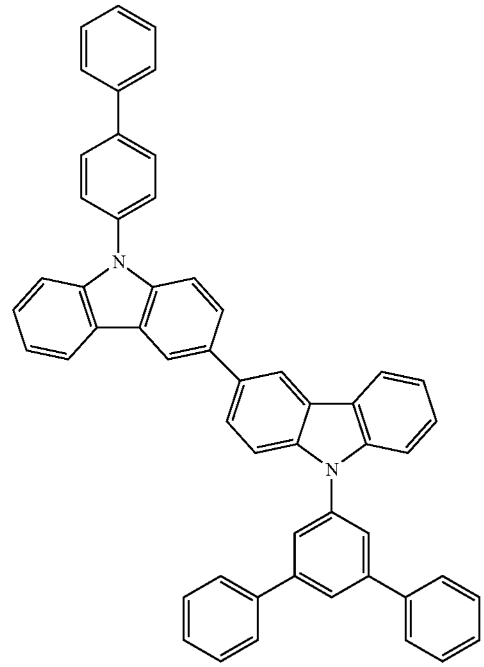
H-H30
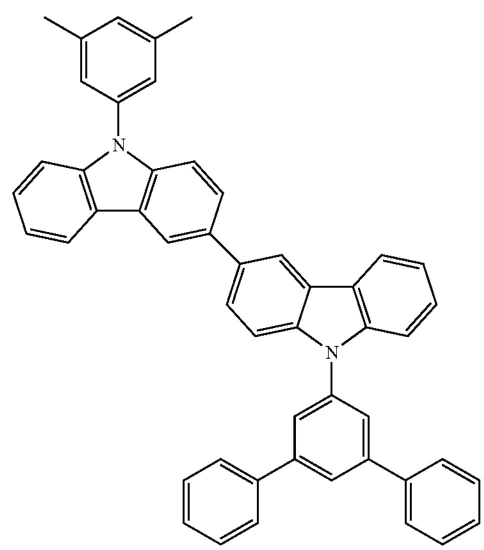

-continued
H-H31
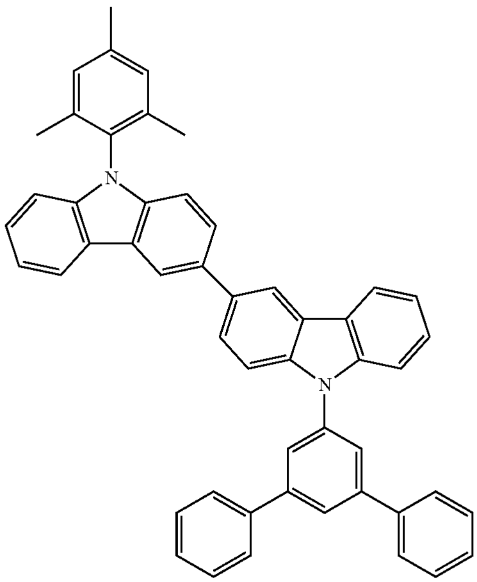
H-H32
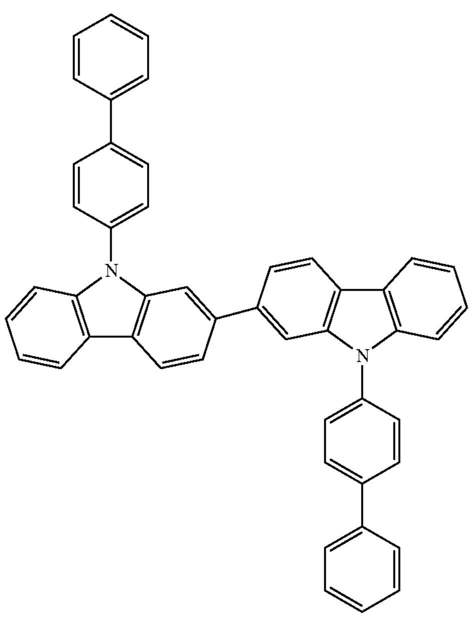
-continued
H-H33
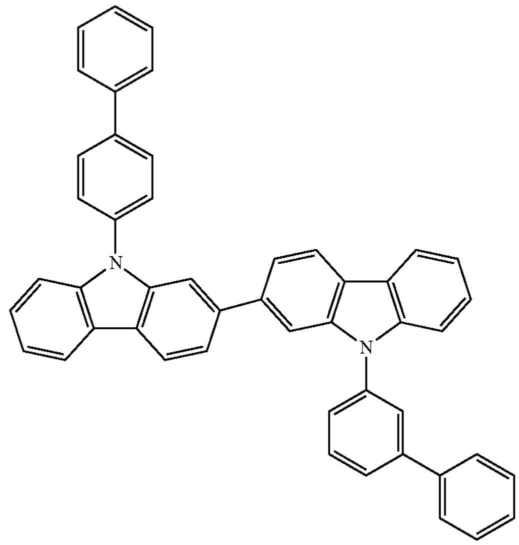
H-H34
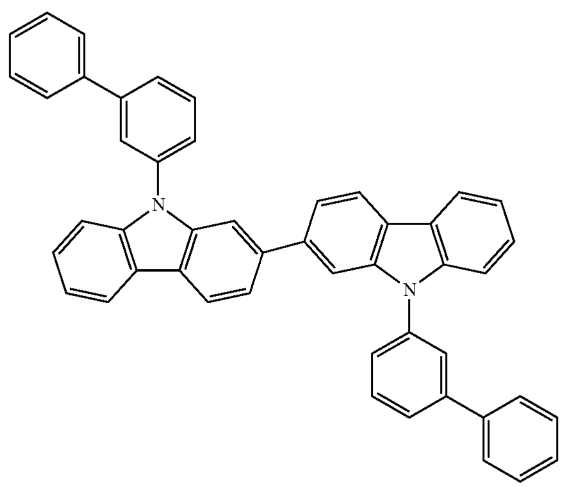
H-H35
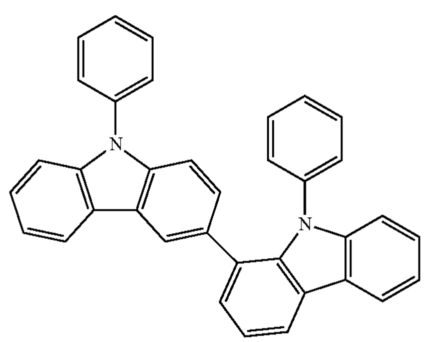

-continued
H-H36
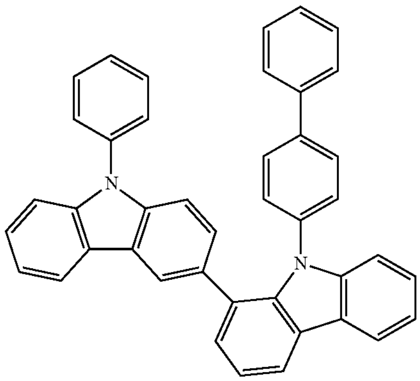
H-H37
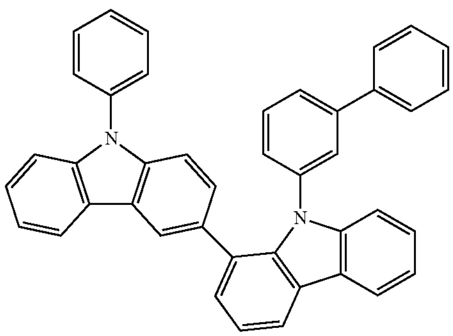
H-H38
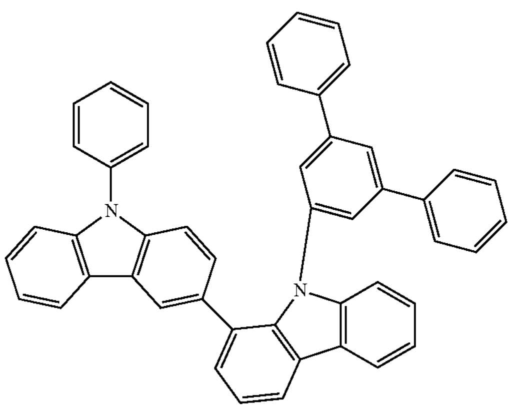
H-H39
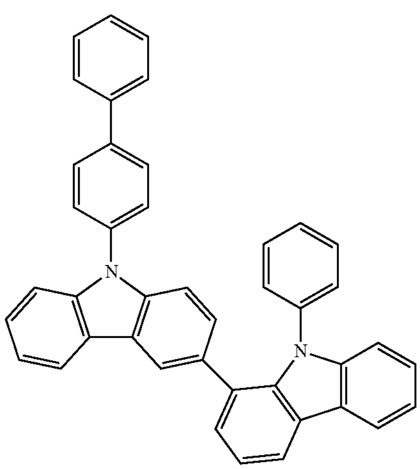
-continued
H-H40
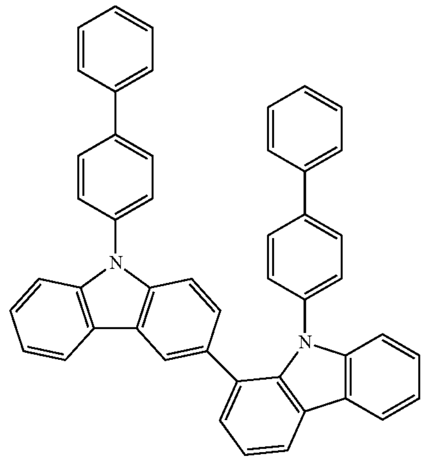
H-H41
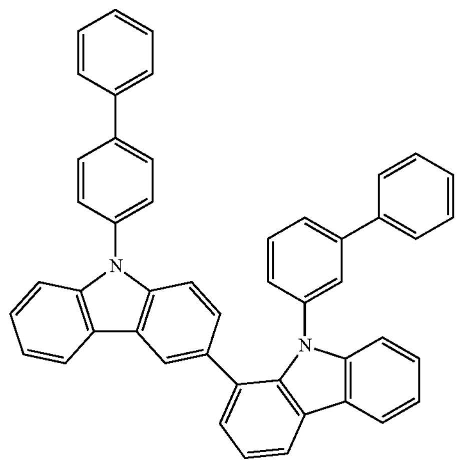
H-H42
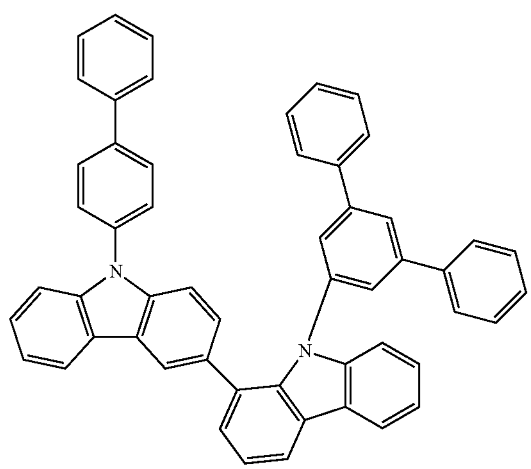

-continued
H-H43
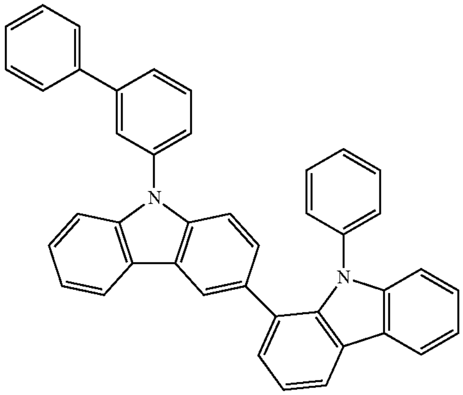
H-H44
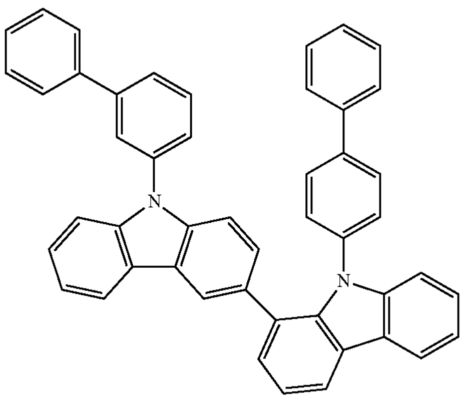
H-H45
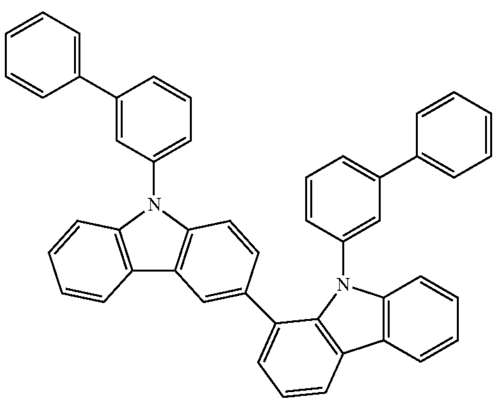
H-H46
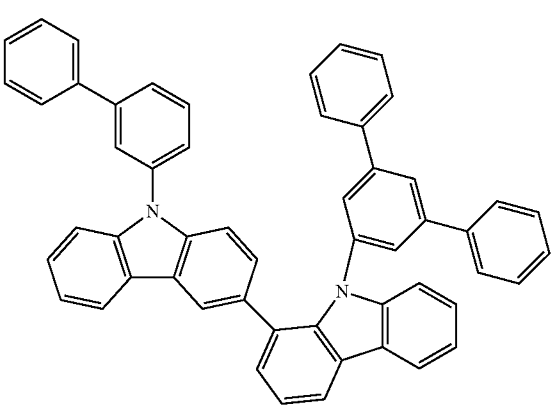
-continued
H-H47
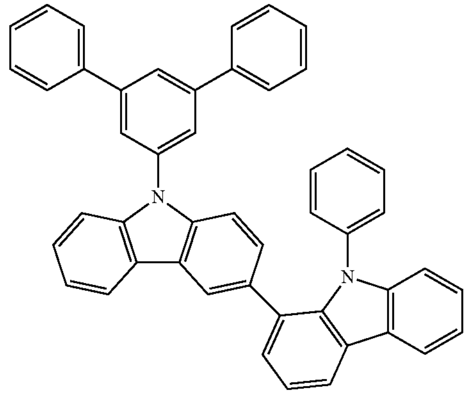
H-H48
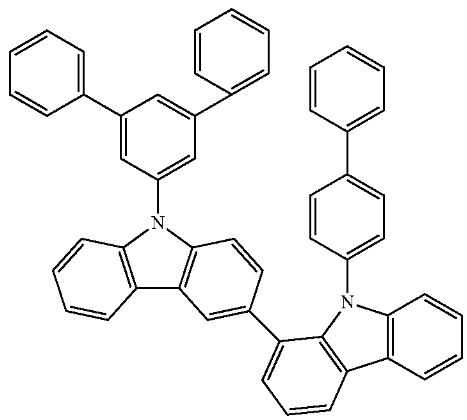
H-H49
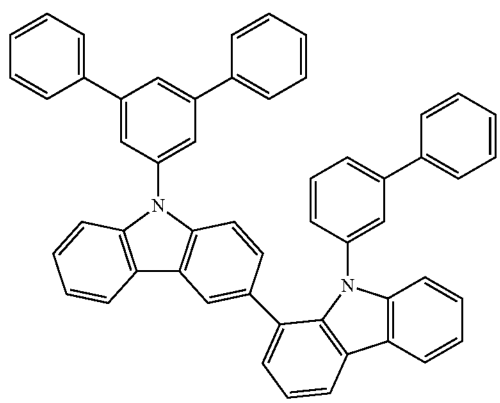

-continued
H-H50
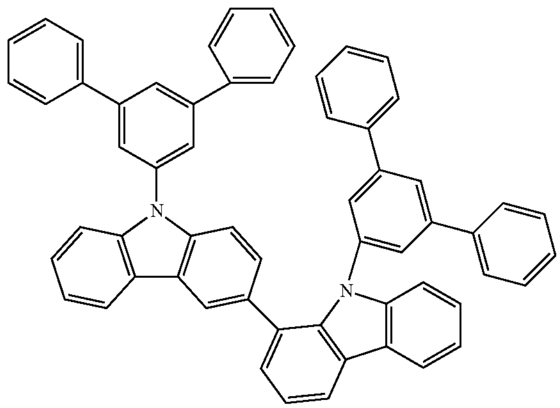
H-H51
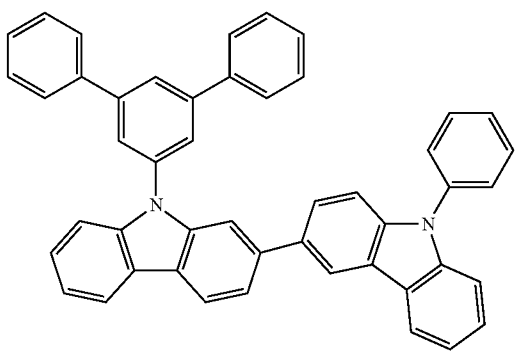
H-H52
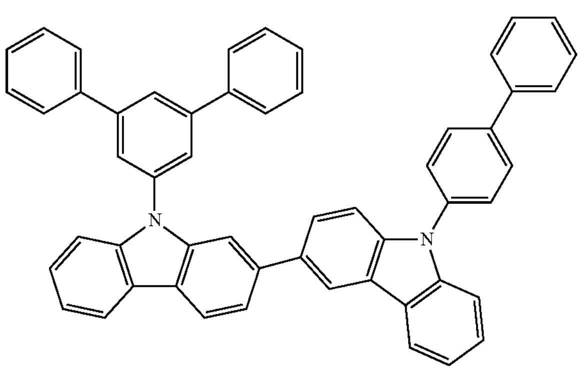
H-H53
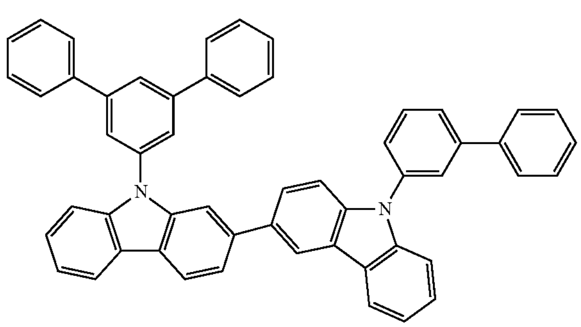
-continued
H-H54
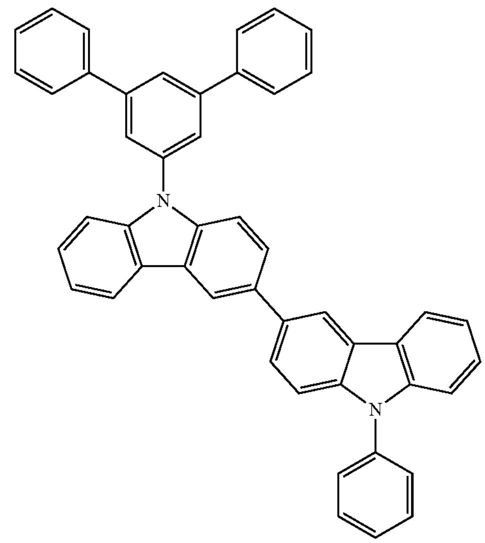
H-H55
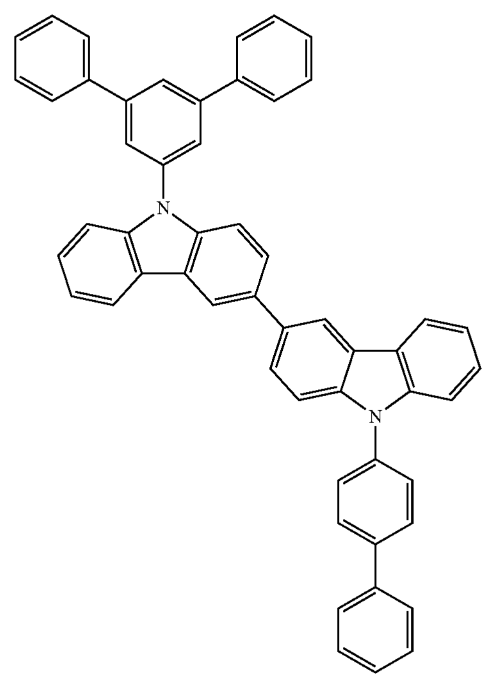

-continued
H-H56
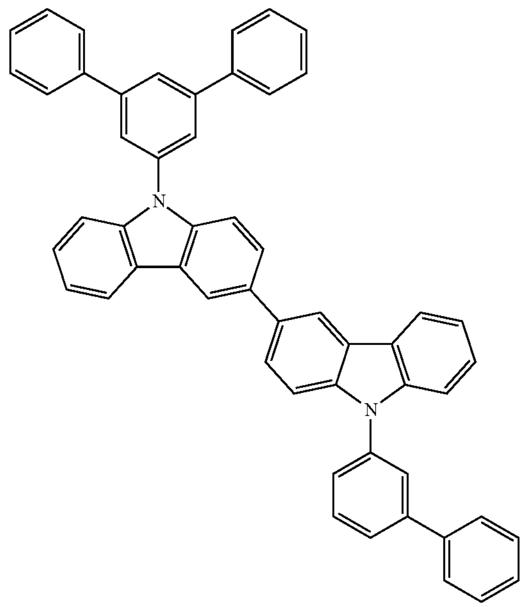
H-H57
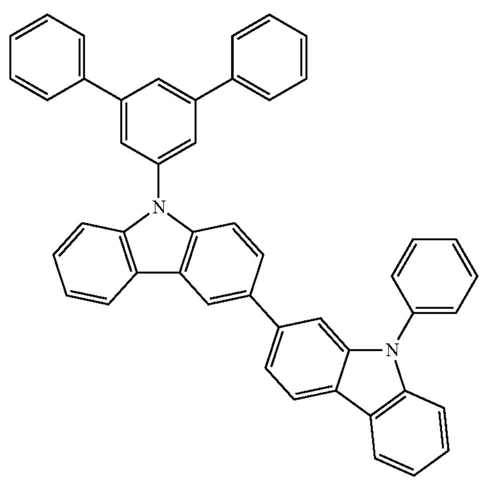
H-H58
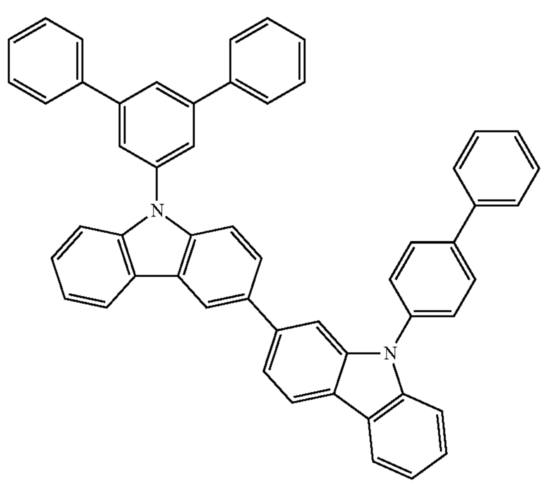
-continued
H-H59
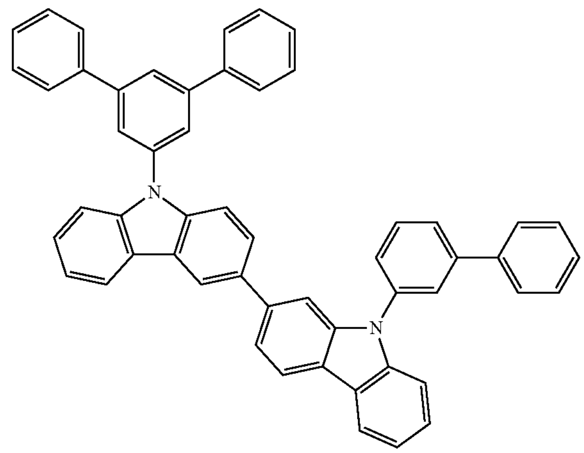
H-H60
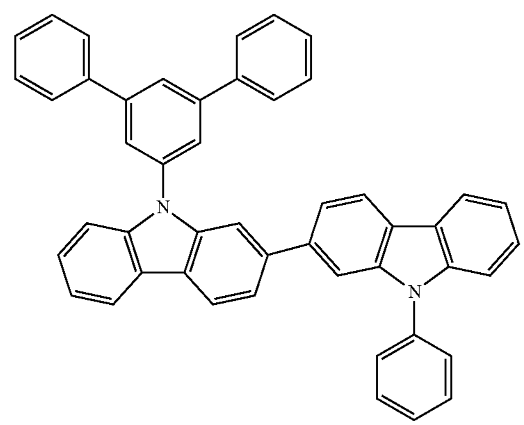
H-H61
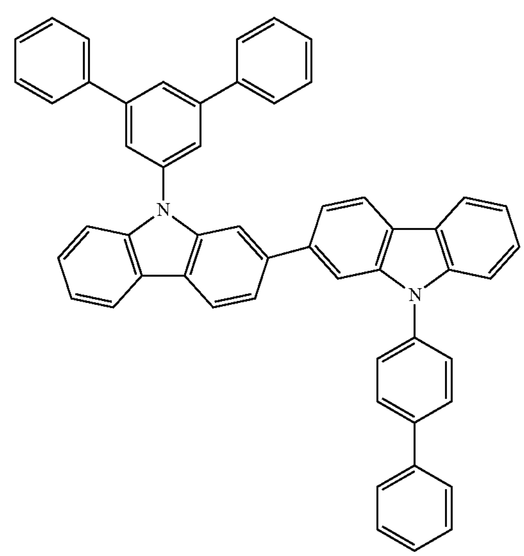

-continued
H-H62
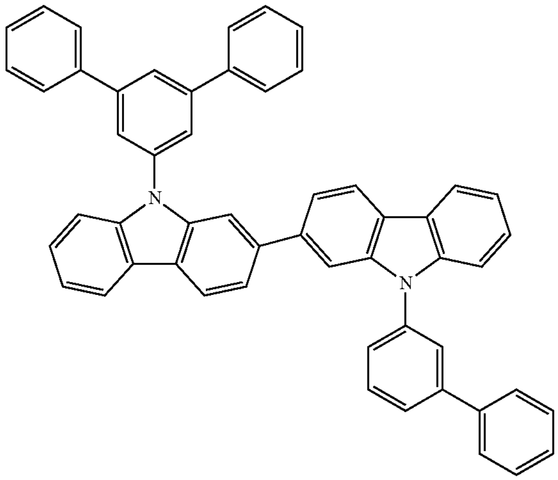
H-H63
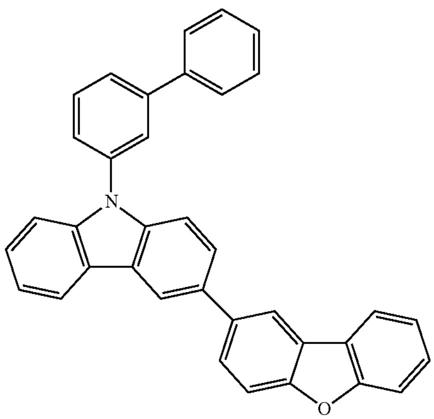
H-H64
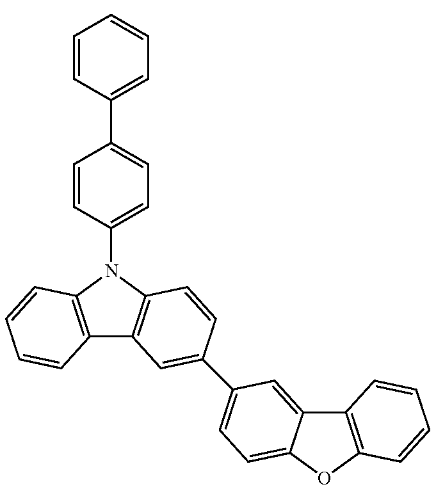
-continued
H-H65
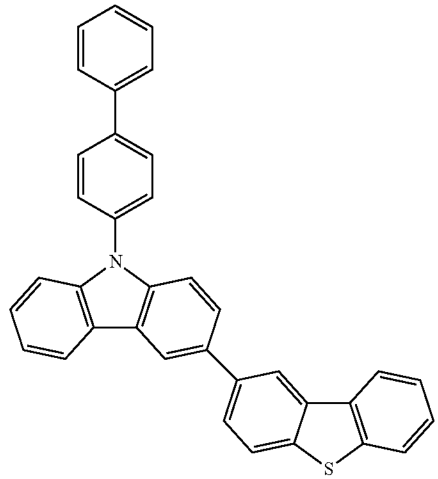
H-H66
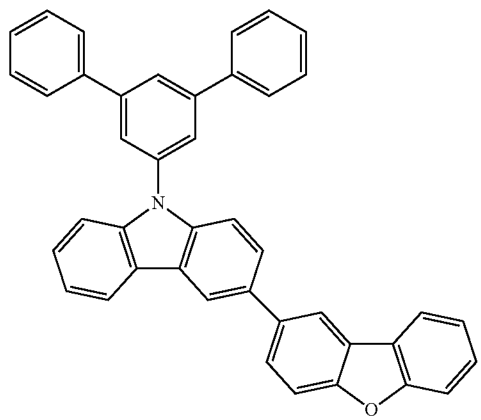
H-H67
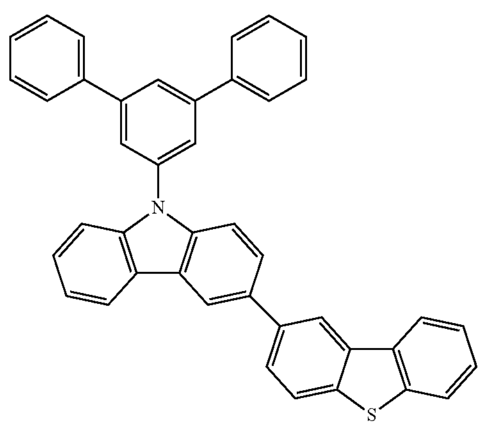

-continued
H-H68
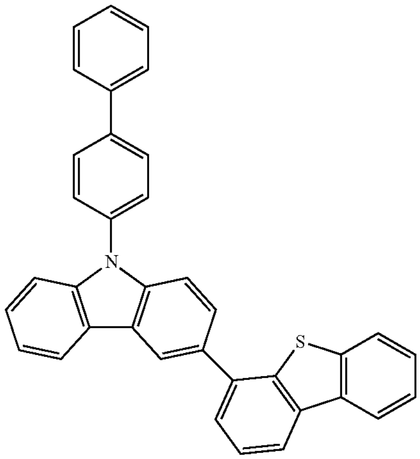
H-H69
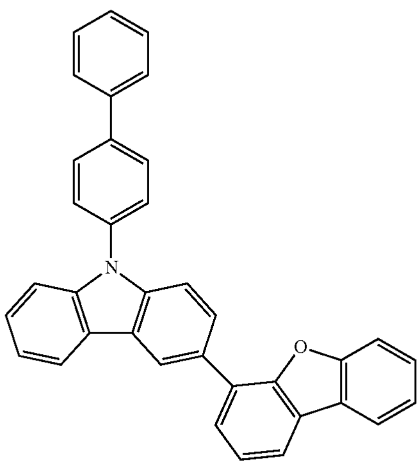
H-H70
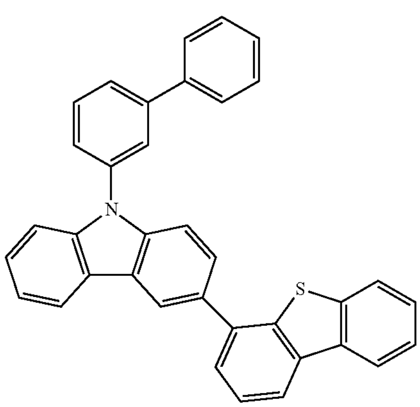
-continued
H-H71
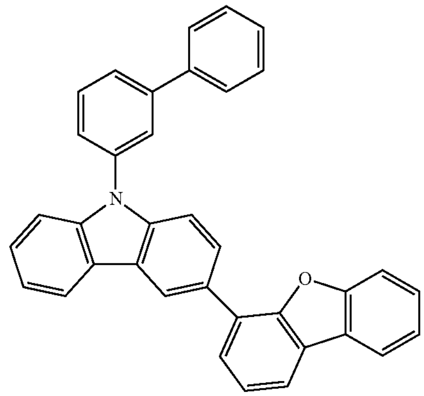
H-H72
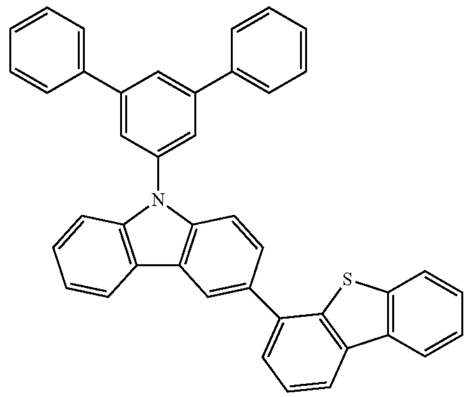
H-H73
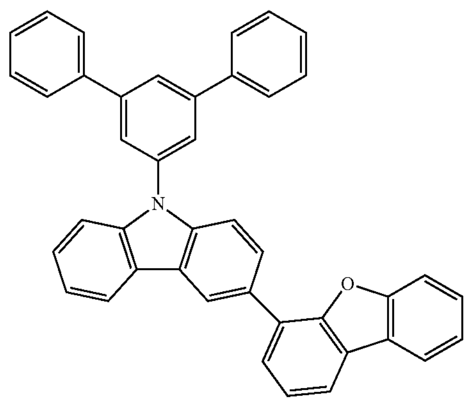
H-H74
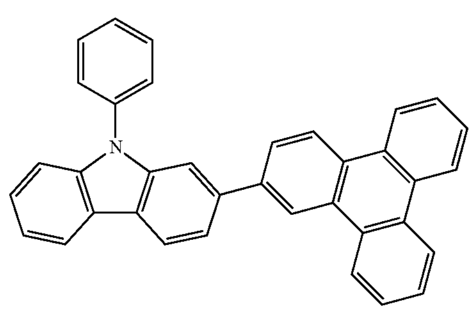

-continued
H-H75
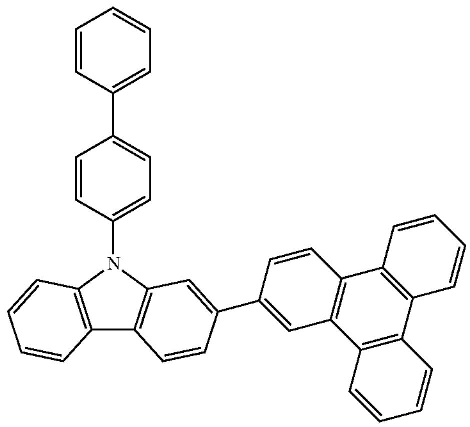
H-H76
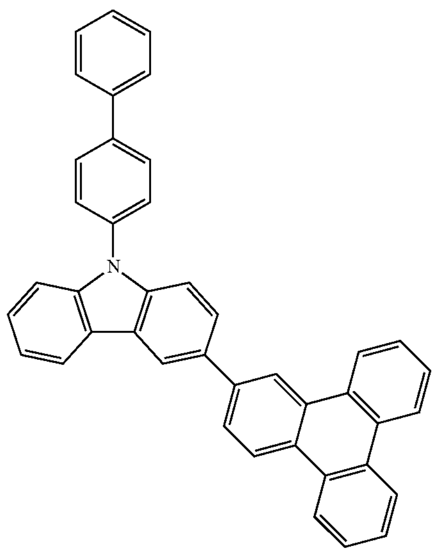
H-H77
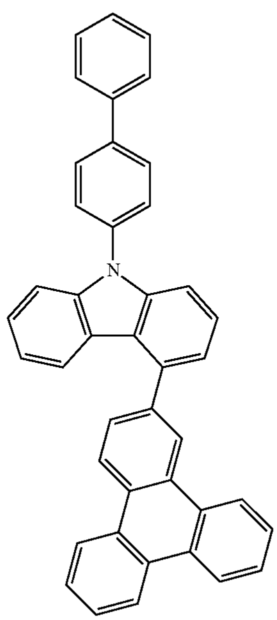
-continued
H-H78
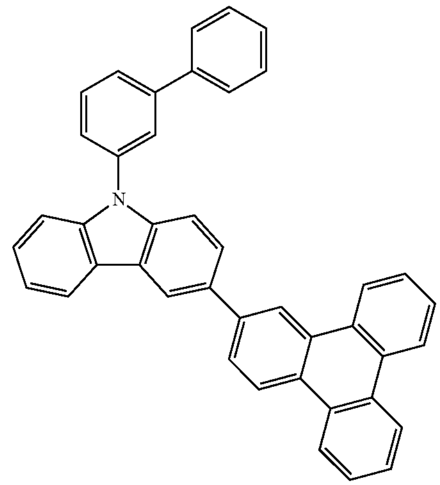
H-H79
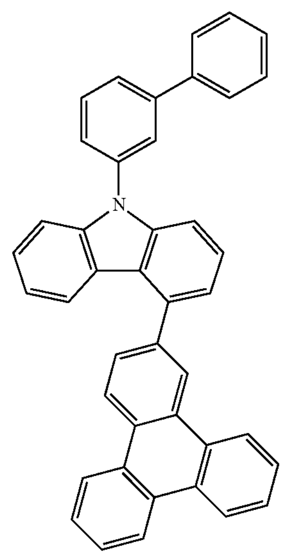
H-H80
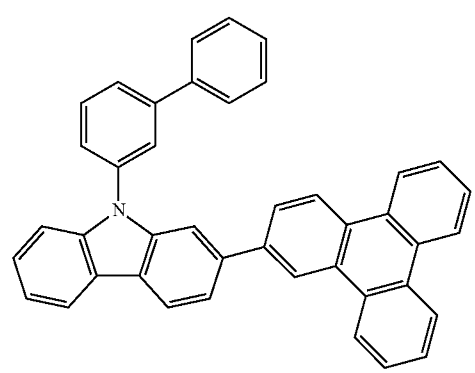

-continued
H-H81
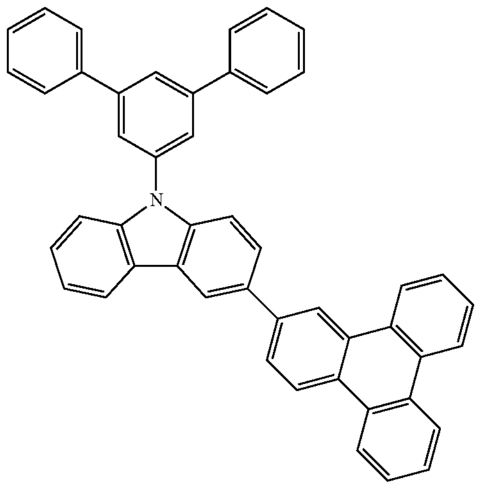
H-H82
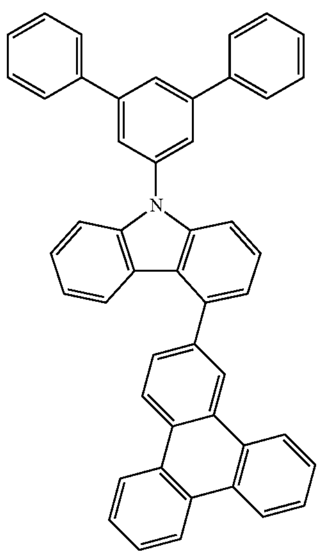
H-H83
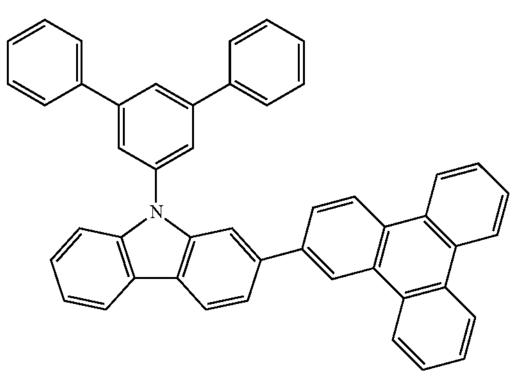
-continued
H-H84
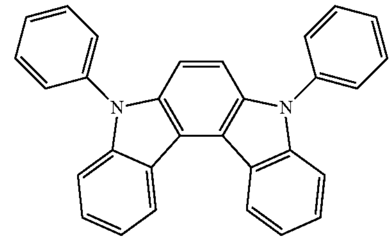
H-H85
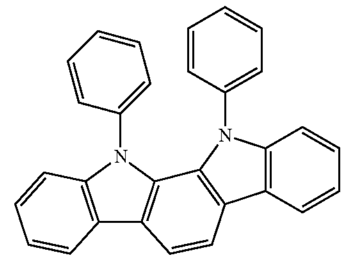
H-H86
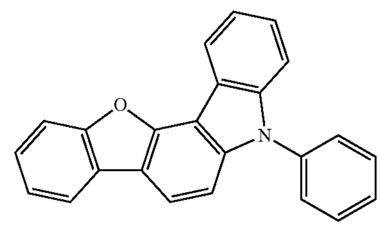
H-H87
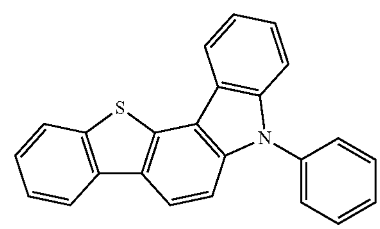
H-H88
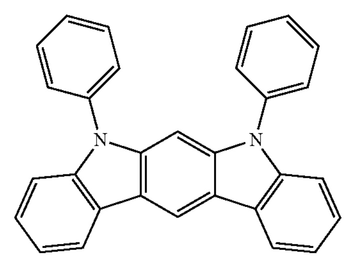
H-H89
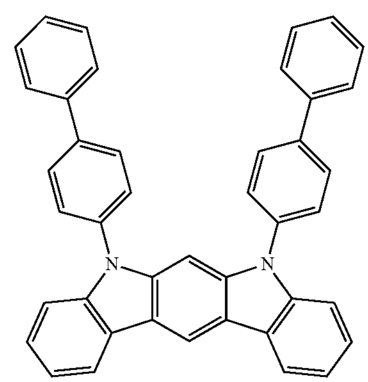

H-H90
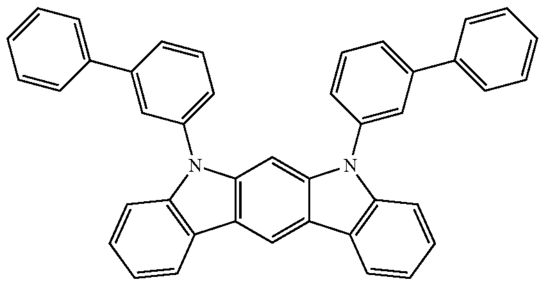
H-H91
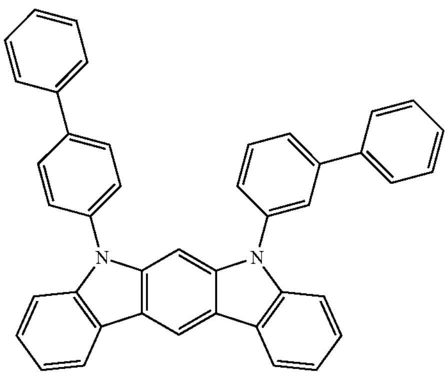
H-H92
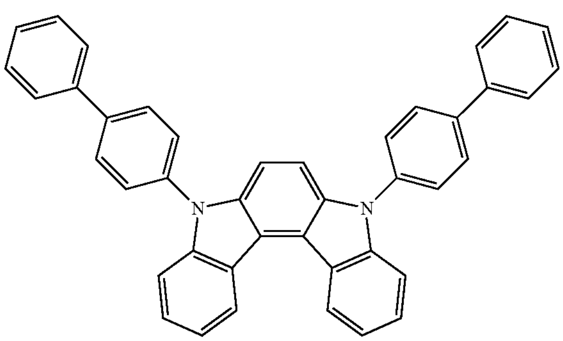
H-H93
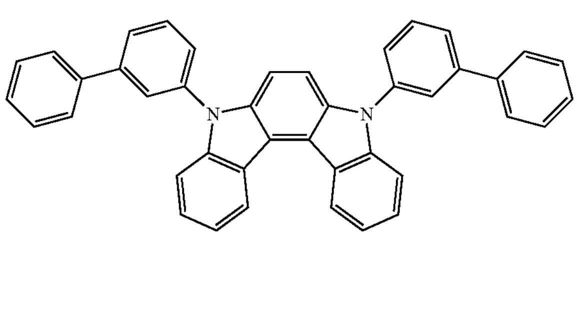
H-H94
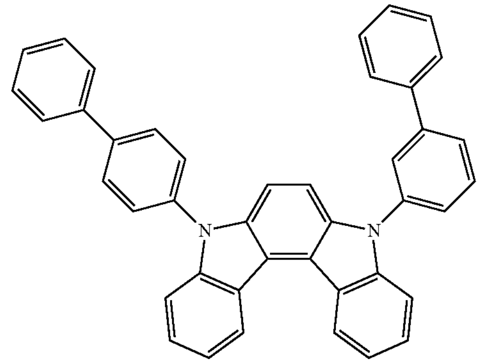
H-H95
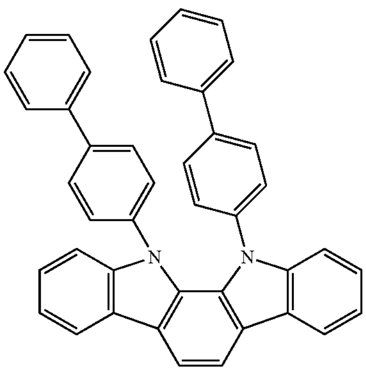
H-H96
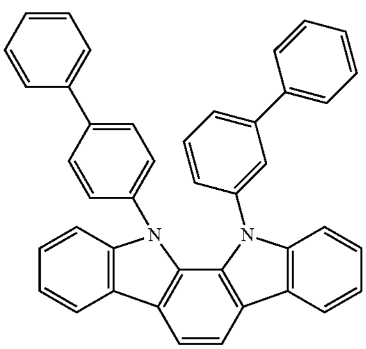
H-H97
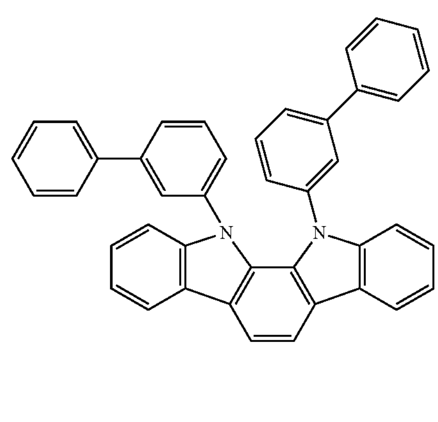

-continued

H-H98

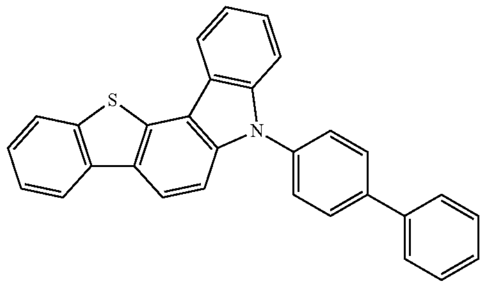

H-H99

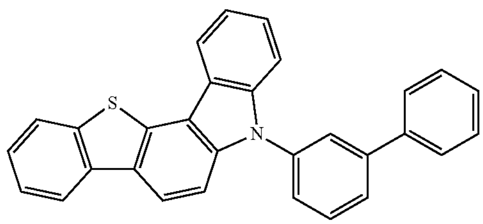

H-H100

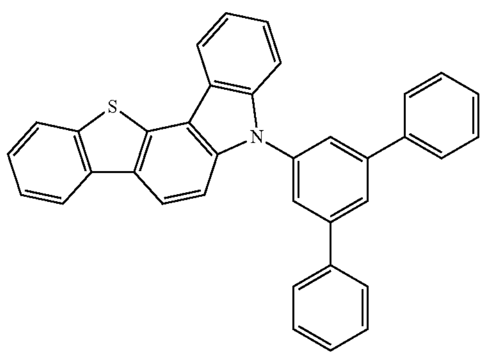

H-H101

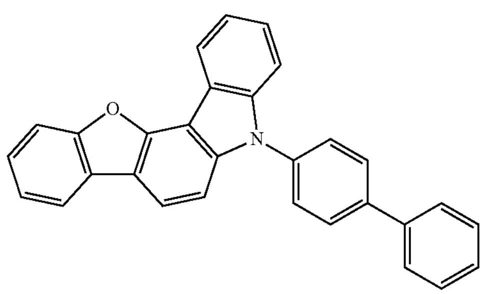

H-H102

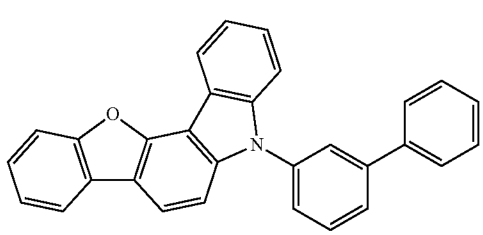

-continued

H-H103

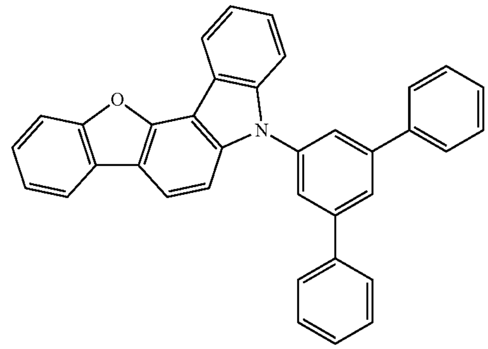

In one or more embodiments, the host may include the electron transport host and the hole transport host, wherein the electron transport host may include at least one selected from a triazine group, a pyrimidine group, and a cyano group, and the hole transport host may include a carbazole group, but embodiments of the present disclosure are not limited thereto.

A weight ratio of the electron transport host to the hole transport host may be in a range of about 1:9 to about 9:1, for example, about 2:8 to about 8:2, and in one or more embodiments, may be in a range of about 4:6 to about 6:4. While not wishing to be bound by theory, it is understood that when the weight ratio of the electron transport host to the hole transport host is within these ranges above, the balanced transport of holes and electrons may be achieved in the emission layer 15.

In an embodiment, the electron transport host may not be BCP, Bphene, B3PYMPM, 3P-T2T, BmPyPb, TPBi, 3TPYMB, or BSFM:

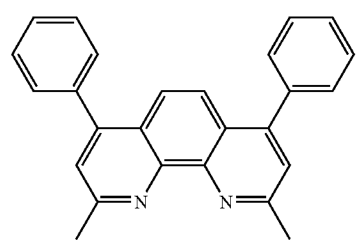

BCP

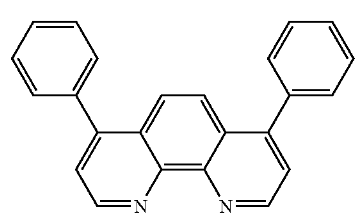

Bphen

-continued

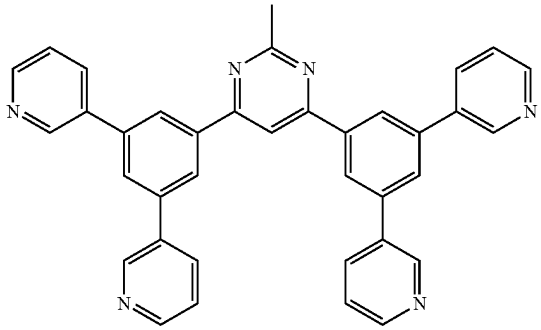

B3PYMPM

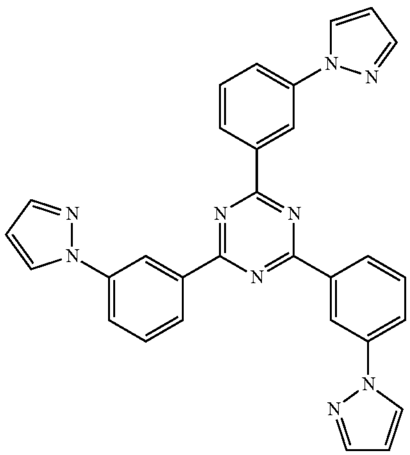

3P-T2T

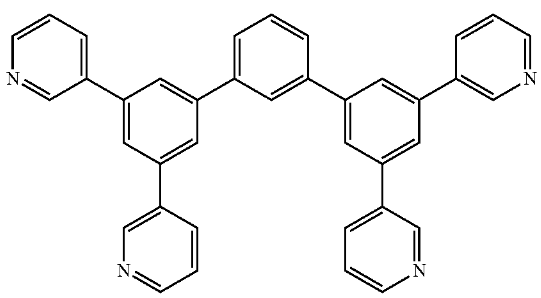

BmPyPb

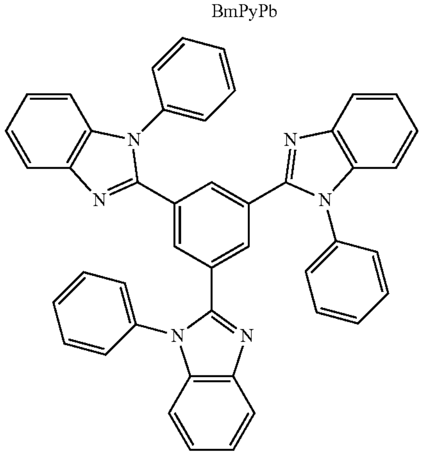

TPBi

-continued

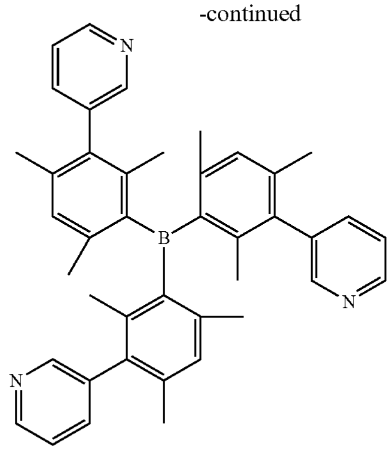

3TPYMB

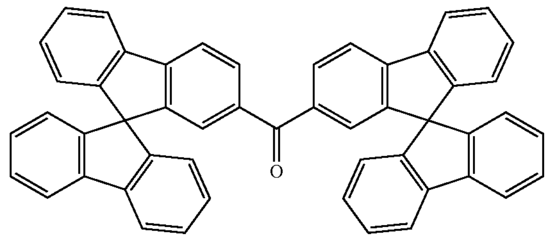

BSFM

In one or more embodiments, the hole transport host may not be mCP, CBP, and an amine-containing compound:

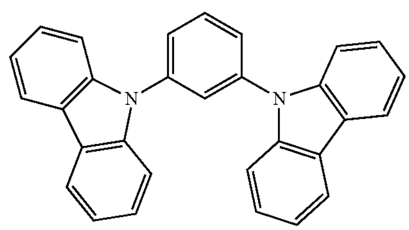

mCP

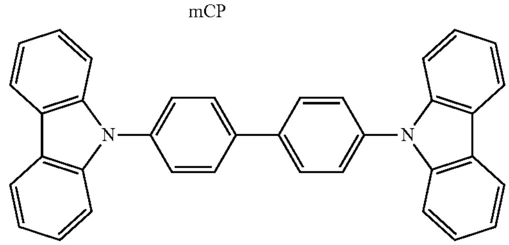

CBP

In one or more embodiments, the host may only include the electron transport host. For example, the host may include only one compound among the examples of the electron transport host, or a mixture of two different compounds among the examples of the electron transport host.

In one or more embodiments, the host may only include the hole transport host. For example, the host may include only one compound among the examples of the hole transport host, or a mixture of two different compounds among the examples of the hole transport host.

Hole Transport Region 12

In the organic light-emitting device 10, the hole transport region 12 is disposed between the first electrode 11 and the emission layer 15.

The hole transport region 12 may have a single-layered structure or a multi-layered structure.

For example, the hole transport region may have a single-layered structure formed of a hole injection layer, a single-layered structure formed of a hole transport layer, or a hole injection layer/hole transport layer structure, a hole injection layer/first hole transport layer/second hole transport layer structure, a hole transport layer/interlayer structure, a hole injection layer/hole transport layer/interlayer structure, a hold transport layer/electron blocking layer structure, or a hole injection layer/hole transport layer/electron blocking layer structure, but embodiments of the present disclosure are not limited thereto.

The hole transport region 12 may include any compound having hole transport characteristics.

For example, the hole transport region 12 may include an amine-based compound.

In an embodiment, the hole transport region 12 may include at least one compound selected from compounds represented by Formulae 201 to 205, but embodiments of the present disclosure are not limited thereto:

Formula 201

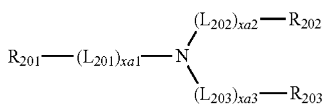

Formula 202

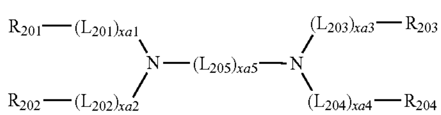

Formula 203

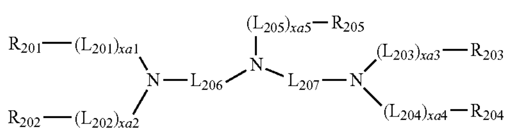

Formula 204

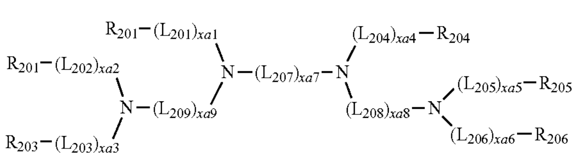

Formula 205

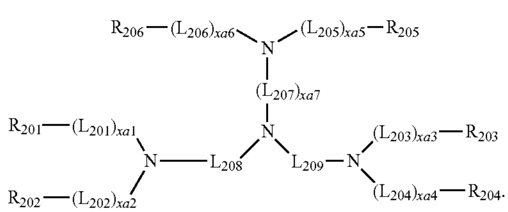

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer of 0 to 5, $R_{201}$ to $R_{206}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein two neighboring groups among $R_{201}$ to $R_{206}$ may optionally be linked via a single bond, a dimethyl-methylene group, or a diphenyl-methylene group.

For example, $L_{201}$ to $L_{209}$ may each independently be selected from a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corozene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{11}$)($Q_{12}$)($Q_{13}$), xa1 to xa9 may each independently be 0, 1, or 2, $R_{201}$ to $R_{206}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, and a benzothienocarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$.

In an embodiment, the hole transport region 12 may include a carbazole group-containing amine-based compound.

In one or more embodiments, the hole transport region 12 may include a carbazole group-containing amine-based compound and a carbazole group-free amine-based compound.

The carbazole group-containing amine-based compound may be selected from, for example, a group represented by Formula 201 which includes a carbazole group and additionally includes, in addition to the carbazole group, at least one selected from a dibenzofuran group, a dibenzothiophene group, a fluorene group, a spiro-fluorene group, an indenocarbazole group, an indolocarbazole group, a benzofurocarbazole group, and a benzothienocarbazole group.

The carbazole-free amine-based compound may be selected from, for example, a group represented by Formula 201 which does not include a carbazole group, but includes at least one selected from a dibenzofuran group, a dibenzothiophene group, a fluorene group, a spiro-fluorene group, an indenocarbazole group, an indolocarbazole group, a benzofurocarbazole group, and a benzothienocarbazole group.

In one or more embodiments, the hole transport region 12 may include at least one selected from groups represented by Formulae 201 and 202.

In an embodiment, the hole transport region 12 may include at least one selected from groups represented by Formulae 201-1, 202-1, and 201-2, but embodiments of the present disclosure are not limited thereto:

Formula 201-1

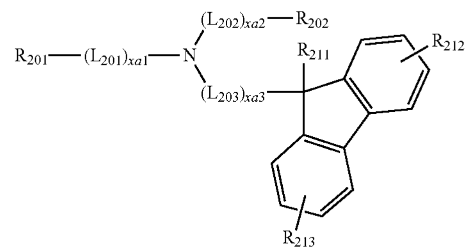

Formula 202-1

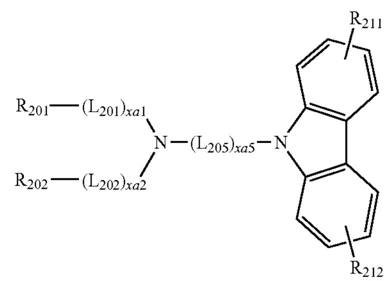

Formula 201-2

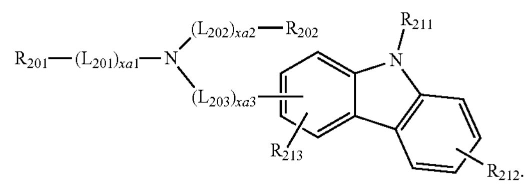

In Formulae 201-1, 202-1, and 201-2, $L_{201}$ to $L_{203}$, $L_{205}$, xa1 to xa3, xa5, $R_{201}$, and $R_{202}$ are the same as described above in the specification, and $R_{211}$ to $R_{213}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

For example, the hole transport region 12 may include at least one selected from Compounds HT1 to HT36, but embodiments of the present disclosure are not limited thereto:

HT1
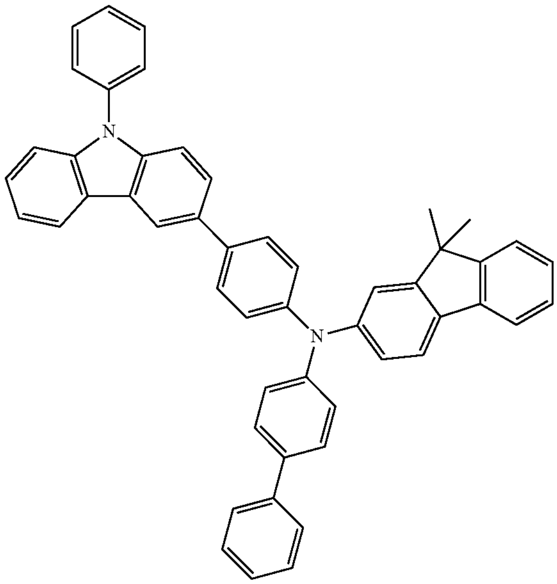
HT2
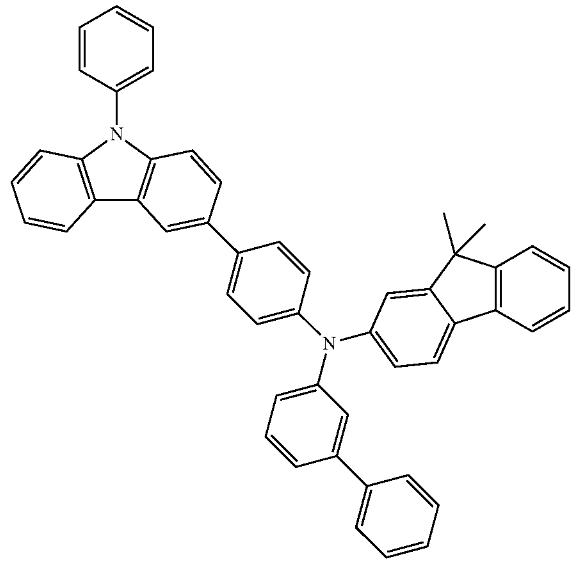
HT3
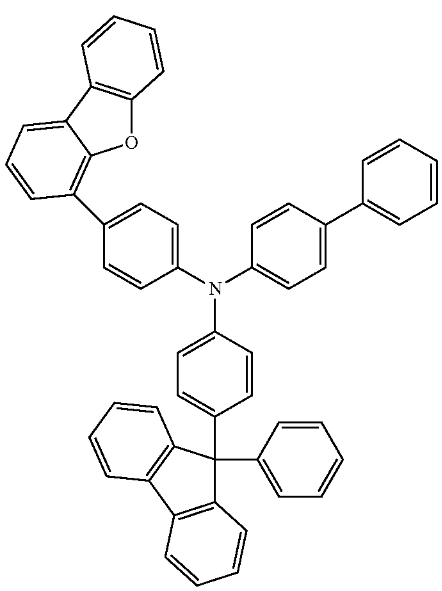
HT4
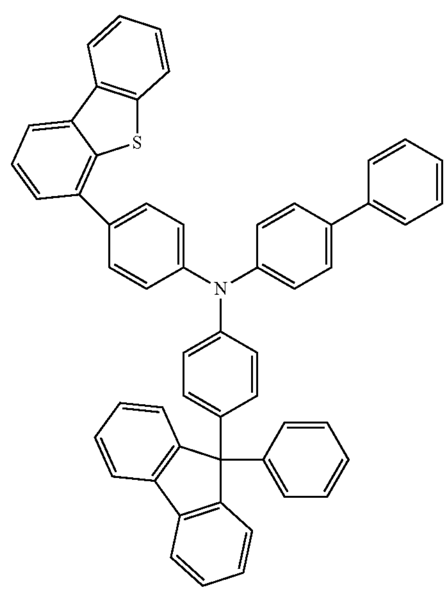

-continued
HT5
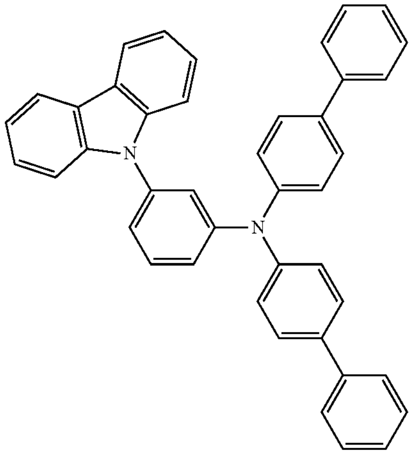
HT6
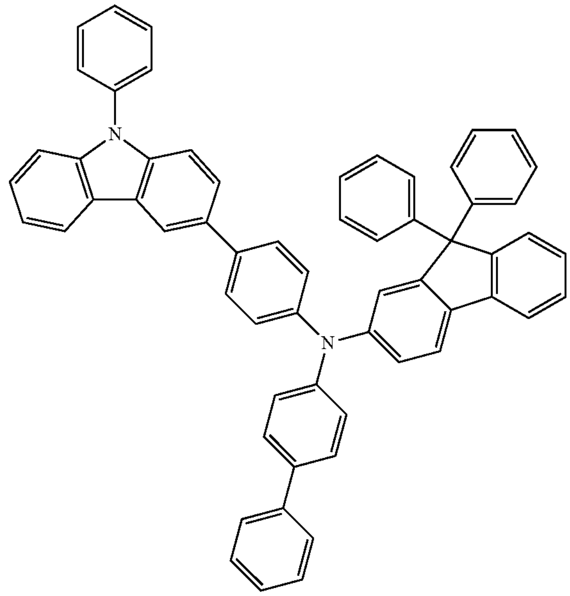
HT7
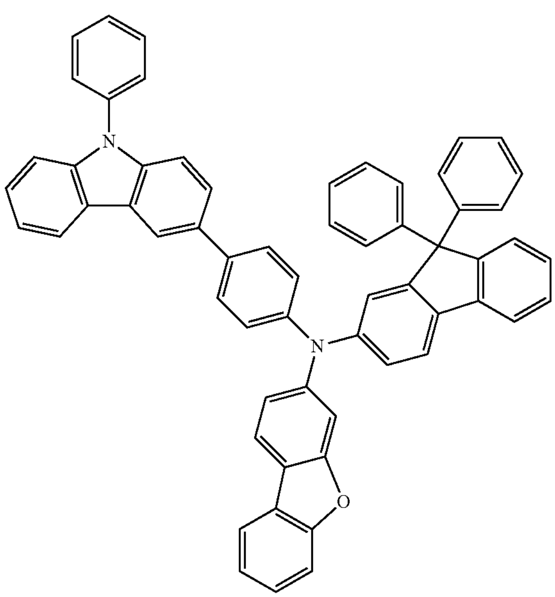
HT8
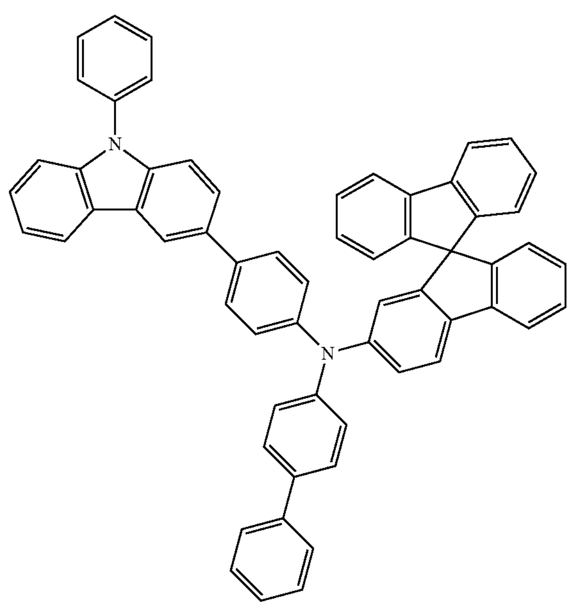

-continued
HT9
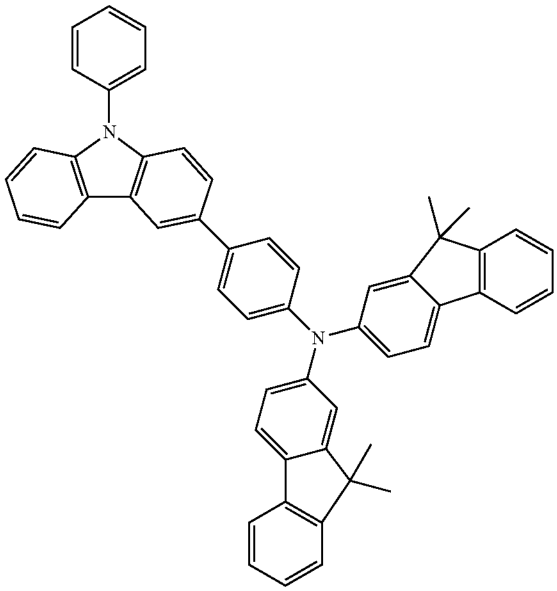
HT10
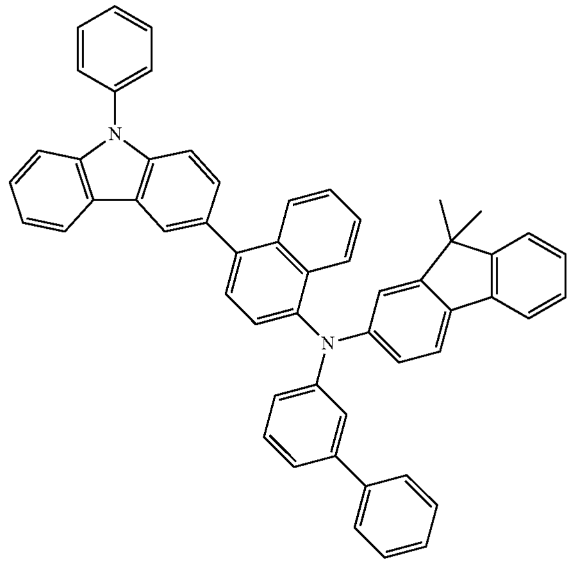
HT11
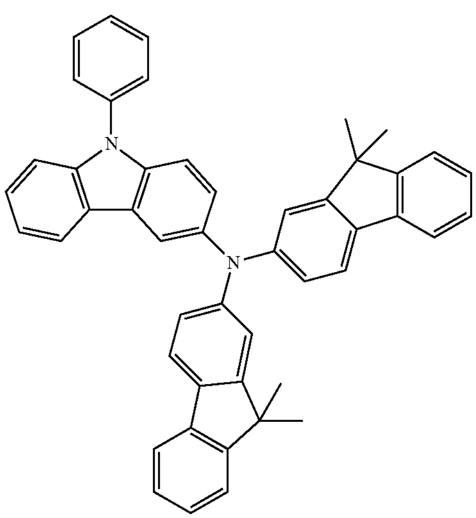
HT12
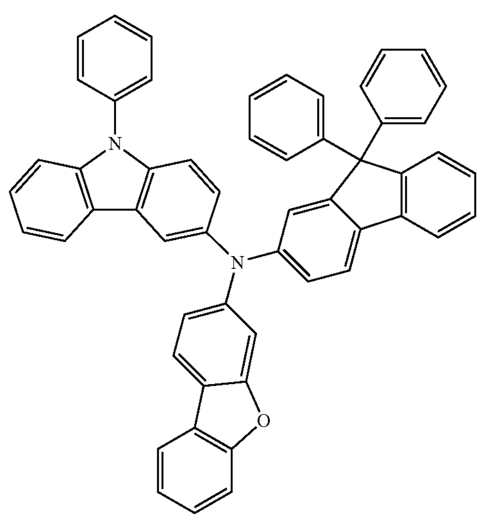

-continued
HT13
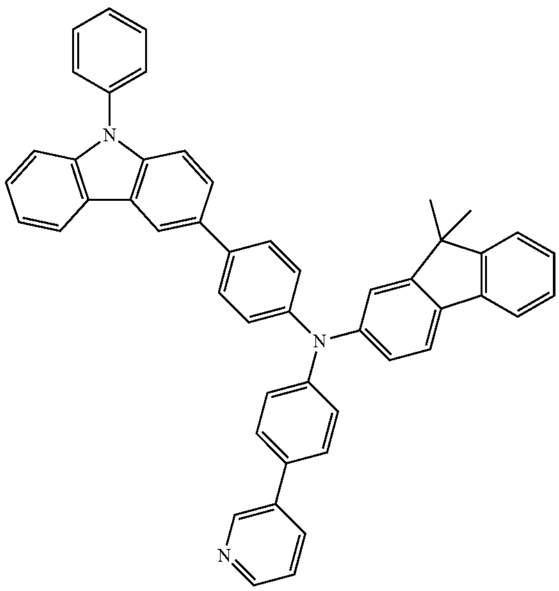
HT14
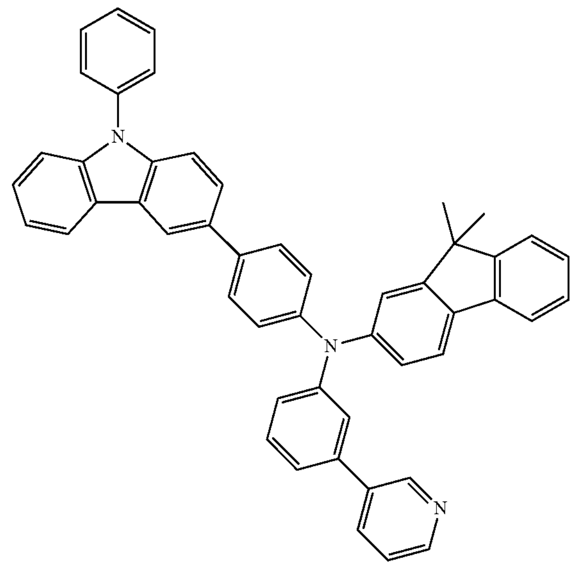
HT15
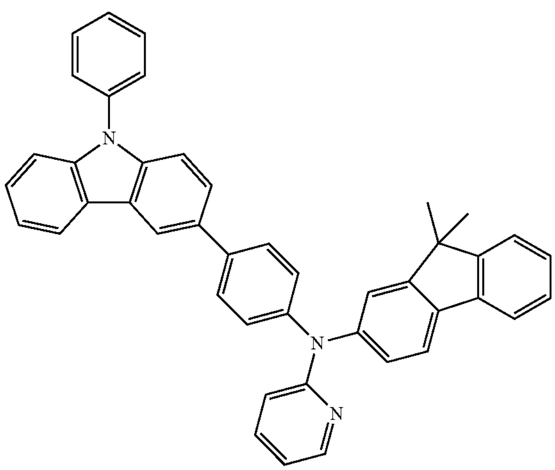
HT16
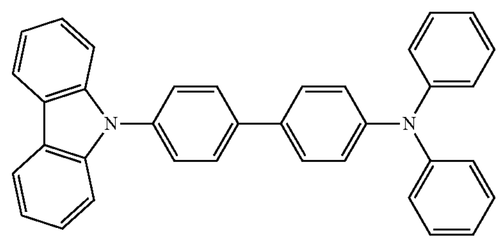
HT17
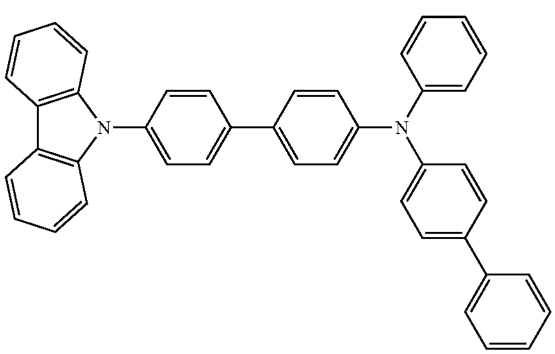
HT18
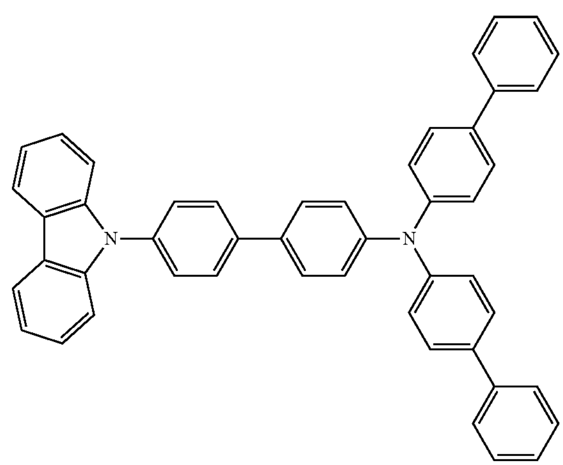

-continued
HT19
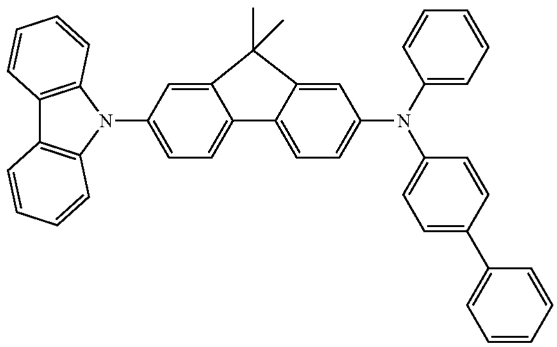
HT20
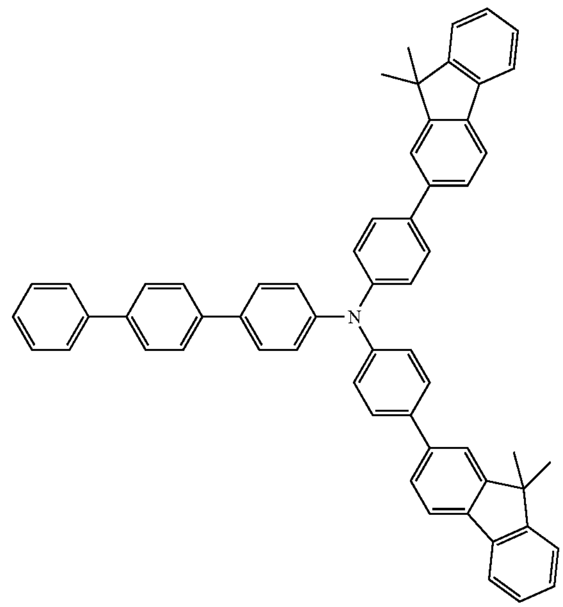
HT21
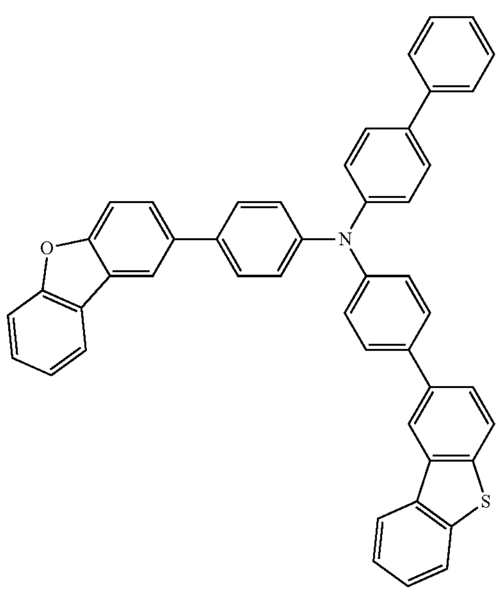
HT22
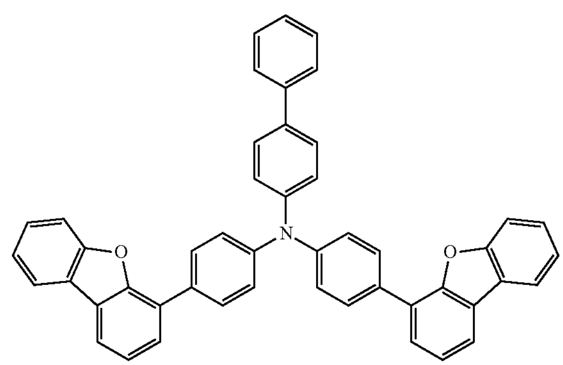

-continued
HT23
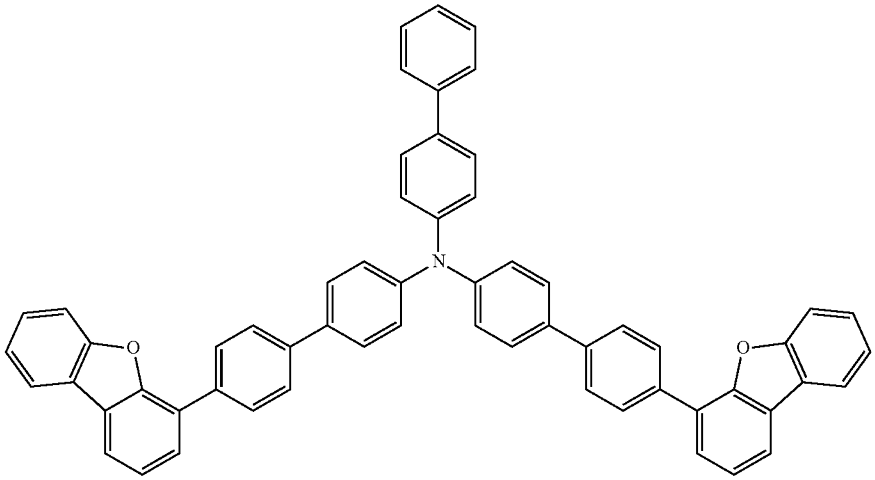
HT24
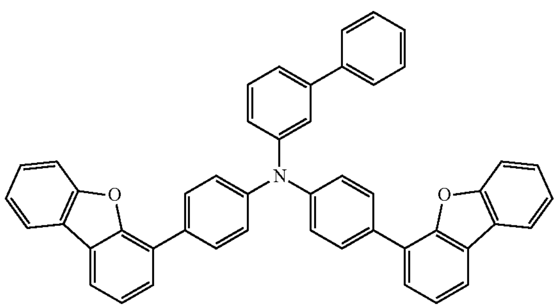
HT25
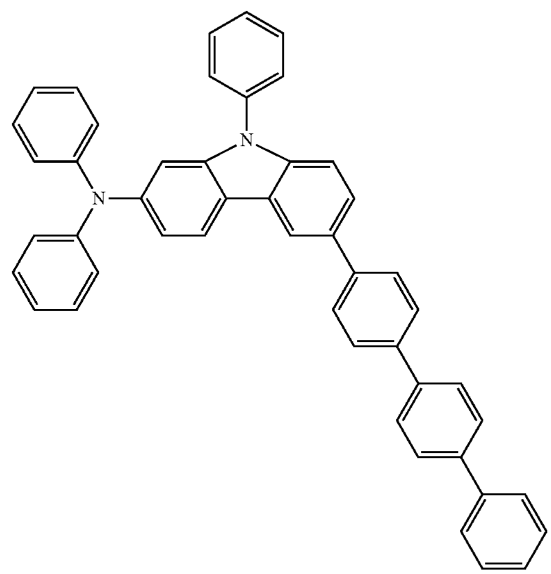
HT26
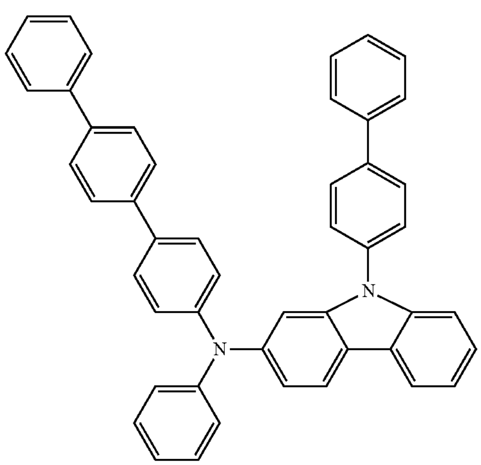
HT27
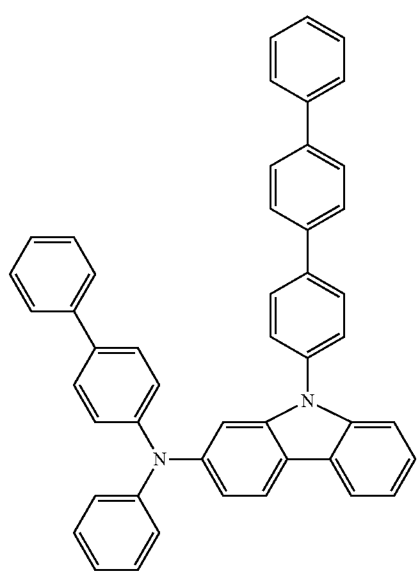

-continued
HT28
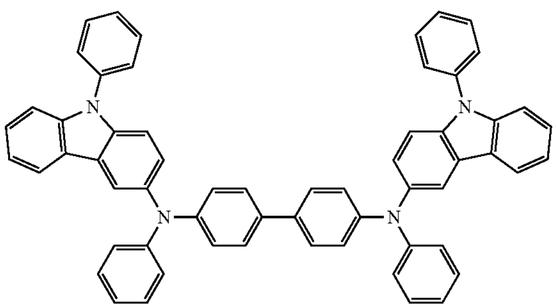
HT29
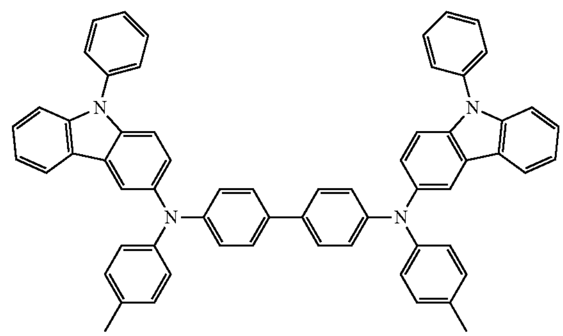
HT30
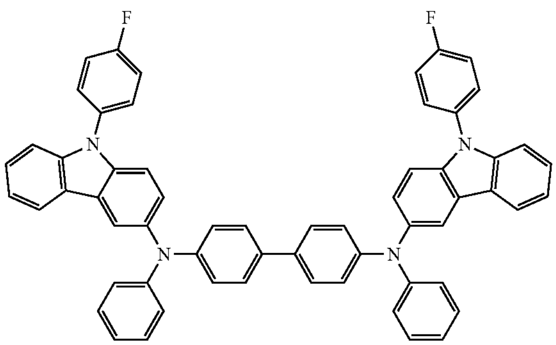
HT31
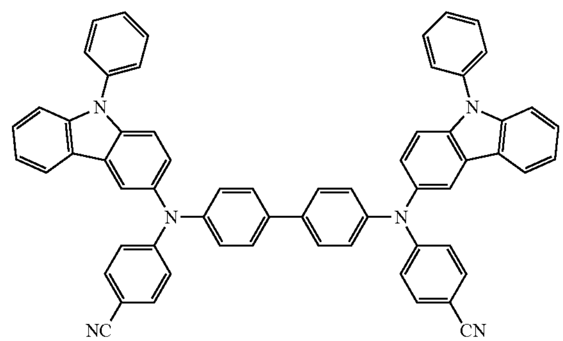
HT32
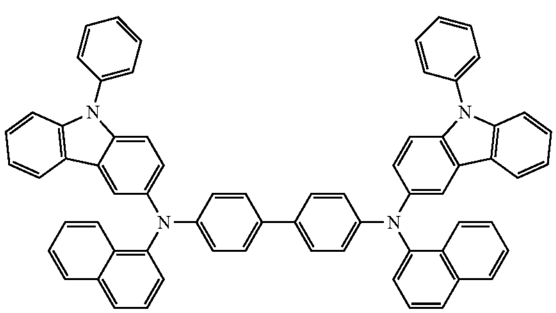
HT33
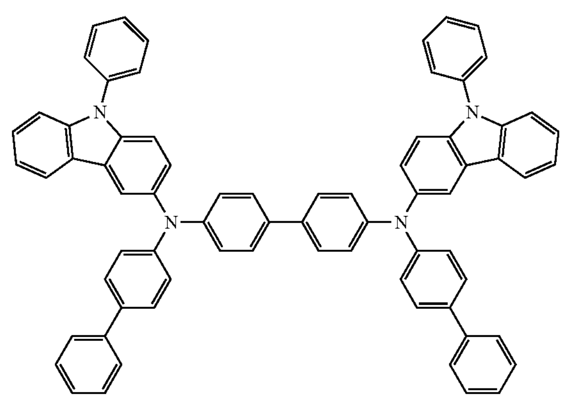
HT34
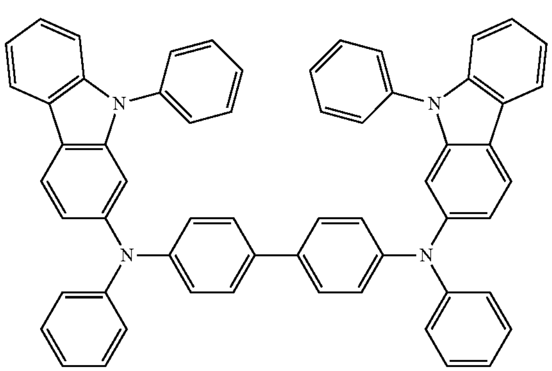
HT35
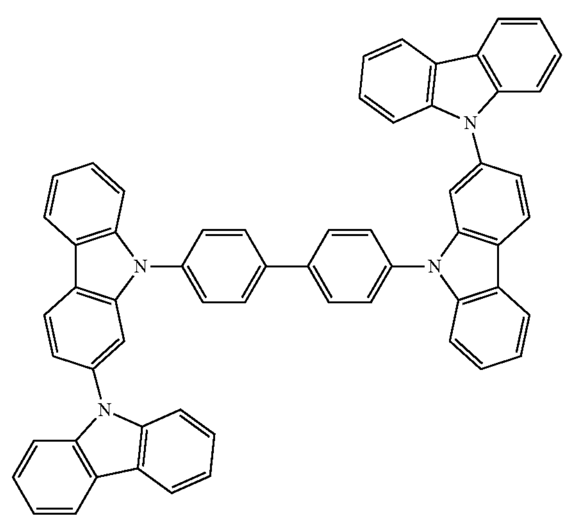

-continued

HT36

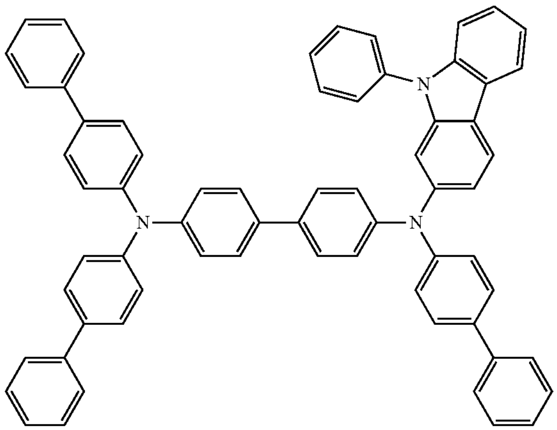

HT37

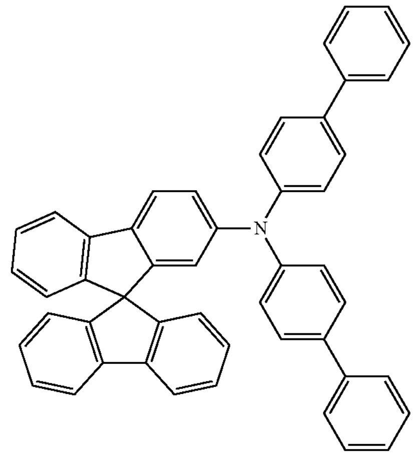

HT38

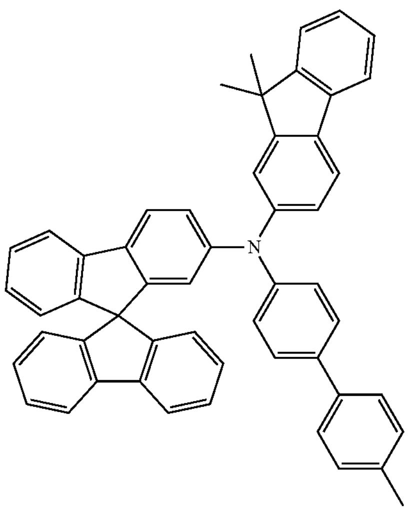

HT39

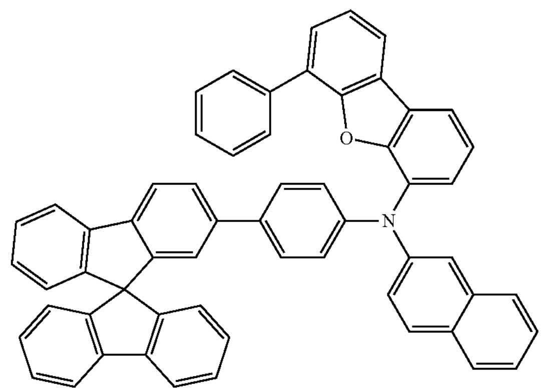

In an embodiment, the hole transport region 12 in the organic light-emitting device 10 may further include a p-dopant. When the hole transport region 12 further include a p-dopant, the hole transport region 12 have a structure including a matrix (for example, at least one selected from compounds represented by Formulae 201 to 205) and a p-dopant included in the matrix. The p-dopant may be homogeneously or non-homogeneously doped in the hole transport region 12.

In an embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ), 2,3,5,6-tetrafluoro-7,7,8,8-tetracyanoquinodimethane (F4-TCNQ), and F6-TCNNQ;

a metal oxide, such as tungsten oxide and molybdenum oxide;

1,4,5,8,9,11-hexaazatriphenylene-hexacarbonitrile (HAT-CN); and a compound represented by Formula 221, but embodiments of the present disclosure are not limited thereto:

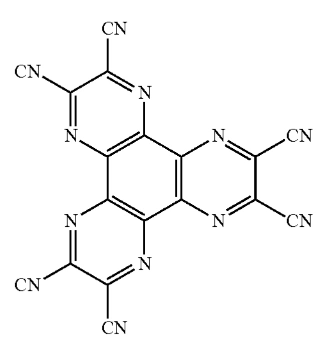

HAT-CN

-continued

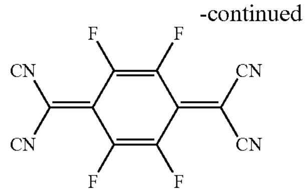

F4-TCNQ

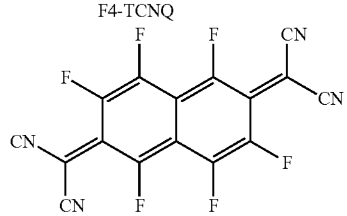

F6-TCNNQ

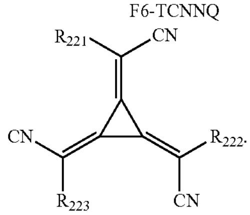

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

A thickness of the hole transport region 12 may be in a range of about 100 Å to about 10,000 Å, for example, about 400 Å to about 2,000 Å, and a thickness of the emission layer 15 may be in a range of about 100 Å to about 3,000 Å, for example, about 300 Å to about 1,000 Å. While not wishing to be bound by theory, it is understood that when the thicknesses of the hole transport region 12 and the emission layer 15 are within these ranges, satisfactory hole transport characteristics and/or emission characteristics may be obtained without a substantial increase in driving voltage.

Electron Transport Region 17

In the organic light-emitting device 10, the electron transport region 17 is disposed between the emission layer 15 and the second electrode 19.

The electron transport region 17 may have a single-layered structure or a multi-layered structure.

For example, the electron transport region may have a single-layered structure formed of an electron transport layer, or an electron transport layer/electron injection layer structure, a buffer layer/electron transport layer structure, a hole blocking layer/electron transport layer structure, a buffer layer/electron transport layer/electron injection layer structure, or a hole blocking layer/electron transport layer/electron injection structure, but embodiments of the structure of the electron transport region are not limited thereto. The electron transport region 17 may also include an electron control layer.

The electron transport region 17 may include a known electron transport material.

The electron transport region (for example, a buffer layer, a hole blocking layer, an electron control layer, or an electron transport layer in the electron transport region) may include a metal-free compound containing at least one π electron-depleted nitrogen-containing cyclic group. The π electron-depleted nitrogen-containing cyclic group is the same as described above.

For example, the electron transport region may include a compound represented by Formula 601:

$$[Ar_{601}]_{xe11}\text{-}[(L_{601})_{xe1}\text{-}R_{601}]_{xe21}. \quad \text{Formula 601}$$

In Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of groups $Ar_{601}$ in the number of xe11 and groups $R_{601}$ in the number of xe21 may include the π electron-depleted nitrogen-containing cyclic group.

In an embodiment, in Formula 601, ring $Ar_{601}$ and $L_{601}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more groups $Ar_{601}$ may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

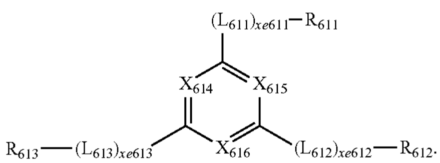

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, xe1 and xe611 to xe613 in Formulae 601 and 601-1 may each independently be 0, 1, or 2.

In one or more embodiments, in Formulae 601 and 601-1, $R_{601}$ and $R_{611}$ to $R_{613}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$($Q_{601}$), and —P(═O)($Q_{601}$)($Q_{602}$), and $Q_{601}$ and $Q_{602}$ may be the same as described above.

The electron transport region may include at least one compound selected from Compounds ET1 to ET36, but embodiments of the present disclosure are not limited thereto:

ET1

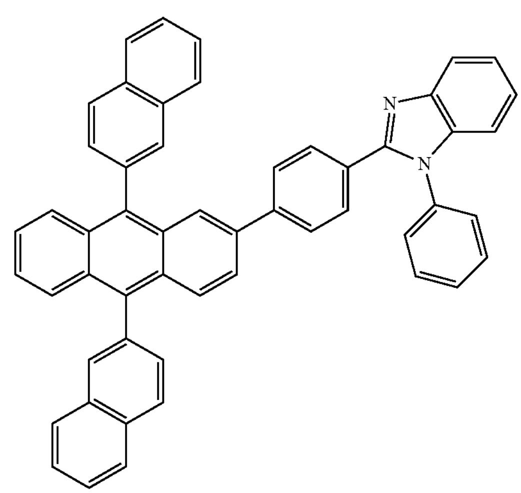

-continued
ET2
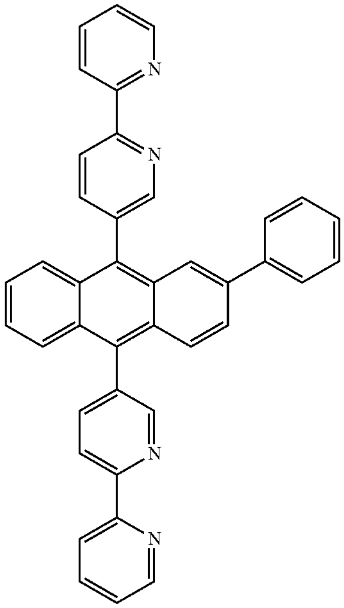
ET3
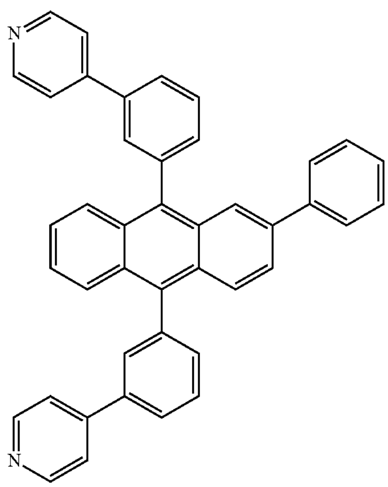
ET4
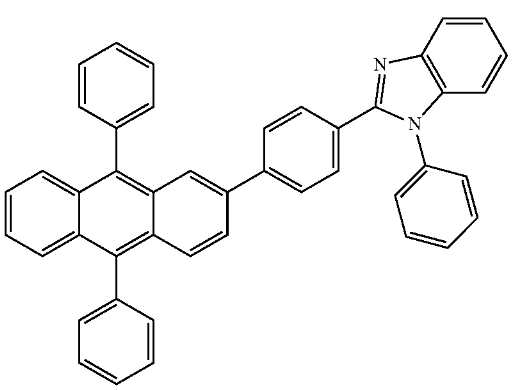
-continued
ET5
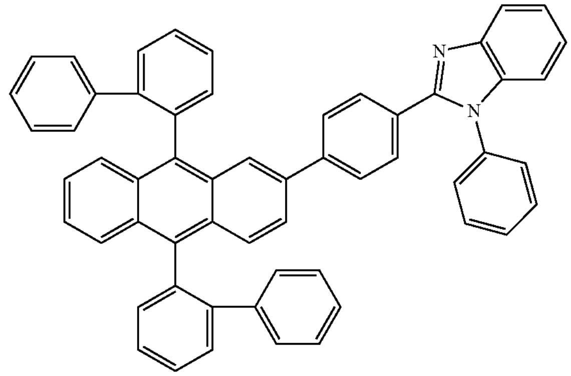
ET6
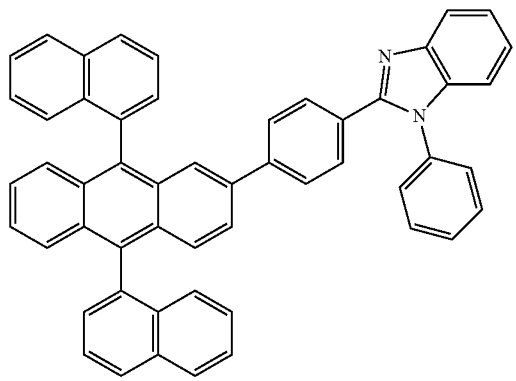
ET7
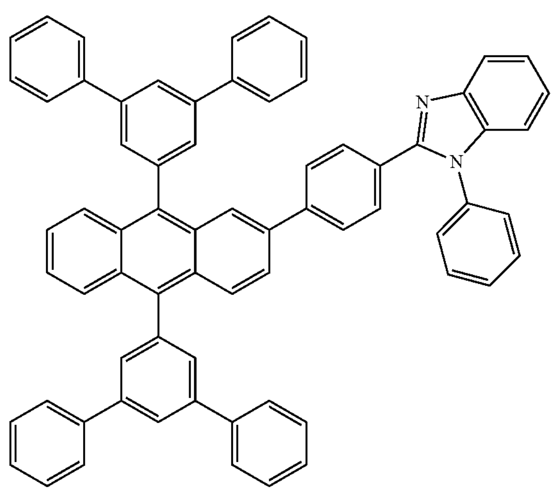

-continued
ET8
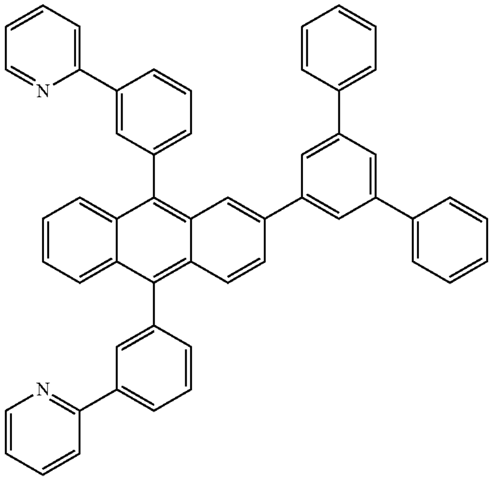
ET9
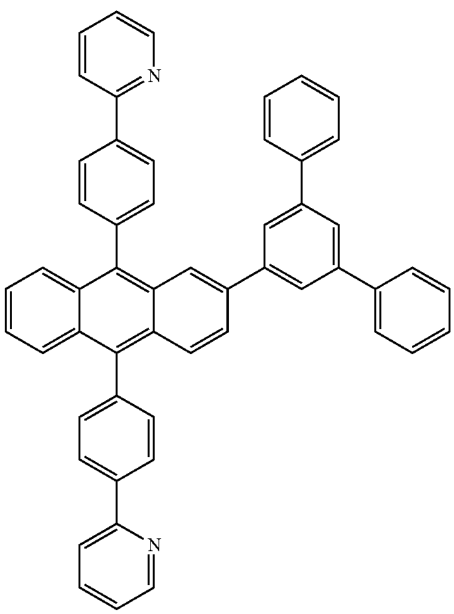
-continued
ET10
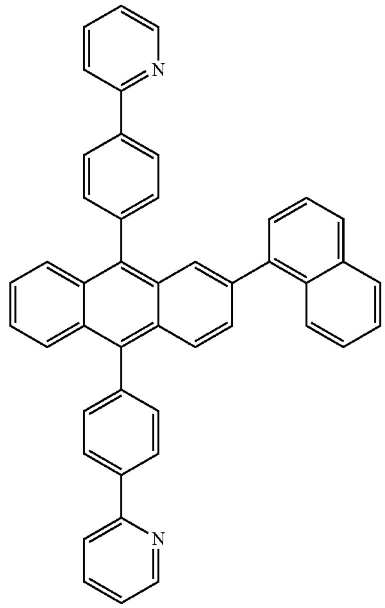
ET11
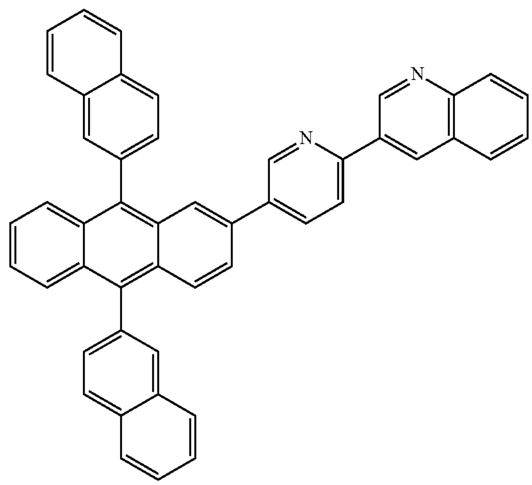
ET12
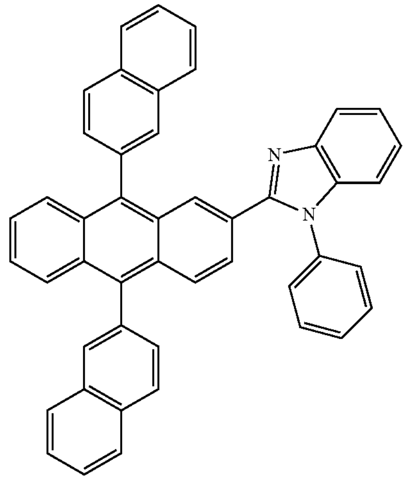

-continued
ET13
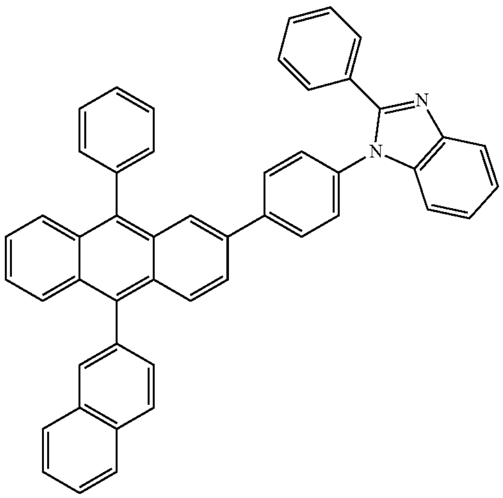
ET14
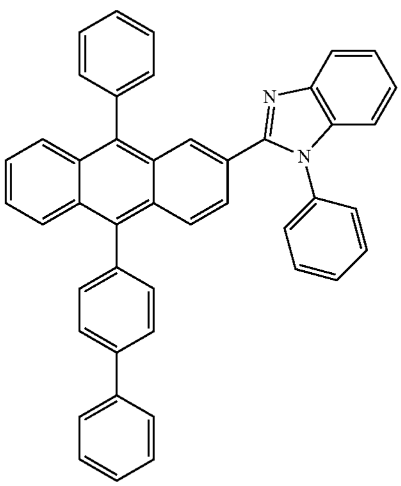
ET15
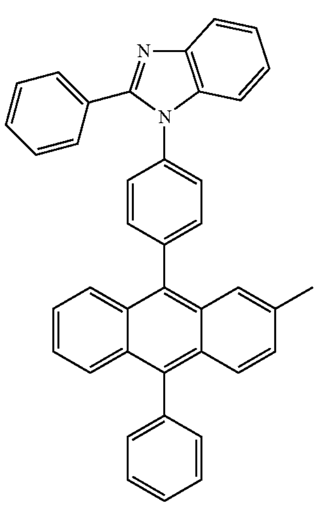
-continued
ET16
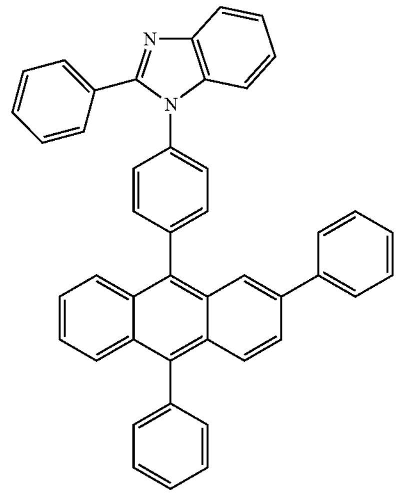
ET17
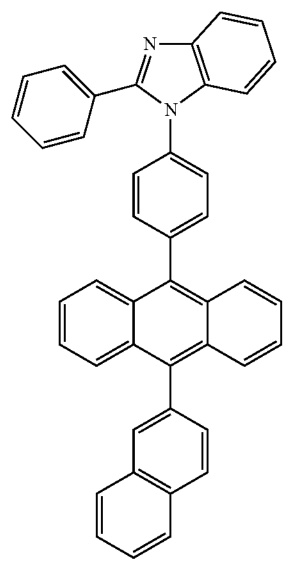
ET18
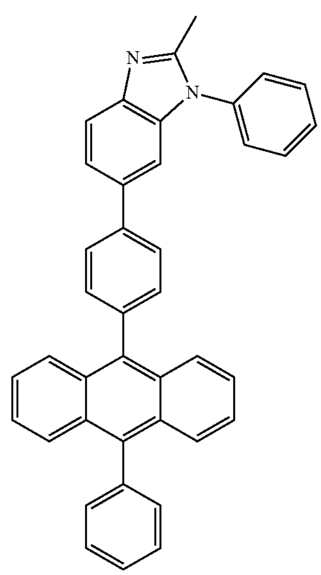

ET19
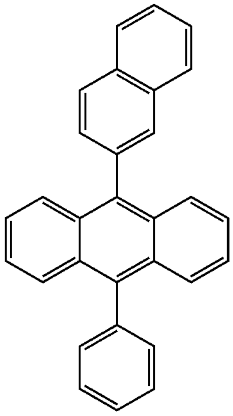
ET20
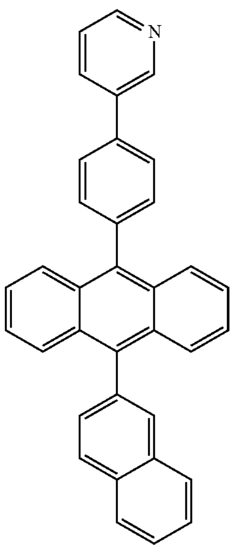
ET21
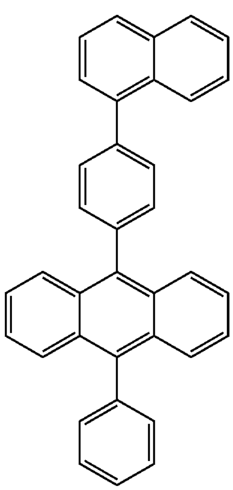
ET22
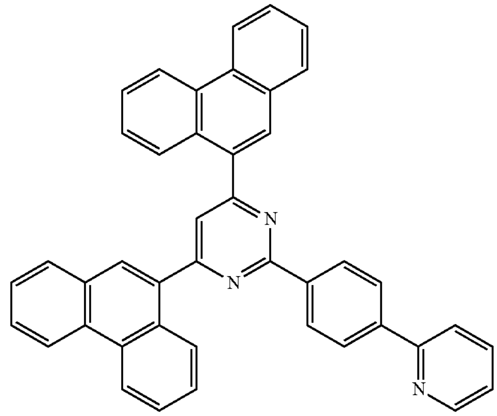
ET23
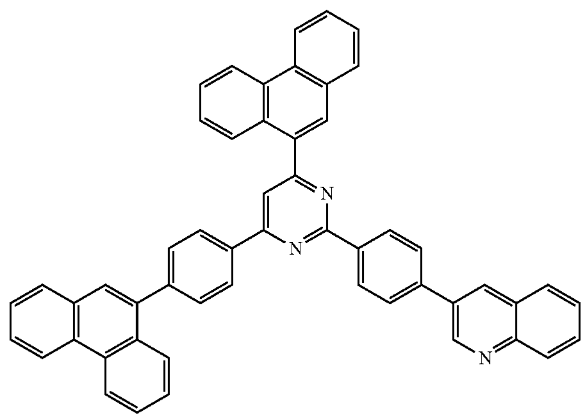
ET24
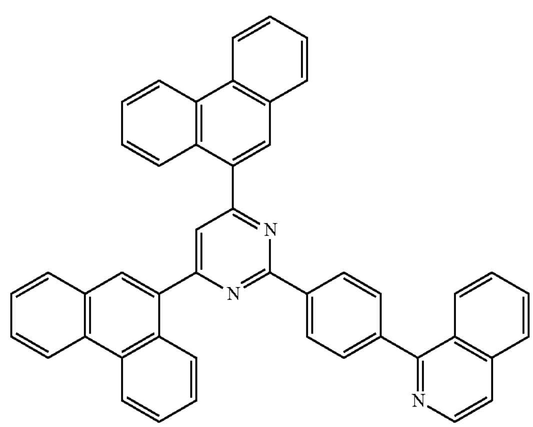

-continued
ET25
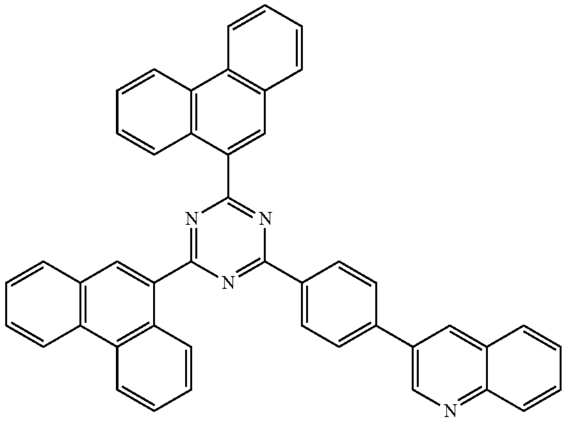
ET26
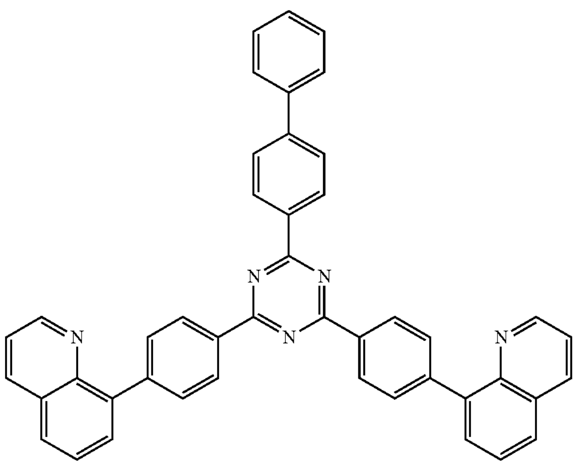
ET27
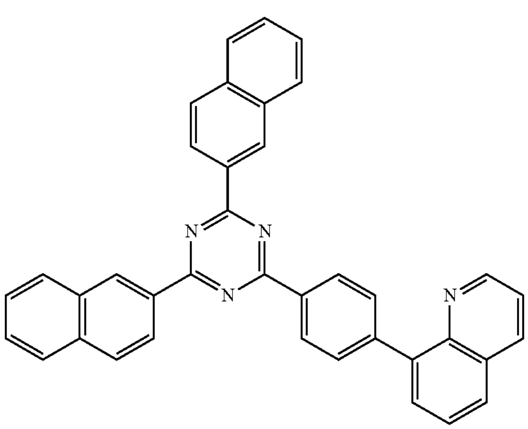
-continued
ET28
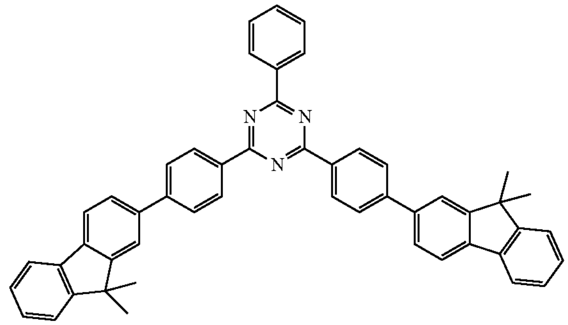
ET29
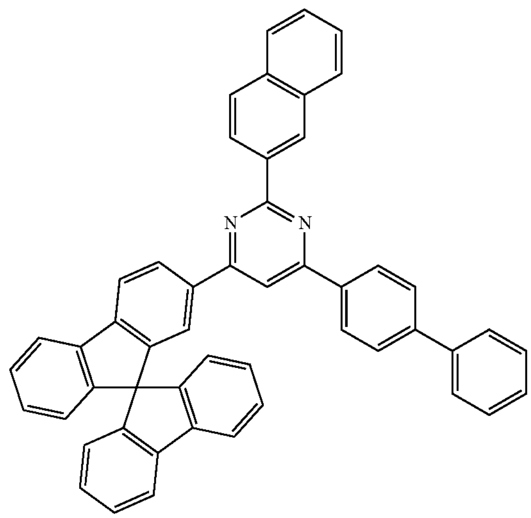
ET30
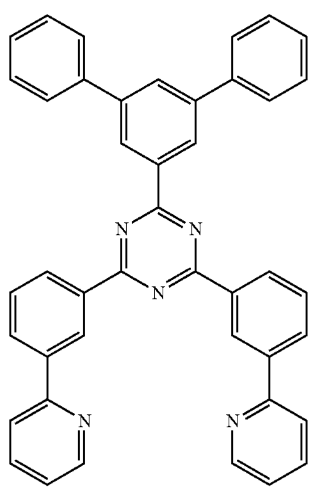

ET31
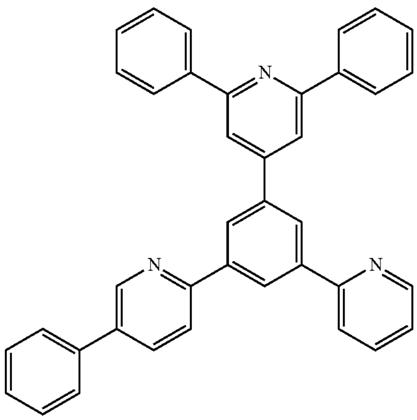
ET32
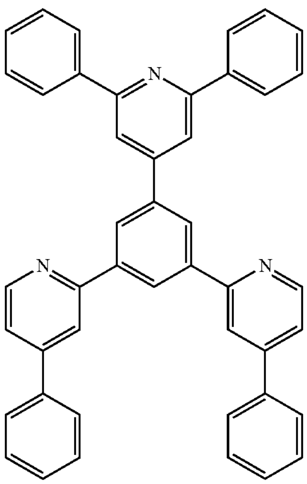
ET33
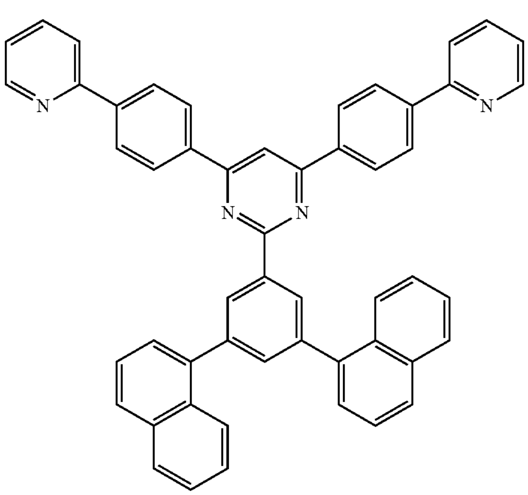
ET34
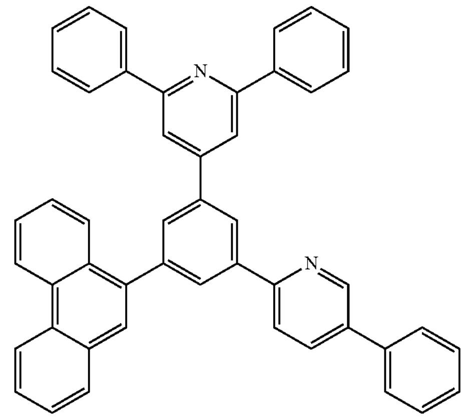
ET35
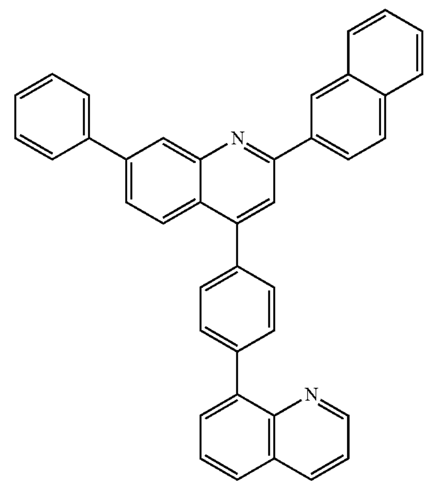
ET36
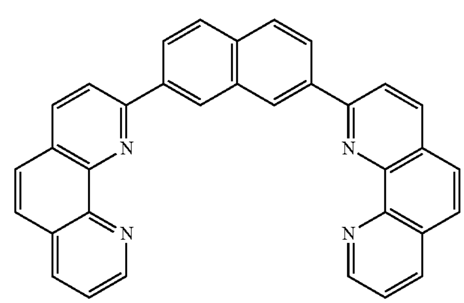
In one or more embodiments, the electron transport region may include at least one selected from 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.

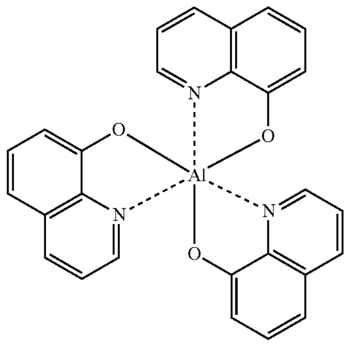

Alq3

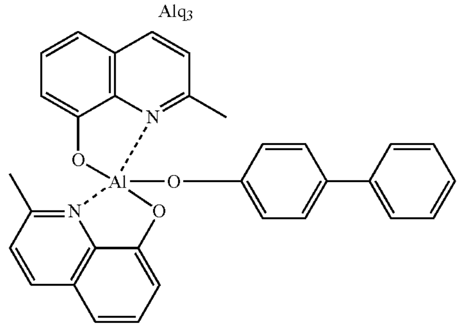

BAlq

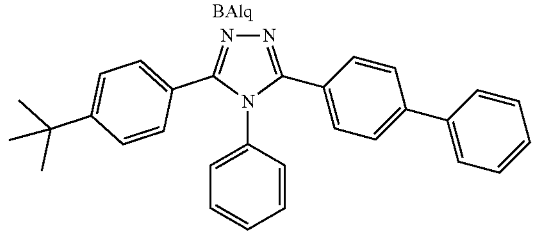

TAZ

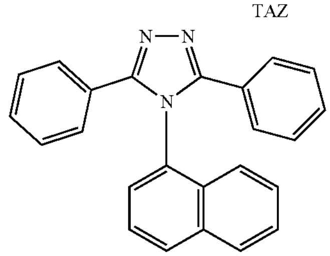

NTAZ

A thickness of the buffer layer, the hole blocking layer, or the electron controlling layer may be in a range of about 20 Å to about 1,000 Å, for example, about 30 Å to about 300 Å. While not wishing to be bound by theory, it is understood that when the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium 8-hydroxyquinolate, LiQ) or ET-D2.

ET-D1

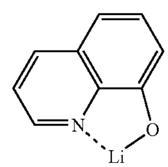

ET-D2

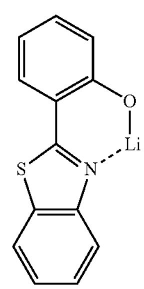

The electron transport region 17 may include an electron injection layer that facilitates injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In an embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In an embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In an embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

Second Electrode 19

The second electrode 19 may be disposed on the organic layer 10A having such a structure. The second electrode 19 may be a cathode that is an electron injection electrode, and in this regard, a material for forming the second electrode 19 may be a material having a low work function, and such a material may be metal, alloy, an electrically conductive compound, or a combination thereof.

The second electrode 19 may include at least one selected from lithium (Li), silver (Si), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 19 may be a transmissive electrode, a semi-transmissive electrode, or a reflective electrode.

The second electrode 19 may have a single-layered structure, or a multi-layered structure including two or more layers.

Figure 3:
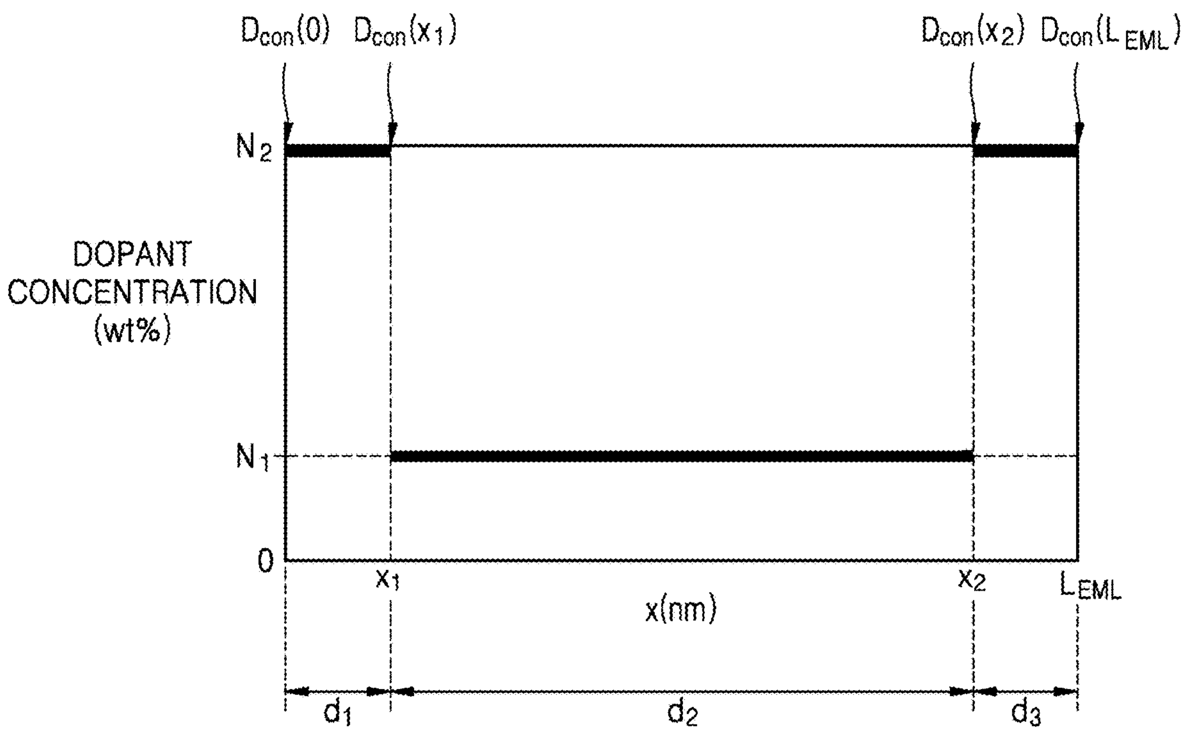
FIGS. 3 to 5 and 7 to 9 are graphs of dopant concentration (percent by weight, wt %) versus real number x (nanometers, nm) illustrating various examples of a dopant concentration profile of an emission layer of the organic light-emitting device.

Description of FIG. 3

FIG. 3 is a diagram illustrating an example of a dopant concentration profile in the emission layer 15 of the organic light-emitting device 10 of FIG. 3 (discontinuous dopant concentration profile). $x_1$ and $x_2$ may each be a real number satisfying $0<x_1<x_2<L_{EML}$, $D_{con}(x)$ for x (for example, all x) satisfying $0\leq x\leq x_1$ may be $N_2$, $D_{con}(x)$ for x (for example, all x) satisfying $x_1<x<x_2$ may be $N_1$, and $D_{con}(x)$ for x (for example, all x) satisfying $x_2\leq x\leq L_{EML}$ may be $N_2$. x, $L_{EML}$, $D_{con}(x)$, $N_1$, and $N_2$ are the same as described herein.

$d_1$ (that is, $x_1$) and $d_3$ (that is, $L_{EML}-x_2$) in FIG. 3 may be identical to each other.

In an embodiment, $d_1$ and $d_3$ in FIG. 3 may each be in a range of about 0.1% to about 20% of $L_{EML}$, about 0.5% to about 15% of $L_{EML}$, about 1% to about 10% of $L_{EML}$, or about 1% to about 5% of $L_{EML}$, but embodiments of the present disclosure are not limited thereto. In an embodiment, $d_1$ and $d_3$ in FIG. 3 may each be about 2.5% of $L_{EML}$, but embodiments of the present disclosure are not limited thereto.

In an embodiment, $d_1$:$d_2$ and $d_3$:$d_2$ in FIG. 3 may each be in a range of about 1:25 to about 1:35, but embodiments of the present disclosure are not limited thereto.

Figure 4:
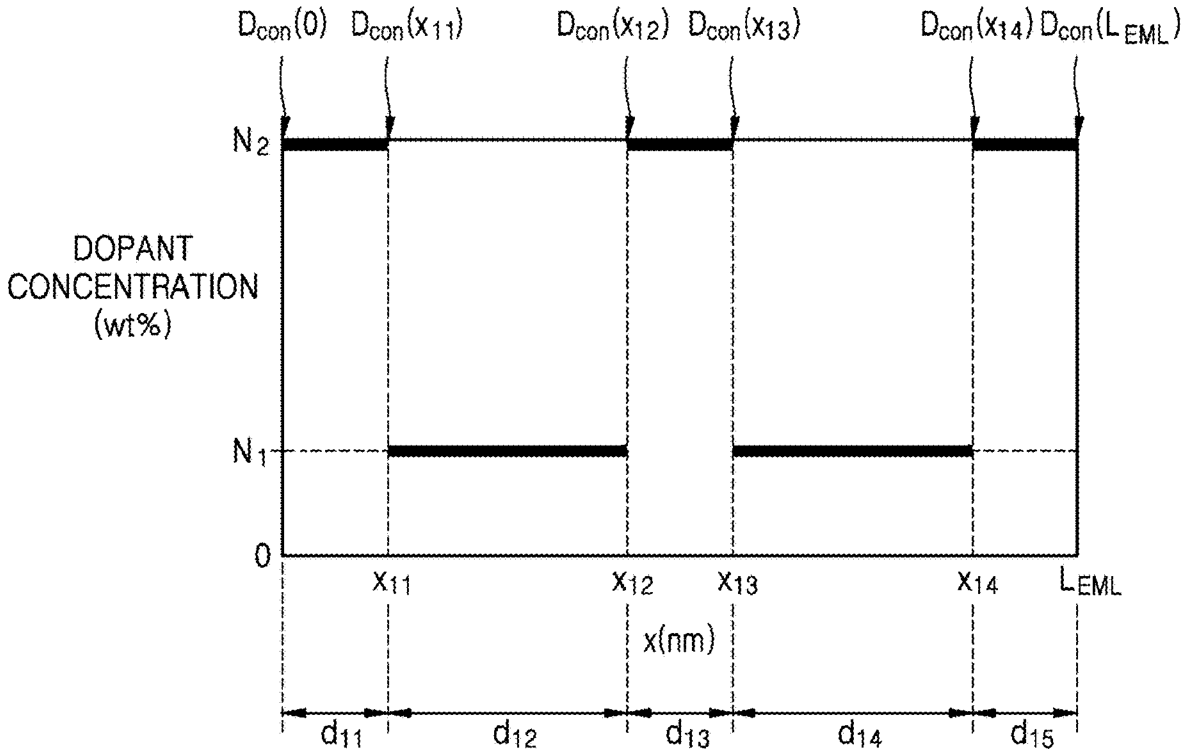

Description of FIG. 4

FIG. 4 illustrates another example of a dopant concentration profile in the emission layer 15 of the organic light-emitting device 10 (discontinuous dopant concentration profile). $x_{11}$, $x_{12}$, $x_{13}$, and $x_{14}$ may each be a real number satisfying $0<x_{11}<x_{12}<x_{13}<x_{14}<L_{EML}$, $D_{con}(x)$ for x satisfying $0\leq x\leq x_{11}$ may be $N_2$, $D_{con}(x)$ may be $N_1$ when x satisfies $x_{11}<x<x_{12}$, $D_{con}(x)$ may be $N_2$ when x satisfies $x_{12}\leq x\leq x_{13}$, $D_{con}(x)$ may be $N_1$ when x satisfies $x_{13}<x<x_{14}$, and $D_{con}(x)$ may be $N_2$ when x satisfies $x_{14}\leq x\leq L_{EML}$. X, $L_{EML}$, $D_{con}(x)$, $N_1$, and $N_2$ are the same as described herein.

$d_{11}$ (that is, $x_{11}$), $d_{13}$ (that is, $x_{13}-x_{12}$), and $d_{15}$ (that is, $L_{EML}-x_{14}$) in FIG. 4 may each be in a range of about 0.1% to about 20% of $L_{EML}$, about 0.5% to about 15% of $L_{EML}$, about 1% to about 10% of $L_{EML}$, or about 1% to about 5% of $L_{EML}$, but embodiments of the present disclosure are not limited thereto. In an embodiment, $d_{11}$, $d_{13}$, and $d_{15}$ may each be about 2.5% of $L_{EML}$, but embodiments of the present disclosure are not limited thereto.

In an embodiment, $d_{11}$:$d_{12}$, $d_{13}$:$d_{12}$, $d_{13}$:$d_{14}$, and $d_{15}$:$d_{14}$ may each be in a range of about 1:5 to about 1:15, but embodiments of the present disclosure are not limited thereto.

Figure 5:
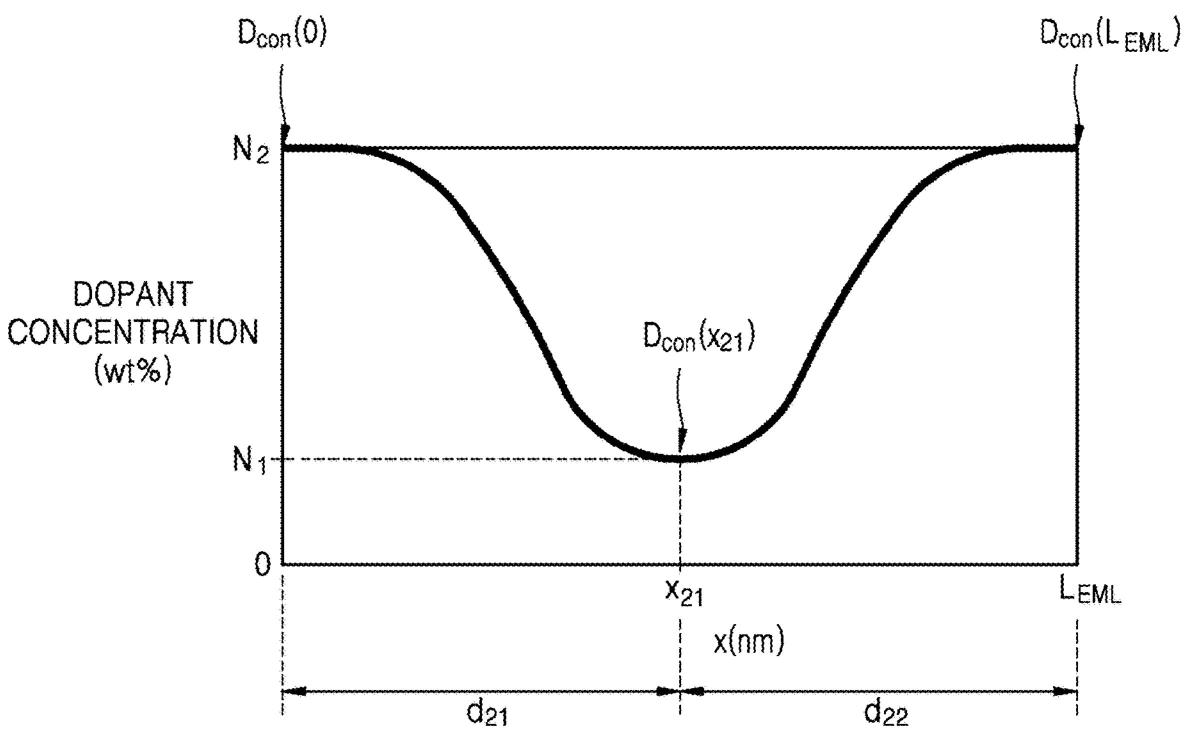

Description of FIG. 5

FIG. 5 illustrates an example of another example of a dopant concentration profile in the emission layer 15 of the organic light-emitting device 10 (continuous dopant concentration profile). $x_{21}$ may be a real number satisfying $0<x_{21}<L_E$ML, $D_{con}(x)$ may gradually decrease when x satisfies $0<x<x_{21}$, $D_{con}(x_{21})$ may be $N_1$, and $D_{con}(x)$ may gradually increase when x satisfies $x_{21}<x<L_{EML}$. X, $L_{EML}$, $D_{con}(x)$, $N_1$, and $N_2$ are the same as described herein.

$d_{21}$ (that is, $x_{21}$) and $d_{22}$ (that is, $L_{EML}-x_{22}$) in FIG. 5 may be identical to each other.

Description of FIGS. 6A to 6G and 7

FIGS. 6A to 6G illustrate a method of forming the emission layer 15 on the surface of the hole transport region 12.

First, a substrate in which a first electrode 11 and a hole transport region 12 are formed is prepared.

A deposition source moving unit 350 is prepared. The deposition source moving unit 350 includes a first deposition source 300 configured to emit a dopant and a second deposition source 400 configured to emit a host. The first deposition source 300 and the second deposition source 400 are spaced apart from each other by a predetermined distance such that a region in which the dopant is emitted overlaps a region in which the host is emitted. $N_1$, $N_2$, $x_{31}$, $x_{32}$, $x_{33}$, and $x_{34}$ to be described below with reference to FIG. 7 may be controlled by adjusting the degree of the overlap between the region in which the dopant is emitted and the region in which the host is emitted, the distance between the first deposition source 300 and the second deposition source 400, and/or the emission amount per hour from the first deposition source 300 and the second deposition source 400.

Figure 6A:
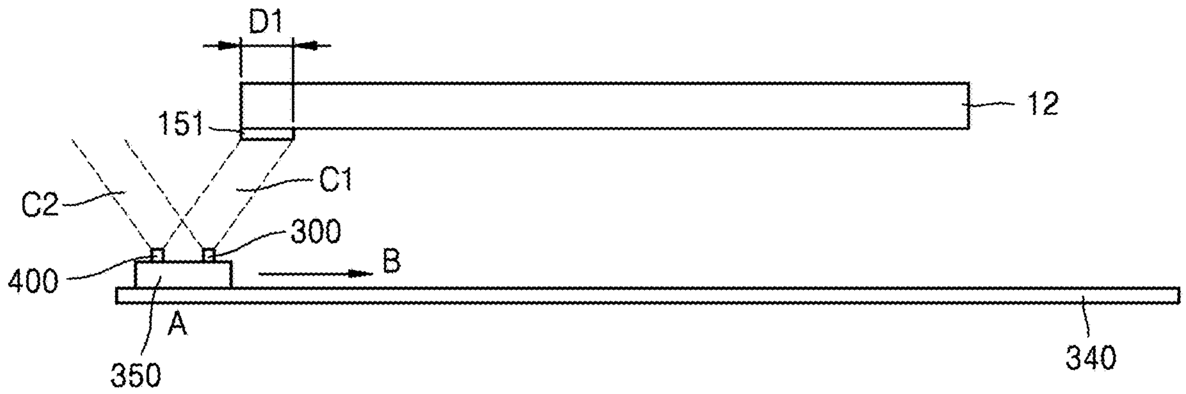
FIGS. 6A to 6G illustrate a method of forming an emission layer having a dopant concentration profile of FIG. 7.

As in FIG. 6A (for convenience, the first electrode 11 is not illustrated), the deposition source moving unit 350 is arranged at a first end A under the surface of the hole transport region 12 such that the hole transport region 12 faces the deposition source moving unit 350 and the first deposition source 300 is more adjacent to the center of the hole transport region 12 than the second deposition source 400. A region C1 in which the dopant is emitted by the first deposition source 300 and a region C2 in which the host is emitted by the second deposition source 400 may have a fan shape having a predetermined angle as illustrated in FIG. 6A. The first deposition source 300 and the second deposition source 400 are arranged at a predetermined distance such that the region C1 in which the dopant is emitted overlaps the region C2 in which the host is emitted.

The first deposition source 300 and the second deposition source 400 may be arranged in the deposition source moving unit 350, and the deposition source moving unit 350 may be installed to reciprocate along a guide rail 340 provided in a chamber. To this end, the deposition source moving unit 350 may be connected to a separate driving unit (not illustrated) and driven.

As illustrated in FIG. 6A, the deposition source moving unit 350 in which the first deposition unit 300 and the second deposition source 400 are spaced apart from each other by a predetermined distance may be moved in a direction B from the first end A under the surface of the hole transport region 12 toward the second end E while the first deposition source 300 and the second deposition source 400 are in an on state. At this time, a region 151 in which the dopant concentration (that is, $D_{con}(x)$) is $N_2$ is firstly deposited on the surface of the hole transport region 12, and a region 151 in which the dopant concentration is $N_2$ (see "D1" in FIG. 6A) begins to formed. The region 151 may continuously extend as the deposition source moving unit 350 is moved in a direction B from the first end A toward the second end E.

Figure 6B:
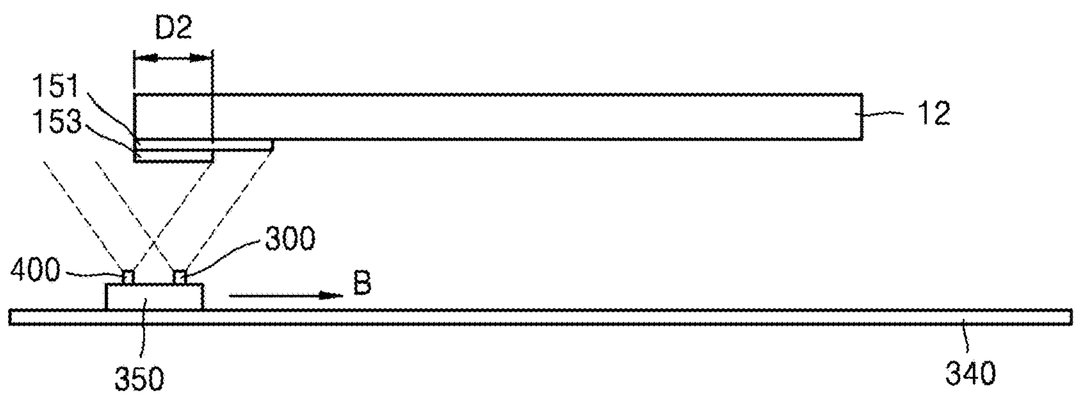

As illustrated in FIG. 6B, when the deposition source moving unit 350 in which the first deposition source 300 and the second deposition source 400 are arranged is continuously moved in the direction B from the first end A toward the second end E, a region 153 (see "D2" in FIG. 6B) in which $D_{con}(x)$ gradually decreases begins to be formed under the region 151. The region 153 may continuously extend as the deposition source moving unit 350 is moved in the direction B from the first end A toward the second end E.

Figure 6C:
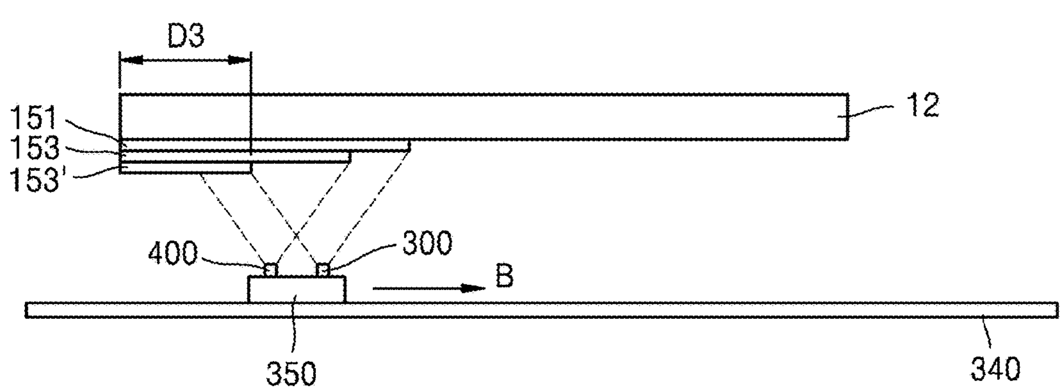

As illustrated in FIG. 6C, when the deposition source moving unit 350 in which the first deposition source 300 and the second deposition source 400 are arranged is continuously moved in the direction B from the first end A toward the second end E, a region 155' in which $D_{con}(x)$ is $N_1$ begins to be formed under the region 153 (see "D3" in FIG. 6C).

Figure 6D:
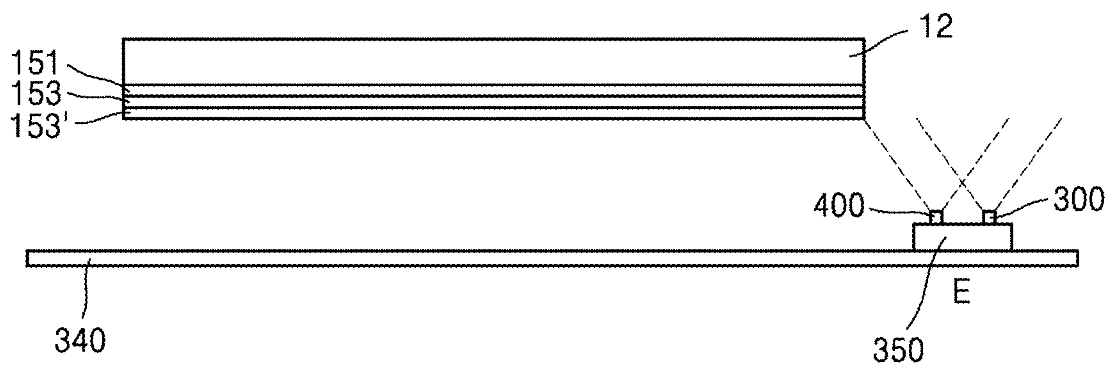

When the deposition source moving unit 350 in which the first deposition source 300 and the second deposition source 400 are arranged is moved in the direction B from the first end A toward the second end E and reaches the second end E under the surface of the hole transport region 12, the region 151 in which $D_{con}(x)$ is $N_2$, the region 153 in which $D_{con}(x)$ gradually decreases, and the region 155' in which $D_{con}(x)$ is $N_1$ may be sequentially formed on the hole transport region 12 as illustrated in FIG. 6D.

Figure 6E:
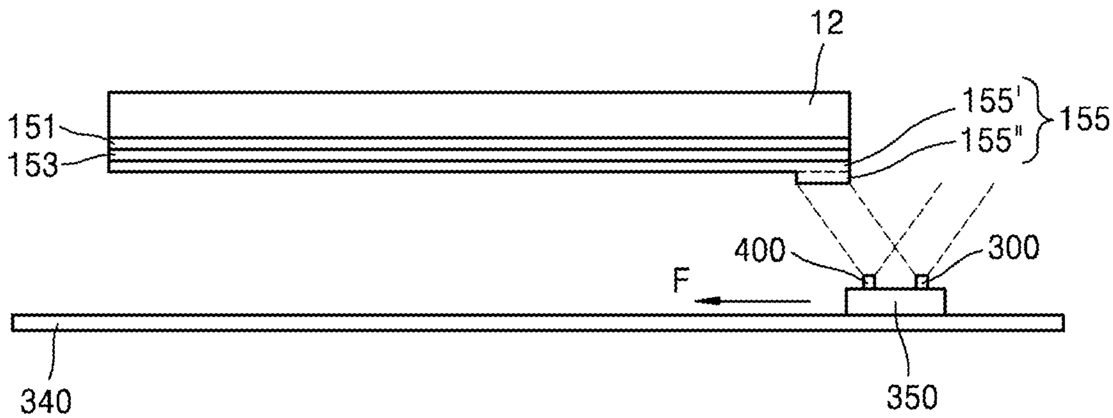

Then, the moving direction of the deposition source moving unit 350 having reached the second end E under the hole transport region 12 is changed to a direction F from the second end E toward the first end A as illustrated in FIG. 6E, and the deposition source moving unit 350 is moved. At this time, as illustrated in FIG. 6E, a region 155" in which $D_{con}(x)$ is $N_1$ begins to be formed.

Figure 6F:
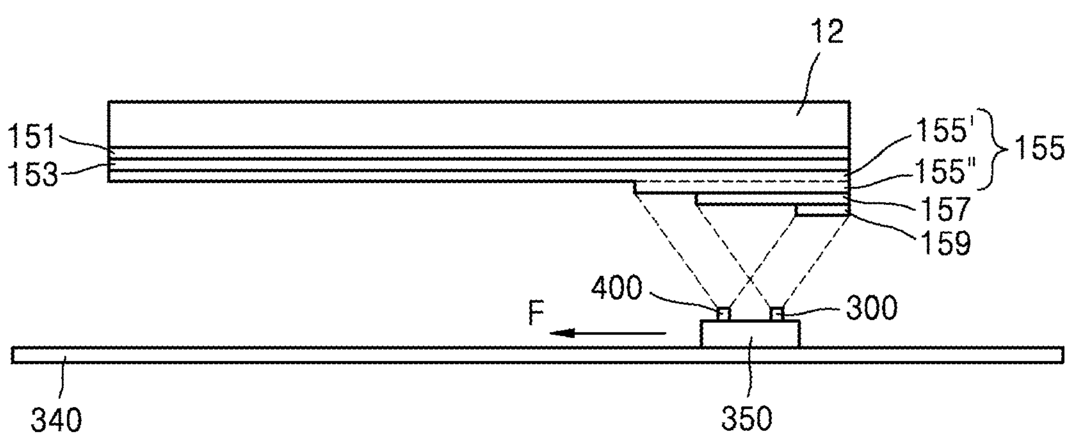

When the deposition source moving unit 350 is continuously moved in the direction F from the second end E toward the first end A, a region 157 in which $D_{con}(x)$ gradually increases and a region 159 in which $D_{con}(x)$ is $N_2$ may be sequentially formed as illustrated in FIG. 6F. At this time, since the surface of the region 155' directly contacts the region 155", and the region 155' and the region 155" have the same constituent component and are formed in a single chamber, an interface S' between the region 155' and the region 155" may be substantially unclear. Therefore, the region 155' and the region 155" may be collectively referred to as a region 155 in which $D_{con}(x)$ is $N_1$.

Figure 6G:
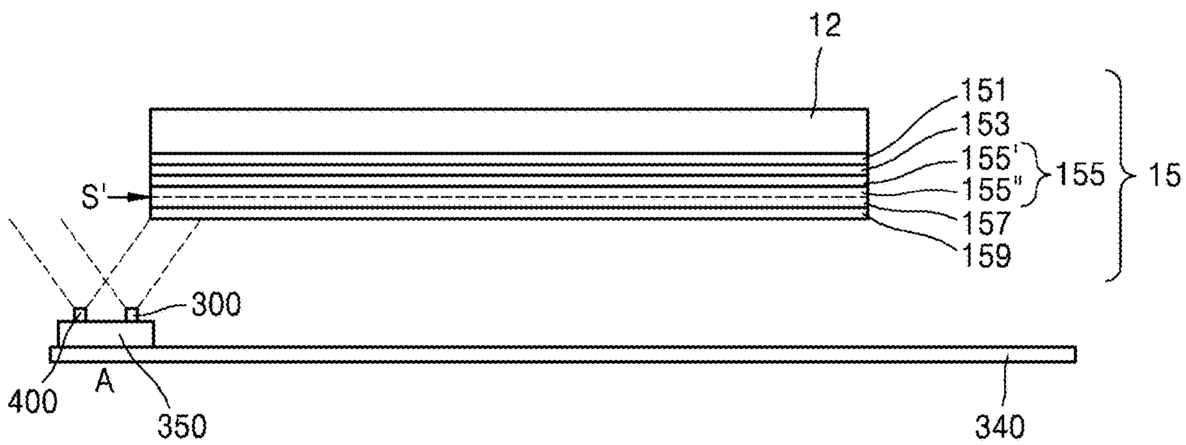

When the deposition source moving unit 350 including the first deposition source 300 and the second deposition source 400 reaches the first end A under the surface of the hole transport region 12, the region 151 in which $D_{con}(x)$ is $N_2$, the region 153 in which $D_{con}(x)$ gradually decreases, the region 155 in which $D_{con}(x)$ is $N_1$, the region 157 in which $D_{con}(x)$ gradually increases, and the region 159 in which $D_{con}(x)$ is $N_2$ may be sequentially formed on the surface of the hole transport region 12 as illustrated in FIG. 6G.

As described with reference to FIGS. 6A to 6F, the deposition source moving unit 350 is arranged at the first end A under the surface of the hole transport region 12 such that the first deposition source 300 configured to emit the dopant is more adjacent to the center of the hole transport region 12 than the second deposition source 400 configured to emit the host. Then, a reciprocating process of moving the deposition source moving unit 350 in a direction B from the first end A under the surface of the hole transport region 12 toward the second end E and immediately moving the deposition source moving unit 350 in a direction F from the second end E toward the first end A is performed "once" to form an emission layer 15 having a dopant concentration profiler as illustrated in FIG. 7.

Figure 7:
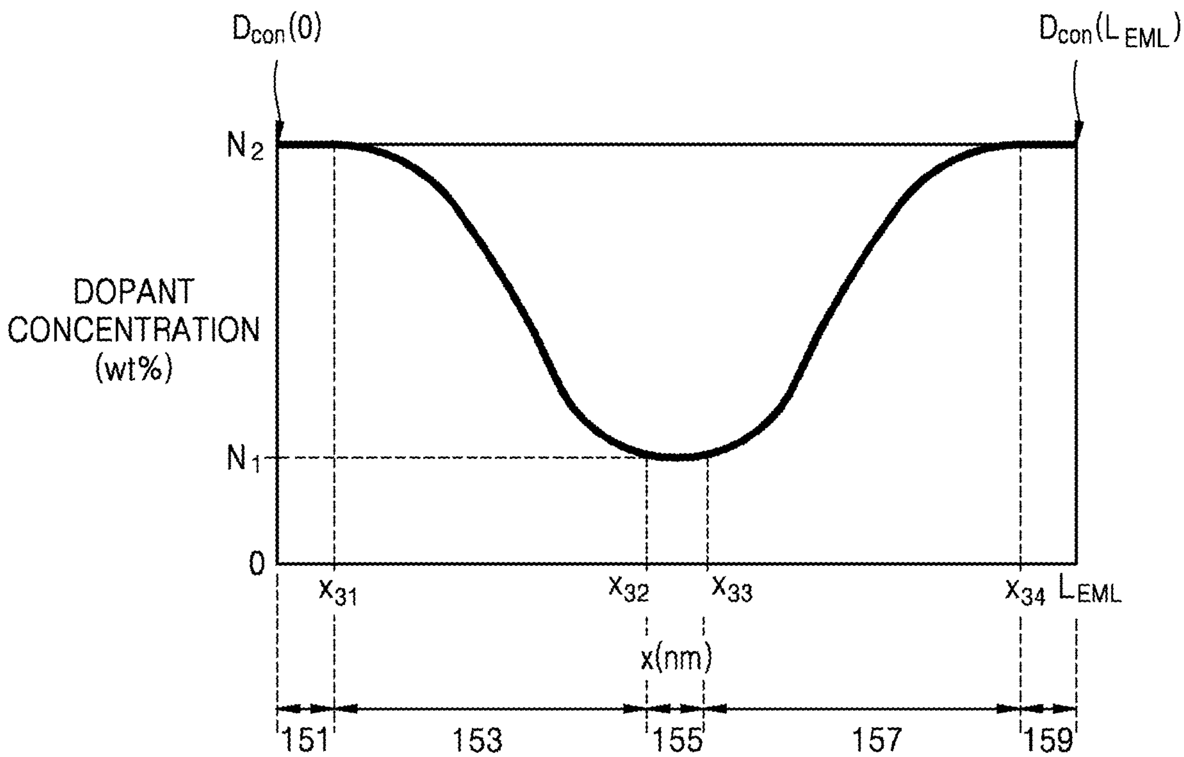

FIG. 7 illustrates another example of a dopant concentration profile in the emission layer 15 of the organic light-emitting device 10 (continuous dopant concentration profile). $x_{31}$, $x_{32}$, $x_{33}$, and $x_{34}$ may each be a real number satisfying $0<x_{31}<x_{32}<x_{33}<x_{34}<L_{EML}$, $D_{con}(x)$ may be $N_2$ when x satisfies $0 \le x \le x_{31}$, $D_{con}(x)$ may gradually decrease when x satisfies $x_{31}<x<x_{32}$, $D_{con}(x)$ may be $N_1$ when x satisfies $x_{32} \le x \le x_{33}$, $D_{con}(x)$ may gradually increase when x satisfies $x_{33}<x<x_{34}$, and $D_{con}(x)$ may be $N_2$ when x satisfies $x_{34} \le x \le L_{EML}$. X, $L_{EML}$, $D_{con}(x)$, $N_1$, and $N_2$ are the same as described herein.

In FIGS. 6G and 7, a thickness of the region 151, a thickness of the region 155, and a thickness of the region 159 may be in a range of about 0.1% to about 20% of $L_{EML}$, about 0.5% to about 15% of $L_{EML}$, about 1% to about 10% of $L_{EML}$, or about 1% to about 5% of $L_{EML}$, but embodiments of the present disclosure are not limited thereto. In an embodiment, the thickness of the region 151, the thickness of the region 155, and the thickness of the region 159 may each be about 2.5% of $L_{EML}$, but embodiments of the present disclosure are not limited thereto.

In an embodiment, in FIGS. 6G and 7, a ratio of the thickness of the region 151:the thickness of the region 153, a ratio of the thickness of the region 155:the thickness of the region 153, a ratio of the thickness of the region 155:the thickness of the region 157, and a ratio of the thickness of the region 159:the thickness of the region 157 may each be in a range of about 1:5 to about 1:15, but embodiments of the present disclosure are not limited thereto.

Figure 8:
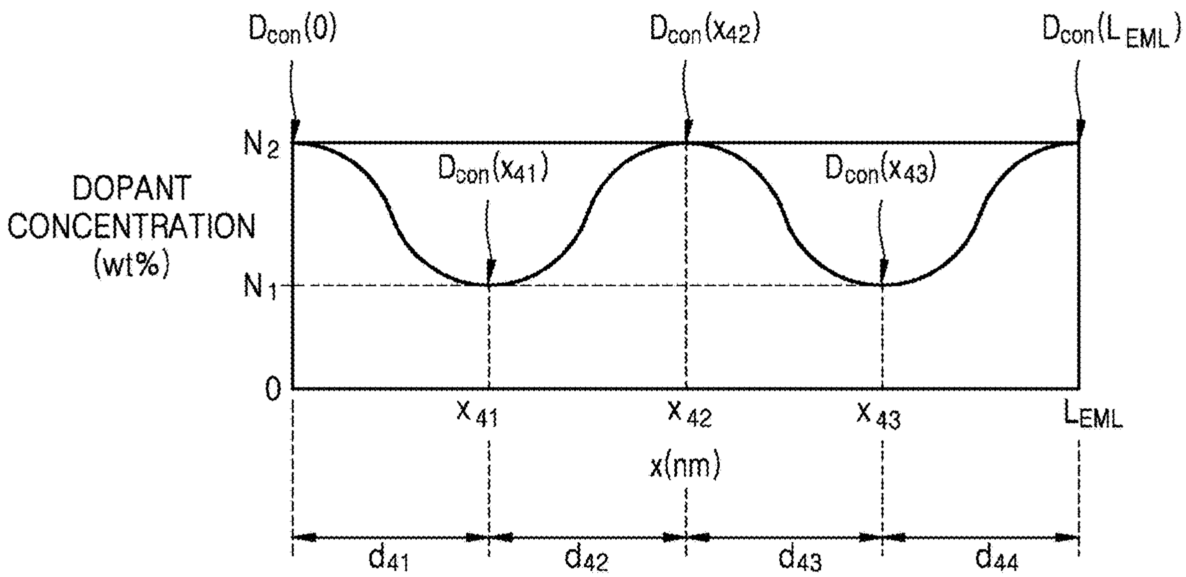

Description of FIG. 8

FIG. 8 illustrates another example of the dopant concentration profile in the emission layer 15 of the organic light-emitting device 10 (continuous dopant concentration profile). $x_{41}$, $x_{42}$, and $x_{43}$ may each be a real number satisfying $0<x_{41}<x_{42}<x_{43}<L_{EML}$, $D_{con}(x)$ may gradually decrease when x satisfies $0<x<x_{41}$, $D_{con}(x_{41})$ may be $N_1$, $D_{con}(x)$ may gradually increase when x satisfies $x_{41}<x<x_{42}$, $D_{con}(x_{42})$ may be $N_2$, $D_{con}(x)$ may gradually decrease when x satisfies $x_{42}<x<x_{43}$, $D_{con}(x_{43})$ may be $N_1$, and $D_{con}(x)$ may gradually increase when x satisfies $x_{43}<x<L_{EML}$. X, $L_{EML}$, $D_{con}(x)$, $N_1$, and $N_2$ are the same as described herein.

$d_{41}$ (that is, $x_{41}$), $d_{42}$ (that is, $x_{42}-x_{41}$), $d_{43}$ (that is, $x_{43}-x_{42}$), and $d_{44}$ (that is, $L_{EML}-x_{43}$) in FIG. 8 may be identical to each other, but embodiments of the present disclosure are not limited thereto.

Figure 9:
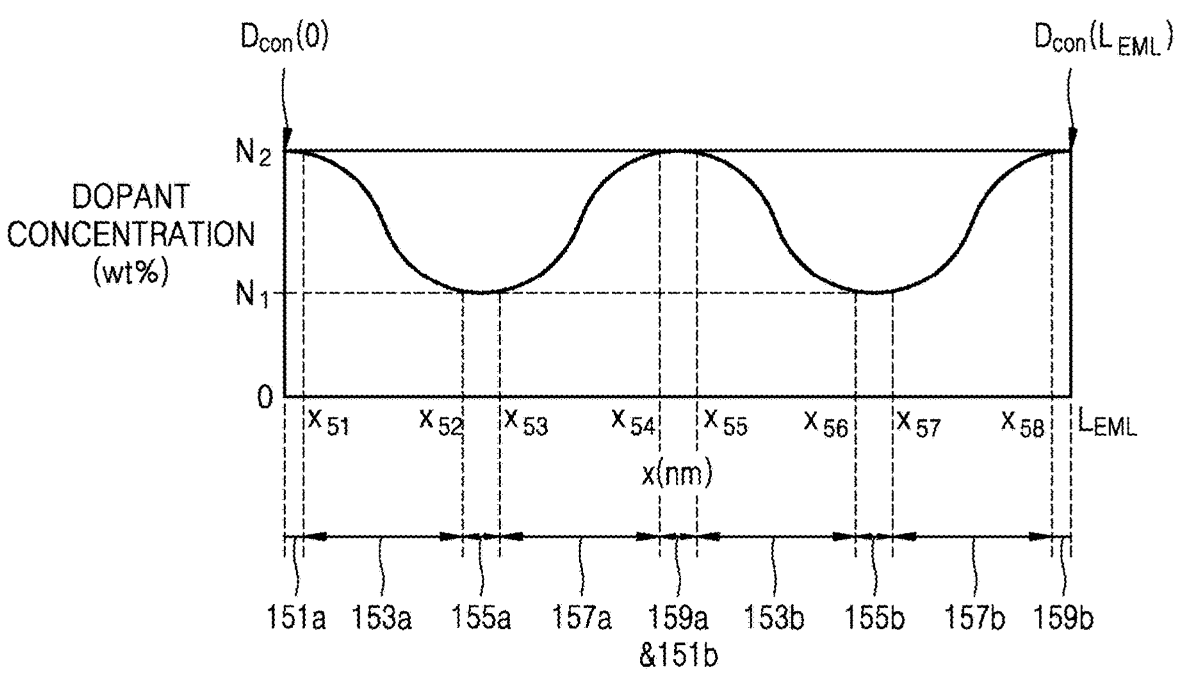

Description of FIG. 9

FIG. 9 illustrates another example of the dopant concentration profile in the emission layer 15 of the organic light-emitting device 10 (continuous dopant concentration profile). $x_{51}$, $x_{52}$, $x_{53}$, $x_{54}$, $x_{55}$, $x_{56}$, $x_{57}$, and $x_{58}$ may each be a real number satisfying $0<x_{51}<x_{52}<x_{53}<x_{54}<x_{55}<x_{56}<x_{57}<x_{58}<L_{EML}$, $D_{con}(x)$ may be $N_2$ when x satisfies $0 \le x \le x_{51}$, $D_{con}(x)$ may gradually decrease when x satisfies $x_{51}<x<x_{52}$, $D_{con}(x)$ may be $N_1$ when x satisfies $x_{52} \le x \le x_{53}$, $D_{con}(x)$ may gradually increase when x satisfies $x_{53}<x<x_{54}$, $D_{con}(x)$ may be $N_2$ when x satisfies $x_{54} \le x \le x_{55}$, $D_{con}(x)$ may gradually decrease when x satisfies $x_{55}<x<x_{56}$, $D_{con}(x)$ may be $N_1$ when x satisfies $x_{56} \le x \le x_{57}$, $D_{con}(x)$ may gradually increase when x satisfies $x_{57}<x<x_{58}$, and $D_{con}(x)$ may be $N_2$ when x satisfies $x_{58} \le x \le L_{EML}$. X, $L_{EML}$, $D_{con}(x)$, $N_1$, and $N_2$ are the same as described herein.

As described with reference to FIGS. 6A to 6G, the emission layer 15 having the dopant concentration profile of FIG. 9 may be formed by performing the reciprocating process of moving the deposition source moving unit 350 in the direction B from the first end A under the surface of the hole transport region 12 toward the second end E and immediately moving the deposition source moving unit in the direction F from the second end E toward the first end A "continuously twice".

That is, as a result of performing the reciprocating process "twice", a region 151$a$ in which $D_{con}(x)$ is $N_2$, a region 153$a$ in which $D_{con}(x)$ gradually decreases, a region 155$a$ in which $D_{con}(x)$ is $N_1$, a region 157$a$ in which $D_{con}(x)$ gradually increases, a region 159$a$ and a region 151$b$ in which $D_{con}(x)$ is $N_2$, a region 153$b$ in which $D_{con}(x)$ gradually decreases, a region 155$b$ in which $D_{con}(x)$ is $N_1$, a region 157$b$ in which $D_{con}(x)$ gradually increases, and a region 159$b$ in which $D_{con}(x)$ is $N_2$ may be sequentially formed on the surface of the hole transport region 12. At this time, since the surface of the region 159$a$ directly contacts the surface of the region 151$b$, and the region 159$a$ and the region 151$b$ have the same constituent component and are formed in a single chamber, an interface between the region 159$a$ and the region 151$b$ may be substantially unclear.

In FIG. 9, a thickness of the region 151$a$, a thickness of the region 155$a$, the sum of thicknesses of the region 159$a$ and the region 151$b$, a thickness of the region 155$b$, and a thickness of the region 159$b$ may be in a range of about 0.1% to about 20% of $L_{EML}$, about 0.5% to about 15% of $L_{EML}$, about 1% to about 10% of $L_{EML}$, or about 1% to about 5% of $L_{EML}$, but embodiments of the present disclosure are not limited thereto. In an embodiment, the thickness of the region 151$a$, the thickness of the region 155$a$, the sum of the thicknesses of the region 159$a$ and the region 151$b$, the thickness of the region 155$b$, and the thickness of the region 159$b$ may each be about 2.5% of $L_{EML}$, but embodiments of the present disclosure are not limited thereto.

In an embodiment, in FIG. 9, a ratio of the thickness of the region 151$a$:the thickness of the region 153$a$, a ratio of the thickness of the region 155$a$:the thickness of the region 153$a$, a ratio of the thickness of the region 155$a$:the thickness of the region 157$a$, a ratio of the sum of the thicknesses of the region 159$a$ and the region 151$b$:the thickness of the region 157$a$, a ratio of the sum of the thicknesses of the region 159$a$ and the region 151$b$:the thickness of the region 153$b$, a ratio of the thickness of the region 155$b$:the thickness of the region 153$b$, a ratio of the thickness of the region 155$b$:the thickness of the region 157$b$, and a ratio of the thickness of the region 159$b$:the thickness of the region 157$b$ may each be in a range of about 1:5 to about 1:15, but embodiments of the present disclosure are not limited thereto.

Various examples of the dopant concentration profile in the emission layer 15 have been described with reference to FIGS. 3 to 5 and 7 to 9, but embodiments of the present disclosure are not limited thereto. For example, although $N_1$ in FIGS. 3 to 5 and 7 to 9 is illustrated as not 0 wt %, $N_1$ may be 0 wt %. In this manner, various examples are possible.

Figure 10:
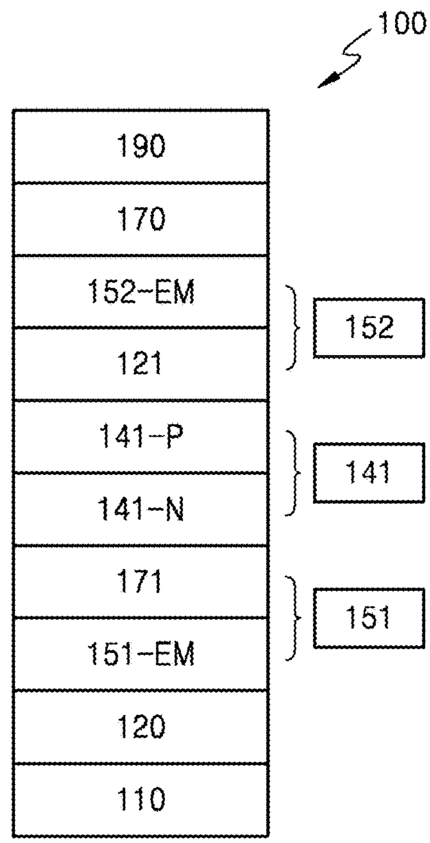
FIG. 10 is a schematic view of an organic light-emitting device according to an embodiment.

Description of FIG. 10

FIG. 10 is a schematic view of an organic light-emitting device 100 according to another embodiment.

The organic light-emitting device 100 of FIG. 10 may include a first electrode 110, a second electrode 190 facing the first electrode 110, and a first light-emitting unit 151 and a second light-emitting unit 152 between the first electrode 100 and the second electrode 190. A charge generation layer 141 is disposed between the first light-emitting unit 151 and the second light-emitting unit 152, and the charge generation layer 141 includes an n-type charge generation layer 141-N and a p-type charge generation layer 141-P. The charge generation layer 141 is a layer that generates charge and supplies the generated charge to an adjacent light-emitting unit, and the charge generation layer 141 may include a known material.

The first light-emitting unit 151 includes a first emission layer 151-EM, and the second light-emitting unit 152 includes a second emission layer 152-EM. A maximum emission wavelength of light emitted by the first light-emitting unit 151 may be different from a maximum emission wavelength of light emitted by the second light-emitting unit 152. For example, a mixed light of the light emitted by the first light-emitting unit 151 and the light emitted by the second light-emitting unit 152 may be white light, but embodiments of the present disclosure are not limited thereto.

A hole transport region 120 is disposed between the first light-emitting unit 151 and the first electrode 110, and the second light-emitting unit 152 includes a first hole transport region 121 disposed on the side of the first electrode 110.

An electron transport region 170 is disposed between the second light-emitting unit 152 and the second electrode 190, and the first light-emitting unit 151 includes a first electron transport region 171 between the charge generation layer 141 and the first emission layer 151-EM.

The first emission layer 151-EM includes a host and a dopant, the dopant may be an iridium-free organometallic compound, a dopant concentration profile in the first emission layer 151-EM may satisfy $N_1 \le D_{con}(x) \le N_2$ in a direction from the hole transport region 120 toward the first electron transport region 171, x in $D_{con}(x)$ may be a real number and a variable satisfying $0 \le x \le L_{EML}$, $L_{EML}$ may be a thickness of the first emission layer 151-EM, $D_{con}(x)$ may represents a dopant concentration (wt %) at a position spaced apart from an interface between the hole transport region 120 and the first emission layer 151-EM by x toward the first emission layer 151-EM, $N_1$ (wt %) may be a minimum value of the dopant concentration in the emission layer 15 and may be greater than or equal to about 0 wt % and less than about 100 wt %, $N_2$ (wt %) may be a maximum value of the dopant concentration in the emission layer 15 and may be greater than about 0 wt % and less than or equal to about 100 wt %, $N_1$ and $N_2$ may be different from each other, and $D_{con}(0)$ and $D_{con}(L_{EML})$ may each be $N_2$, and the second emission layer 152-EM may include a host and dopant, the dopant may be an iridium-free organometallic compound, the dopant concentration profile in the second emission layer 152-EM may satisfy $N_1 \le D_{con}(x) \le N_2$ in a direction from the first hole transport region 121 toward the electron transport region 170, x in $D_{con}(x)$ may be a real number and a variable satisfying $0 \le x \le L_{EML}$, $L_{EML}$ may be a thickness of the second emission layer 152-EM, $D_{con}(x)$ may be a dopant concentration (wt %) at a position spaced apart from an interface between the first hole transport region 121 and the second emission layer 152-EM by x toward the second emission layer 152-EM, $N_1$ (wt %) may be a minimum value of the dopant concentration in the second emission layer 152-EM and may be greater than or equal to about 0 wt % and less than about 100 wt %, $N_2$ (wt %) may be a maximum value of the dopant concentration in the second emission layer 152-EM and may be greater than about 0 wt % and less than or equal to about 100 wt %, $N_1$ and $N_2$ may be different from each other, and $D_{con}(0)$ and $D_{con}(L_{EML})$ may each be $N_2$.

Since $D_{con}(0)$ and $D_{con}(L_{EML})$ in the first emission layer 151-EM and the second emission layer 152-EM are each $N_2$, the hole injection from the interface between the hole transport region 120 and the first emission layer 151-EM to the first emission layer 151-EM and the electron injection from the interface between the first emission layer 151-EM and the first electron transport region 171 to the first emission layer 151-EM may be accelerated, and the hole injection from the interface between the first hole transport region 121 and the second emission layer 152-EM to the second emission layer 152-EM and the electron injection from the interface between the second emission layer 152-EM and the electron transport region 170 to the second emission layer 152-EM may be accelerated. Therefore, the organic light-emitting device 100 may have a long lifespan.

The description of the first electrode 110 and the second electrode 190 in FIG. 10 is substantially the same as the description of the first electrode 11 and the second electrode 19 in FIG. 1.

The description of the first emission layer 151-EM and the second emission layer 152-EM in FIG. 10 is substantially the same as the description of the emission layer 15 in FIG. 1.

The description of the hole transport region 120 and the first hole transport region 121 in FIG. 10 is substantially the same as the description of the hole transport region 12 in FIG. 1.

The description of the electron transport region 170 and the first electron transport region 171 in FIG. 10 is substantially the same as the description of the electron transport region 17 in FIG. 1.

The organic light-emitting device, in which $D_{con}(0)$ and $D_{con}(L_{EML})$ in the first light-emitting unit 151 and the second light-emitting unit 152 are $N_2$, has been described with reference to FIG. 10, the organic light-emitting device of FIG. 10 may be variously modified. For example, one of the first light-emitting unit 151 and the second light-emitting unit 152 may be replaced with a known light-emitting unit, or may the organic light-emitting device may include three or more light-emitting units.

Description of Terminology

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group.

When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$) and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The terms "a biphenyl group, a terphenyl group, and a tetraphenyl group" as used herein each refer to a monovalent group in which two, three, three, or four phenyl groups are linked via a single bond.

The terms "a cyano group-containing phenyl group, a cyano group-containing biphenyl group, a cyano group-containing terphenyl group, and a cyano group-containing tetraphenyl group" as used herein each refer to a phenyl group, a biphenyl group, a terphenyl group, and a tetraphenyl group each substituted with at least one cyano group. In "the cyano group-containing phenyl group, the cyano group-containing biphenyl group, the cyano group-containing terphenyl group, and the cyano group-containing tetraphenyl group", a cyano group may be substituent in any position, and "the cyano group-containing phenyl group, the cyano group-containing biphenyl group, the cyano group-containing terphenyl group, and the cyano group-containing tetraphenyl group" may each include a substituent other than the cyano group. For example, the cyano group may include both a phenyl group substituted with a cyano group and a phenyl group substituted with a cyano group and a methyl group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 3-170

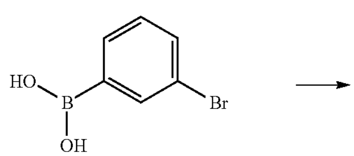

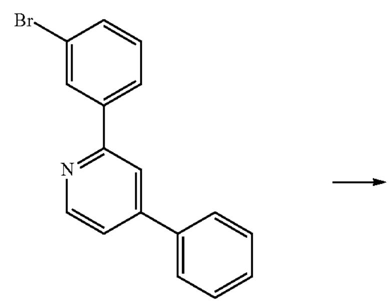

A

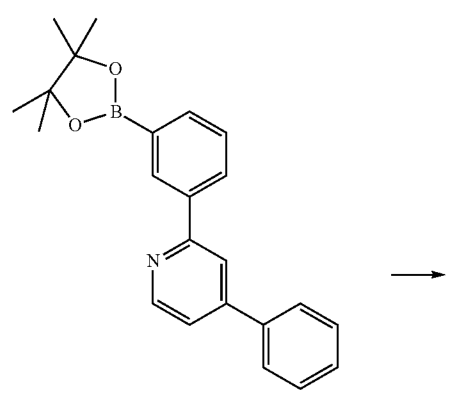

B

-continued

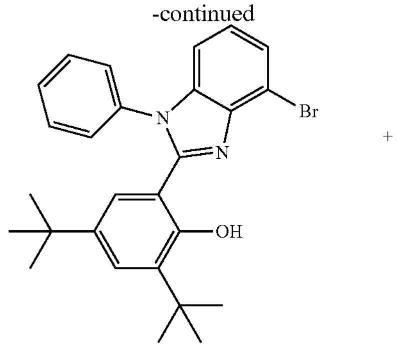

C

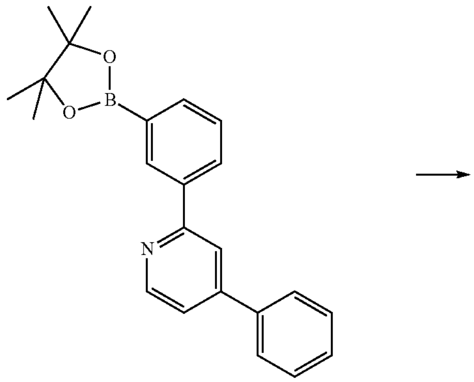

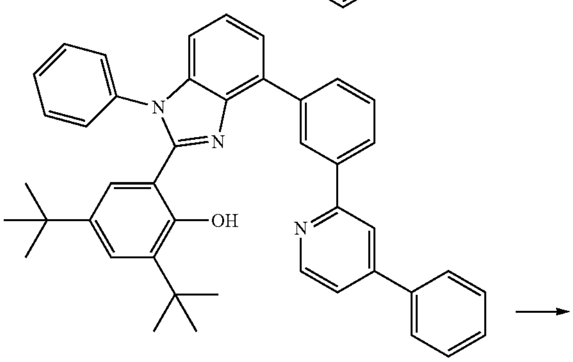

D

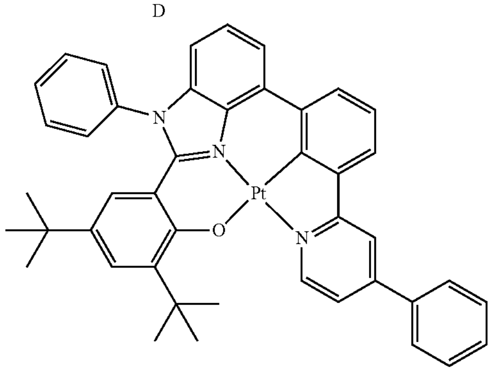

3-170

Synthesis of Intermediate A (2-(3-bromophenyl)-4-phenylpyridine)

3 grams (g) (13 millimoles (mmol)) of 2-bromo-4-phenylpyridine, 3.1 g (1.2 equivalents (equiv.)) of (3-bromophenyl)boronic acid, 1.1 g (0.9 mmol, 0.07 equiv.) of tetrakis (triphenylphosphine)palladium(0), and 3.4 g (32 mmol, 3 equiv.) of sodium carbonate were mixed with 49 milliliters (mL) of a solvent (0.6 molar (M)) in which tetrahydrofuran (THF) and distilled water ($H_2O$) were mixed at a ratio of 3:1, and then refluxed for 12 hours. The resultant mixture was cooled to room temperature, and a precipitate was filtered. The filtrate obtained therefrom was washed by using ethyl acetate (EA) and $H_2O$ and purified by column chromatography (while increasing a rate of MC/Hex to between 25% to 50%) to obtain 3.2 g (yield: 80%) of Intermediate A. The obtained product was identified by Mass and HPLC analysis.

HRMS (MALDI) calcd for $C_{17}H_{12}BrN$: m/z 309.0153, Found: 309.0155.

Synthesis of Intermediate B (4-phenyl-2-(3-(4,4,5,5-tetramethyl-1,3,2-dioxaborolan-2-yl)phenyl)pyridine)

3.2 g (0.01 mmol) of Intermediate A and 3.9 g (0.015 mol, 1.5 equiv.) of bispinacolato diboron were added to a flask, 2.0 g (0.021 mol, 2 equiv.) of potassium acetate and 0.42 g (0.05 equiv.) of $PdCl_2$(dppf) were added thereto, 34 mL of toluene was added thereto, and the resultant mixture was refluxed at a temperature of 100° C. overnight. The resultant mixture was cooled to room temperature, and a precipitate was filtered. The filtrate obtained therefrom was washed by using EA and $H_2O$ and purified by column chromatography to obtain 2.4 g (yield: 65%) of Intermediate B. The obtained product was identified by Mass and HPLC analysis.

HRMS (MALDI) calcd for $C_{23}H_{24}BNO_2$: m/Z 357.1900, Found: 357.1902.

Synthesis of Intermediate D (2,4-di-tert-butyl-6-(1-phenyl-4-(3-(4-phenylpyridin-2-yl)phenyl)-1H-benzo[d]imidazol-2-yl)phenol)

2.7 g (0.006 mol, 1 equiv.) of Intermediate C (2-(4-bromo-1-phenyl-1H-benzo[d]imidazol-2-yl)-4,6-di-tert-butylphenol), 2.4 g (0.007 mol, 1.2 equiv.) of Intermediate B, 0.39 g (0.001 mol, 0.07 equiv.) of tetrakis(triphenylphosphine) palladium(0), and 2.0 g (0.017 mol, 3 equiv.) of potassium carbonate were mixed with 20 mL of a solvent in which THF and distilled water $H_2O$ were mixed at a ratio of 3:1, and then refluxed for 12 hours. The resultant mixture was cooled to room temperature, and a precipitate was filtered. The filtrate obtained therefrom was washed by using EA and $H_2O$ and purified by column chromatography (while increasing a rate of EA/Hex to between 20% to 35%) to obtain 2.4 g (yield: 70%) of Intermediate D. The obtained compound was identified by Mass and HPLC analysis.

HRMS (MALDI) calcd for $C_{44}H_{41}BN_3O$: m/z 627.3250, Found: 627.3253.

Synthesis of Compound 3-170

2.4 g (3.82 mmol) of Intermediate D and 1.9 g (4.6 mmol, 1.2 equiv.) of $K_2PtCl_4$ were mixed with 55 mL of a solvent in which 50 mL of AcOH and 5 mL of $H_2O$ were mixed, and then refluxed for 16 hours. The resultant mixture was cooled to room temperature, and a precipitate was filtered. The precipitate was dissolved again in MC and washed by using $H_2O$. The precipitate was then purified by column chromatography (MC 40%, EA 1%, Hex 59%) to obtain 1.2 g (purity: 99% or more) of Compound 3-170 (actual synthesis yield: 70%). The obtained compound was identified by Mass and HPLC analysis.

HRMS (MALDI) calcd for $C_{44}H_{39}N_3OPt$: m/z 820.2741, Found: 820.2744.

Manufacture of OLED Pt-1

An ITO glass substrate was cut to a size of 50 mm×50 mm×0.5 mm (mm=millimeters), sonicated with acetone, iso-propyl alcohol, and pure water each for 15 minutes, and then cleaned by exposure to ultraviolet rays and ozone for 30 minutes.

Then, F6-TCNNQ was deposited on an ITO electrode (anode) of the ITO glass substrate to form a hole injection layer having a thickness of 10 nanometers (nm), and HT1 was deposited on the hole injection layer to form a hole transport layer having a thickness of 126 nm, thereby forming a hole transport region.

Then, H-H1 (hole transport host) and H-E2 (electron transport host) (a weight ratio of the hole transport host and the electron transport host was 5:5) as a host and Compound 3-170 as a dopant was co-deposited on the hole transport region (a weight ratio of the host to the dopant was 90:10) to form an emission layer having a thickness of 40 nm and having a continuous dopant concentration profile as illustrated in FIG. 9.

As described with reference to FIGS. 6A to 6G, the emission layer was formed by arranging the deposition source moving unit at the first end A under the surface of the hole transport region such that the first deposition source configured to emit the dopant (Compound 3-170) is more adjacent to the center of the hole transport region than the second deposition source configured to emit the host (the hole transport host H-H1 and the electron transport host H-E2) and performing the reciprocating process of moving the deposition source moving unit in the direction B from the first end A under the surface of the hole transport region toward the second end E and immediately moving the deposition source moving unit in the direction F from the second end E toward the first end A "continuously twice". The emission layer having the dopant concentration profile of FIG. 9 has a structure in which the regions having the following thicknesses are sequentially stacked from the hole transport region.

1) A region 151*a* in which the dopant concentration is 20 wt %: 1 nm

2) A region 153*a* in which the dopant concentration gradually decreases: 8.5 nm 3) A region 155*a* in which the dopant concentration is 5 wt %: 1 nm 4) A region 157*a* in which the dopant concentration gradually increases: 9 nm 5) A region 159*a* and a region 151*b* in which the dopant concentration is 20 wt %: 1 nm 6) A region 153*b* in which the dopant concentration gradually decreases: 9 nm 7) A region 155*b* in which the dopant concentration is 5 wt %: 1 nm 8) A region 157*b* in which the dopant concentration gradually increases: 8.5 nm 9) A region 159*b* in which the dopant concentration is 20 wt %: 1 nm Then, Compound ET1 and LiQ were co-deposited on the emission layer at a weight ratio of 5:5 to form an electron transport layer having a thickness of 36 nm, LiF was deposited on the electron transport layer to form an electron injection layer having a thickness of 0.5 nm, and Al was vacuum-deposited on the electron injection layer to form a second electrode (cathode) having a thickness of 80 nm, thereby completing the manufacture of an organic light-emitting device having a structure of ITO/F6-TCNNQ (10 nm)/HT1 (126 nm)/(H-H1+H-E2):Compound 3-170 (40 nm)/ET1:LiQ (50 wt %) (36 nm)/LiF (0.5 nm)/Al (80 nm).

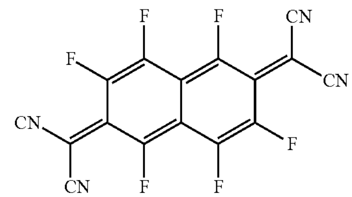

F6-TCNNQ

HT1

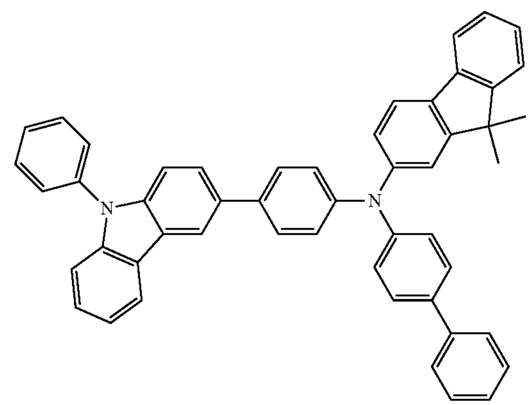

H-H1

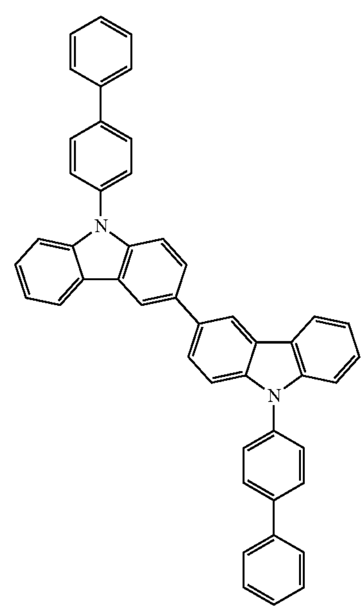

-continued

H-E2

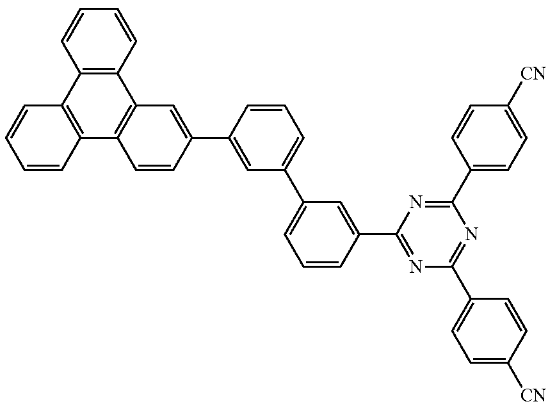

3-170

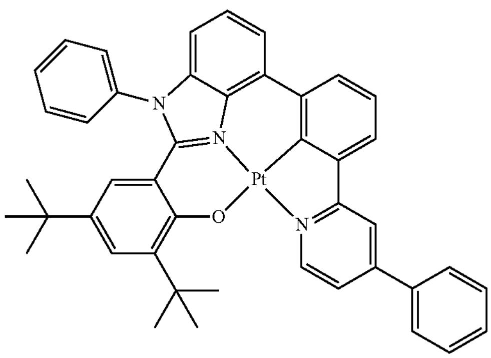

ET1

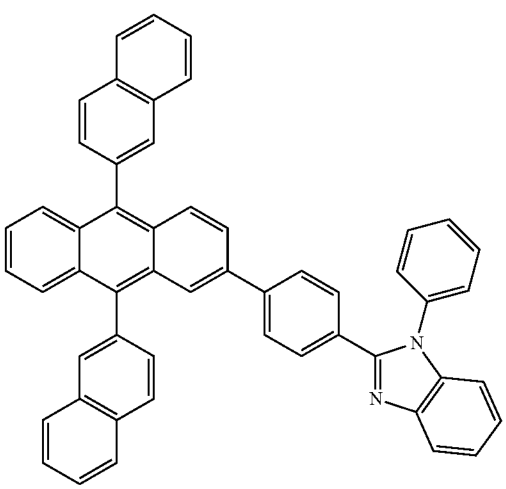

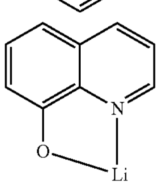

Liq

Manufacture of OLED Pt-2

An organic light-emitting device was manufactured in the same manner as in the OLED Pt-1, except that an emission layer having a thickness of 40 nm, in which a concentration of Compound 3-170 (dopant) was uniform (10 wt %) in an entire emission layer, was formed instead of the emission layer having the continuous dopant concentration profile as illustrated in FIG. 9.

Manufacture of OLED Pt-3

Figure 11:
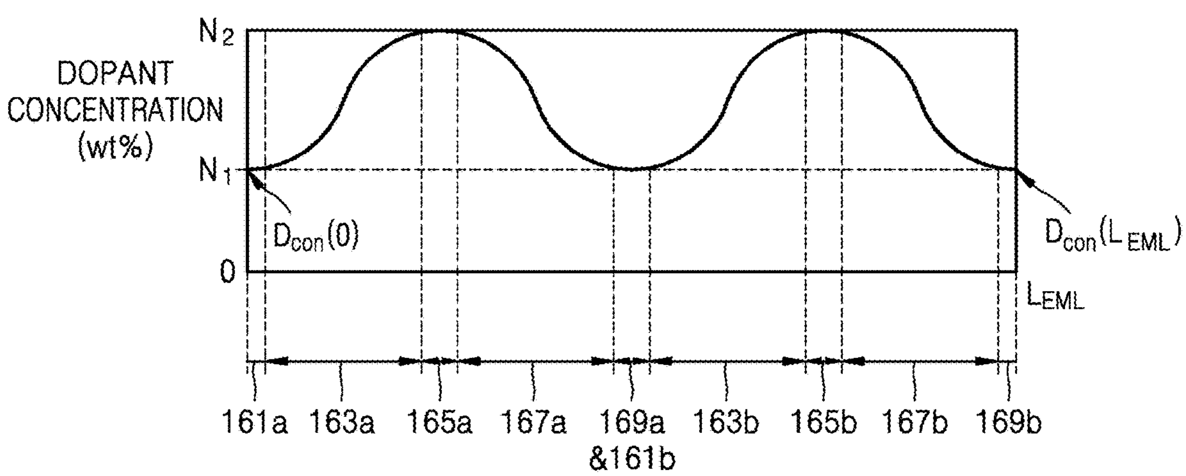
FIG. 11 illustrates a dopant concentration (percent by weight, wt %) profile of emission layers of organic light-emitting devices OLED Pt-3 and OLED Ir-3 manufactured according to Comparative Examples.

An organic light-emitting device was manufactured in the same manner as the OLED Pt-1, except that an emission layer having a continuous dopant concentration profile as illustrated in FIG. 11 and having a thickness of 40 nm was formed instead of the emission layer having the continuous dopant concentration profile as illustrated in FIG. 9.

The emission layer was formed in the same manner as in the emission layer of the OLED Pt-1, except that a position of the first deposition source configured to emit the dopant (Compound 3-170) and a position of the second deposition source configured to emit the host (the hole transport host H-H1 and the electron transport host H-E2) were changed to each other. The emission layer has a structure in which the regions having the following thicknesses are sequentially formed from the hole transport region.

1) A region 161*a* in which the dopant concentration is 5 wt %: 1 nm

2) A region 163*a* in which the dopant concentration gradually increases: 8.5 nm 3) A region 165*a* in which the dopant concentration is 20 wt %: 1 nm 4) A region 167*a* in which the dopant concentration gradually decreases: 9 nm 5) A region 169*a* and a region 161*a* in which the dopant concentration is 5 wt %: 1 nm 6) A region 163*b* in which the dopant concentration gradually increases: 9 nm 7) A region 165*b* in which the dopant concentration is 20 wt %: 1 nm 8) A region 167*b* in which the dopant concentration gradually decreases: 8.5 nm 9) A region 169*b* in which the dopant concentration is 5 wt %: 1 nm Manufacture of OLED Ir-1

An organic light-emitting device was manufactured in the same manner as in the OLED Pt-1, except that Compound Ir-A was used instead of Compound 3-170 as a dopant.

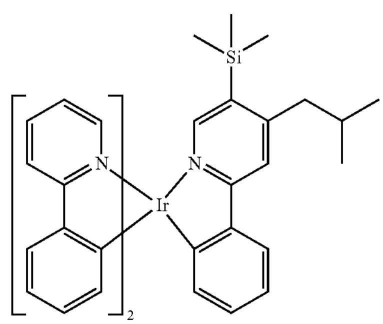

Ir-A

Manufacture of OLED Ir-2

An organic light-emitting device was manufactured in the same manner as in the OLED Pt-2, except that Compound Ir-A was used instead of Compound 3-170 as a dopant.

Manufacture of OLED Ir-3

An organic light-emitting device was manufactured in the same manner as in the OLED Pt-3, except that Compound Ir-A was used instead of Compound 3-170 as a dopant.

Evaluation Example 1

The driving voltage, luminescent efficiency, external quantum efficiency (EQE), and lifespan ($T_{95}$) of the OLED Pt-1 to the OLED Pt-3 and the OLED Ir-1 to the OLED Ir-3 were evaluated, and results thereof are shown in Table 1. A current-voltage meter (Keithley 2400) and a luminance meter (Minolta Cs-1000A) were used as an evaluation apparatus, and the lifespan ($T_{95}$) (at 6,000 nit) indicates an amount of time that lapsed when luminance was 95% of initial luminance (100%).

TABLE 1

| | Dopant | Dopant concentration profile | Driving voltage (V) | Luminescent efficiency (cd/A) | External quantum efficiency (%) | Lifespan ($T_{95}$) (at 6,000 nit) |
|---|---|---|---|---|---|---|
| OLED Pt-1 | 3-170 | Same as in FIG. 9 $N_2$ = 20 wt % $N_1$ = 5 wt % | 3.71 | 97.7 | 25.16 | 777 |
| OLED Pt-2 | 3-170 | Uniform in entire emission layer 10 wt % | 3.68 | 89.8 | 24.26 | 600 |
| OLED Pt-3 | 3-170 | Same as in FIG. 11 $N_2$ = 20 wt % $N_1$ = 5 wt % | 3.65 | 97.8 | 25.09 | 633 |
| OLED Ir-1 | Ir-A | Same as in FIG. 9 $N_2$ = 20 wt % $N_1$ = 5 wt % | 4.87 | 49.4 | 13.71 | 43 |
| OLED Ir-2 | Ir-A | Uniform in entire emission layer 10 wt % | 4.62 | 58.46 | 16.41 | 400 |
| OLED Ir-3 | Ir-A | Same as in FIG. 11 $N_2$ = 20 wt % $N_1$ = 5 wt % | 4.51 | 56.6 | 15.72 | 63 |

3-170

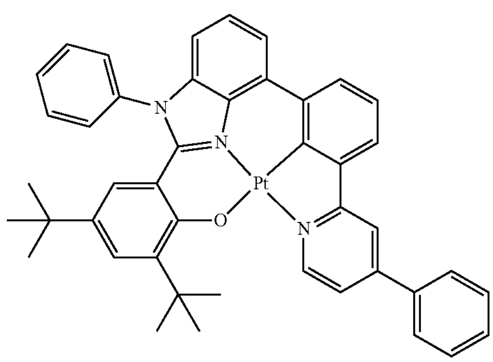

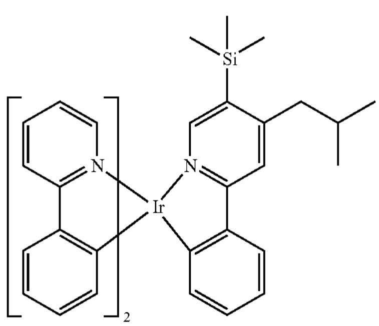

Ir-A

Referring to Table 1, it is confirmed that the OLED Pt-1 has the same or improved driving voltage, luminescent efficiency, and external quantum efficiency, as compared with the OLED Pt-2 and the OLED Pt-3, and has remarkably improved lifespan characteristics, as compared with the OLED Pt-2 and the OLED Pt-3. In addition, it is confirmed that the OLED Ir-1 has a poor driving voltage, luminescent efficiency, and external quantum efficiency, as compared with the OLED Ir-2 and the OLED Ir-3, and has reduced lifespan characteristics, as compared with the OLED Ir-2 and the OLED Ir-3.

The organic light-emitting device, which satisfies a predetermined parameter and includes an iridium-free organometallic compound, may have excellent luminance and lifespan characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organic light-emitting device comprising:

a first electrode;

a second electrode;

an emission layer comprising a host and a dopant, the emission layer disposed between the first electrode and the second electrode;

a hole transport region disposed between the first electrode and the emission layer; and an electron transport region disposed between the emission layer and the second electrode, wherein the dopant comprises platinum or palladium, and a tetradentate organic ligand including a benzimidazole and a pyridine group, a dopant concentration profile of the emission layer satisfies $N_1 \leq D_{con}(x) \leq N_2$ in a direction from the hole transport region toward the electron transport region, wherein the dopant concentration profile of the emission layer is continuous, x of $D_{con}(x)$ is a real number and a variable satisfying $0 \leq x \leq L_{EML}$, $L_{EML}$ is a thickness of the emission layer, $D_{con}(x)$ represents a dopant concentration (percent by weight) in the emission layer at a distance x from an interface between the hole transport region and the emission layer to an interface between the electron transport region and the emission layer, $N_1$ is a minimum value of a dopant concentration of the emission layer and is in a range of about 1 percent by weight to about 10 percent by weight, $N_2$ is a maximum value of the dopant concentration of the emission layer and is greater than about 10 percent by weight and less than or equal to about 40 percent by weight, wherein $D_{con}(0)$ and $D_{con}(L_{EML})$ are each $N_2$, wherein the dopant is represented by Formula 1A-1:

Formula 1A-1

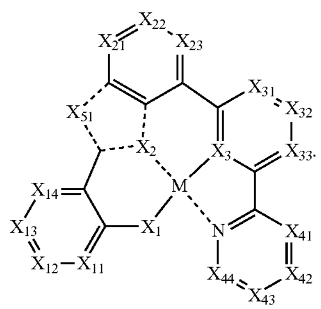

wherein in Formula 1A-1,

M represents the palladium or the platinum, $X_1$ is O or S, and a bond between $X_1$ and M is a covalent bond, $X_2$ is N, and $X_3$ is C, $X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], and $X_{14}$ is N or C-[$(L_{14})_{b14}$-$(R_{14})_{c14}$], $X_{21}$ is N or C-[$(L_{21})_{b21}$-$(R_{21})_{c21}$], $X_{22}$ is N or C-[$(L_{22})_{b22}$-$(R_{22})_{c22}$], and $X_{23}$ is N or C-[$(L_{23})_{b23}$-$(R_{23})_{c23}$], $X_{31}$ is N or C-[$(L_{31})_{b31}$-$(R_{31})_{c31}$], $X_{32}$ is N or C-[$(L_{32})_{b32}$-$(R_{32})_{c32}$], and $X_{33}$ is N or C-[$(L_{33})_{b33}$-$(R_{33})_{c33}$], $X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], and $X_{44}$ is N or C-[$(L_{44})_{b44}$-$(R_{44})_{c44}$], and $X_{51}$ is N-[$(L_7)_{b7}$-$(R_7)_{c7}$], wherein $L_7$, $L_{11}$ to $L_{14}$, $L_{21}$ to $L_{23}$, $L_{31}$ to $L_{33}$, and $L_{41}$ to $L_{44}$, are independently a substituted or unsubstituted $C_5$-$C_{30}$ carbocyclic group, or a substituted or unsubstituted $C_1$-$C_{30}$ heterocyclic group, b11 to b14, b21 to b23, b31 to b33, and b41 to b44, are independently an integer of 0 to 5, and $b_7$ is 0, $R_7$ is a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, or a substituted or unsubstituted monovalent non-aromatic condensed polycyclic group, $R_{11}$ to $R_{14}$, $R_{21}$ to $R_{23}$, $R_{31}$ to $R_{33}$, and $R_{41}$ to $R_{44}$, are independently hydrogen, deuterium, —F, a hydroxyl group, a cyano group, a nitro group, an amidino group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, c7 is 1, and c11 to c14, c21 to c23, c31 to c33, and c41 to c44, are independently an integer of 1 to 5, and optionally, at least two of $R_{11}$ to $R_{14}$ are linked to form a substituted or unsubstituted $C_5$-$C_{30}$ carbocyclic group or a substituted or unsubstituted $C_1$-$C_{30}$ heterocyclic group, optionally, at least two of $R_{21}$ to $R_{23}$ are linked to form a substituted or unsubstituted $C_5$-$C_{30}$ carbocyclic group or a substituted or unsubstituted $C_1$-$C_{30}$ heterocyclic group, optionally, at least two of $R_{31}$ to $R_{33}$ are linked to form a substituted or unsubstituted $C_5$-$C_{30}$ carbocyclic group or a substituted or unsubstituted $C_1$-$C_{30}$ heterocyclic group, or optionally, at least two of $R_{41}$ to $R_{44}$ are linked to form a substituted or unsubstituted $C_5$-$C_{30}$ carbocyclic group or a substituted or unsubstituted $C_1$-$C_{30}$ heterocyclic group.

2. An organic light-emitting device comprising:

a first electrode;

a second electrode;

an emission layer comprising a host and a dopant, the emission layer disposed between the first electrode and the second electrode;

a hole transport region disposed between the first electrode and the emission layer; and an electron transport region disposed between the emission layer and the second electrode, a dopant concentration profile of the emission layer satisfies $N_1 \leq D_{con}(x) \leq N_2$ in a direction from the hole transport region toward the electron transport region, wherein the dopant concentration profile of the emission layer is continuous, x of $D_{con}(x)$ is a real number and a variable satisfying $0 \leq x \leq L_{EML}$, $L_{EML}$ is a thickness of the emission layer, $D_{con}(x)$ represents a dopant concentration (percent by weight) in the emission layer at a distance x from an interface between the hole transport region and the emission layer to an interface between the electron transport region and the emission layer, $N_1$ is a minimum value of a dopant concentration of the emission layer and is in a range of about 1 percent by weight to about 10 percent by weight, $N_2$ is a maximum value of the dopant concentration of the emission layer and is greater than about 10 percent by weight and less than or equal to about 40 percent by weight, wherein $D_{con}(0)$ and $D_{con}(L_{EML})$ are each $N_2$, wherein the dopant is represented by one or more of the following:

-continued
1-1
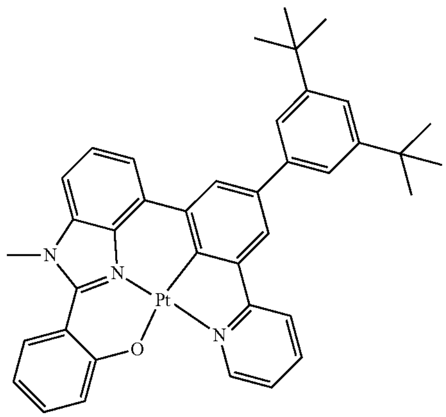
1-2
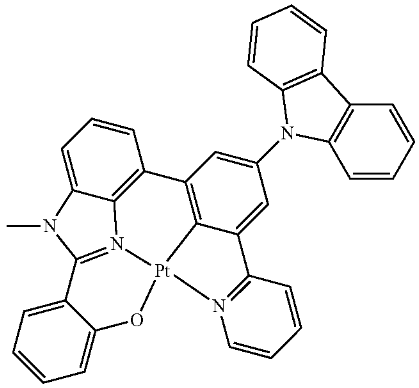
1-3
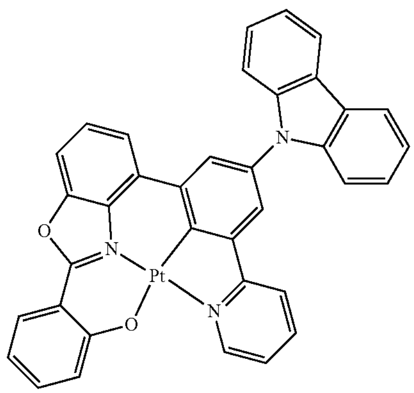
1-4
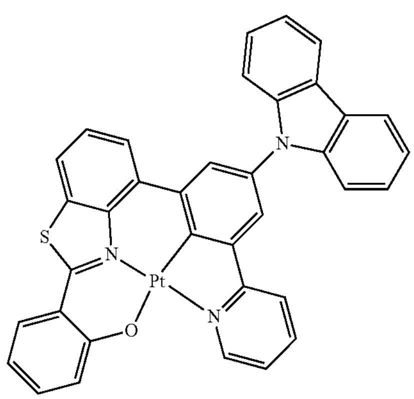
1-5
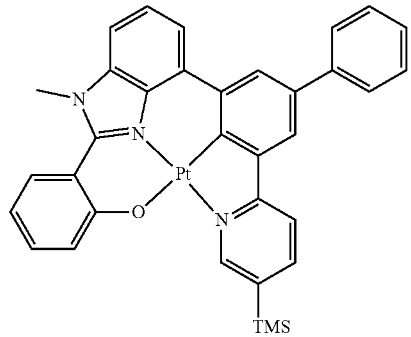
1-6
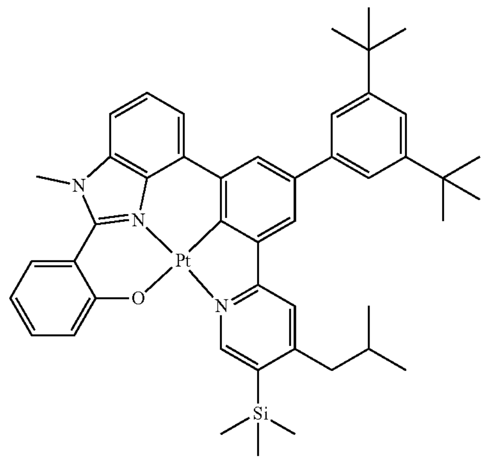
1-7
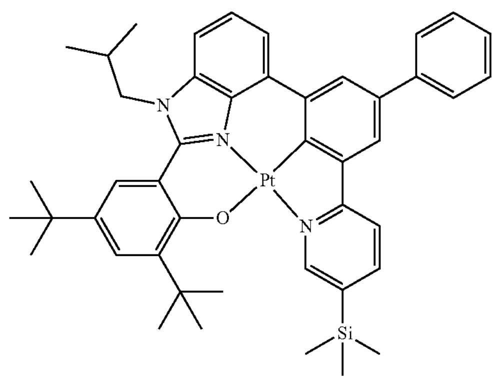
1-8
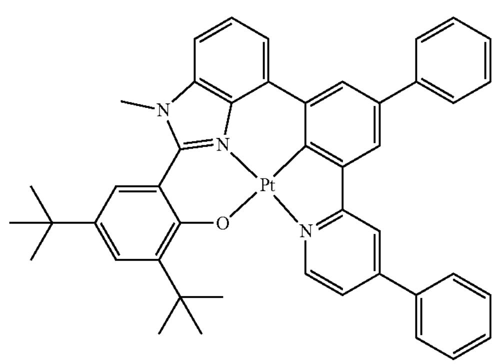

-continued
1-9
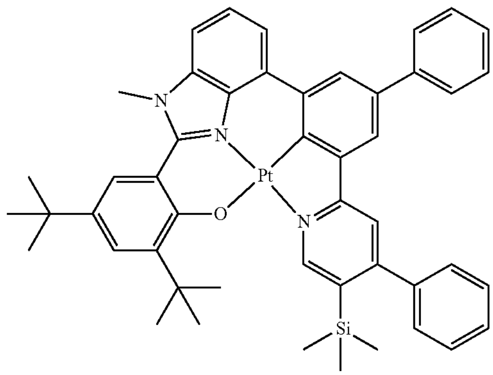
1-10
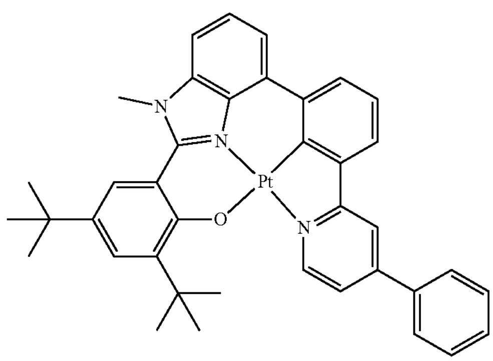
1-11
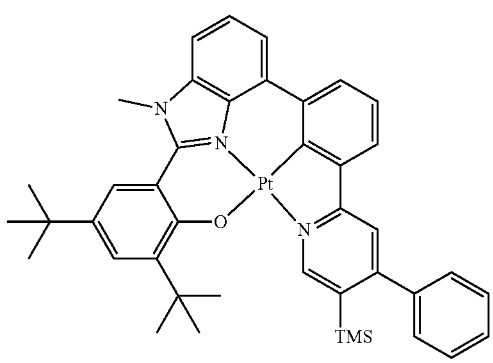
1-12
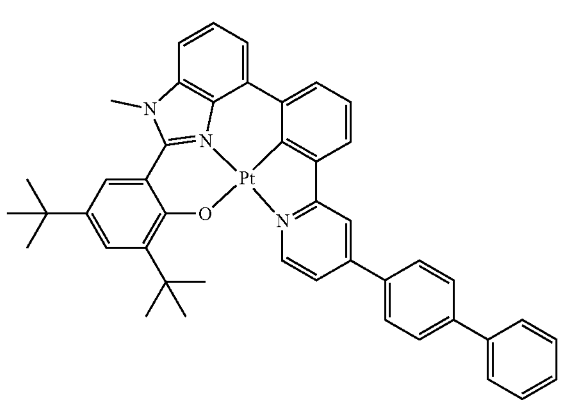
-continued
1-13
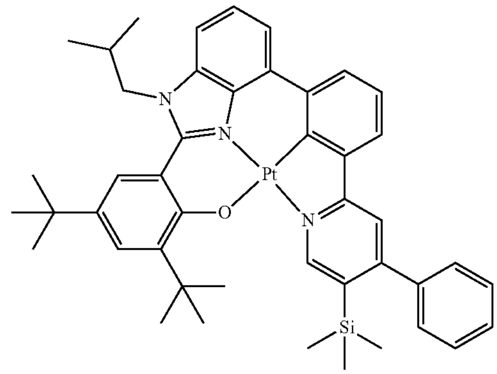
1-14
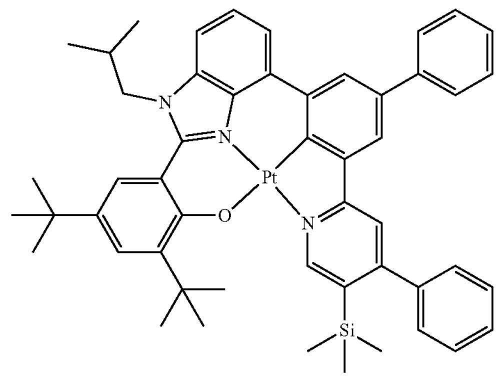
1-15
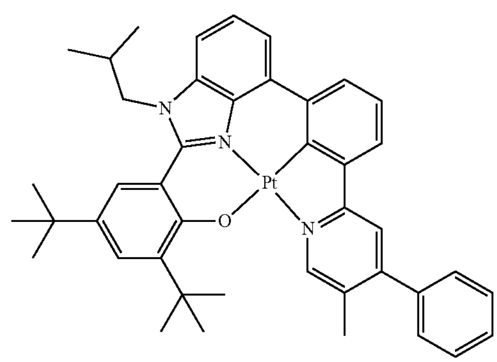
1-16
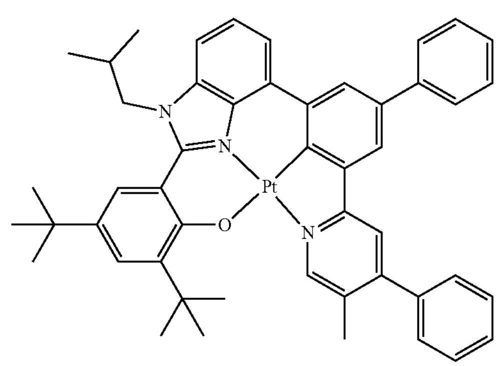

-continued
1-17
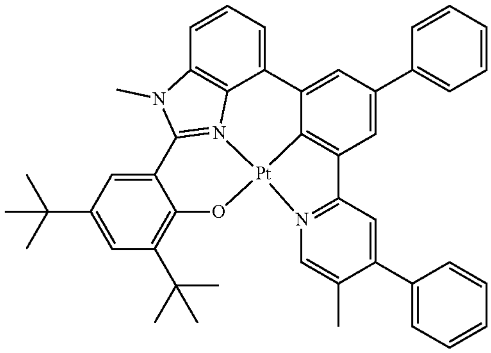
1-18
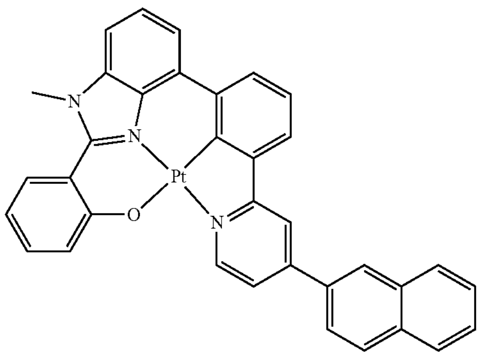
1-19
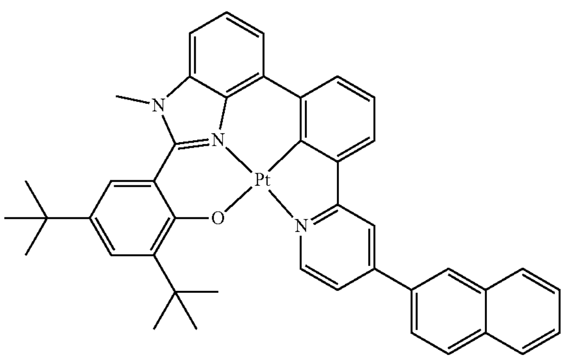
1-20
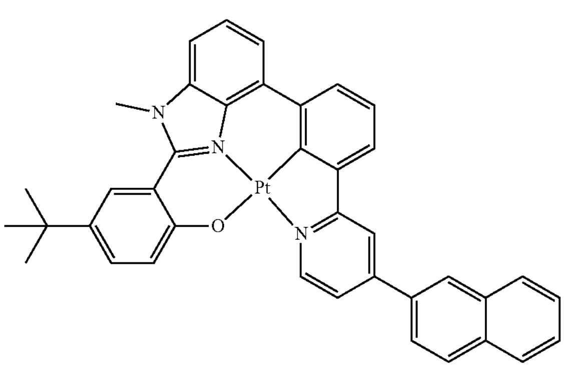
-continued
1-21
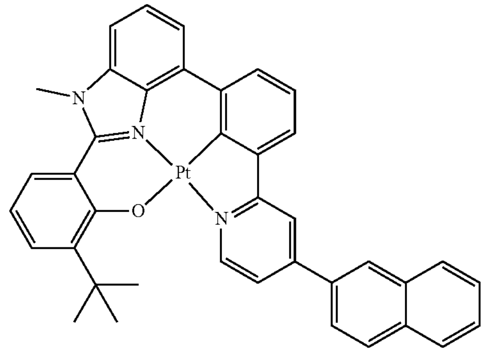
1-22
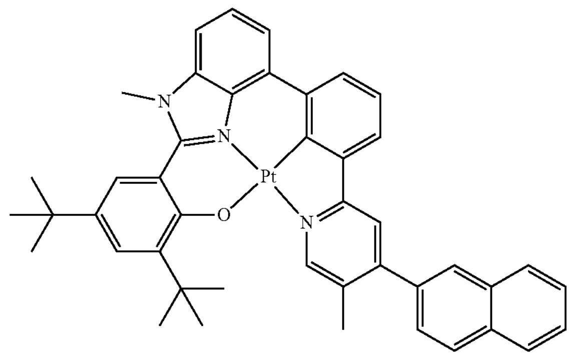
1-23
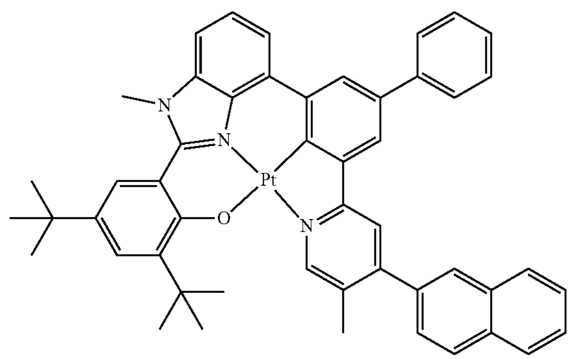
1-24
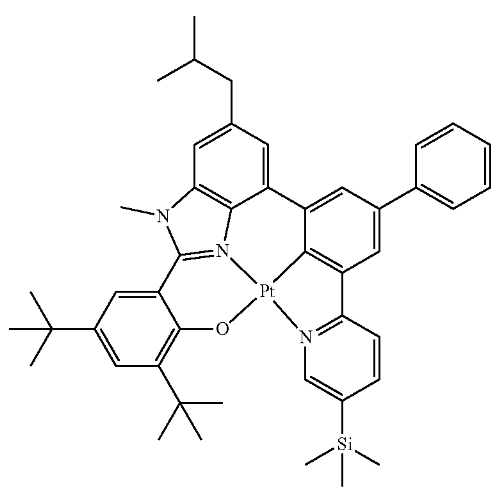

-continued
1-25
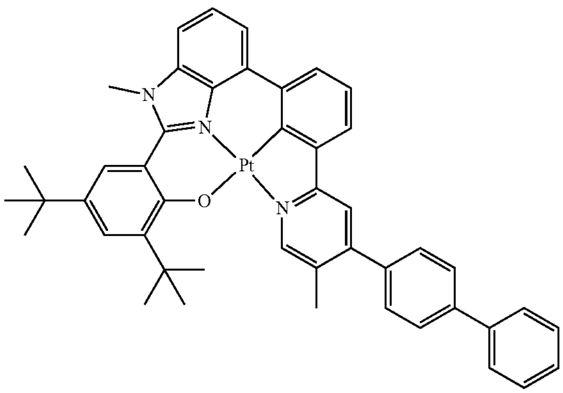
1-26
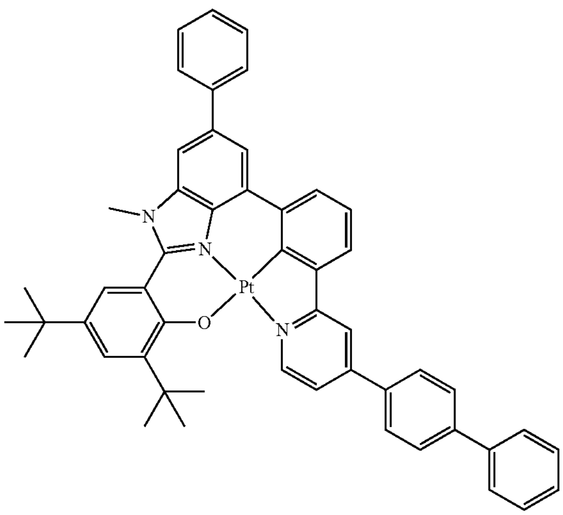
1-27
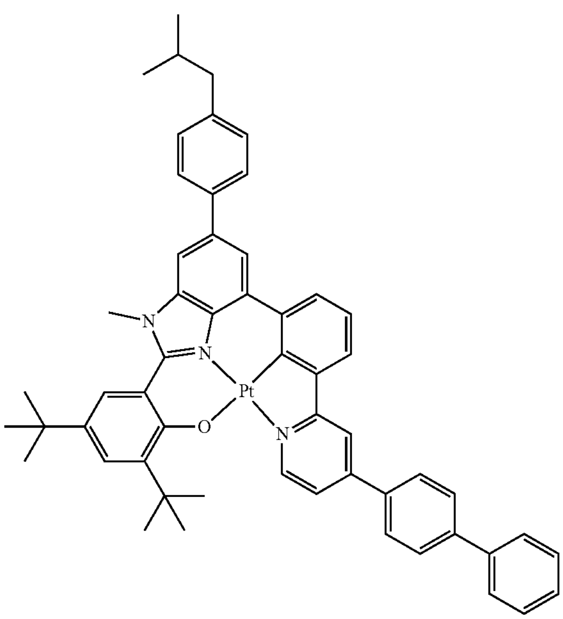
-continued
1-28
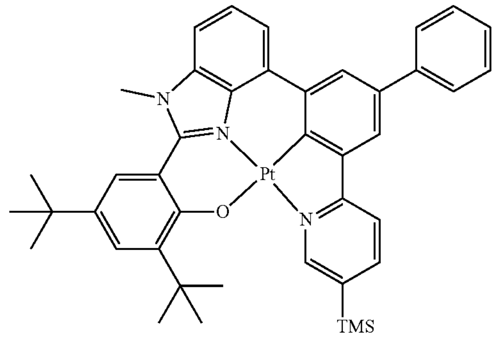
1-29
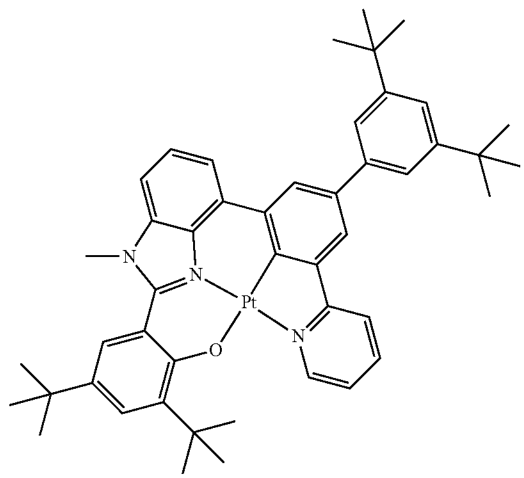
1-30
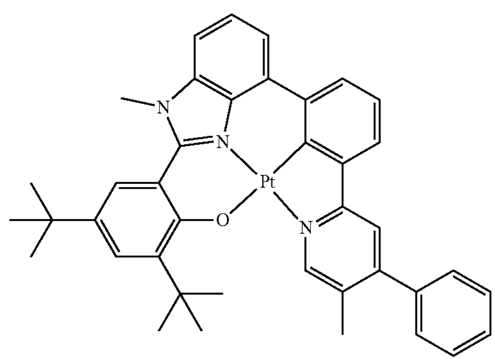
1-31
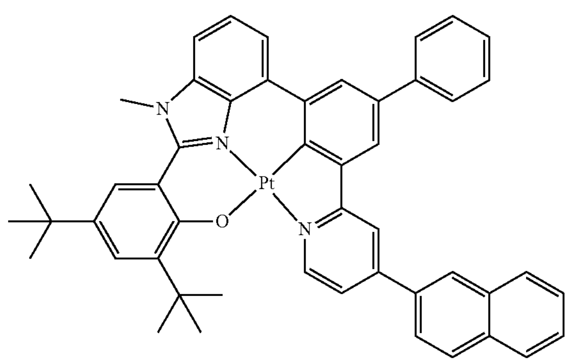

-continued
1-32
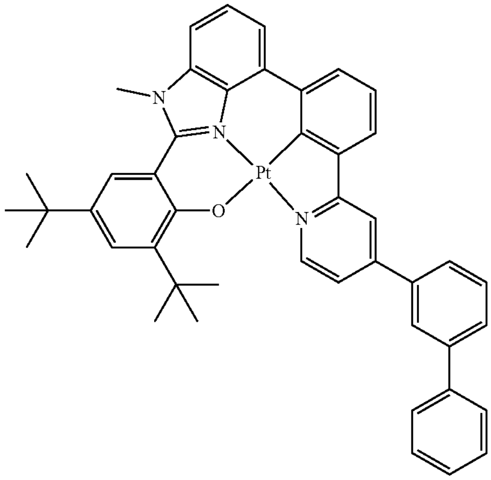
1-33
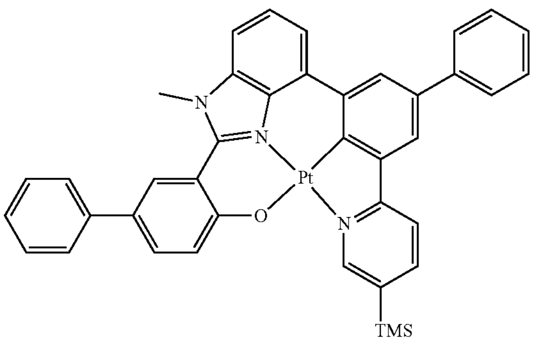
1-34
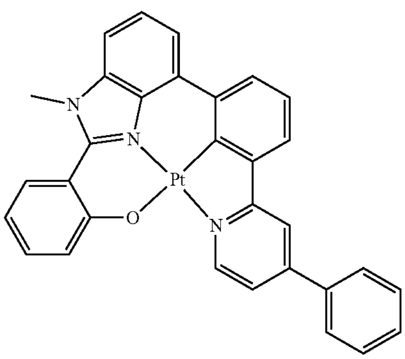
1-35
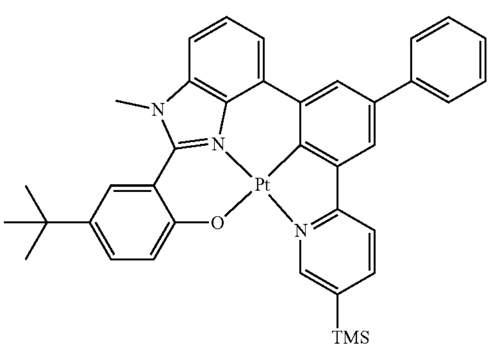
-continued
1-36
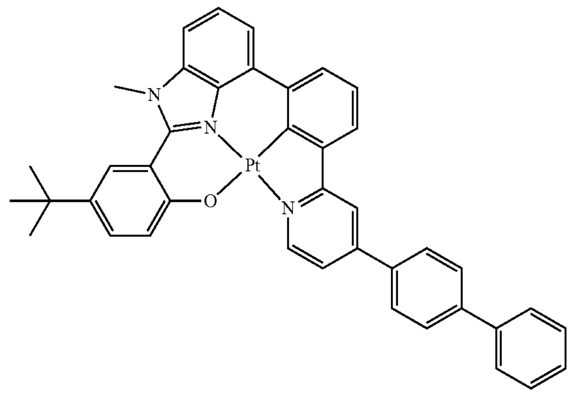
1-37
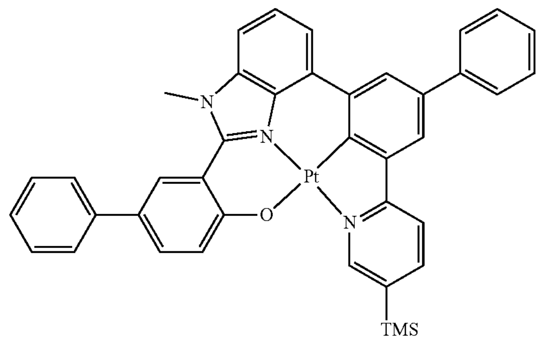
1-38
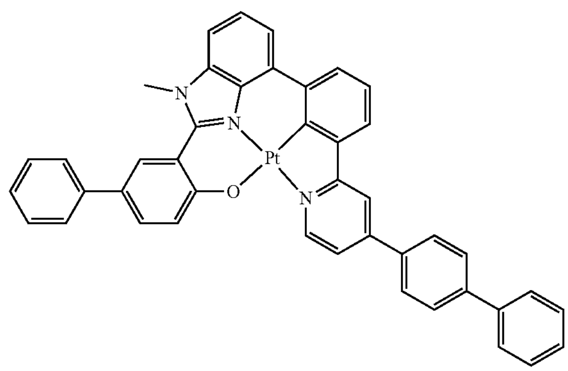
1-39
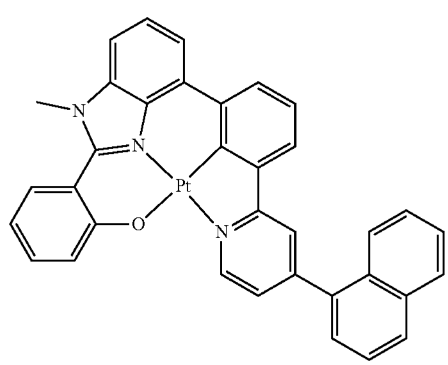

-continued
1-40
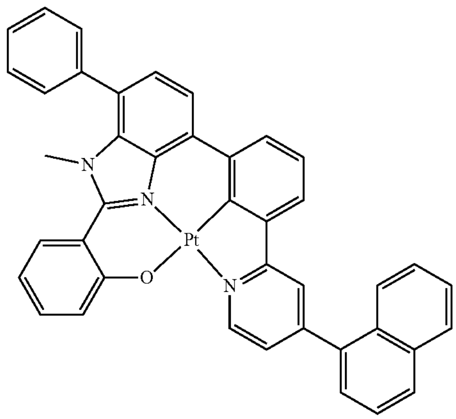
1-41
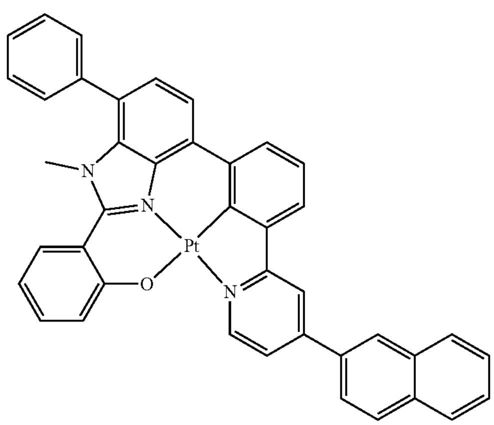
1-42
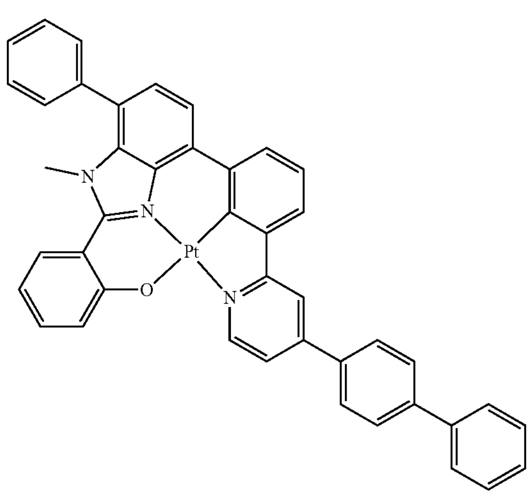
-continued
1-43
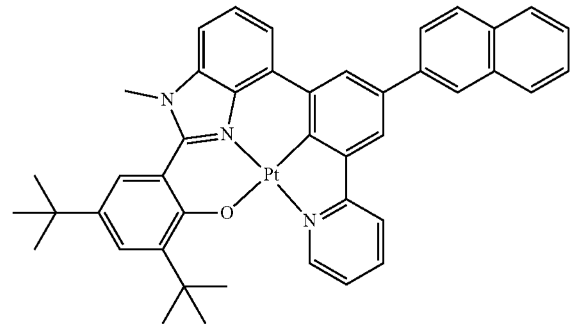
1-44
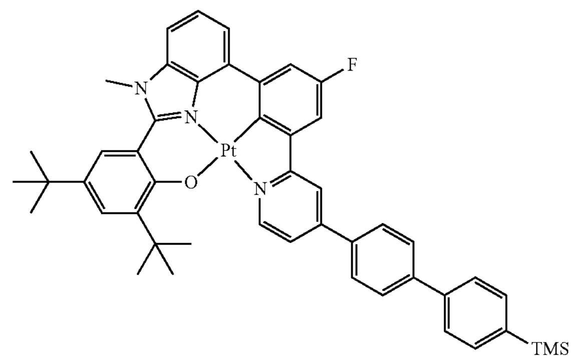
1-45
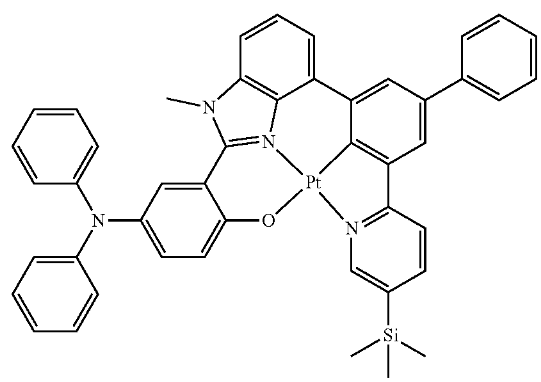
1-46
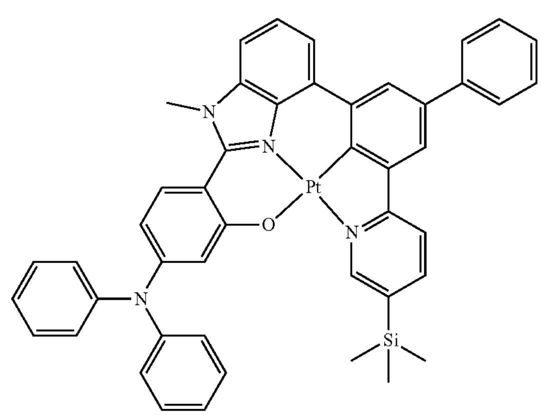

-continued
1-47
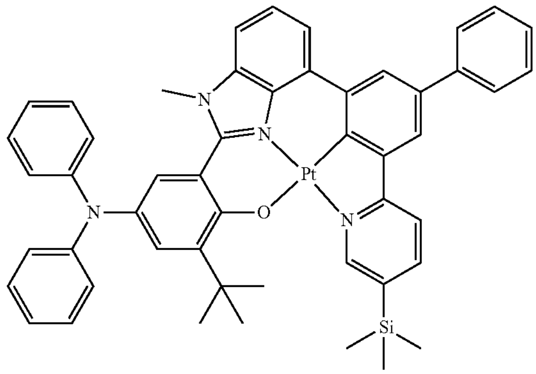
1-48
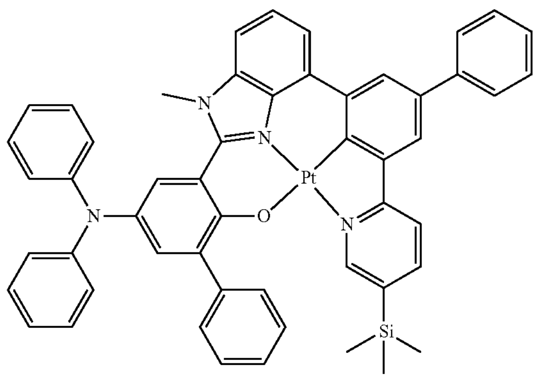
1-49
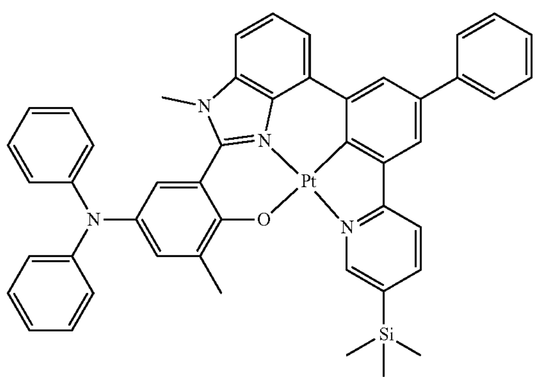
1-50
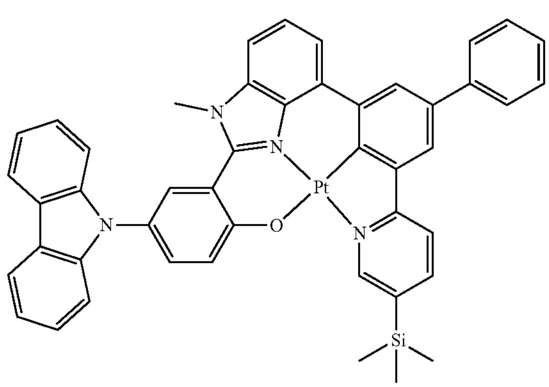
-continued
1-51
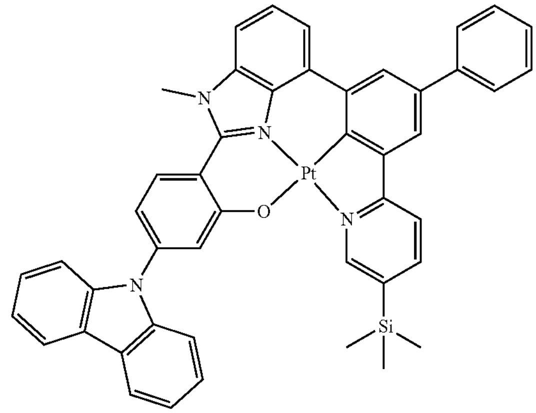
1-52
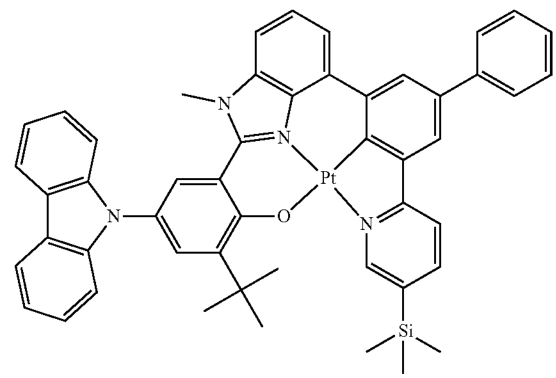
1-53
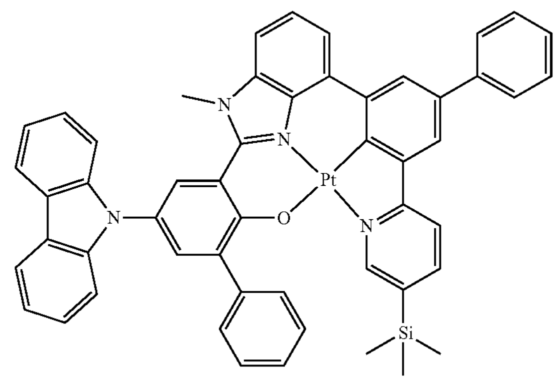
1-54
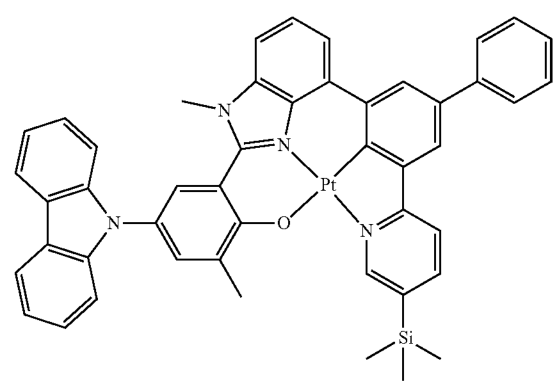

-continued
1-55
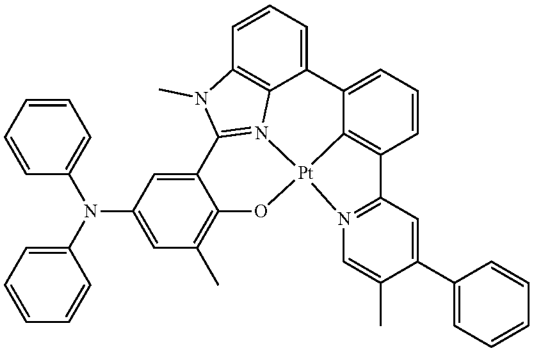
1-56
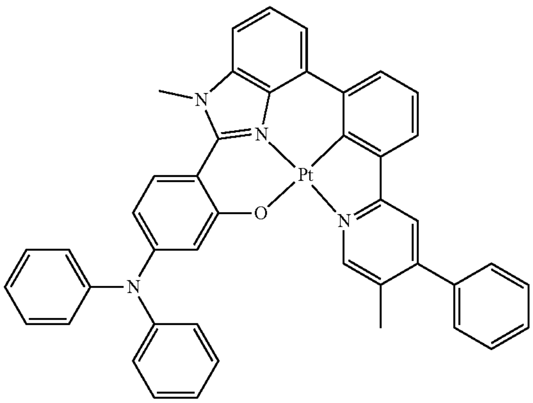
1-57
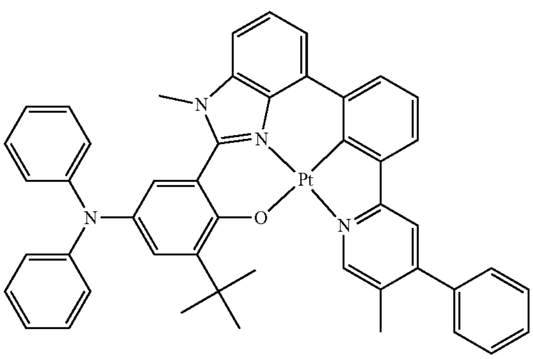
1-58
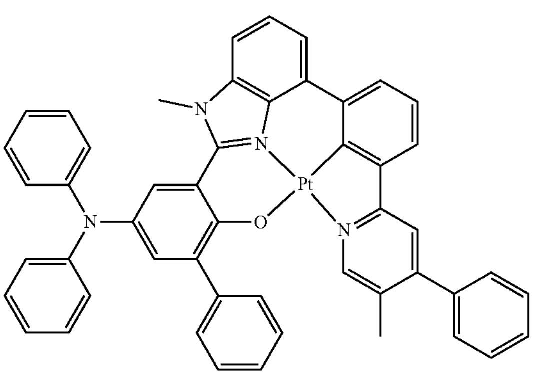
-continued
1-59
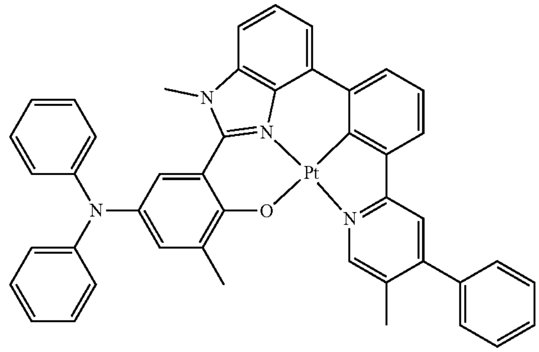
1-60
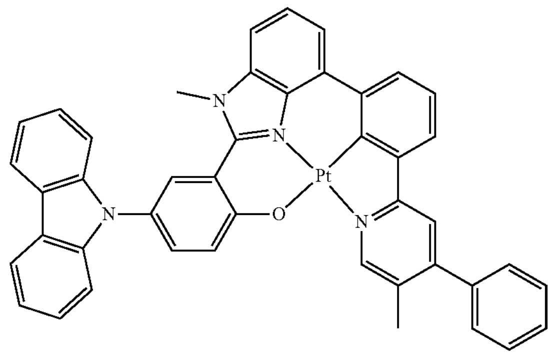
1-61
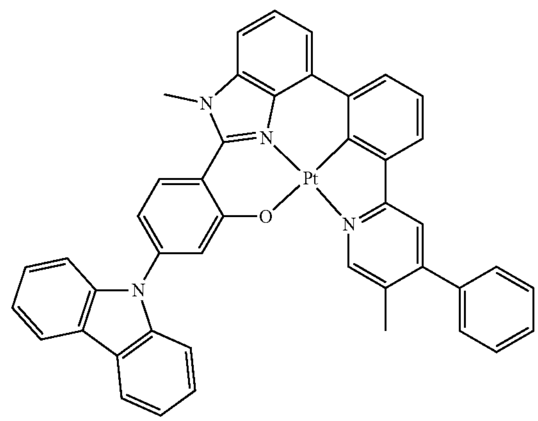
1-62
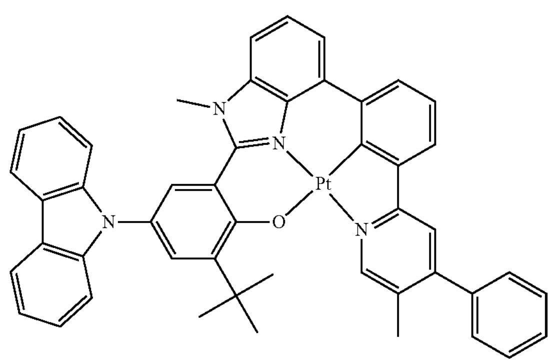

-continued
1-63
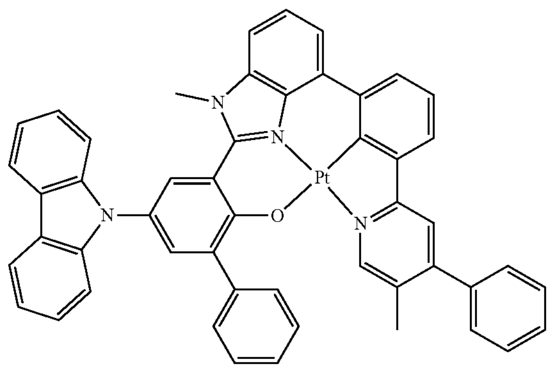
1-64
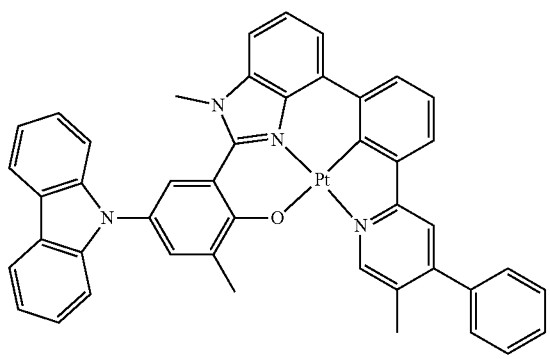
1-65
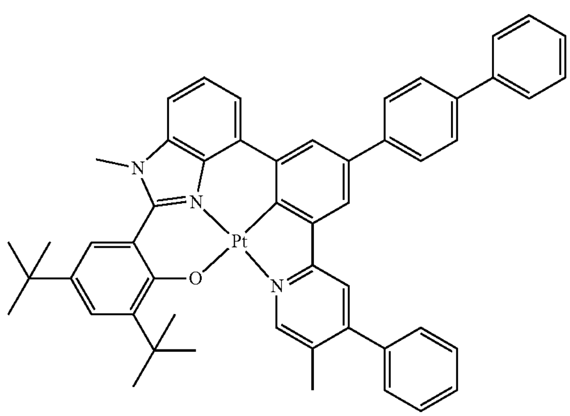
1-66
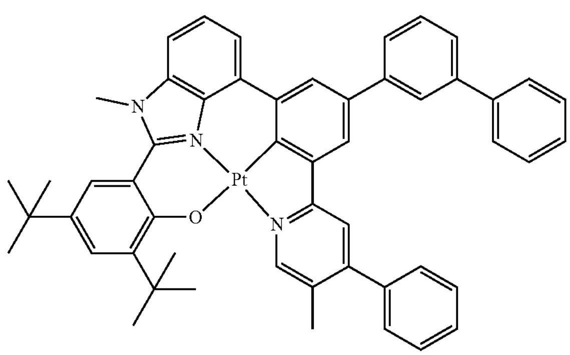
-continued
1-67
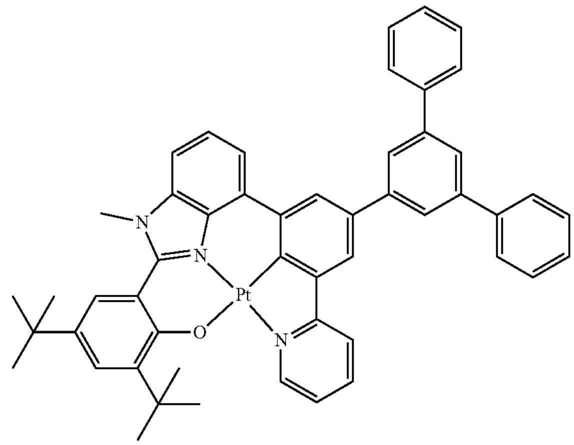
1-68
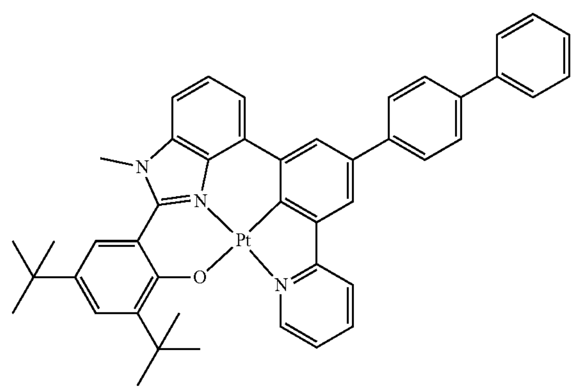
1-69
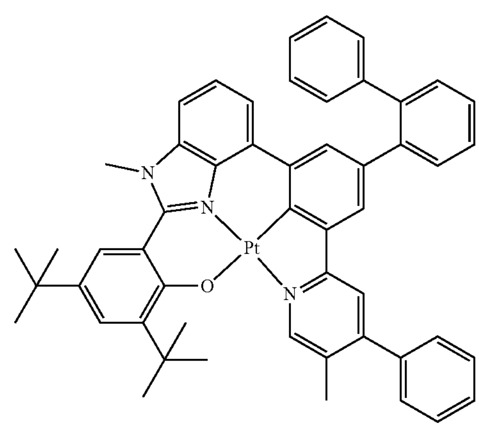

-continued
1-70
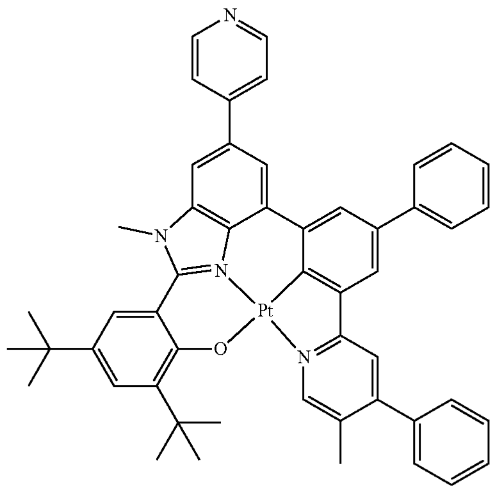
1-71
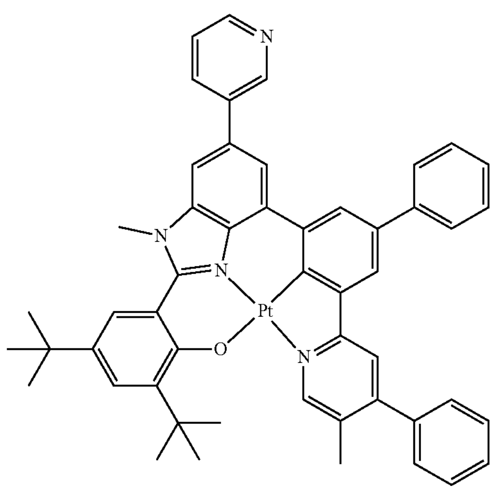
1-72
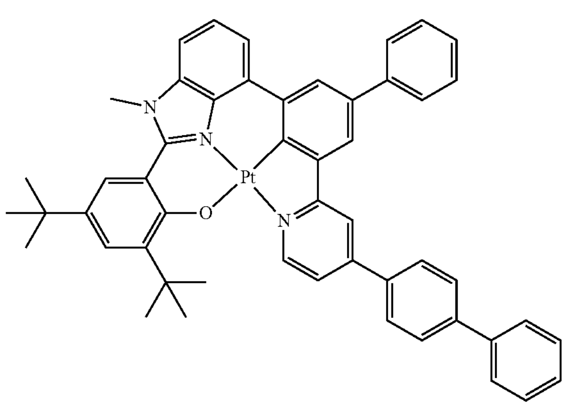
-continued
1-73
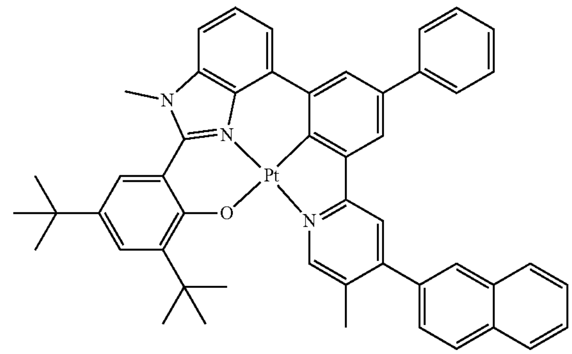
1-74
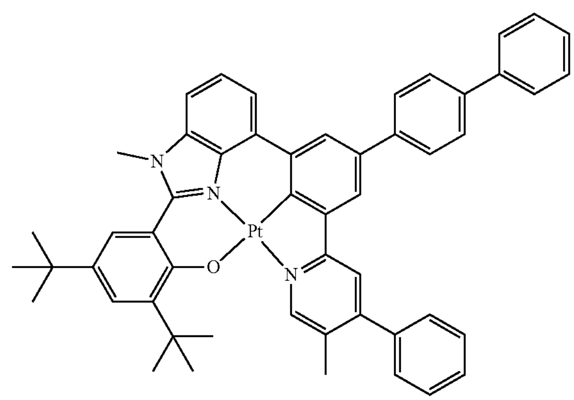
1-75
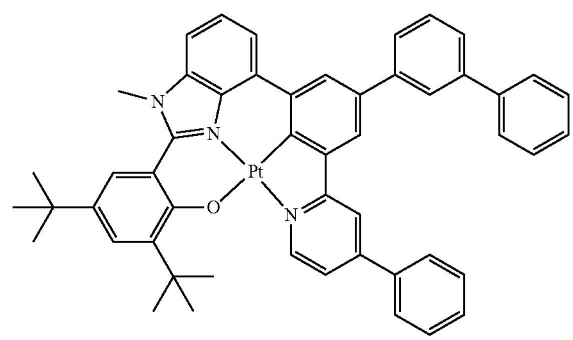
1-76
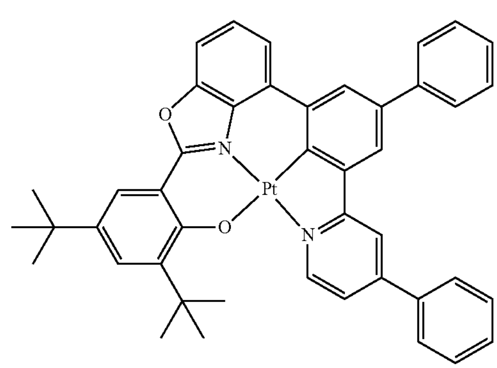

-continued
1-77
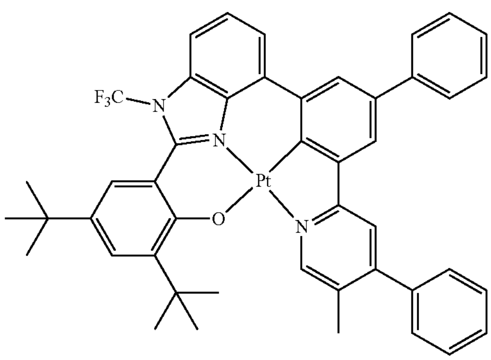
1-78
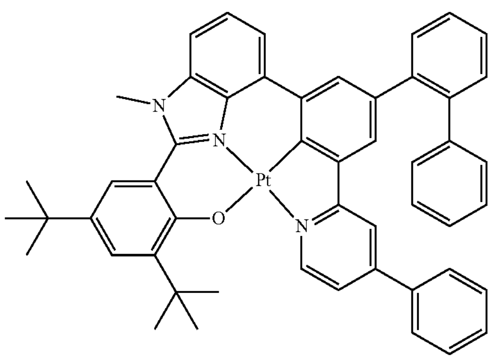
1-79
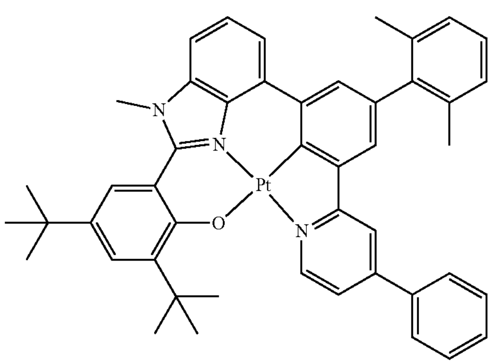
1-80
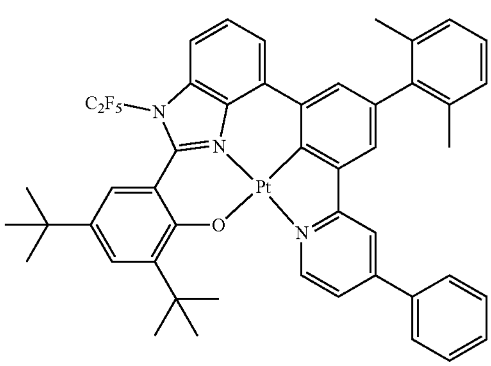
-continued
1-81
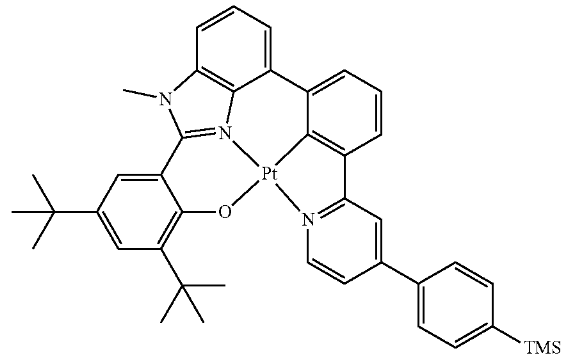
1-82
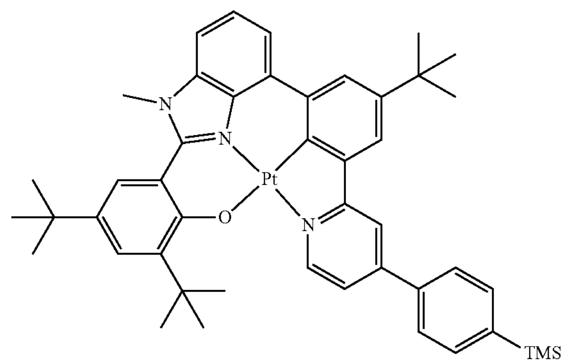
1-83
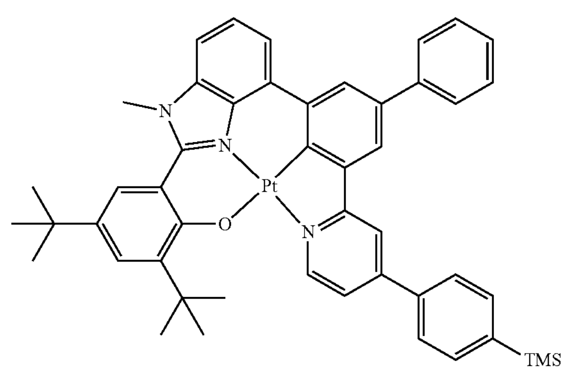
1-84
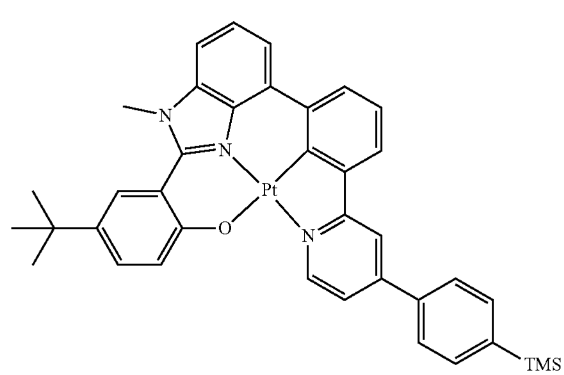

-continued
1-85
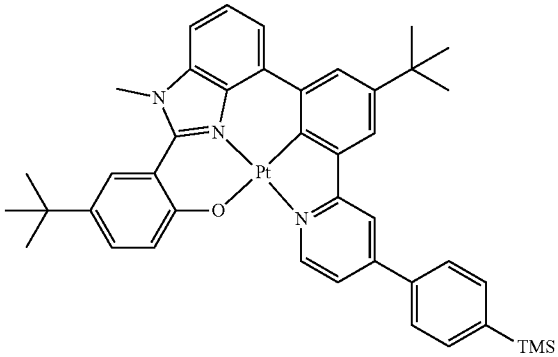
1-86
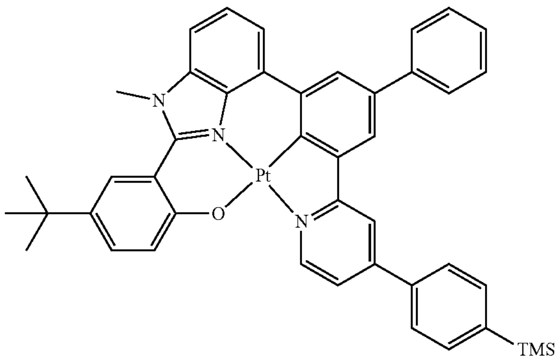
1-87
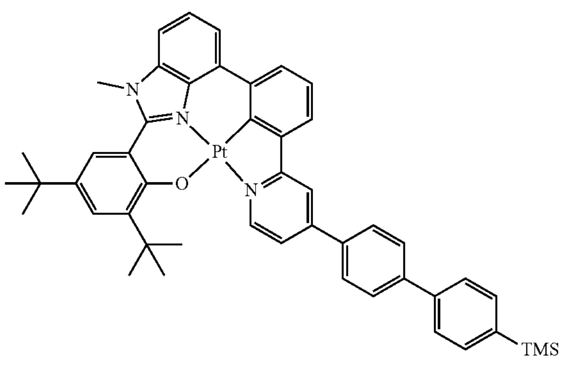
1-88
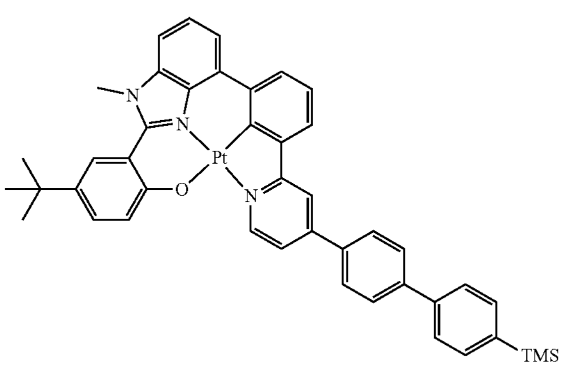
-continued
2-1
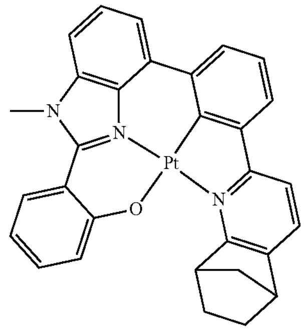
2-2
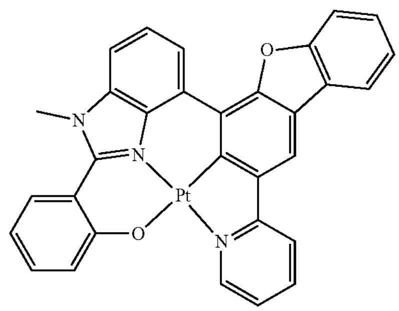
2-3
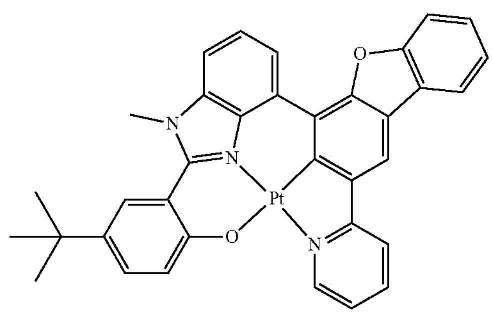
2-4
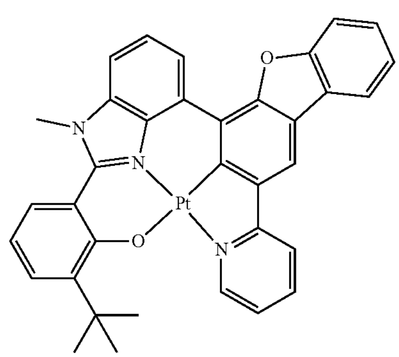

-continued
2-5
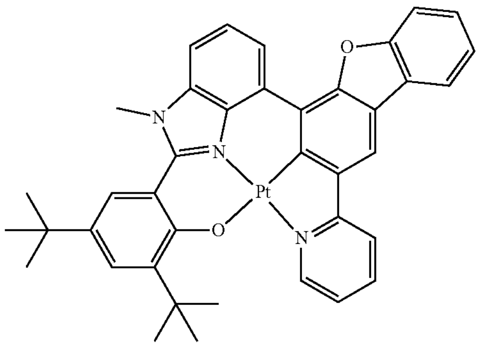
2-6
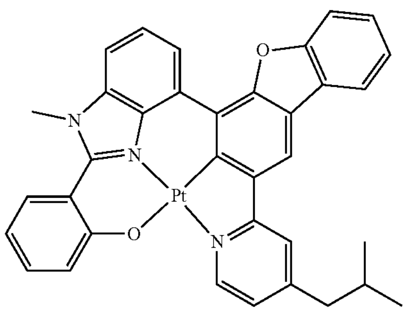
2-7
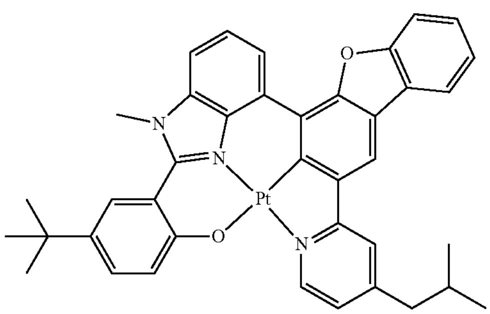
2-8
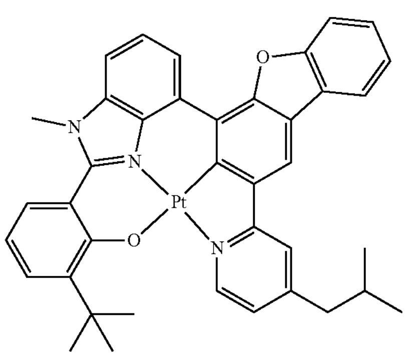
-continued
2-9
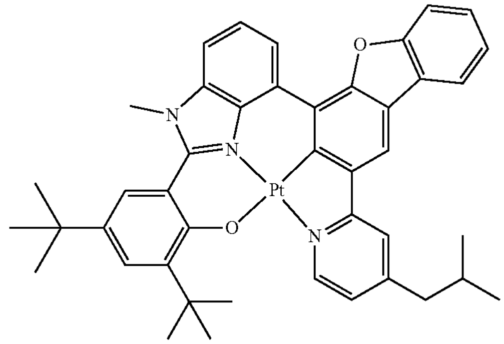
2-10
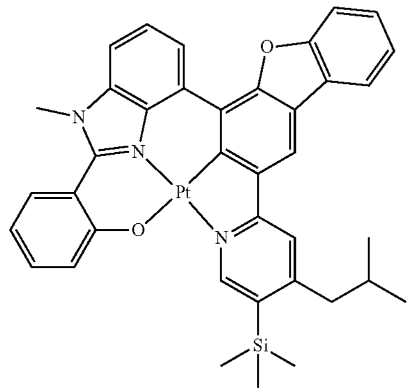
2-11
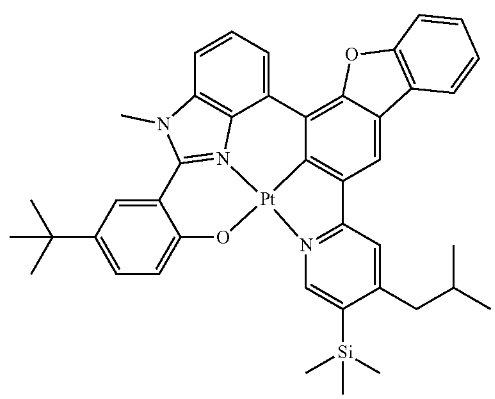
2-12
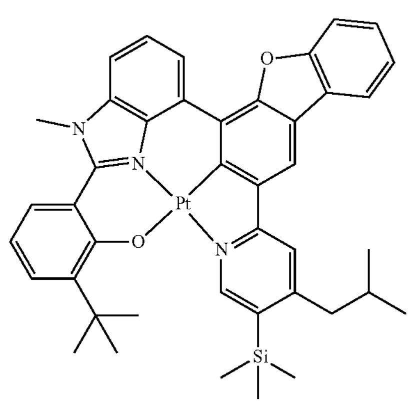

-continued
2-13
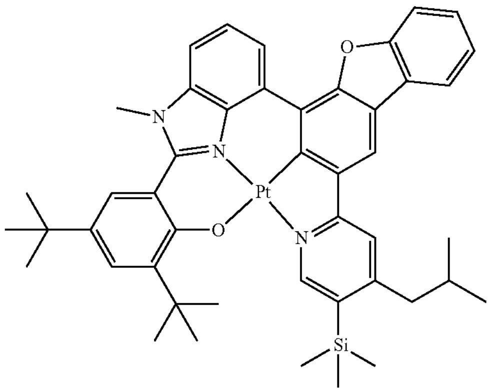
2-14
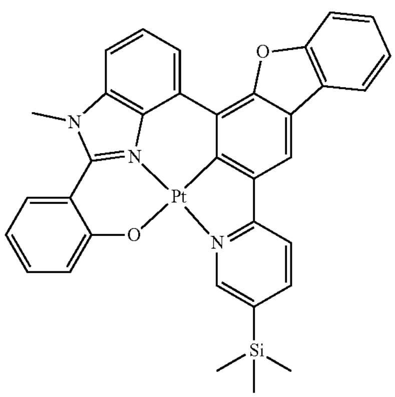
2-15
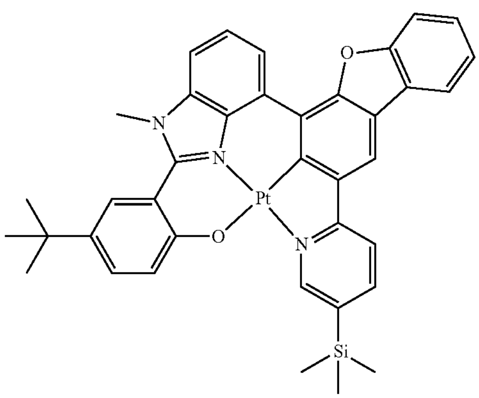
2-16
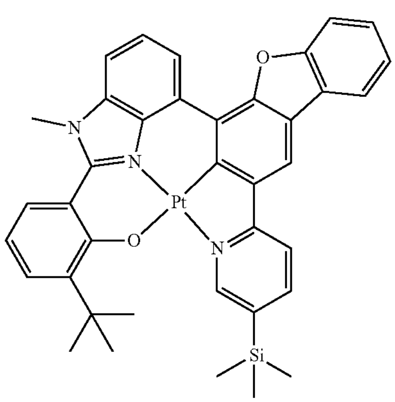
-continued
2-17
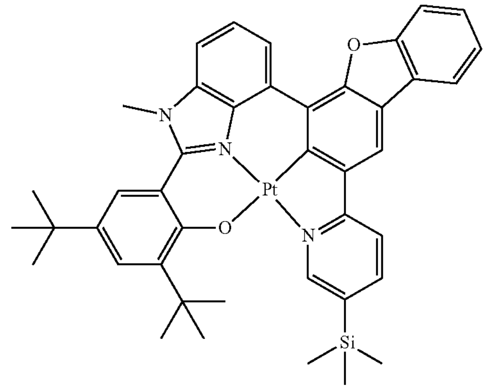
2-18
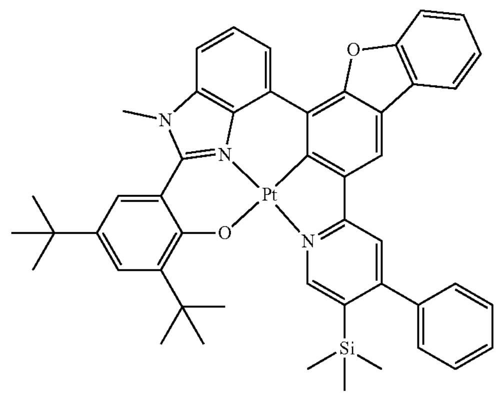
2-19
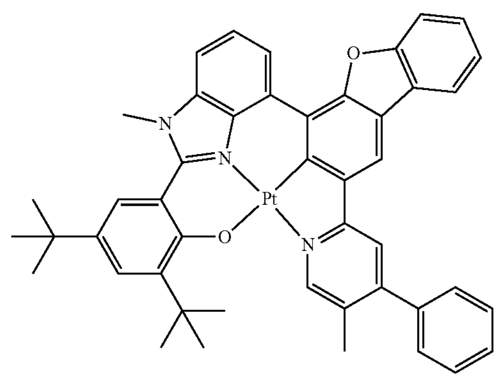
2-20
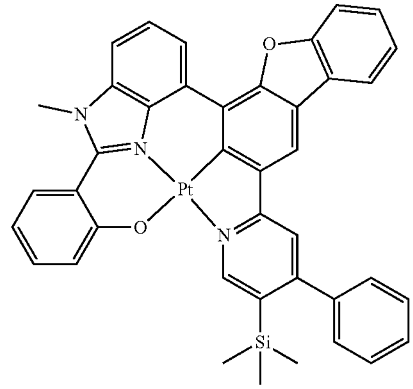

-continued
2-21
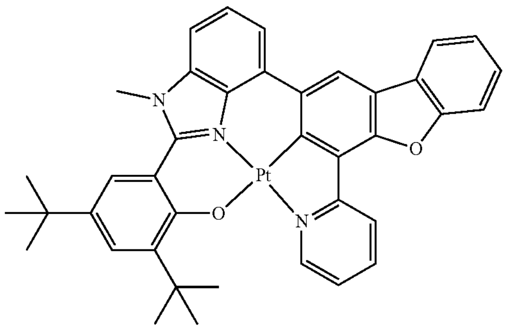
2-22
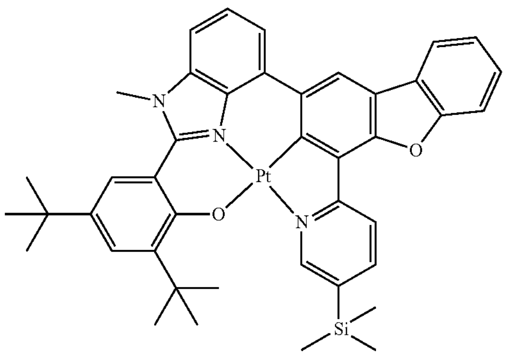
2-23
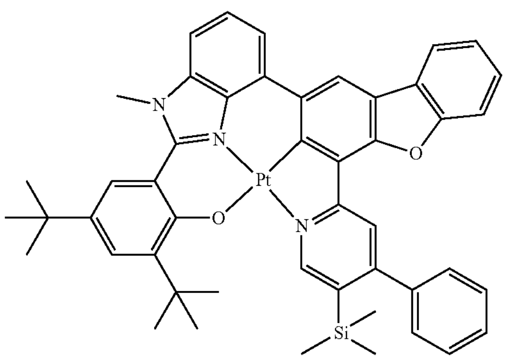
2-24
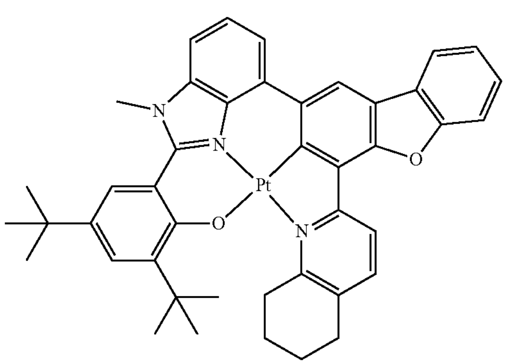
-continued
2-25
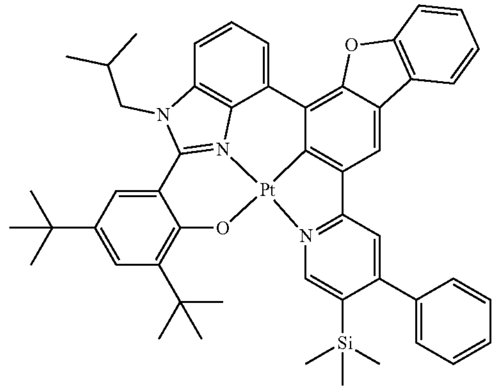
2-26
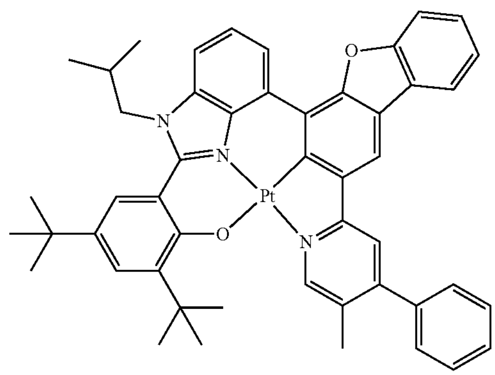
2-27
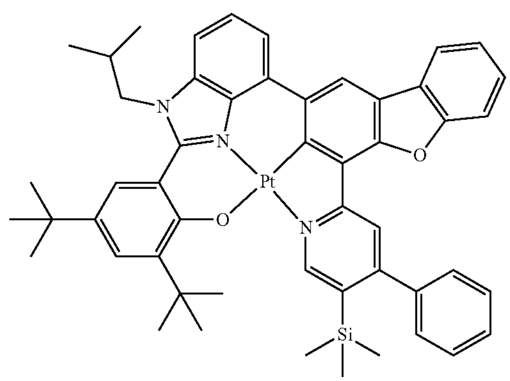
2-28
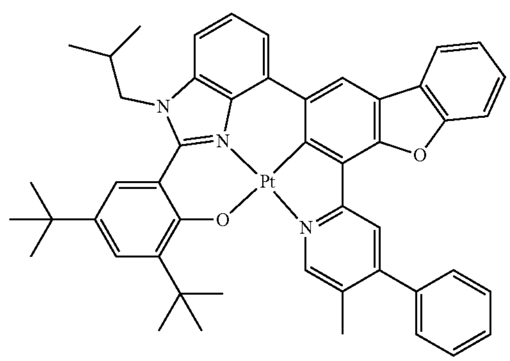

2-29
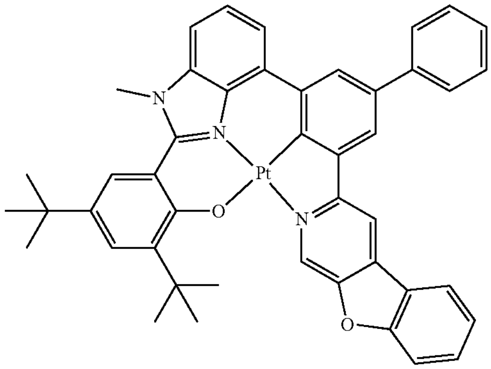
2-30
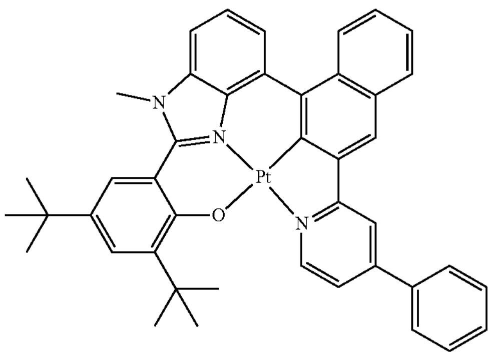
2-31
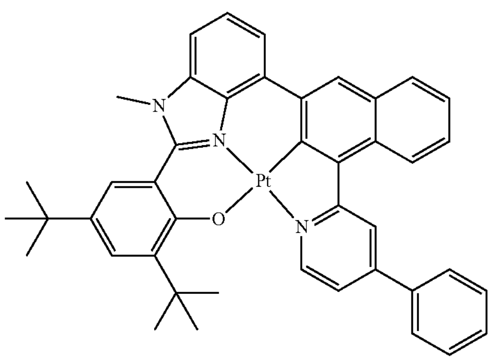
2-32
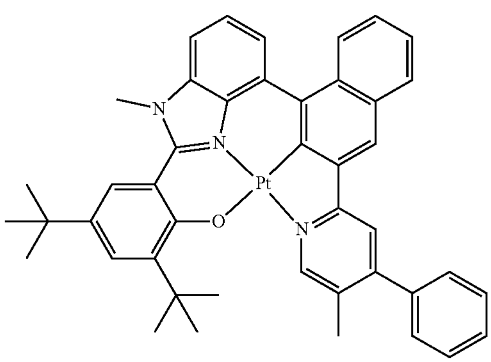
2-33
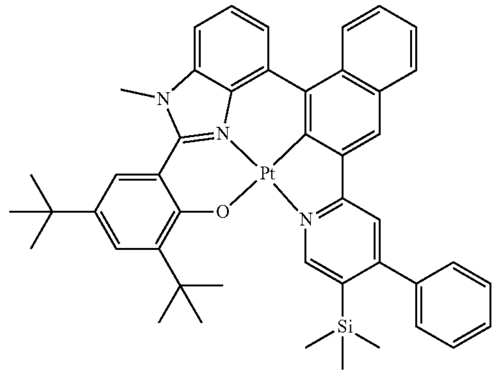
2-34
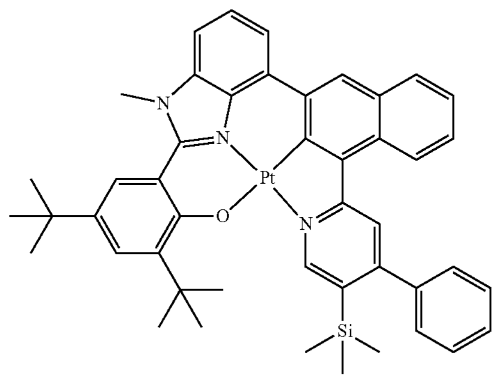
2-35
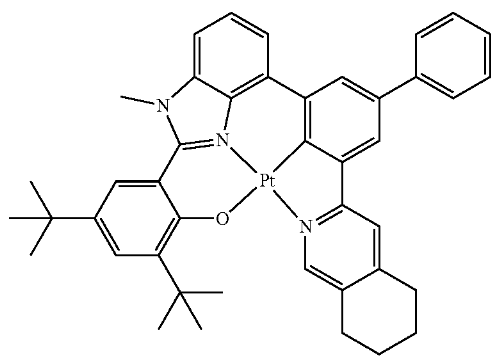
2-36
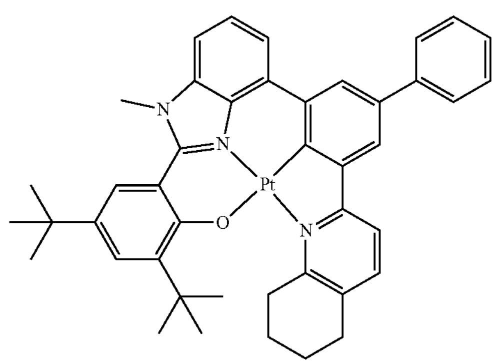

-continued
2-37
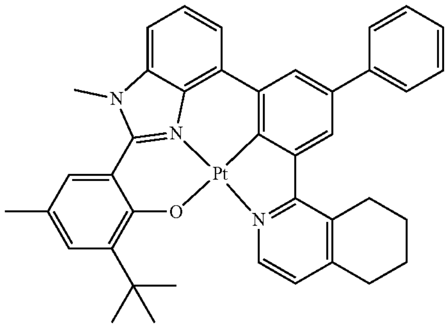
2-38
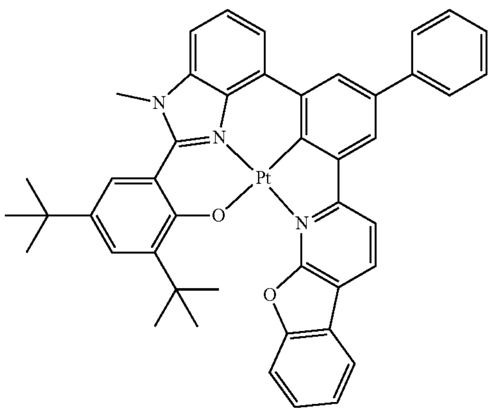
2-39
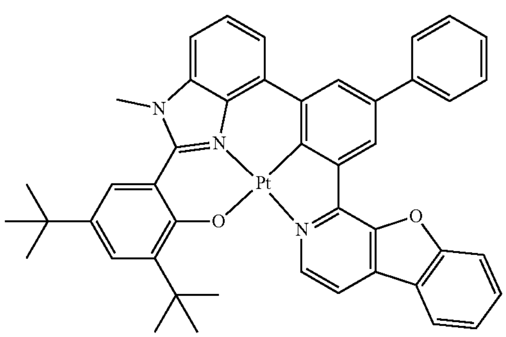
2-40
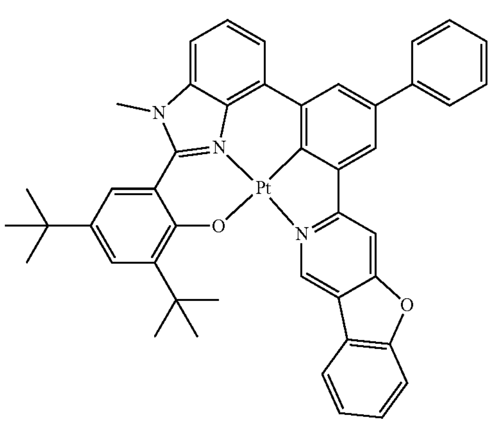
-continued
2-41
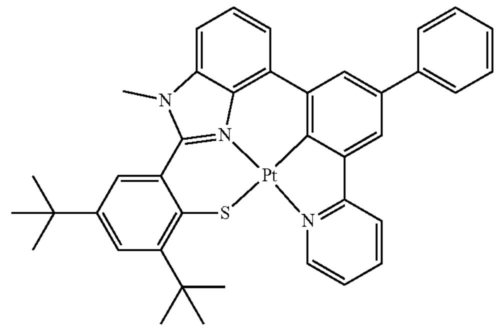
2-42
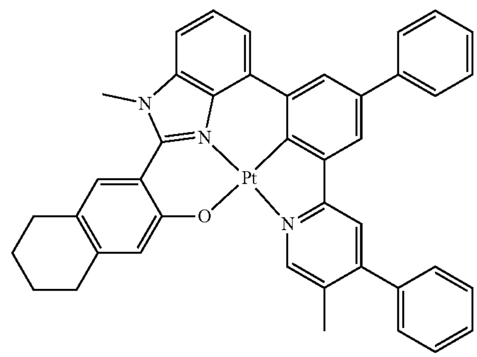
2-43
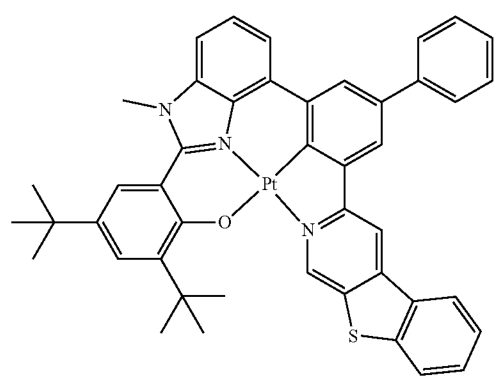
2-44
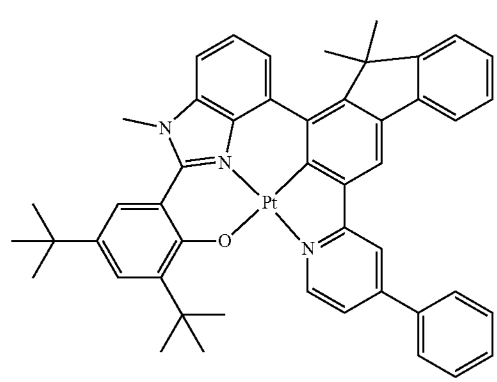

2-45
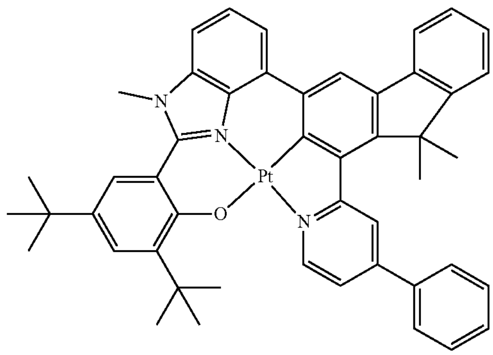
2-46
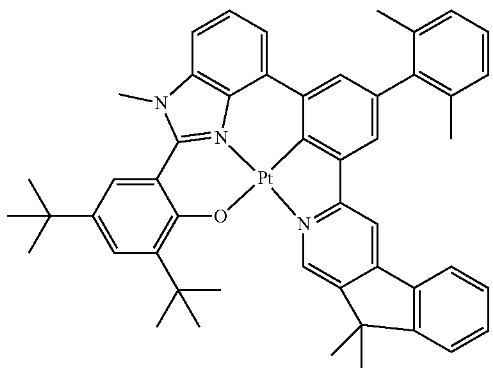
2-47
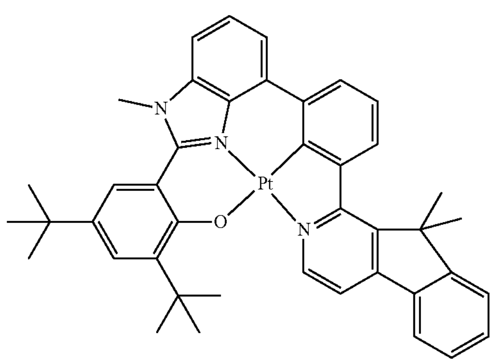
3-1
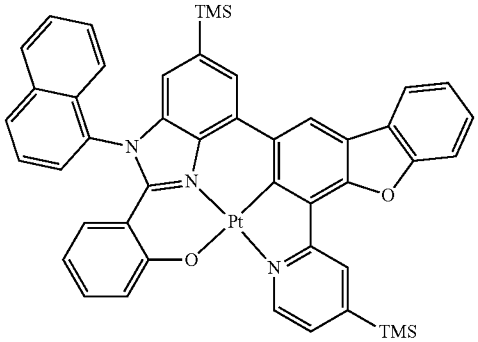
3-2
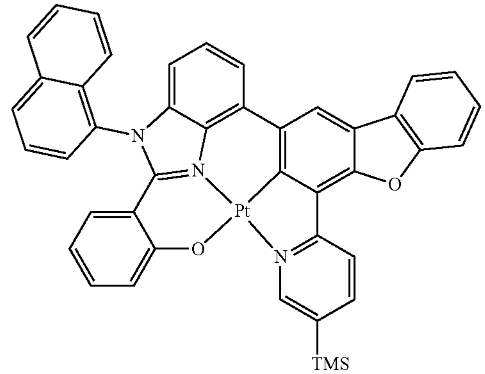
3-3
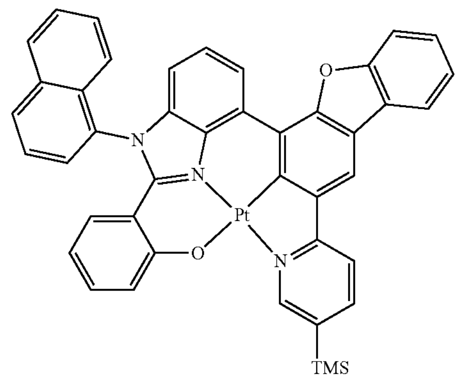
3-4
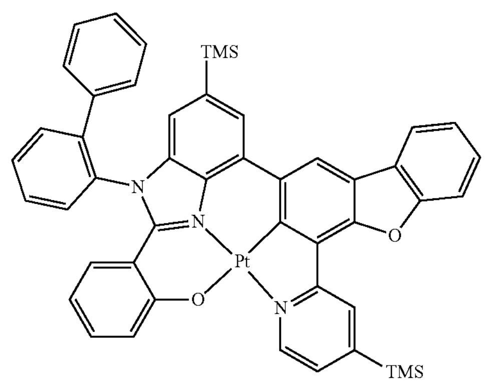
3-5
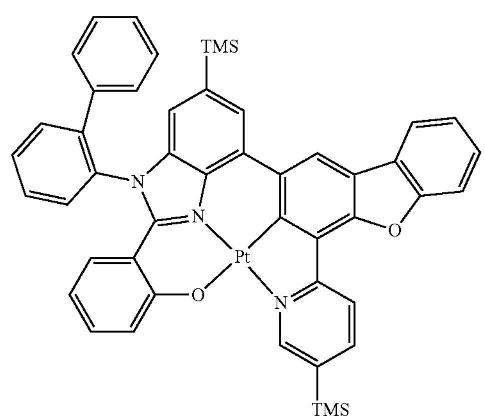

-continued
3-6
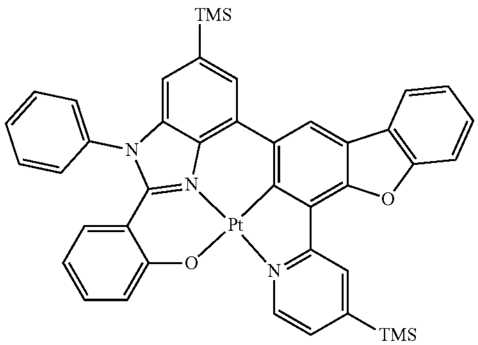
3-7
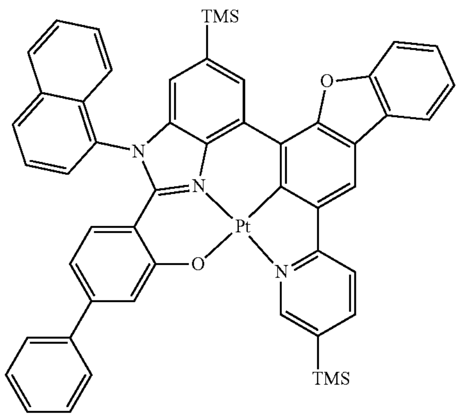
3-8
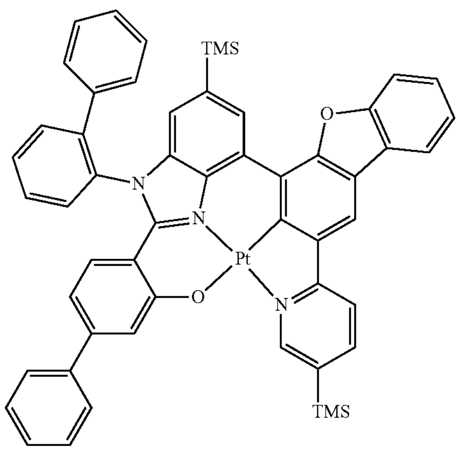
3-9
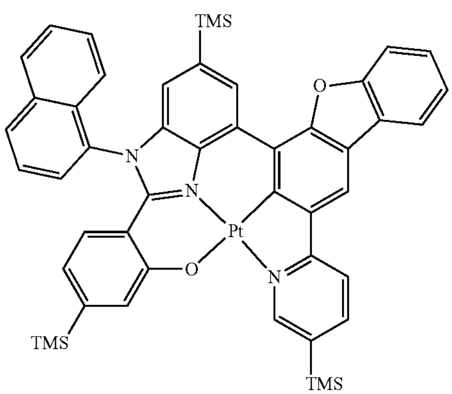
-continued
3-10
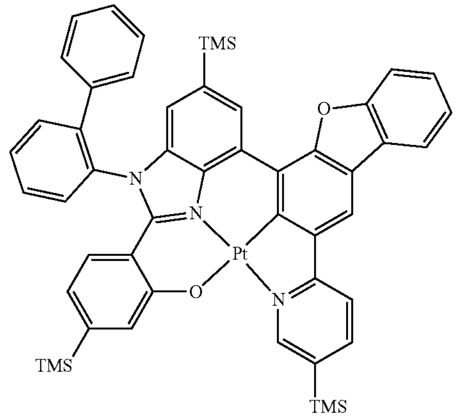
3-11
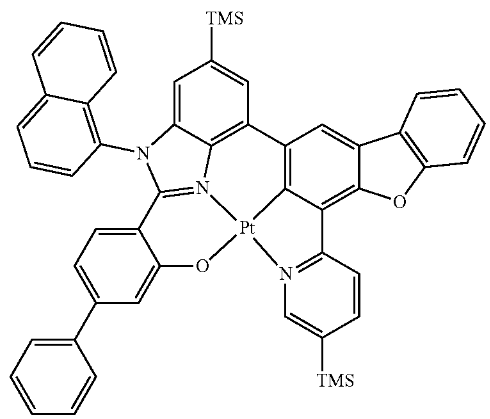
3-12
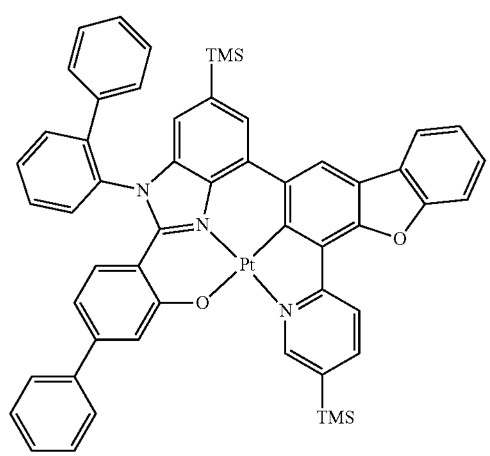

-continued
3-13
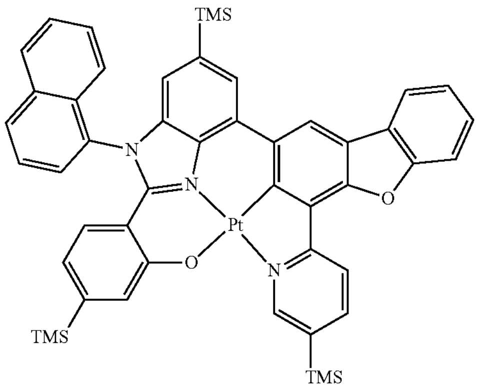
3-14
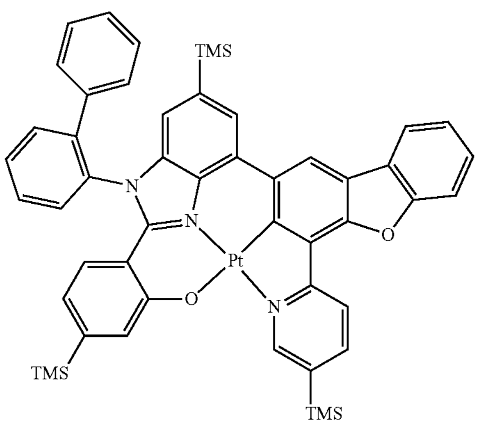
3-15
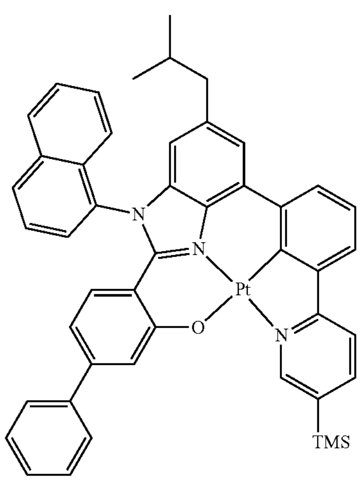
-continued
3-16
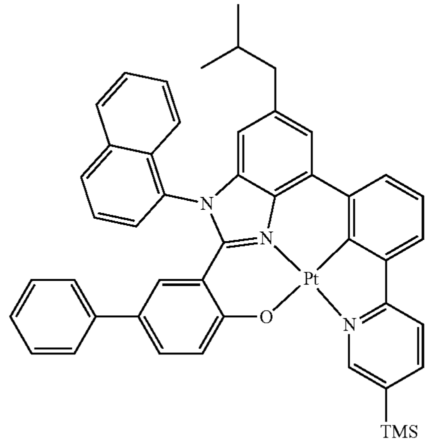
3-17
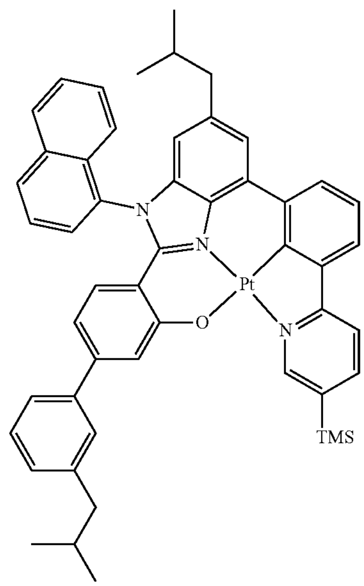
3-18
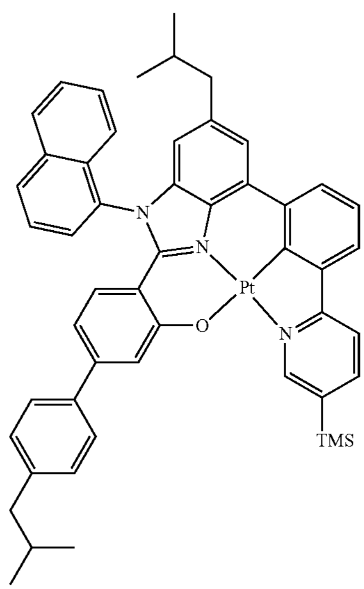

-continued
3-19
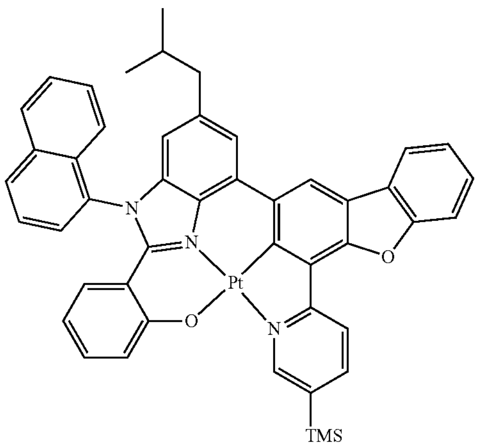
3-20
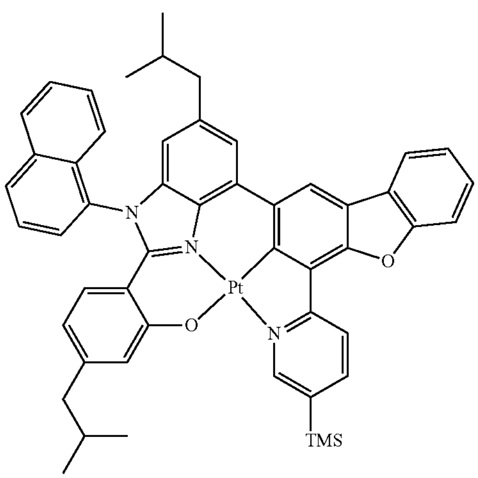
3-21
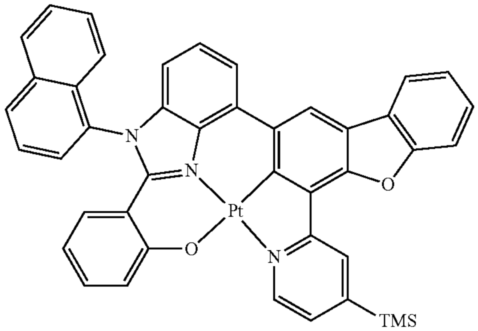
-continued
3-22
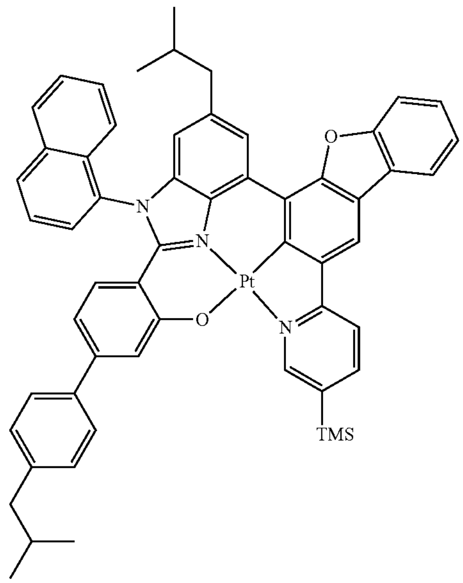
3-23
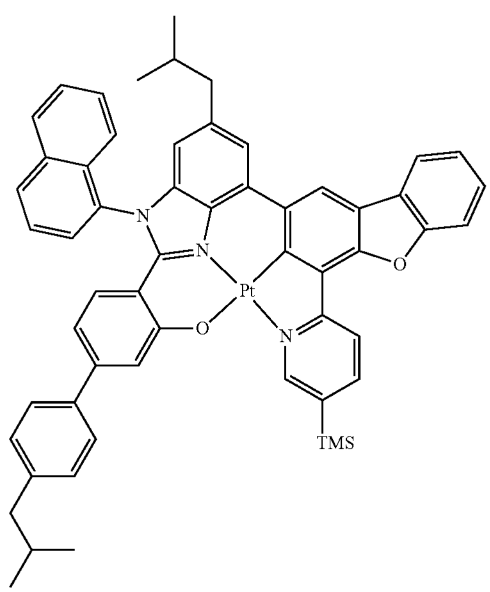

-continued
3-24
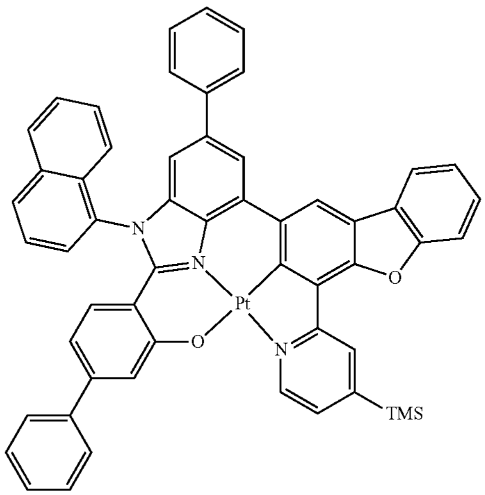
3-25
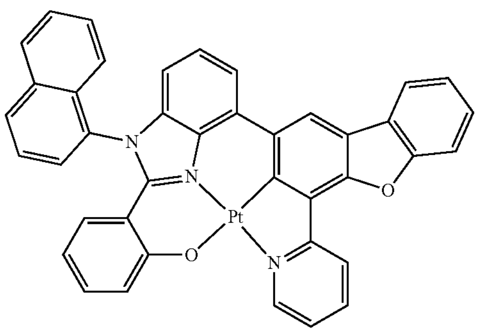
3-26
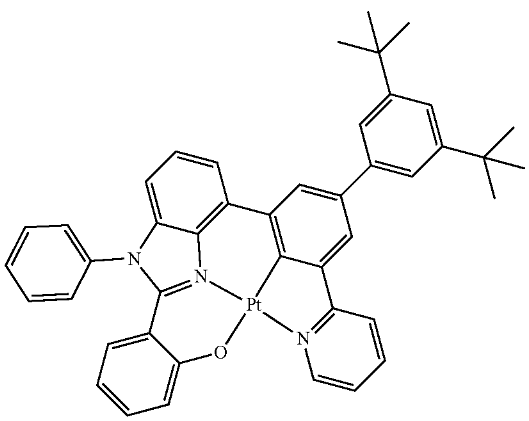
-continued
3-27
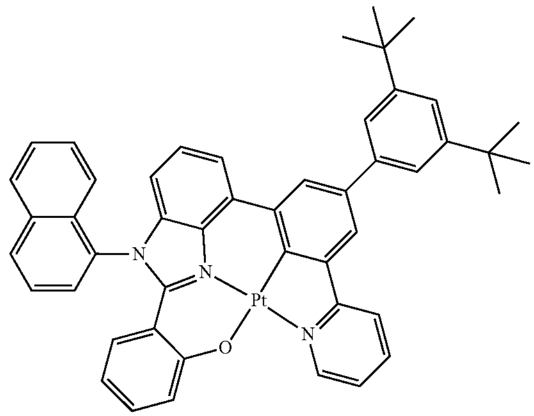
3-28
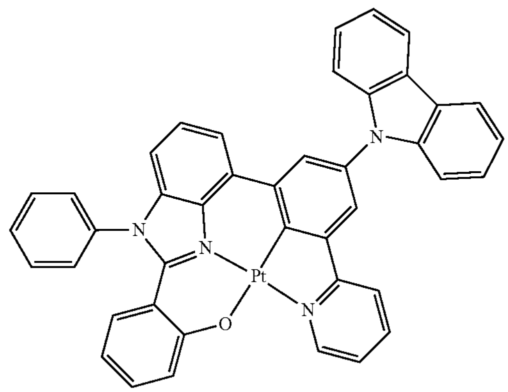
3-29
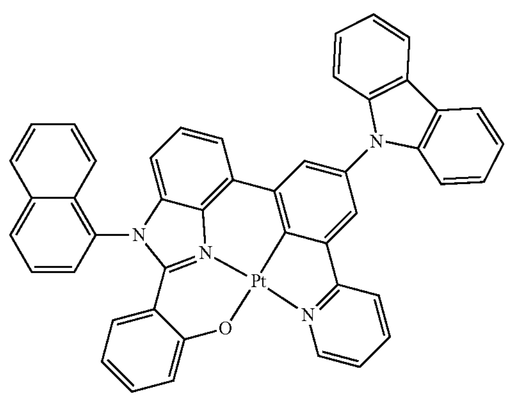

-continued
3-30
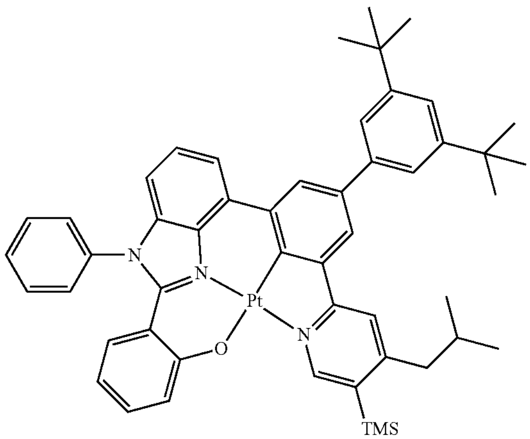
3-31
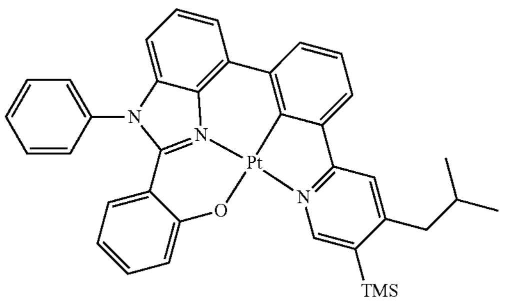
3-32
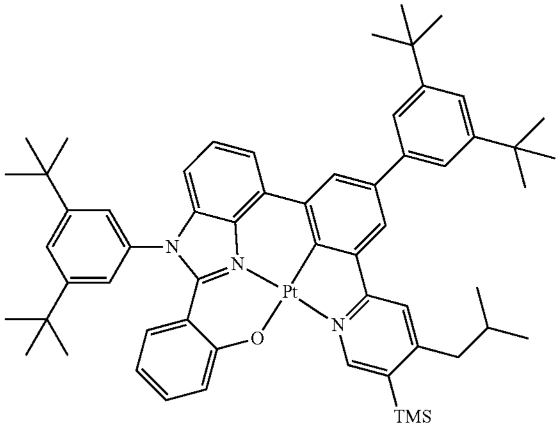
3-33
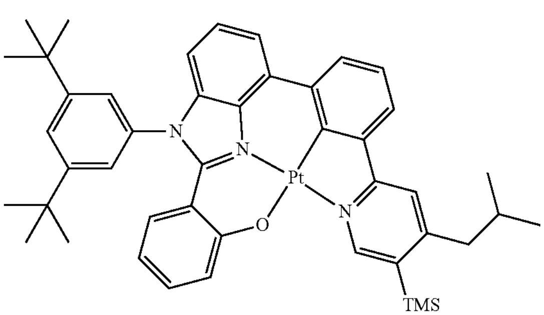
-continued
3-34
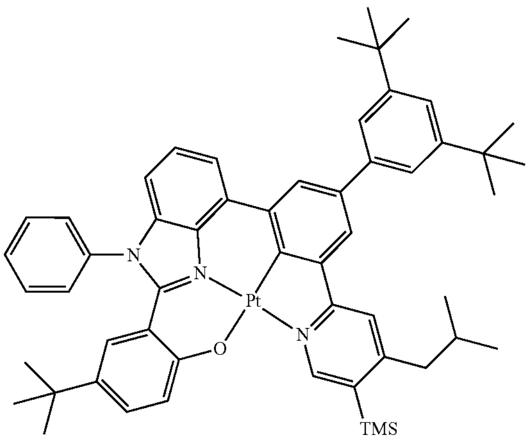
3-35
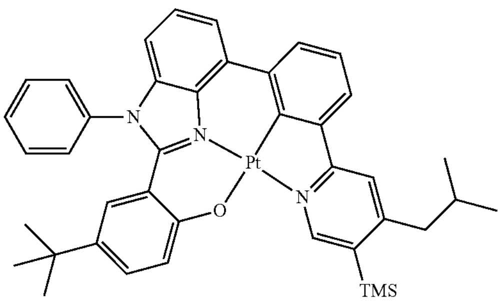
3-36
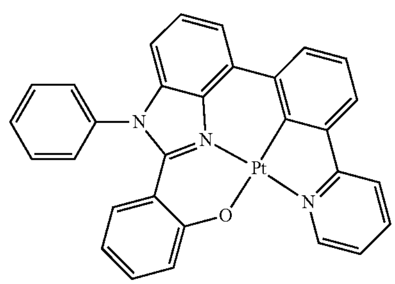
3-37
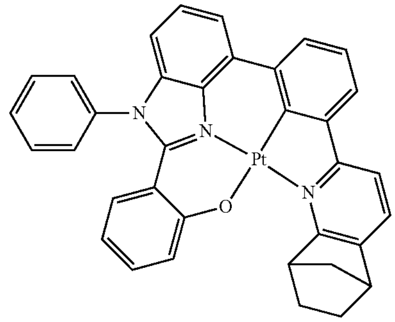

3-38
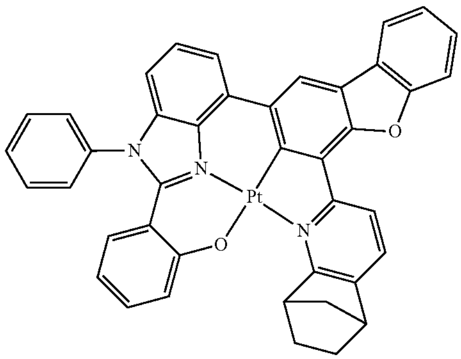
3-39
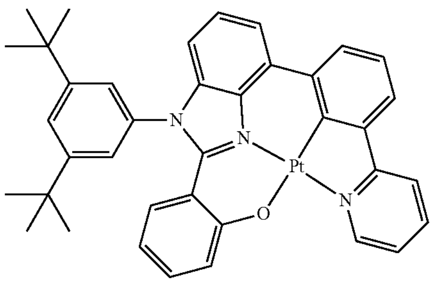
3-40
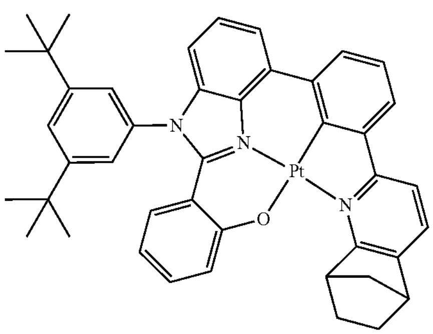
3-41
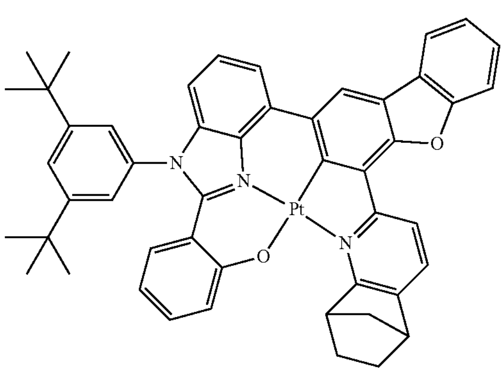
3-42
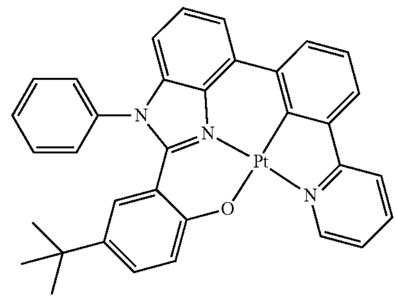
3-43
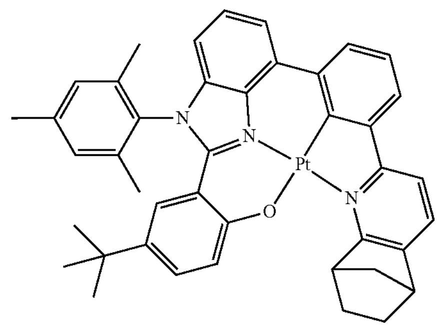
3-44
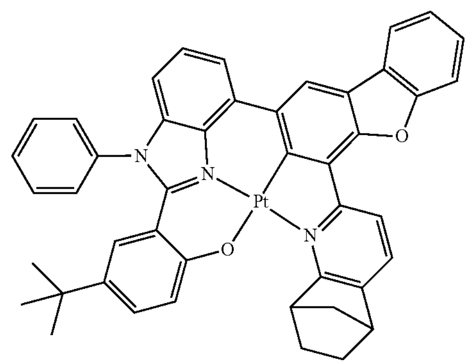
3-45
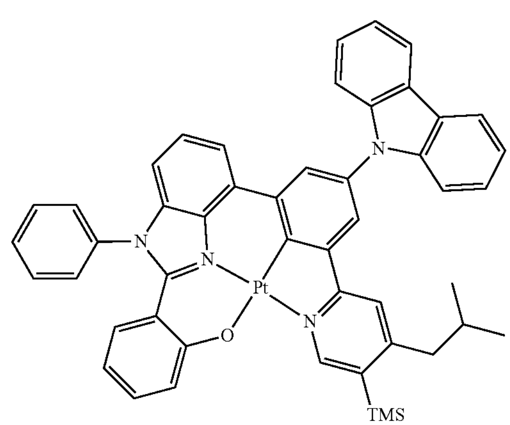

3-46
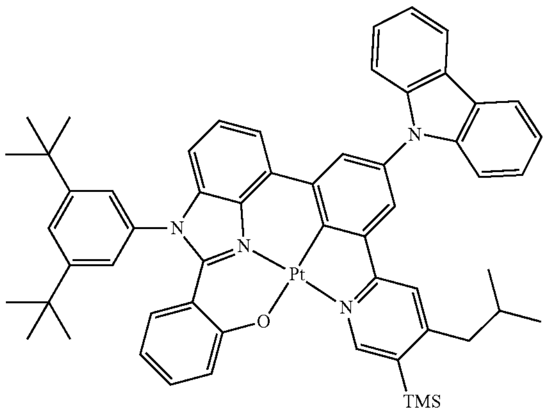
3-47
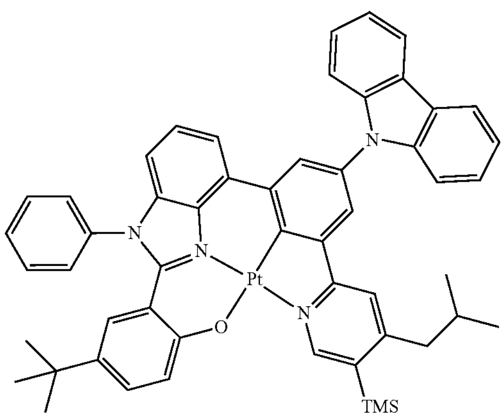
3-48
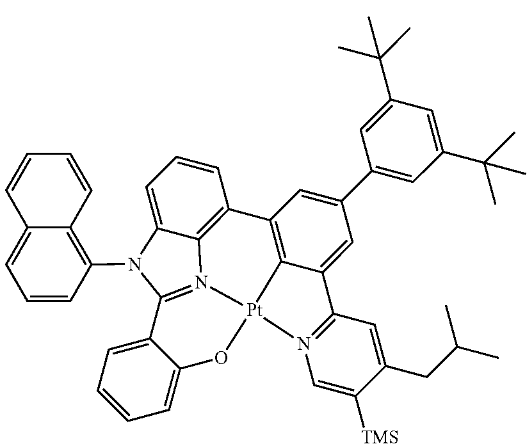
3-49
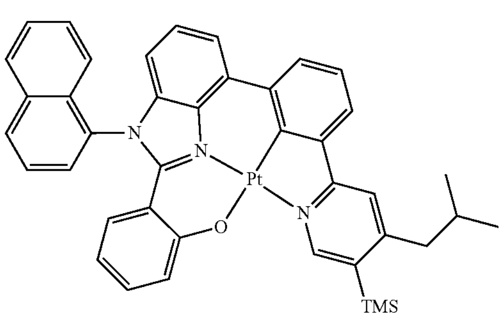
3-50
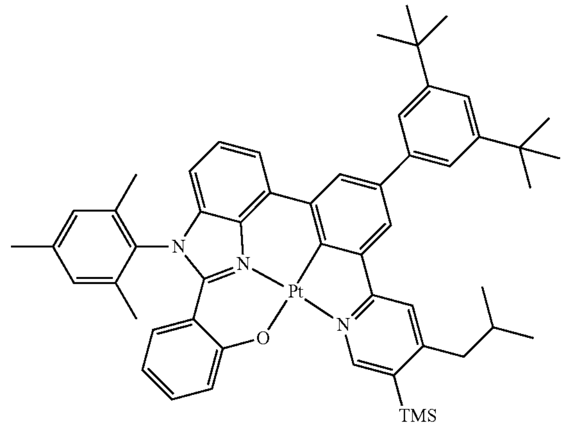
3-51
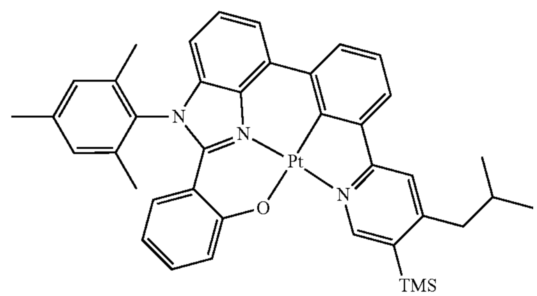
3-52
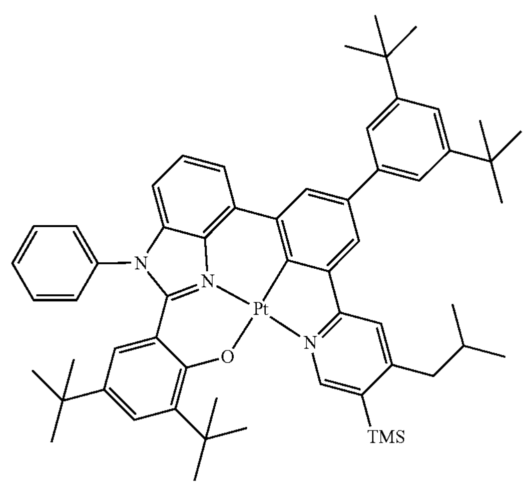
3-53
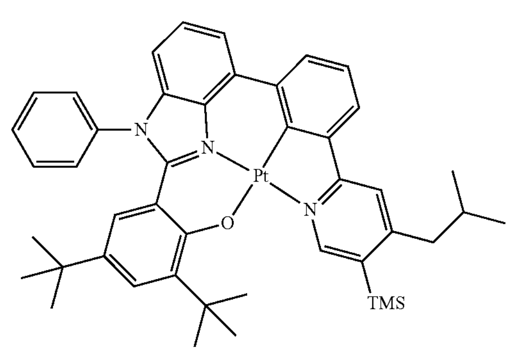

-continued
3-54
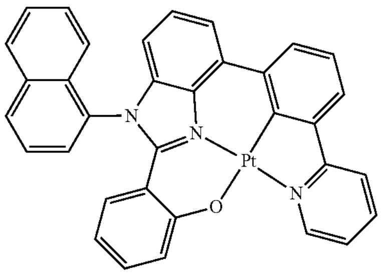
3-55
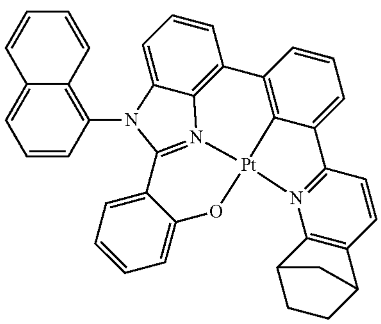
3-56
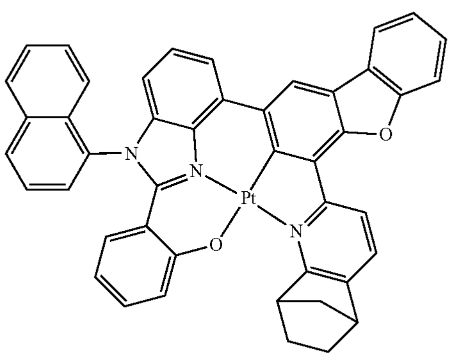
3-57
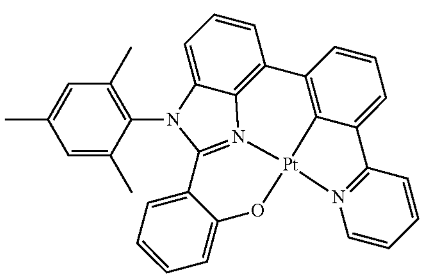
3-58
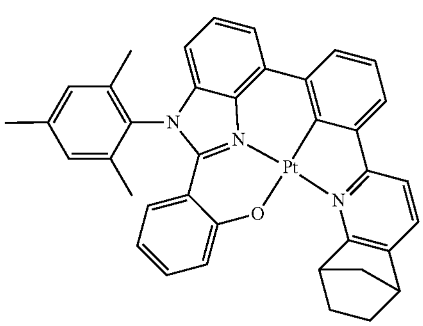
-continued
3-59
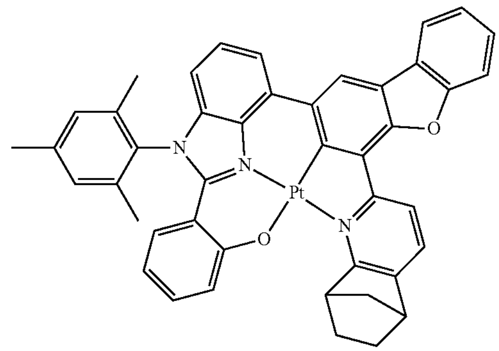
3-60
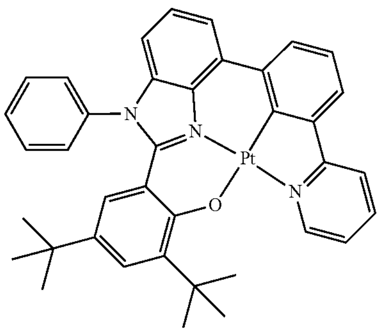
3-61
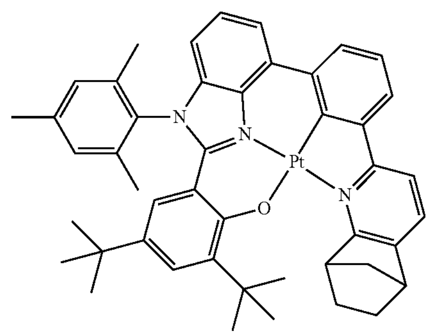
3-62
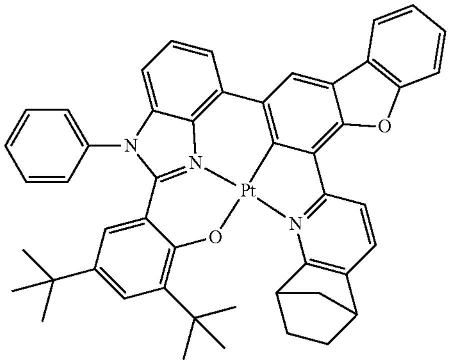

-continued
3-63
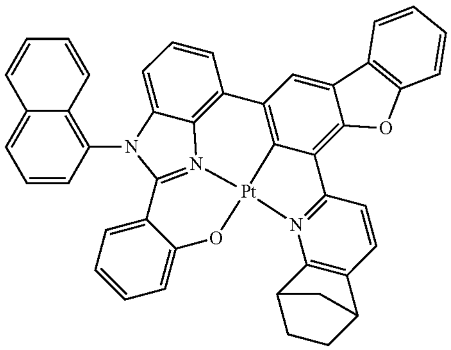
3-64
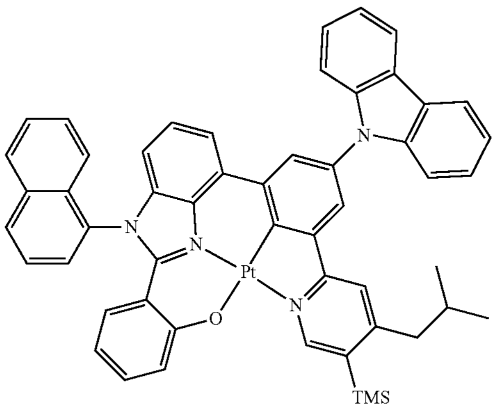
3-65
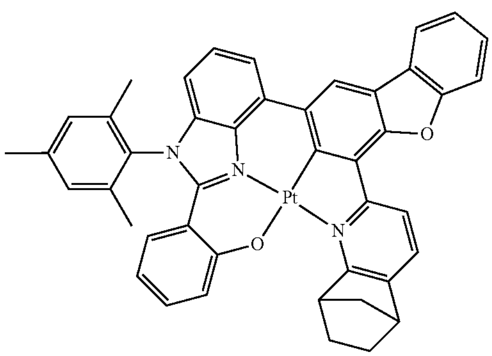
3-66
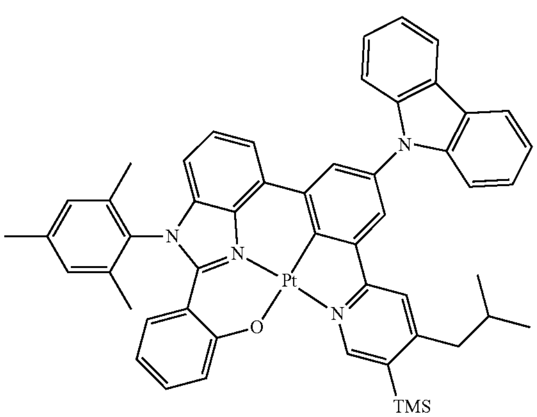
-continued
3-67
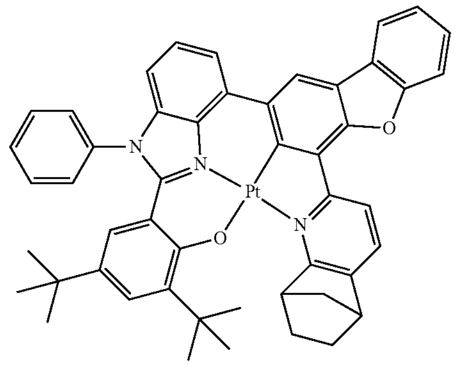
3-68
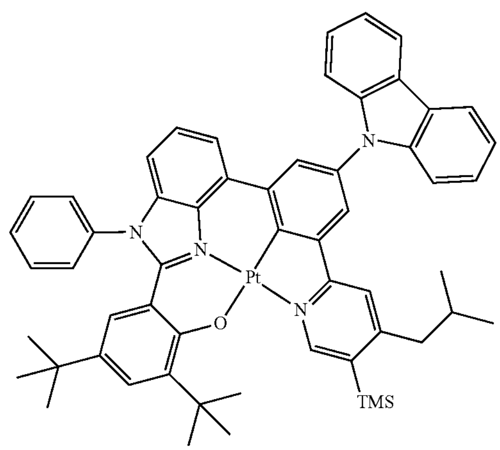
3-69
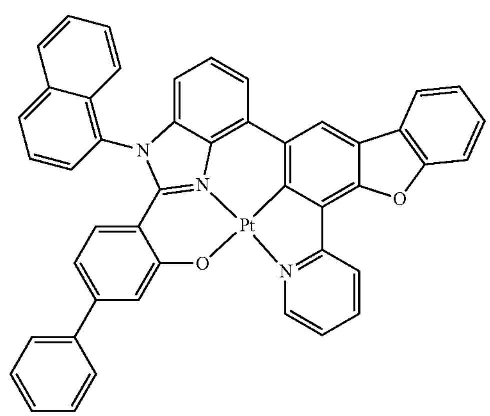

3-70
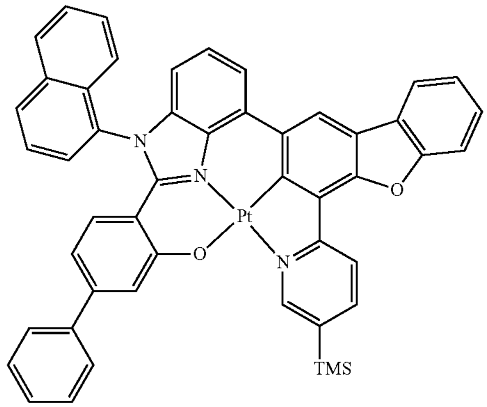
3-71
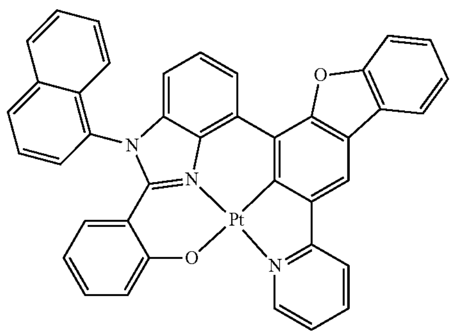
3-72
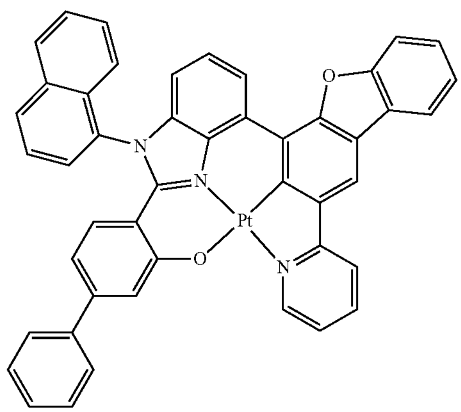
3-73
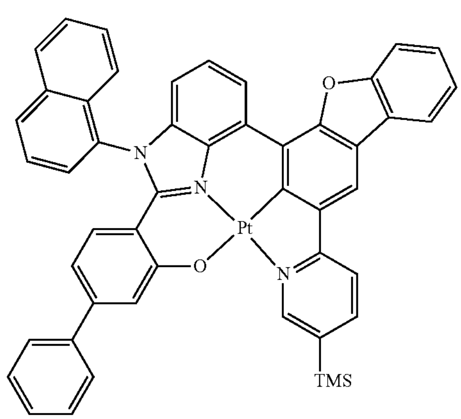
3-74
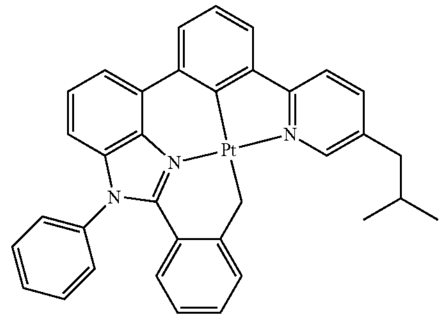
3-75
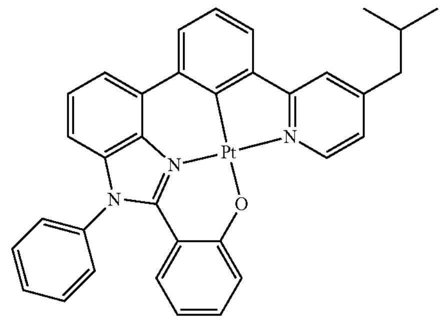
3-76
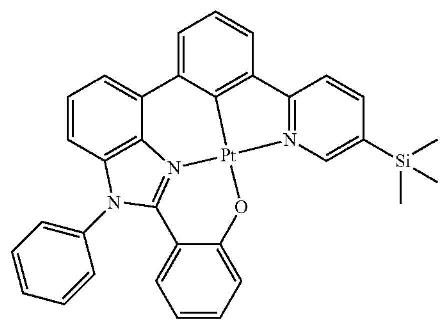
3-77
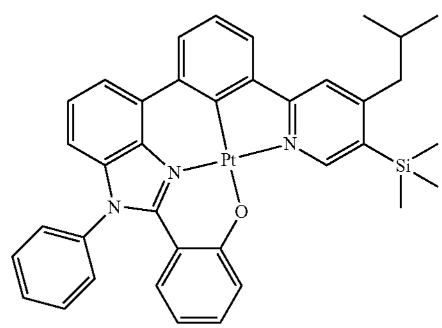
3-78
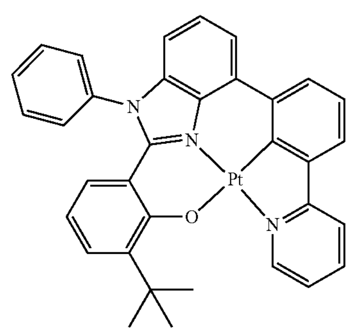

-continued
3-79
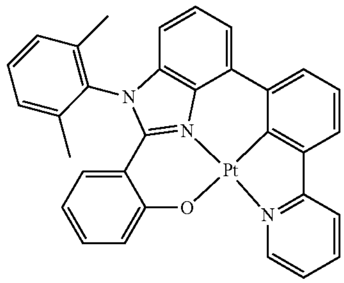
3-80
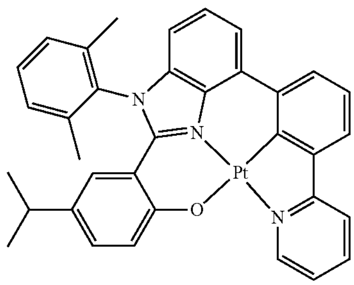
3-81
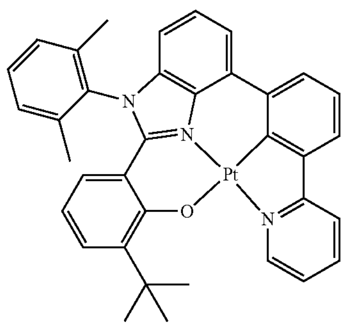
3-82
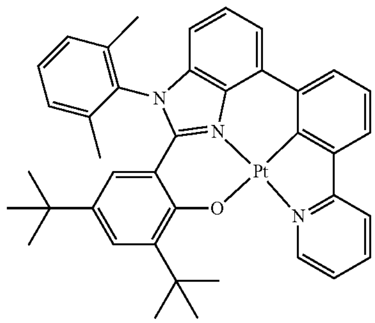
3-83
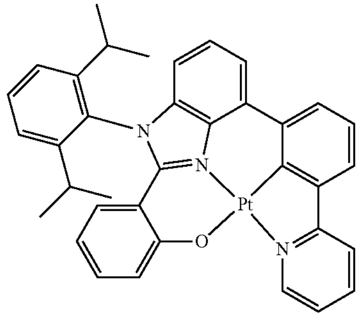
-continued
3-84
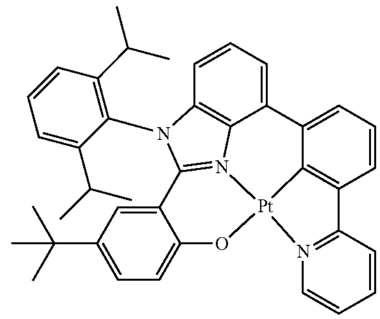
3-85
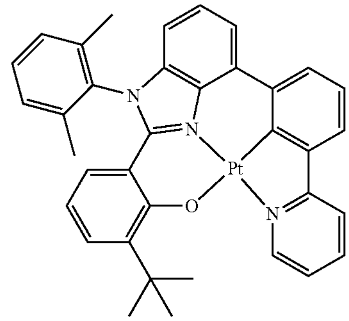
3-86
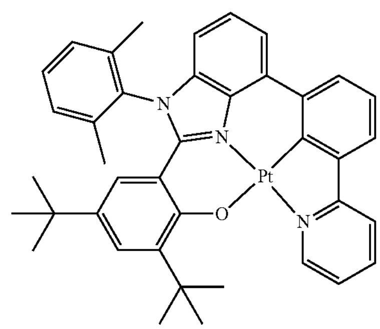
3-87
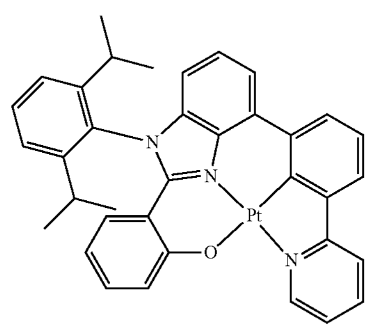
3-88
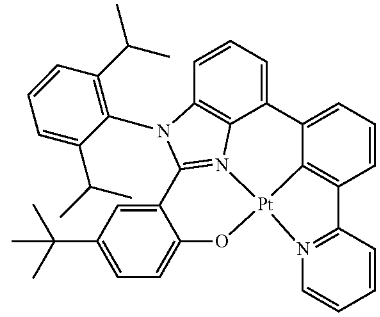

-continued
3-89
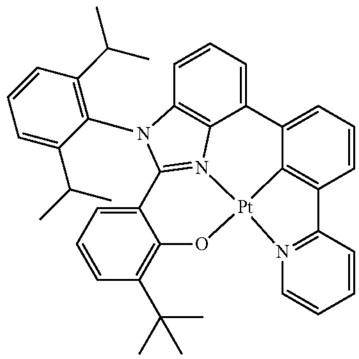
3-90
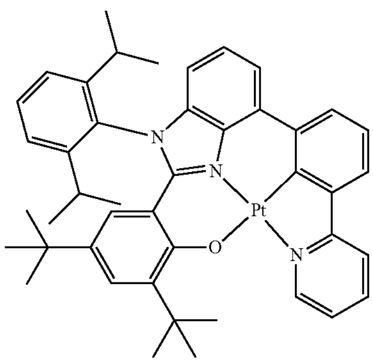
3-91
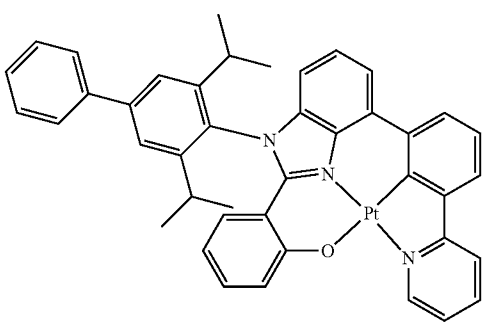
3-92
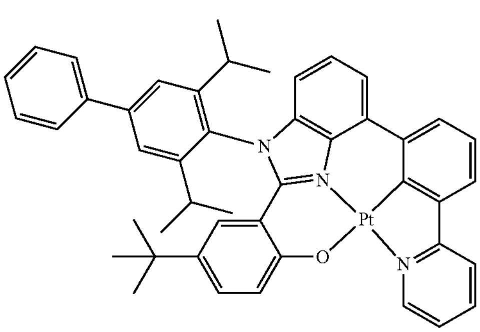
-continued
3-93
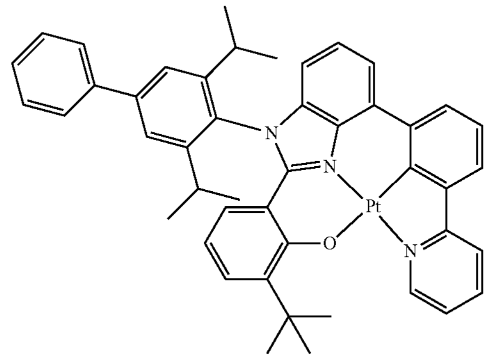
3-94
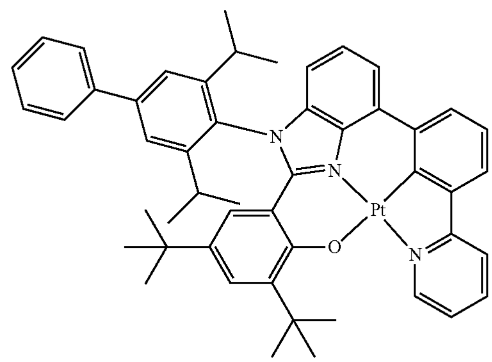
3-95
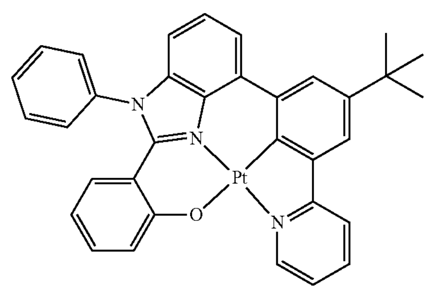
3-96
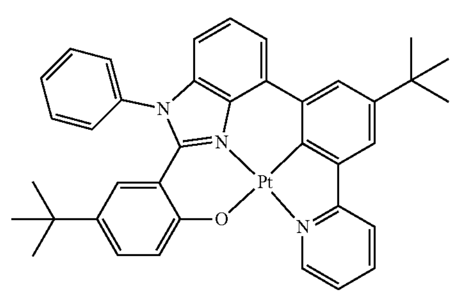
3-97
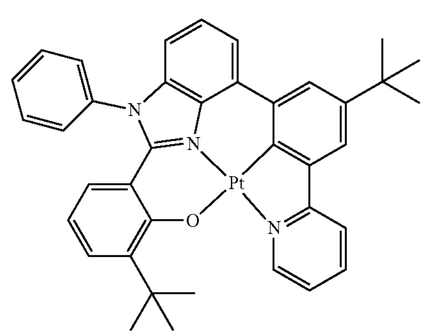

-continued
3-98
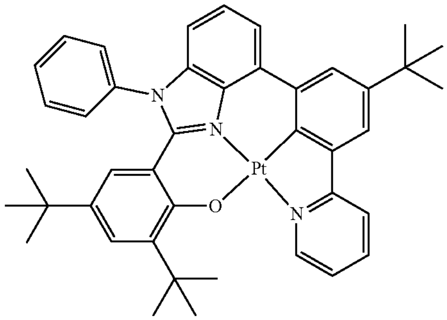
3-99
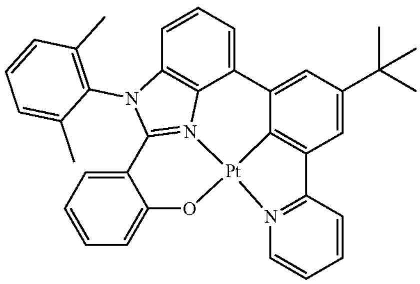
3-100
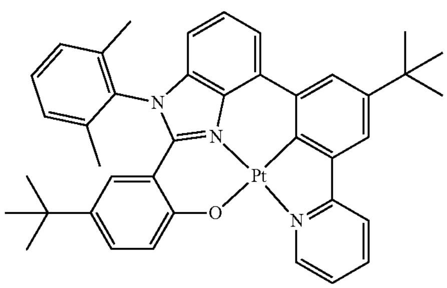
3-101
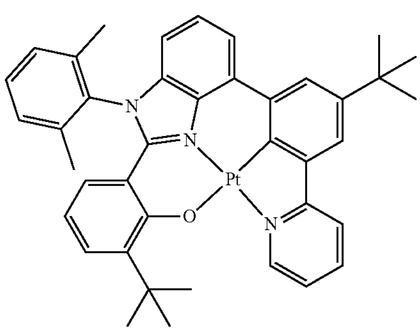
3-102
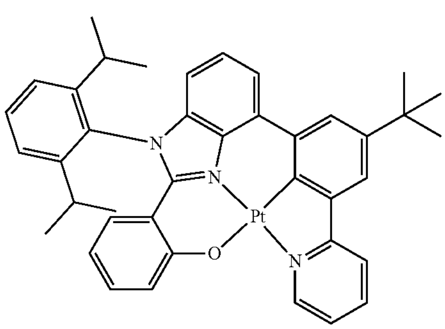
-continued
3-103
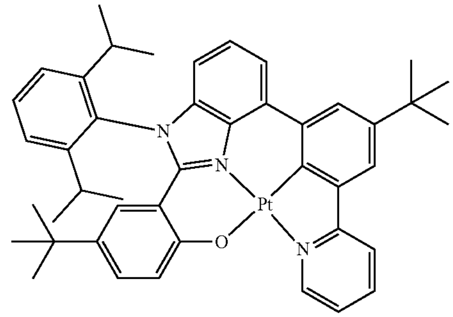
3-104
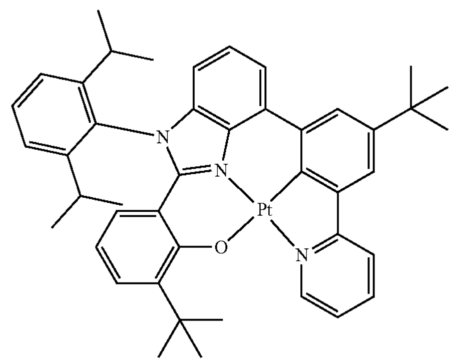
3-105
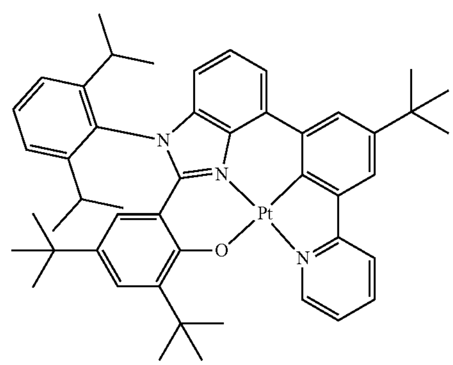
3-106
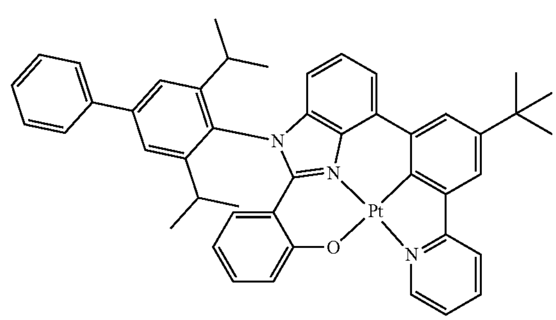

-continued
3-107
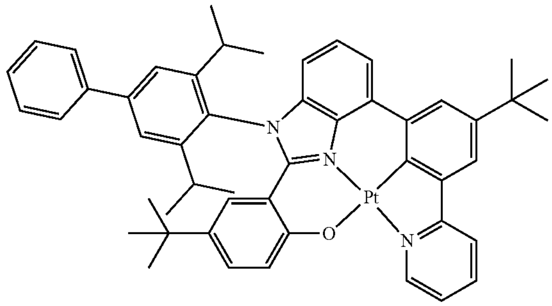
3-108
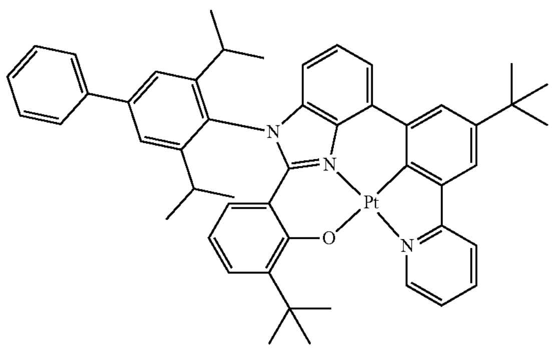
3-109
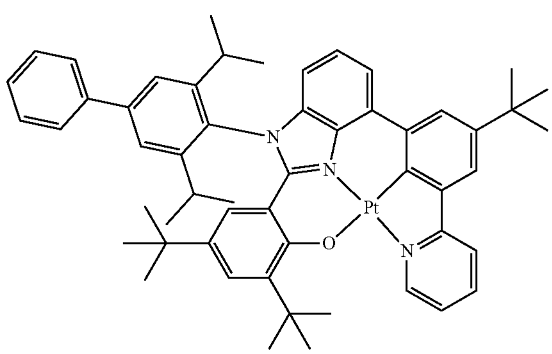
3-110
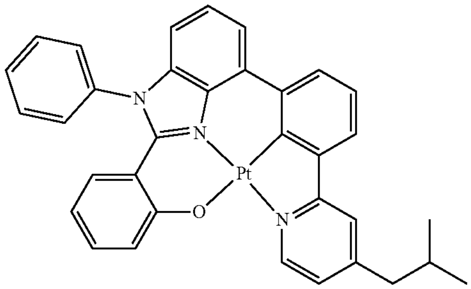
-continued
3-111
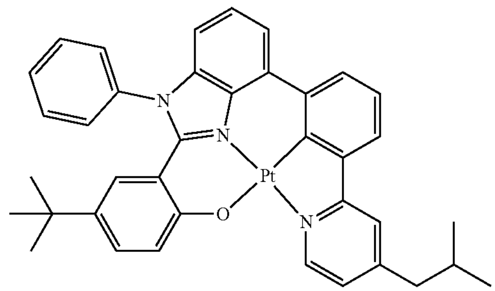
3-112
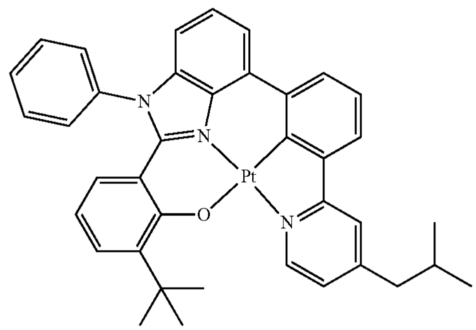
3-113
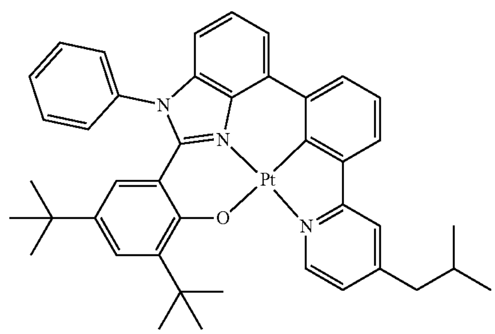
3-114
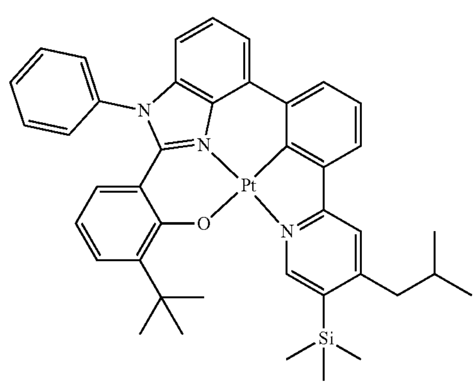

-continued
3-115
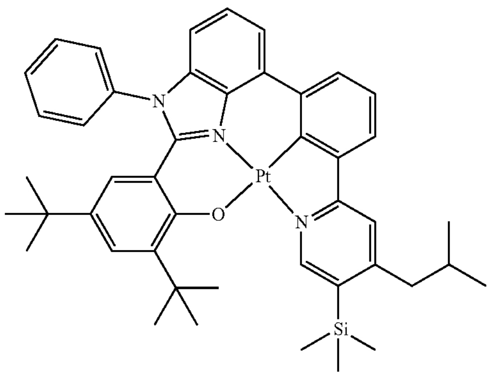
3-116
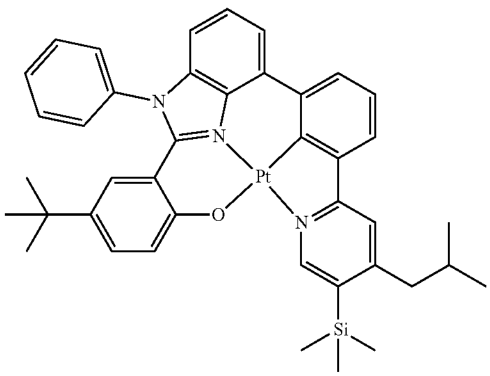
3-117
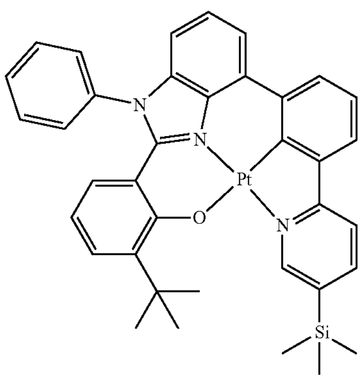
3-118
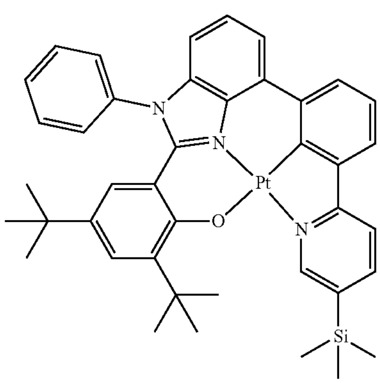
-continued
3-119
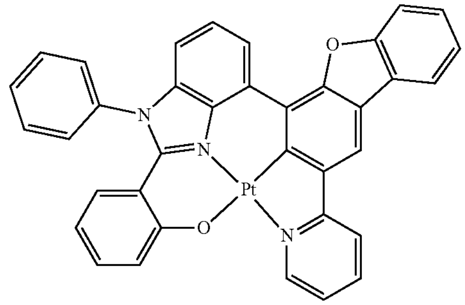
3-120
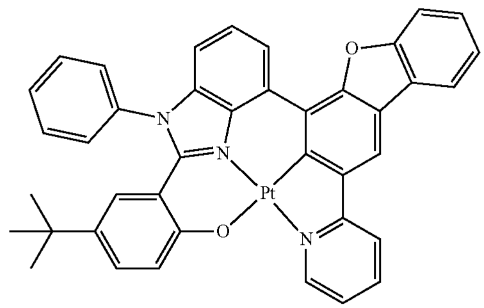
3-121
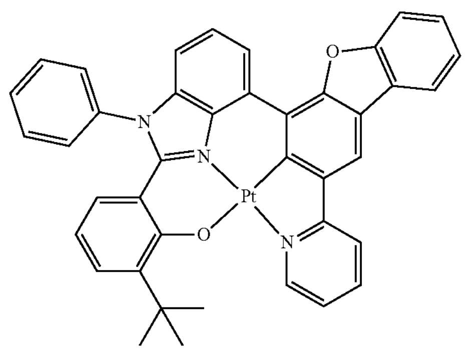
3-122
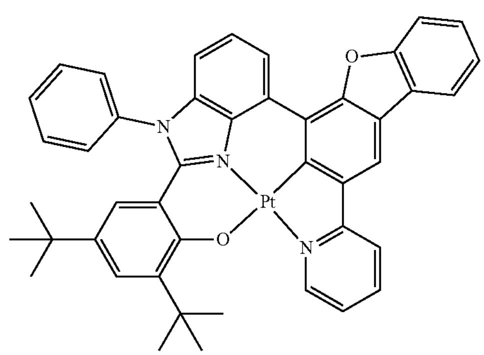

-continued
3-123
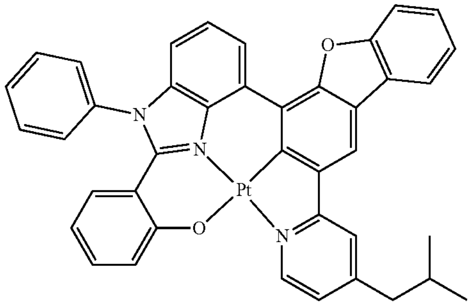
3-124
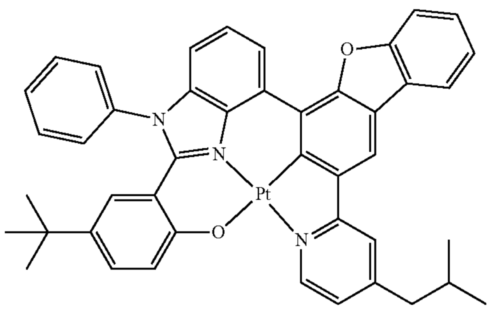
3-125
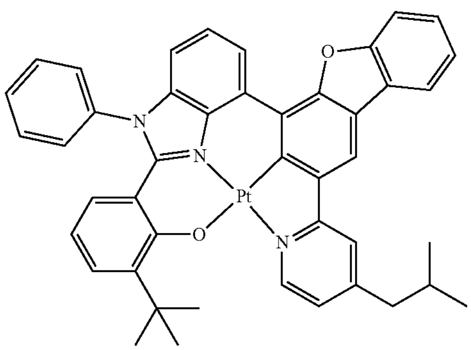
3-126
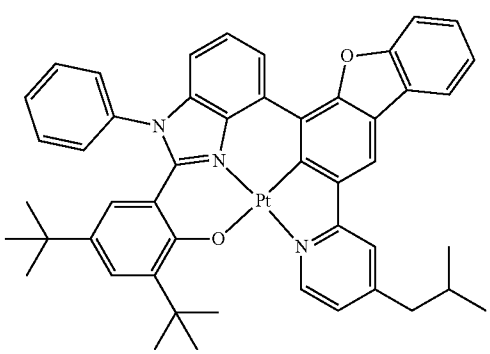
-continued
3-127
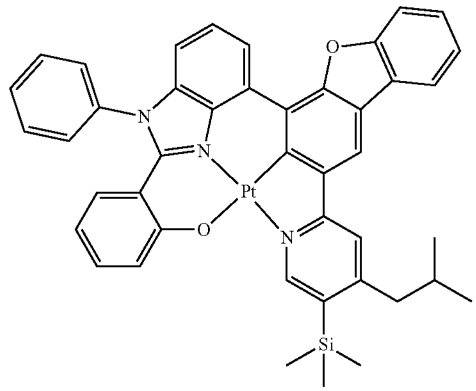
3-128
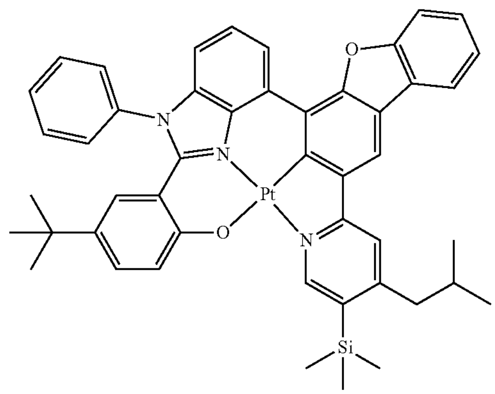
3-129
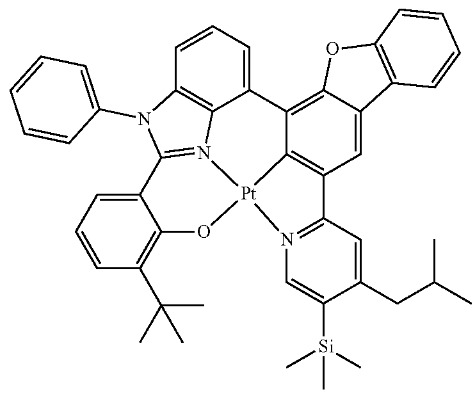
3-130
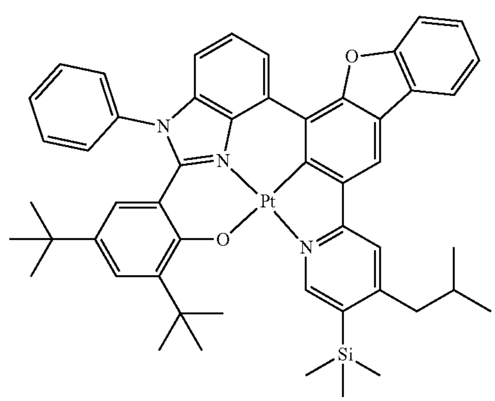

-continued
3-131
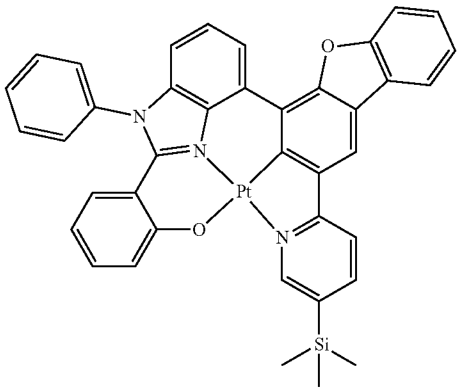
3-132
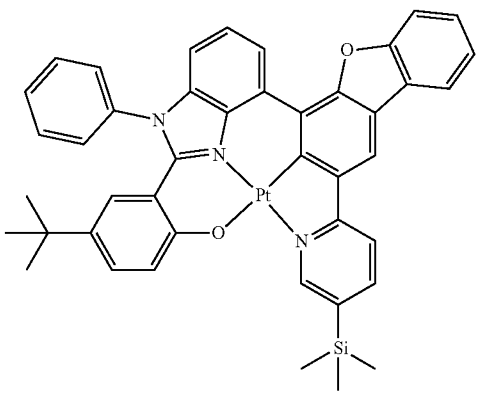
3-133
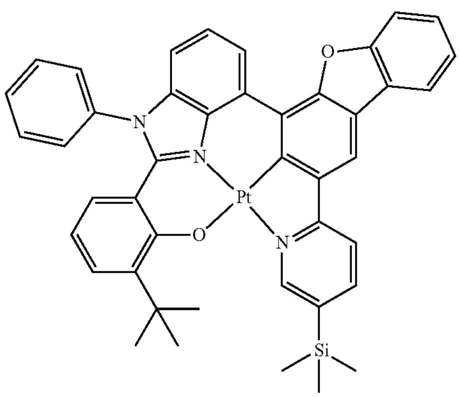
3-134
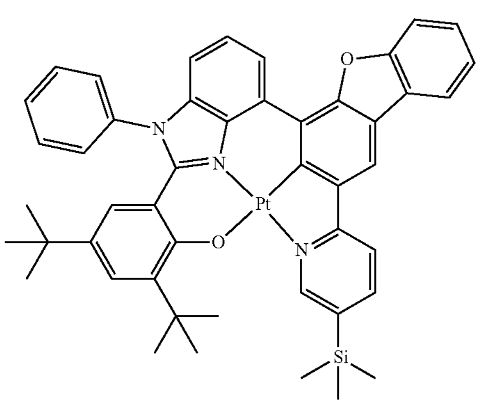
-continued
3-135
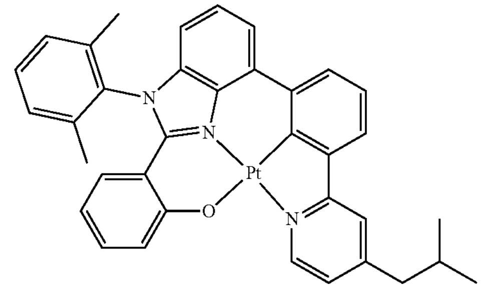
3-136
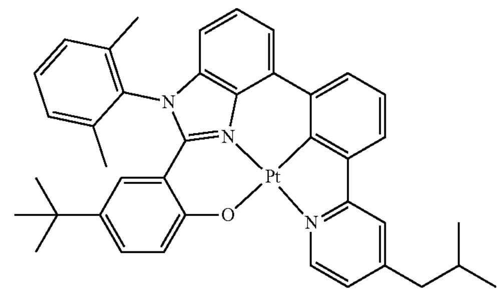
3-137
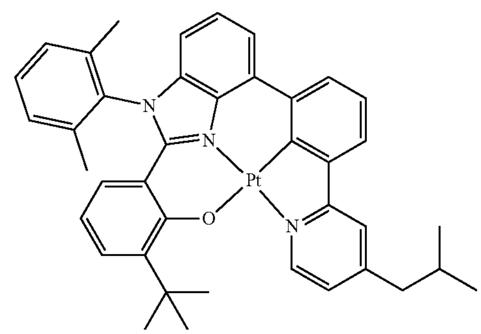
3-138
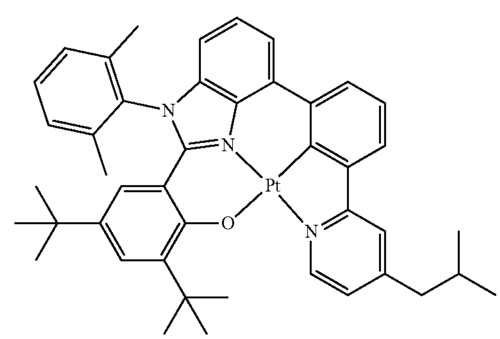

-continued
3-139
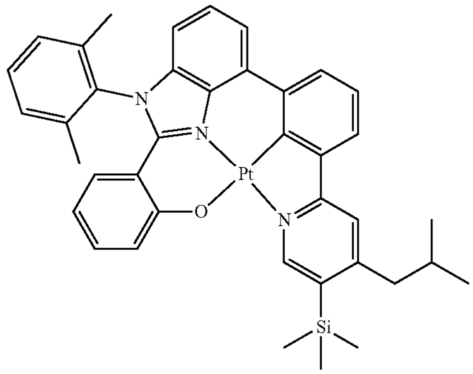
3-140
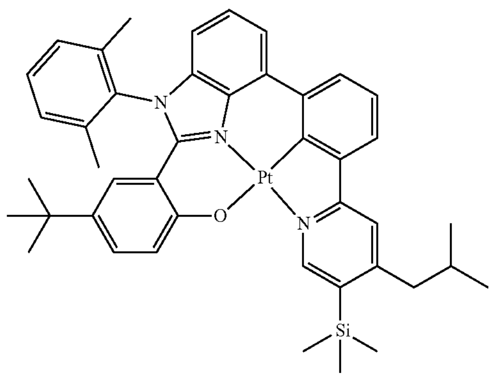
3-141
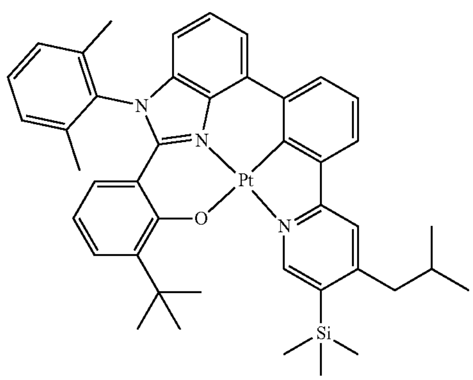
3-142
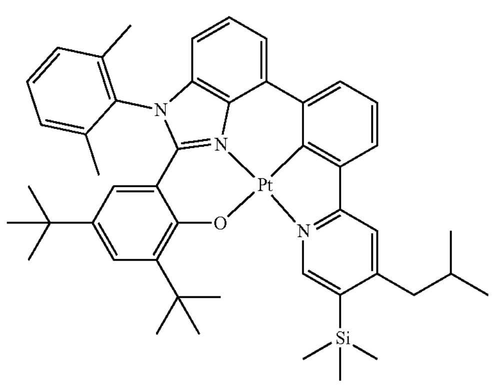
-continued
3-143
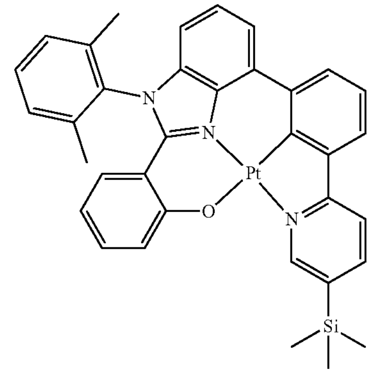
3-144
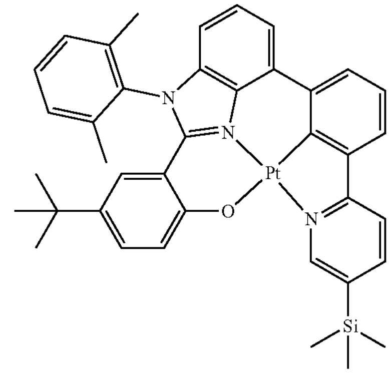
3-145
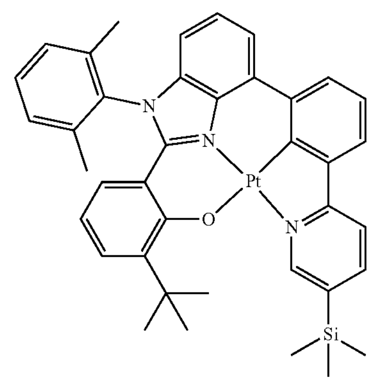
3-146
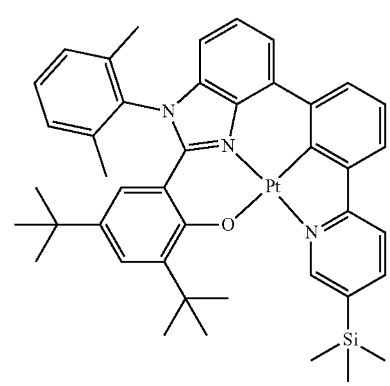

3-147
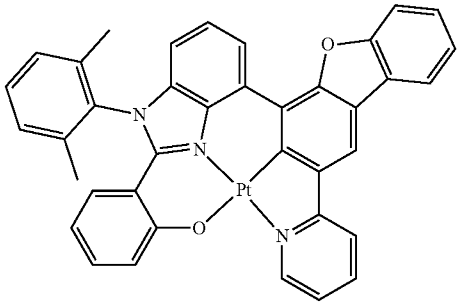
3-148
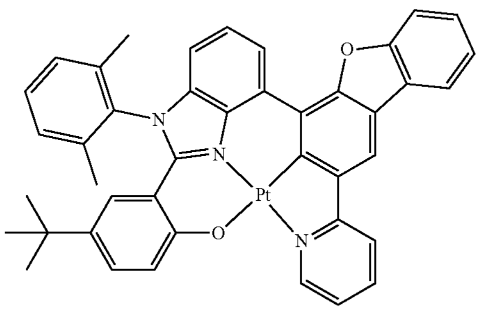
3-149
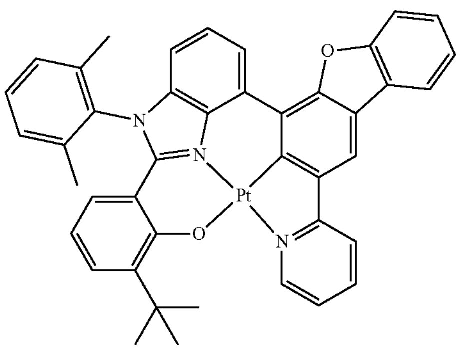
3-150
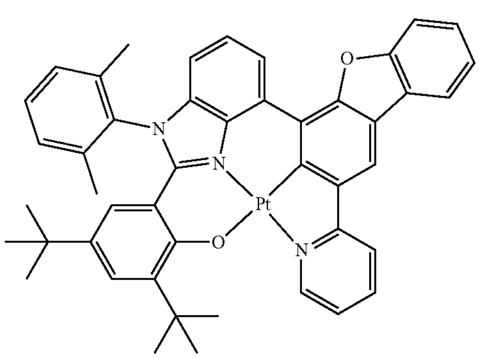
3-151
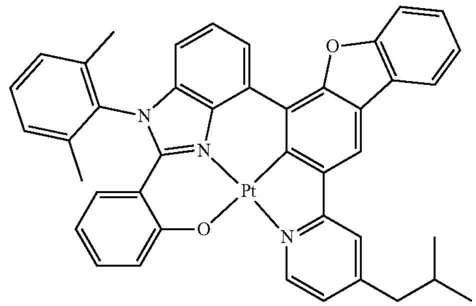
3-152
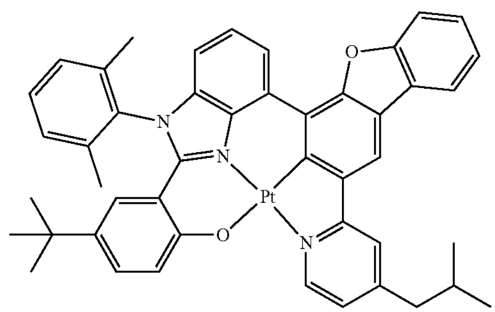
3-153
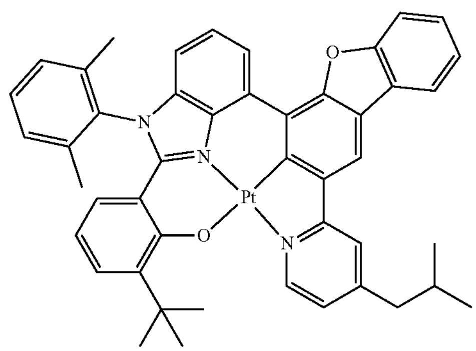
3-154
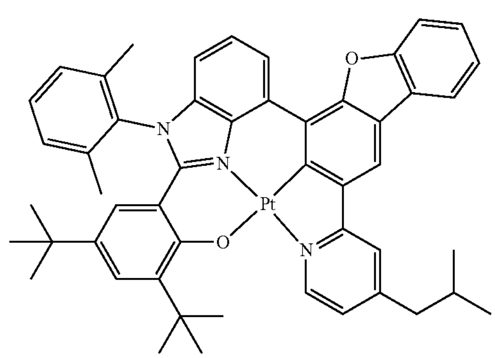

-continued
3-155
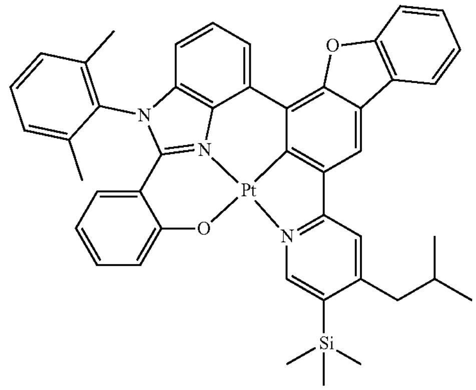
3-156
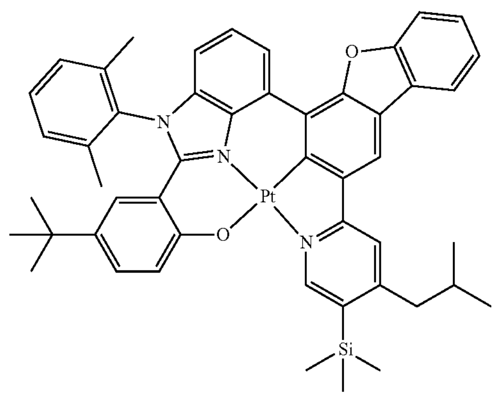
3-157
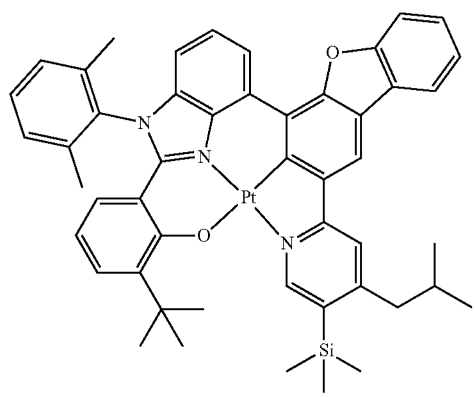
3-158
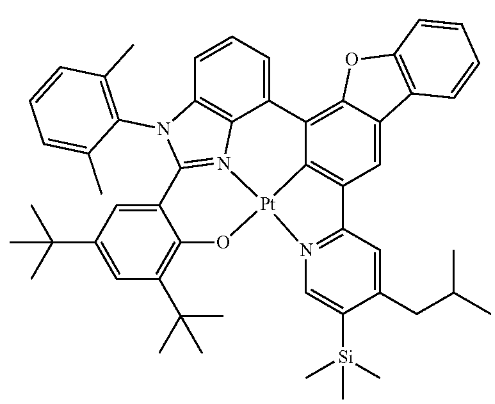
-continued
3-159
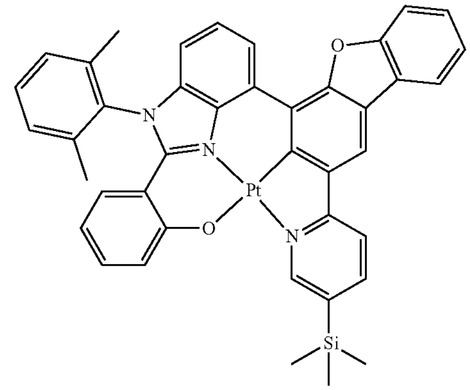
3-160
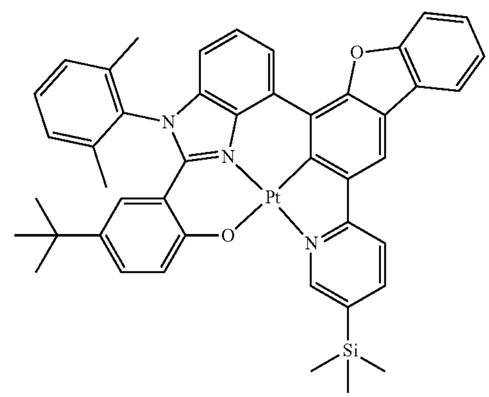
3-161
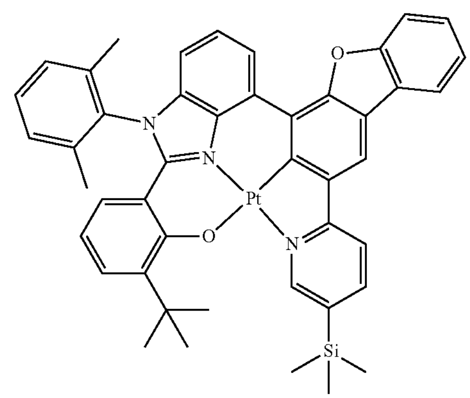
3-162
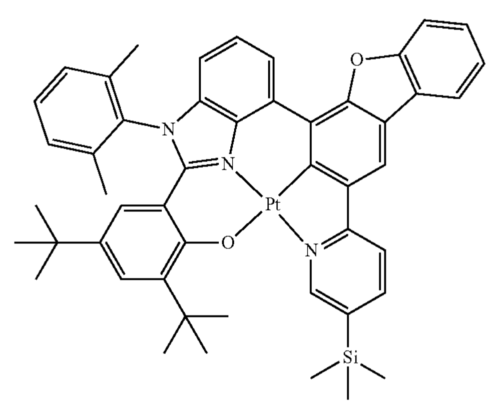

-continued
3-163
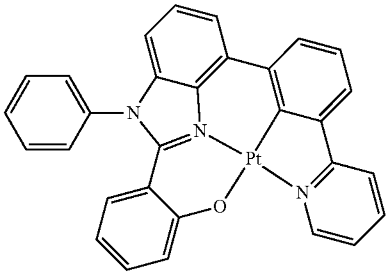
3-164
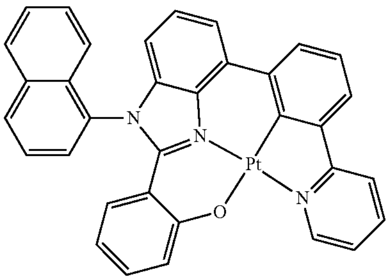
3-165
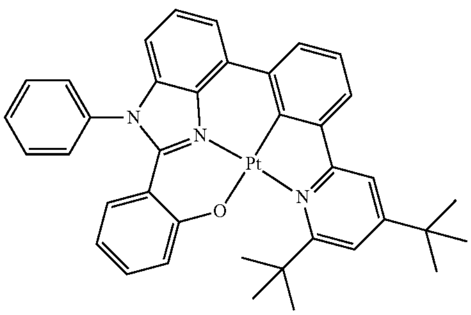
3-166
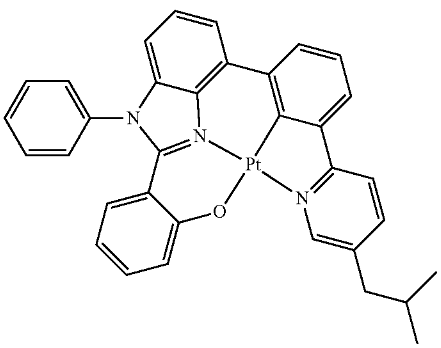
3-167
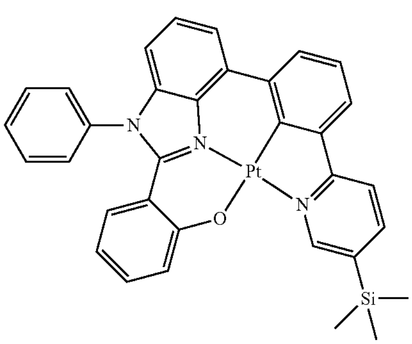
-continued
3-168
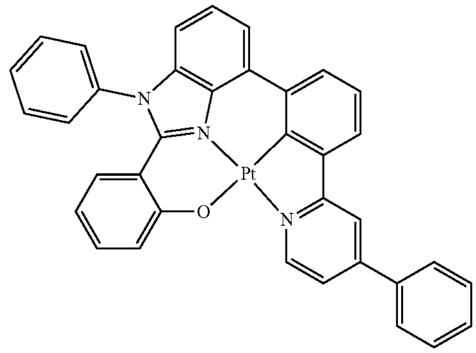
3-169
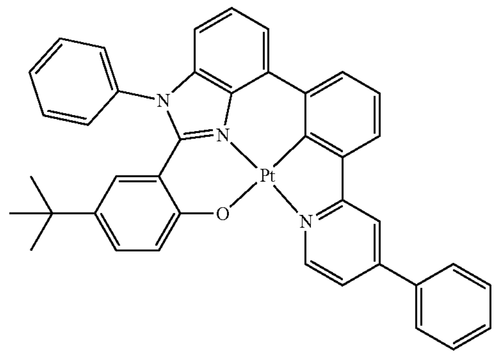
3-170
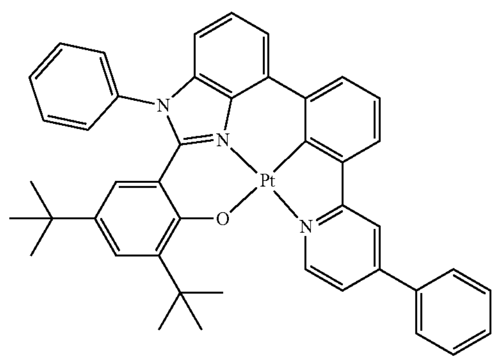
3-171
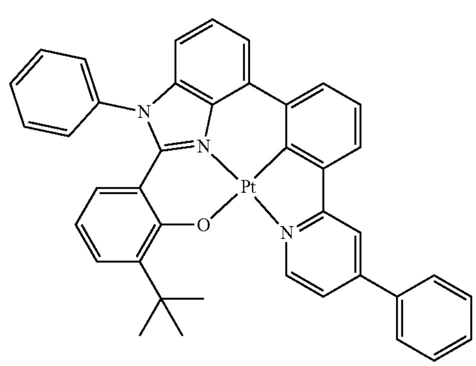

-continued
3-172
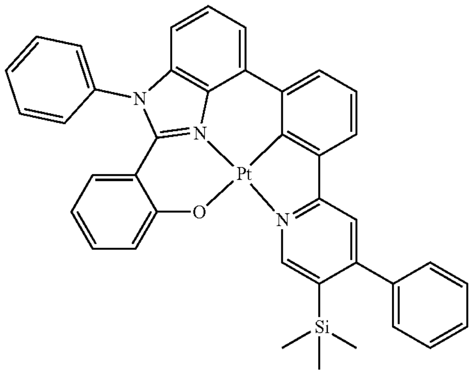
3-173
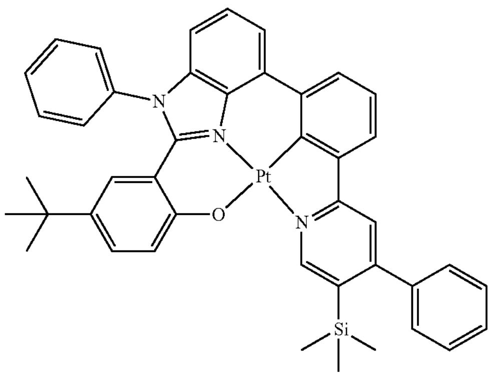
3-174
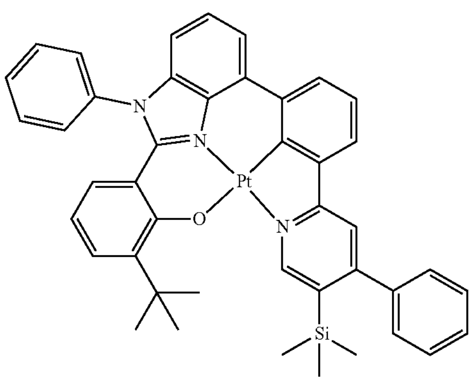
3-175
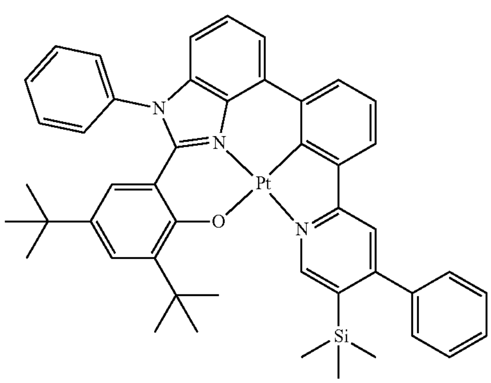
-continued
3-176
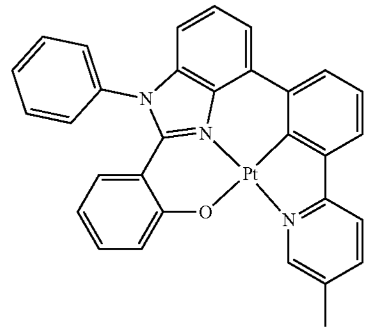
3-177
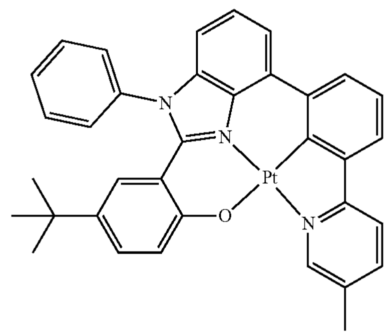
3-178
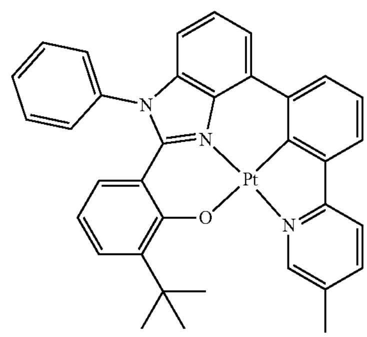
3-179
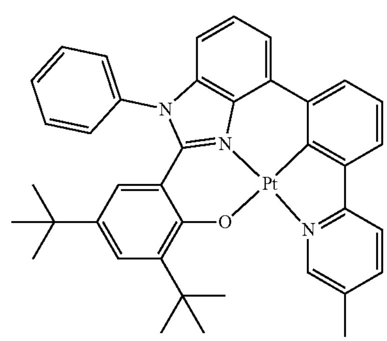

-continued
3-180
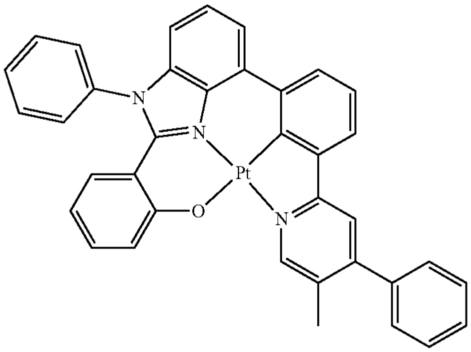
3-181
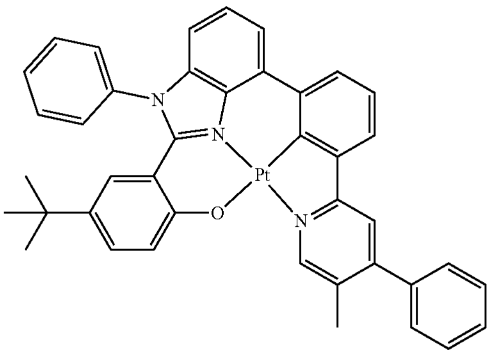
3-182
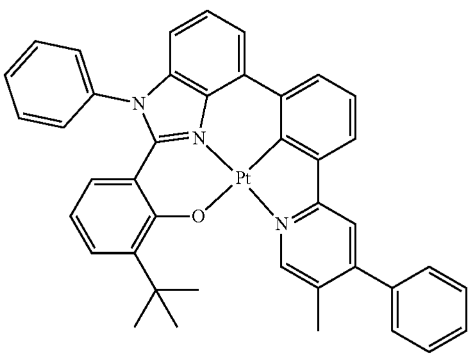
3-183
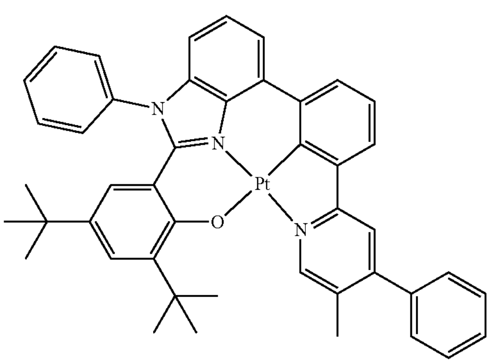
-continued
3-184
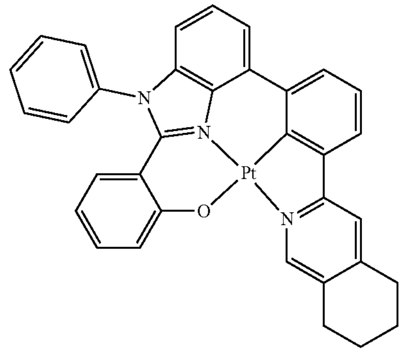
3-185
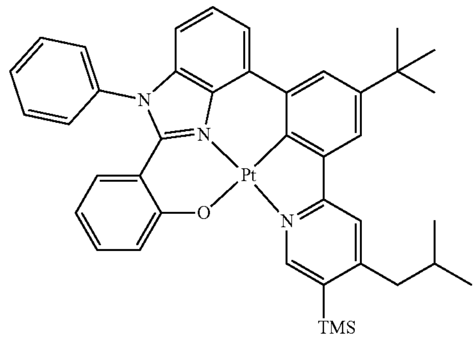
3-186
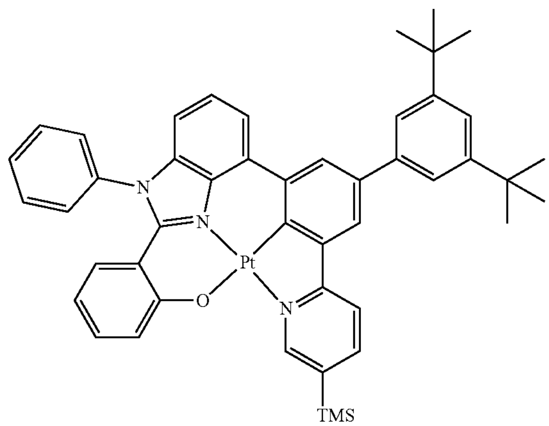
3-187
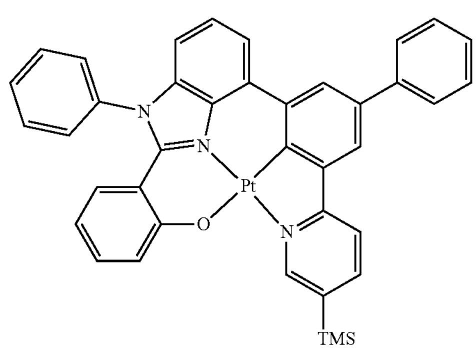

-continued
3-188
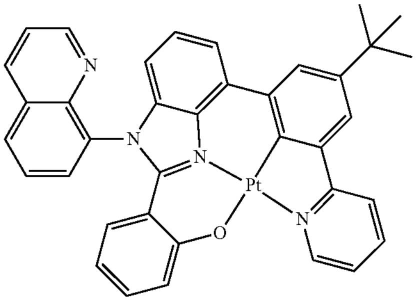
3-189
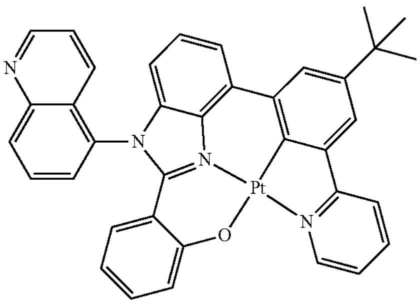
3-190
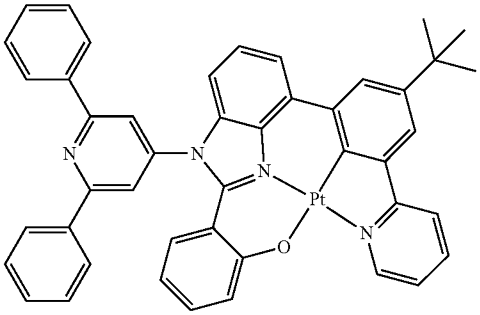
3-191
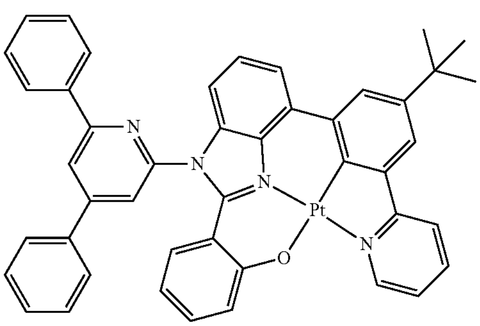
3-192
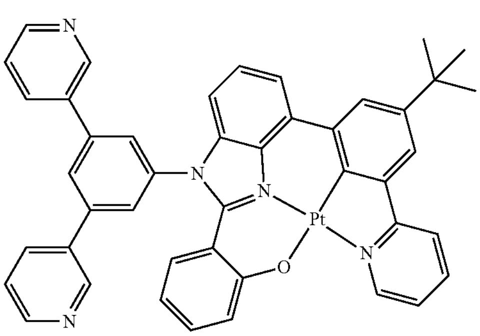
-continued
3-193
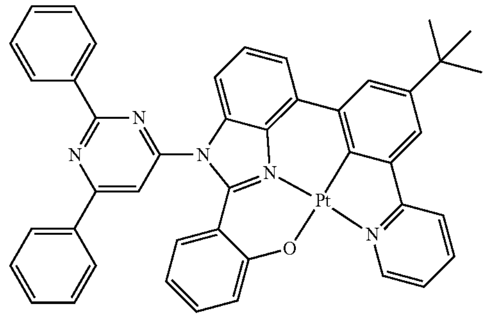
3-194
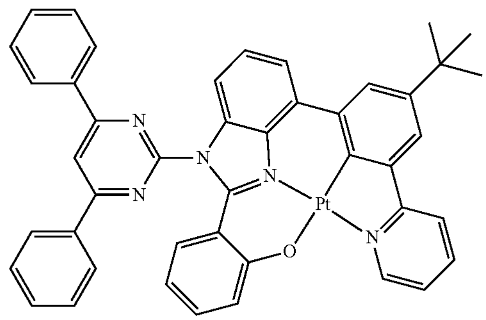
3-195
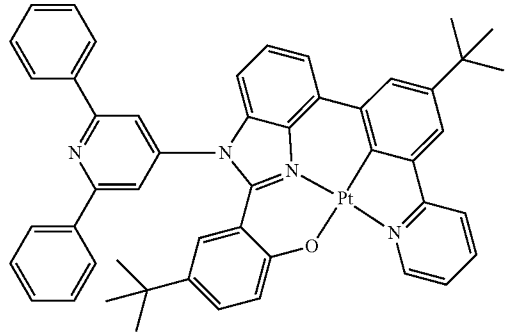
3-196
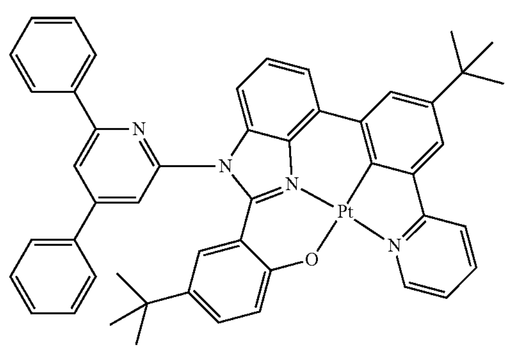

-continued
3-197
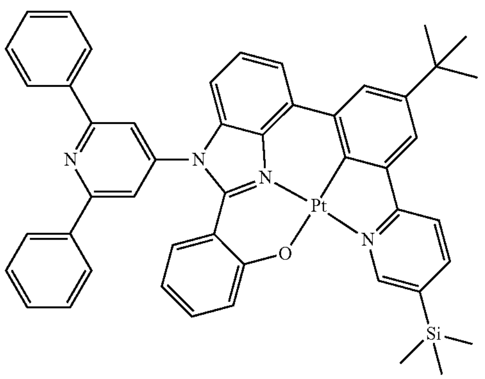
3-198
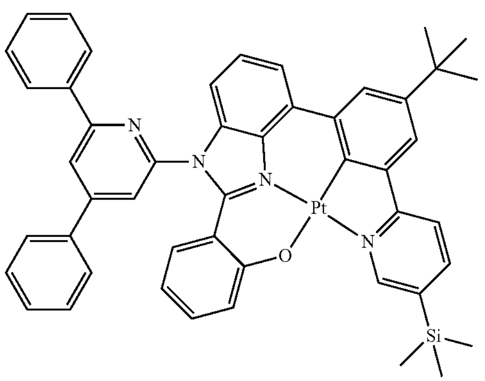
3-199
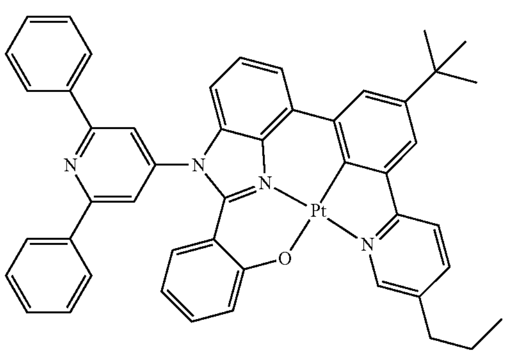
3-200
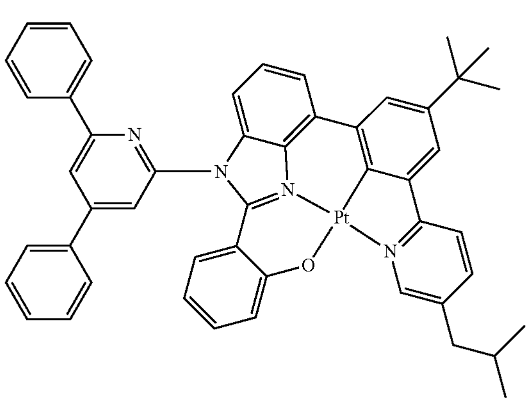
-continued
3-201
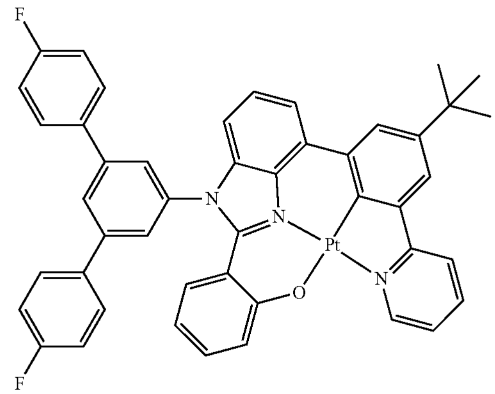
3-202
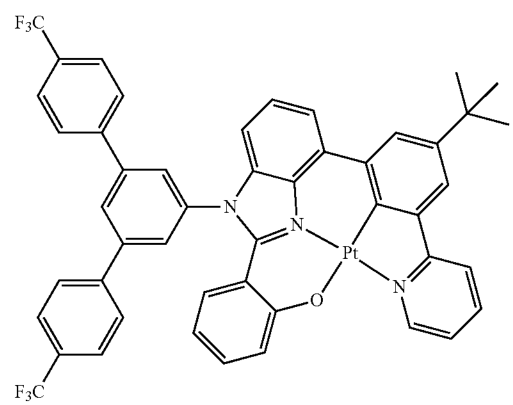
3-203
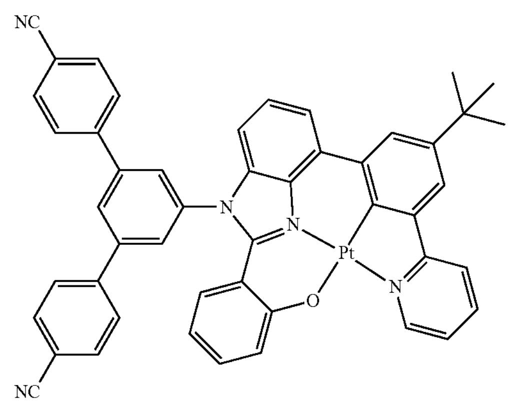
3-204
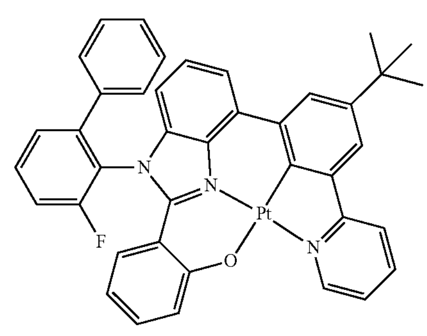

3-205
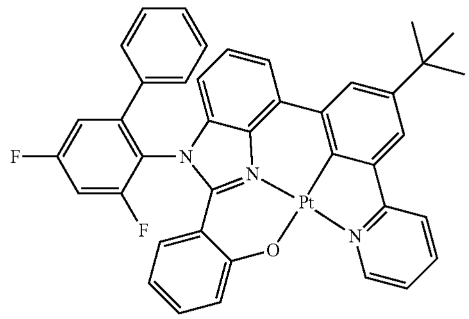
3-206
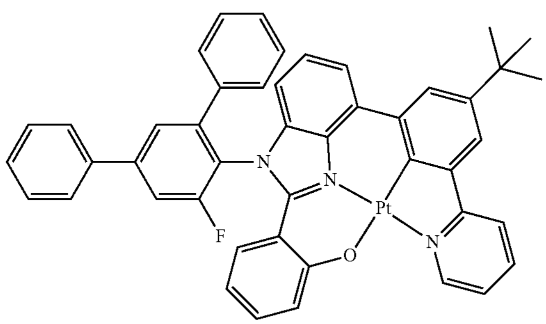
3-207
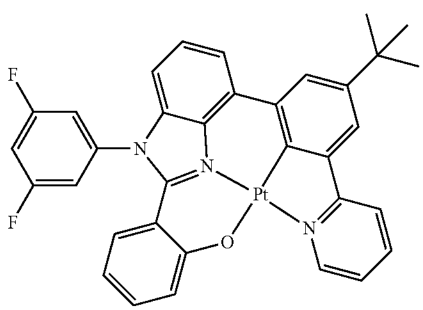
3-208
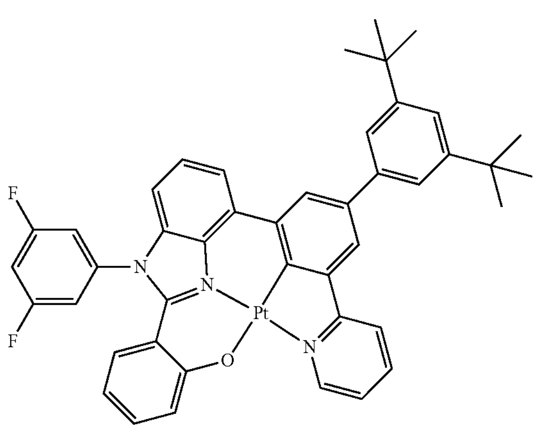
3-209
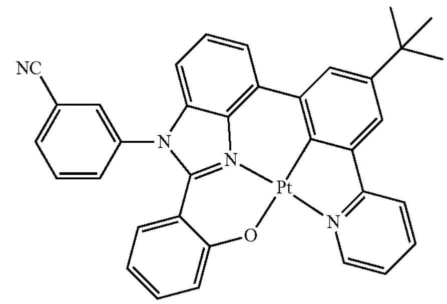
3-210
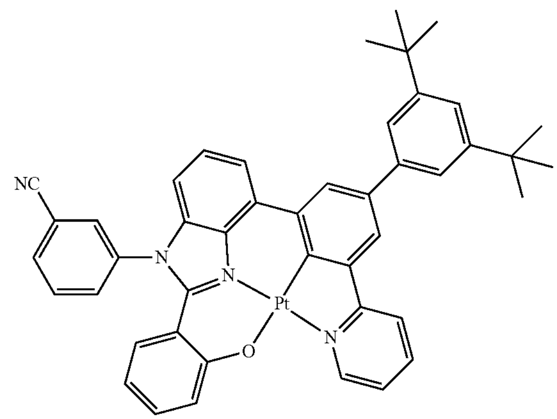
3-211
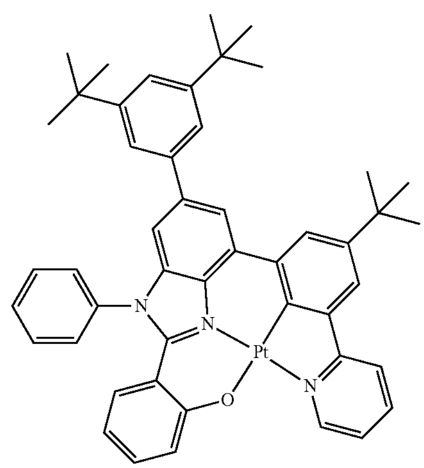
3-212
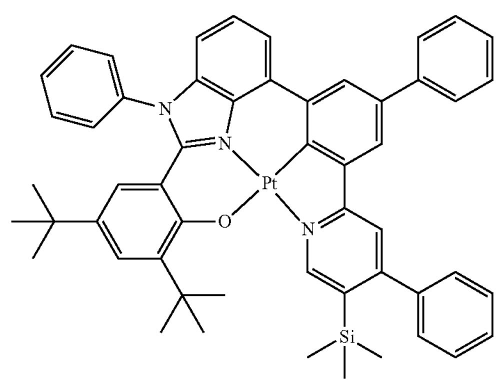

-continued
3-213
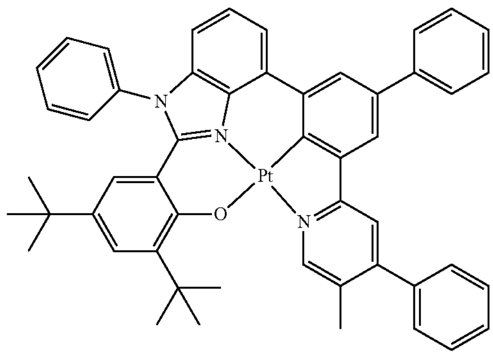
3-214
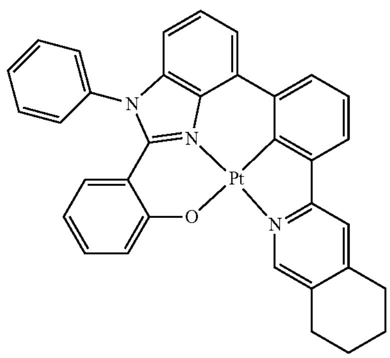
3-215
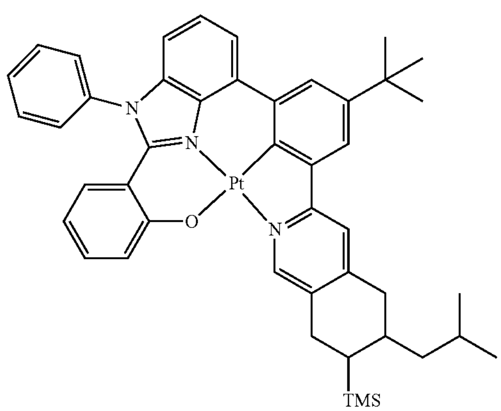
3-216
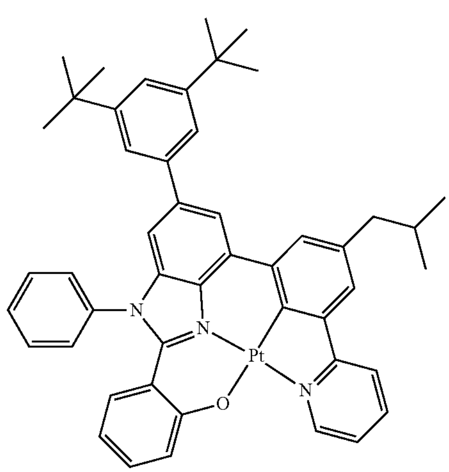
-continued
3-217
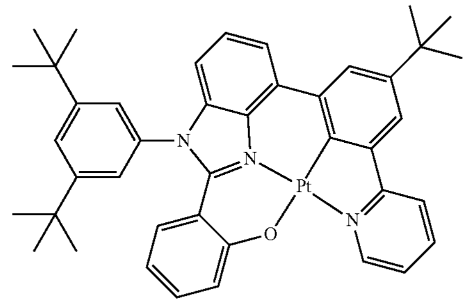
3-218
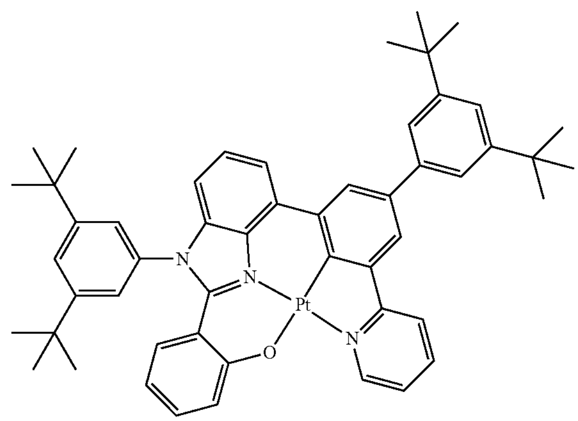
3-219
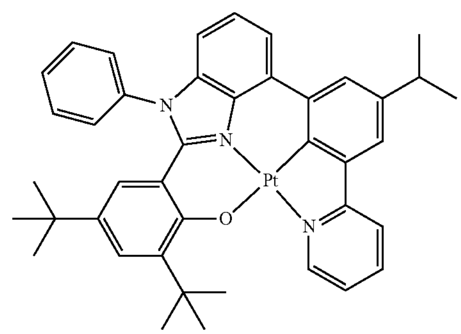
3-220
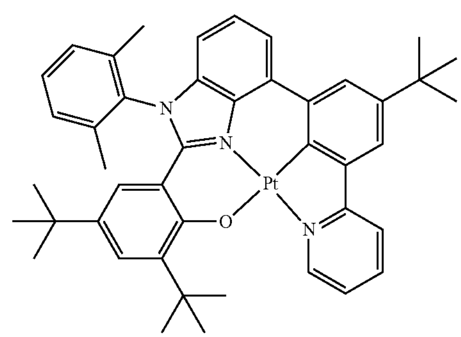

-continued
3-221
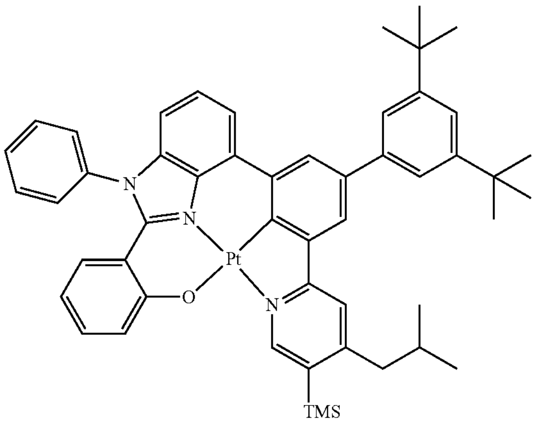
3-222
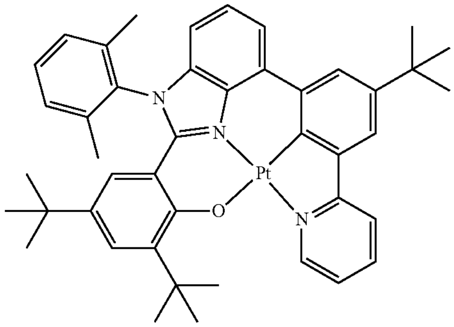
3-223
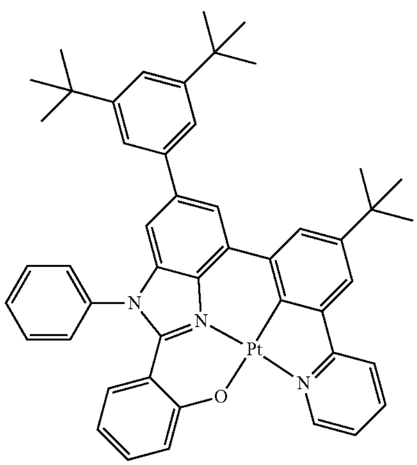
3-224
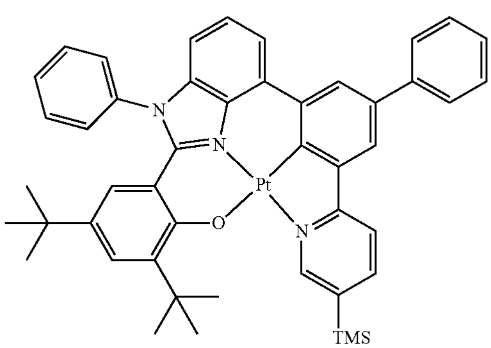
-continued
3-225
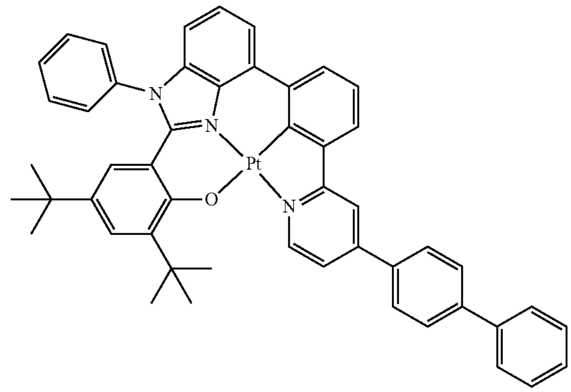
3-226
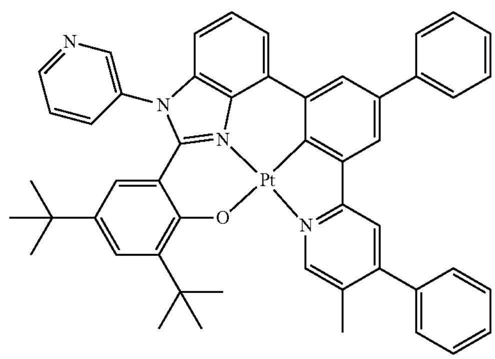
3-227
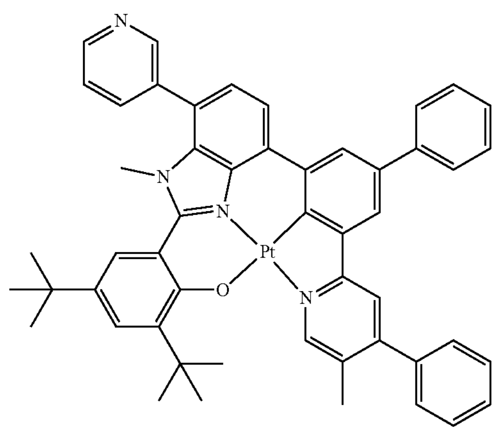
3-228
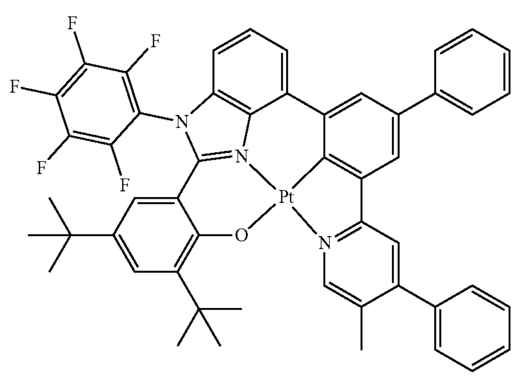

-continued
3-229
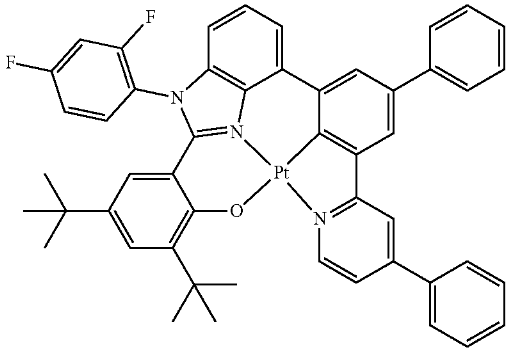
3-230
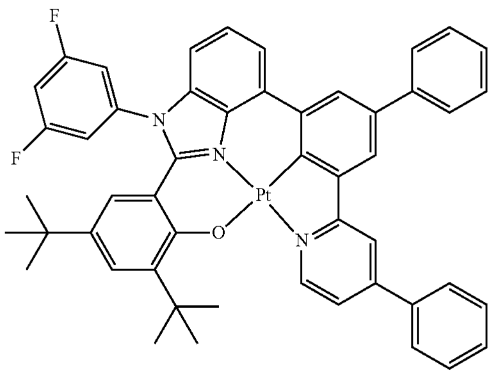
3-231
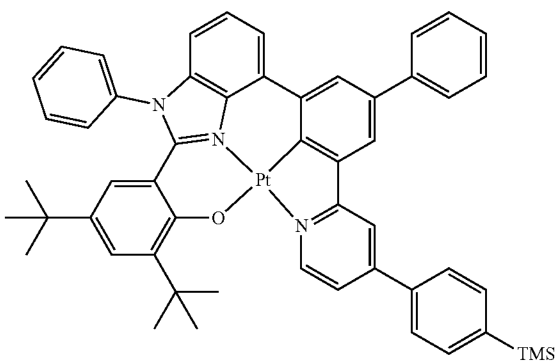
3-232
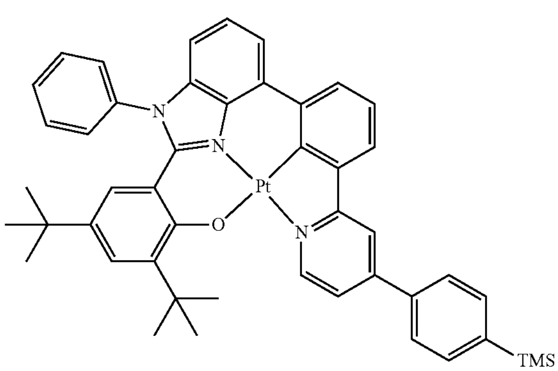
-continued
3-233
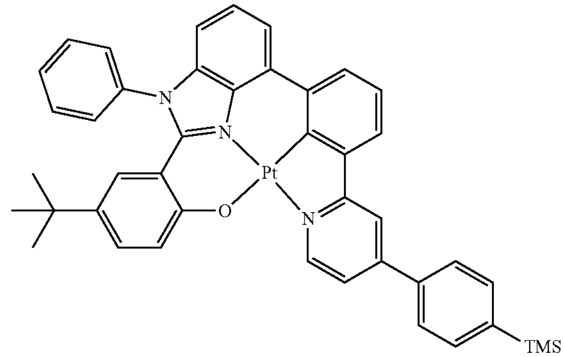
3-234
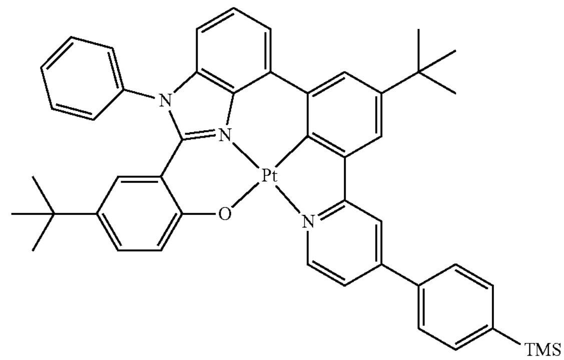
3-235
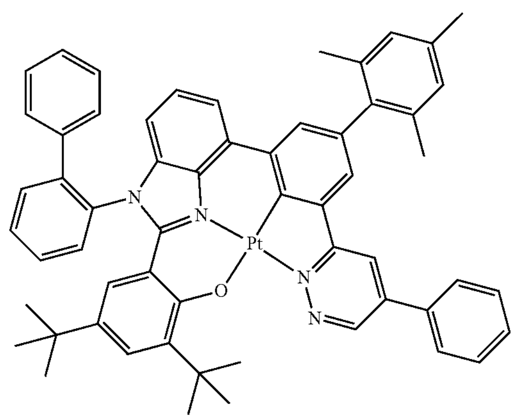
3-236
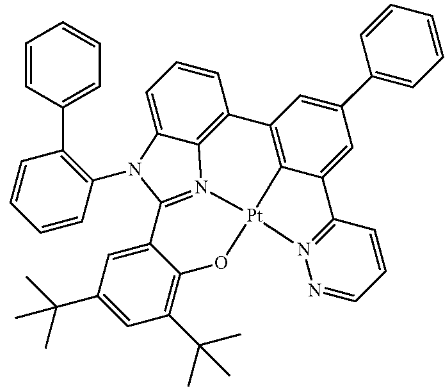

-continued
3-237
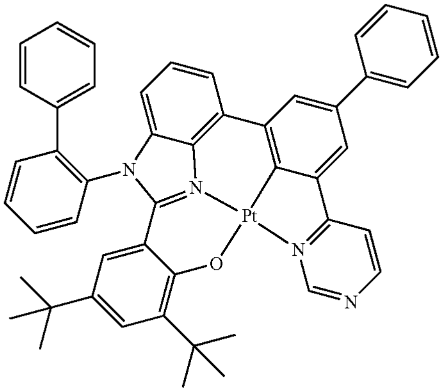
3-238
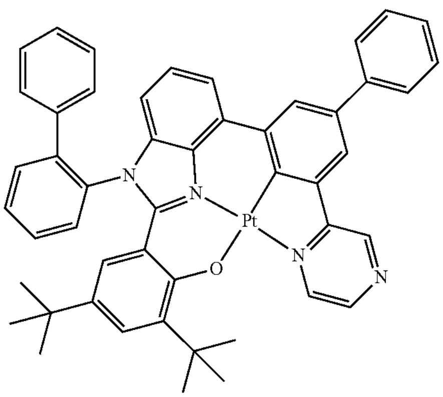
3-239
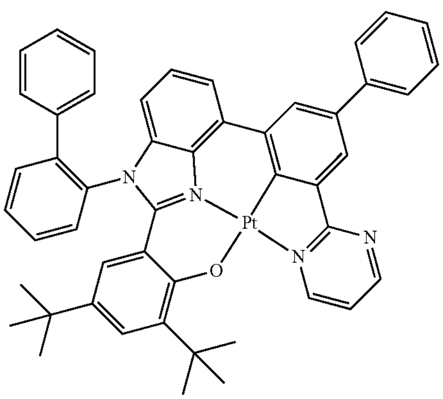
3-240
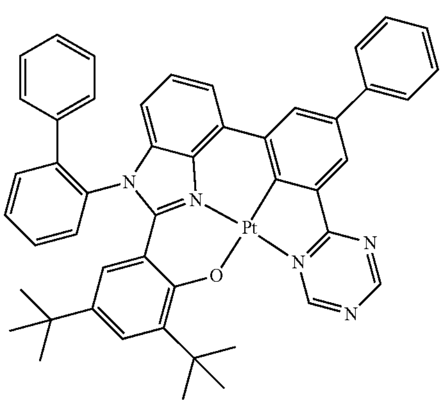
-continued
3-241
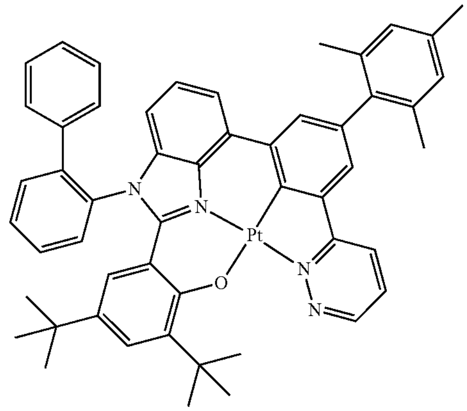
3-242
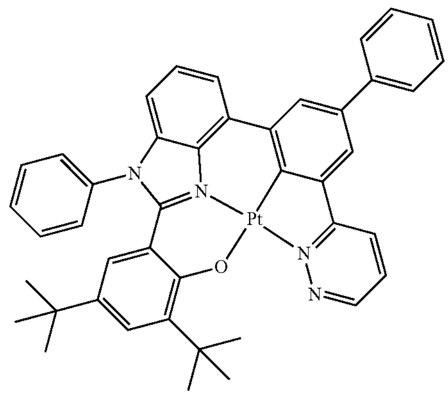
3-243
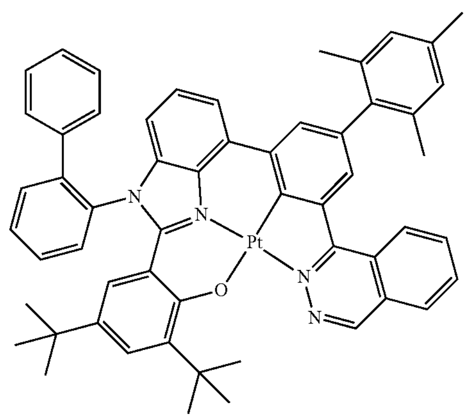
3-244
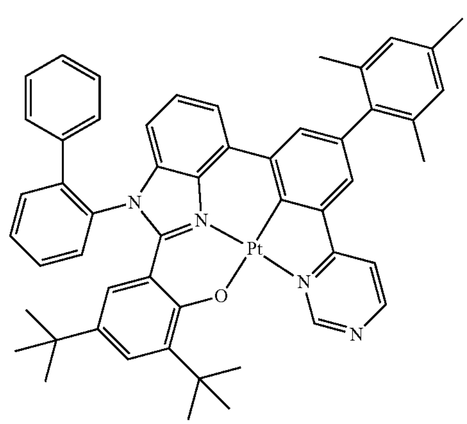

-continued
3-245
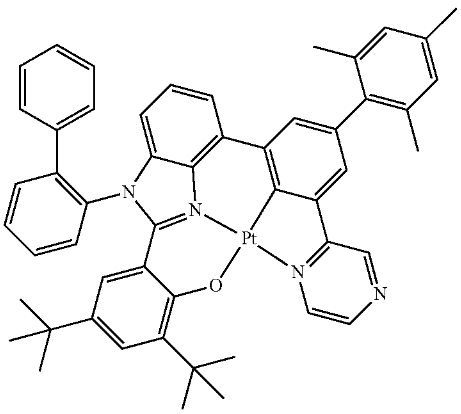
3-246
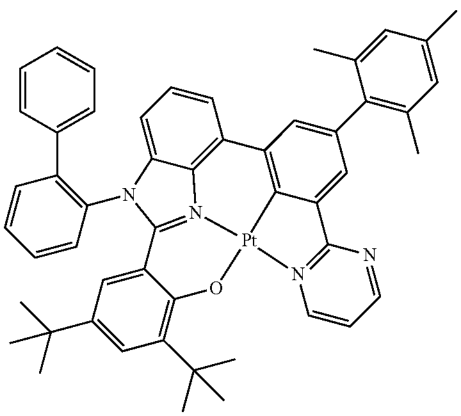
3-247
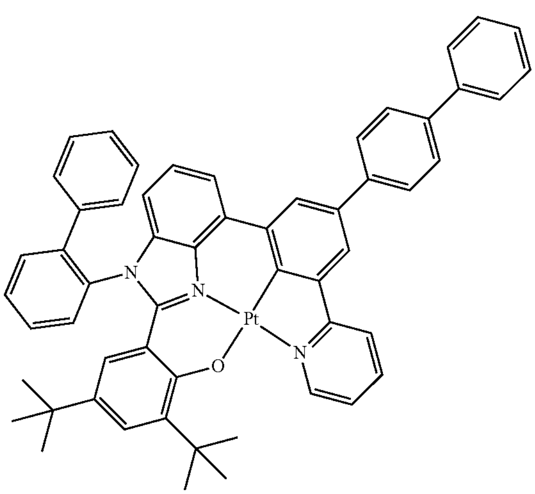
-continued
3-248
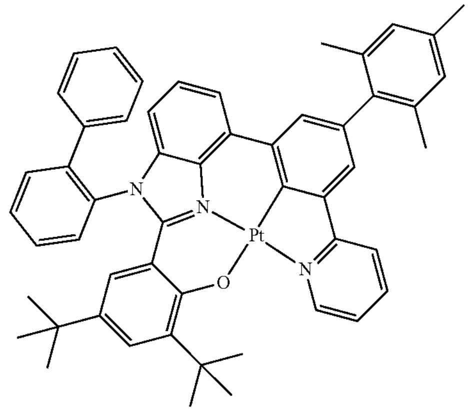
3-249
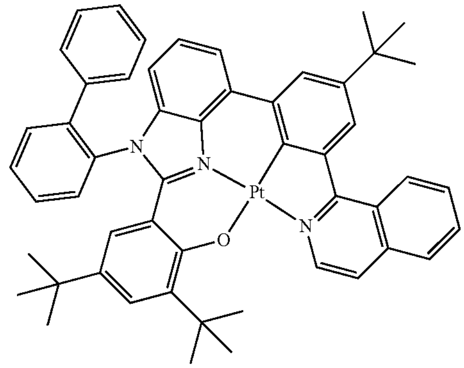
3-250
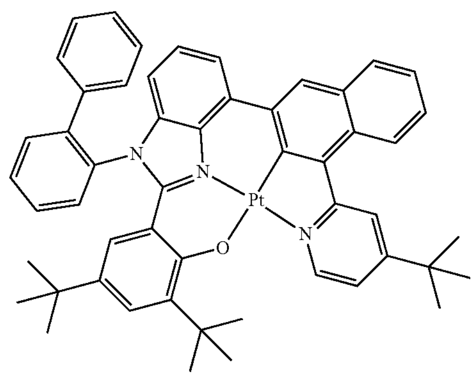
3-251
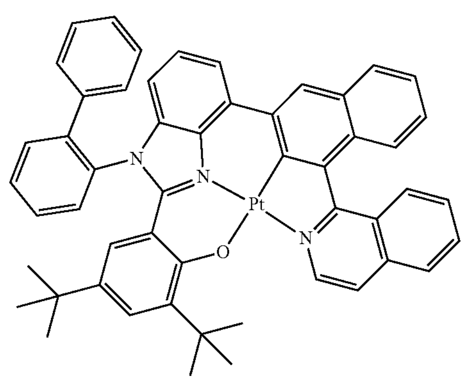

-continued
3-252
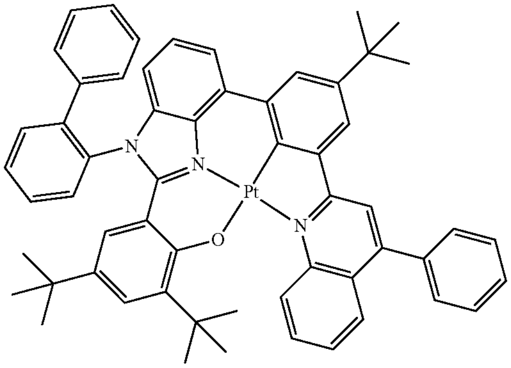
3-253
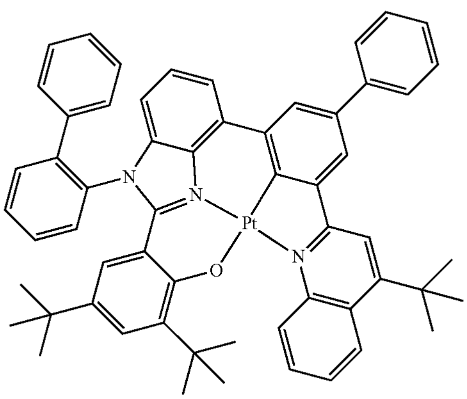
3-254
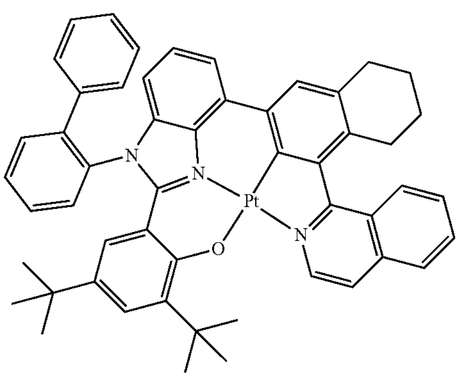
3-255
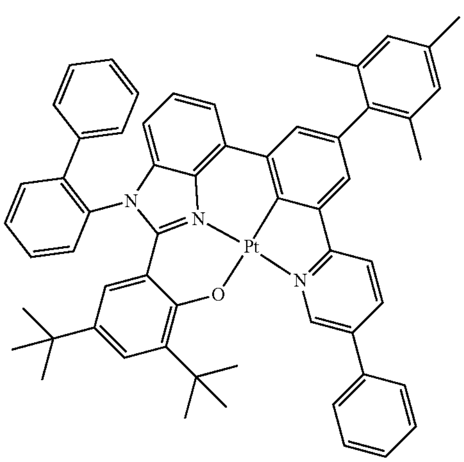
-continued
3-256
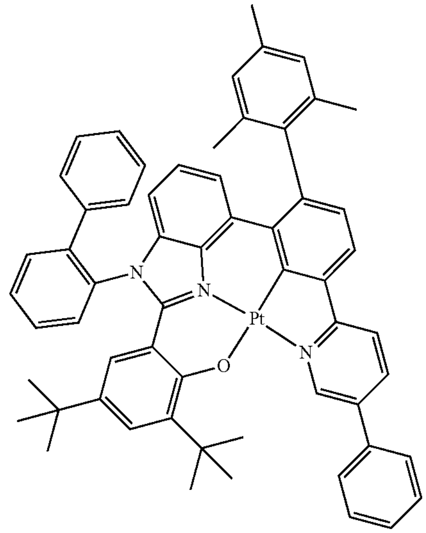
3-257
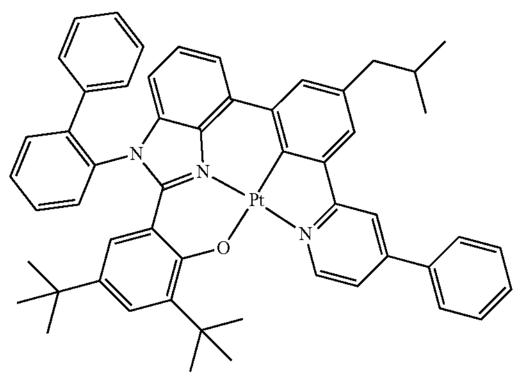
3-258
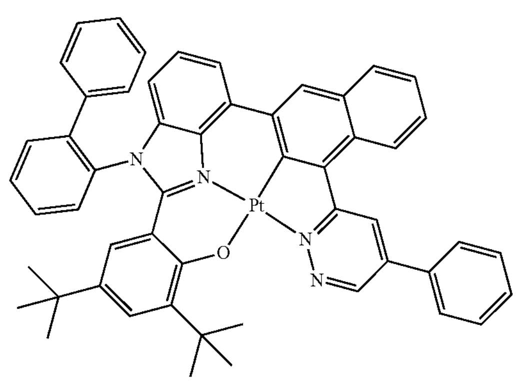

-continued
3-259
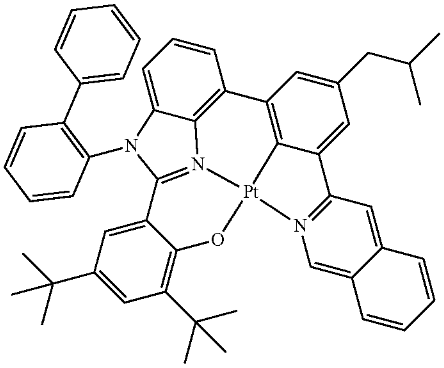
3-260
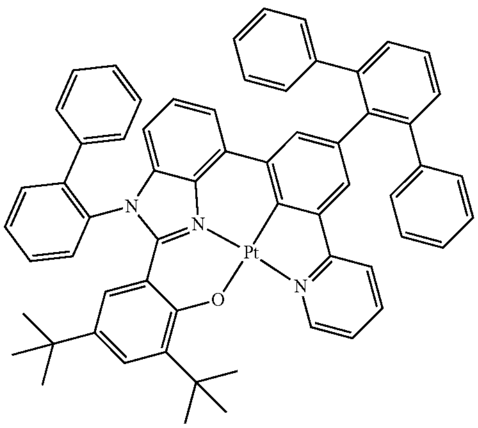
3-261
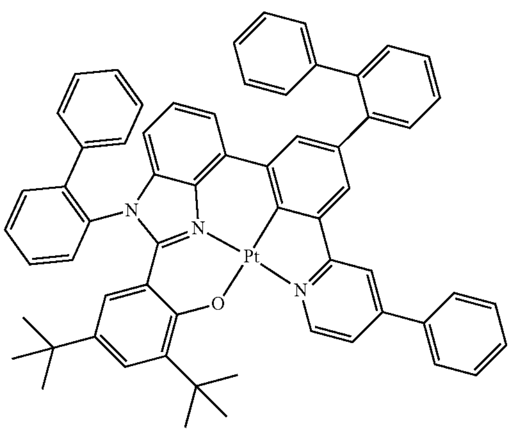
3-262
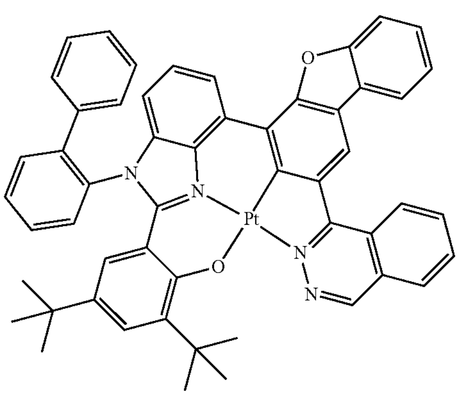
-continued
3-263
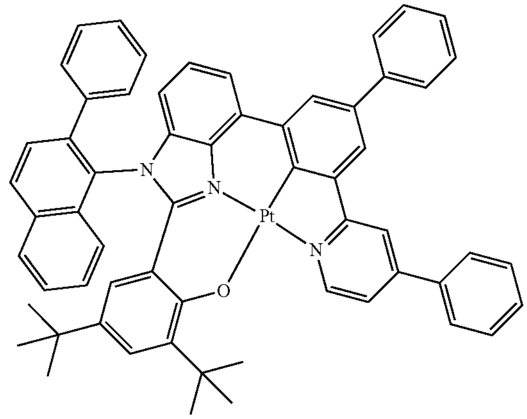
3-264
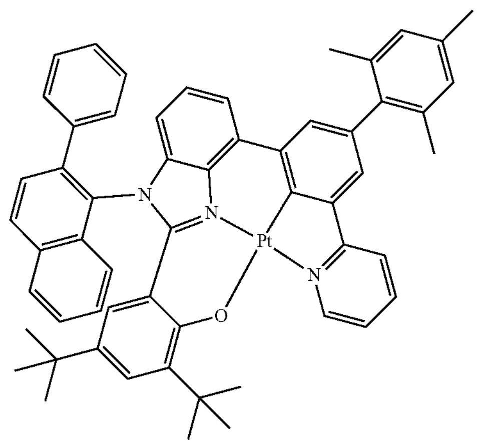
3-265
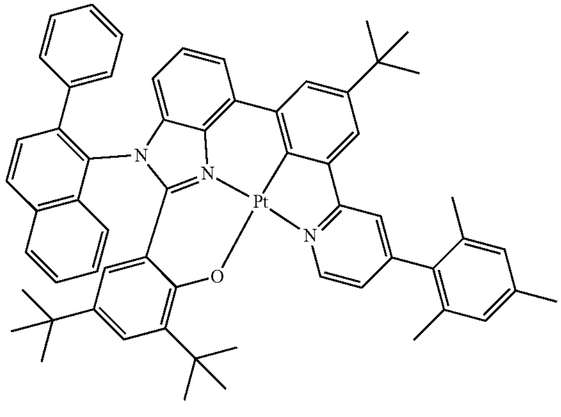

-continued
3-266
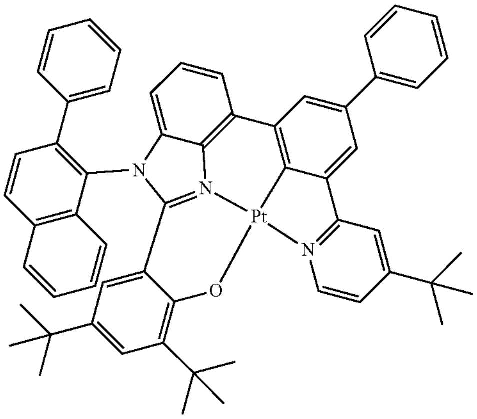
3-267
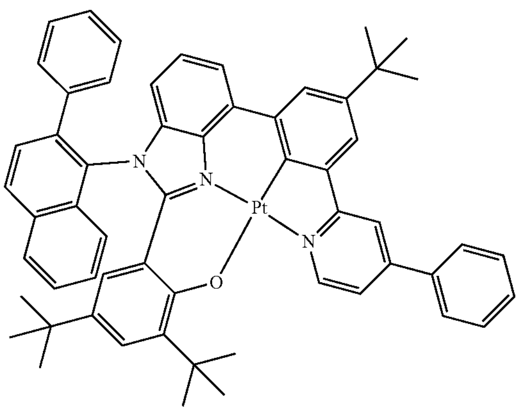
3-268
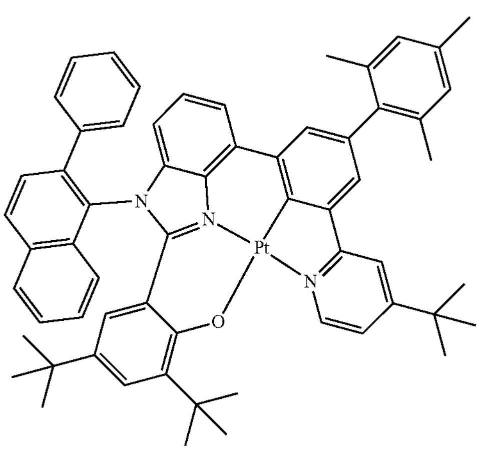
-continued
3-269
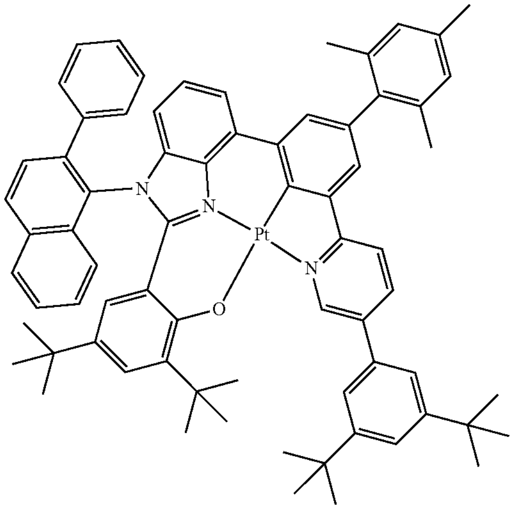
3-270
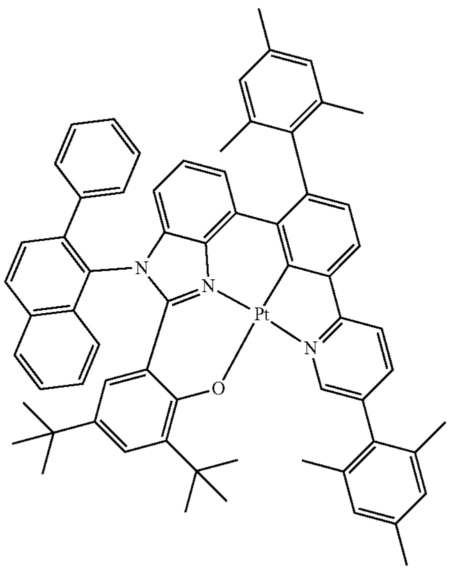
3-271
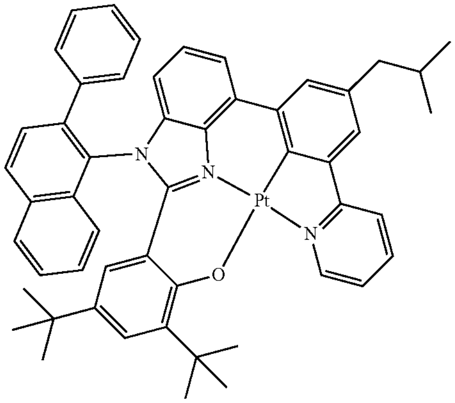

-continued
3-272
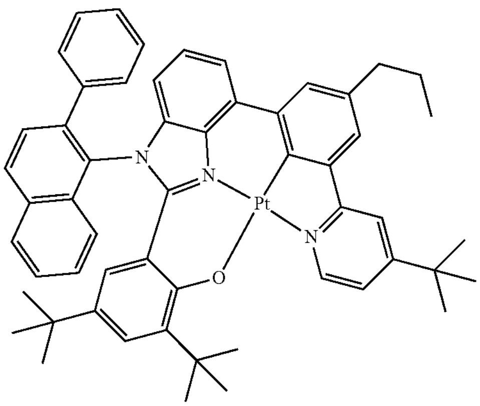
3-273
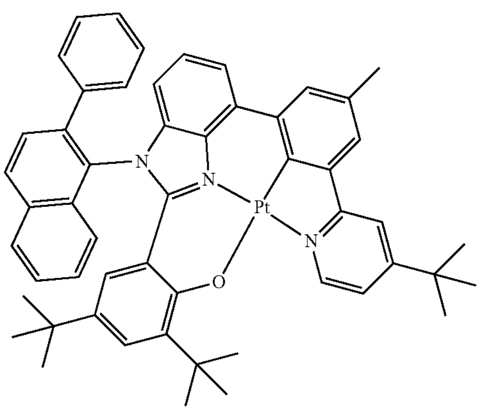
3-274
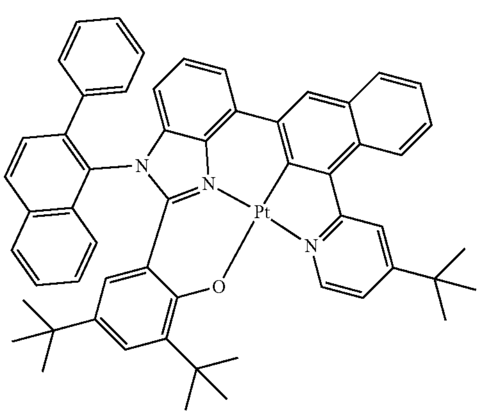
-continued
3-275
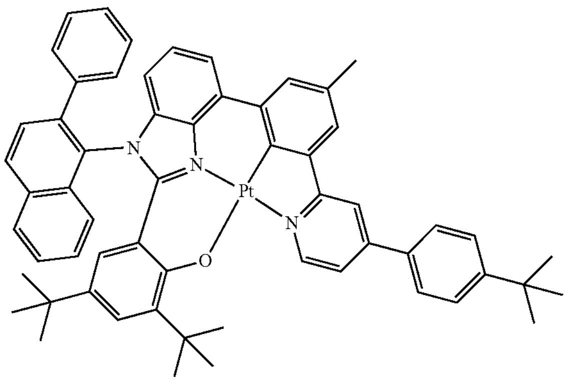
3-276
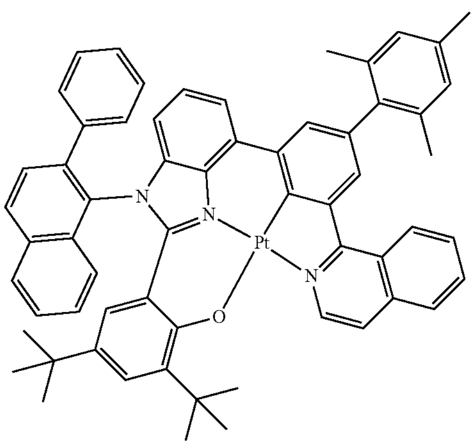
3-277
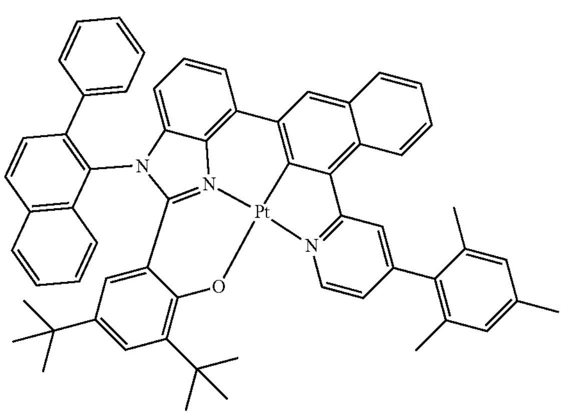

-continued
3-278
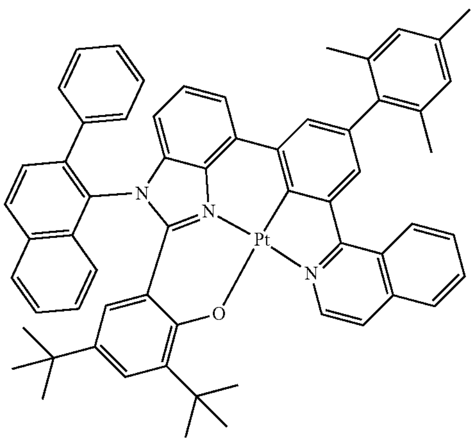
3-279
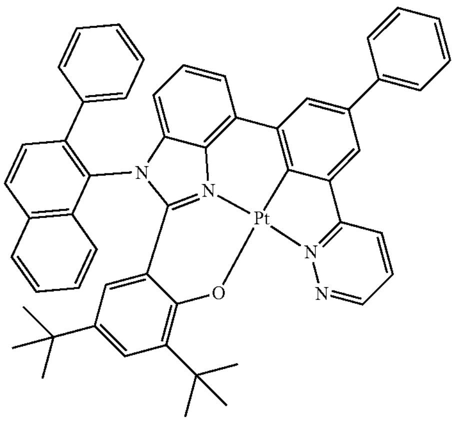
3-280
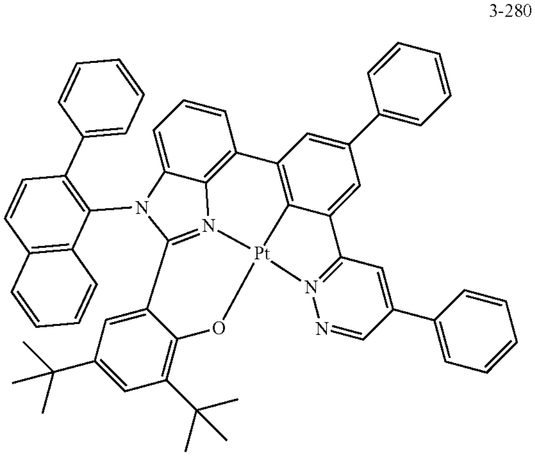
3-281
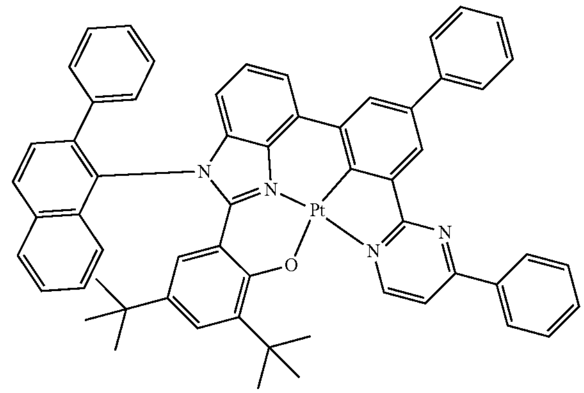
3-282
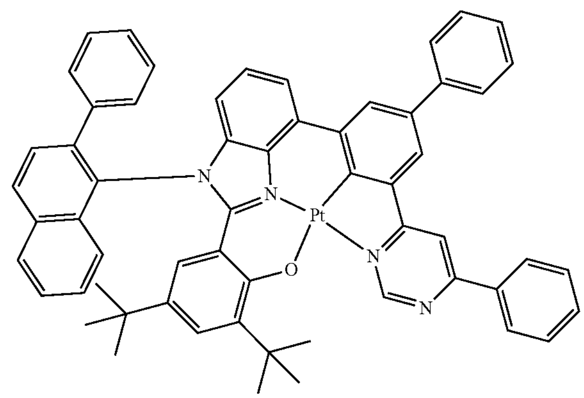
3-283
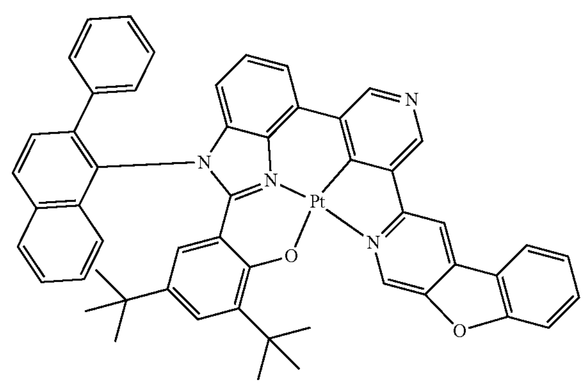
3-284
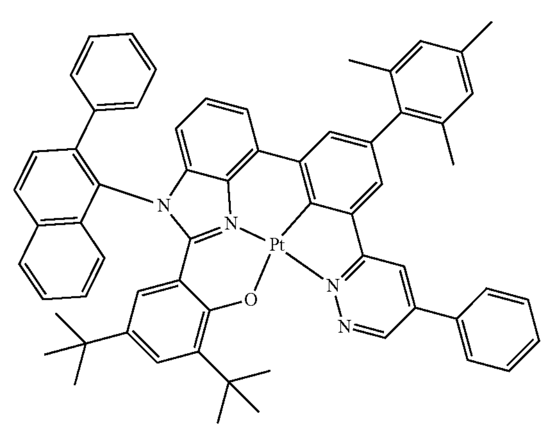

-continued
3-285
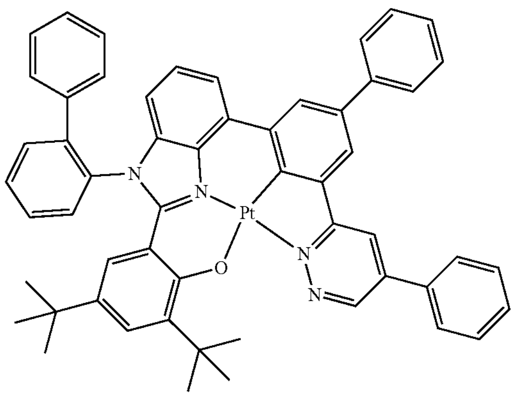
3-286
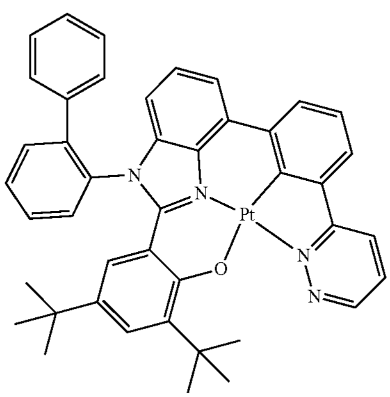
3-287
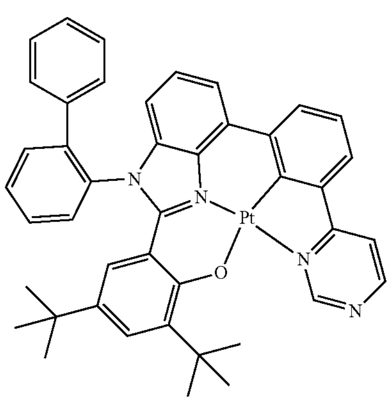
3-288
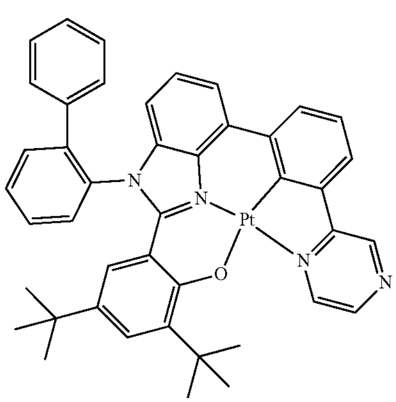
-continued
3-289
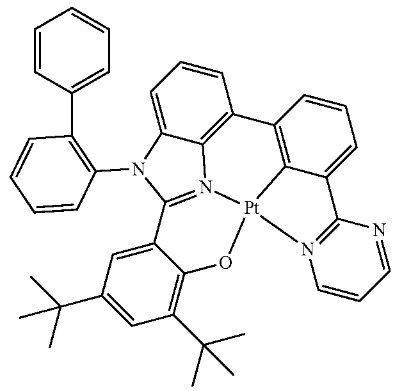
3-290
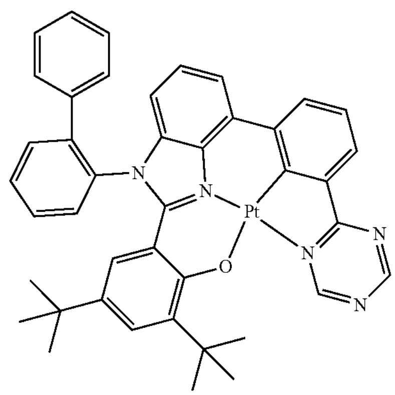
3-291
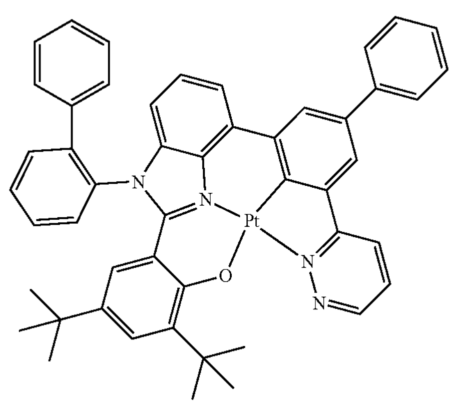
3-292
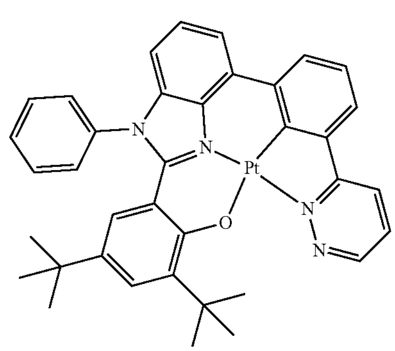

-continued
3-293
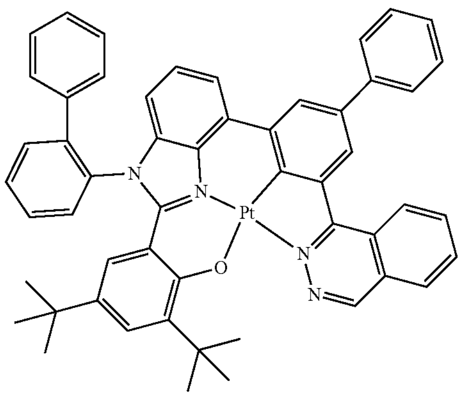
3-294
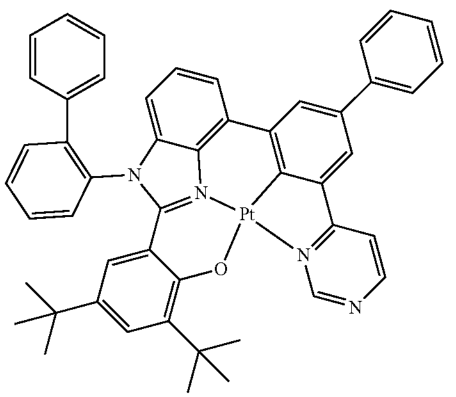
3-295
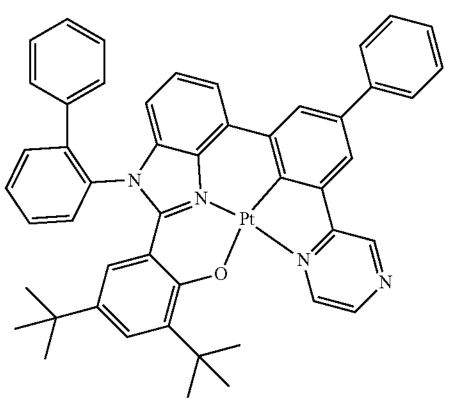
3-296
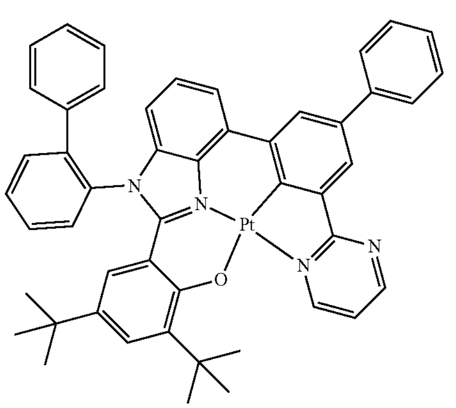
-continued
3-297
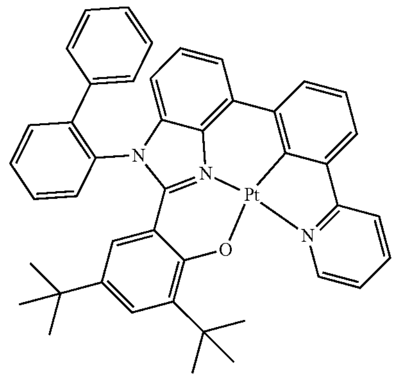
3-298
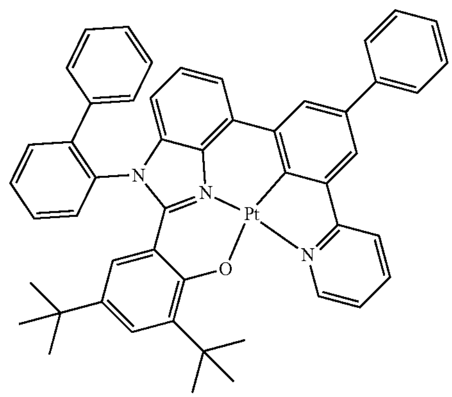
3-299
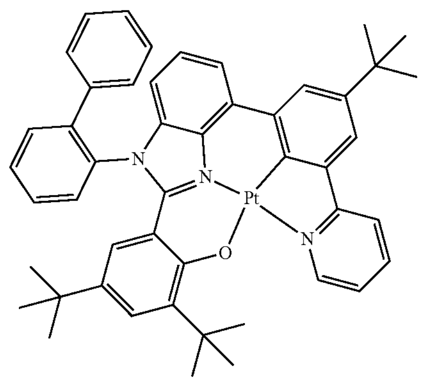
3-300
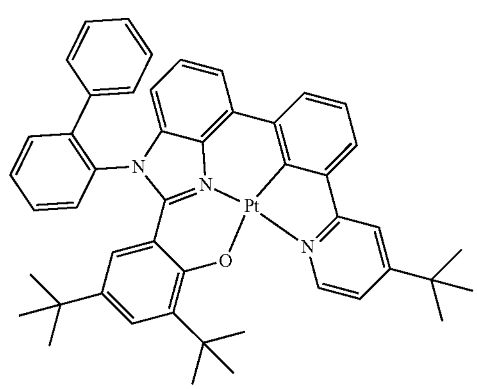

-continued
3-301
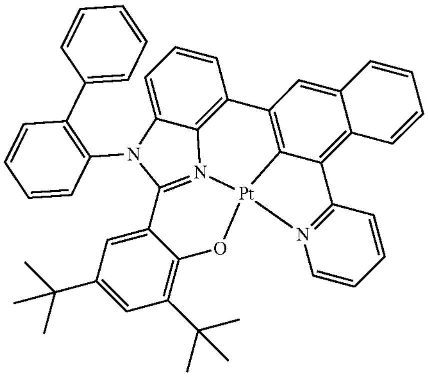
3-302
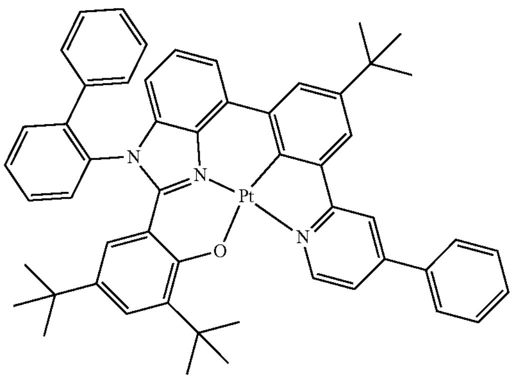
3-303
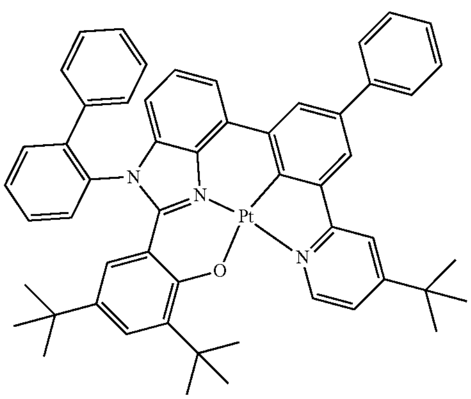
3-304
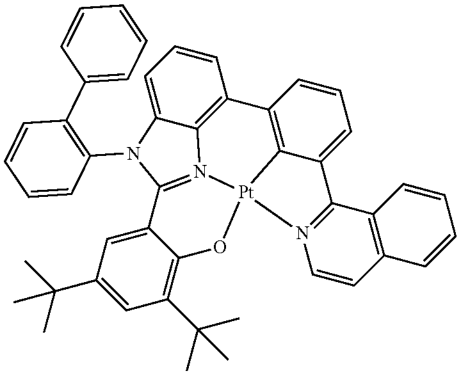
-continued
3-305
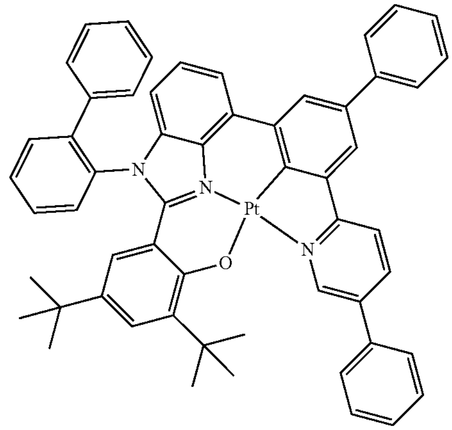
3-306
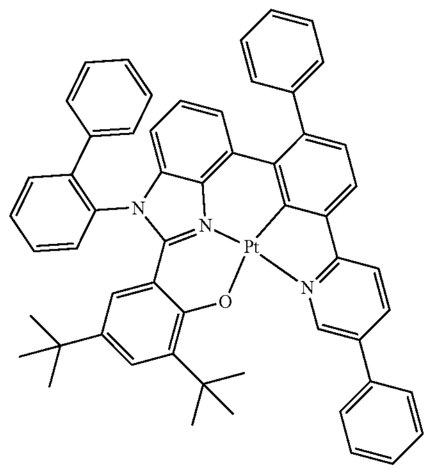
3-307
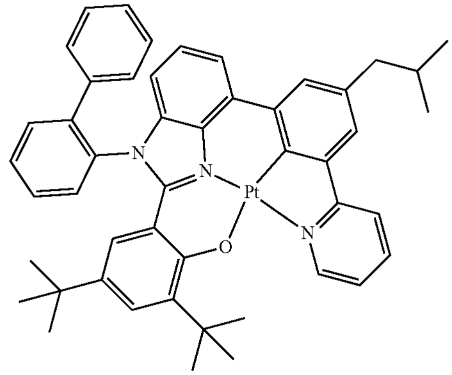

-continued
3-308
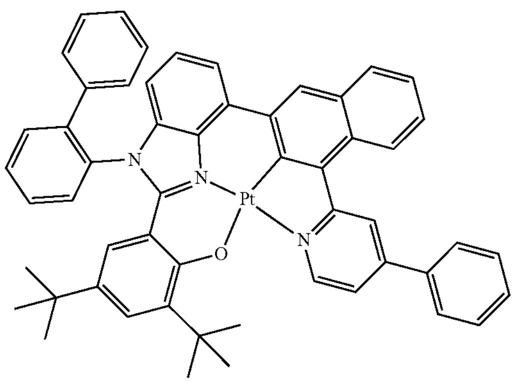
3-309
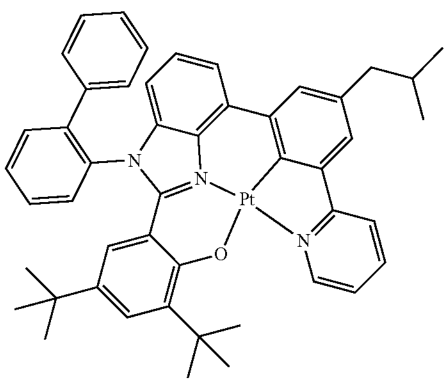
3-310
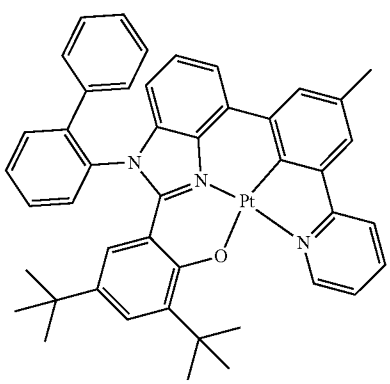
3-311
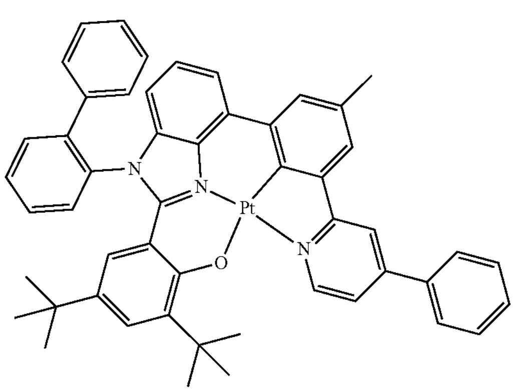
-continued
3-312
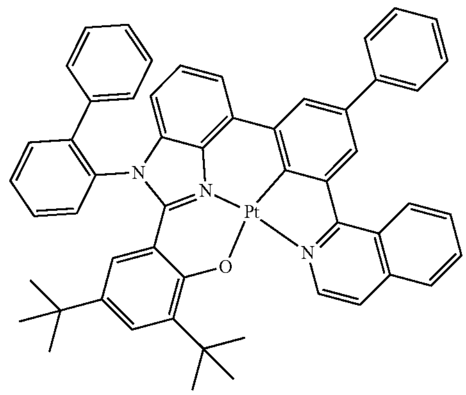
3-313
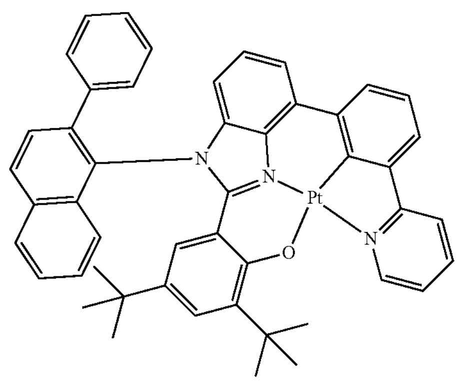
3-314
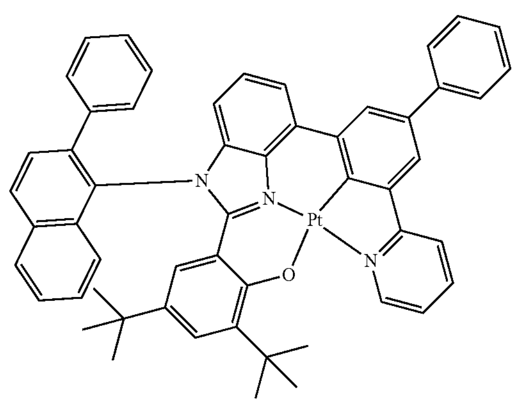
3-315
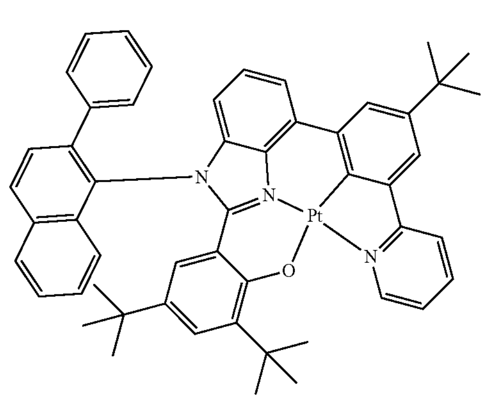

-continued
3-316
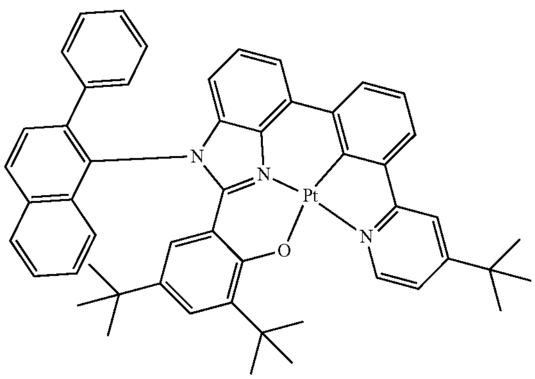
3-317
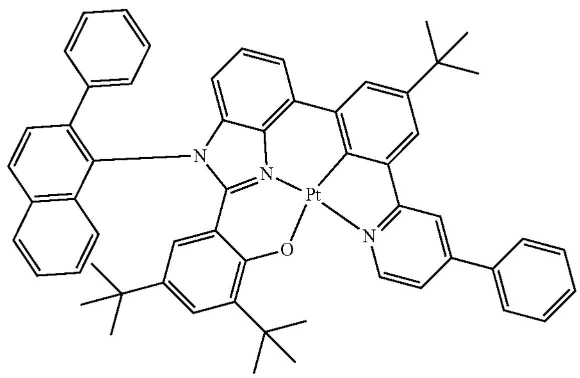
3-318
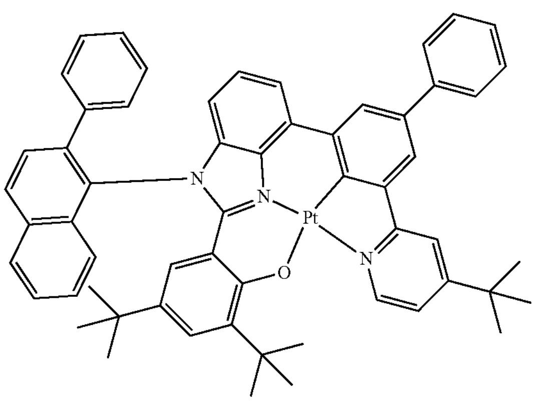
3-319
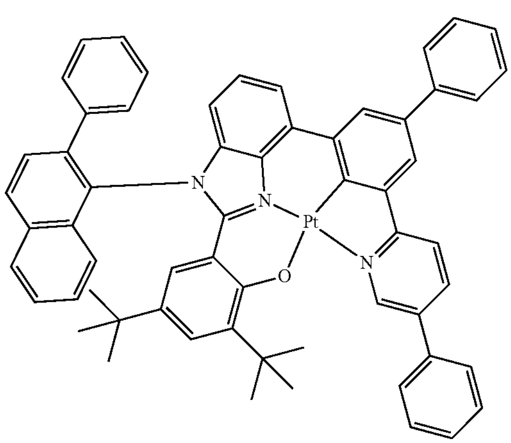
-continued
3-320
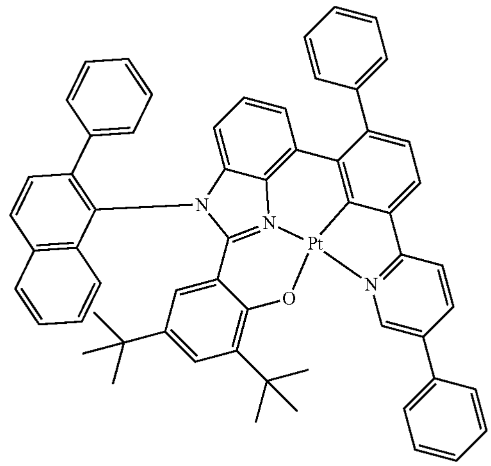
3-321
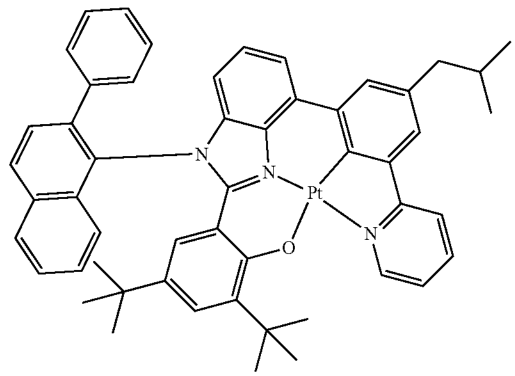
3-222
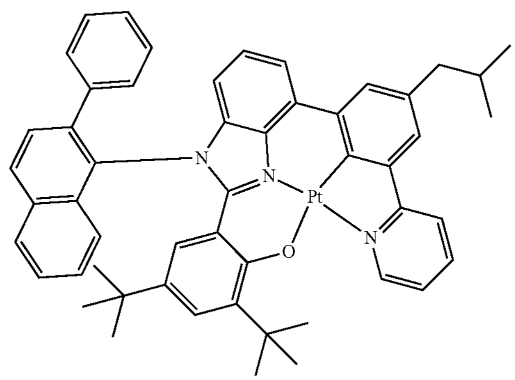
3-323
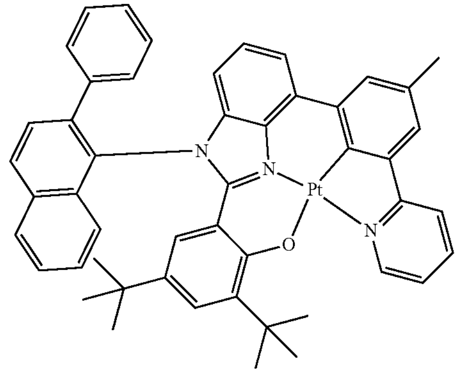

-continued
3-324
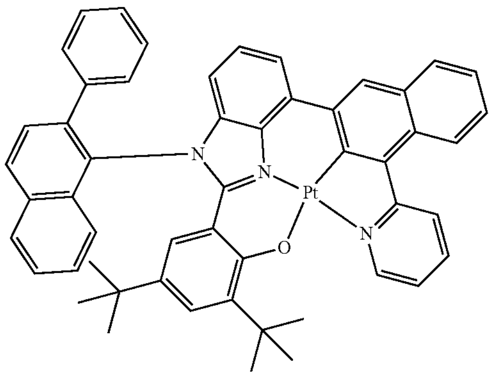
3-325
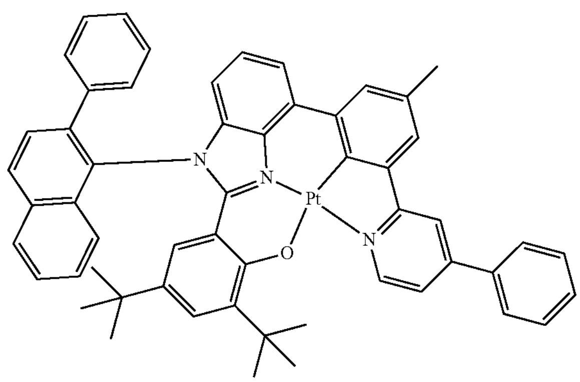
3-326
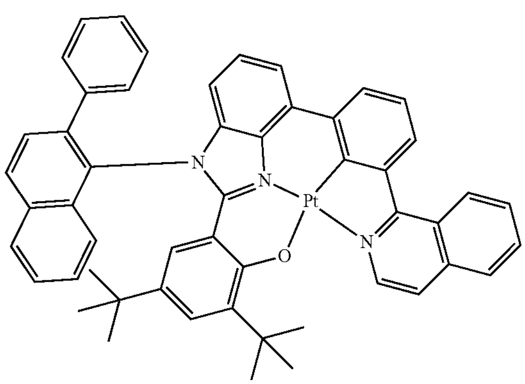
3-327
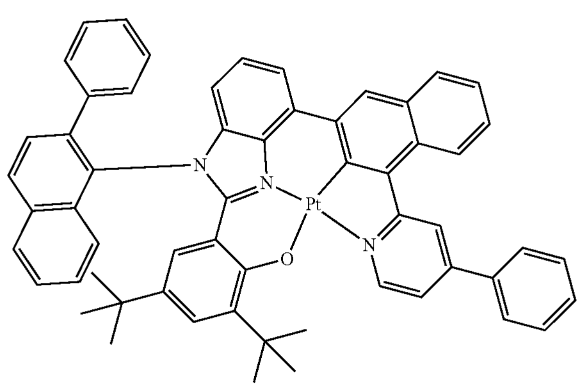
-continued
3-328
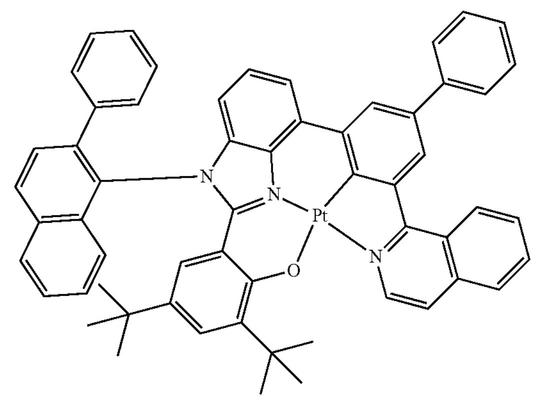
3-329
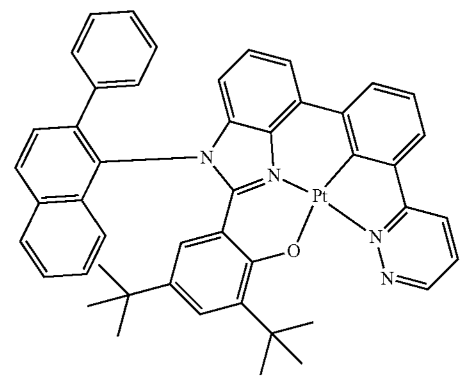
3-330
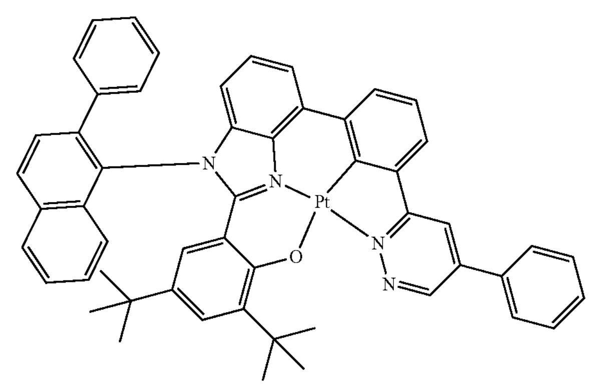
3-331
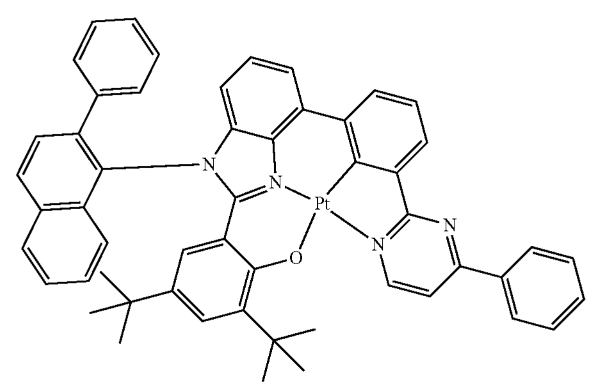

-continued
3-332
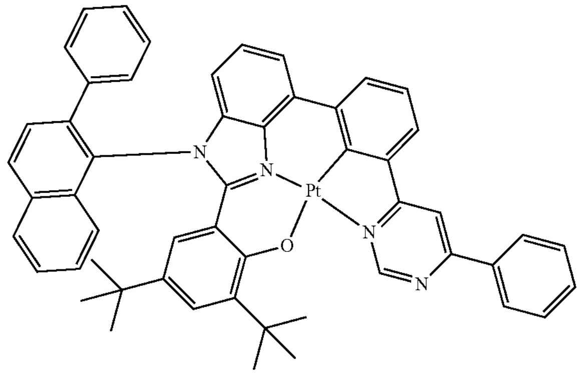
3-333
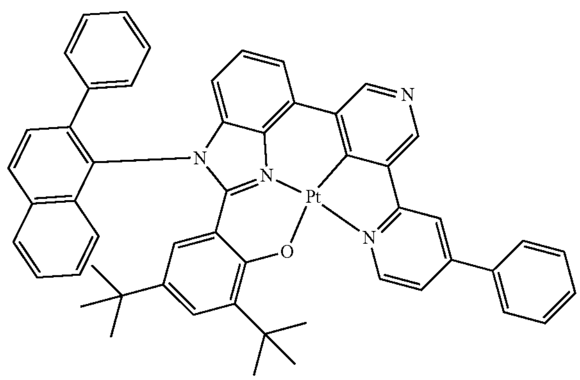
3-334
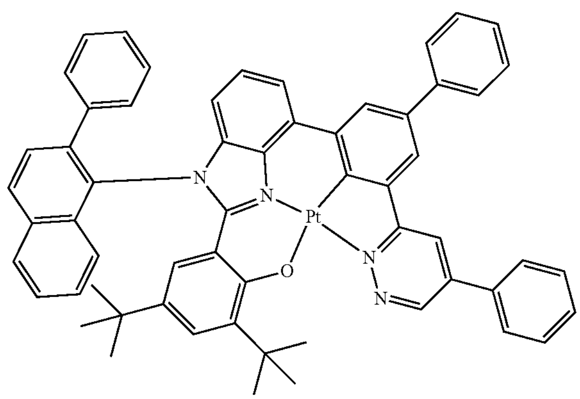
3-335
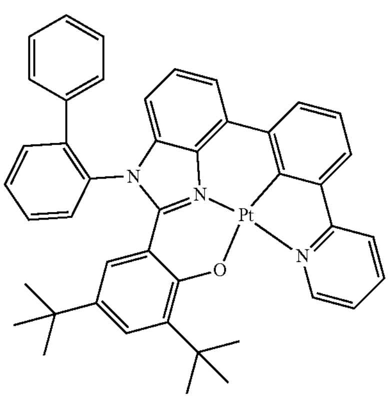
-continued
3-336
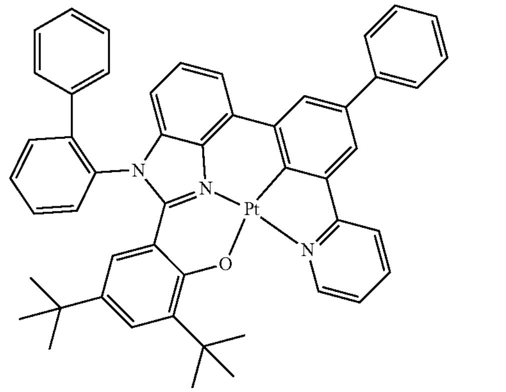
3-337
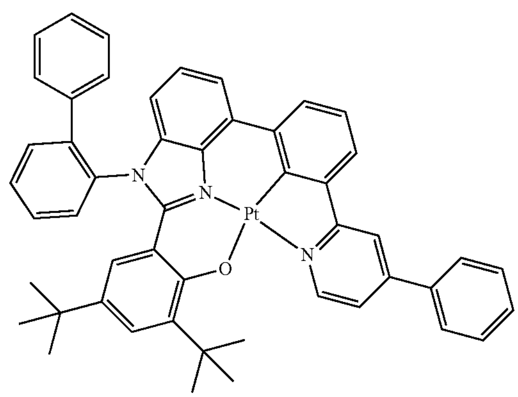
3-338
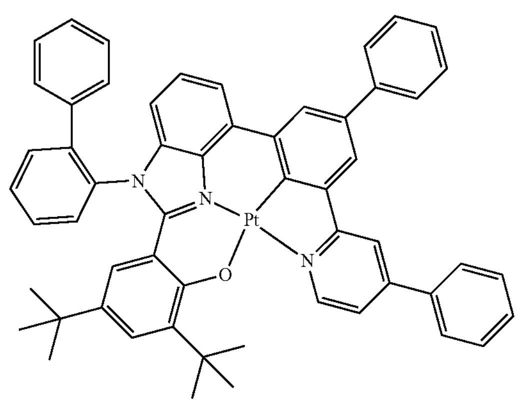

-continued
3-339
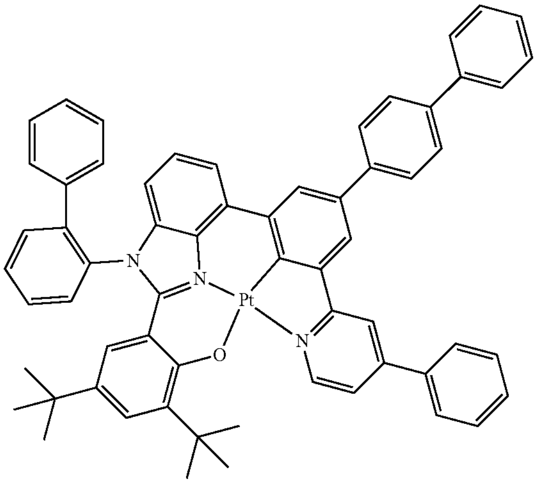
3-340
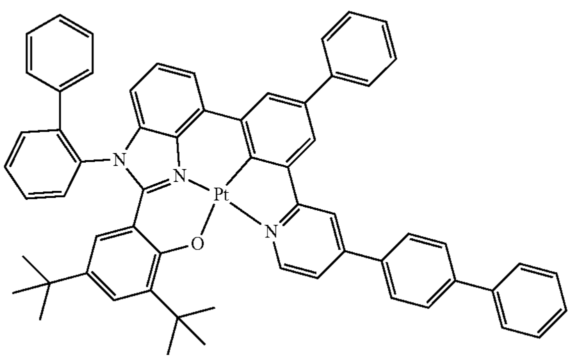
3-341
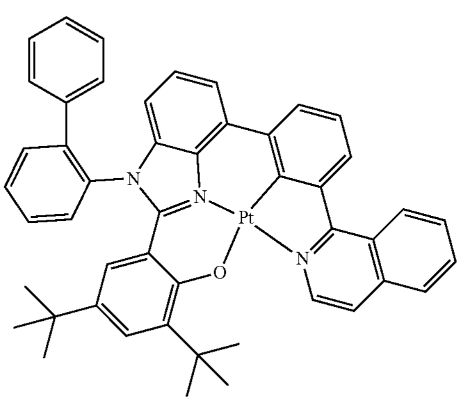
-continued
3-342
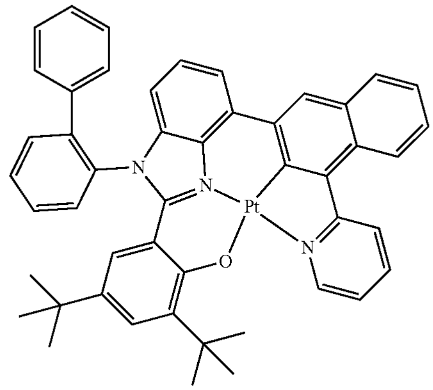
3-343
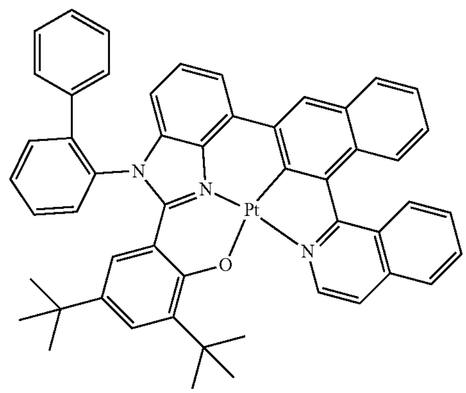
3-344
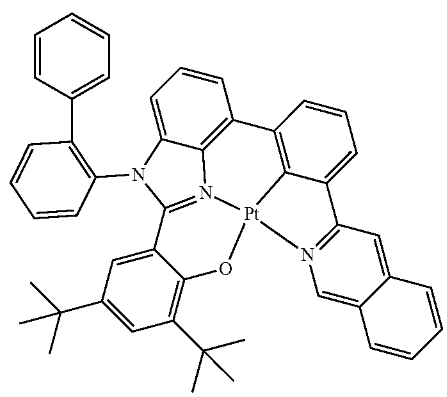
3-345
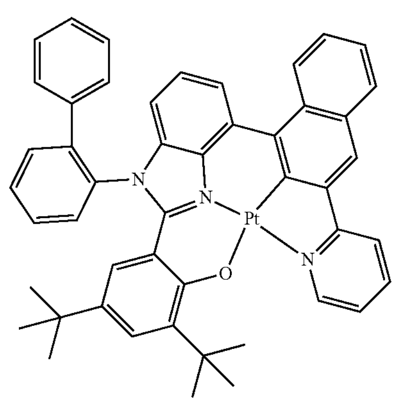

-continued
3-346
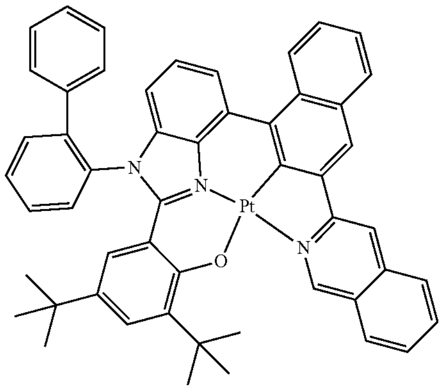
3-347
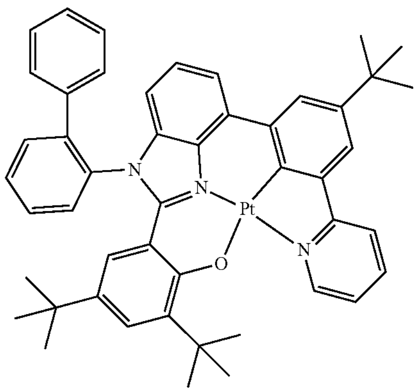
3-348
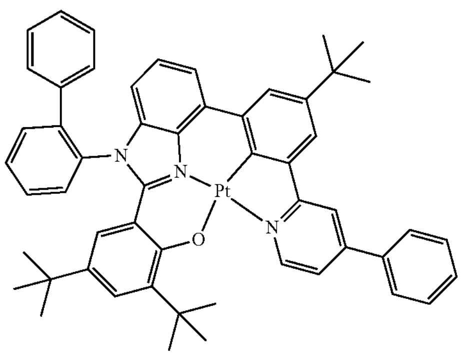
3-349
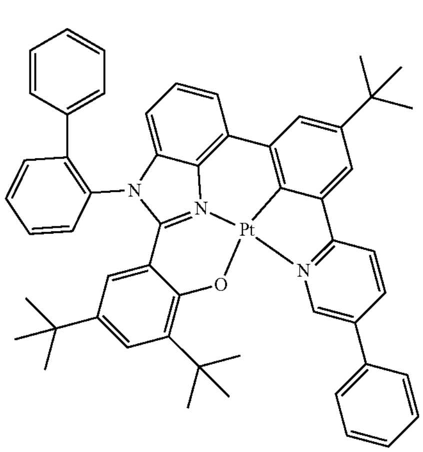
-continued
3-350
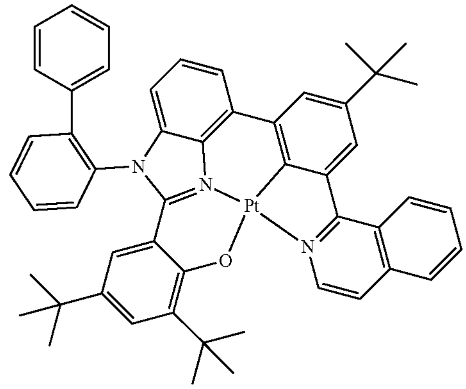
3-351
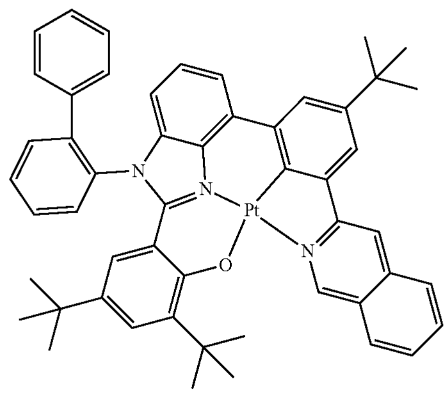
3-352
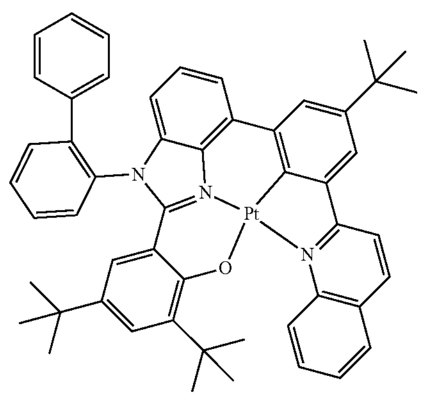
3-353
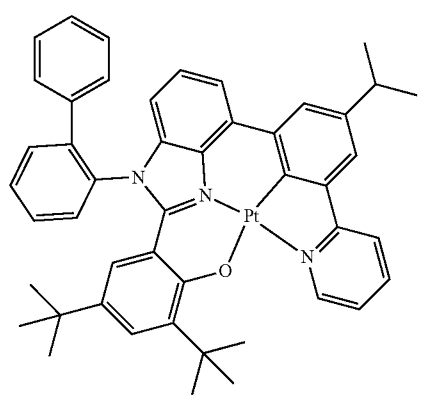

3-354
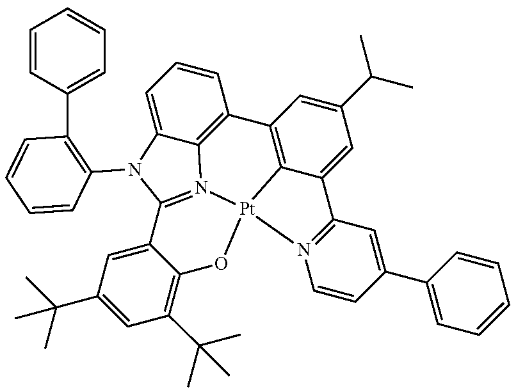
3-355
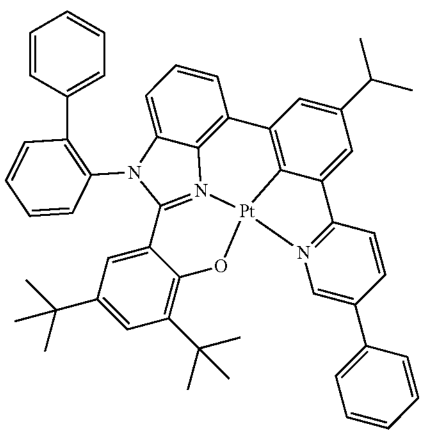
3-356
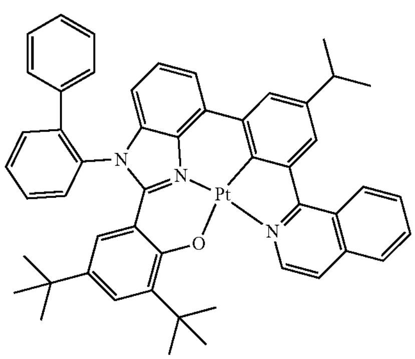
3-357
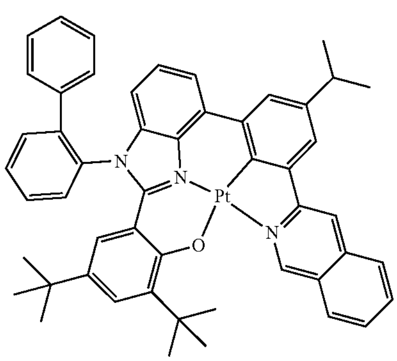
3-358
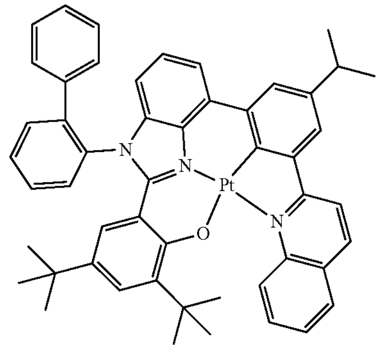
3-359
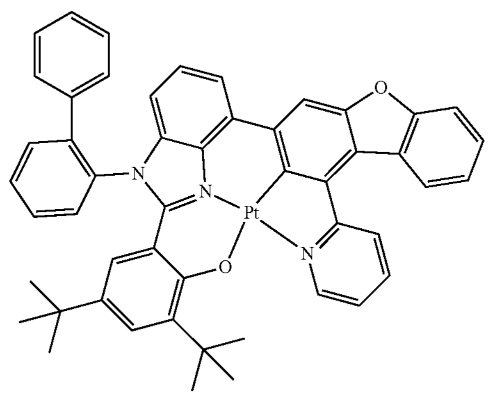
3-360
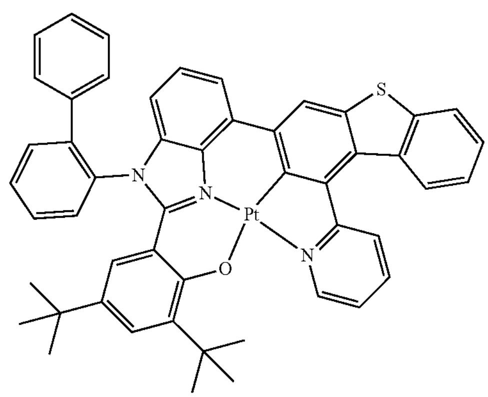
3-361
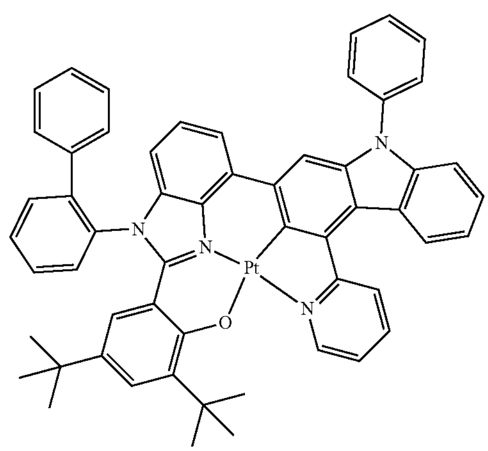

-continued
3-362
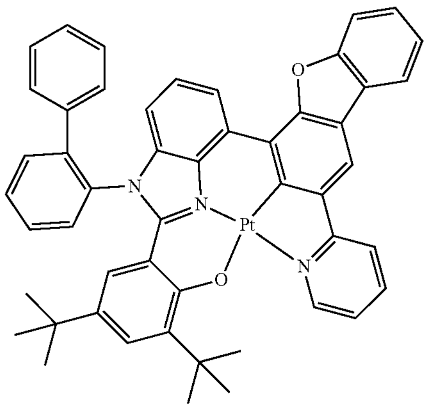
3-363
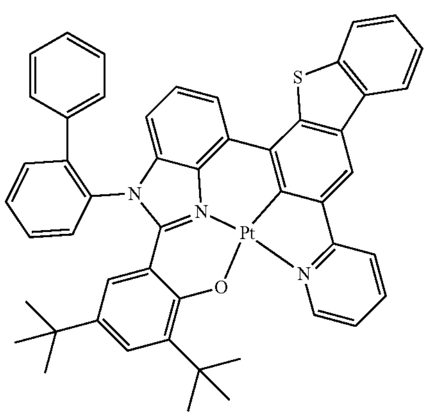
3-364
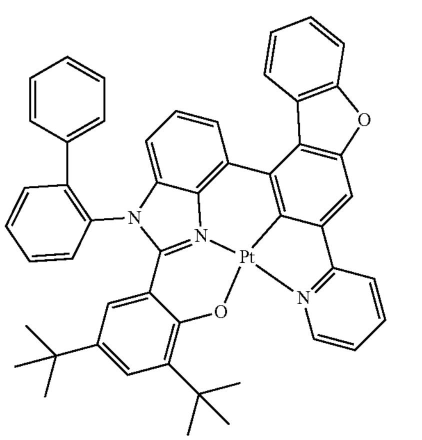
-continued
3-365
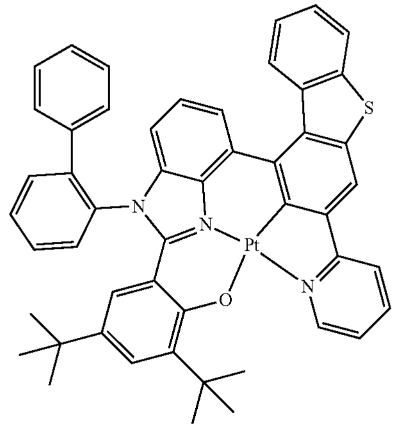
3-366
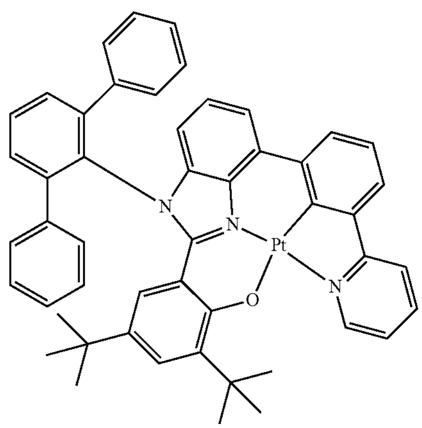
3-367
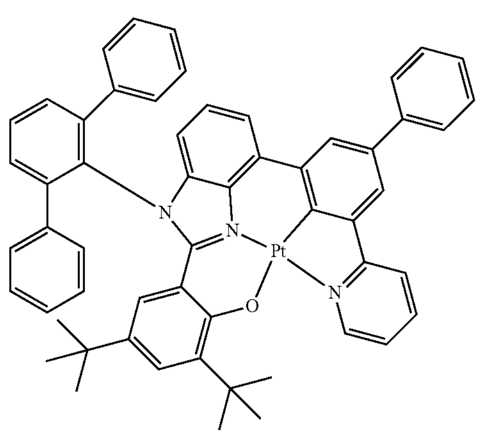

-continued
3-368
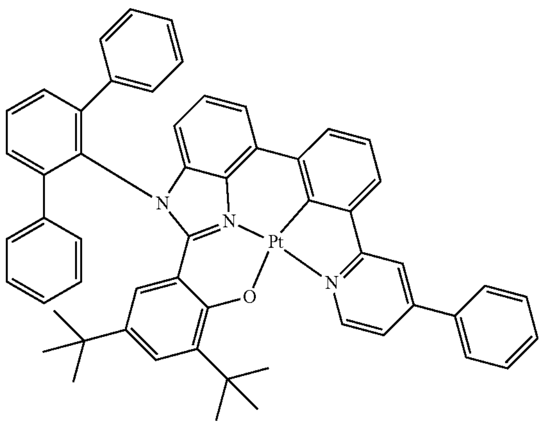
3-369
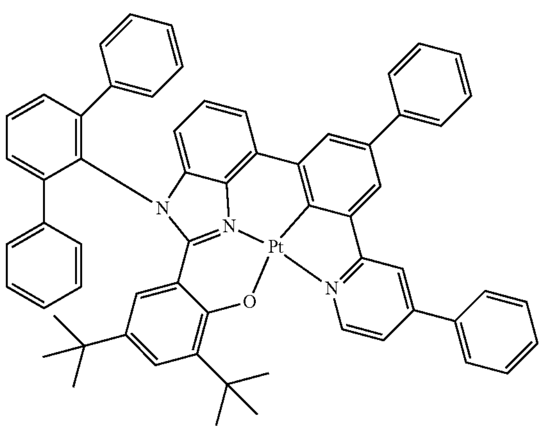
3-370
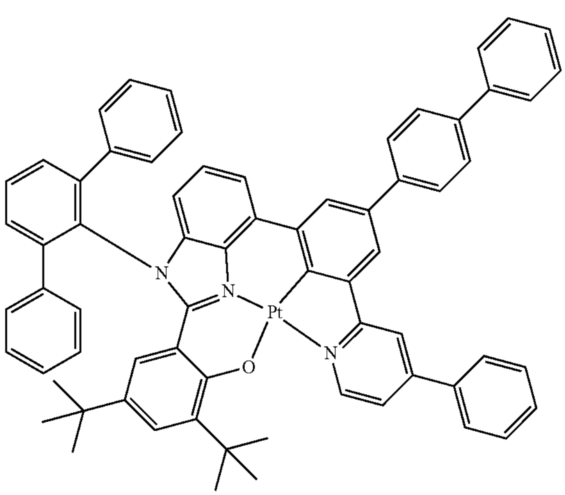
-continued
3-371
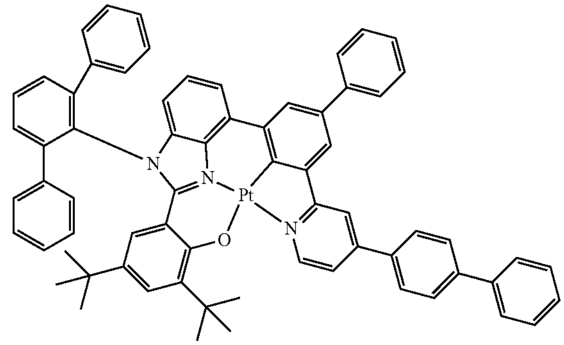
3-372
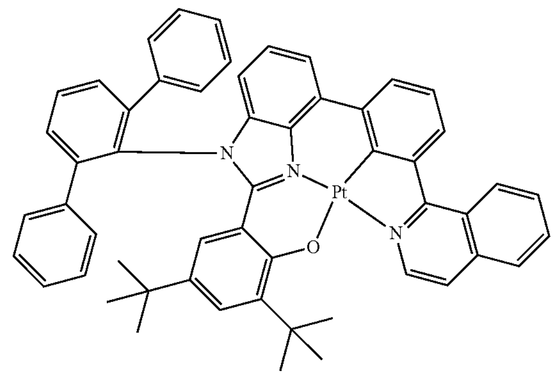
3-373
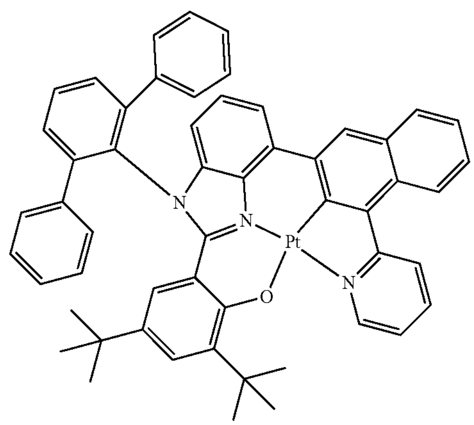
3-374
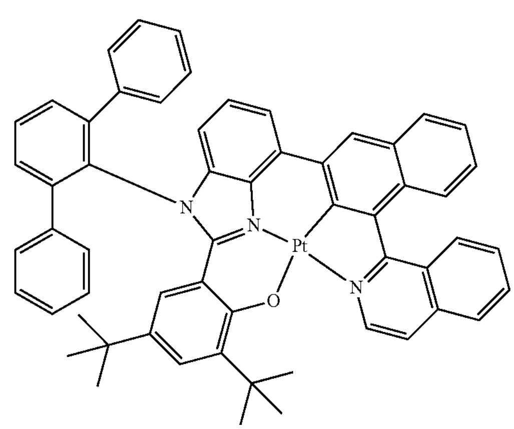

-continued
3-375
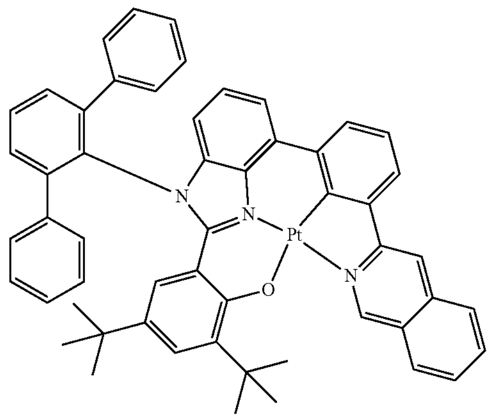
3-376
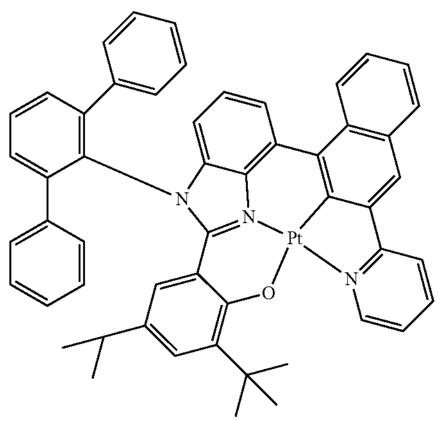
3-377
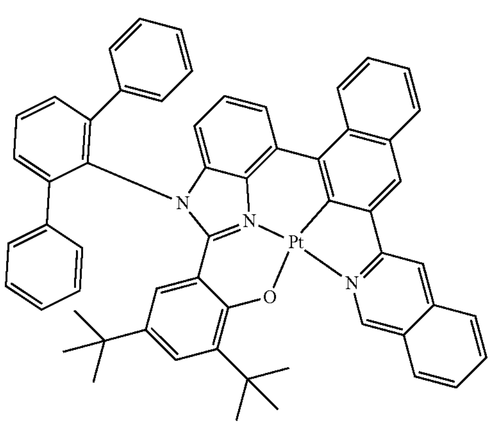
-continued
3-378
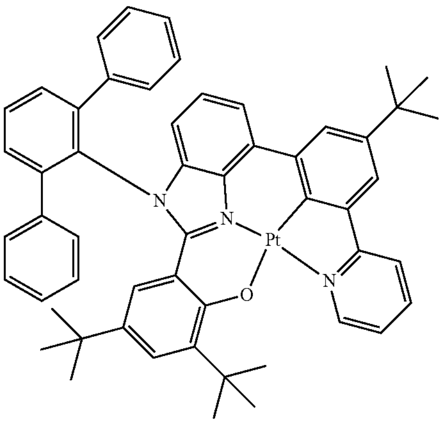
3-379
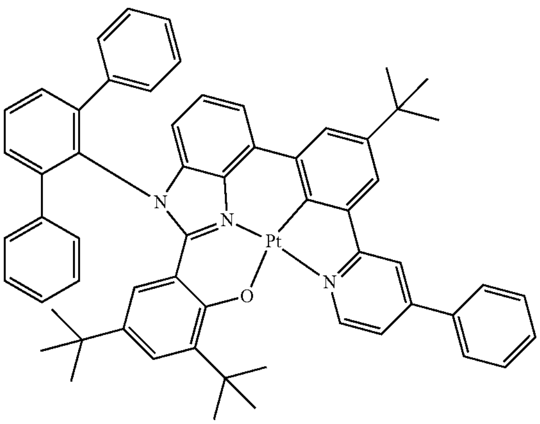
3-380
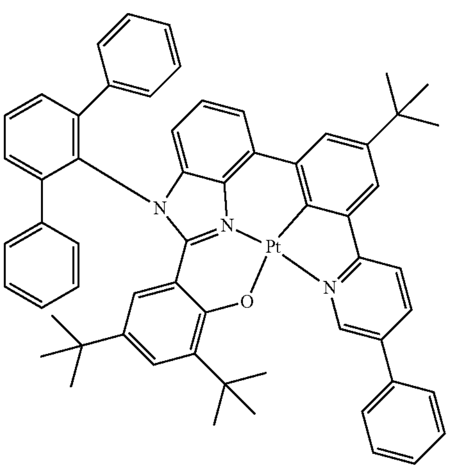

-continued
3-381
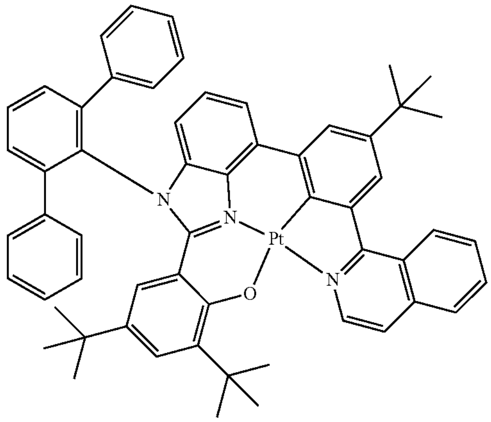
3-382
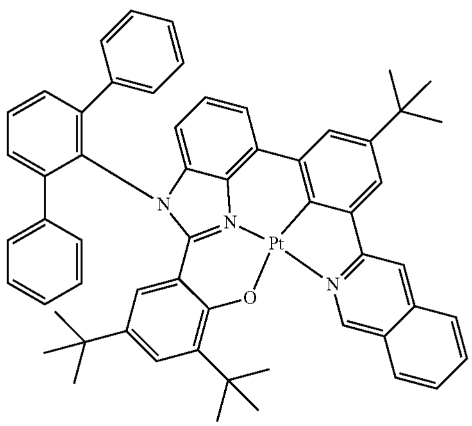
3-383
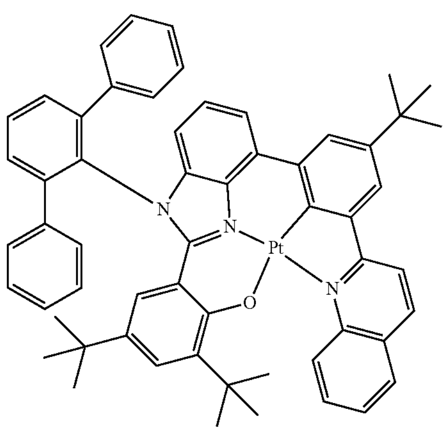
-continued
3-384
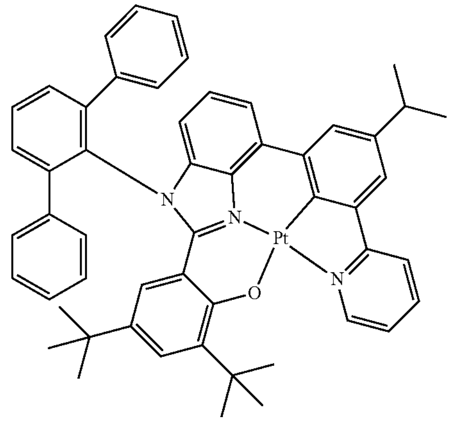
3-385
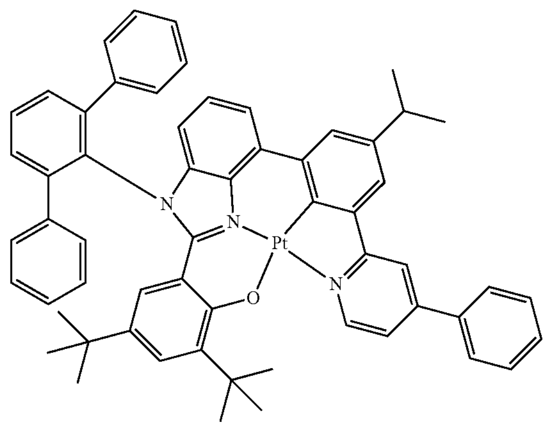
3-386
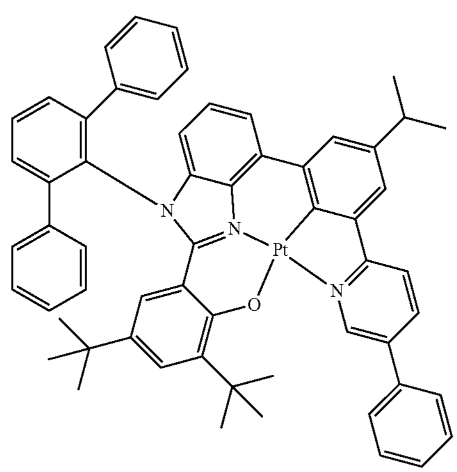

-continued
3-387
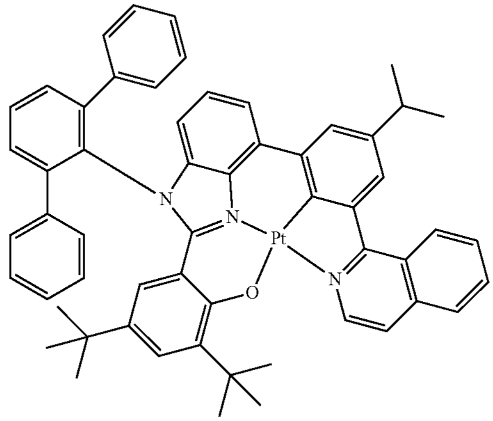
3-388
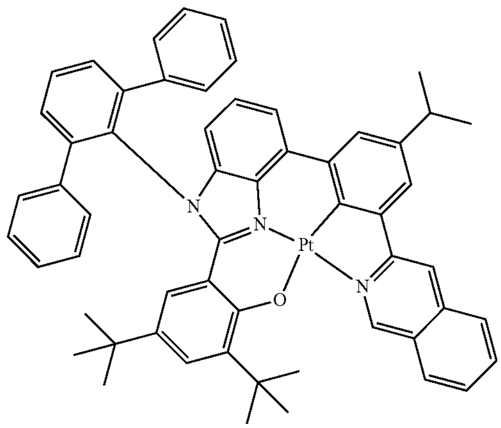
3-389
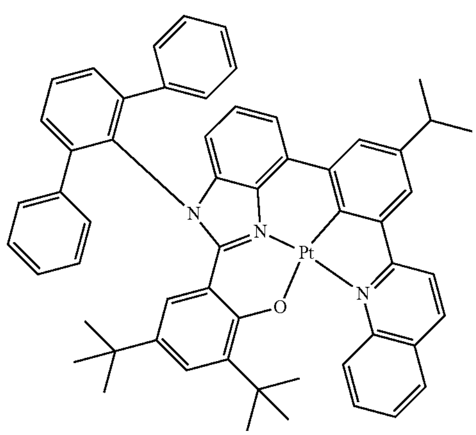
-continued
3-390
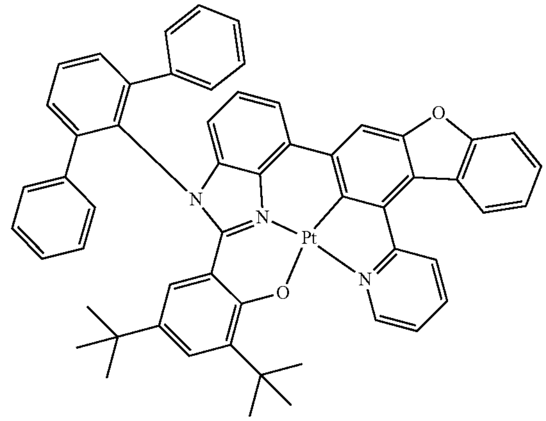
3-391
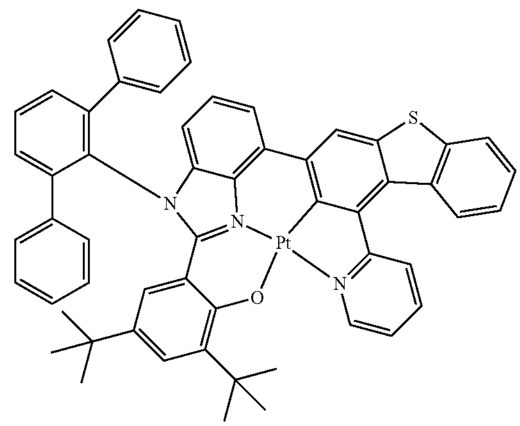
3-392
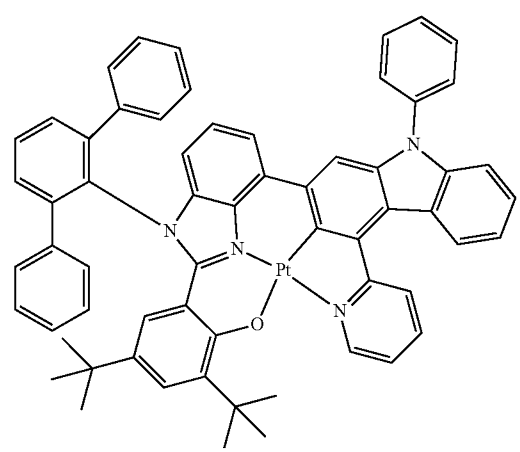

-continued
3-393
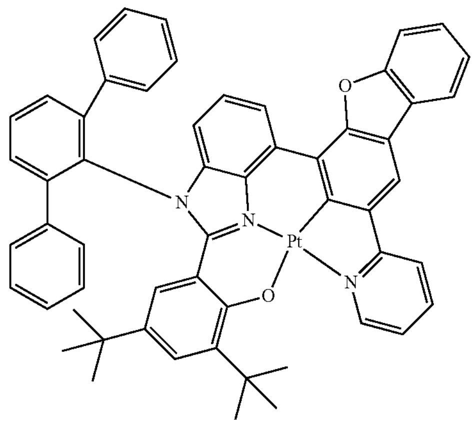
3-394
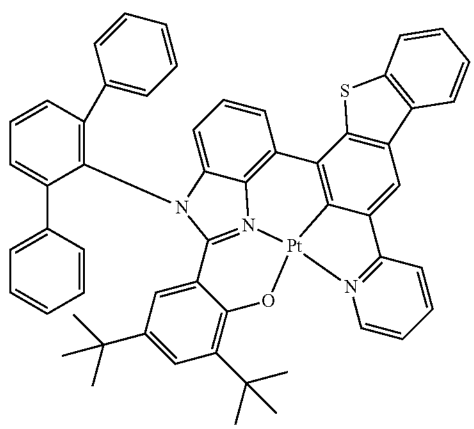
3-395
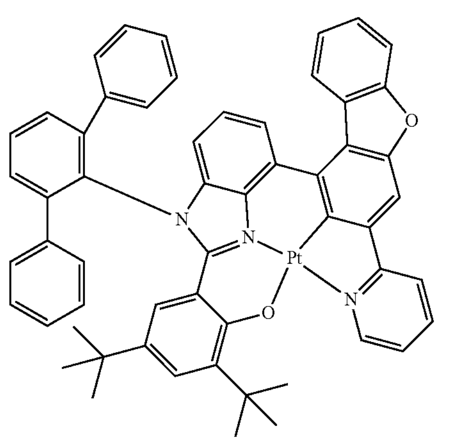
-continued
3-396
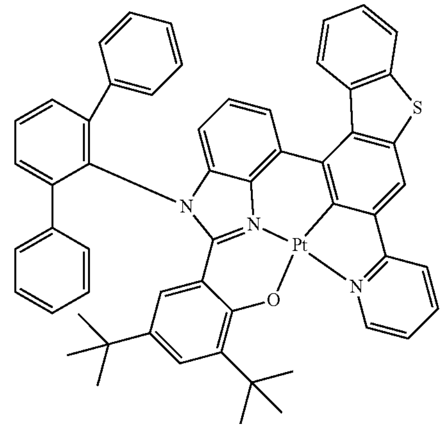
3-397
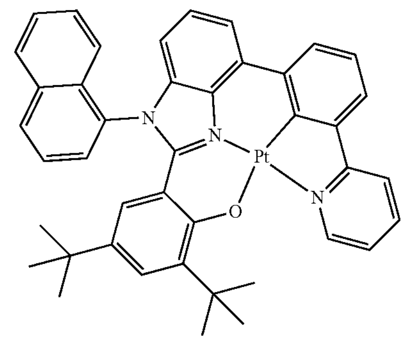
3-398
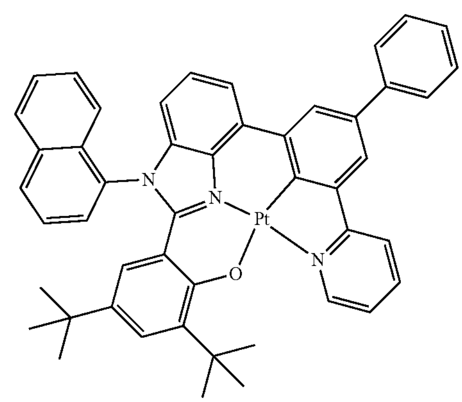
3-399
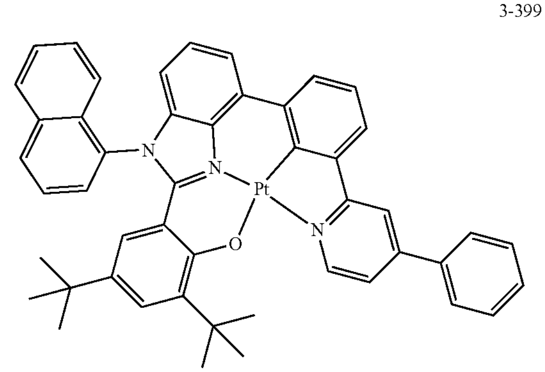

-continued
3-400
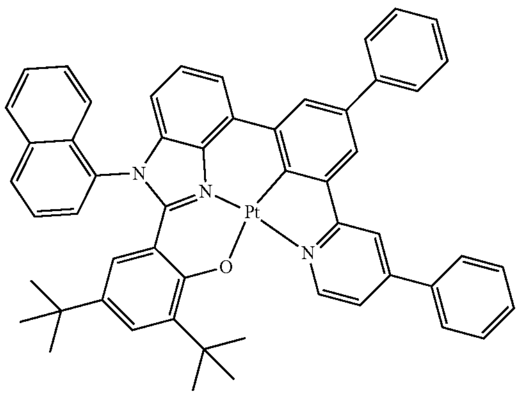
3-401
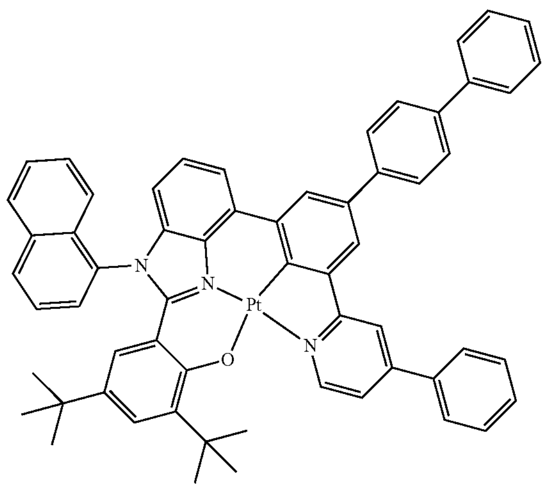
3-402
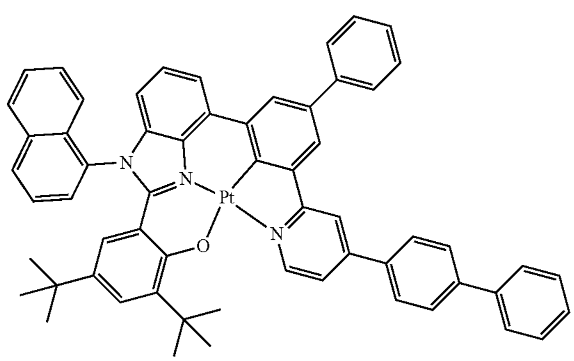
3-403
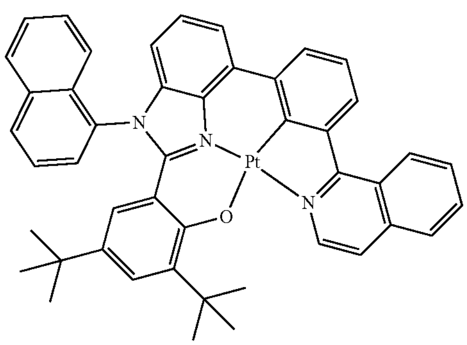
-continued
3-404
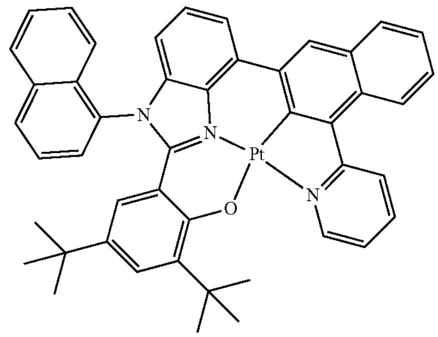
3-405
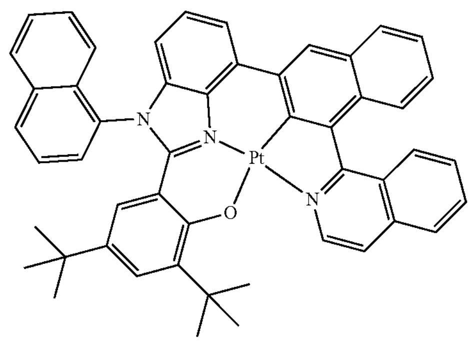
3-406
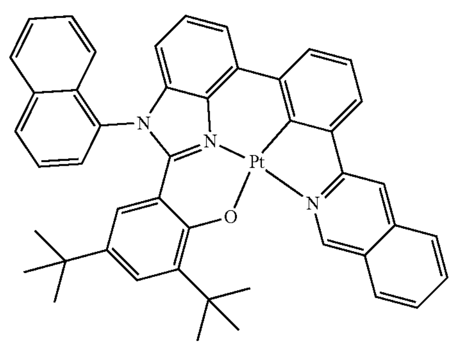
3-407
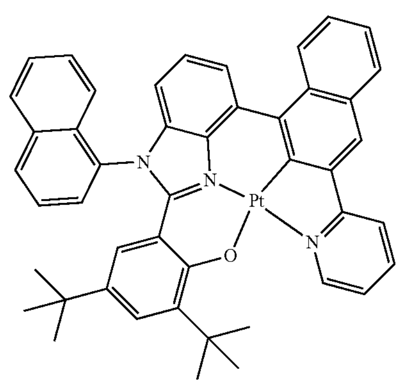

-continued
3-408
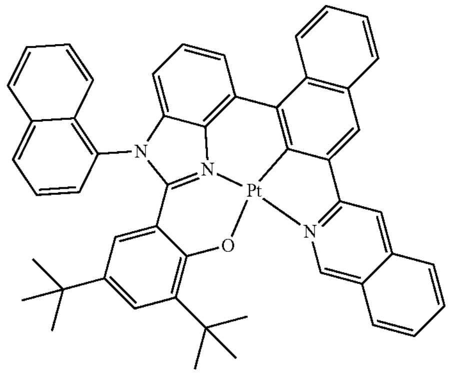
3-409
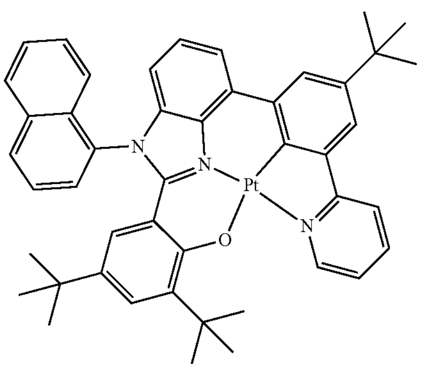
3-410
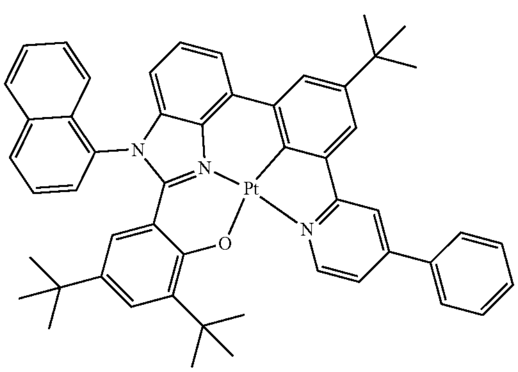
3-411
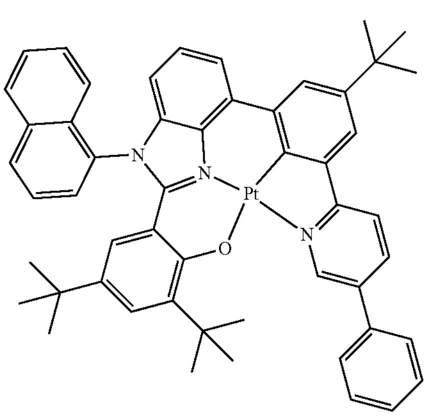
-continued
3-412
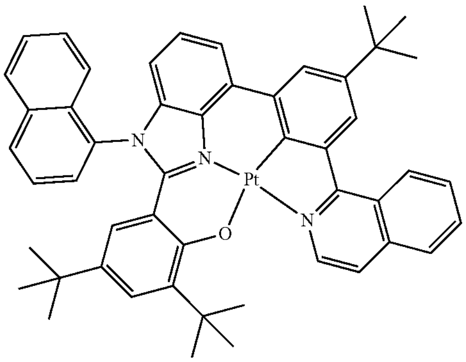
3-413
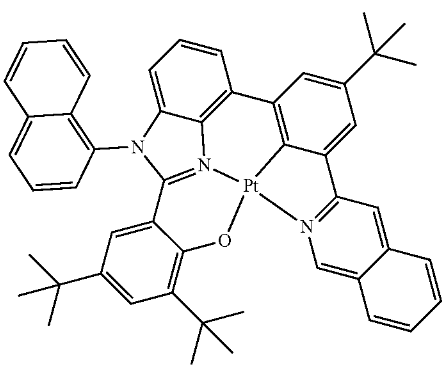
3-414
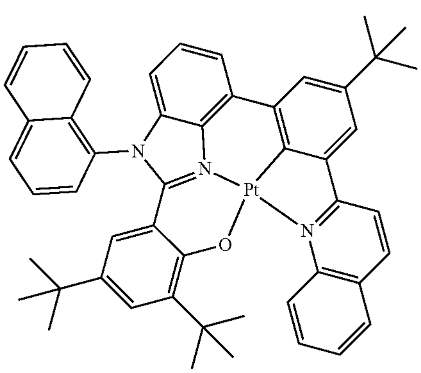
3-415
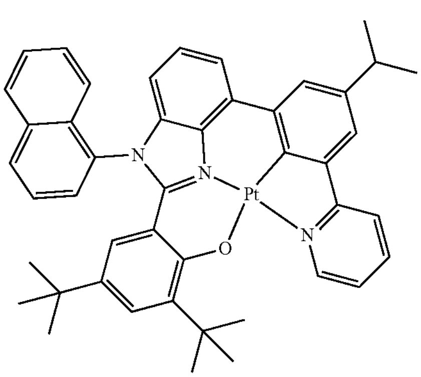

-continued
3-416
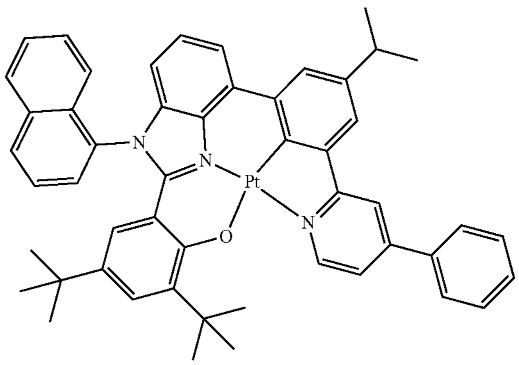
3-417
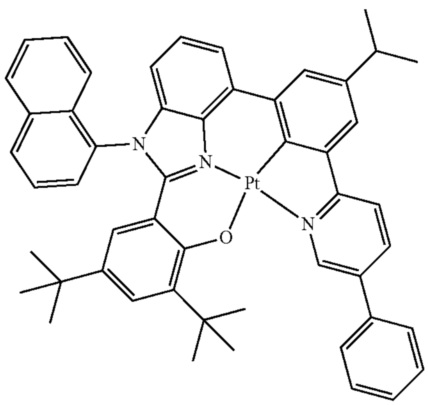
3-418
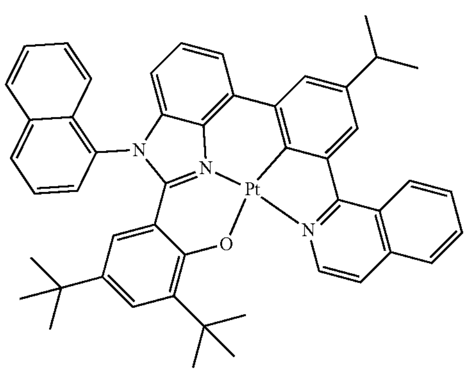
3-419
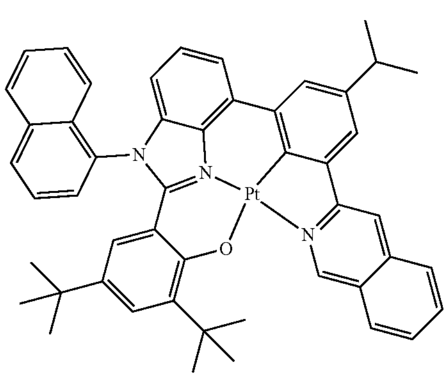
-continued
3-420
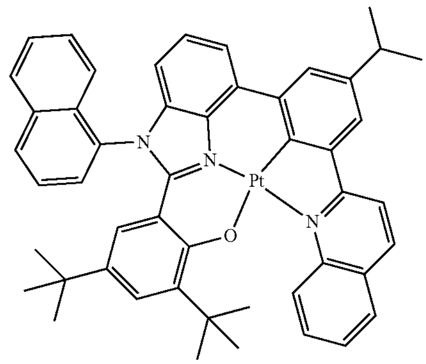
3-421
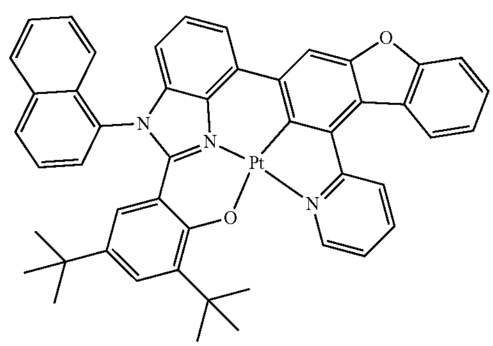
3-422
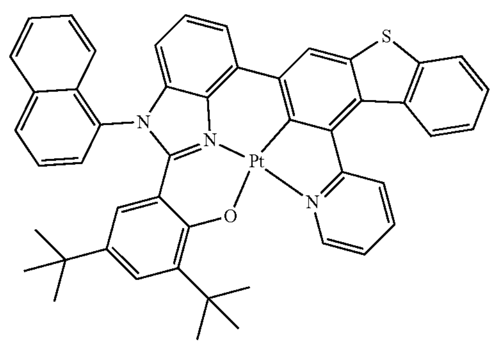
3-423
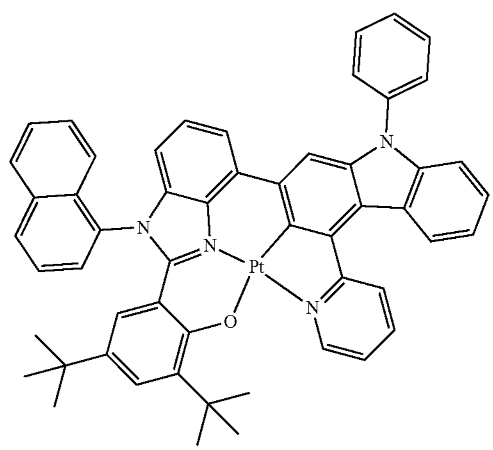

-continued
3-424
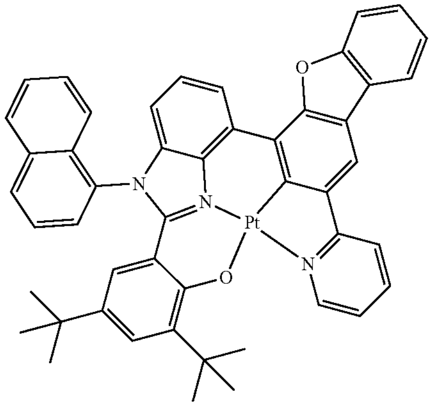
3-425
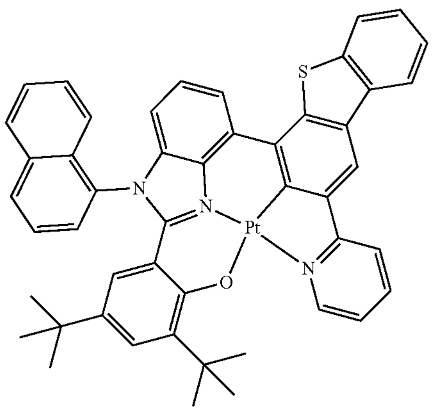
3-426
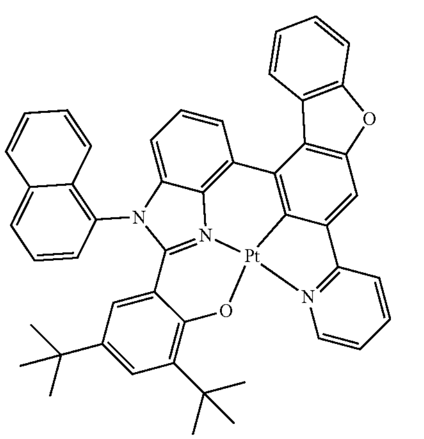
-continued
3-427
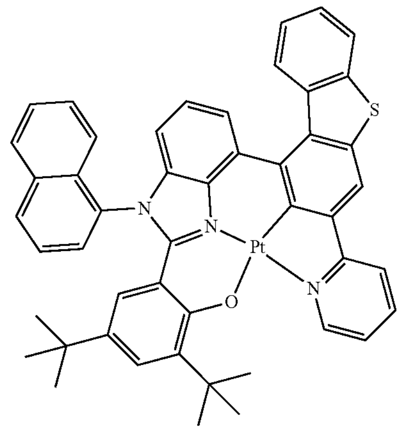
3-428
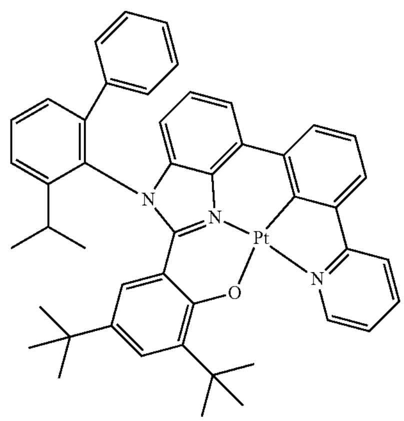
3-429
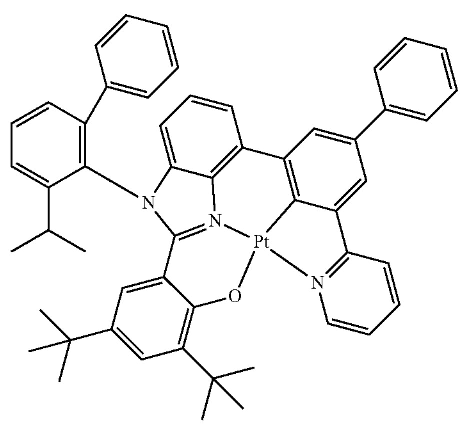

-continued
3-430
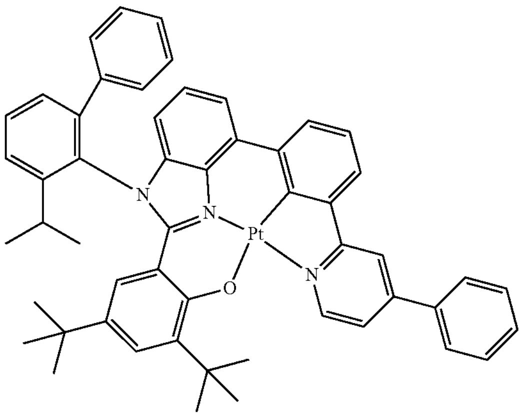
3-431
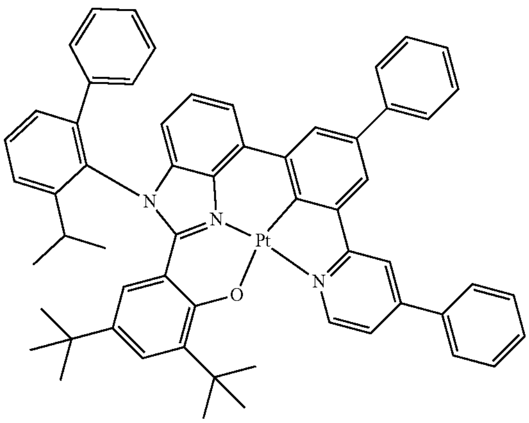
3-432
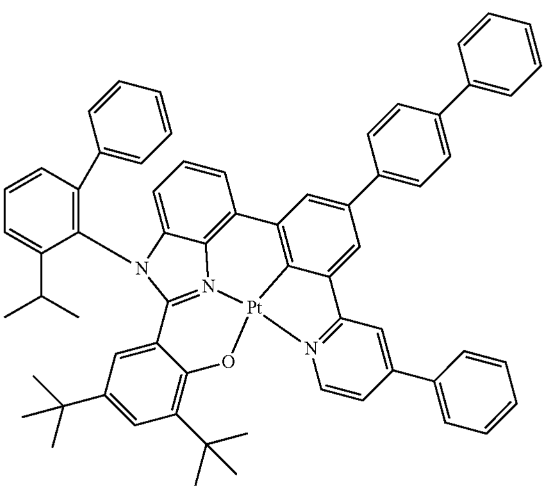
-continued
3-433
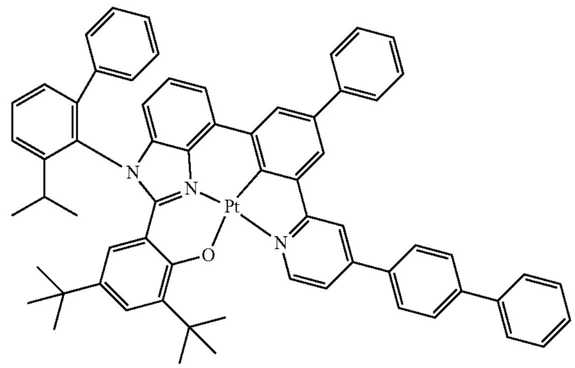
3-434
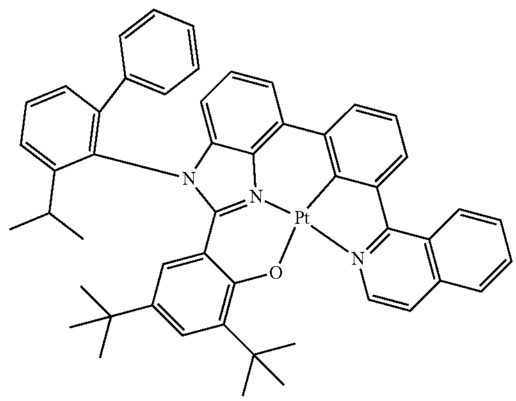
3-435
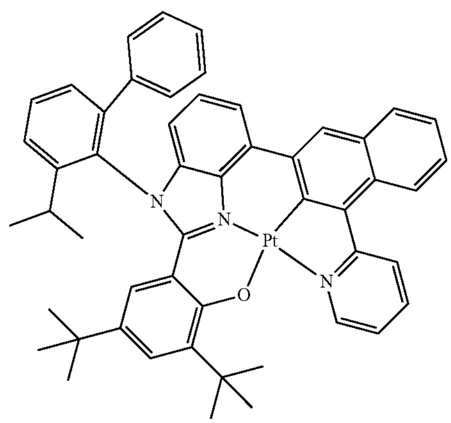
3-436
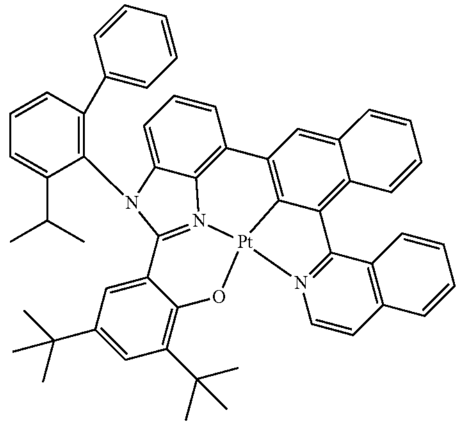

-continued
3-437
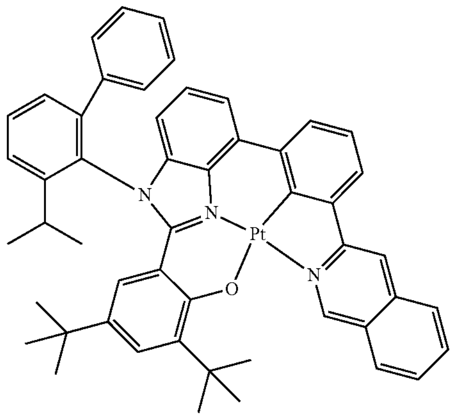
3-438
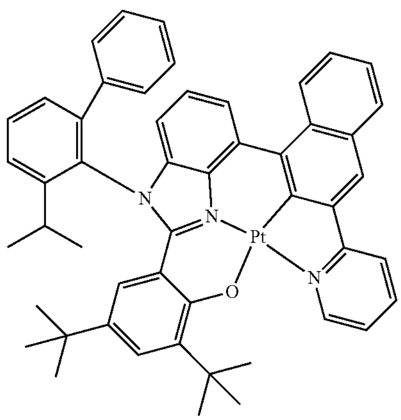
3-439
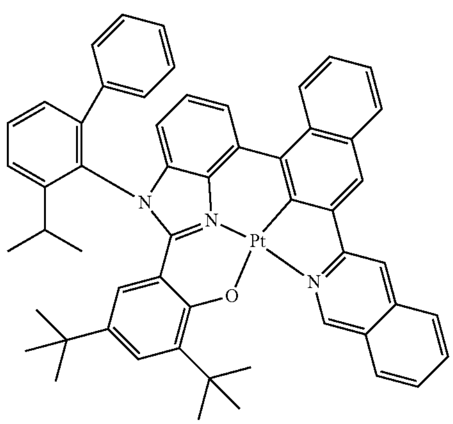
-continued
3-440
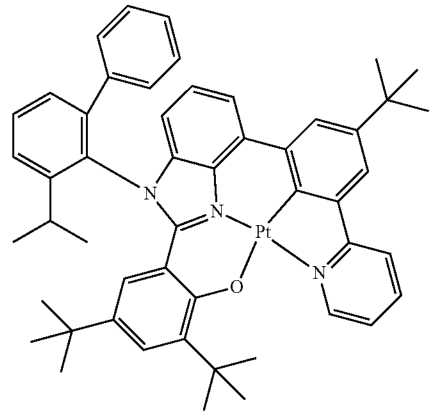
3-441
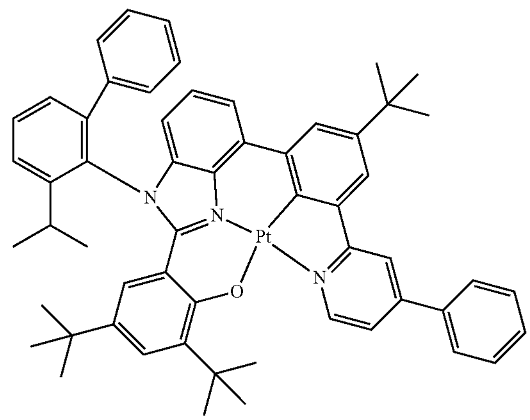
3-442
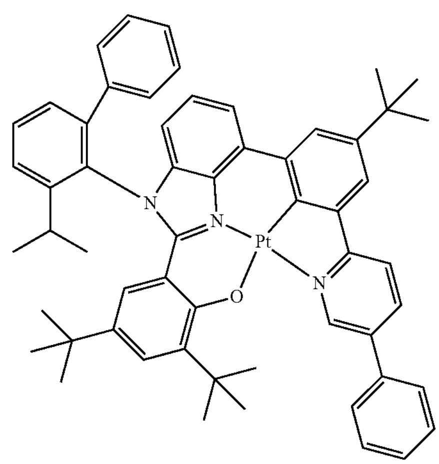

-continued
3-443
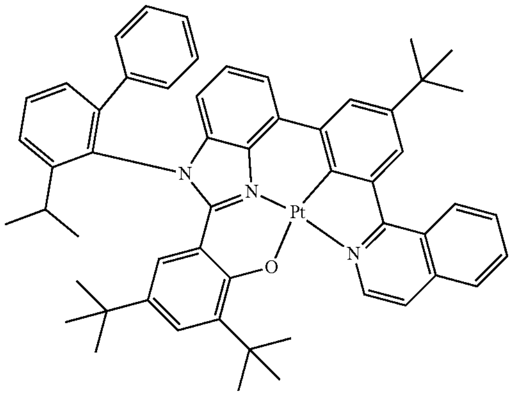
3-444
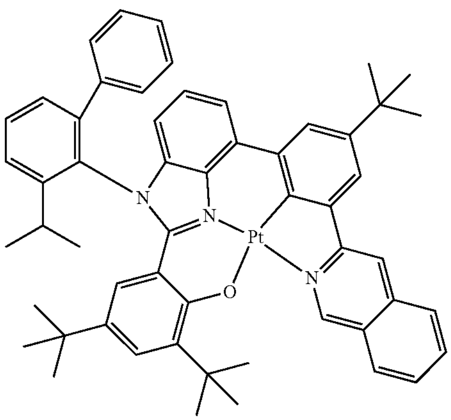
3-445
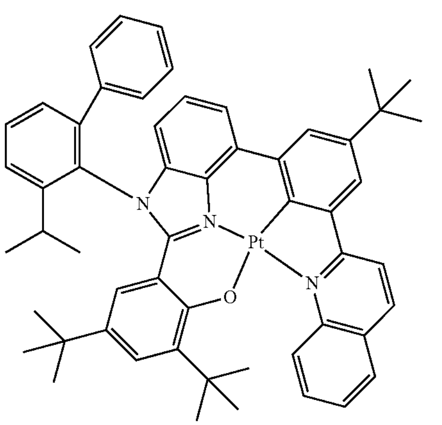
-continued
3-446
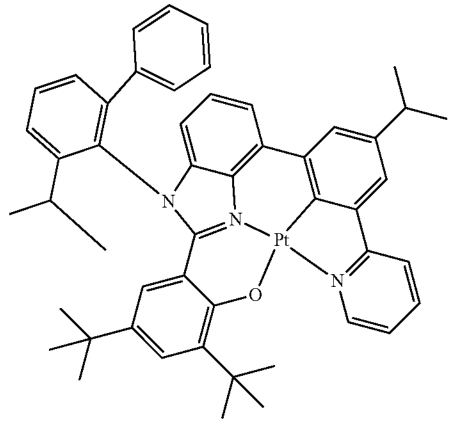
3-447
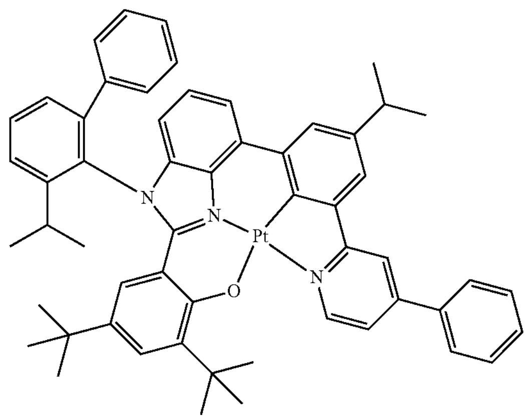
3-448
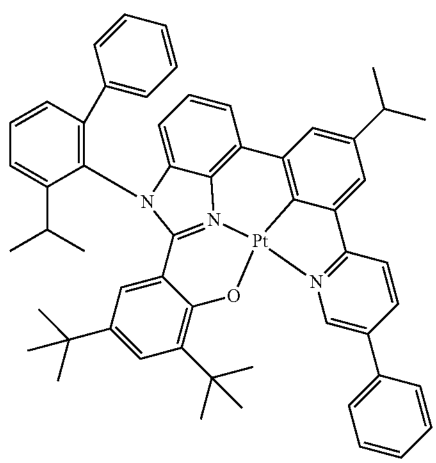

-continued
3-449
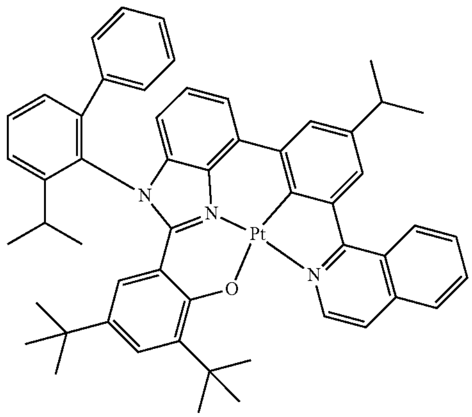
3-450
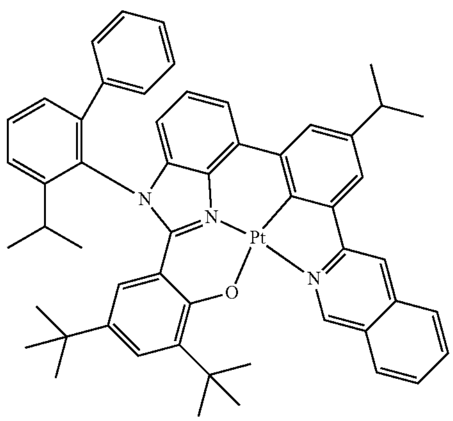
3-451
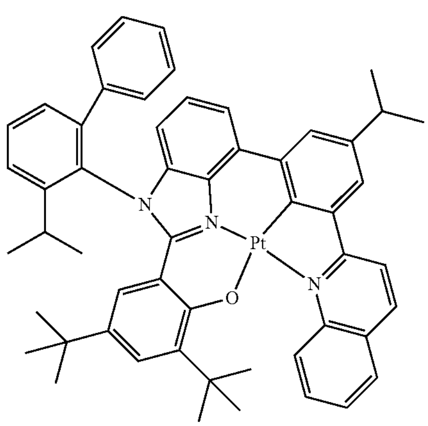
-continued
3-452
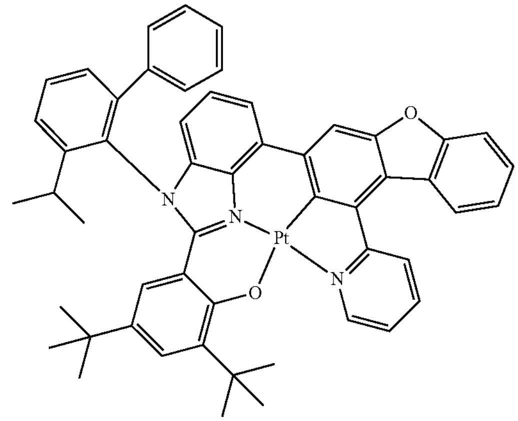
3-453
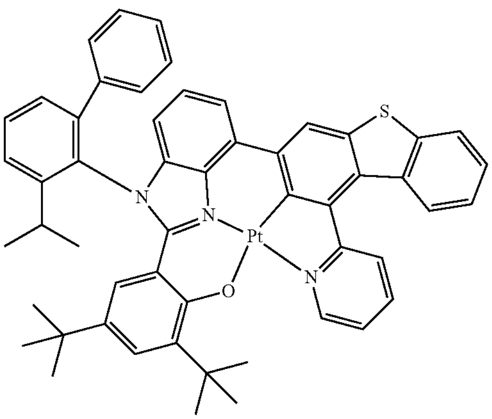
3-454
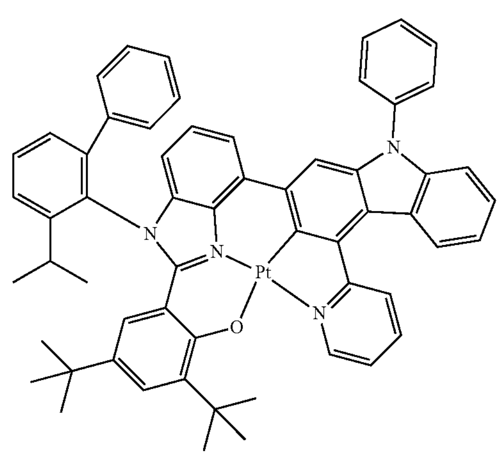

-continued
3-455
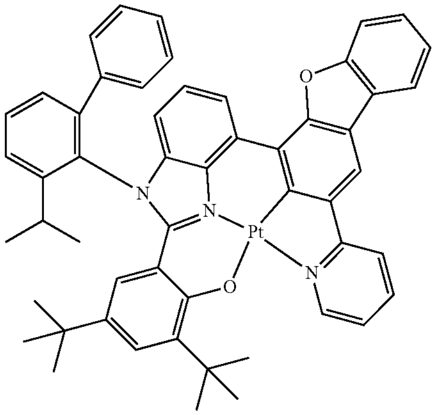
3-456
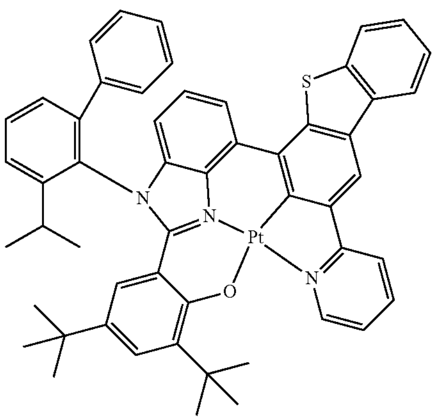
3-457
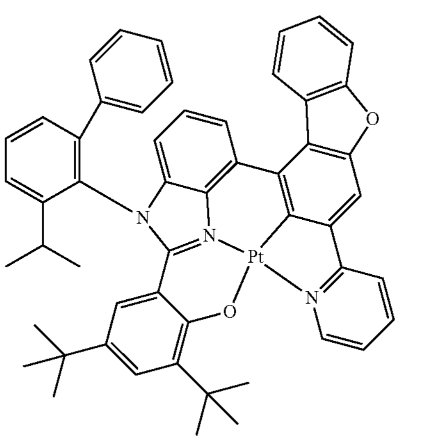
-continued
3-458
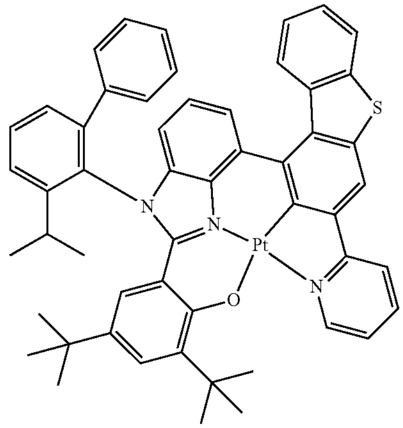
3-459
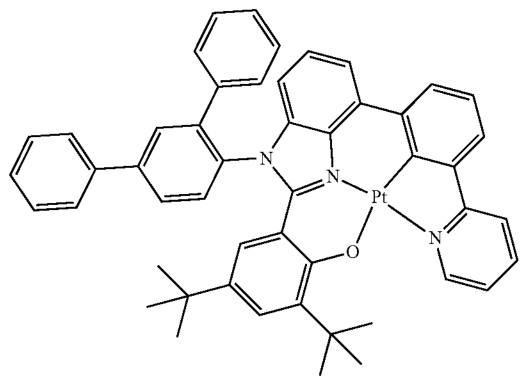
3-460
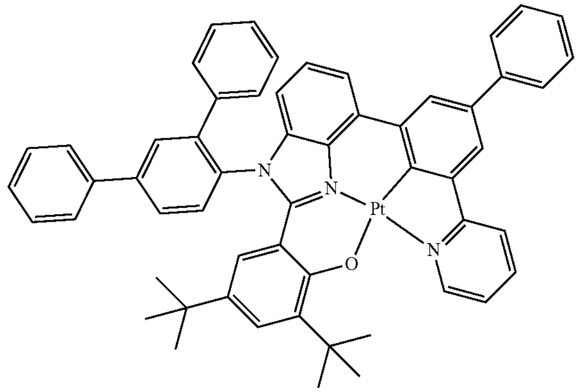
3-461
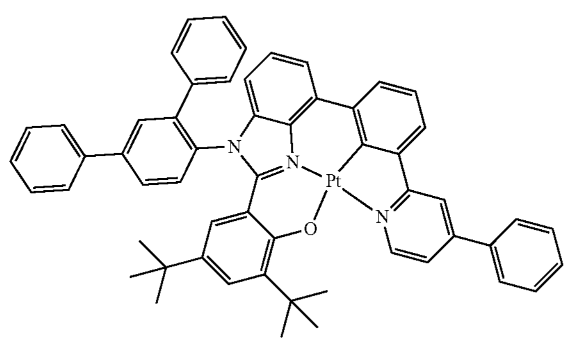

-continued
3-462
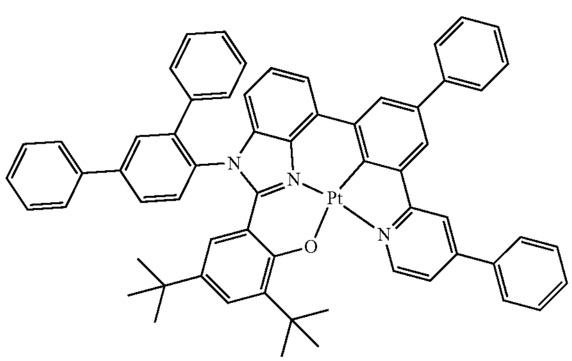
3-463
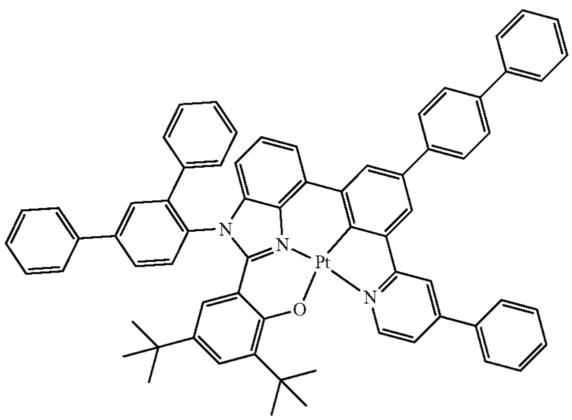
3-464
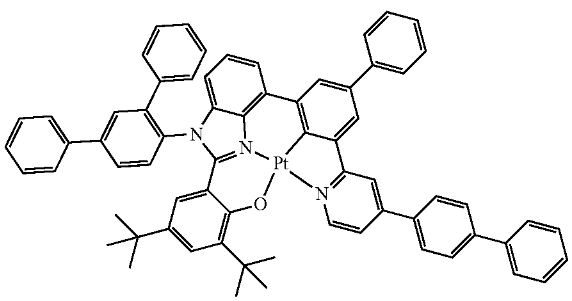
3-465
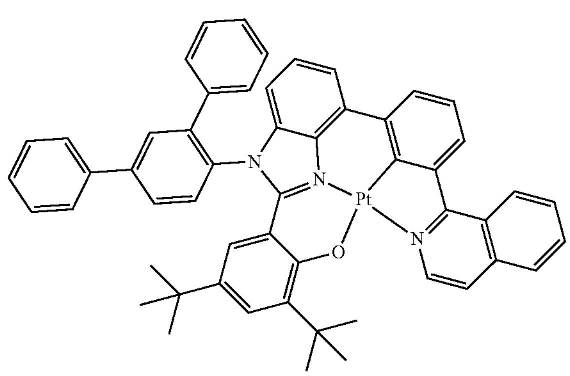
-continued
3-466
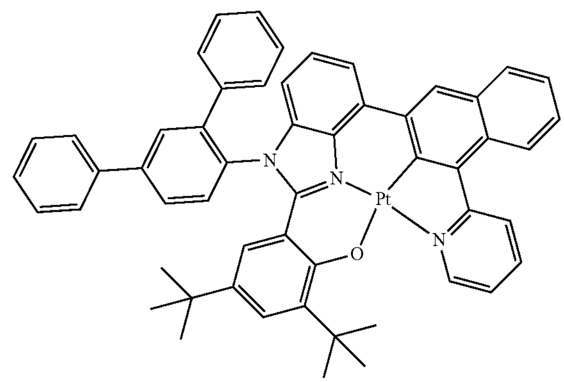
3-467
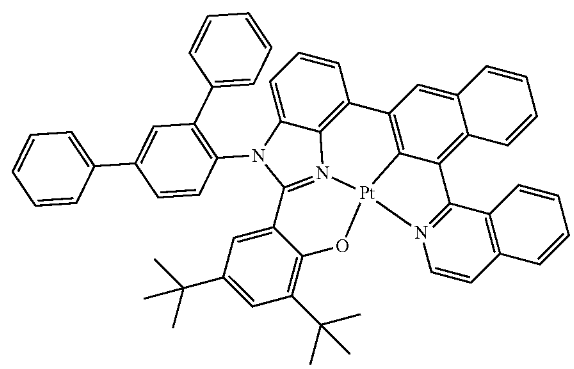
3-468
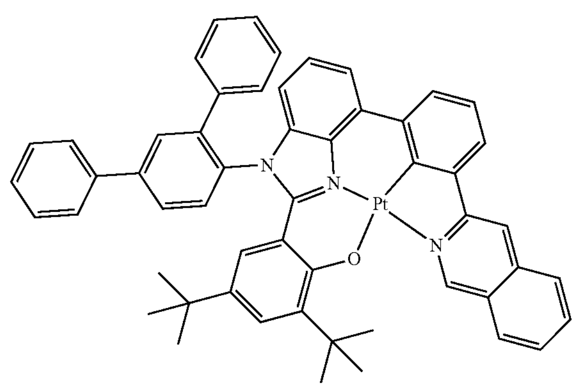
3-469
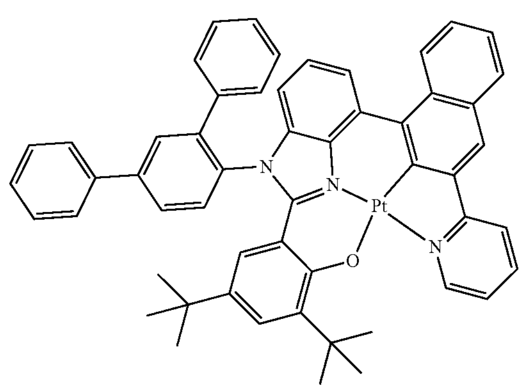

-continued
3-470
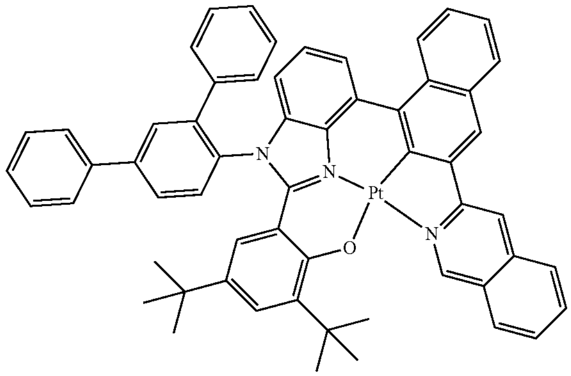
3-471
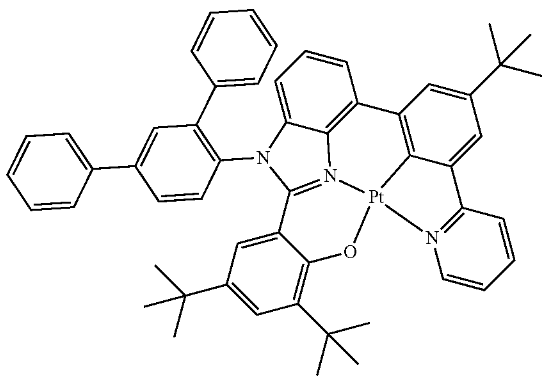
3-472
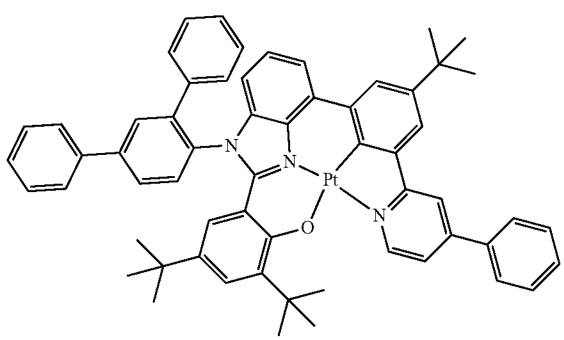
3-473
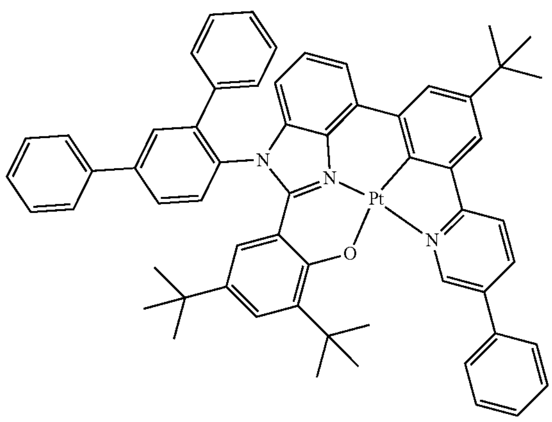
-continued
3-474
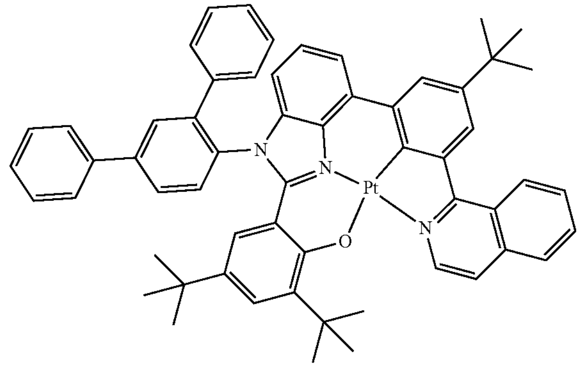
3-475
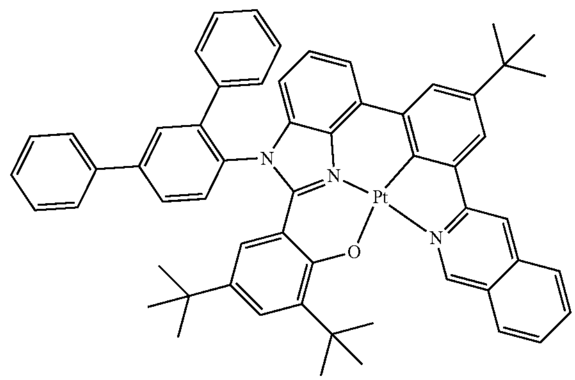
3-476
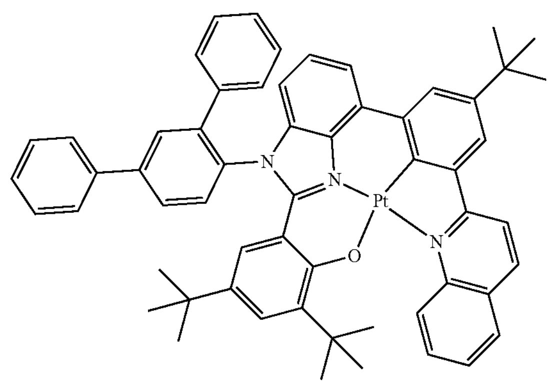
3-477
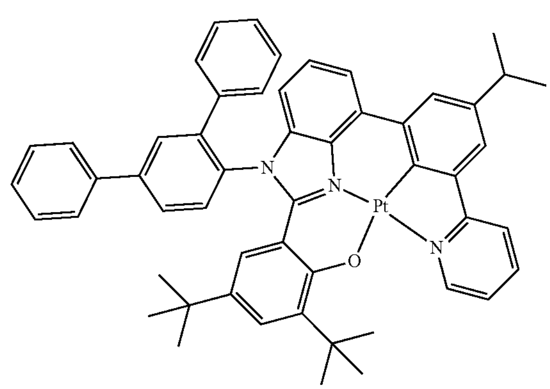

-continued
3-478
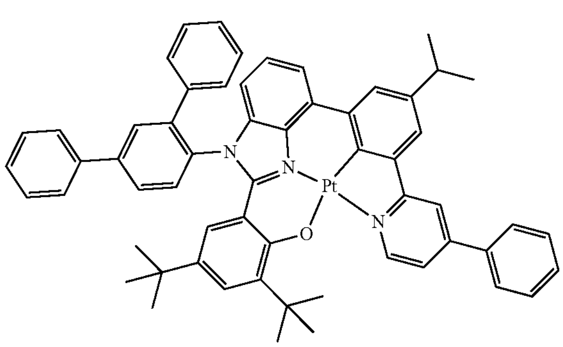
3-479
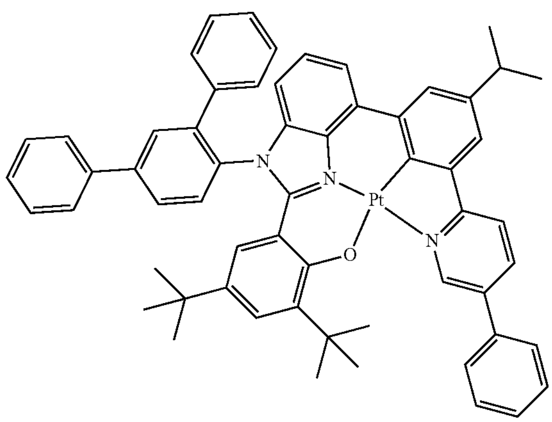
3-480
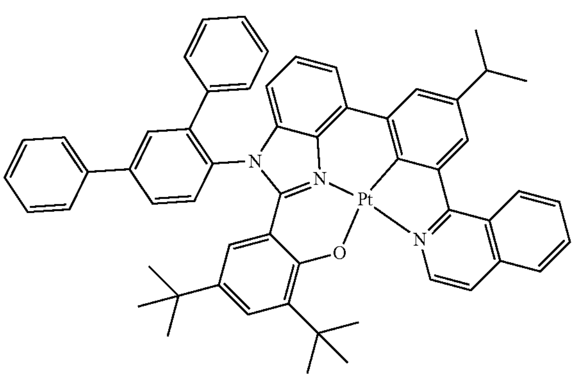
3-481
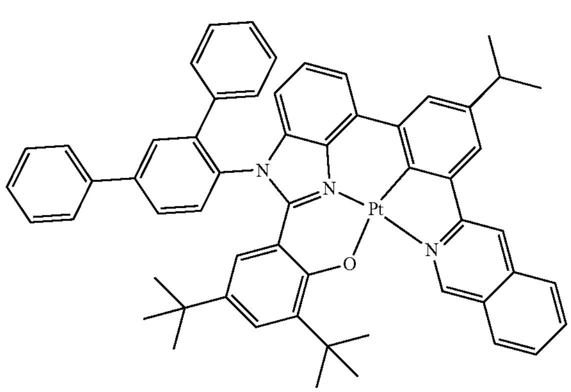
-continued
3-482
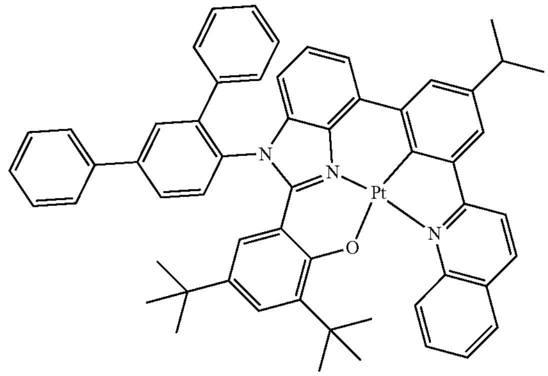
3-483
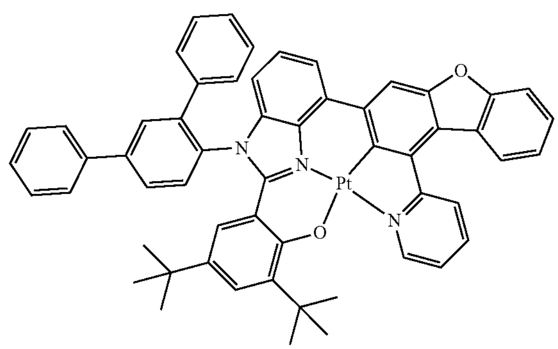
3-484
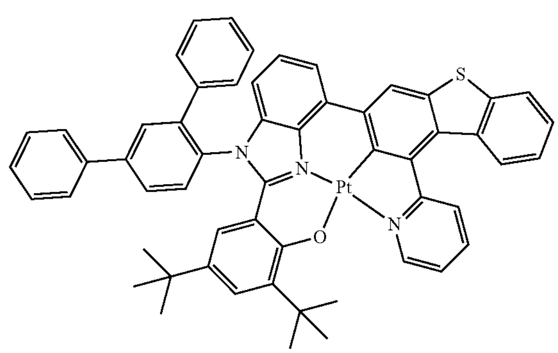
3-485
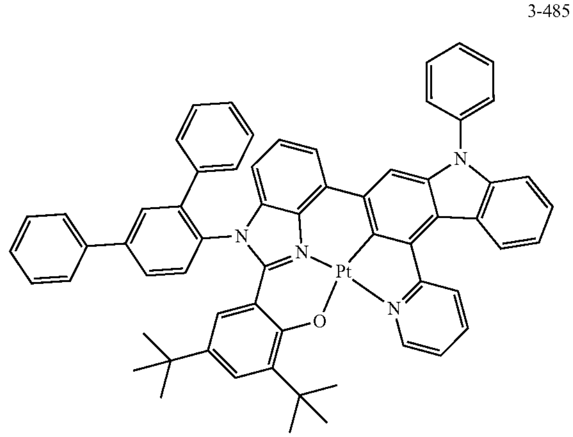

-continued
3-486
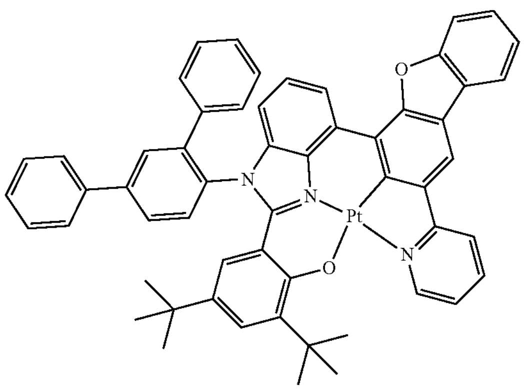
3-487
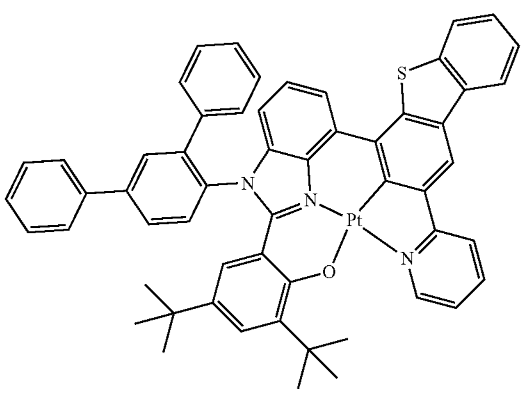
3-488
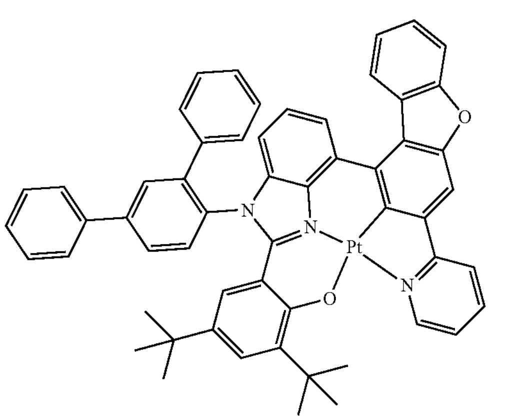
-continued
3-489
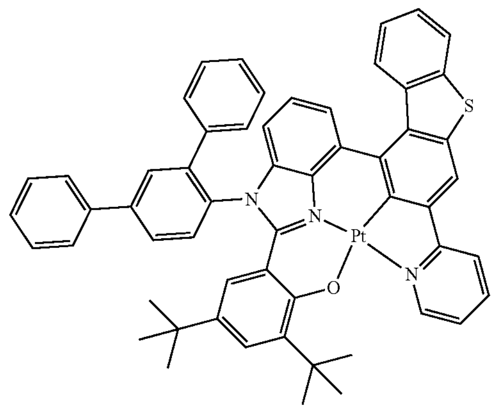
3-490
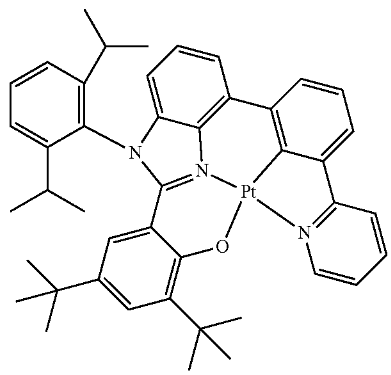
3-491
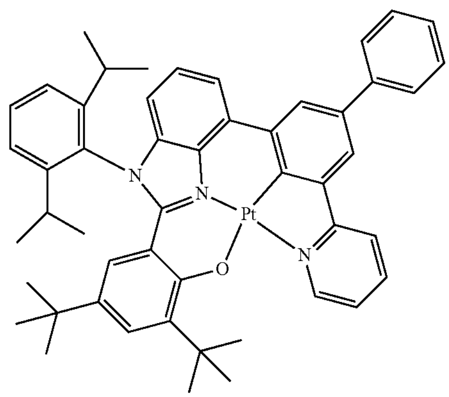
3-492
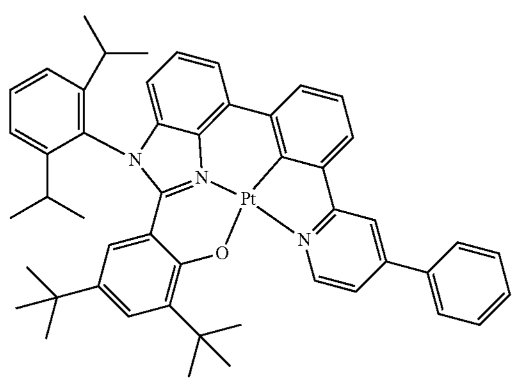

-continued
3-493
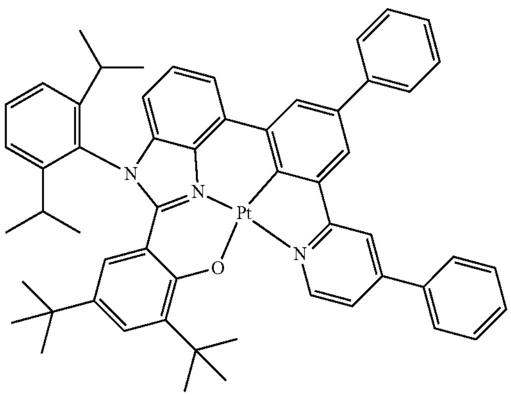
3-494
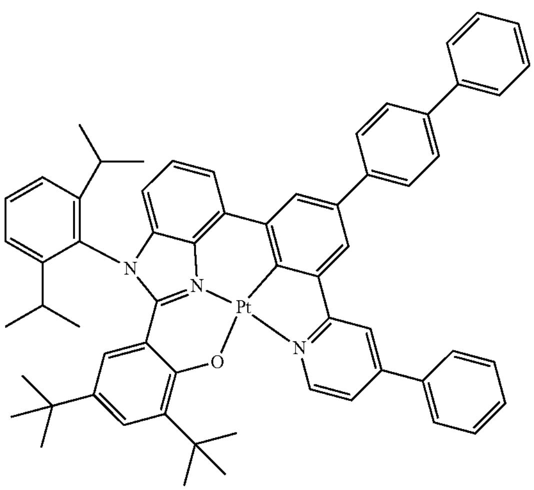
3-495
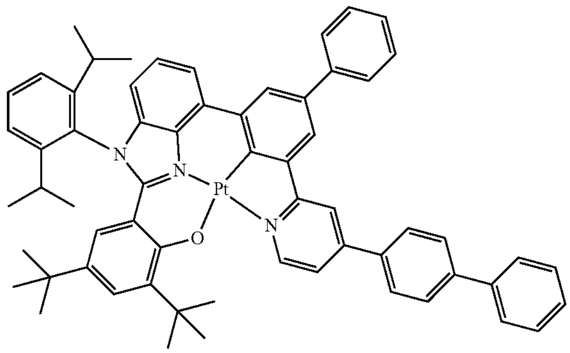
-continued
3-496
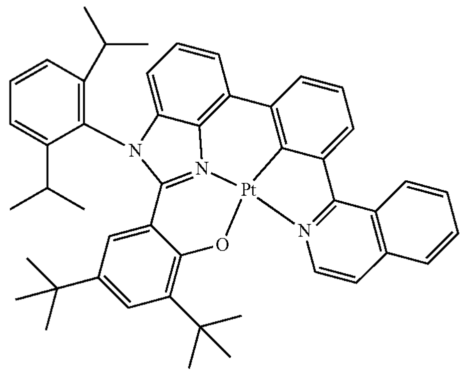
3-497
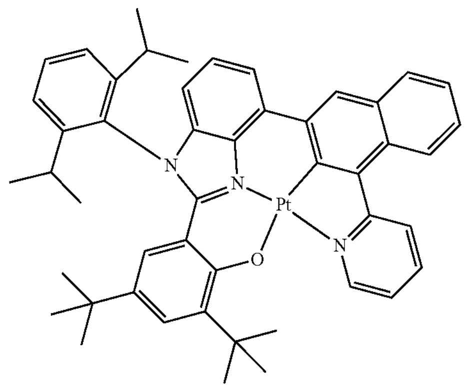
3-498
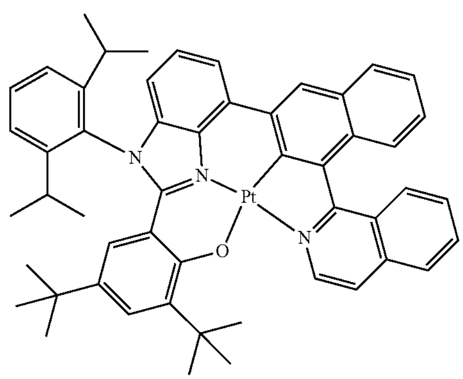
3-499
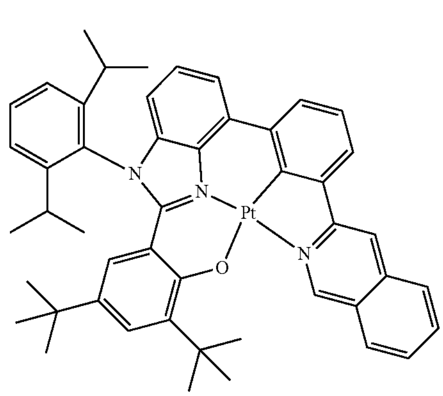

-continued
3-500
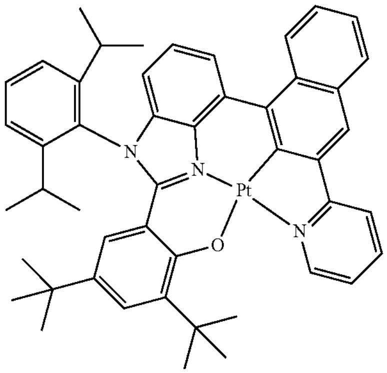
3-501
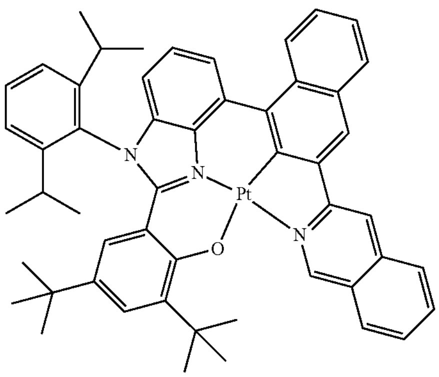
3-502
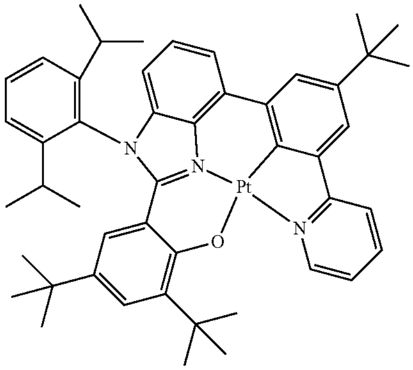
3-503
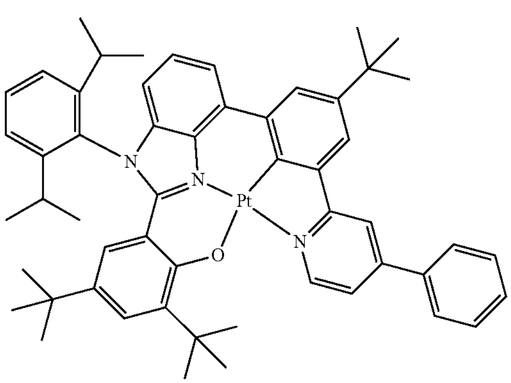
-continued
3-504
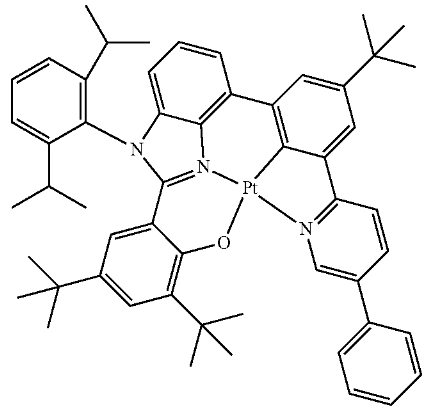
3-505
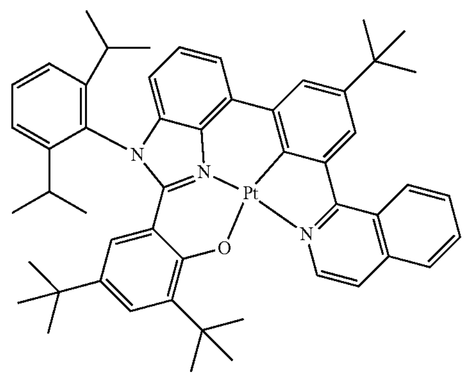
3-506
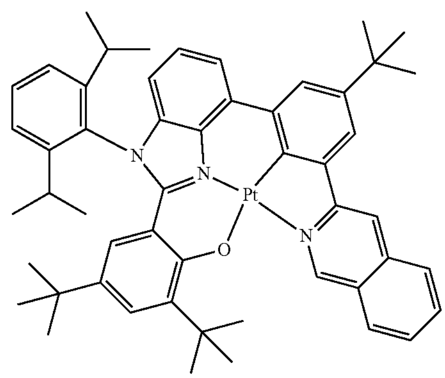
3-507
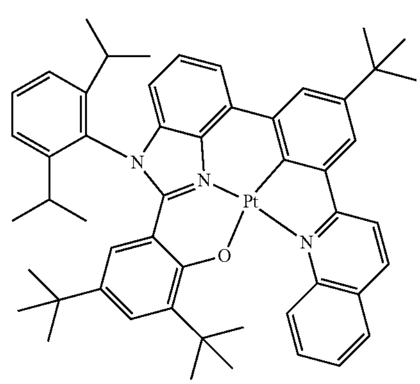

-continued
3-508
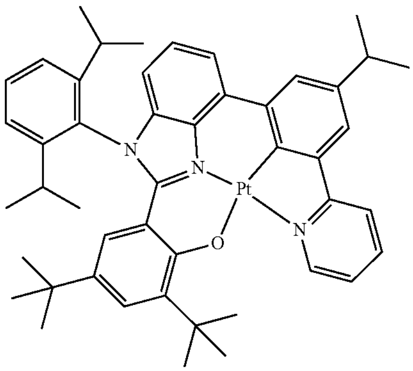
3-509
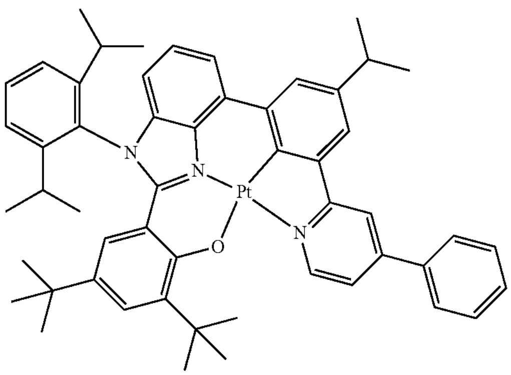
3-510
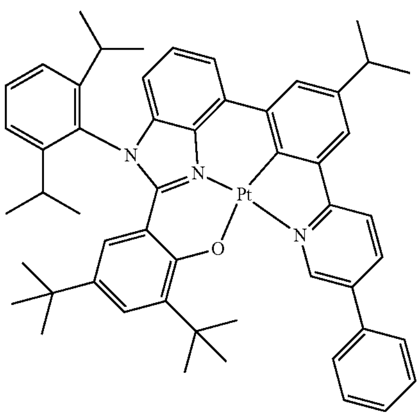
3-511
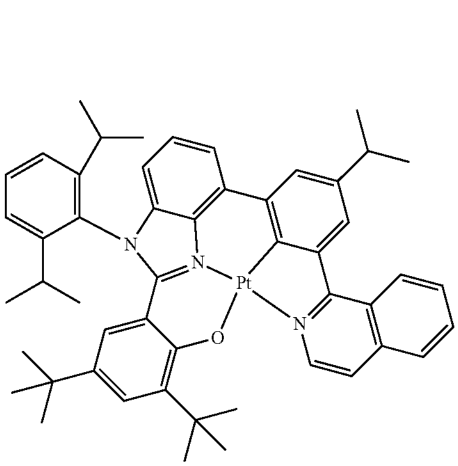
-continued
3-512
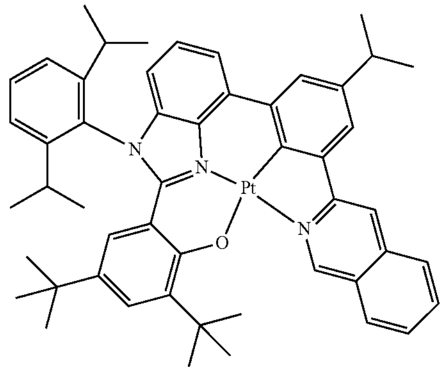
3-513
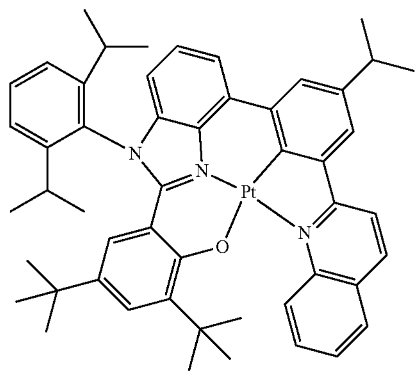
3-514
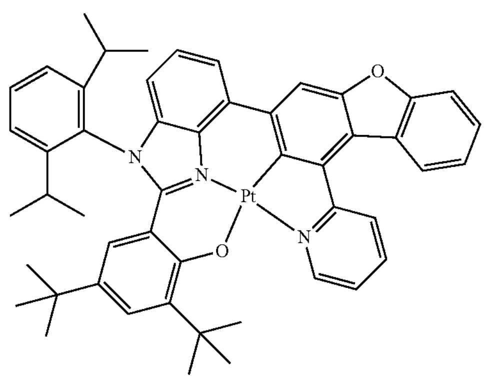
3-515
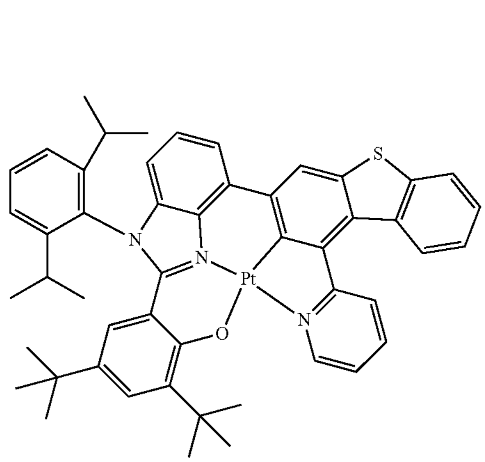

-continued
3-516
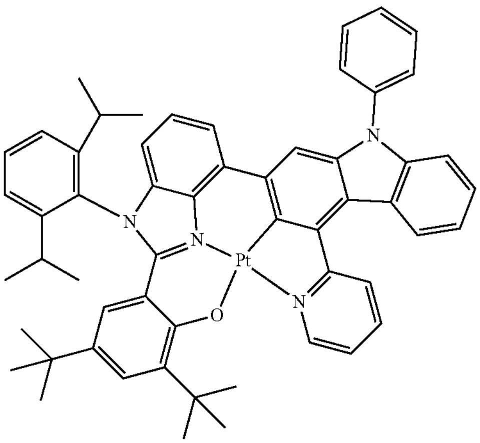
3-517
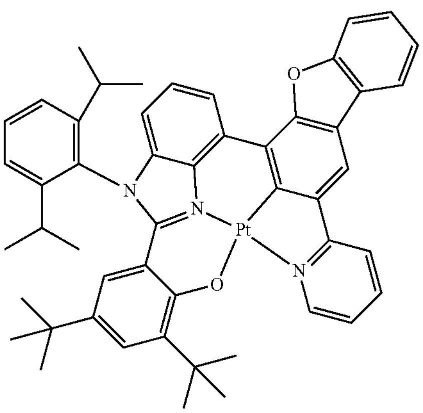
3-518
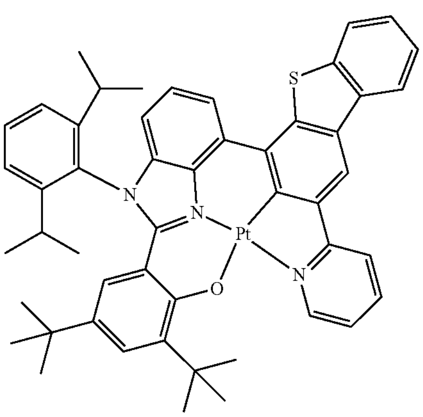
-continued
3-519
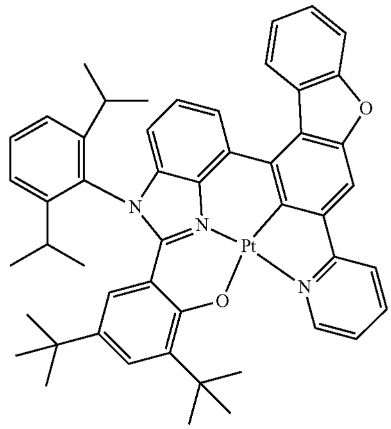
3-520
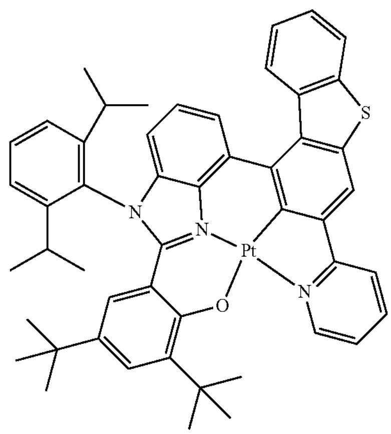
3-521
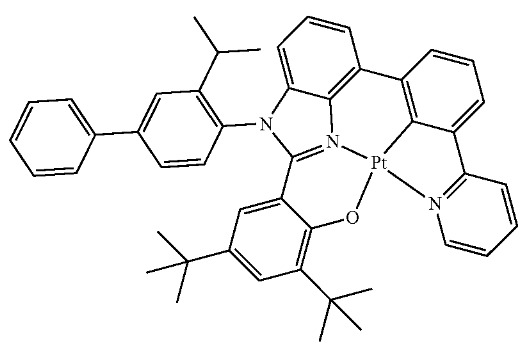
3-522
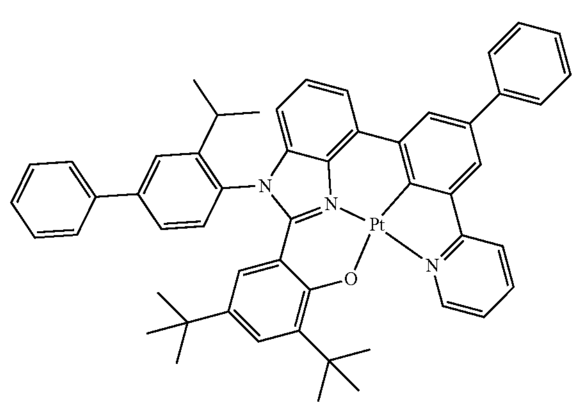

-continued
3-523
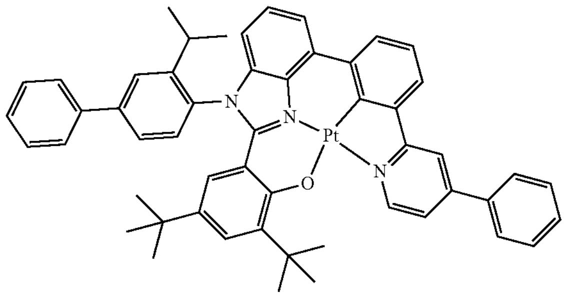
3-524
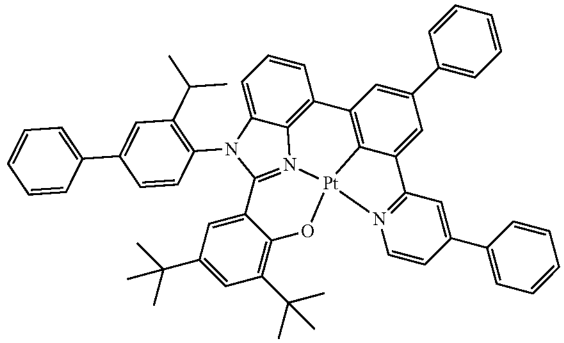
3-525
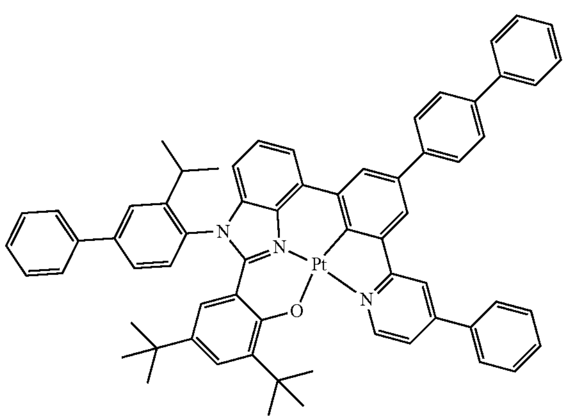
3-526
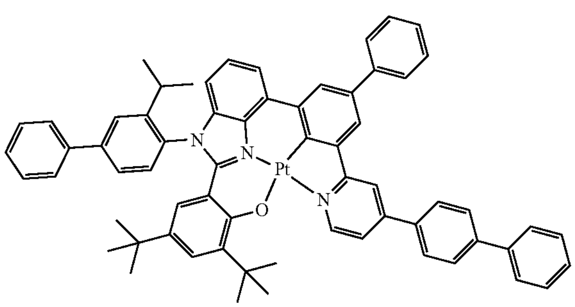
-continued
3-527
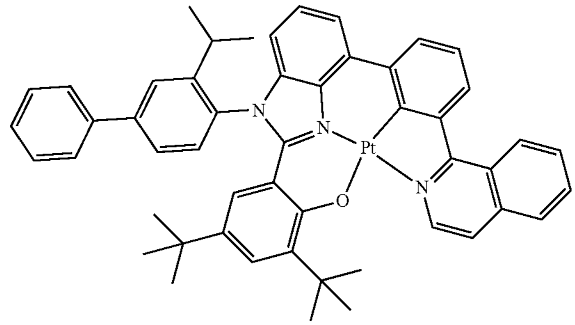
3-528
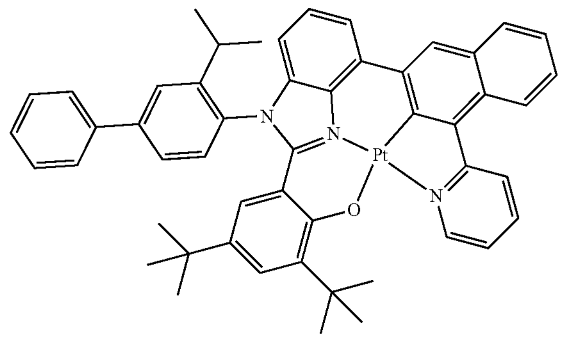
3-529
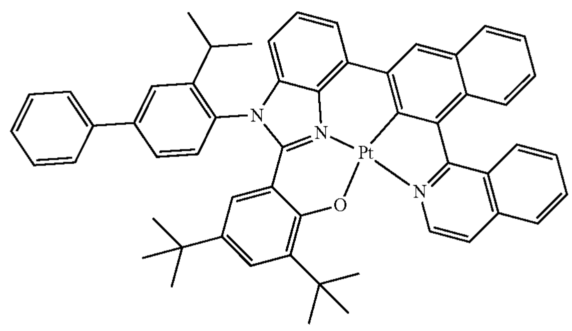
3-530
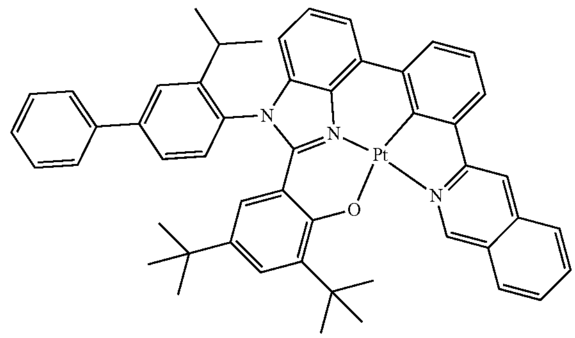

-continued
3-531
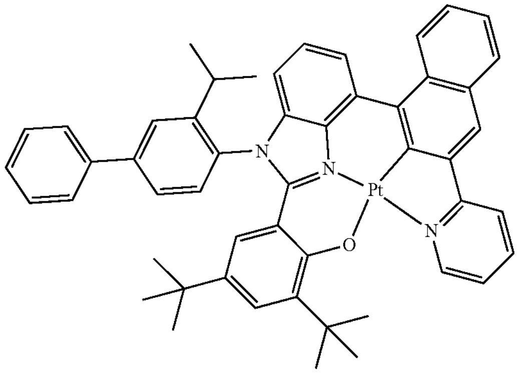
3-532
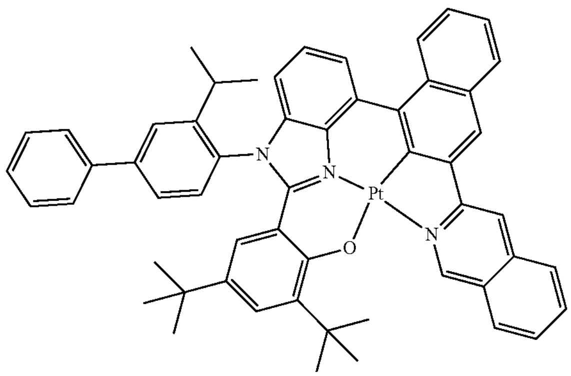
3-533
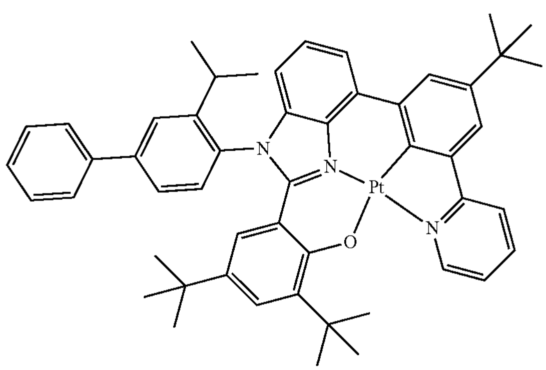
3-534
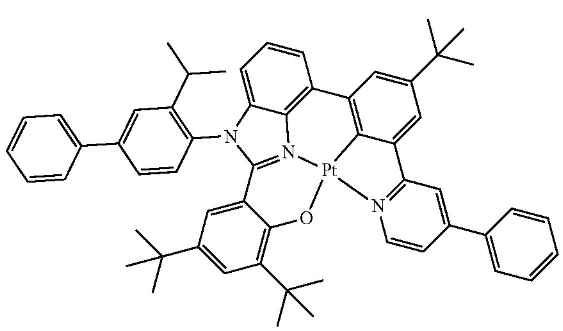
-continued
3-535
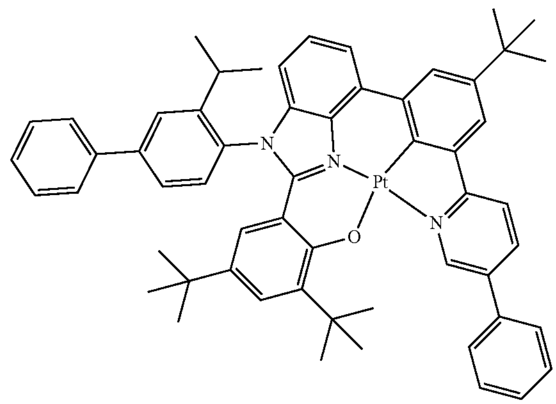
3-536
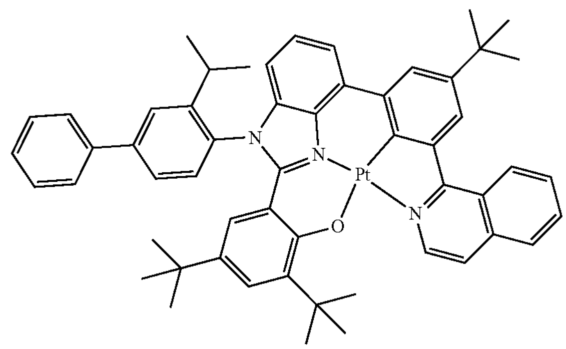
3-537
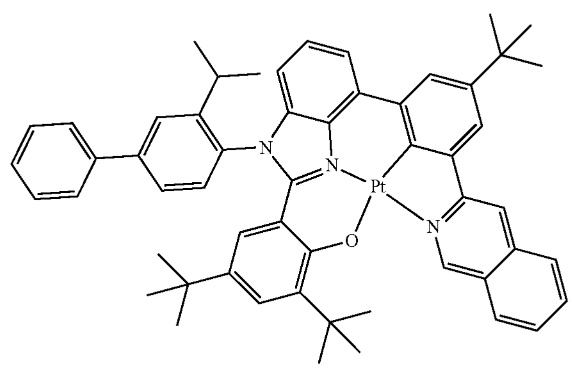
3-538
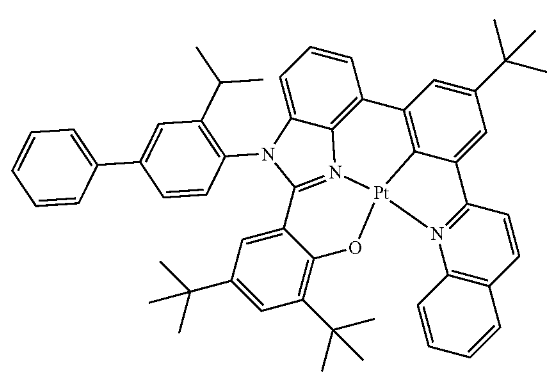

3-539
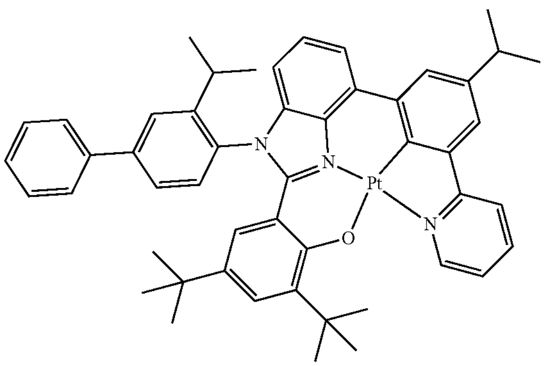
3-540
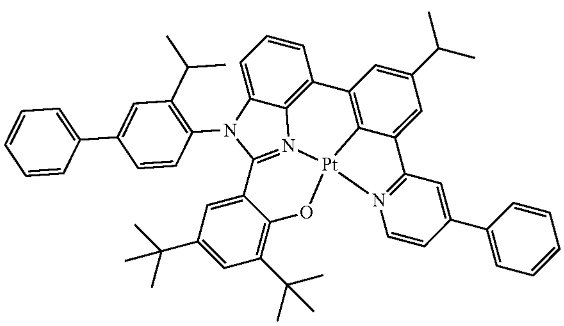
3-541
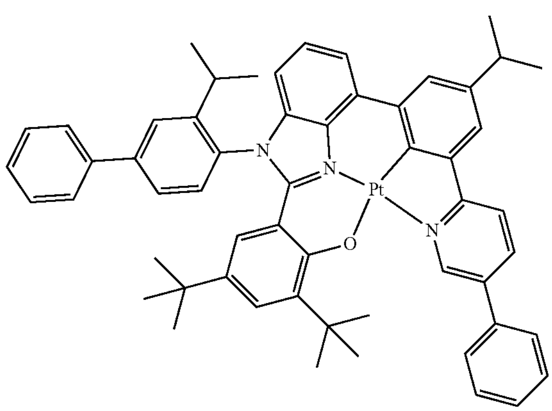
3-542
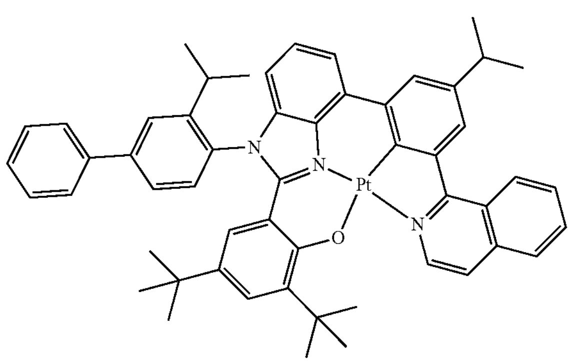
3-543
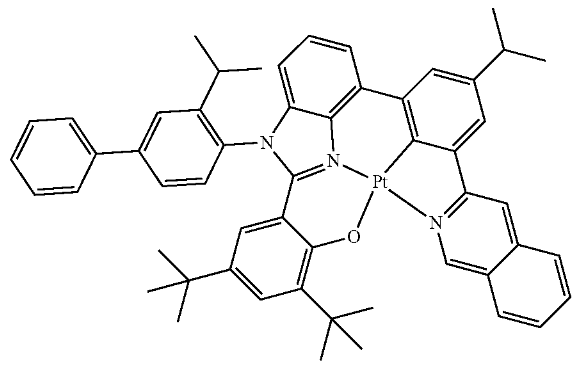
3-544
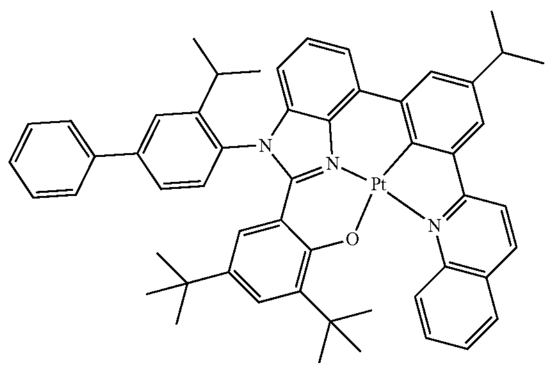
3-545
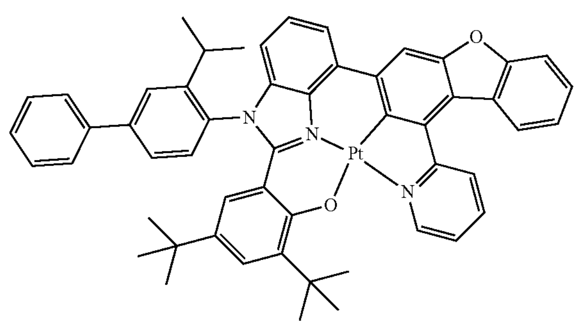
3-546
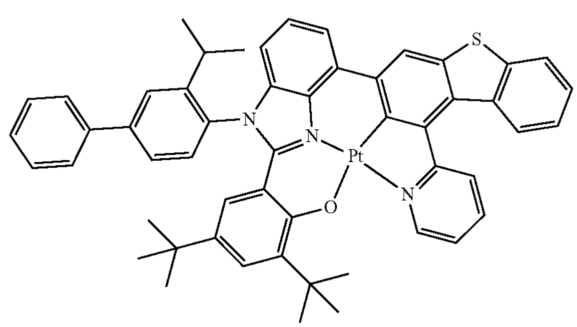

-continued
3-547
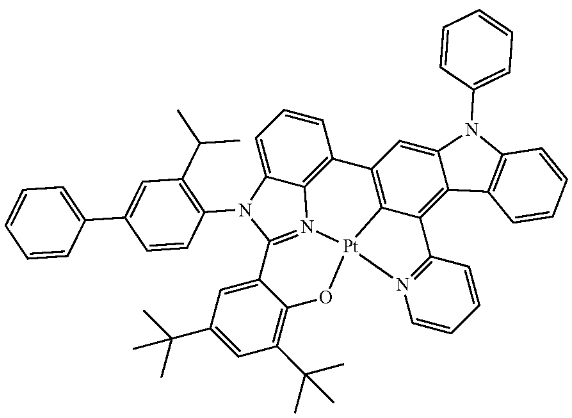
3-548
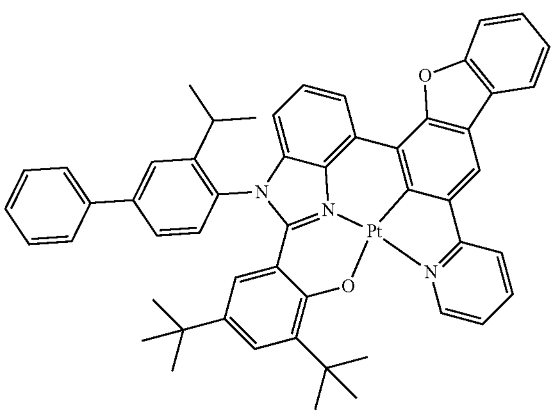
3-549
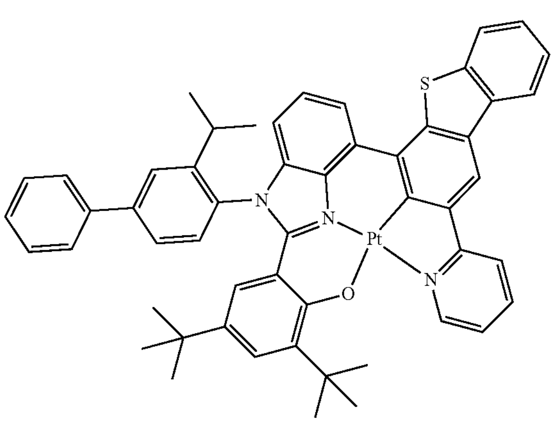
-continued
3-550
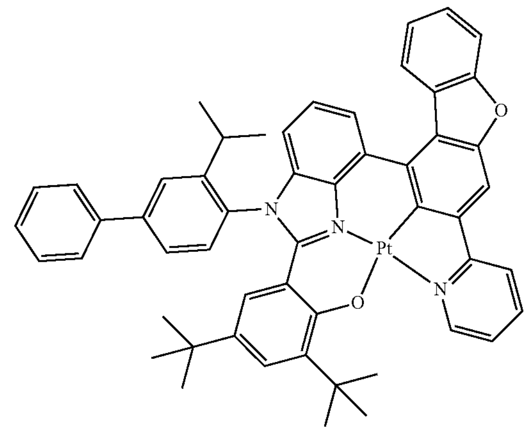
3-551
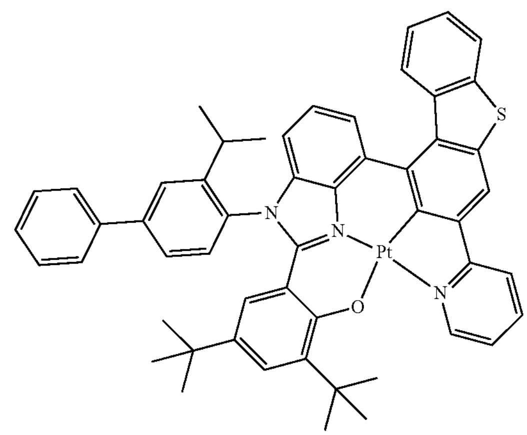
3-552
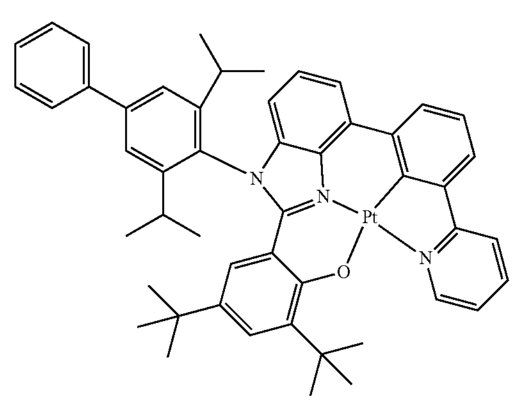

-continued
3-553
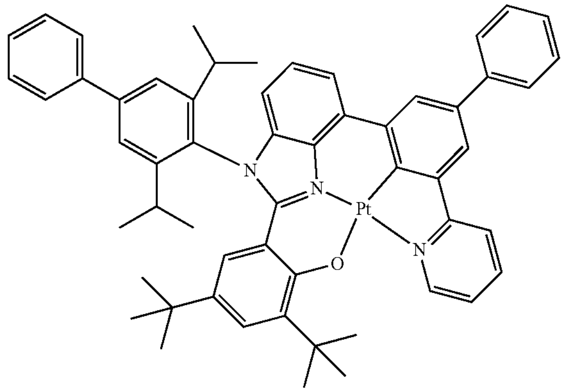
3-554
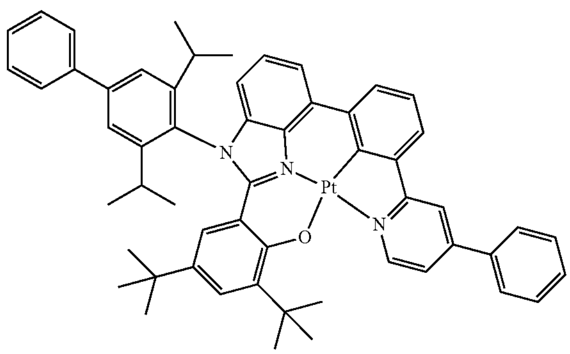
3-555
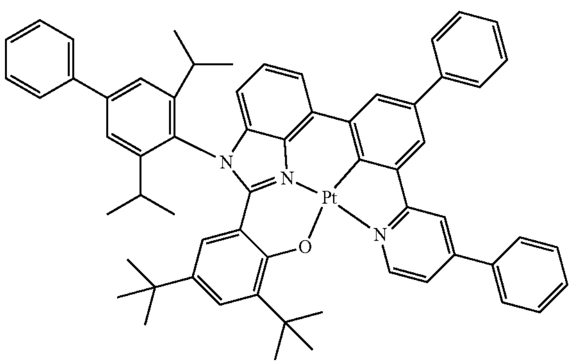
3-556
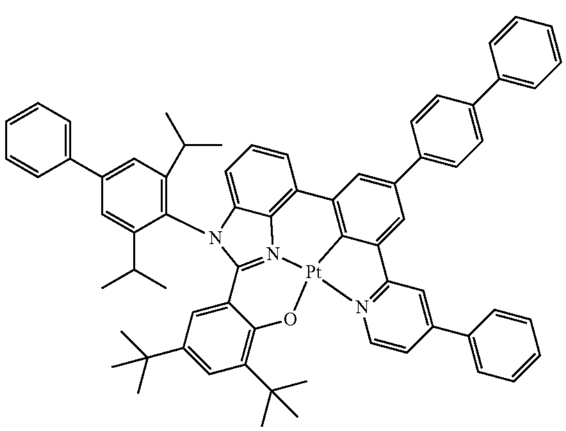
-continued
3-557
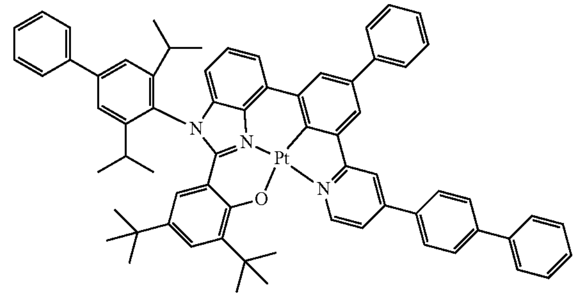
3-558
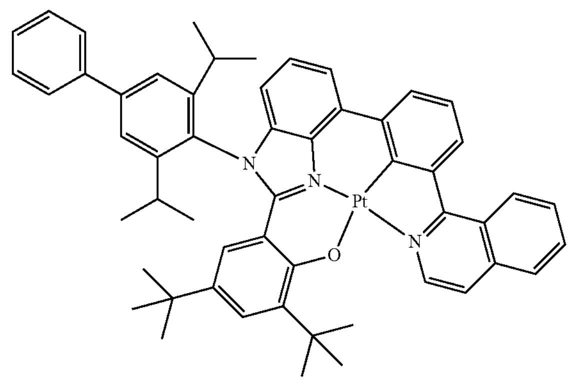
3-559
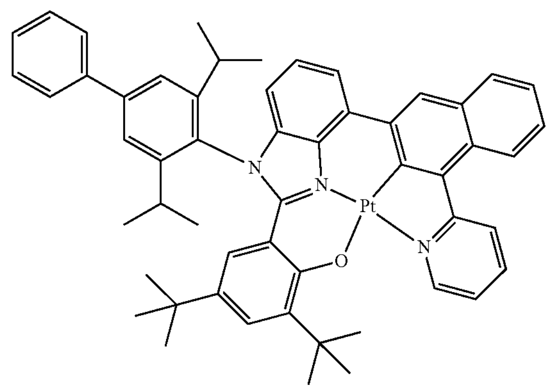
3-560
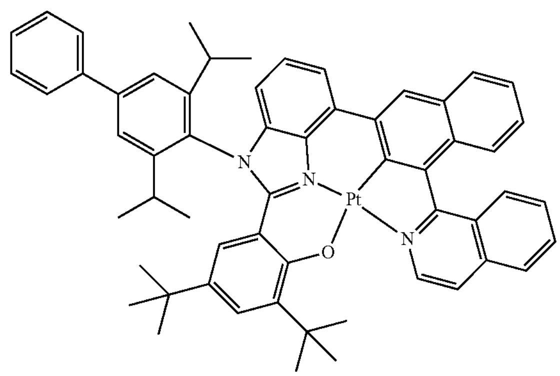

-continued
3-561
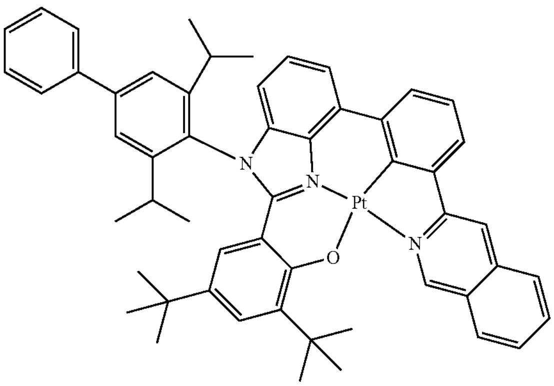
3-562
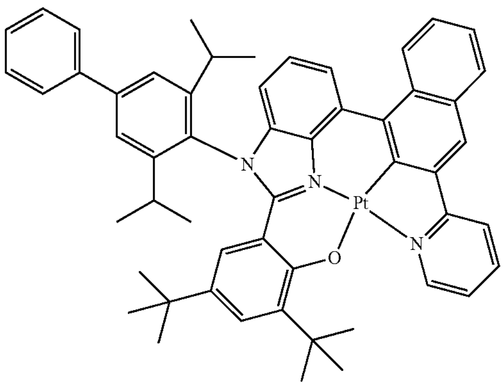
3-563
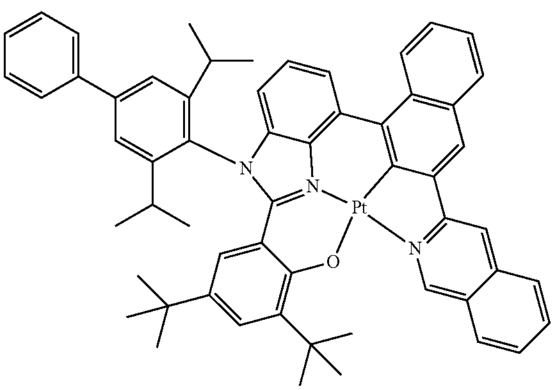
3-564
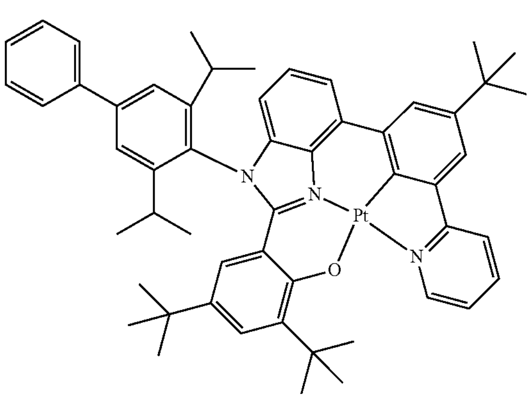
-continued
3-565
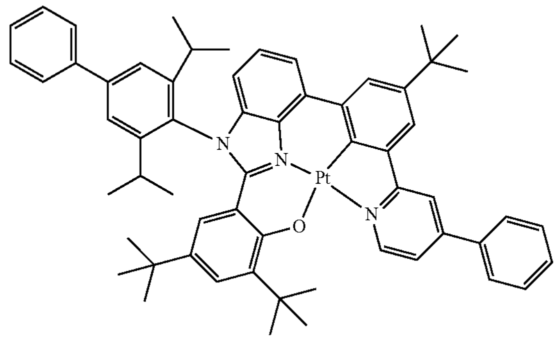
3-566
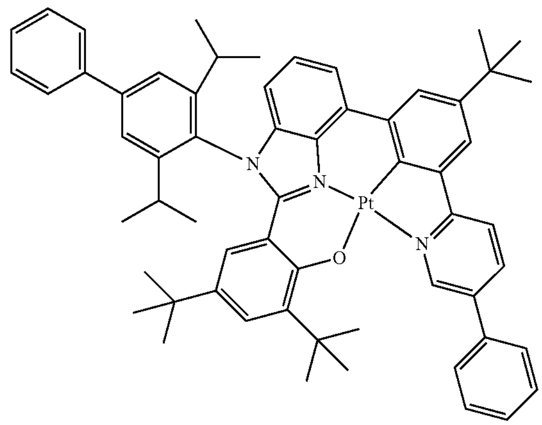
3-567
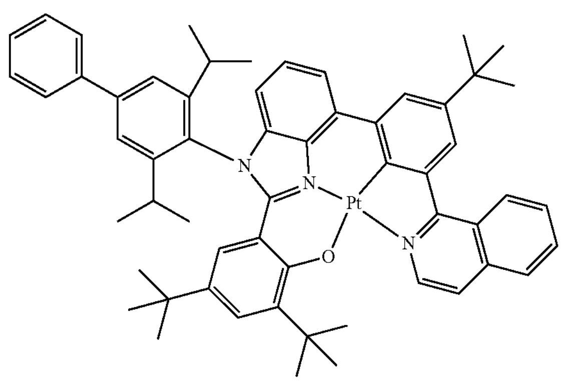
3-568
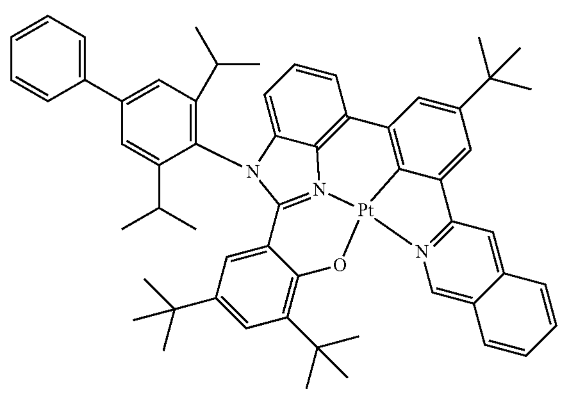

-continued
3-569
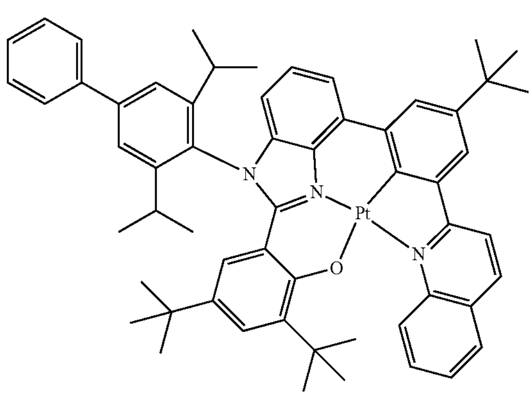
3-570
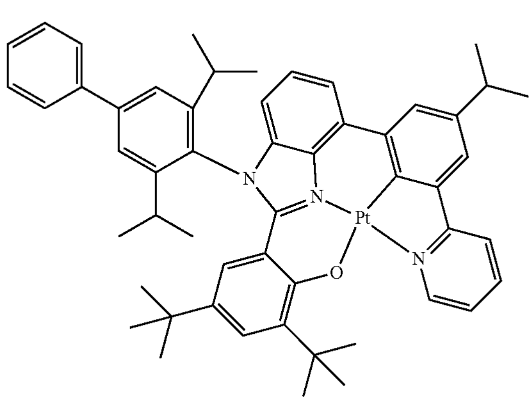
3-571
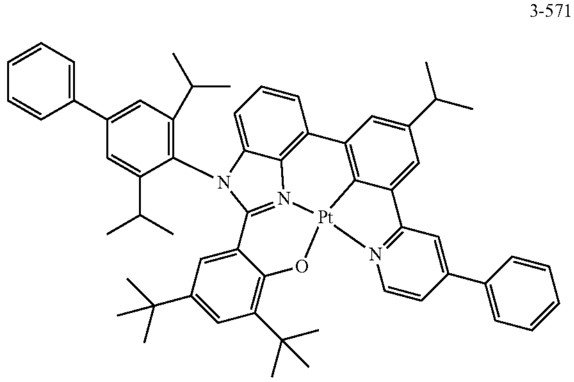
3-572
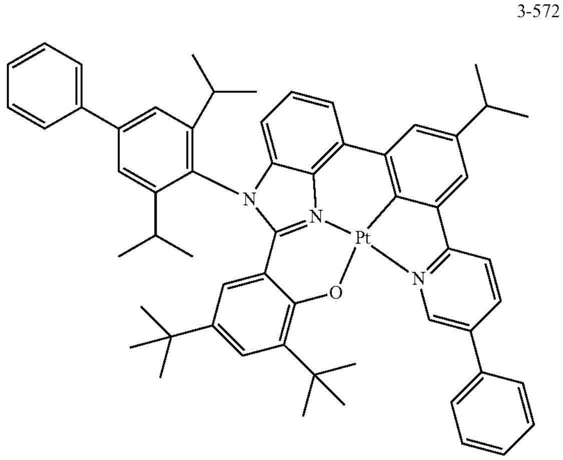
-continued
3-573
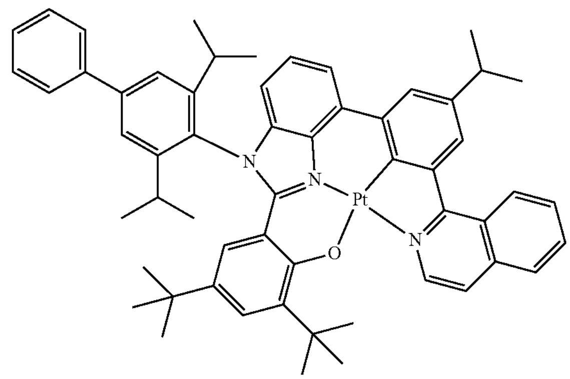
3-574
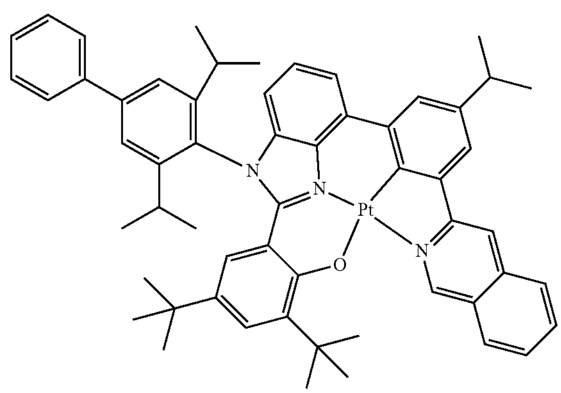
3-575
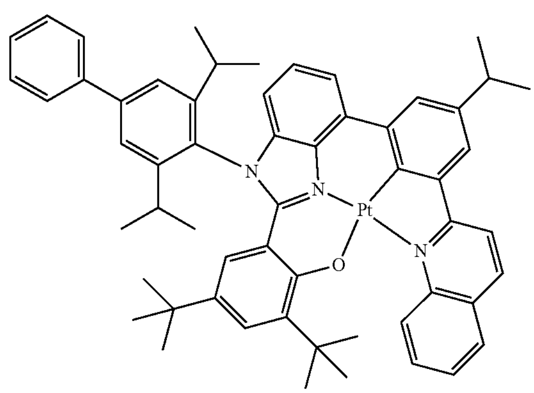
3-576
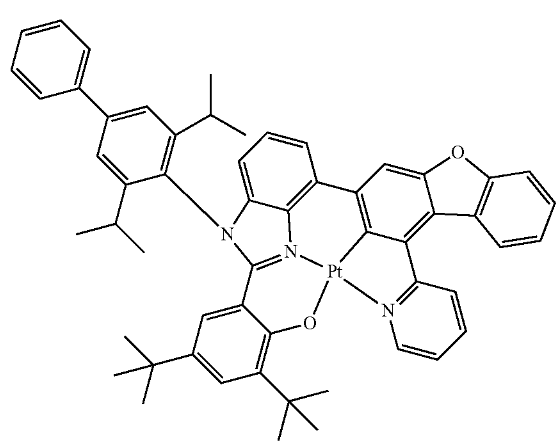

-continued 3-577

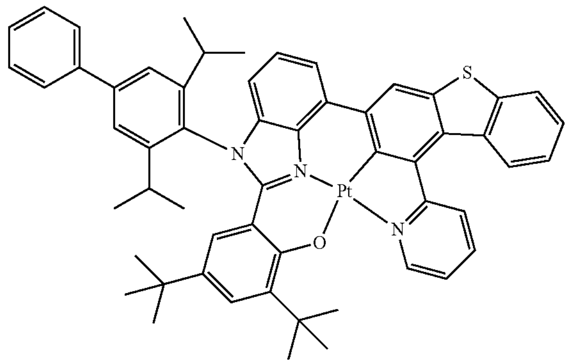

3-578

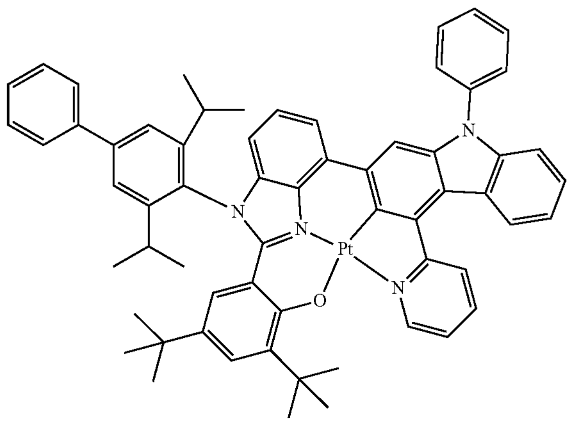

3-579

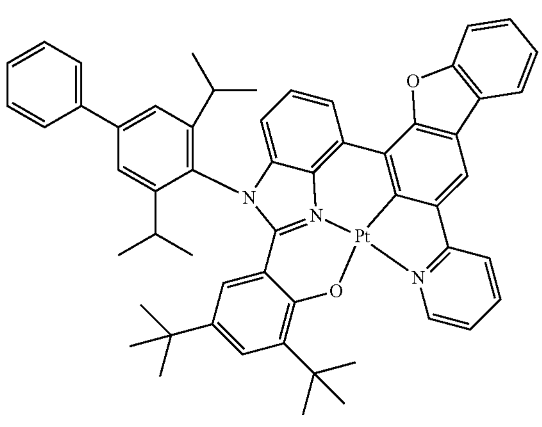

-continued 3-580

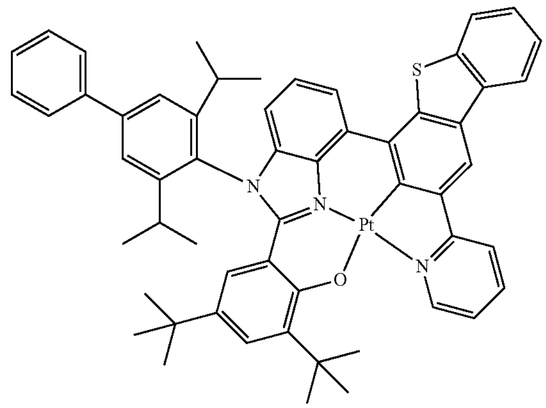

3-581

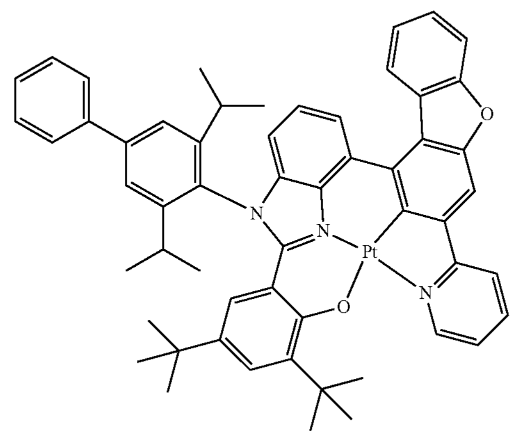

3-582

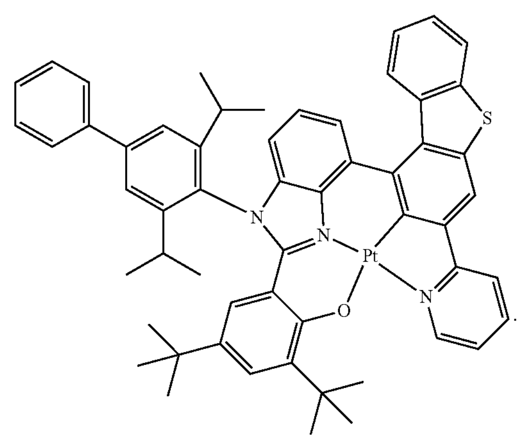

3. The organic light-emitting device of claim 1, wherein $N_2$ is in a range of about 15 percent by weight to about 30 percent by weight.

4. The organic light-emitting device of claim 1, wherein $x_1$ and $x_2$ are each a real number satisfying $0<x_1<x_2<L_{EML}$, $D_{con}(x)$ is $N_2$ when x satisfies $0\leq x\leq x_1$, and $D_{con}(x)$ is $N_2$ when x satisfies $x_2\leq x\leq L_{EML}$.

5. The organic light-emitting device of claim wherein the host comprises an electron transport host and a hole transport host, the electron transport host comprises at least one electron transport moiety, and the hole transport host does not comprise an electron transport moiety, the at least one electron transport moiety is selected from a cyano group, a R electron-depleted nitrogen-containing cyclic group, and a group represented by one of the following formulae:

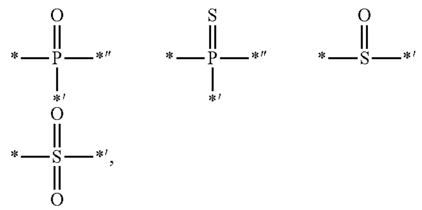

wherein *, *', and *" in the formulae each indicate a binding site to a neighboring atom.

6. The organic light-emitting device of claim 5, wherein the electron transport host comprises at least one of a triazine group, a pyrimidine group, and a cyano group, and the hole transport host comprises a carbazole group.

7. The organic light-emitting device of claim 1, wherein the hole transport region comprises an amine-based compound.

8. The organic light-emitting device of claim 1, wherein $x_1$ and $x_2$ are each a real number satisfying $0 \le x_1 < x_2 < L_{EML}$, $D_{con}(x)$ is $N_2$ when x satisfies $0 \le x \le x_1$, $D_{con}(x)$ is $N_1$ when x satisfies $x_1 < x < x_2$, and $D_{con}(x)$ is $N_2$ when x satisfies $x_2 \le x \le L_{EML}$.

9. The organic light-emitting device of claim 1, wherein $x_{11}$, $x_{12}$, $x_{13}$, and $x_{14}$ are each a real number satisfying $0 < x_{11} < x_{12} < x_{13} < x_{14} < L_{EML}$, $D_{con}(x)$ is $N_2$ when x satisfies $0 \le x \le x_{11}$, $D_{con}(x)$ is $N_1$ when x satisfies $x_{11} < x < x_{12}$, $D_{con}(x)$ is $N_2$ when x satisfies $x_{12} \le x \le x_{13}$, $D_{con}(x)$ is $N_1$ when x satisfies $x_{13} < x < x_{14}$, and $D_{con}(x)$ is $N_2$ when x satisfies $x_{14} \le x \le L_{EML}$.

10. The organic light-emitting device of claim 1, wherein $x_{21}$ is a real number satisfying $0 < x_{21} < L_{EML}$, $D_{con}(x)$ gradually decreases when x satisfies $0 < x < x_{21}$, $D_{con}(x_{21})$ is $N_1$, and $D_{con}(x)$ gradually increases when x satisfies $x_{21} < x < L_{EML}$.

11. The organic light-emitting device of claim 1, wherein $X_{31}$, $x_{32}$, $x_{33}$, and $x_{34}$ are each a real number satisfying $0 < x_{31} < x_{32} < x_{33} < x_{34} < L_{EML}$, $D_{con}(x)$ is $N_2$ when x satisfies $0 \le x \le x_{31}$, $D_{con}(x)$ gradually decreases when x satisfies $x_{31} < x < x_{32}$, $D_{con}(x)$ is $N_1$ when x satisfies $x_{32} \le x \le x_{33}$, $D_{con}(x)$ gradually increases when x satisfies $x_{33} < x < x_{34}$, and $D_{con}(x)$ is $N_2$ when x satisfies $x_{34} \le x \le L_{EML}$.

12. The organic light-emitting device of claim 1, wherein $x_{41}$, $x_{42}$, and $x_{43}$ are each a real number satisfying $0 < x_{41} < x_{42} < x_{43} < L_{EML}$, $D_{con}(x)$ gradually decreases when x satisfies $0 < x < x_{41}$, $D_{con}(x_{41})$ is $N_1$, $D_{con}(x)$ gradually increases when x satisfies $x_{41} < x < x_{42}$, $D_{con}(x_{42})$ is $N_2$, $D_{con}(x)$ gradually decreases when x satisfies $x_{42} < x < x_{43}$, $D_{con}(x_{43})$ is $N_1$, and $D_{con}(x)$ gradually increases when x satisfies $x_{43} < x < L_{EML}$.

13. The organic light-emitting device of claim 1, wherein $x_{51}$, $x_{52}$, $x_{53}$, $x_{54}$, $x_{55}$, $x_{56}$, $x_{57}$, and $x_{58}$ are each a real number satisfying $0 < x_{51} < x_{52} < x_{53} < x_{54} < x_{55} < x_{56} < x_{57} < x_{58} < L_{EML}$, $D_{con}(x)$ is $N_2$ when x satisfies $0 \le x \le x_{51}$, $D_{con}(x)$ gradually decreases when x satisfies $x_{51} < x < x_{52}$, $D_{con}(x)$ is $N_1$ when x satisfies $x_{52} \le x \le x_{53}$, $D_{con}(x)$ gradually increases when x satisfies $x_{53} < x < x_{54}$, $D_{con}(x)$ is $N_2$ when x satisfies $x_{54} \le x \le x_{55}$, $D_{con}(x)$ gradually decreases when x satisfies $x_{55} < x < x_{56}$, $D_{con}(x)$ is $N_1$ when x satisfies $x_{56} \le x \le x_{57}$, $D_{con}(x)$ gradually increases when x satisfies $x_{57} < x < x_{58}$, and $D_{con}(x)$ is $N_2$ when x satisfies $x_{58} \le x \le L_{EML}$.

* * * * *